US012004420B2

(12) United States Patent
Moon et al.

(10) Patent No.: US 12,004,420 B2
(45) Date of Patent: Jun. 4, 2024

(54) ORGANIC ELECTROLUMINESCENT COMPOUND AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Doo-Hyeon Moon, Gyeonggi-do (KR); Su-Hyun Lee, Gyeonggi-do (KR); Jin-Ri Hong, Gyeonggi-do (KR); So-Young Jung, Gyeonggi-do (KR); Dong-Hyung Lee, Gyeonggi-do (KR); Sang-Hee Cho, Gyeonggi-do (KR)

(73) Assignee: Rohm and Haas Electronic Materials Korea Ltd. (KR)

( * ) Notice: Subject to any disclaimer, the term of this patent is extended or adjusted under 35 U.S.C. 154(b) by 658 days.

(21) Appl. No.: 16/886,822

(22) Filed: May 29, 2020

(65) Prior Publication Data

US 2021/0005822 A1 Jan. 7, 2021

(30) Foreign Application Priority Data

Jul. 1, 2019 (KR) ........................ 10-2019-0078837
Apr. 28, 2020 (KR) ........................ 10-2020-0051436

(51) Int. Cl.
*H10K 85/60* (2023.01)

(52) U.S. Cl.
CPC ......... *H10K 85/654* (2023.02); *H10K 85/622* (2023.02); *H10K 85/633* (2023.02); *H10K 85/6572* (2023.02); *H10K 85/6574* (2023.02); *H10K 85/6576* (2023.02)

(58) Field of Classification Search
None
See application file for complete search history.

(56) References Cited

U.S. PATENT DOCUMENTS

| | | | | |
|---|---|---|---|---|
| 2017/0148995 | A1* | 5/2017 | Kim | H01L 51/0067 |
| 2018/0222872 | A1 | 8/2018 | Jatsch et al. | |
| 2019/0237680 | A1* | 8/2019 | Kim | H01L 51/5088 |
| 2019/0355913 | A1* | 11/2019 | Oh | H01L 51/0054 |
| 2020/0373497 | A1* | 11/2020 | Jang | H01L 51/0054 |
| 2021/0091314 | A1* | 3/2021 | Shin | H01L 51/0073 |

FOREIGN PATENT DOCUMENTS

| | | | | | |
|---|---|---|---|---|---|
| KR | 2018099547 | A | * | 2/2018 | C09K 11/06 |
| KR | 20190013353 | A | | 2/2019 | |
| KR | 20190108935 | A | * | 9/2019 | C07D 401/10 |
| WO | WO-2017200210 | A1 | * | 11/2017 | C07D 251/24 |
| WO | WO-2018151520 | A1 | * | 8/2018 | C07D 209/86 |
| WO | WO-2019059695 | A1 | * | 3/2019 | C07D 239/74 |
| WO | WO-2019066304 | A2 | * | 4/2019 | H01L 51/00 |

OTHER PUBLICATIONS

Machine translation of KR-20190108935, translation generated May 2023, 29 pages. (Year: 2023).*

* cited by examiner

*Primary Examiner* — Robert S Loewe
(74) *Attorney, Agent, or Firm* — G. Creston Campbell

(57) ABSTRACT

The present disclosure relates to an organic electroluminescent compound and an organic electroluminescent device comprising the same. By comprising the organic electroluminescent compound, an organic electroluminescent device having a low driving voltage and/or a high luminous efficiency and/or a long lifespan can be provided.

6 Claims, No Drawings

ORGANIC ELECTROLUMINESCENT COMPOUND AND ORGANIC ELECTROLUMINESCENT DEVICE COMPRISING THE SAME

TECHNICAL FIELD

The present disclosure relates to an organic electroluminescent compound and an organic electroluminescent device comprising the same.

BACKGROUND ART

An electroluminescent device (EL device) is a self-light-emitting display device which has advantages in that it provides a wider viewing angle, a greater contrast ratio, and a faster response time. The first organic EL device was developed by Eastman Kodak in 1987, by using small aromatic diamine molecules and aluminum complexes as materials for forming a light-emitting layer [Appl. Phys. Lett. 51, 913, 1987].

The most important factor determining luminous efficiency in an organic electroluminescent device is light-emitting materials. Until now, fluorescent materials have been widely used as the light-emitting material. However, in view of electroluminescent mechanisms, since phosphorescent light-emitting materials theoretically enhance luminous efficiency by four (4) times that of fluorescent light-emitting materials, phosphorescent light-emitting materials have been widely researched. Iridium(III) complexes have been widely known as phosphorescent light-emitting materials, including bis(2-(2'-benzothienyl)-pyridinato-N,C-3')iridium (acetylacetonate) [(acac)Ir(btp)$_2$], tris(2-phenylpyridine) iridium [Ir(ppy)$_3$], and bis(4,6-difluorophenylpyridinato-N, C2)picolinato iridium (Firpic), etc.

In conventional technology, 4,4'-N,N'-dicarbazol-biphenyl (CBP) is the most widely known phosphorescent host material. Recently, Pioneer (Japan) et al., developed a high performance organic electroluminescent device using bathocuproine (BCP) and aluminum(III) bis(2-methyl-8-quinolinate)(4-phenylphenolate) (BAlq), etc., as host materials, which were known as hole blocking materials.

Although these materials provide good luminous characteristics, they have the following disadvantages: (1) Due to their low glass transition temperature and poor thermal stability, their degradation may occur, and the lifespan of the device may be shortened during a high-temperature deposition process in a vacuum. (2) The power efficiency of the organic electroluminescent device is given by [(π/voltage)× current efficiency], and the power efficiency is inversely proportional to the voltage. Although the organic electroluminescent device comprising phosphorescent host materials provides higher current efficiency (cd/A) than one comprising fluorescent materials, a significantly high driving voltage is necessary. Thus, there is no merit in terms of power efficiency (Im/W). (3) Also, when used in the organic electroluminescent device, it is not satisfactory in terms of the operational lifespan, and the luminous efficiency is still necessary to improve.

In order to improve the luminous efficiency, the driving voltage and/or the lifespan, various materials or concepts in the organic layer of the organic electroluminescent device have been proposed; however, they have not been satisfactory for practical use.

KR 2019-0013353 A, KR 2018-0094349 A, and KR 2018-0031766 A disclose a fluorene compound or benzofluorene compound, which is linked with heteroaryl containing at least one nitrogen directly or through a linker, as materials of a light-emitting layer and/or an electron buffer layer and/or an electron transport layer, etc. However, the documents do not specifically disclose an organic electroluminescent compound according to the present disclosure.

DISCLOSURE OF INVENTION

Technical Problem

The object of the present disclosure is firstly, to provide an organic electroluminescent compound which is able to produce an organic electroluminescent device having a low driving voltage and/or a high luminous efficiency and/or long lifespan, and secondly, to provide an organic electroluminescent device comprising the organic electroluminescent compound.

Solution to Problem

As a result of intensive studies to solve the technical problem above, the present inventors found that the aforementioned objective can be achieved by the organic electroluminescent compound represented by the following formula 1, and then completed the present invention.

(1)

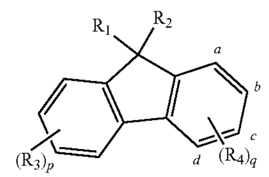

In formula 1, one of a and b, b and c, c and d is linked with * of the following formula 2 to form a ring, and $R_4$ is substituted at a position in a to d which is not linked with * of formula 2;

(2)

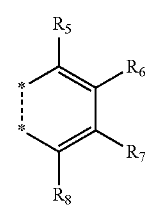

$R_1$ and $R_2$ each independently represent hydrogen, deuterium, a substituted or unsubstituted (C1-C30)alkyl, a substituted or unsubstituted (C6-C30)aryl, a substituted or unsubstituted (3- to 30-membered)heteroaryl, or a substituted or unsubstituted (C3-C30)cycloalkyl; or may be linked to an adjacent substituent to form a ring;

in formulas 1 and 2, $R_3$ to $R_8$ each independently represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

provided that at least one $R_4$ or at least one of $R_5$ to $R_8$ represent(s) -$L_1$-ETU;

$L_1$ represents a single bond, a substituted or unsubstituted (C6-C30)arylene, a substituted or unsubstituted (3- to 30-membered)heteroarylene, or a substituted or unsubstituted(C3-C30)cycloalkylene;

ETU represents a substituted or unsubstituted nitrogen-containing (3- to 30-membered)heteroaryl;

p represents an integer of 1 to 4, and when p is 2 or more, each $R_3$ may be the same or different;

q represents an integer of 1 or 2, and when q is 2, each $R_4$ may be the same or different; and with the proviso that the compounds represented by the following formulas I-1 to I-3 are excluded.

(I-1)

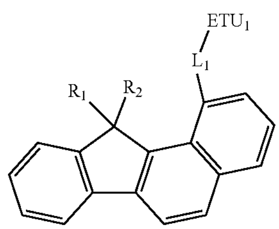

(I-2)

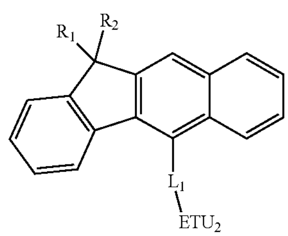

(I-3)

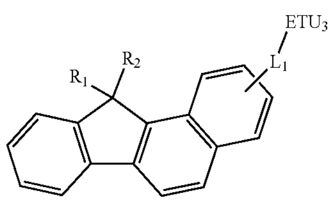

In formulas I-1 to I-3, $R_1$, $R_2$, and $L_1$ are as defined in formula 1;

$ETU_1$ to $ETU_3$ are as defined as ETU in formula 1;

at least one of $L_1$ and $ETU_1$ include(s) triazine structure in formula I-1;

at least one of $L_1$ and $ETU_2$ include(s) pyridine structure, pyrimidine structure, or triazine structure in formula I-2; and at least one of $L_1$ and $ETU_3$ include quinazoline structure in formula I-3.

Advantageous Effects of Invention

By using an organic electroluminescent compound according to the present disclosure, an organic electroluminescent device having a low driving voltage and/or a high luminous efficiency and/or long lifespan can be prepared.

MODE FOR THE INVENTION

Hereinafter, the present disclosure will be described in detail. However, the following description is intended to explain the invention, and is not meant in any way to restrict the scope of the invention.

The present disclosure relates to an organic electroluminescent compound represented by formula 1 above, an organic electroluminescent material comprising the organic electroluminescent compound, and an organic electroluminescent device comprising the organic electroluminescent material.

The term "organic electroluminescent compound" in the present disclosure means a compound that may be used in an organic electroluminescent device, and may be comprised in any material layer constituting an organic electroluminescent device, as necessary.

Herein, "organic electroluminescent material" means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (containing host and dopant materials), an electron buffer material, a hole blocking material, an electron transport material, or an electron injection material, etc.

Herein, "electron transport zone" means a region in which electrons move between a second electrode and a light-emitting layer and may include, for example, at least one of an electron buffer layer, a hole blocking layer, an electron transport layer and an electron injection layer, preferably, may include at least one of an electron buffer layer, an electron transport layer and an electron injection layer. The electron buffer layer is a layer capable of improving the problem that the current characteristics in the device possess, where changes upon exposure to a high temperature in a panel fabrication process cause deformation of light emission luminance, which can control the flow of charge.

Herein, "(C1-C30)alkyl" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, tert-butyl, etc. "(C3-C30)cycloalkyl(ene)" is a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. "(C6-C30)aryl(ene)" is a monocyclic or fused ring radical derived from an aromatic hydrocarbon having 6 to 30 ring backbone carbon atoms, in which the number of the ring backbone carbon atoms is preferably 6 to 20, more preferably 6 to 15, may be partially saturated, and may comprise a spiro structure. Examples of the aryl specifically include phenyl, biphenyl, terphenyl, quaterphenyl, naphthyl, binaphthyl, phenylnaphthyl, naphthylphenyl, fluorenyl, phenylfluorenyl, dimethylfluorenyl, diphenylfluorenyl, benzofluorenyl, diphenylbenzofluorenyl, dibenzofluorenyl, phenanthrenyl, benzophenanthrenyl, phenylphenanthrenyl, anthracenyl, benzanthracenyl, indenyl, triphenylenyl, pyrenyl, tetracenyl, perylenyl, chrysenyl, benzochrysenyl, naphthacenyl, fluoranthenyl, benzofluoranthenyl, tolyl, xylyl, mesityl, cumenyl, spiro[fluorene-fluorene]yl, spiro[fluorene-benzofluorene]yl, azulenyl, etc. More specifically, the aryl may be o-tolyl, m-tolyl, p-tolyl, 2,3-xylyl, 3,4-xylyl, 2,5-xylyl, mesityl, o-cumenyl, m-cumenyl, p-cumenyl, p-t-butylphenyl, p-(2-phenylpropyl)phenyl, 4'-methylbiphenyl, 4"-t-butyl-p-terphenyl-4-yl, o-biphenyl, m-biphenyl, p-biphenyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 1-naphthyl, 2-naphthyl, 1-fluorenyl, 2-fluorenyl, 3-fluorenyl, 4-fluorenyl, 9-fluorenyl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 1-anthryl, 2-anthryl, 9-anthryl, 1-phenanthryl, 2-phenanthryl, 3-phenanthryl, 4-phenanthryl, 9-phenanthryl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 3-fluoranthenyl, 4-fluoranthenyl, 8-fluoranthenyl, 9-fluoranthenyl, benzofluoranthenyl, etc. "(3- to 30-membered)heteroaryl(ene)" is an aryl having 3 to 30 ring backbone, including at least one heteroatom(s) selected from the group consisting of B, N, O, S, Si, P, and Ge. "Nitrogen-containing (3- to 30-membered) heteroaryl" is an aryl having 3 to 30 ring backbone, including at least one nitrogen atom(s) and may further include at least one heteroatom(s) selected from the group consisting of B, O, S, Si, and P. Wherein the number of atoms in the ring backbone is preferably 5 to 25, and the number of heteroatoms is preferably 1 to 4. The above heteroaryl may be a monocyclic ring, or a fused ring condensed with at least one benzene ring; and may be partially saturated. Also, the above heteroaryl may be one formed by linking at least one heteroaryl or aryl group to a heteroaryl group via a single bond(s). Examples of the heteroaryl specifically may include a monocyclic ring-type heteroaryl including furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl including benzofuranyl, benzothiophenyl, isobenzofuranyl, dibenzofuranyl, dibenzothiophenyl, benzoimidazolyl, benzothiazolyl, benzoisothiazolyl, benzoisoxazolyl, benzoxazolyl, imidazopyridinyl, isoindolyl, indolyl, benzoindolyl, indazolyl, benzothiadiazolyl, quinolyl, isoquinolyl, cinnolinyl, quinazolinyl, quinoxalinyl, carbazolyl, azacarbazolyl, benzocarbazolyl, dibenzocarbazolyl, phenoxazinyl, phenanthridinyl, benzodioxolyl, indolizidinyl, acrylidinyl, silafluorenyl, germafluorenyl, etc. More specifically, the heteroaryl may be 1-pyrrolyl, 2-pyrrolyl, 3-pyrrolyl, 2-pyridinyl, 3-pyridinyl, 4-pyridinyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolizidinyl, 2-indolizidinyl, 3-indolizidinyl, 5-indolizidinyl, 6-indolizidinyl, 7-indolizidinyl, 8-indolizidinyl, 2-imidazopyridinyl, 3-imidazopyridinyl, 5-imidazopyridinyl, 6-imidazopyridinyl, 7-imidazopyridinyl, 8-imidazopyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazole-1-yl, azacarbazole-2-yl, azacarbazole-3-yl, azacarbazole-4-yl, azacarbazole-5-yl, azacarbazole-6-yl, azacarbazole-7-yl, azacarbazole-8-yl, azacarbazole-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acrylidinyl, 2-acrylidinyl, 3-acrylidinyl, 4-acrylidinyl, 9-acrylidinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, 4-t-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, etc. Herein, "Halogen" includes F, Cl, Br, and I.

In addition, "ortho (o)," "meta (m)," and "para (p)" are meant to signify the substitution position of all substituents. Ortho position is a compound with substituents which are adjacent to each other, e.g., at the 1 and 2 positions on benzene. Meta position is the next substitution position of the immediately adjacent substitution position, e.g., a compound with substituents at the 1 and 3 positions on benzene. Para position is the next substitution position of the meta position, e.g., a compound with substituents at the 1 and 4 positions on benzene.

Herein, "a ring formed in linking to an adjacent substituent" means a substituted or unsubstituted (3- to 30-membered) mono- or polycyclic, alicyclic, aromatic ring, or a combination thereof, formed by linking or fusing two or more adjacent substituents, preferably may be a substituted or unsubstituted (3- to 26-membered) mono- or polycyclic, alicyclic, aromatic ring, or a combination thereof. Further, the formed ring may be included at least one heteroatom selected from the group consisting of B, N, O, S, Si and P, preferably, N, O and S. According to one embodiment of the present disclosure, the number of atoms in the ring skeleton is 5 to 20; according to another embodiment of the present disclosure, the number of atoms in the ring skeleton is 5 to 15. In one embodiment the fused ring may be, for example, a substituted or unsubstituted benzene ring, a substituted or unsubstituted fluorene ring, a substituted or unsubstituted dibenzothiophene ring, a substituted or unsubstituted dibenzofuran ring, a substituted or unsubstituted naphthalene ring, a substituted or unsubstituted phenanthrene ring, a substituted or unsubstituted benzothiophene ring, a substituted or unsubstituted benzofuran ring, a substituted or unsubstituted indole ring, a substituted or unsubstituted indene ring, or a substituted or unsubstituted carbazole ring, etc.

In addition, "substituted" in the expression "substituted or unsubstituted" means that a hydrogen atom in a certain functional group is replaced with another atom or functional group, i.e., a substituent. The substituents of the substituted (C1-C30)alkyl, the substituted (C6-C30)aryl(ene), the substituted (3- to 30-membered)heteroaryl(ene), the substituted (C3-C30)cycloalkyl(ene), the substituted (C1-C30)alkoxy, the substituted tri(C1-C30)alkylsilyl, the substituted di(C1-

C30)alkyl(C6-C30)arylsilyl, the substituted (C1-C30)alkyldi(C6-C30)arylsilyl, the substituted tri(C6-C30)arylsilyl, the substituted mono- or di-(C1-C30)alkylamino, the substituted mono- or di-(C6-C30)arylamino, and the substituted (C1-C30)alkyl(C6-C30)arylamino in $R_1$ to $R_8$, $R_a$, $R_b$, $L_1$, and ETU are each independently at least one selected from the group consisting of consisting of deuterium, halogen, cyano, carboxyl, nitro, hydroxy, (C1-C30)alkyl, halo(C1-C30)alkyl, (C2-C30)alkenyl, (C2-C30)alkynyl, (C1-C30)alkoxy, (C1-C30)alkylthio, (C3-C30)cycloalkyl, (C3-C30)cycloalkenyl, (3- to 7-membered)heterocycloalkyl, (C6-C30)aryloxy, (C6-C30)arylthio, (C6-C30)aryl-substituted or unsubstituted (5- to 30-membered)heteroaryl, (5- to 30-membered)heteroaryl-substituted or unsubstituted (C6-C30)aryl, tri(C1-C30)alkylsilyl, tri(C6-C30)arylsilyl, di(C1-C30)alkyl(C6-C30)arylsilyl, (C1-C30)alkyldi(C6-C30)arylsilyl, amino, mono- or di-(C1-C30)alkylamino, (C1-C30)alkyl-substituted or unsubstituted mono- or di-(C6-C30)arylamino, (C1-C30)alkyl(C6-C30)arylamino, (C1-C30)alkylcarbonyl, (C1-C30)alkoxycarbonyl, (C6-C30)arylcarbonyl, di(C6-C30)arylboronyl, di(C1-C30)alkylboronyl, (C1-C30)alkyl(C6-C30)arylboronyl, (C6-C30)ar(C1-C30)alkyl, and (C1-C30)alkyl(C6-C30)aryl, but is not limited thereto. For example, the substituents may be the unsubstituted phenyl, unsubstituted o-biphenyl, the unsubstituted m-biphenyl, the unsubstituted p-biphenyl, the unsubstituted naphthyl, the unsubstituted o-terphenyl, the unsubstituted m-terphenyl, the unsubstituted p-terphenyl, a substituted or unsubstituted fluorenyl, the unsubstituted triphenylenyl, a substituted or unsubstituted carbazolyl, the unsubstituted phenanthrenyl, the unsubstituted dibenzothiophenyl, the unsubstituted dibenzofuranyl, or the unsubstituted spirobifluorenyl.

Hereinafter, the organic electroluminescent compound according to one embodiment will be described.

The organic electroluminescent compound according to one embodiment is represented by the following formula 1.

(1)

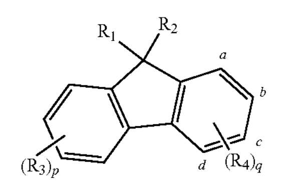

In formula 1, one of a and b, b and c, c and d is linked with * of the following formula 2 to form a ring, and $R_4$ is substituted at a position in a to d which is not linked with * of formula 2;

(2)

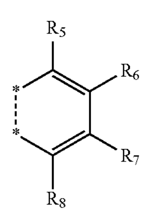

$R_1$ and $R_2$ each independently represent hydrogen, deuterium, a substituted or unsubstituted (C1-C30)alkyl, a substituted or unsubstituted (C6-C30)aryl, a substituted or unsubstituted (3- to 30-membered)heteroaryl, or a substituted or unsubstituted (C3-C30)cycloalkyl; or may be linked to an adjacent substituent to form a ring;

in formulas 1 and 2, $R_3$ to $R_8$ each independently represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

provided that at least one $R_4$ or at least one of $R_5$ to $R_8$ represent(s) $-L_1$-ETU;

$L_1$ represents a single bond, a substituted or unsubstituted (C6-C30)arylene, a substituted or unsubstituted (3- to 30-membered)heteroarylene, or a substituted or unsubstituted(C3-C30)cycloalkylene;

ETU represents a substituted or unsubstituted nitrogen-containing (3- to 30-membered)heteroaryl;

p represents an integer of 1 to 4, and when p is 2 or more, each $R_3$ may be the same or different;

q represents an integer of 1 or 2, and when q is 2 or more, each $R_4$ may be the same or different; and with the proviso that the compounds represented by the following formulas I-1 to 1-3 are excluded.

(I-1)

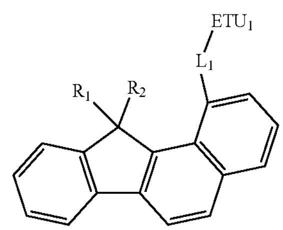

(I-2)

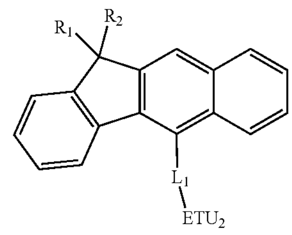

(I-3)

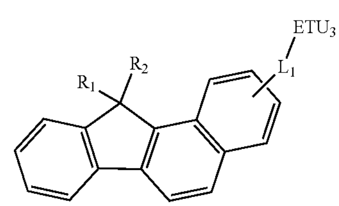

wherein, $R_1$, $R_2$, and $L_1$ are as defined in formula 1;

$ETU_1$ to $ETU_3$ are as defined as ETU in formula 1;

at least one of $L_1$ and $ETU_1$ include(s) triazine structure in formula I-1;

at least one of $L_1$ and $ETU_2$ include(s) pyridine structure, pyrimidine structure, or triazine structure in formula I-2; and at least one of L and $ETU_3$ include quinazoline structure in formula I-3.

According to one embodiment, a and b of formula 1 are linked with * of formula 2 to form a ring; $R_4$ may be substituted at c and d of formula 1; wherein $R_4$ may be the same or different.

According to another embodiment, b and c of formula 1 are linked with * of formula 2 to form a ring; $R_4$ may be substituted at a and d of formula 1; wherein $R_4$ may be the same or different.

According to the other embodiment, c and d of formula 1 are linked with * of formula 2 to form a ring; $R_4$ may be substituted at a and b of formula 1; wherein $R_4$ may be the same or different.

In one embodiment, $R_1$ and $R_2$ each independently may be a substituted or unsubstituted (C1-C30)alkyl or a substituted or unsubstituted (C6-C30)aryl; or may be linked to an adjacent substituent to form a ring, preferably, a substituted or unsubstituted (C1-C10)alkyl or a substituted or unsubstituted (C6-C25)aryl; or may be linked to an adjacent substituent to form a substituted or unsubstituted (3- to 30-membered) mono- or polycyclic, alicyclic, aromatic ring, more preferably a substituted or unsubstituted (C1-C4)alkyl, or a substituted or unsubstituted (C6-C18)aryl; or may be linked to an adjacent substituent to form a substituted or unsubstituted (5- to 25-membered) mono- or polycyclic, aromatic ring. For example, $R_1$ and $R_2$ each independently may be a substituted or unsubstituted methyl, a substituted or unsubstituted phenyl, or $R_1$ and $R_2$ may be linked or fused to form a fluorene ring.

In one embodiment, $R_3$ each independently may be hydrogen, deuterium, a substituted or unsubstituted (C6-C30)aryl, or a substituted or unsubstituted (3- to 30-membered)heteroaryl, preferably, hydrogen, a substituted or unsubstituted (C6-C25)aryl, or a substituted or unsubstituted (5- to 30-membered)heteroaryl, more preferably, hydrogen, a substituted or unsubstituted (C6-C18)aryl, or a substituted or unsubstituted (5- to 25-membered)heteroaryl. For example, $R_3$ each independently may be a substituted or unsubstituted phenyl, a substituted or unsubstituted naphthyl, a substituted or unsubstituted o-biphenyl, a substituted or unsubstituted m-biphenyl, a substituted or unsubstituted fluoranthenyl, a substituted or unsubstituted carbazolyl, a substituted or unsubstituted dibenzofuranyl, or a substituted or unsubstituted dibenzothiophenyl.

In one embodiment, $R_4$ to $R_8$ each independently may be hydrogen, deuterium, a substituted or unsubstituted (C1-C30)alkyl, a substituted or unsubstituted (C6-C30)aryl, or a substituted or unsubstituted (3- to 30-membered)heteroaryl, preferably, hydrogen, a substituted or unsubstituted (C6-C25)aryl, or a substituted or unsubstituted (5- to 30-membered)heteroaryl, more preferably hydrogen, a substituted or unsubstituted (C6-C20)aryl, or a substituted or unsubstituted (5- to 25-membered)heteroaryl.

With the proviso that at least one $R_4$ or at least one of $R_5$ to $R_8$ may be $-L_1$-ETU, for example, one of $R_4$ or one of $R_5$ to $R_8$ may be $-L_1$-ETU.

In one embodiment, when a and b of formula 1 are linked with * of formula 2 to form a ring, at least one $R_4$ or at least one of $R_5$ to $R_8$ may be a substituted or unsubstituted nitrogen-containing (3- to 30-membered)heteroaryl, preferably, one of $R_4$ or one of $R_5$ to $R_8$ may be $-L_1$-ETU.

In one embodiment, when b and c of formula 1 are linked with * of formula 2 to form a ring, at least one of $R_5$ to $R_8$ may be a substituted or unsubstituted nitrogen-containing (3- to 30-membered)heteroaryl, preferably, one of $R_5$ to $R_8$ may be $-L_1$-ETU.

In one embodiment, when c and d of formula 1 are linked with * of formula 2 to form a ring, at least one of $R_5$ to $R_8$ may be a substituted or unsubstituted nitrogen-containing (3- to 30-membered)heteroaryl, preferably, one of $R_5$ to $R_8$ may be $-L_1$-ETU.

In one embodiment, $L_1$ may be a single bond, a substituted or unsubstituted (C6-C30)arylene, or a substituted or unsubstituted (5- to 30-membered)heteroarylene, preferably, a single bond or a substituted or unsubstituted (C6-C25) arylene, more preferably, a single bond or a substituted or unsubstituted (C6-C18)arylene. For example, $L_1$ may be a single bond, or a substituted or unsubstituted phenylene, a substituted or unsubstituted o-biphenylene, a substituted or unsubstituted m-biphenylene, a substituted or unsubstituted naphthylene, or a substituted or unsubstituted phenylnaphthylene.

In one embodiment, ETU may be a substituted or unsubstituted nitrogen-containing (3- to 30-membered)heteroaryl including at least one nitrogen (N), preferably, a substituted or unsubstituted nitrogen-containing (5- to 30-membered) heteroaryl including at least two nitrogens, more preferably, a substituted or unsubstituted nitrogen-containing (5- to 25-membered)heteroaryl including at least two nitrogens. Nitrogen-containing (3- to 30-membered)heteroaryl according to one embodiment may further include at least one heteroatom(s) selected from the group consisting of B, O, S, Si, and P, other than N, e.g., may be a substituted or unsubstituted pyridyl, a substituted or unsubstituted pyrimidinyl, a substituted or unsubstituted triazinyl, a substituted or unsubstituted pyrazinyl, a substituted or unsubstituted pyridazinyl, a substituted or unsubstituted quinazolinyl, a substituted or unsubstituted benzoquinazolinyl, a substituted or unsubstituted quinoxalinyl, a substituted or unsubstituted benzoquinoxalinyl, a substituted or unsubstituted benzofuropyrimidinyl, a substituted or unsubstituted benzothienopyrimidinyl, a substituted or unsubstituted indenopyrazinyl, a substituted or unsubstituted quinolyl, a substituted or unsubstituted benzoquinolyl, a substituted or unsubstituted isoquinolyl, a substituted or unsubstituted benzoisoquinolyl, a substituted or unsubstituted triazolyl, a substituted or unsubstituted pyrazolyl, a substituted or unsubstituted naphthyridinyl, or a substituted or unsubstituted benzothienopyrimidinyl, preferably a substituted or unsubstituted triazinyl, a substituted or unsubstituted pyrimidinyl, a substituted or unsubstituted quinazolinyl, a substituted or unsubstituted benzoquinazolinyl, a substituted or unsubstituted quinoxalinyl, a substituted or unsubstituted benzoquinoxalinyl, a substituted or unsubstituted benzofuropyrimidinyl, a substituted or unsubstituted benzothienopyrimidinyl, or a substituted or unsubstituted indenopyrazinyl.

According to one embodiment, ETU may be selected from any one of the substituents listed in the following Group 1.

[Group 1]

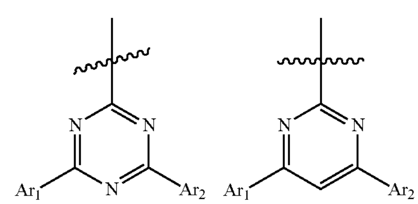

-continued

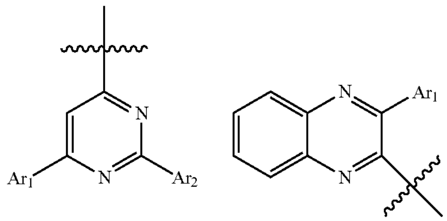

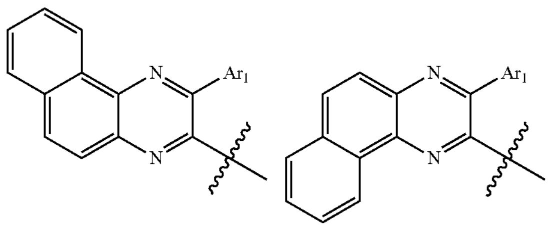

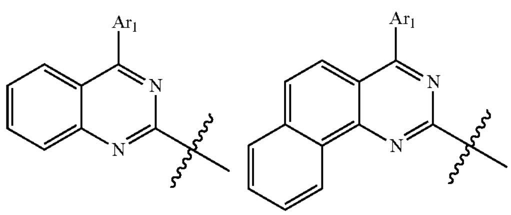

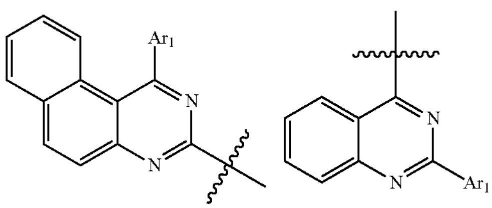

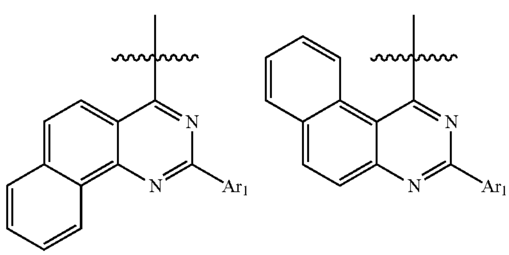

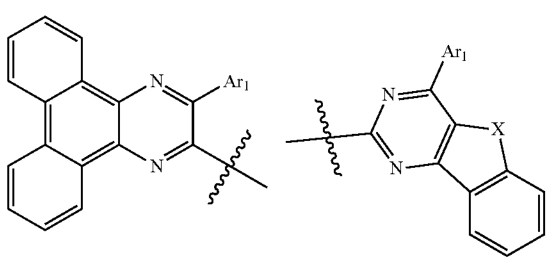

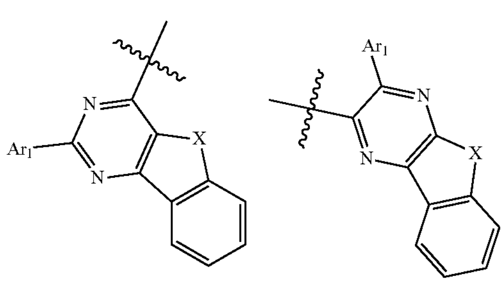

-continued

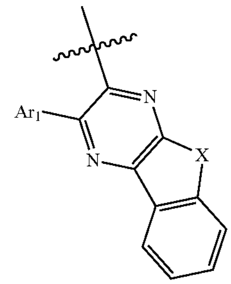

In Group 1,

X represents $CR_{11}R_{12}$, O, or S;

$R_{11}$ and $R_{12}$ each independently represent hydrogen, deuterium, a substituted or unsubstituted (C1-C30)alkyl, a substituted or unsubstituted (C6-C30)aryl, a substituted or unsubstituted (3- to 30-membered)heteroaryl, or a substituted or unsubstituted (C3-C30)cycloalkyl; or may be linked to an adjacent substituent to form a ring; and $Ar_1$ and $Ar_2$ each independently represent a substituted or unsubstituted (C6-C30)aryl or a substituted or unsubstituted (3- to 30-membered)heteroaryl.

In one embodiment, X may be $CH_2$, O, or S.

In one embodiment, $Ar_1$ and $Ar_2$ each independently may be a substituted or unsubstituted (C6-C30)aryl or a substituted or unsubstituted (5- to 30-membered)heteroaryl, preferably, a substituted or unsubstituted (C6-C25)aryl or a substituted or unsubstituted (5- to 25-membered)heteroaryl, more preferably, may be selected from any one of the substituents listed in the following Group 2.

[Group 2]

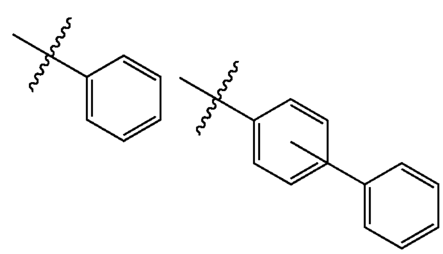

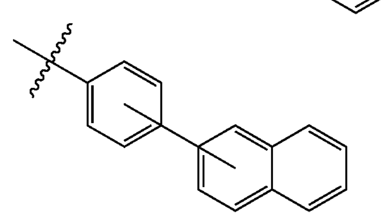

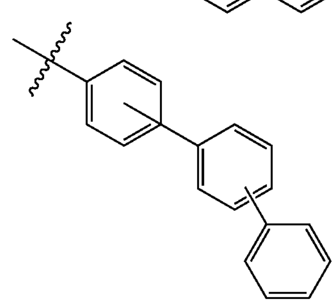

-continued

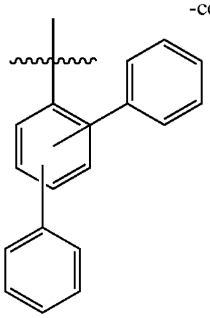

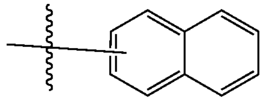

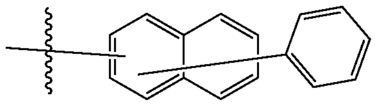

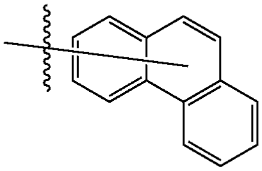

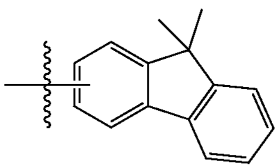

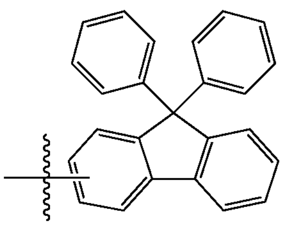

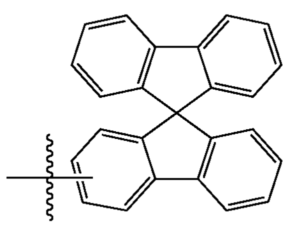

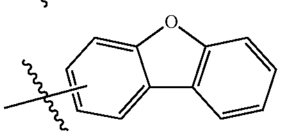

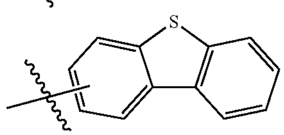

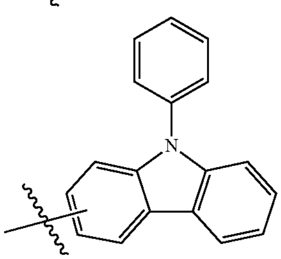

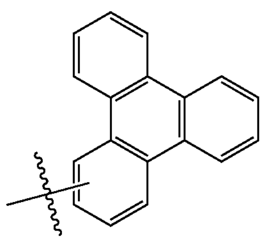

In one embodiment, when a and b of formula 1 are linked with * of formula 2 to form a ring, $R_4$ substituted at c or at least one of $R_5$ to $R_8$ may be a substituted or unsubstituted nitrogen-containing (3- to 30-membered)heteroaryl.

With the proviso that the compound represented by formula 1 according to one embodiment excludes the compounds represented by the following formulas I-1 to I-3.

(I-1)

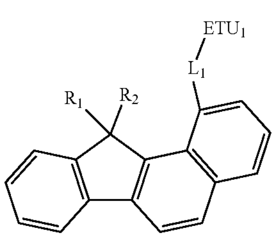

-continued (I-2)

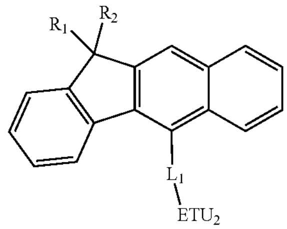

(I-3)

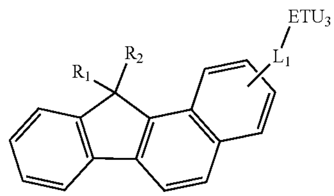

In formulas I-1 to I-3, $R_1$, $R_2$, and $L_1$ are as defined in formula 1;

$ETU_1$ to $ETU_3$ are as defined as ETU in formula 1;

at least one of $L_1$ and $ETU_1$ include(s) triazine structure in formula I-1;

at least one of $L_1$ and $ETU_2$ include(s) pyridine structure, pyrimidine structure, or triazine structure in formula I-2; and at least one of $L_1$ and $ETU_3$ include quinazoline structure in formula I-3.

The compound represented by the formula 1 may be represented by any one of the following formulas 1-1 to 1-3.

(1-1)

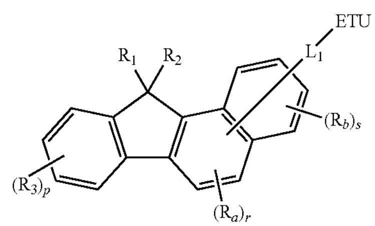

(1-2)

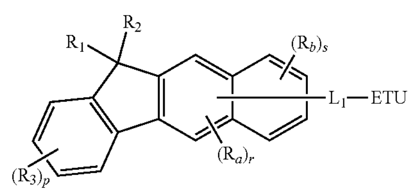

(1-3)

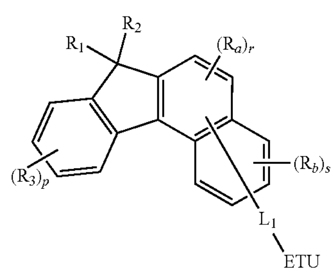

In formulas 1-1 to 1-3, $R_1$ to $R_3$, $L_1$, ETU, and p are as defined in formula 1;

$R_a$ and $R_b$ are each independently as defined as $R_3$;

r represents an integer of 1 or 2, s represents an integer of 1 to 4; and when r and s are 2 or more, each $R_1$ and each $R_b$ may be the same or different.
According to one embodiment, the organic electroluminescent compound represented by formula 1 may be illustrated by the following compounds, but is not limited thereto.
C-1
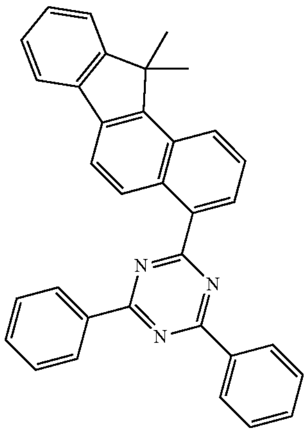
C-2
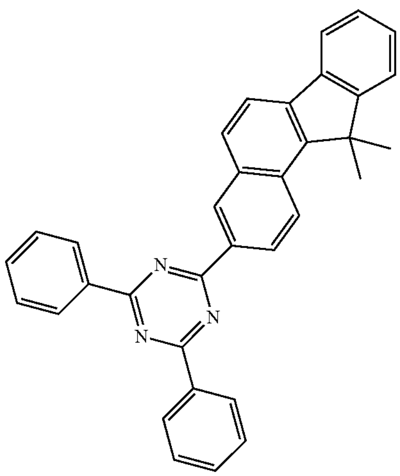
C-3
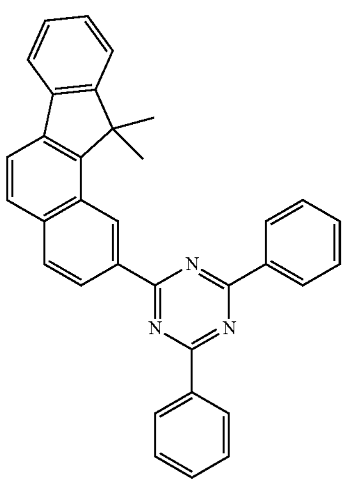
-continued
C-4
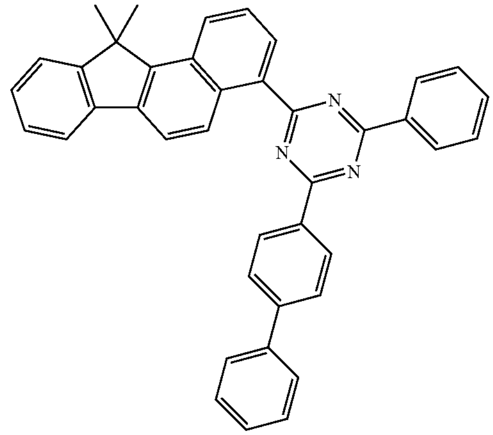
C-5
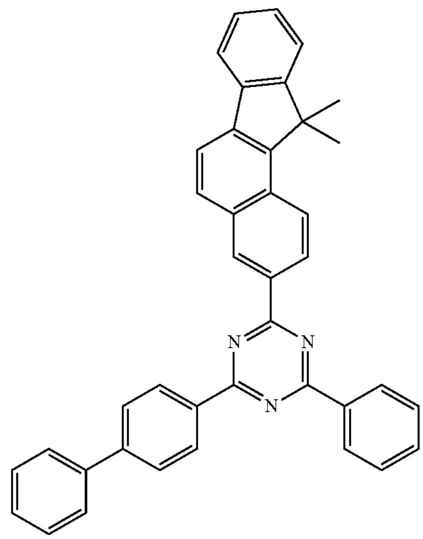
C-6
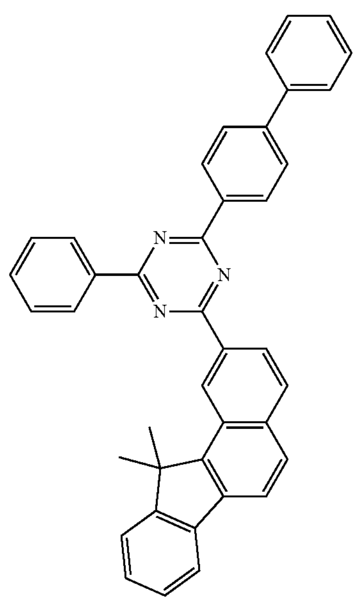

C-7
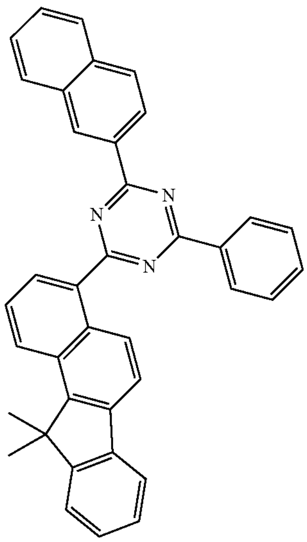
C-8
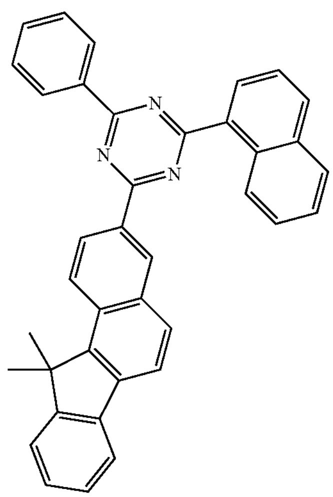
C-9
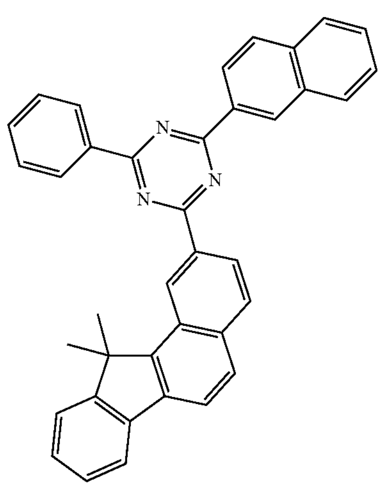
C-10
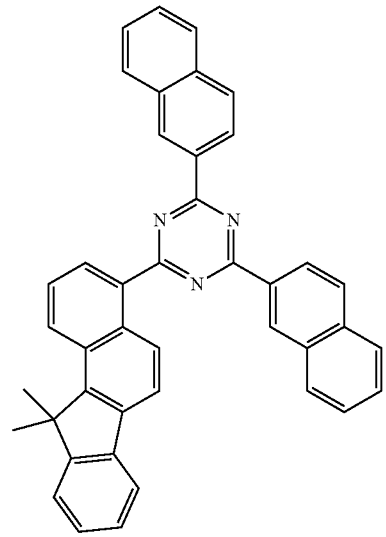
C-11
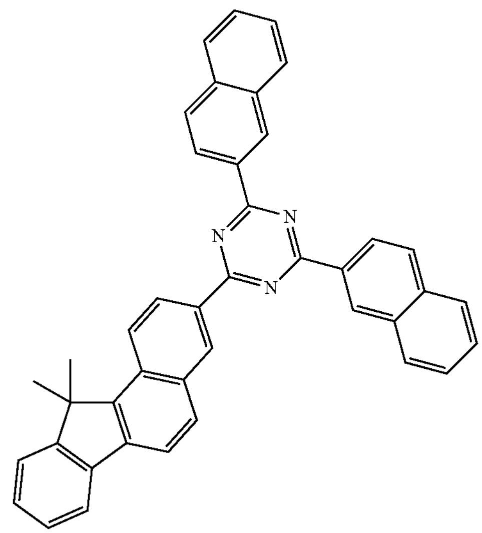
C-12
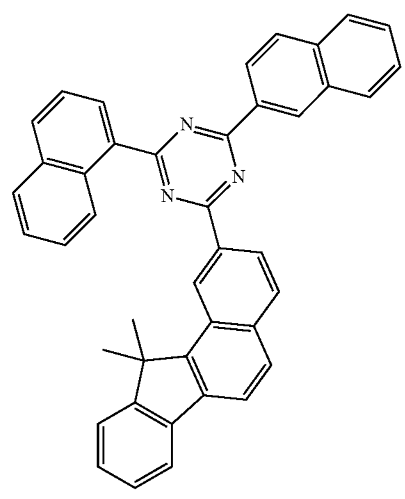

-continued
C-13
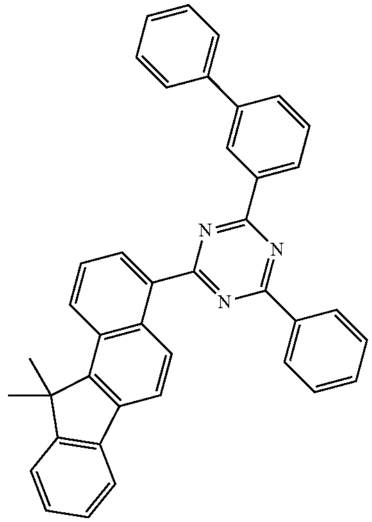
C-14
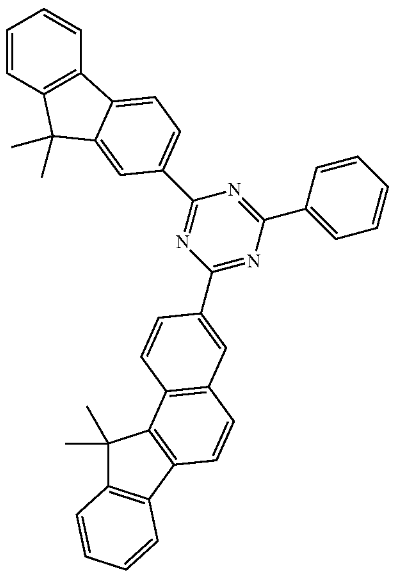
C-15
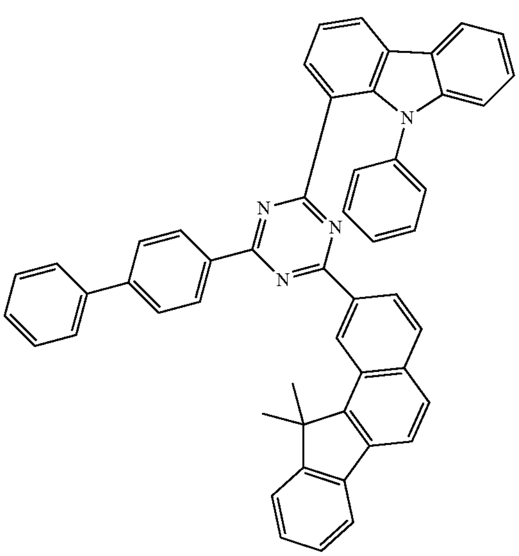
-continued
C-16
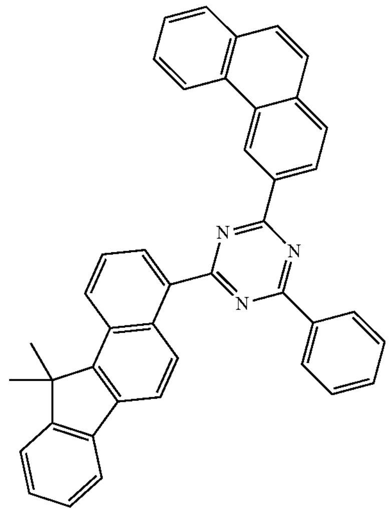
C-17
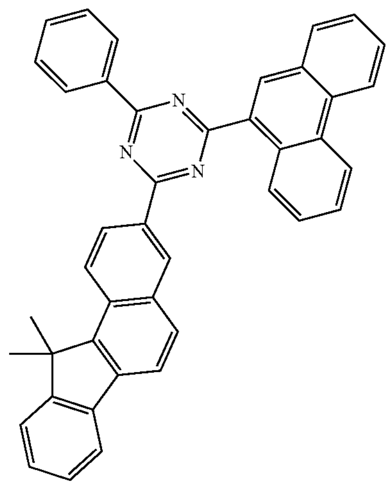
C-18
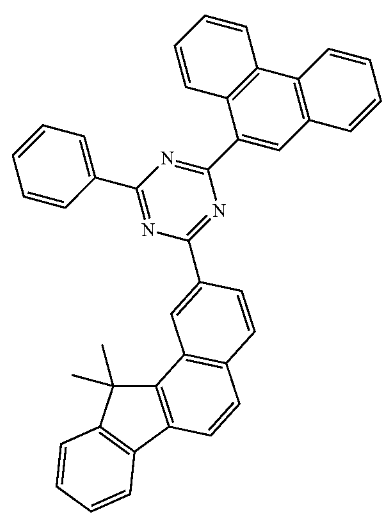

-continued
C-19
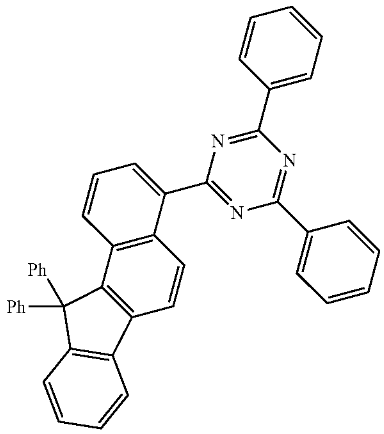
C-20
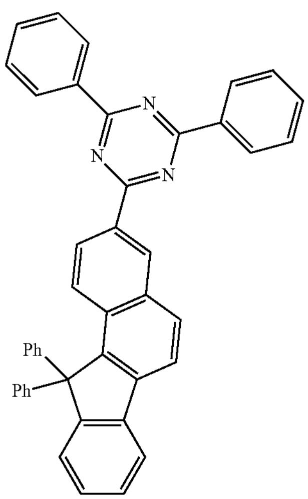
C-21
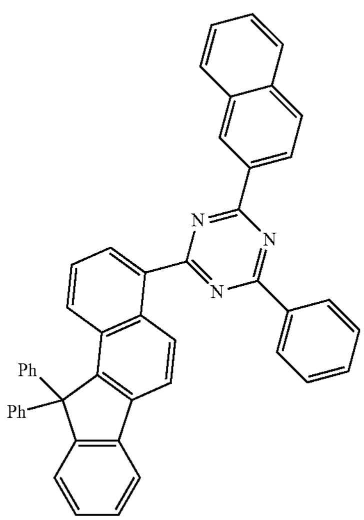
-continued
C-22
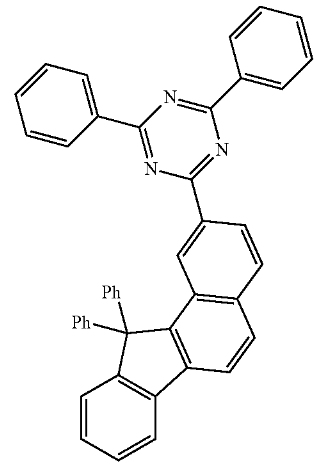
C-23
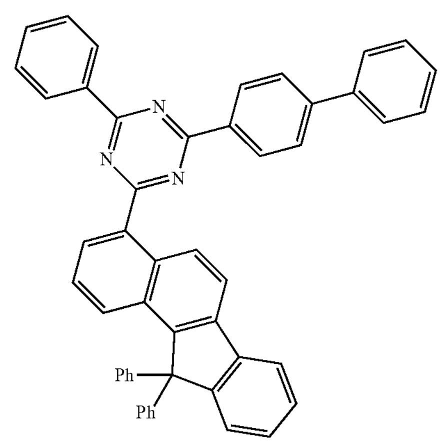
C-24
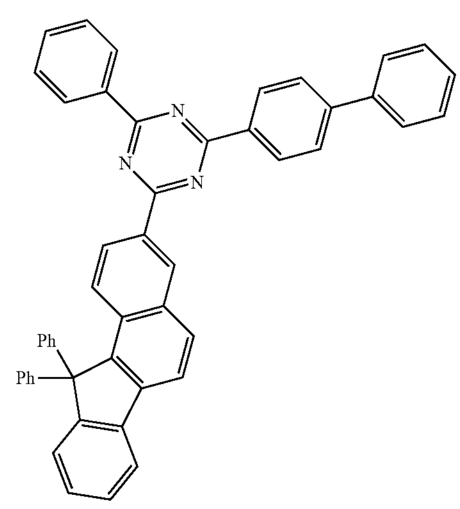

-continued
C-25
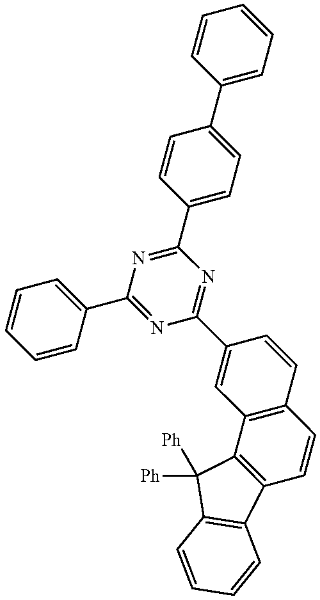
C-26
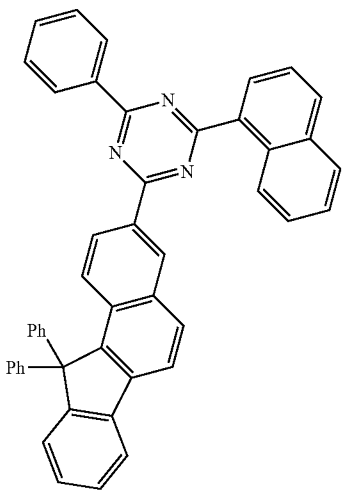
C-27
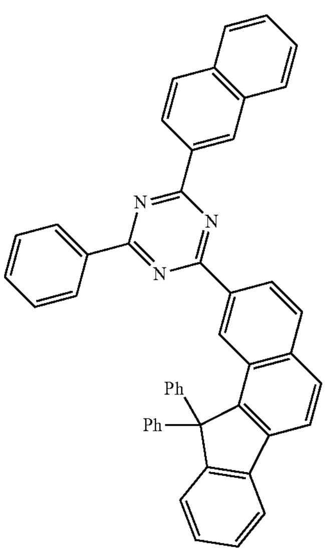
-continued
C-28
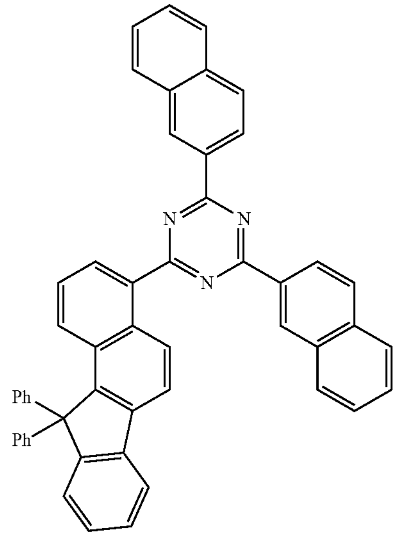
C-29
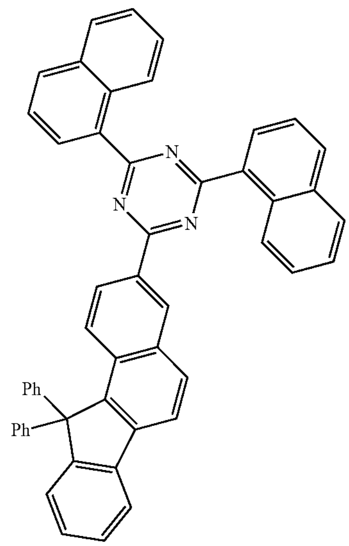
C-30
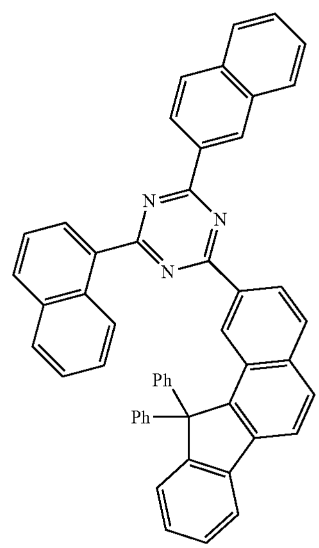

C-31
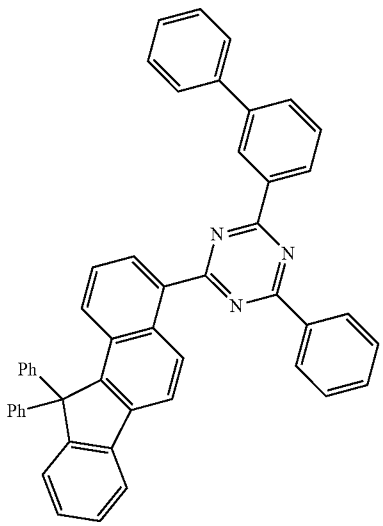
C-32
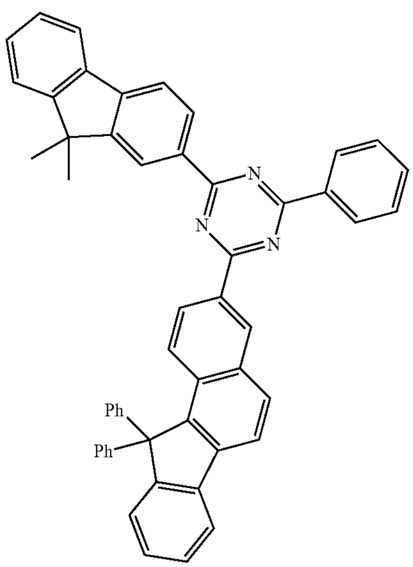
C-33
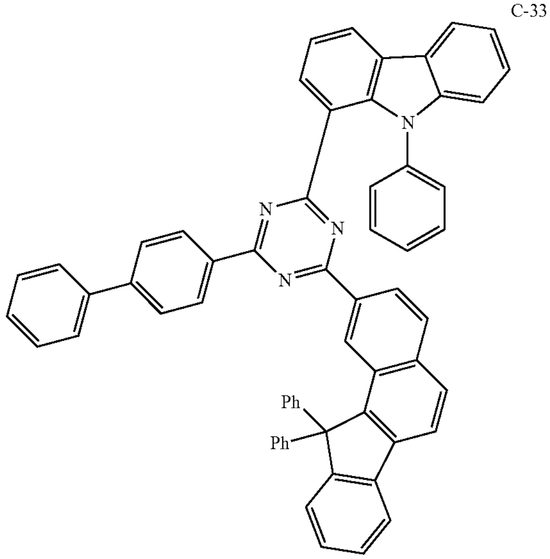
C-34
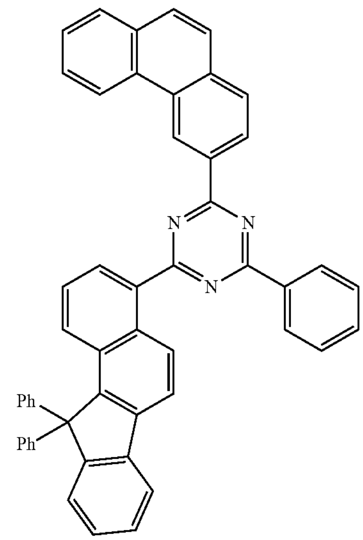
C-35
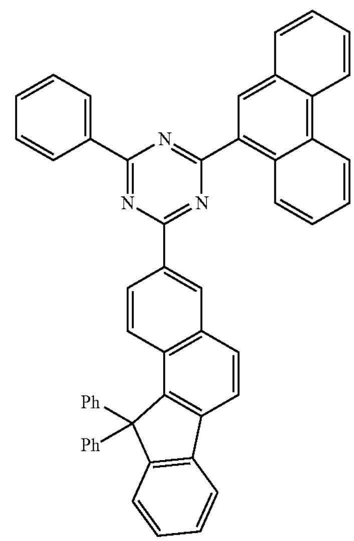
C-36
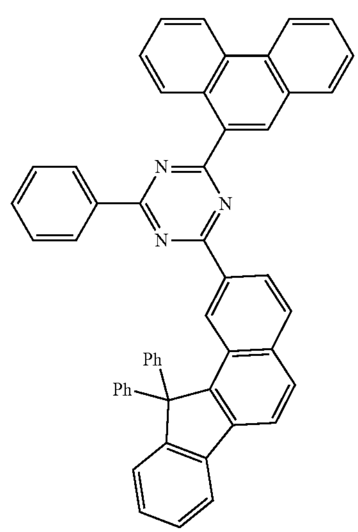

-continued
C-37
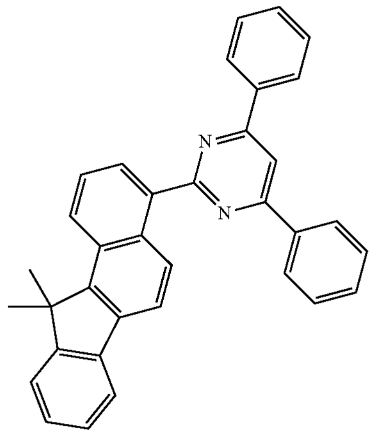
C-38
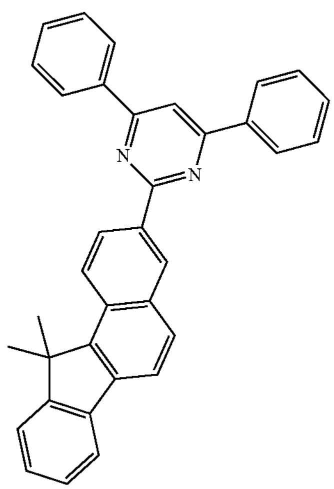
C-39
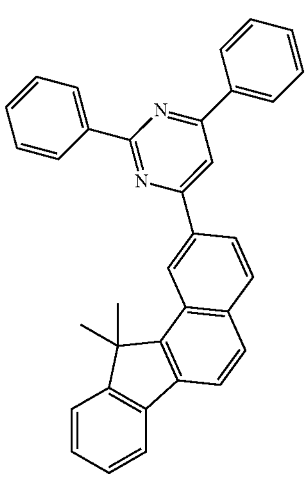
-continued
C-40
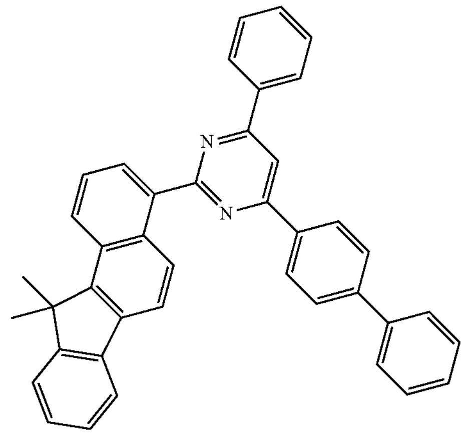
C-41
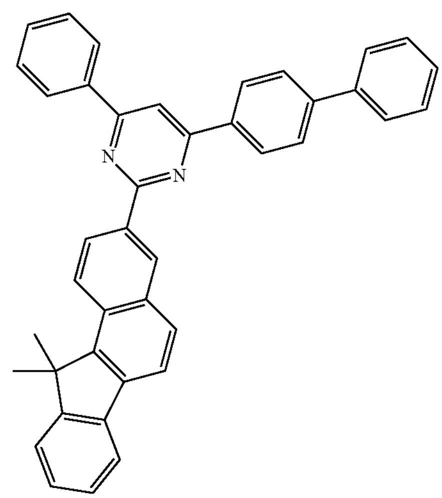
C-42
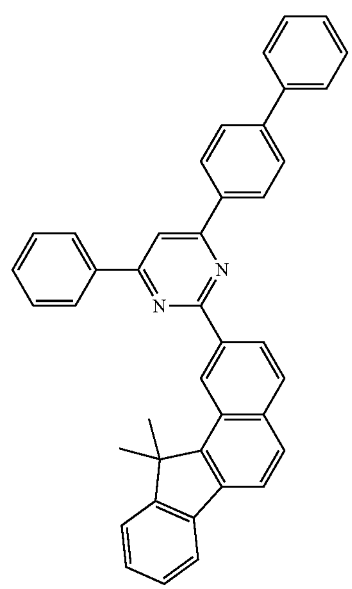

-continued
C-43
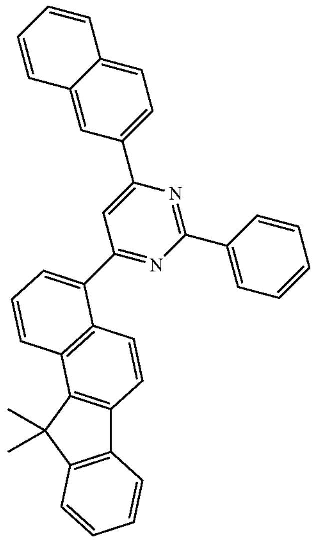
C-44
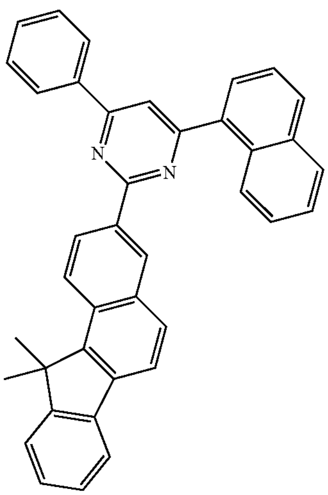
C-45
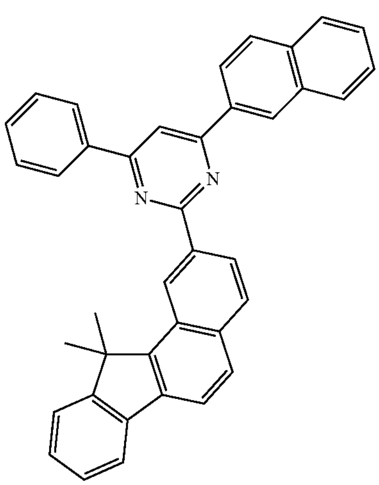
-continued
C-46
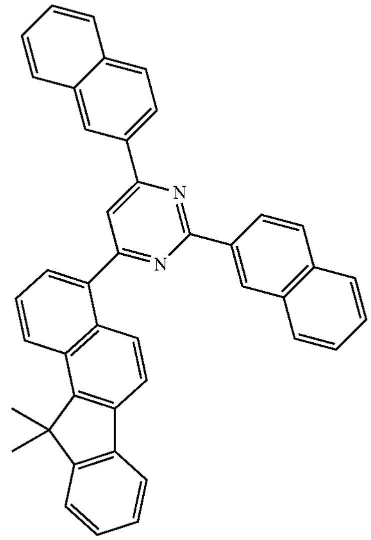
C-47
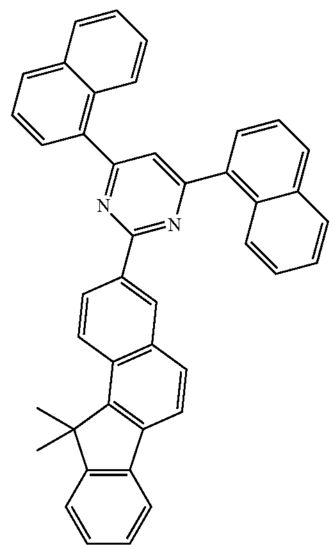
C-48
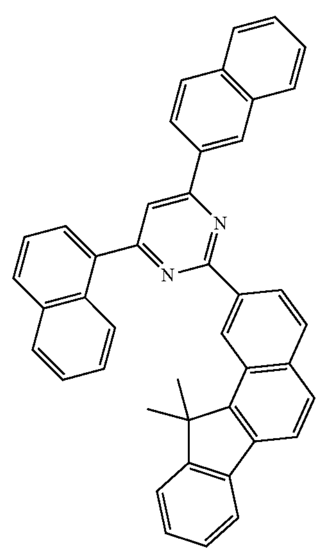

-continued
C-49
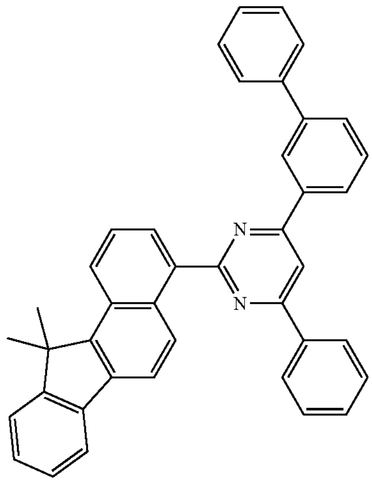
C-50
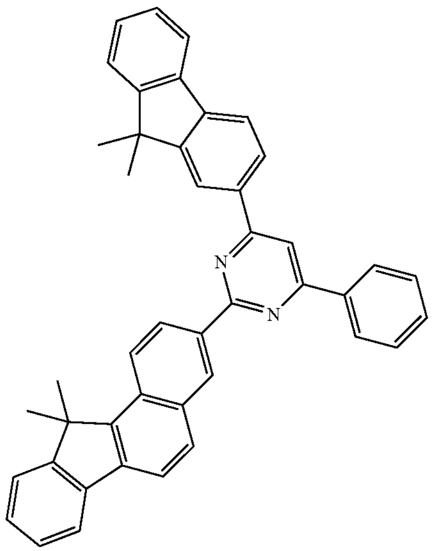
C-51
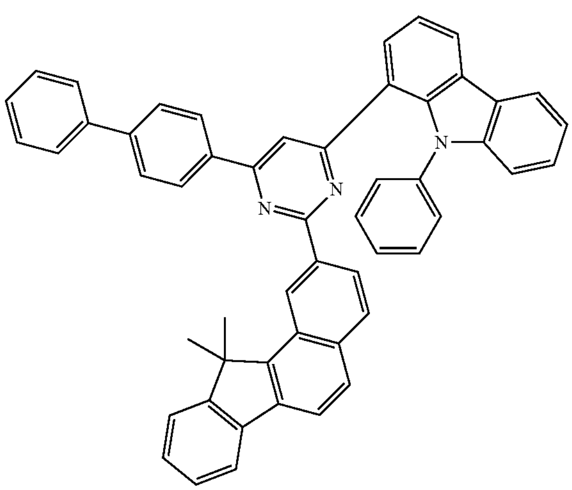
-continued
C-52
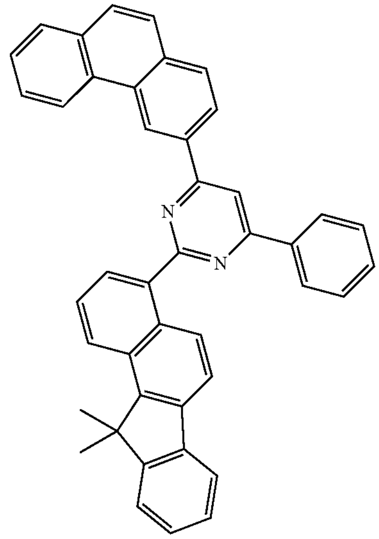
C-53
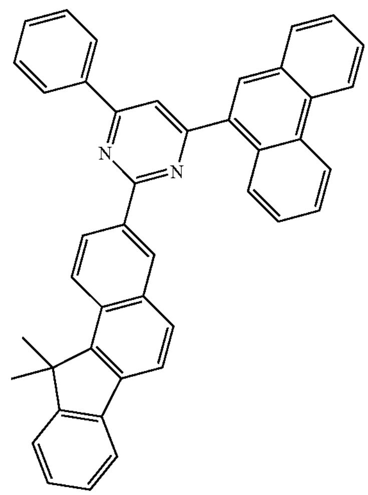
C-54
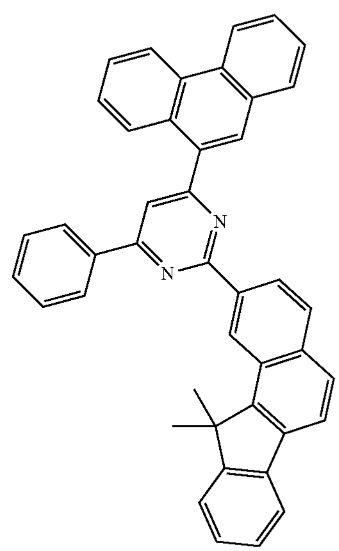

-continued
C-55
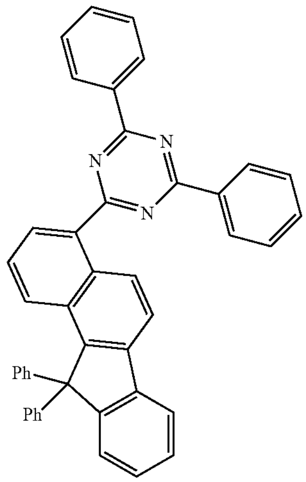
C-56
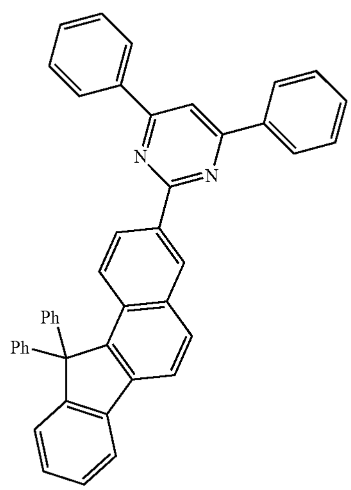
C-57
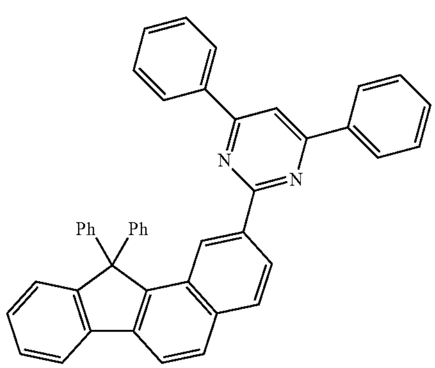
-continued
C-58
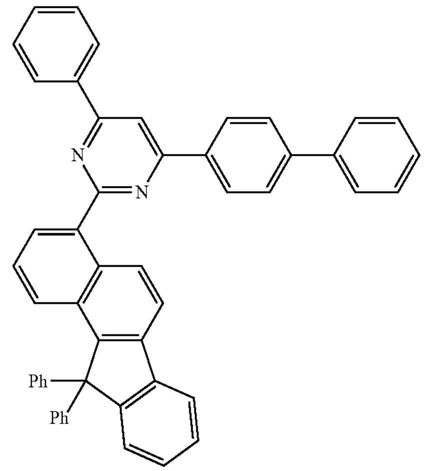
C-59
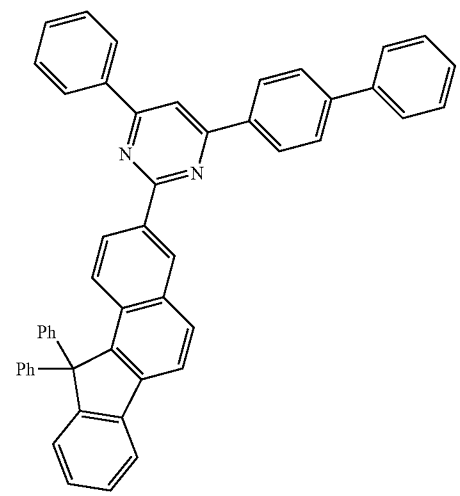
C-60
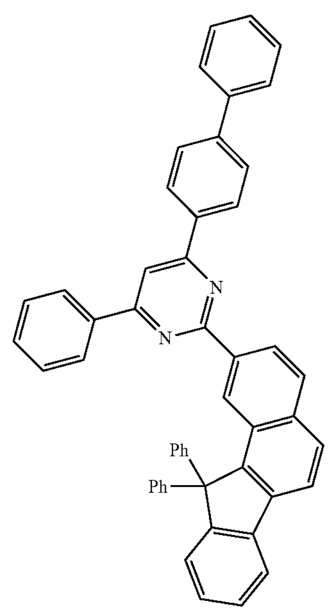

-continued
C-61
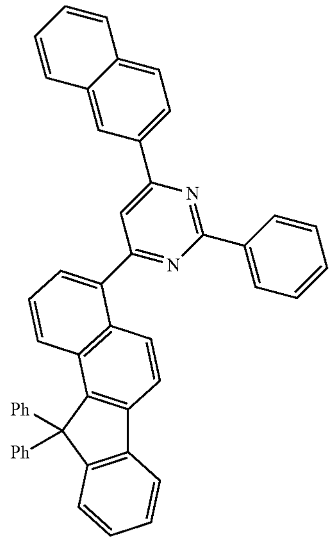
C-62
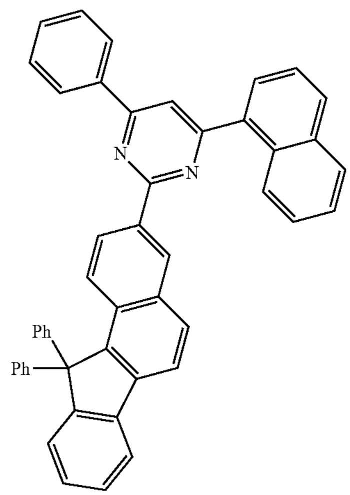
C-63
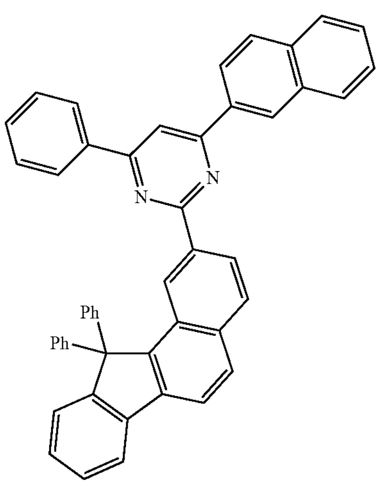
-continued
C-64
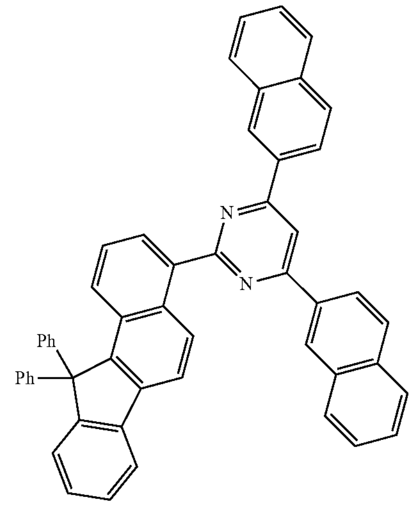
C-65
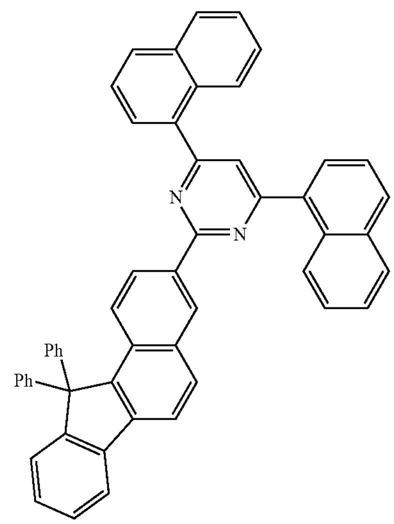
C-66
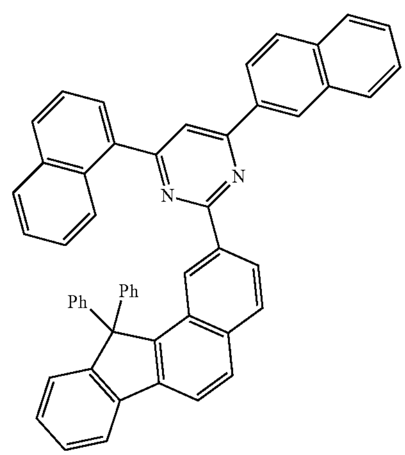

-continued
C-67
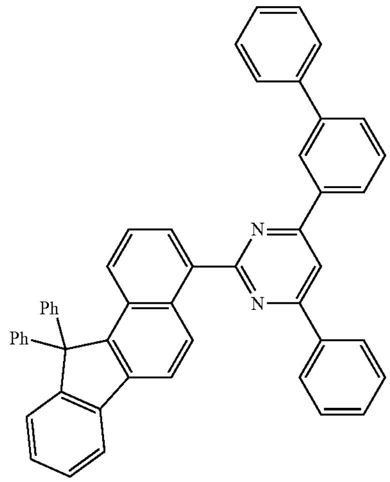
C-68
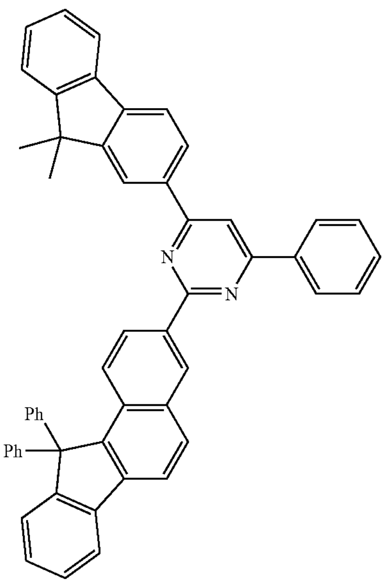
C-69
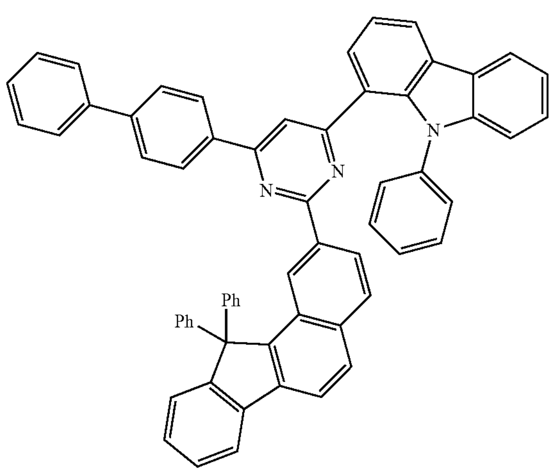
-continued
C-70
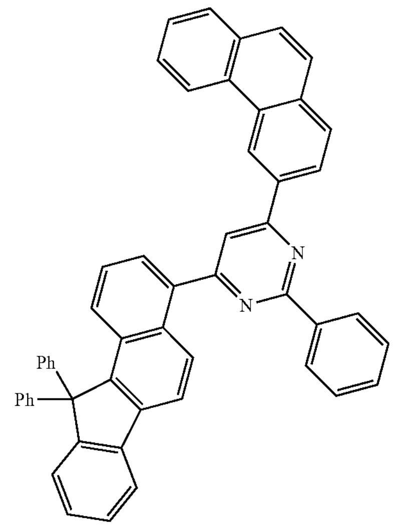
C-71
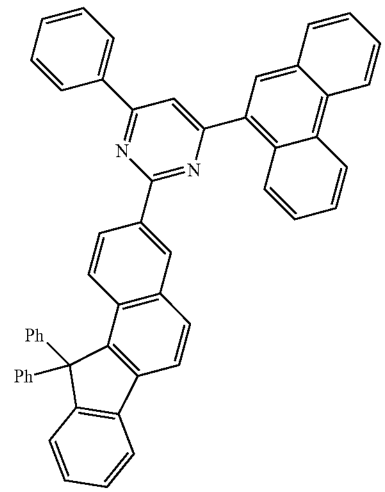
C-72
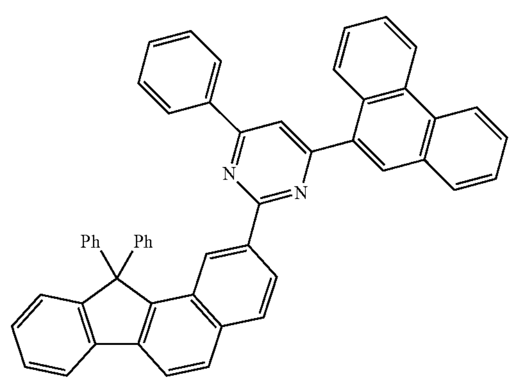

-continued
C-73
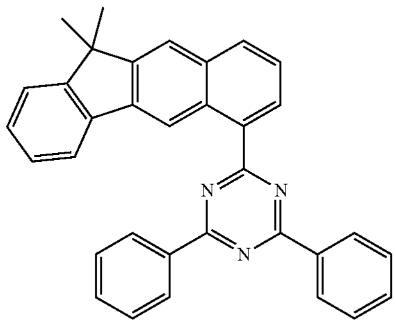
C-74
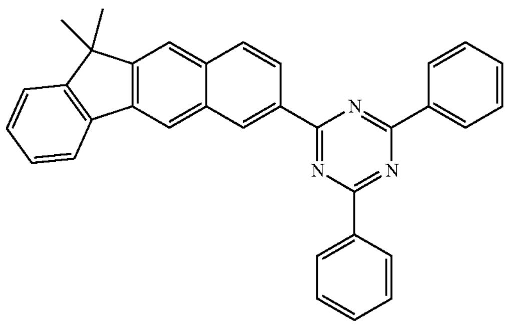
C-75
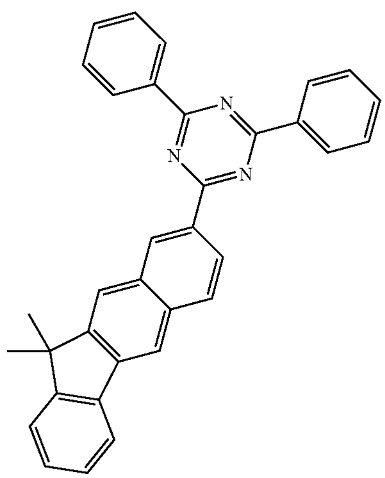
C-76
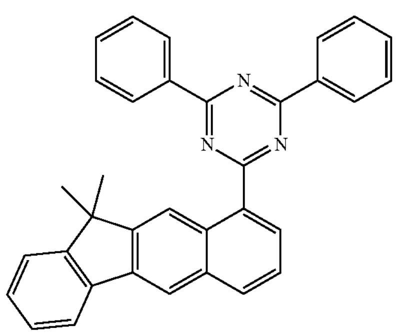
-continued
C-77
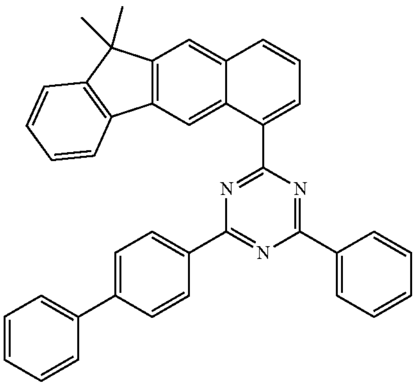
C-78
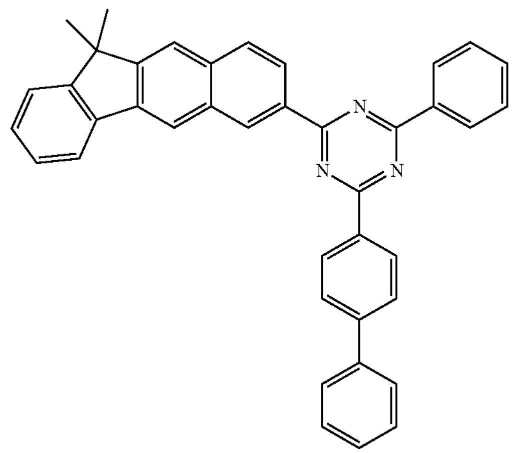
C-79
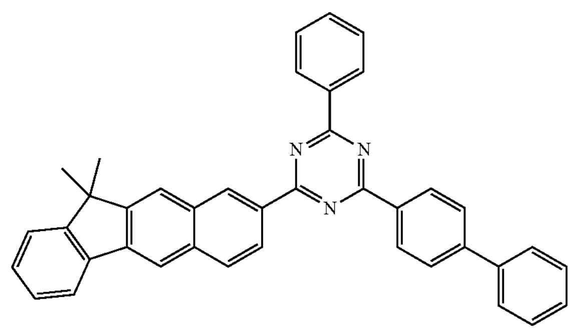
C-80
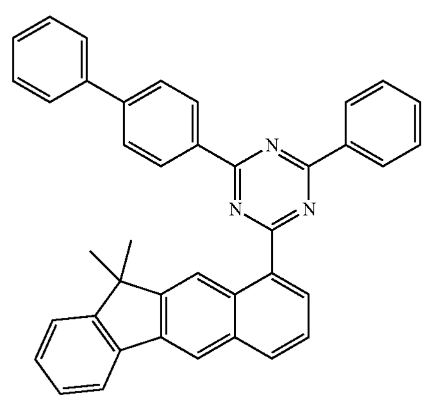

-continued
C-81
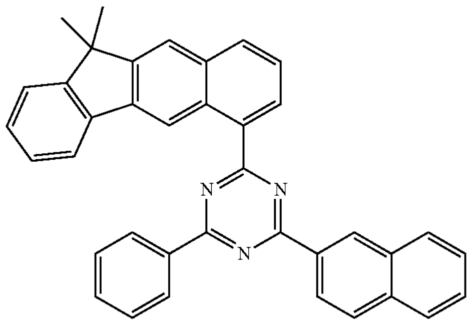
C-82
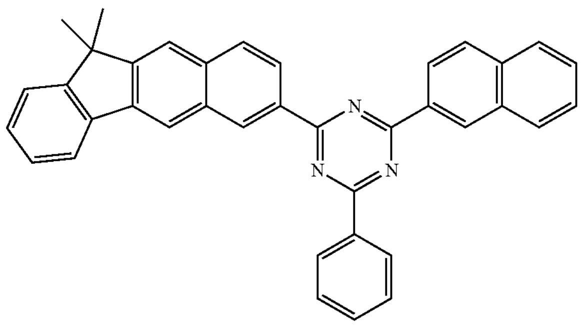
C-83
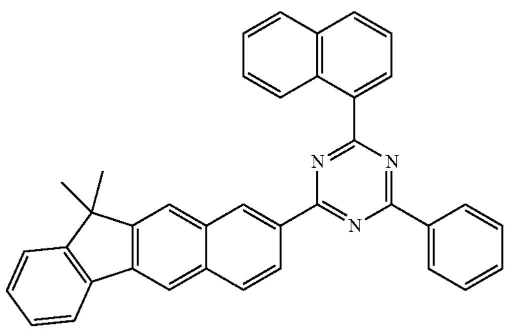
C-84
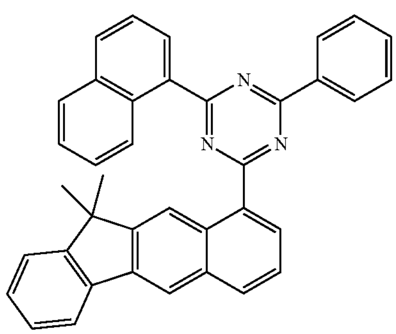
C-85
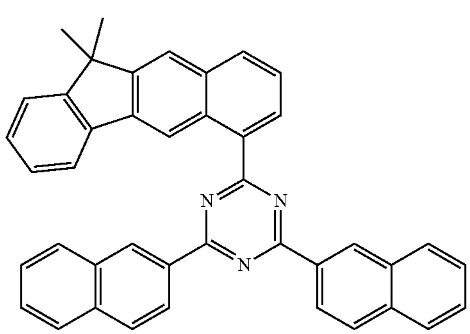
-continued
C-86
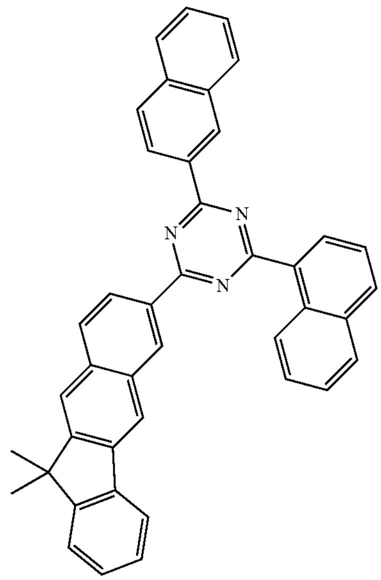
C-87
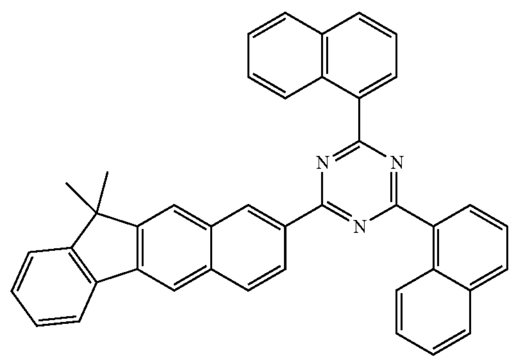
C-88
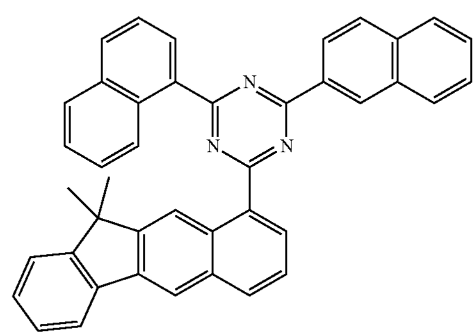

-continued
C-89
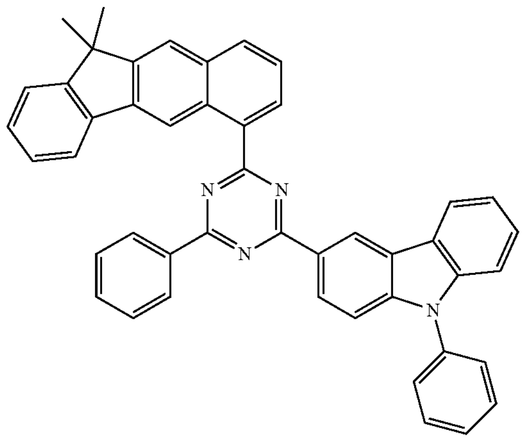
C-90
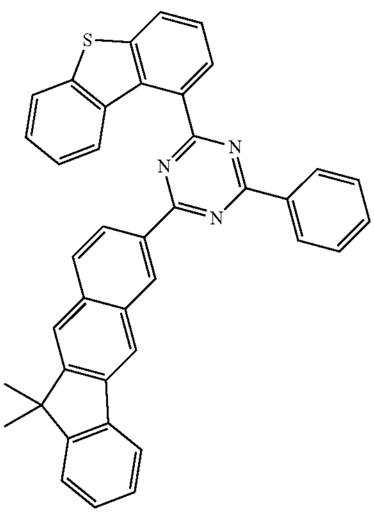
C-91
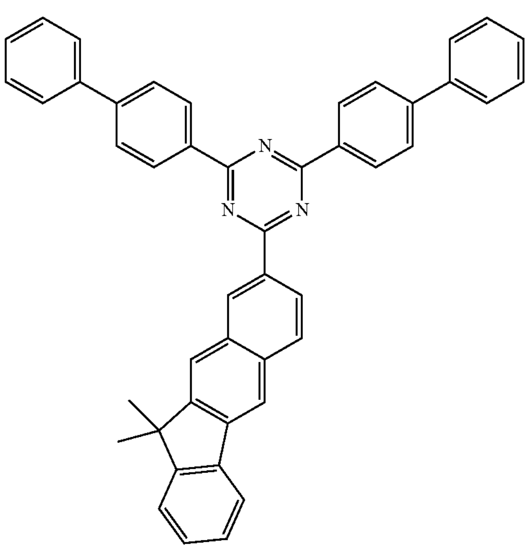
-continued
C-92
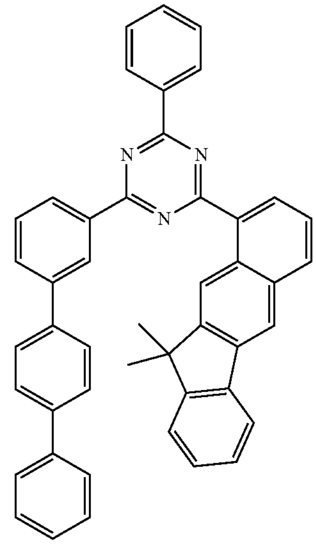
C-93
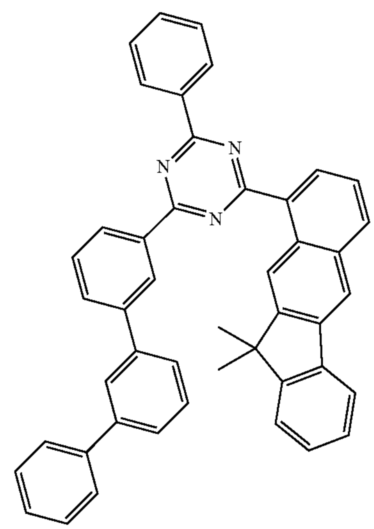
C-94
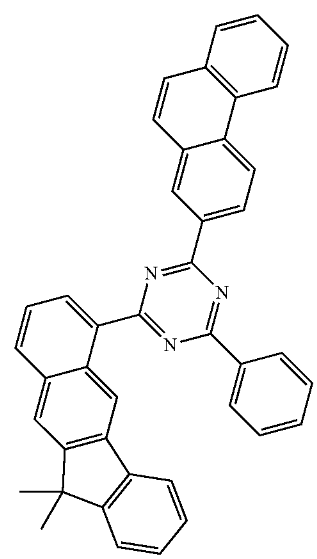

-continued
C-95
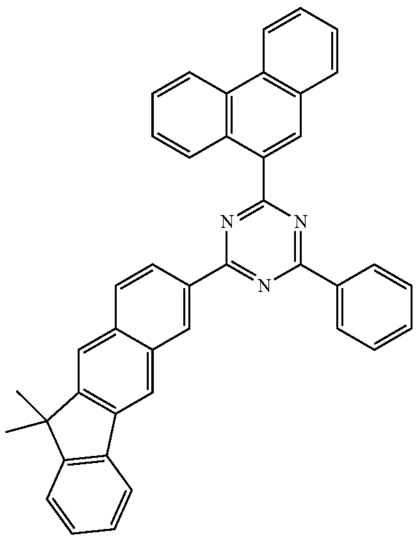
C-96
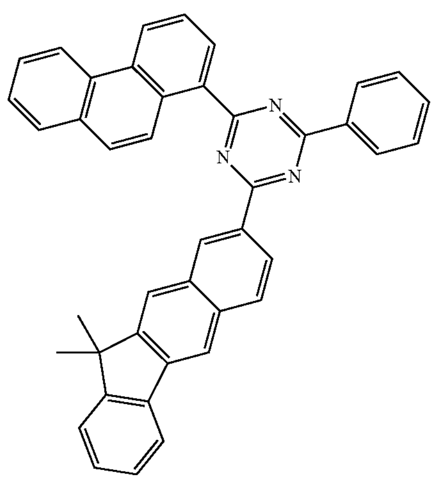
C-97
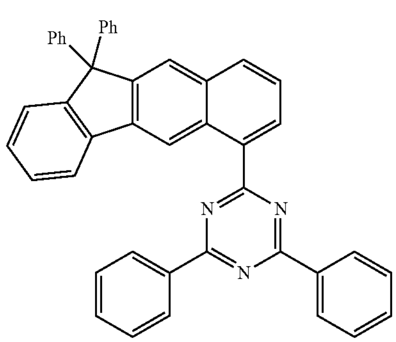
-continued
C-98
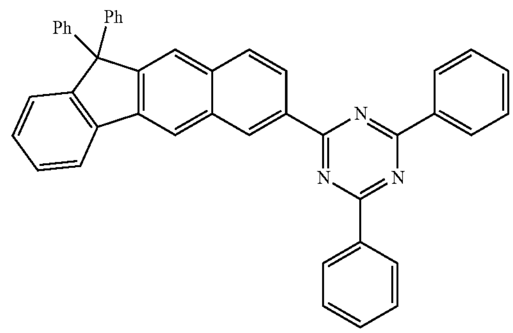
C-99
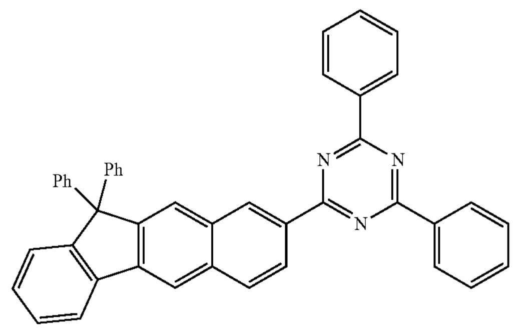
C-100
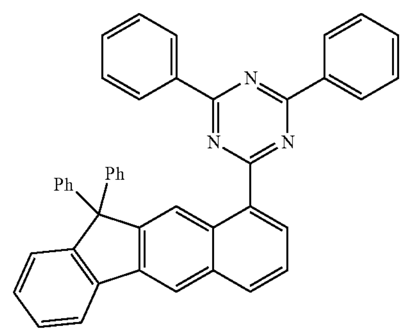
C-101
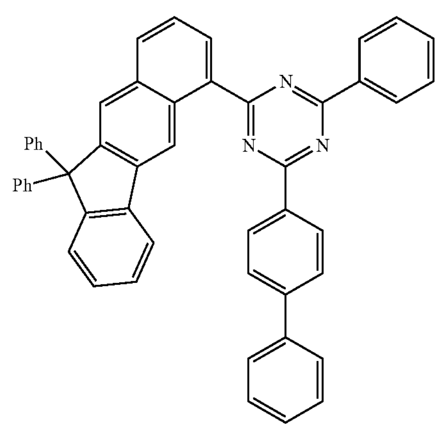

-continued
C-102
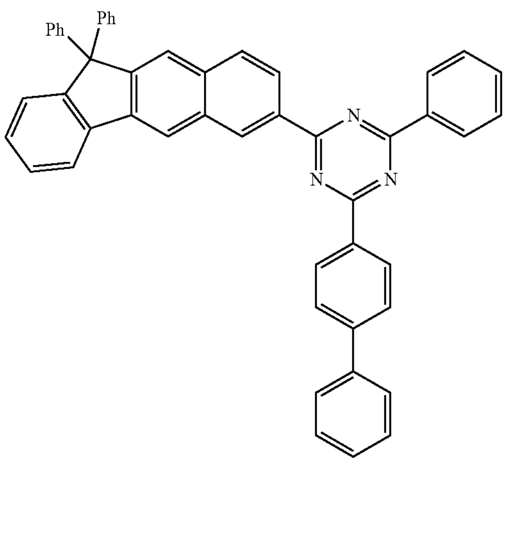
C-103
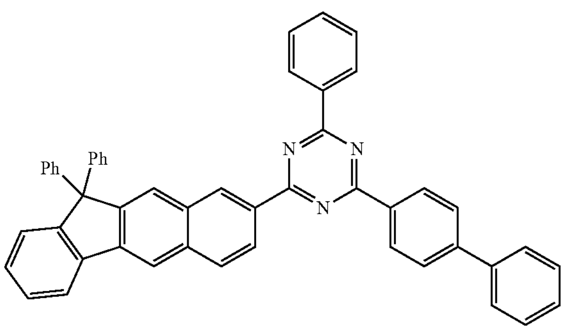
C-104
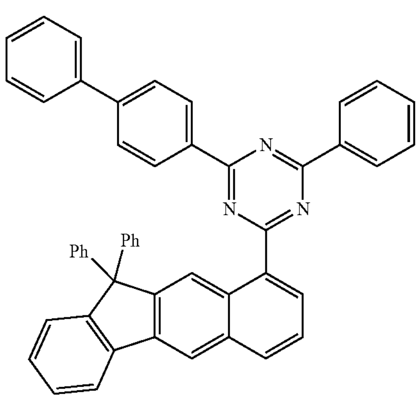
-continued
C-105
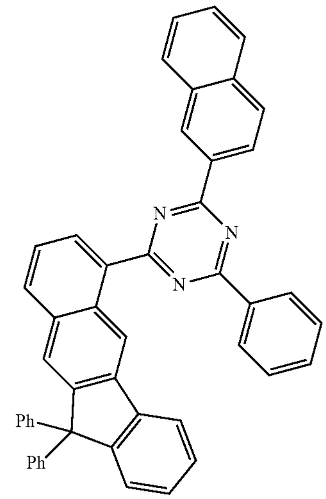
C-106
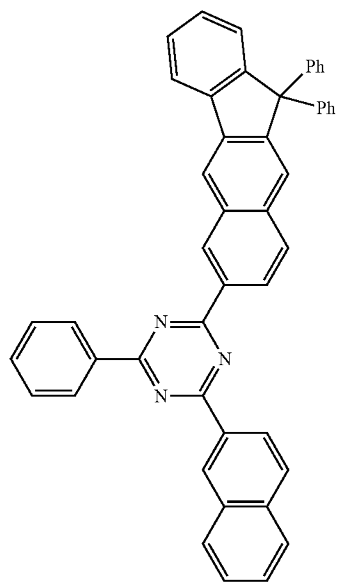
C-107
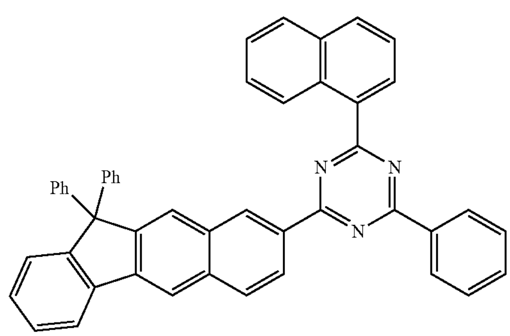

-continued
C-108
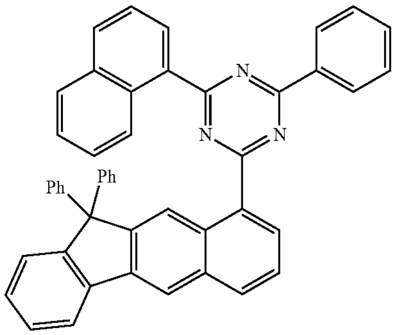
C-109
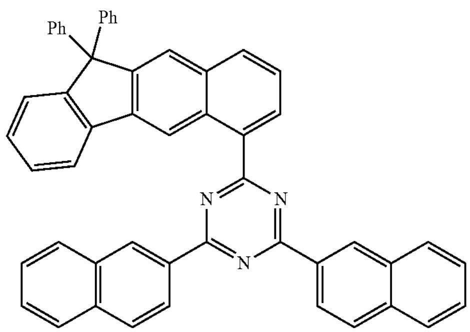
C-110
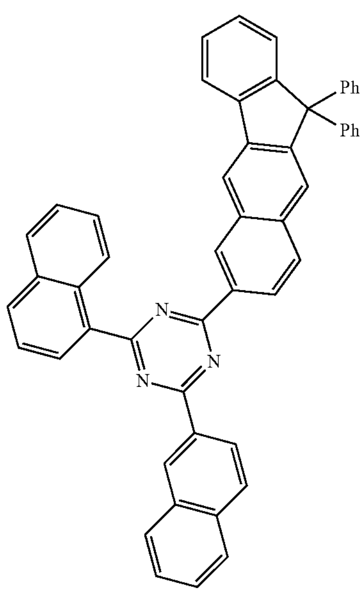
-continued
C-111
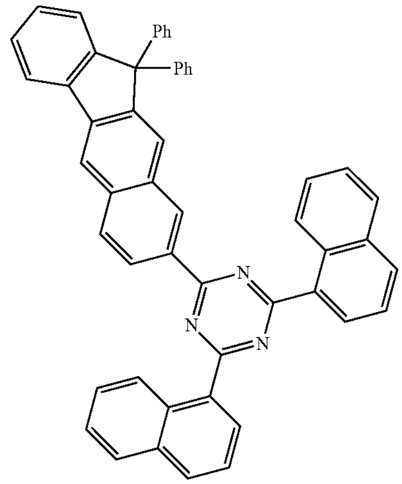
C-112
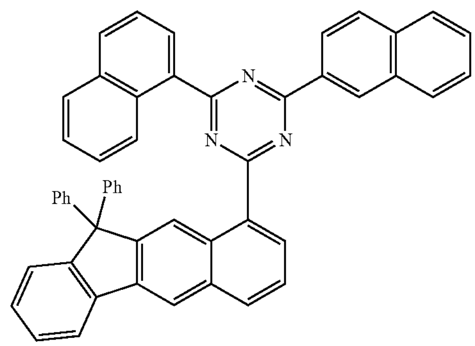
C-113
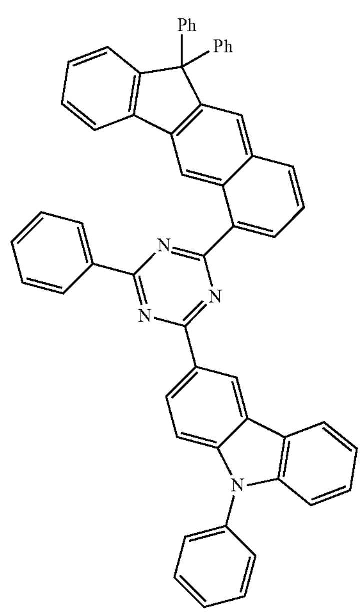

-continued
C-114
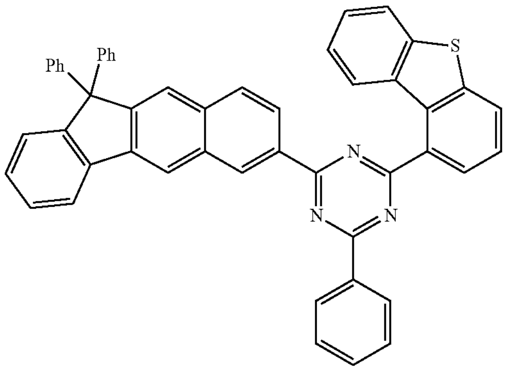
C-115
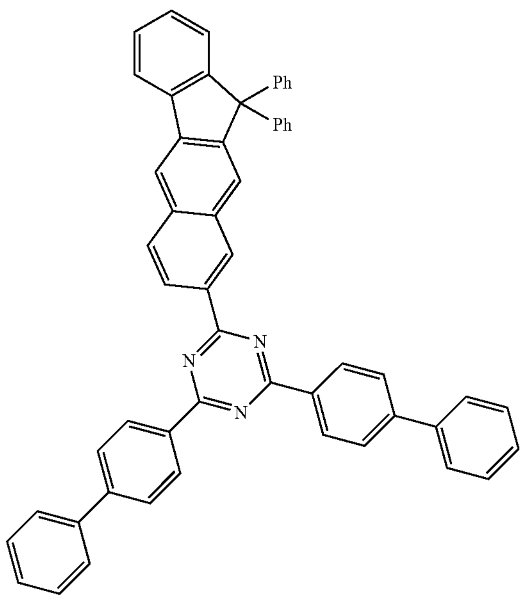
C-116
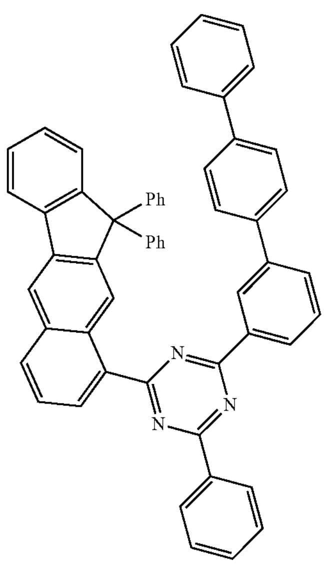
-continued
C-117
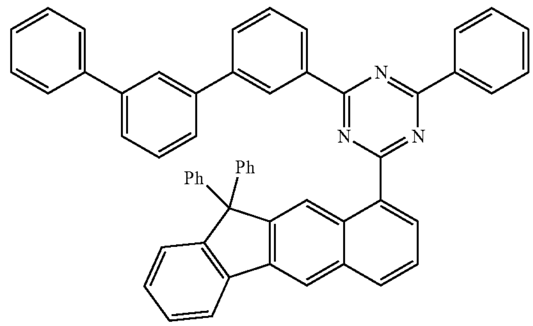
C-118
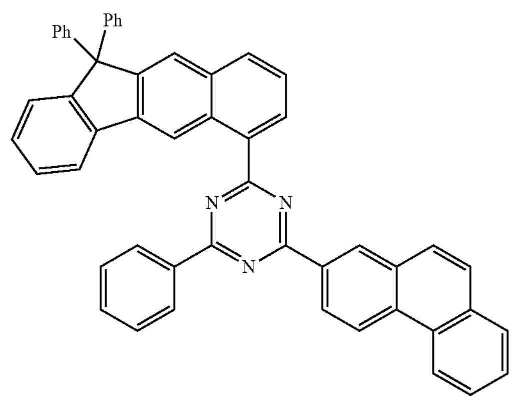
C-119
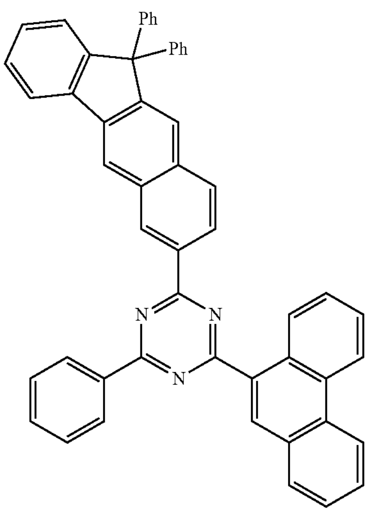

-continued
C-120
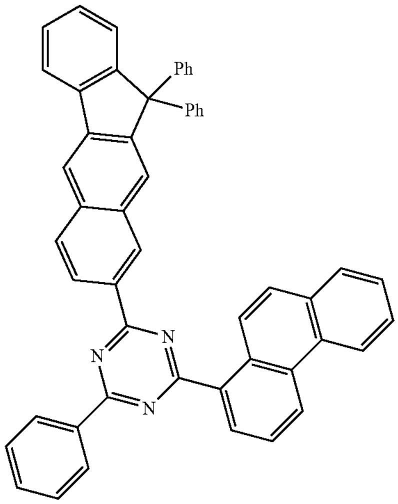
C-121
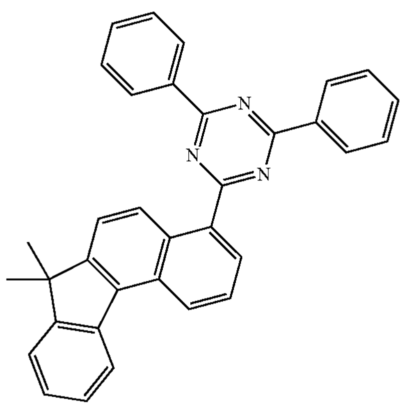
C-122
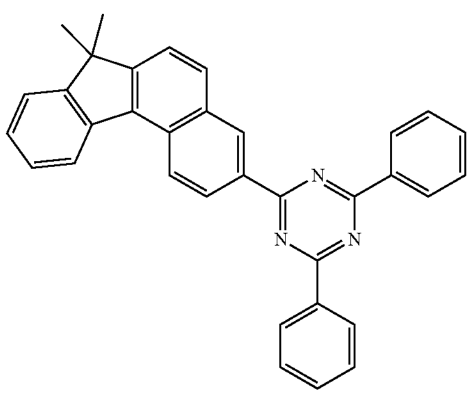
-continued
C-123
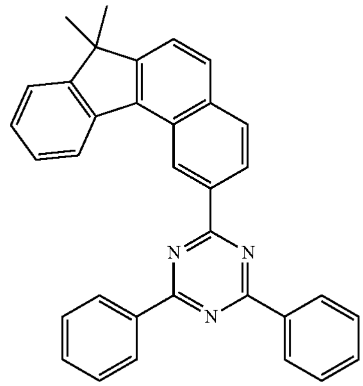
C-124
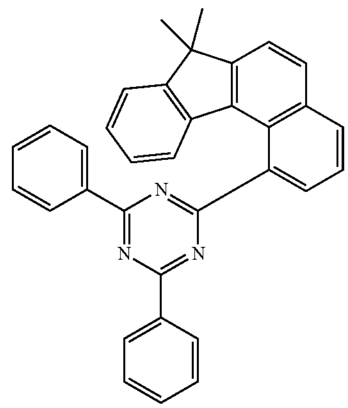
C-125
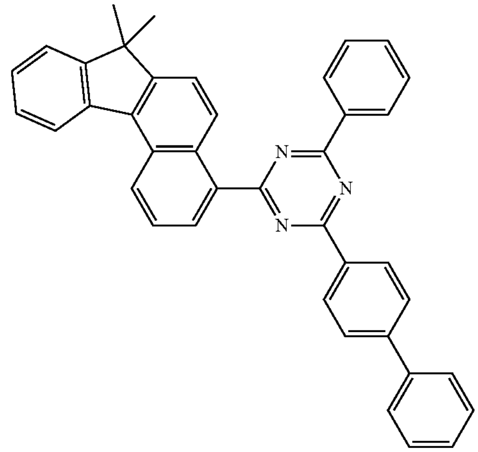

-continued
C-126
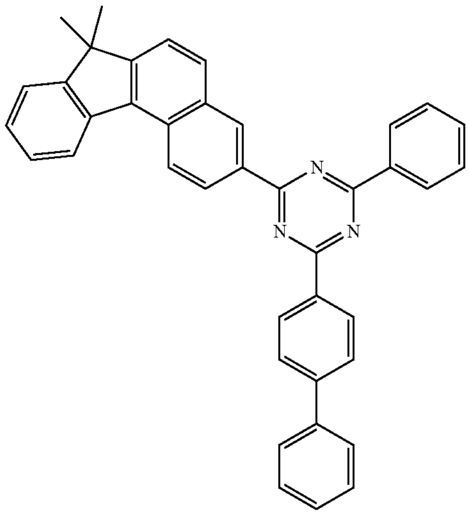
C-127
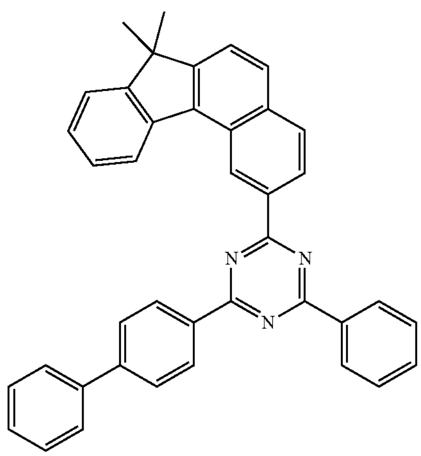
C-128
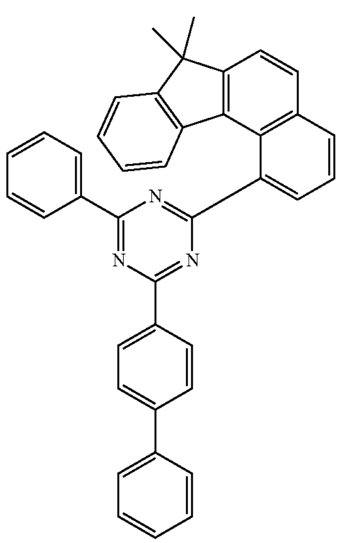
-continued
C-129
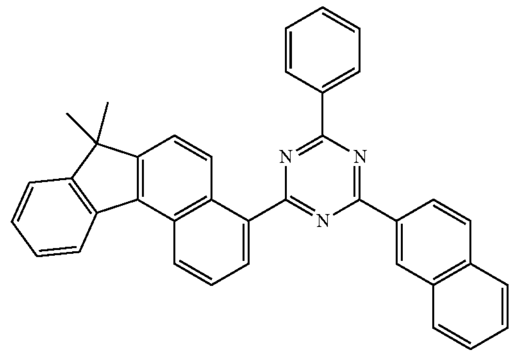
C-130
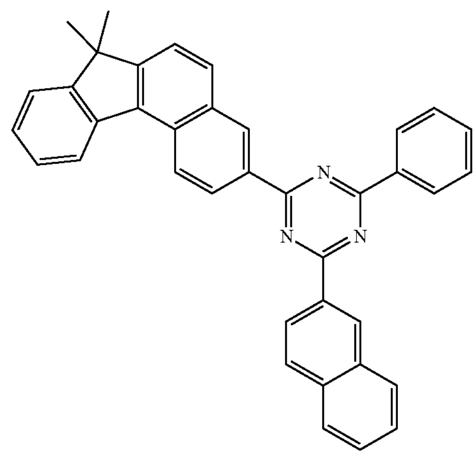
C-131
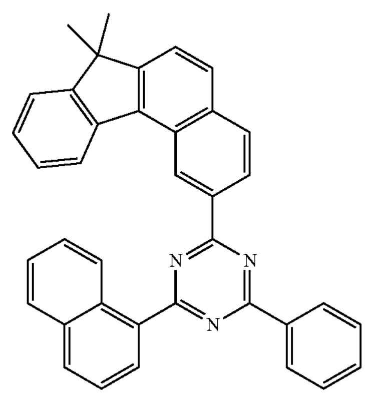
C-132
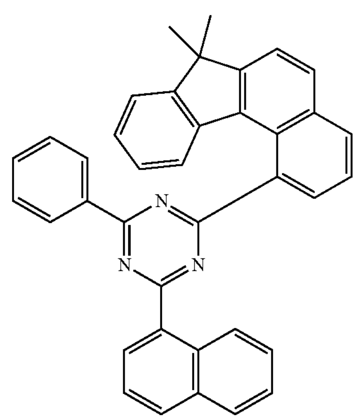

-continued
C-133
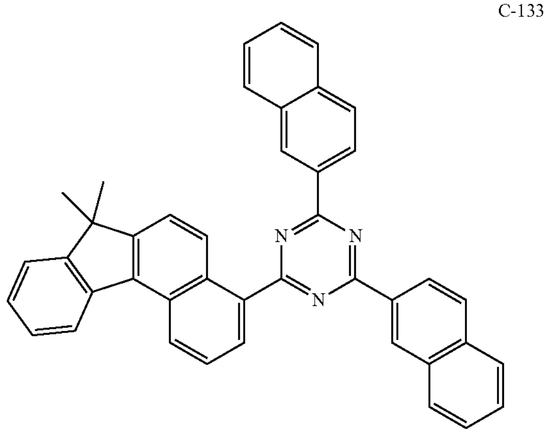
C-134
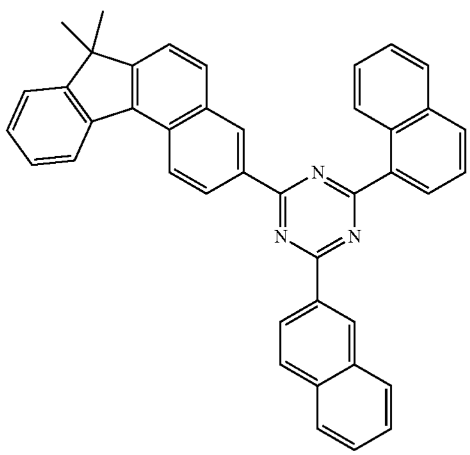
C-135
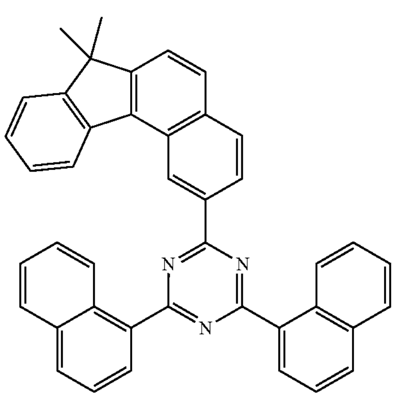
-continued
C-136
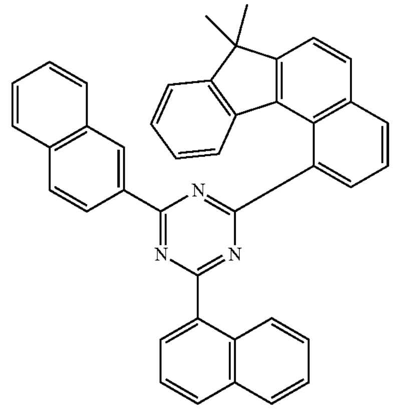
C-137
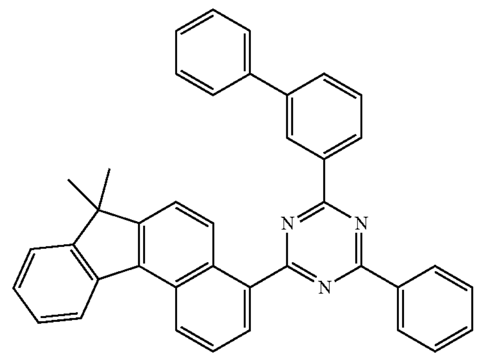
C-138
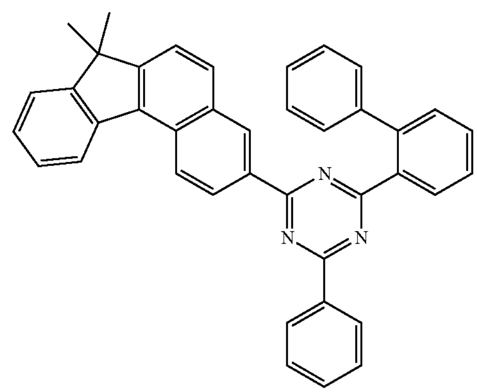
C-139
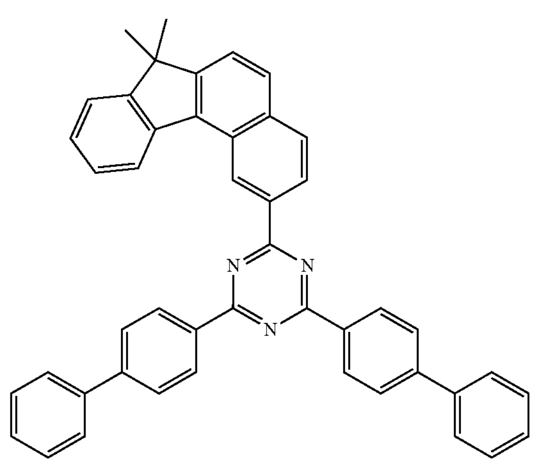

-continued
C-140
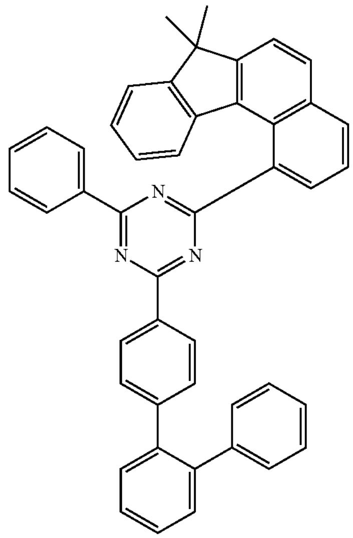
C-141
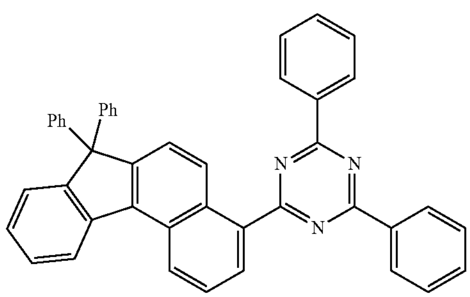
C-142
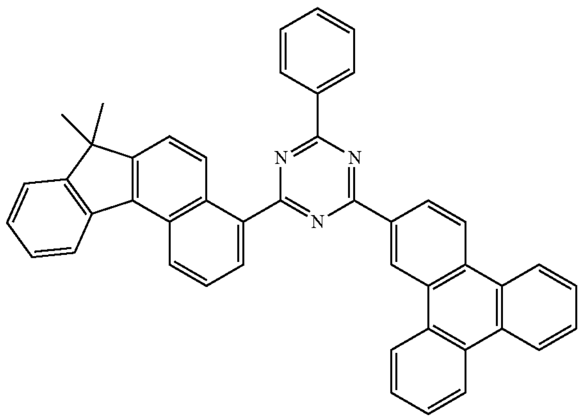
-continued
C-143
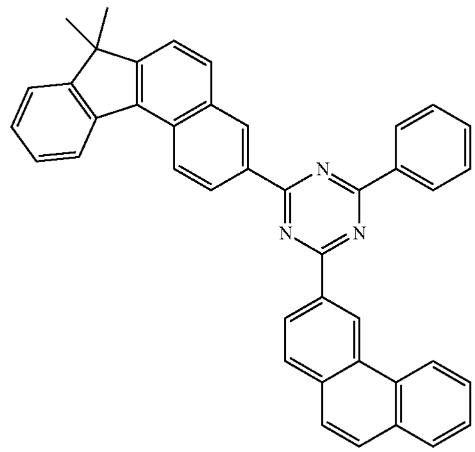
C-144
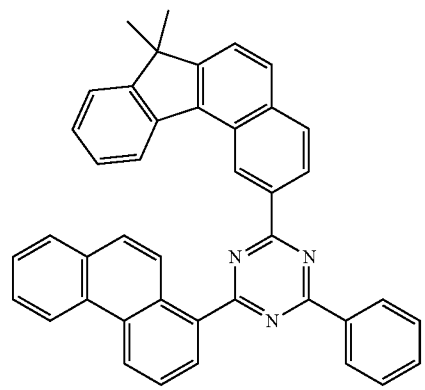
C-145
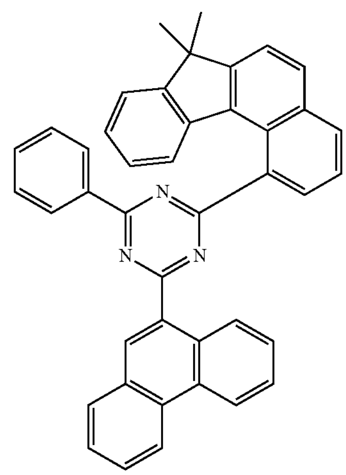

C-146
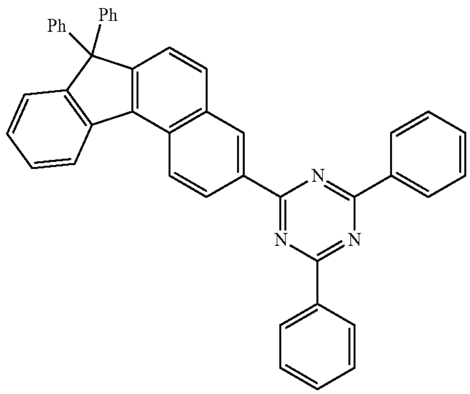
C-147
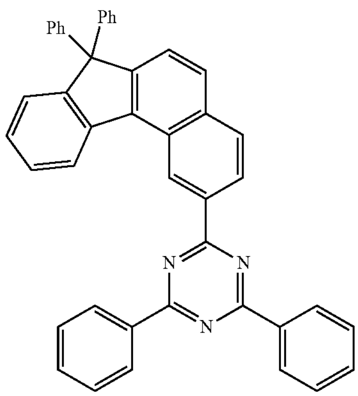
C-148
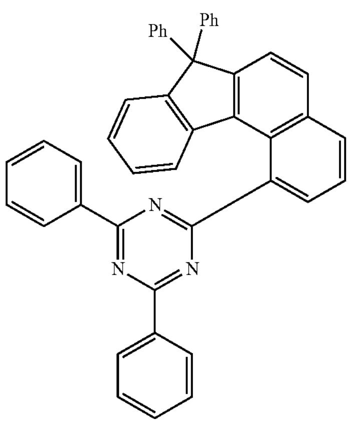
C-149
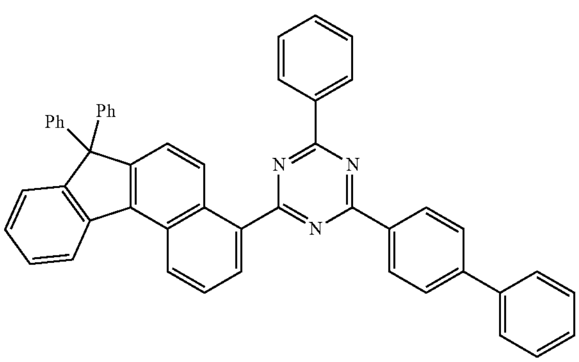
C-150
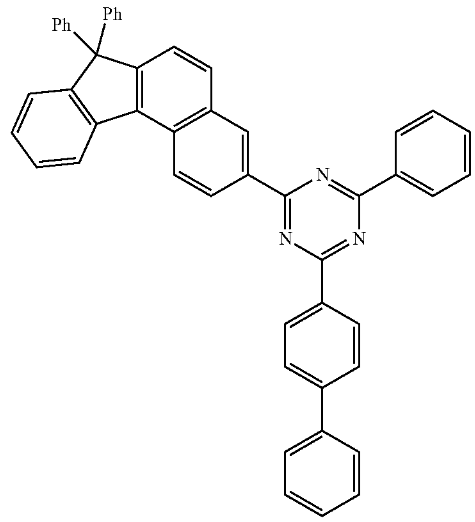
C-151
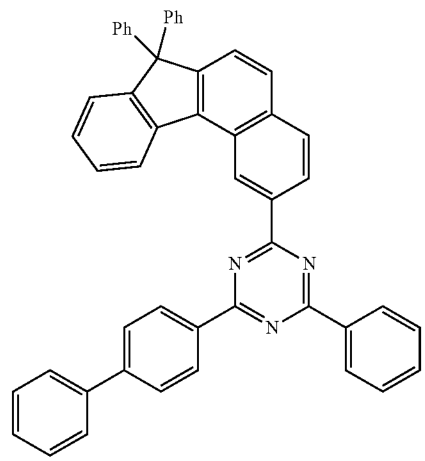
C-152
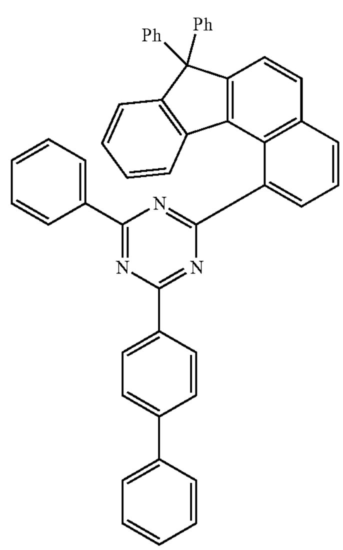

-continued
C-153
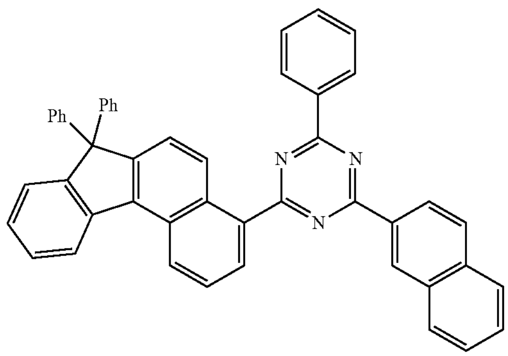
C-154
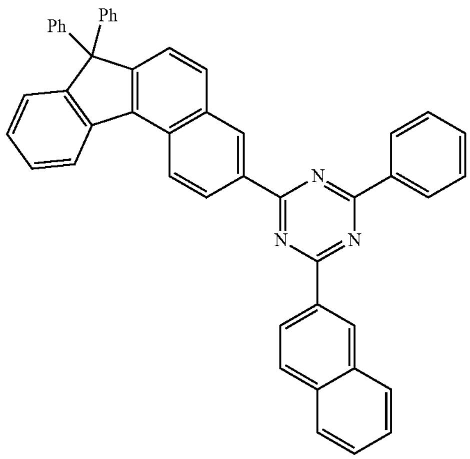
C-155
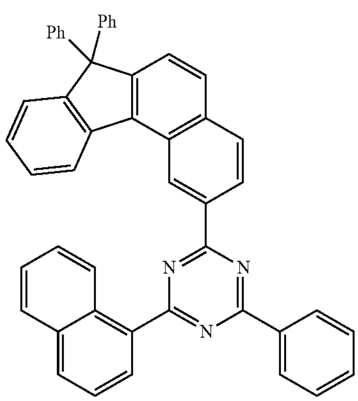
C-156
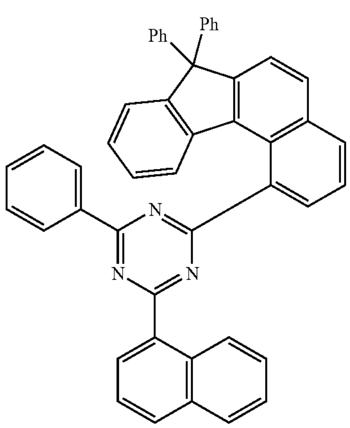
-continued
C-157
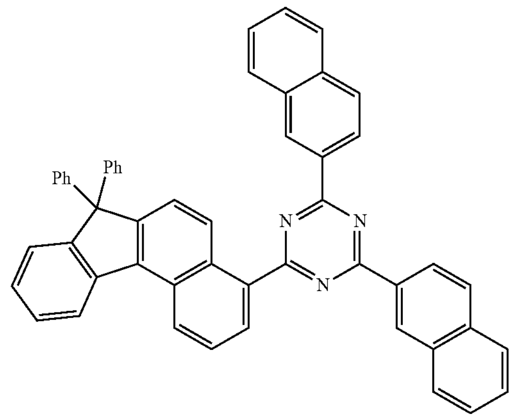
C-158
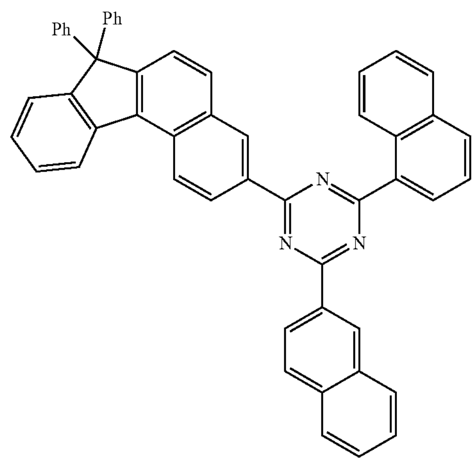
C-159
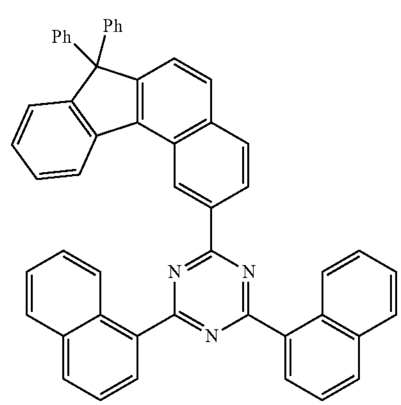

-continued
C-160
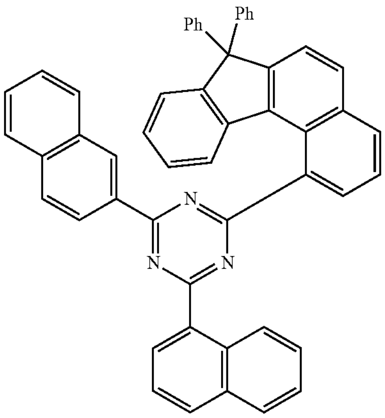
C-161
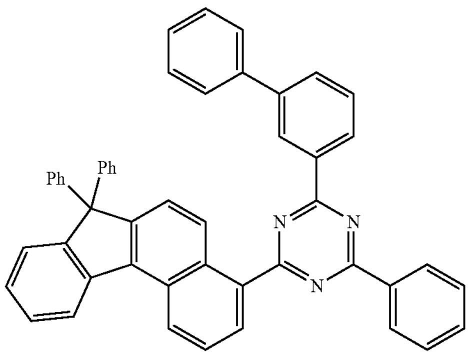
C-162
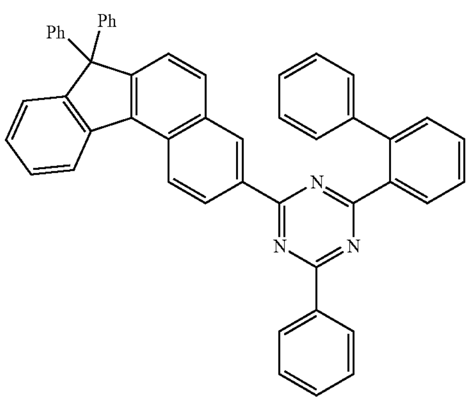
C-163
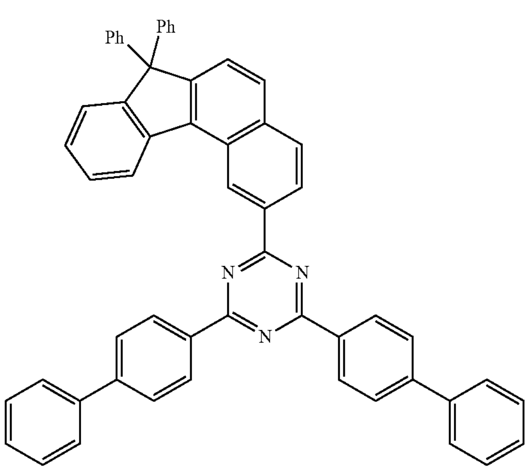
-continued
C-164
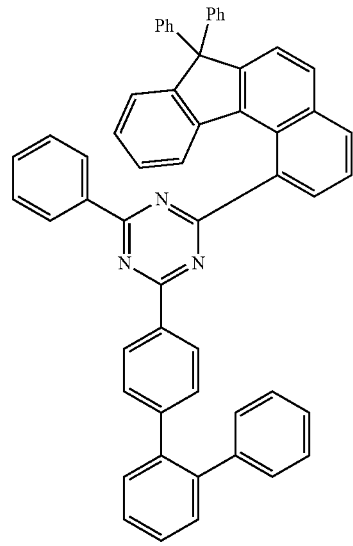
C-165
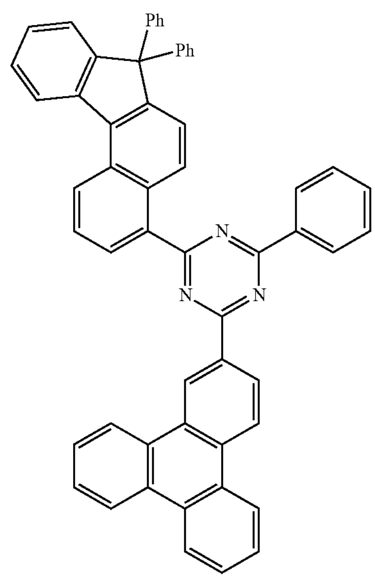
C-166
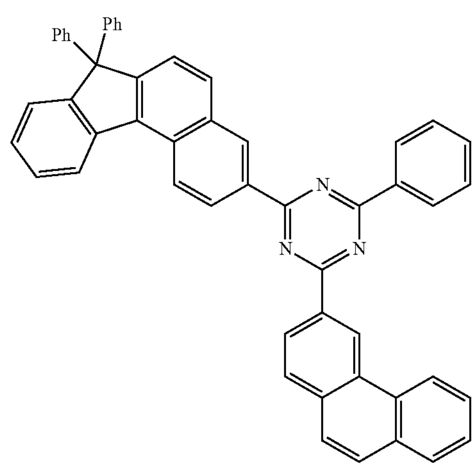

C-167
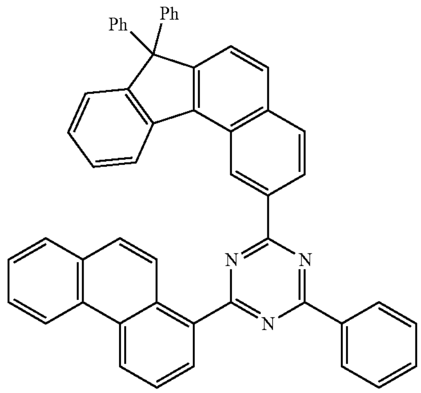
C-168
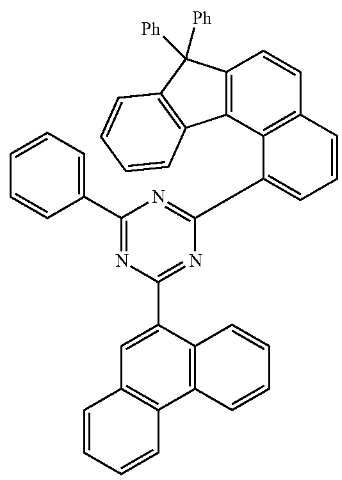
C-169
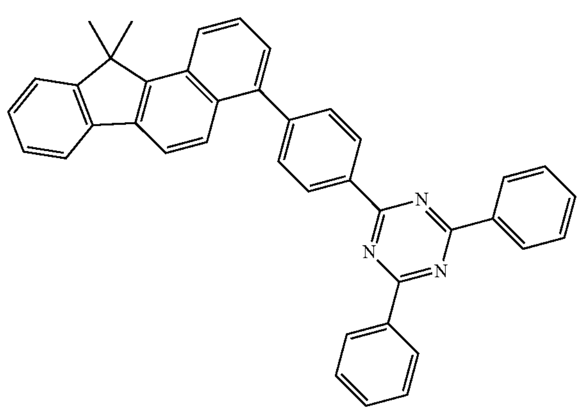
C-170
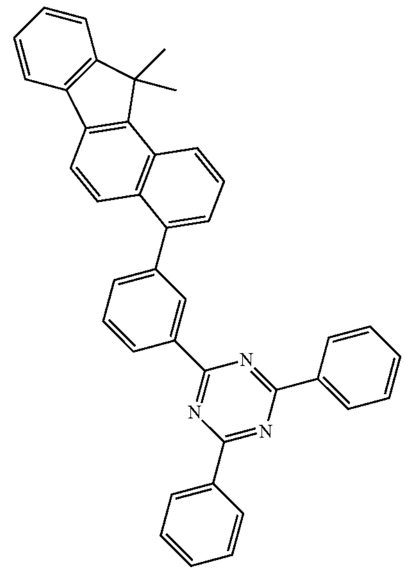
C-171
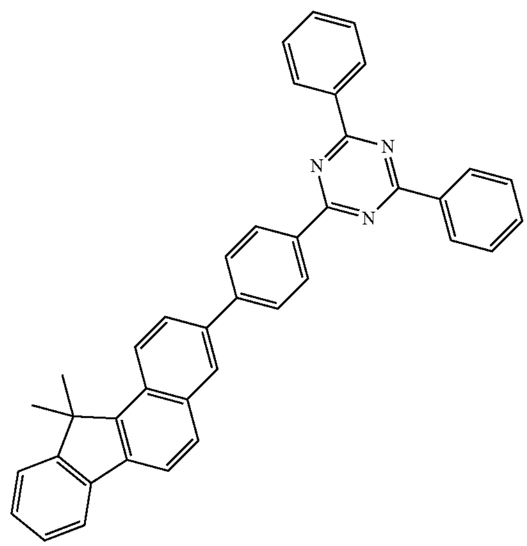
C-172
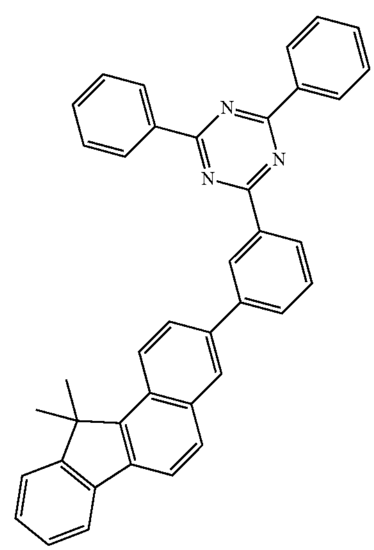

-continued
C-173
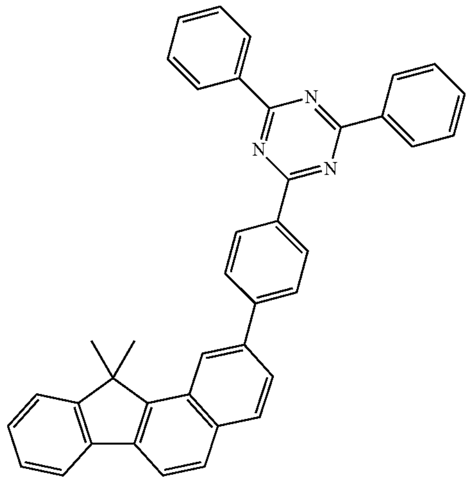
C-174
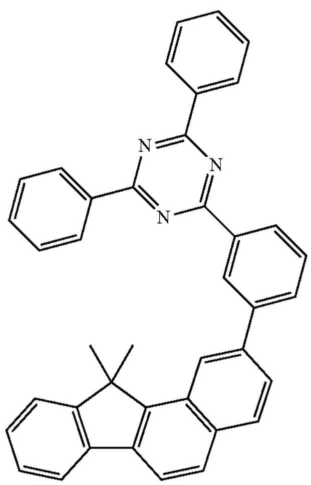
C-175
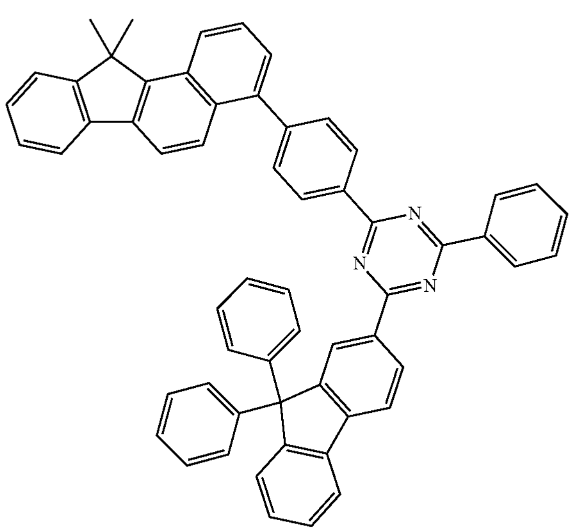
-continued
C-176
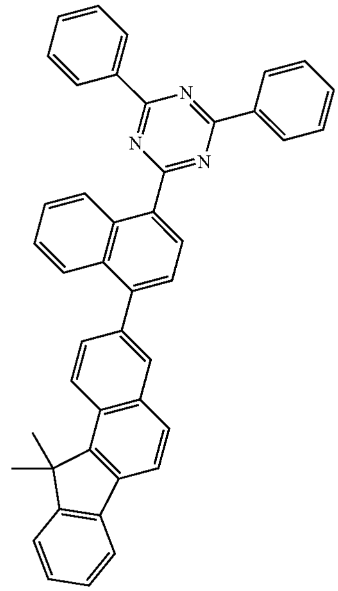
C-177
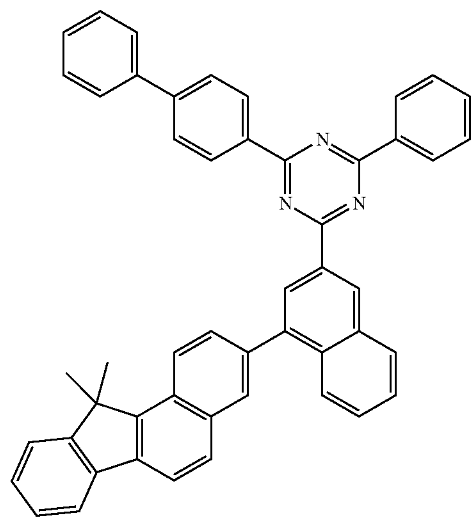
C-178
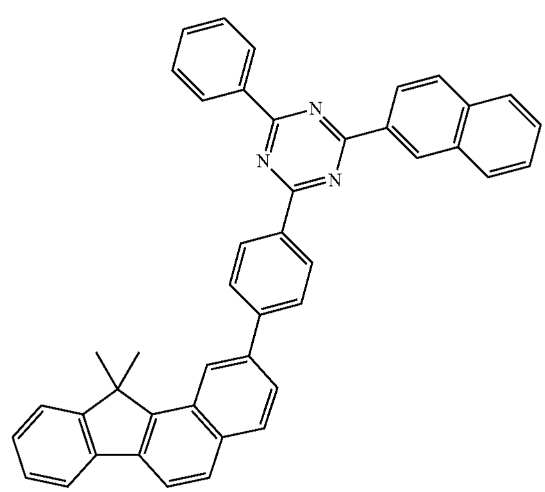

-continued
C-179
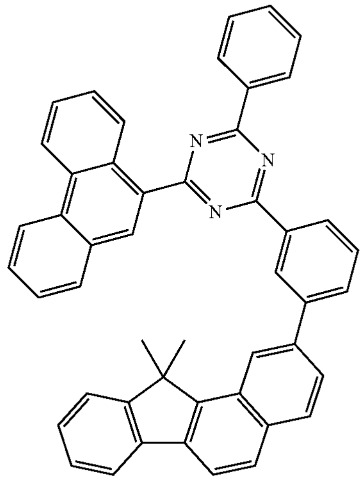
C-180
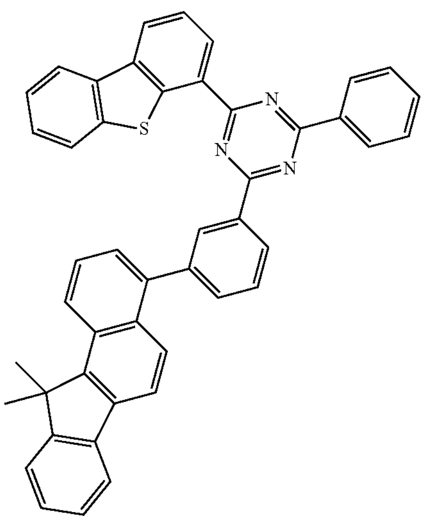
C-181
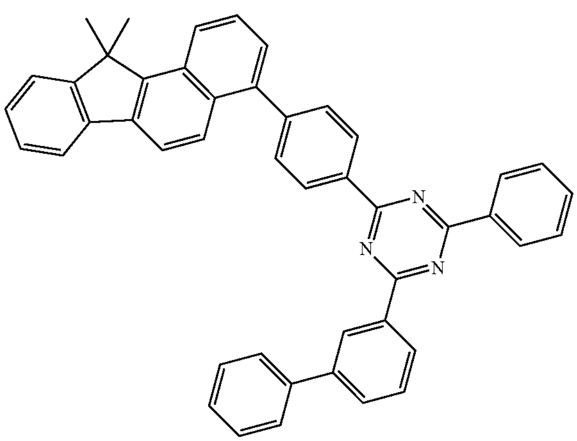
-continued
C-182
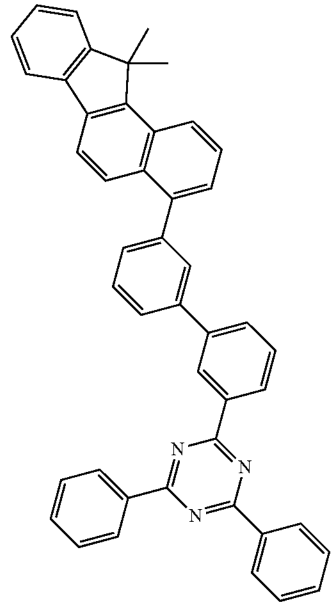
C-183
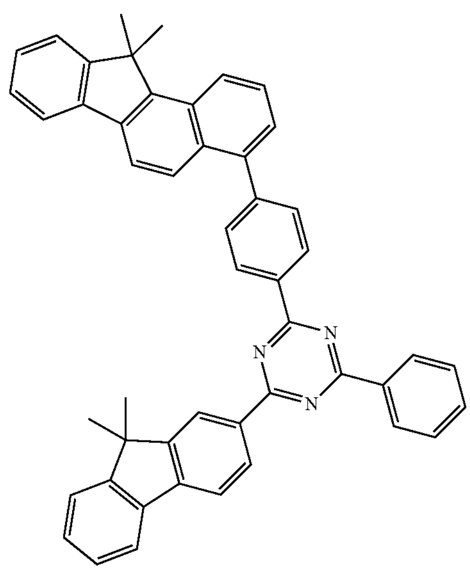

-continued
C-184
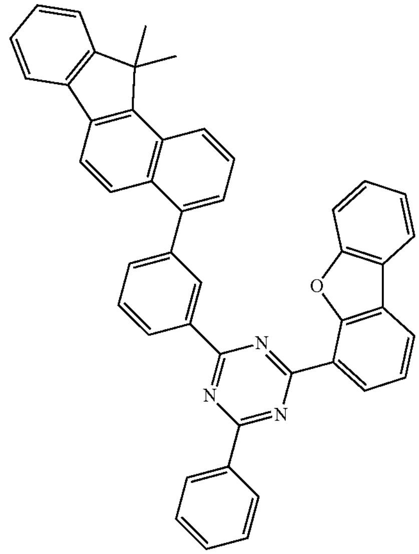
C-185
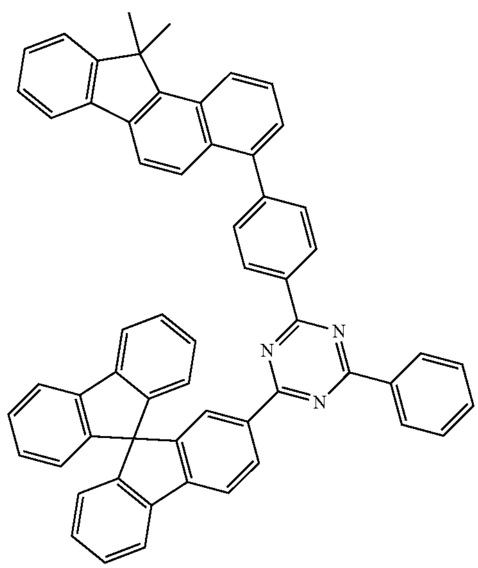
C-186
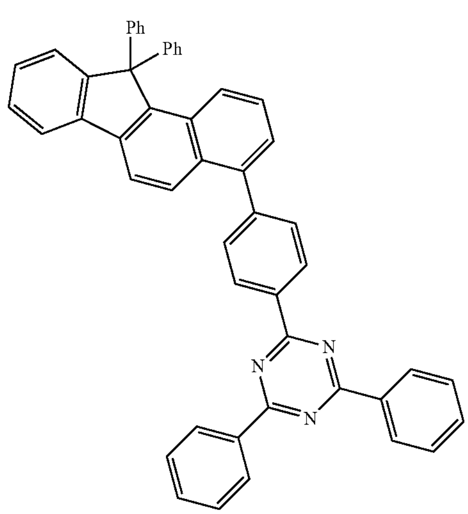
-continued
C-187
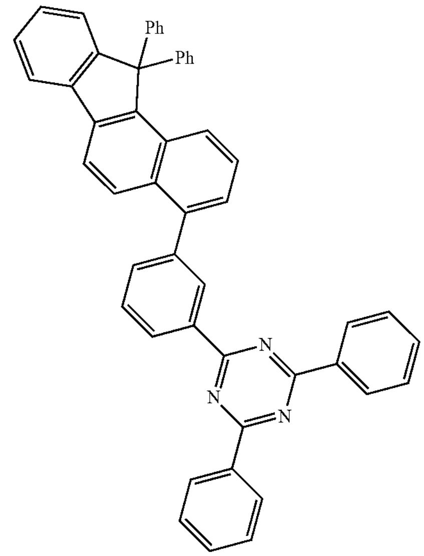
C-188
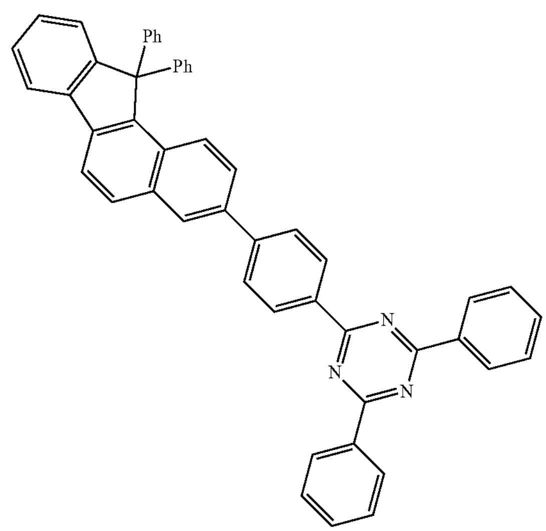

-continued
C-189
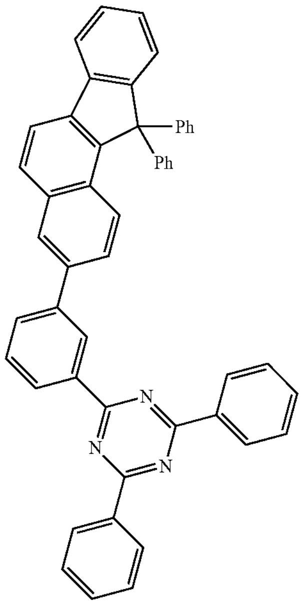
C-190
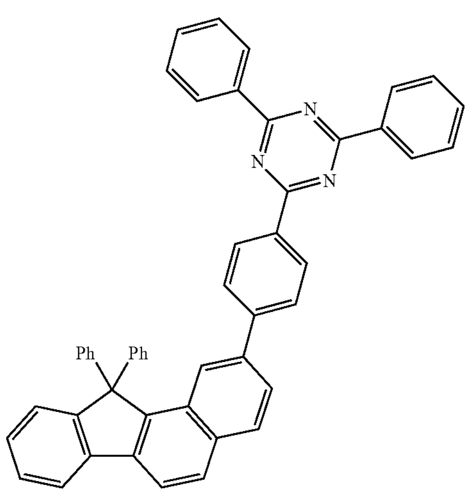
-continued
C-191
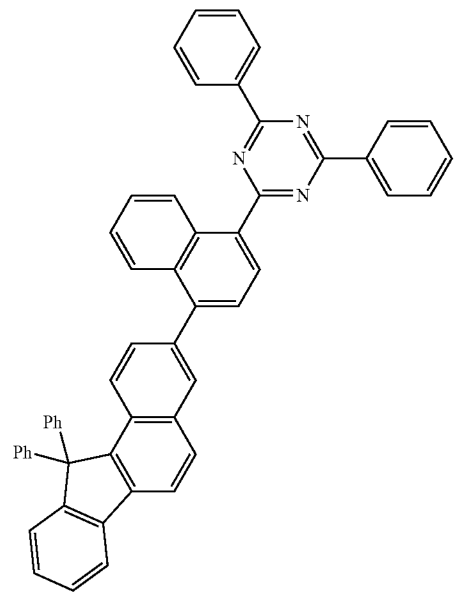
C-192
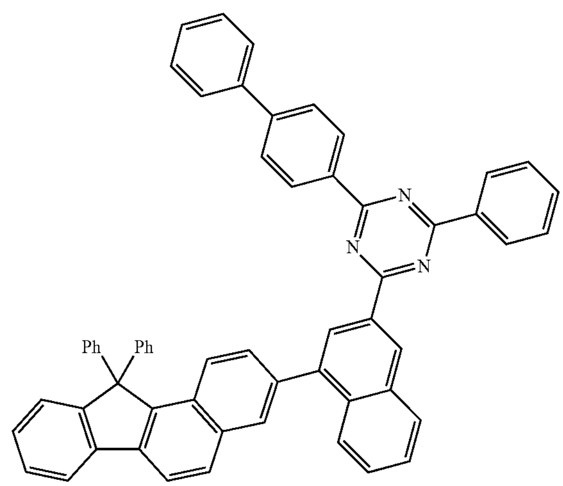
C-193
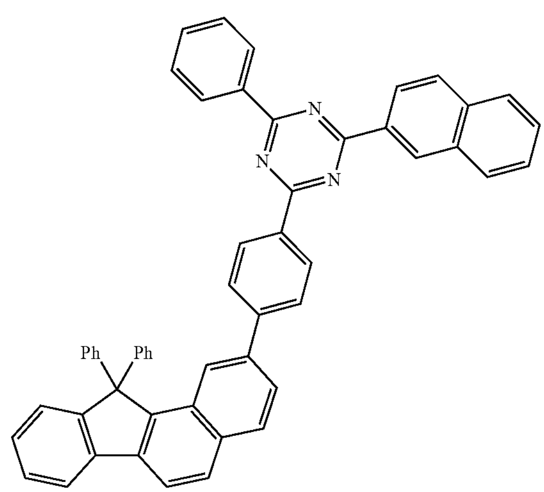

C-194
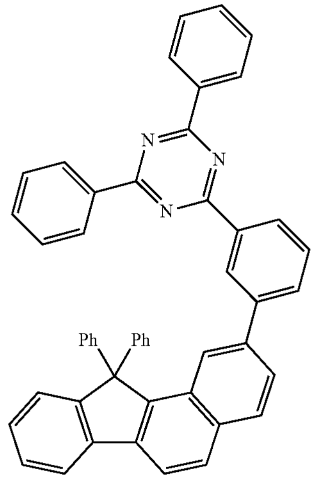
C-195
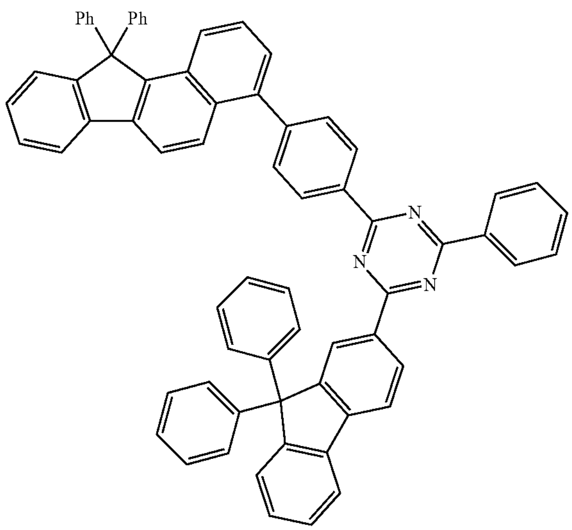
C-196
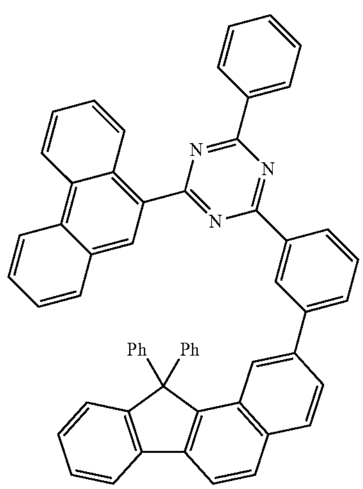
C-197
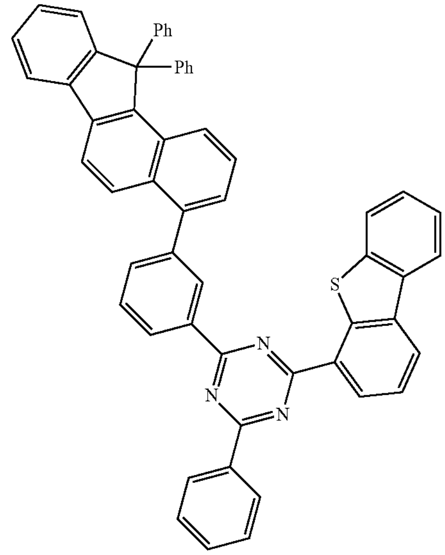
C-198
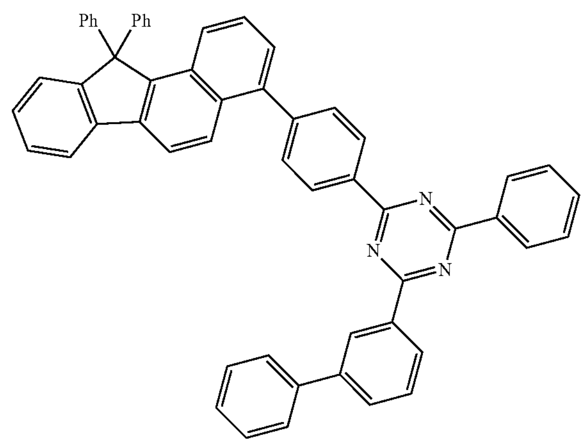
C-199
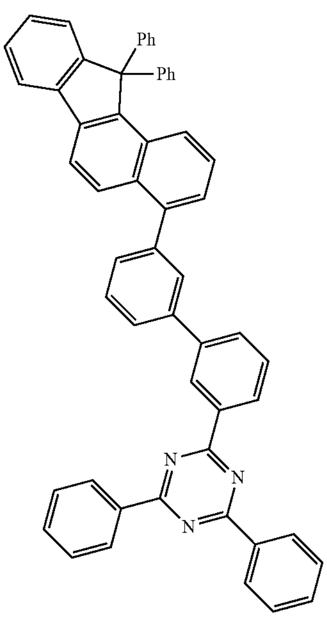

-continued
C-200
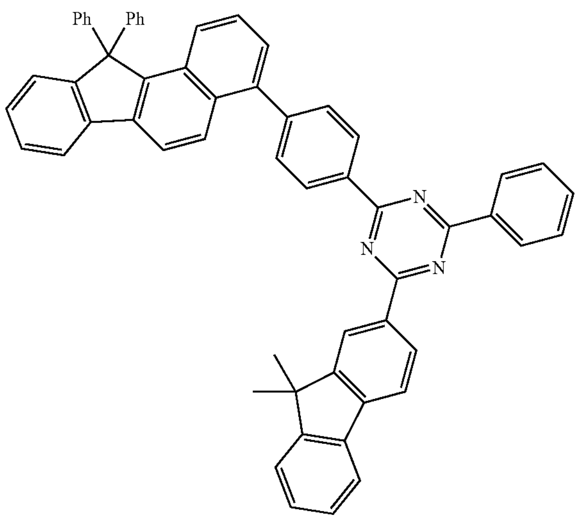
C-201
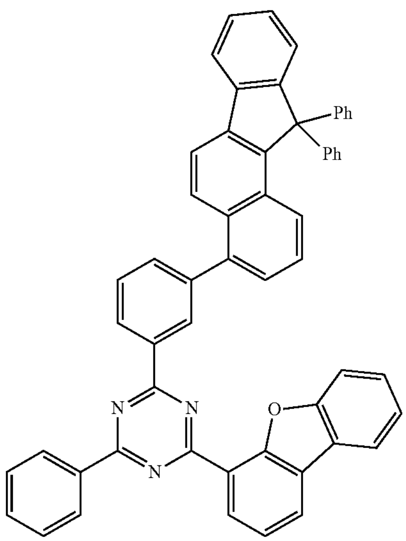
C-202
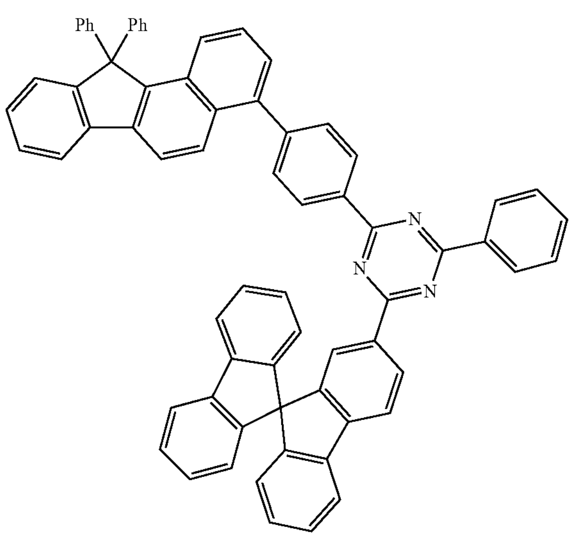
-continued
C-203
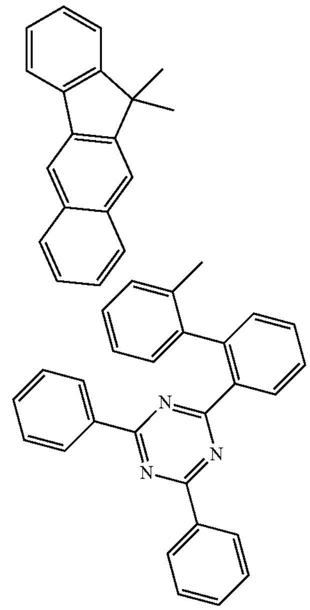
C-204
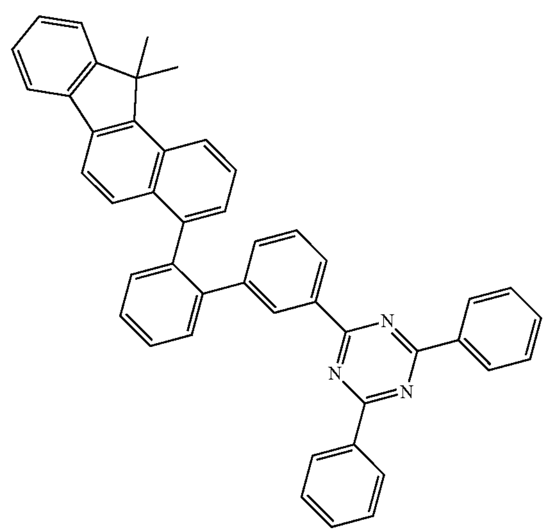

-continued
C-205
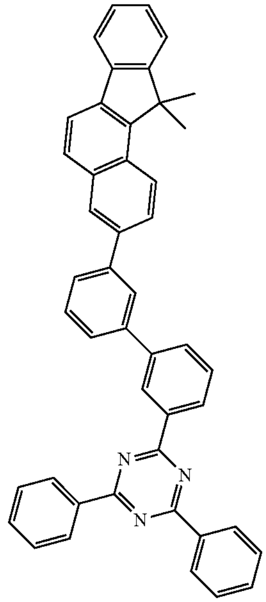
C-206
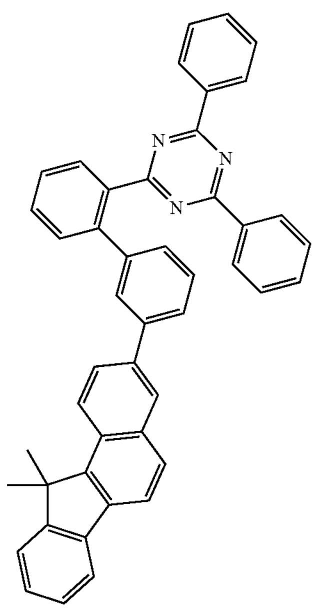
-continued
C-207
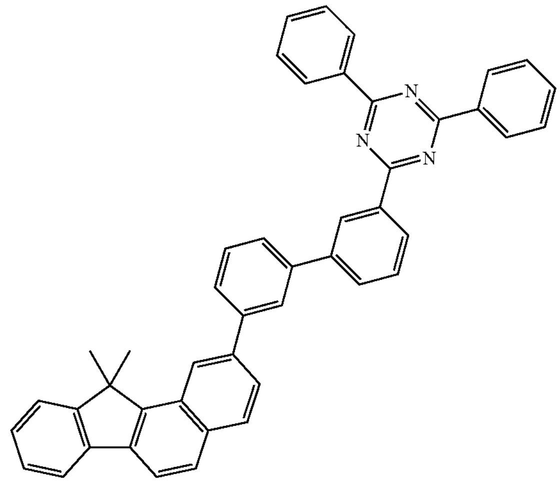
C-208
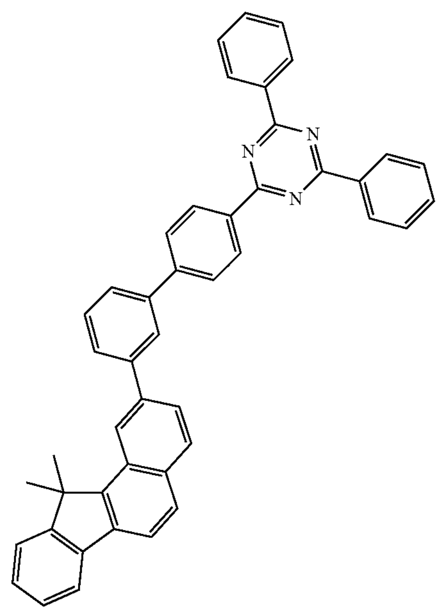

-continued
C-209
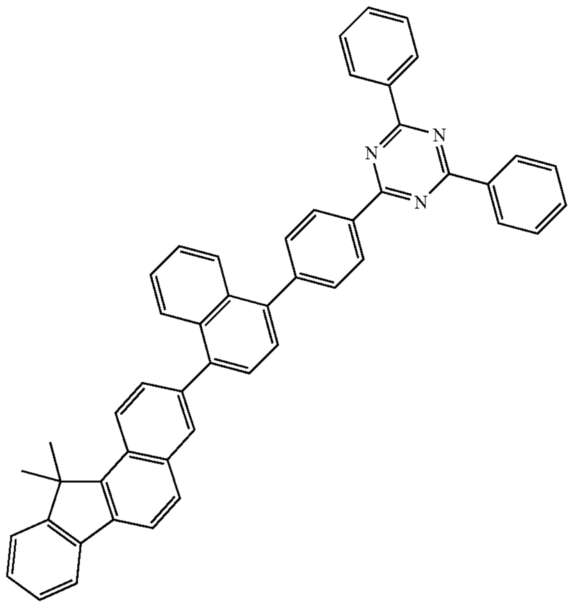
C-210
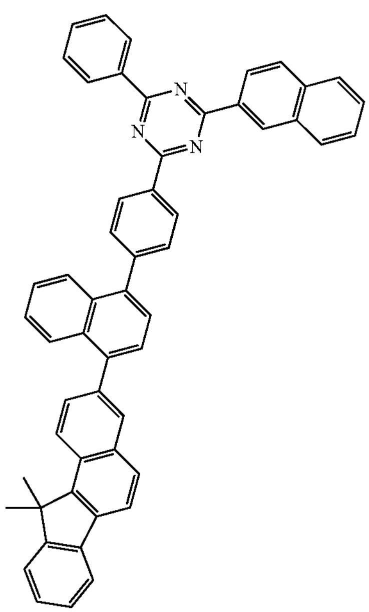
-continued
C-211
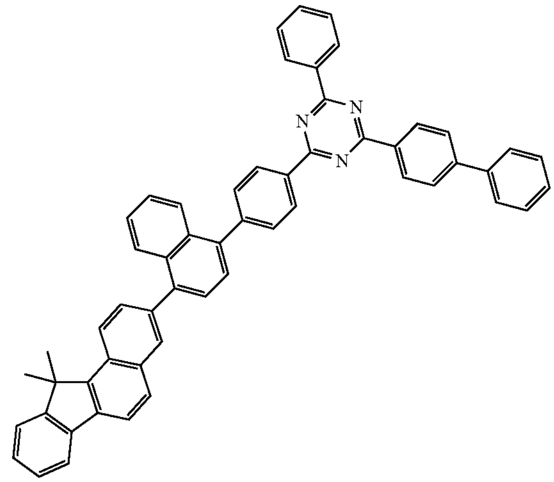
C-212
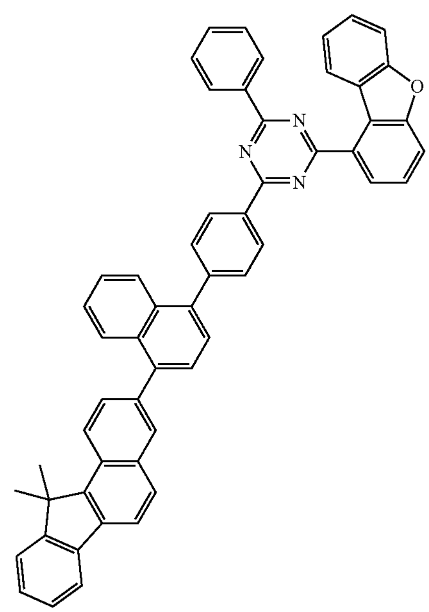

-continued
C-213
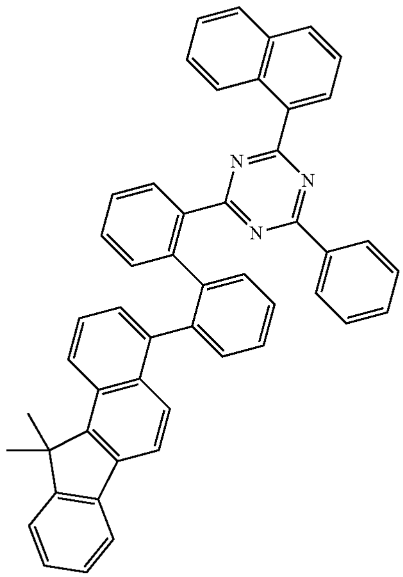
-continued
C-215
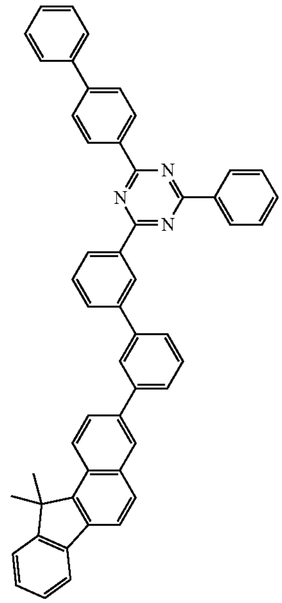
C-214
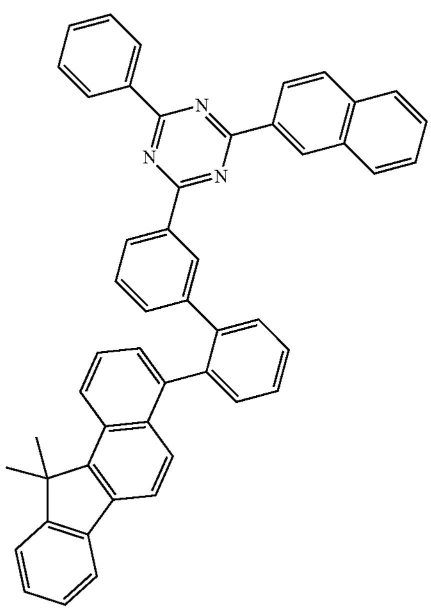
C-216
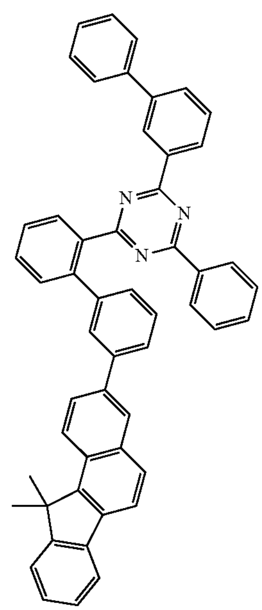

-continued
C-217
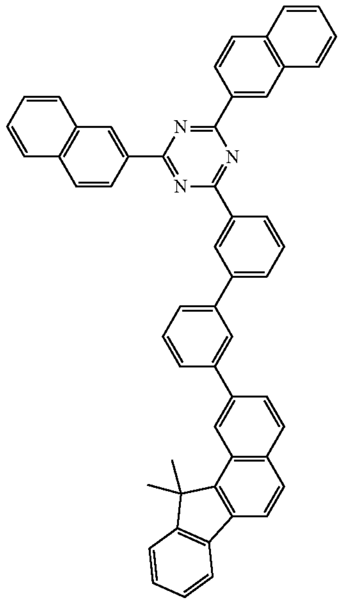
C-218
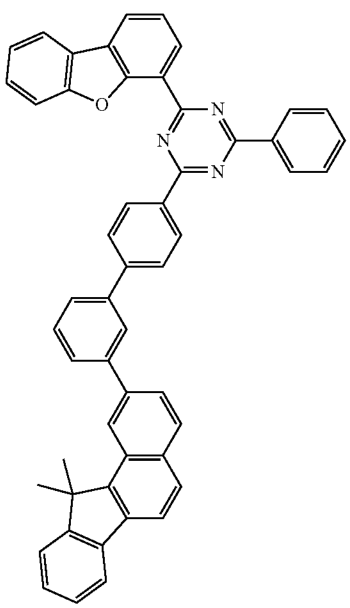
-continued
C-219
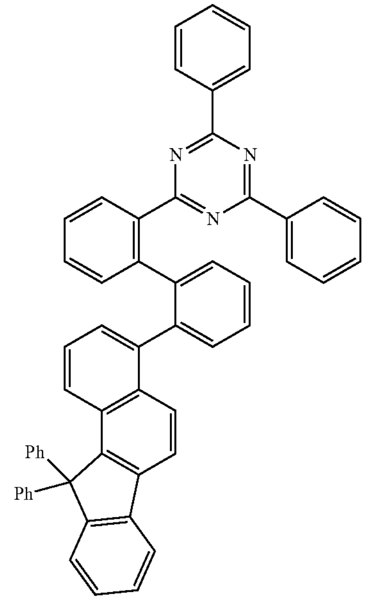
C-220
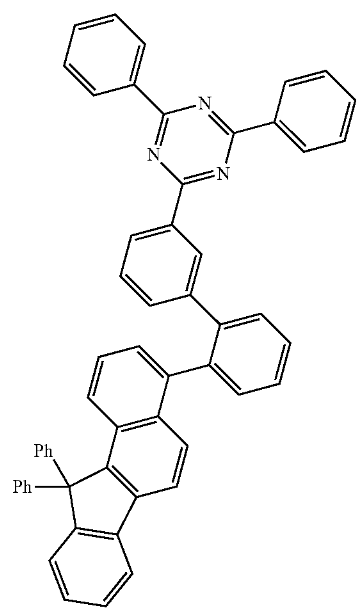

-continued
C-221
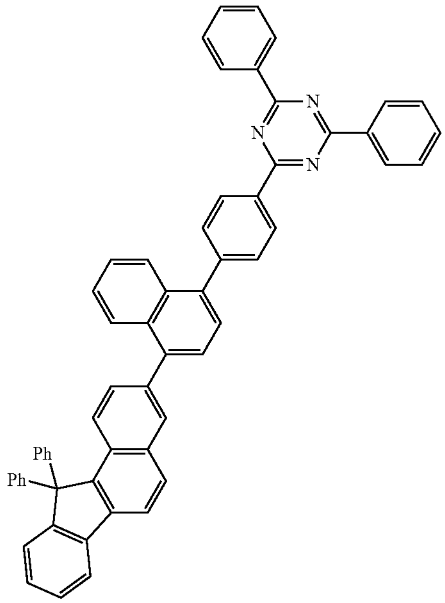
C-222
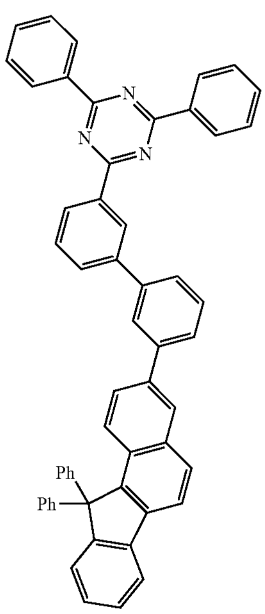
-continued
C-223
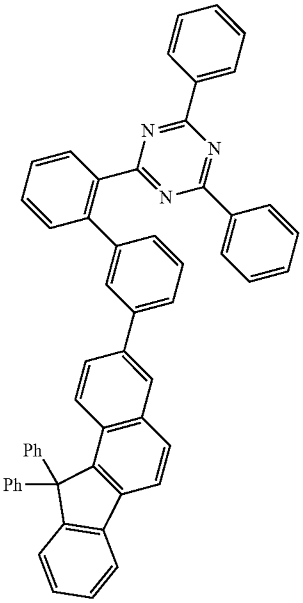
C-224
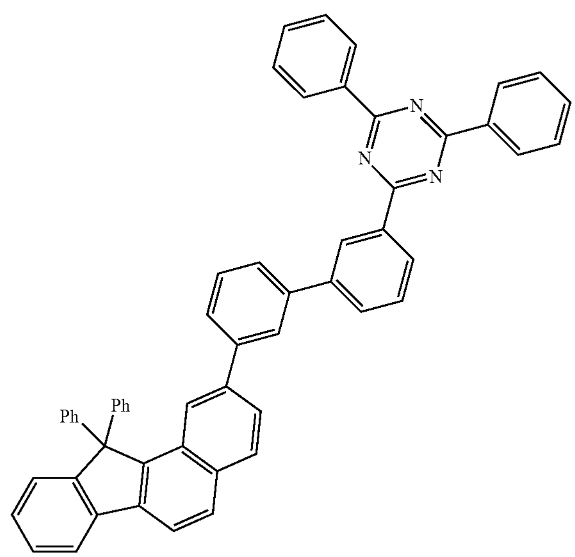

C-225
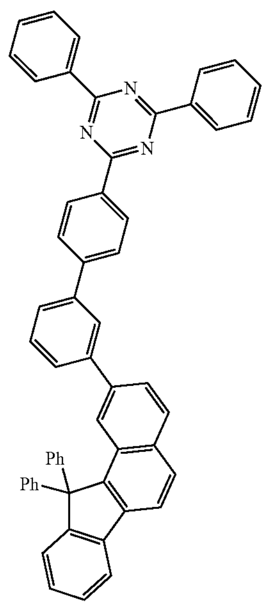
C-226
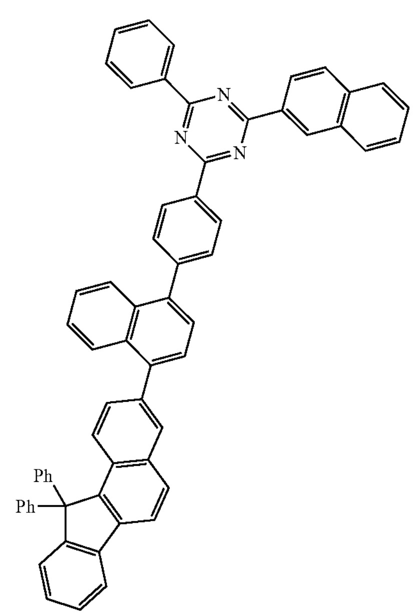
-continued
C-227
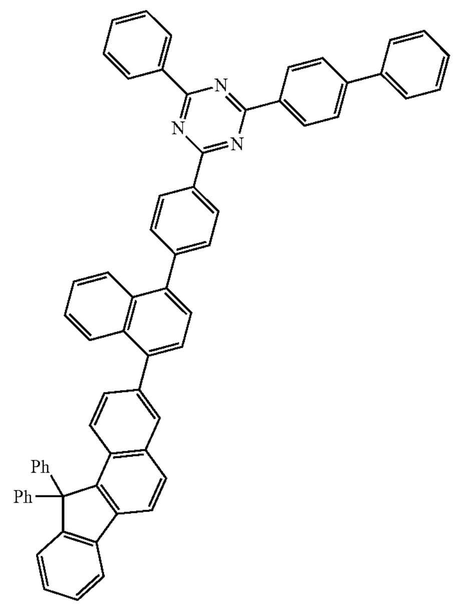
C-228
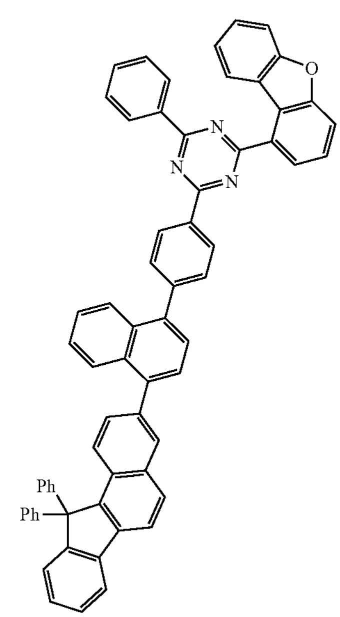

-continued
C-229
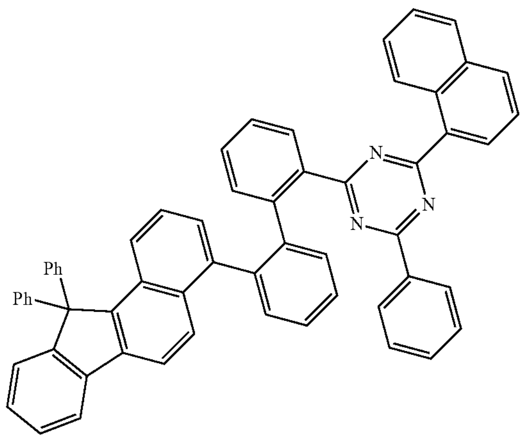
C-230
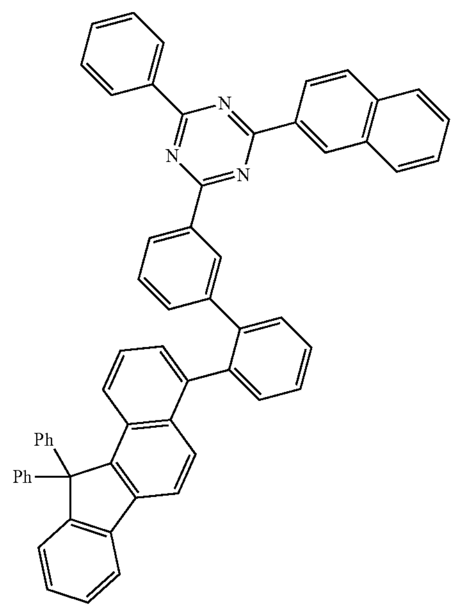
C-231
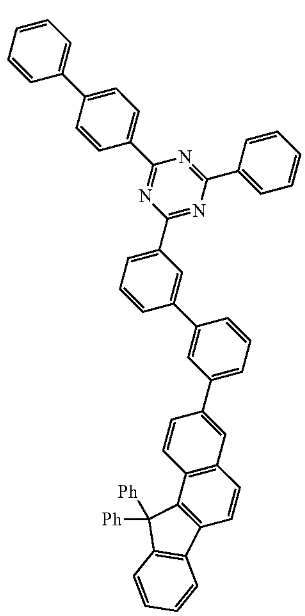
-continued
C-232
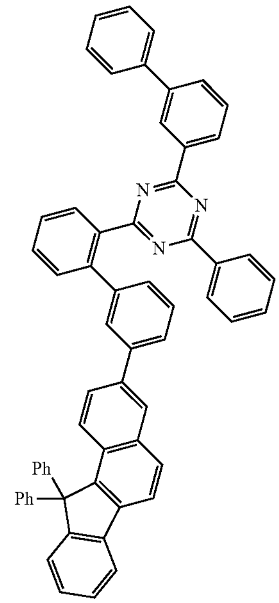
C-233
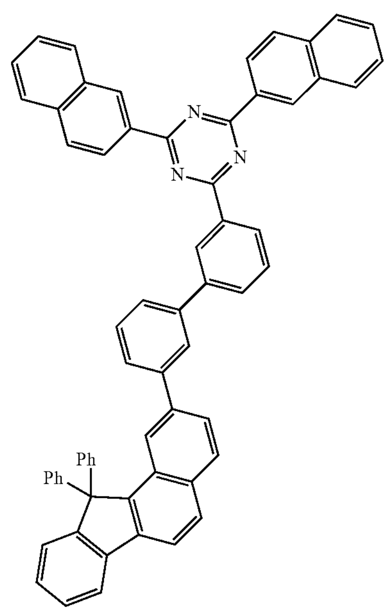

C-234
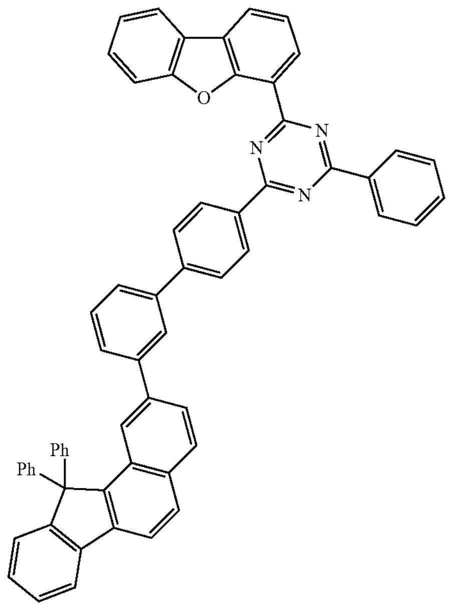
C-235
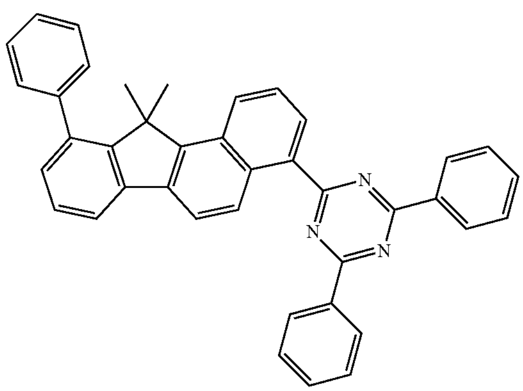
C-236
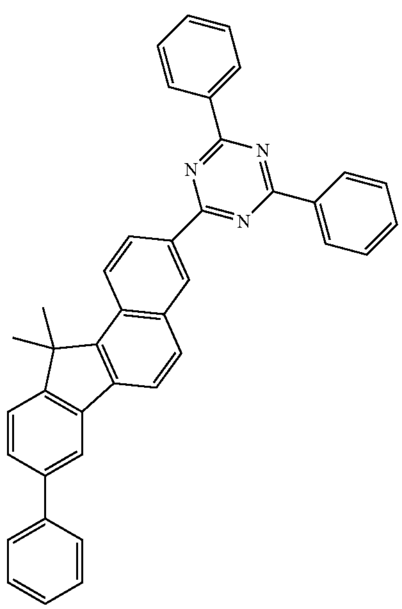
C-237
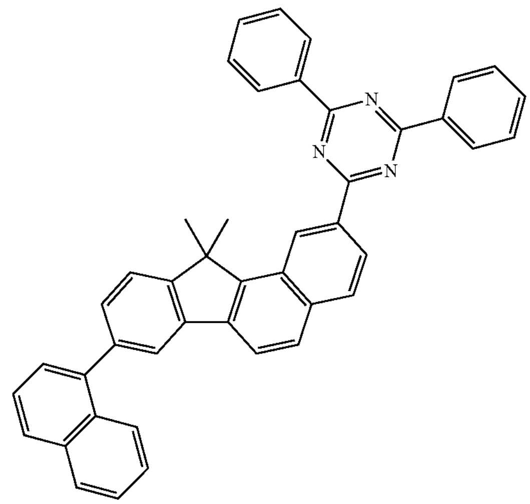
C-238
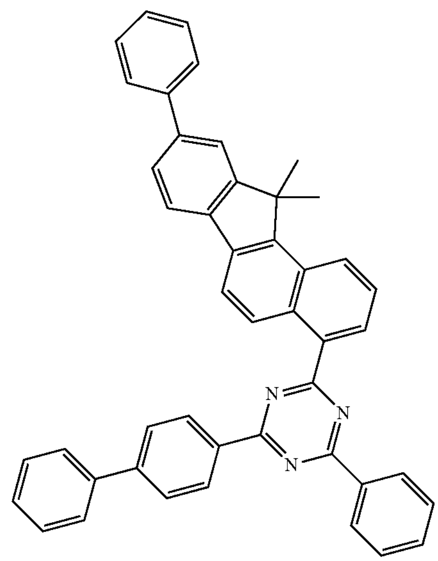
C-239
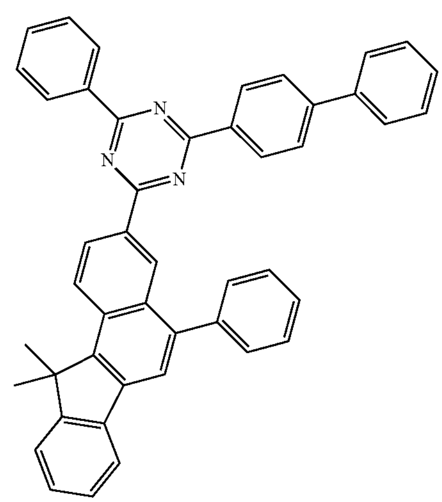

C-240
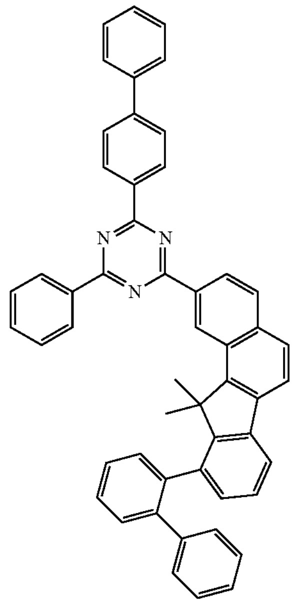
C-241
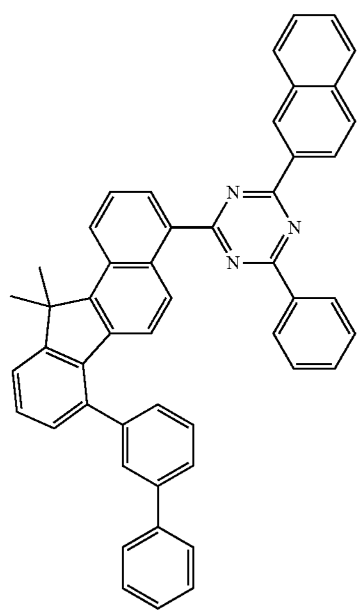
C-242
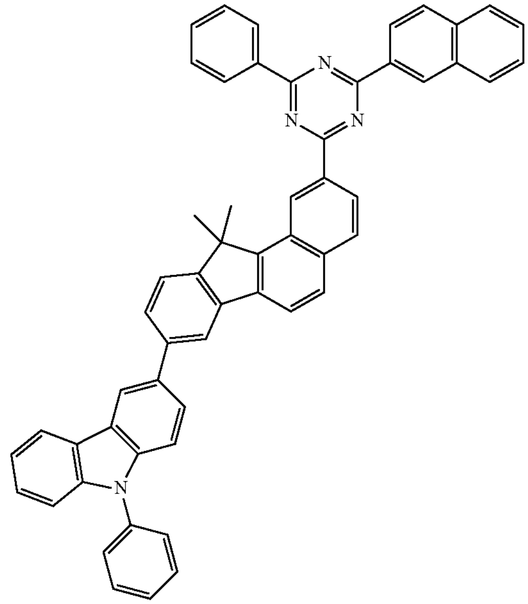
C-243
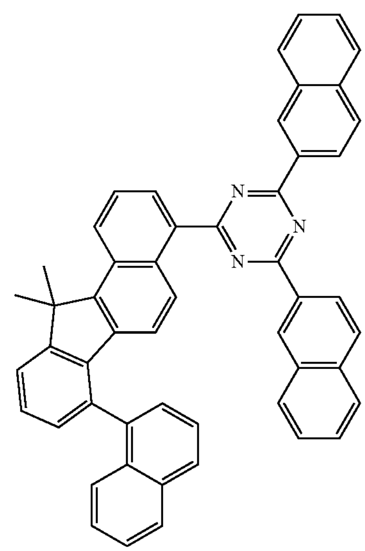

C-244
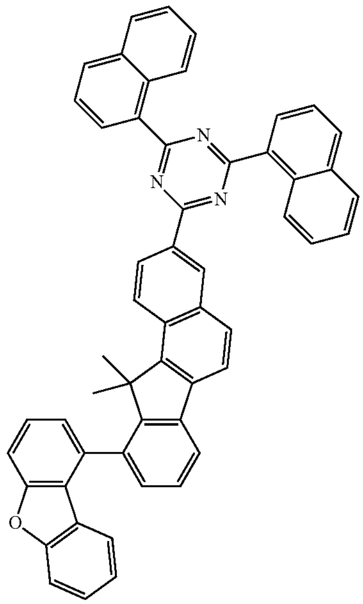
C-245
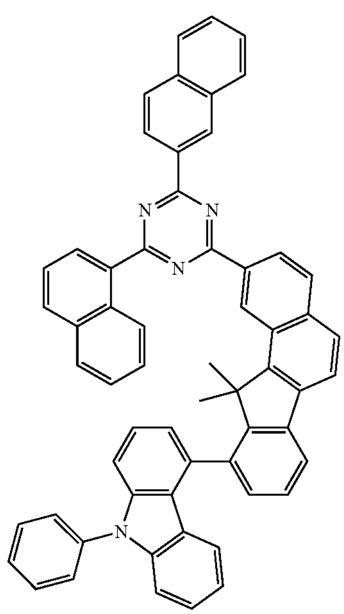
C-246
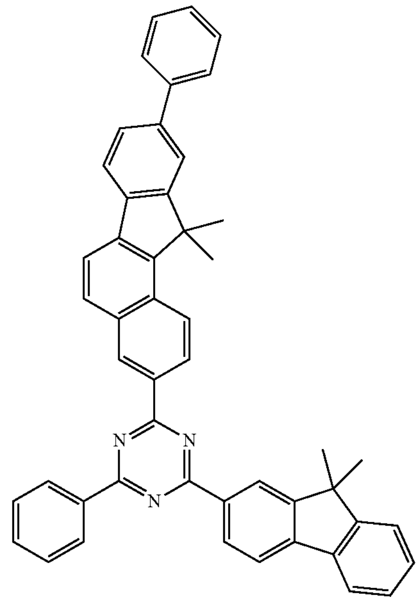
C-247
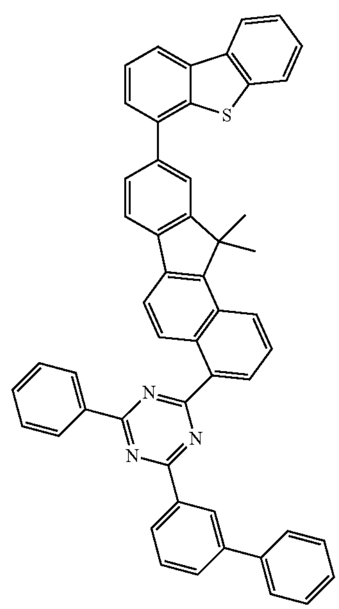

-continued
C-248
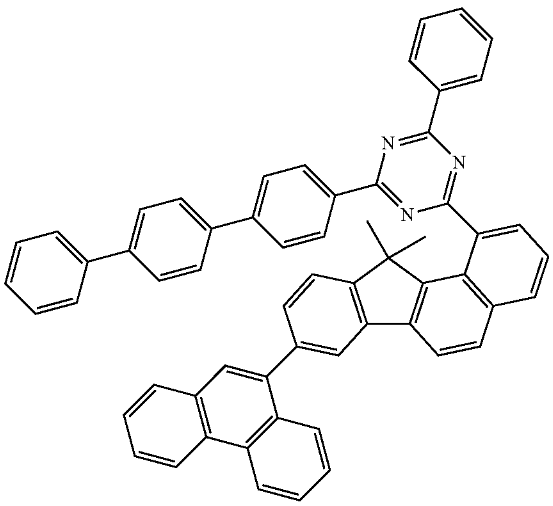
C-249
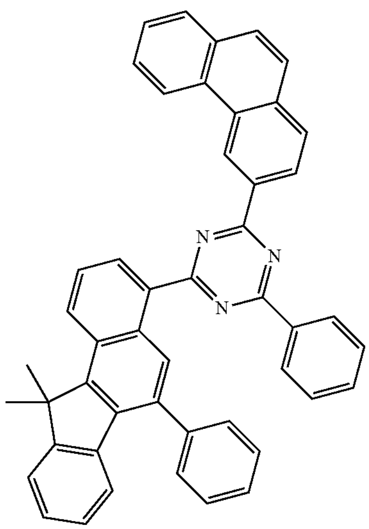
C-250
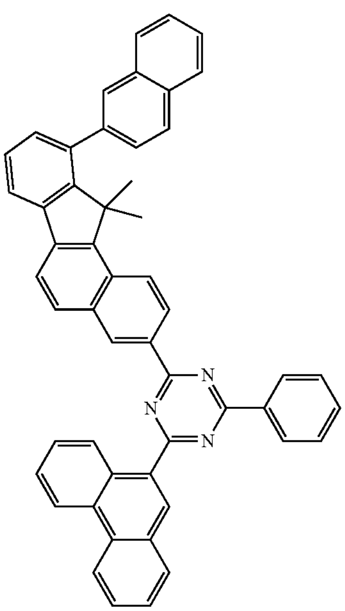
-continued
C-251
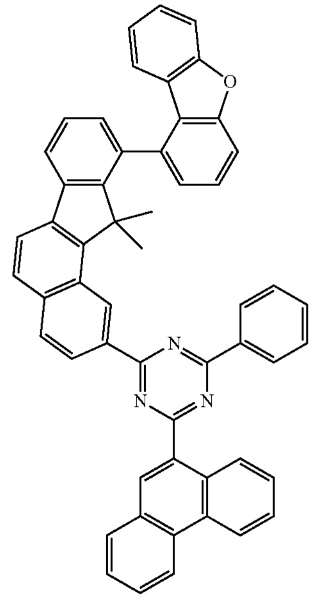
C-252
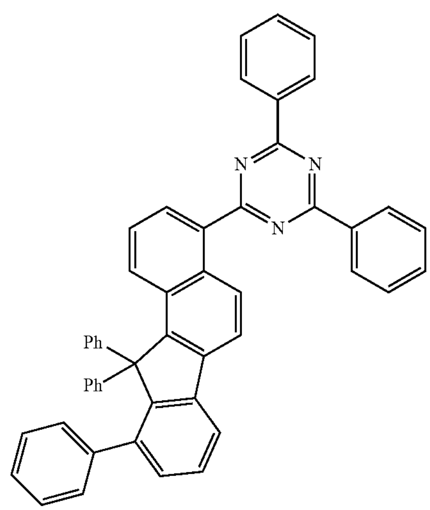

-continued
C-253
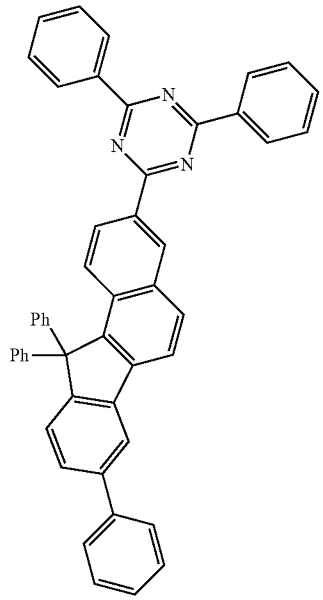
C-254
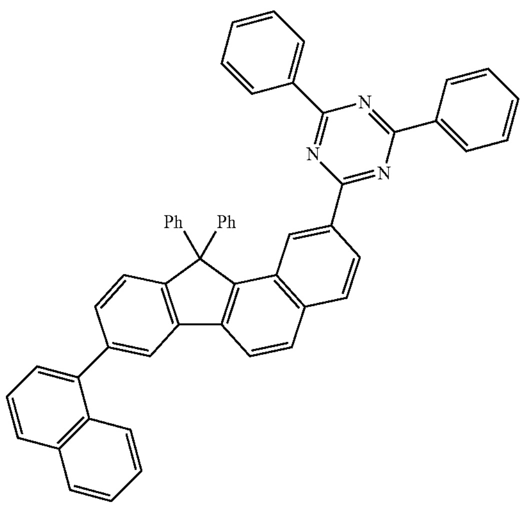
C-255
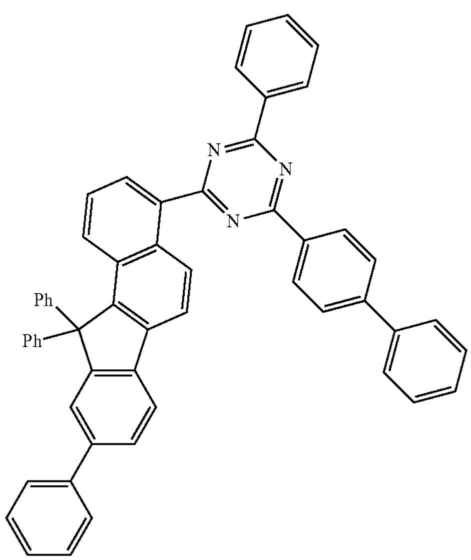
-continued
C-256
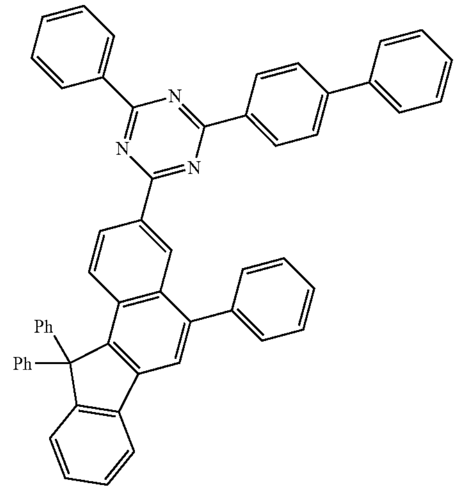
C-257
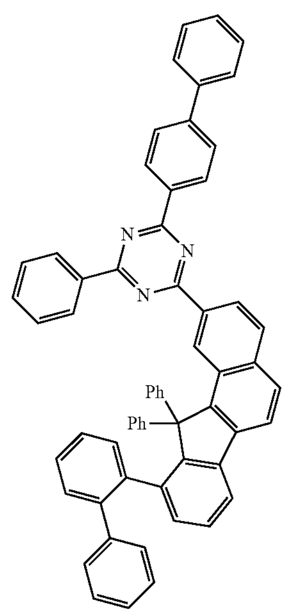

C-258
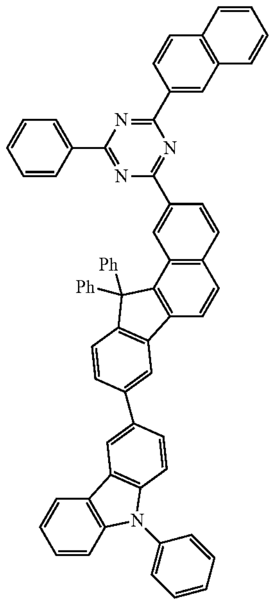
C-259
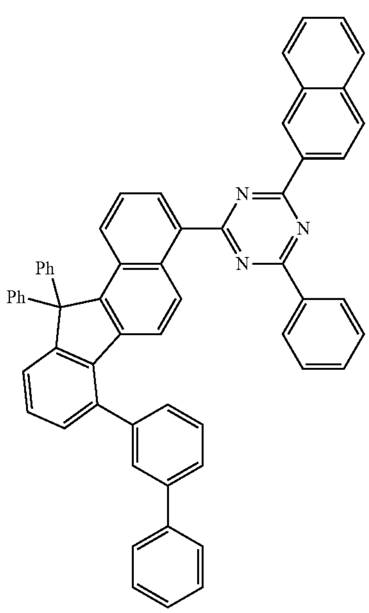
C-260
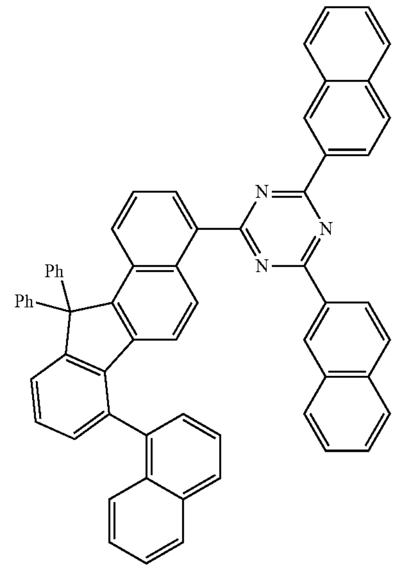
C-261
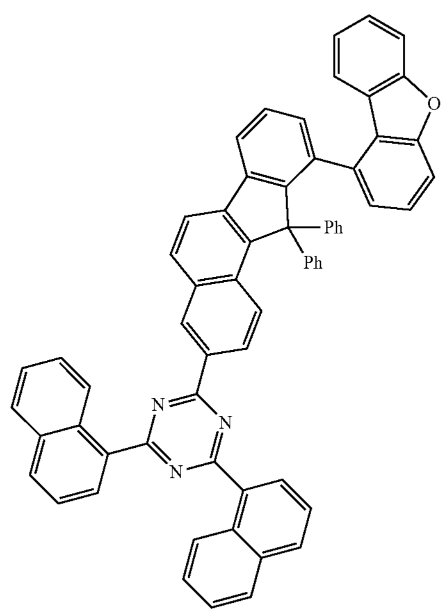

-continued
C-262
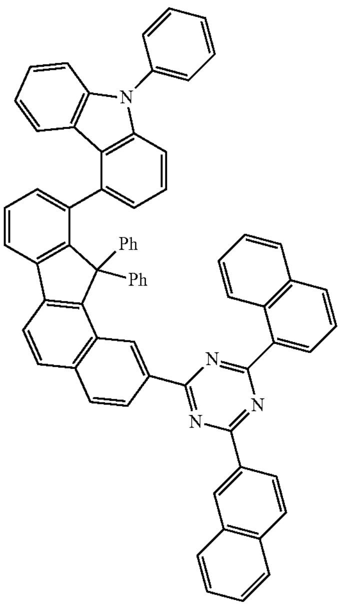
C-263
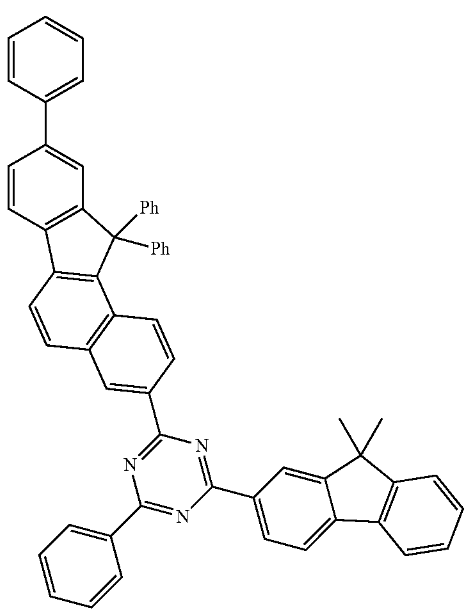
-continued
C-264
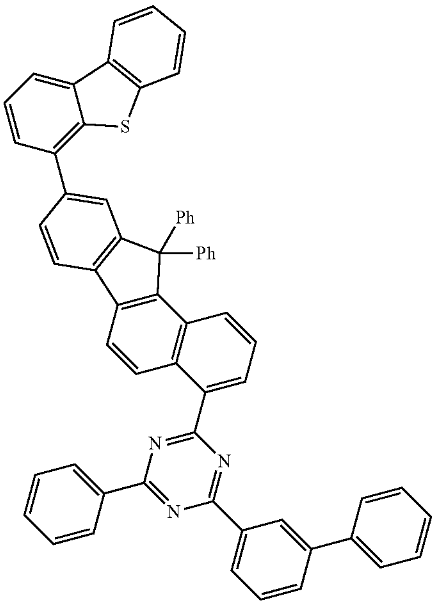
C-265
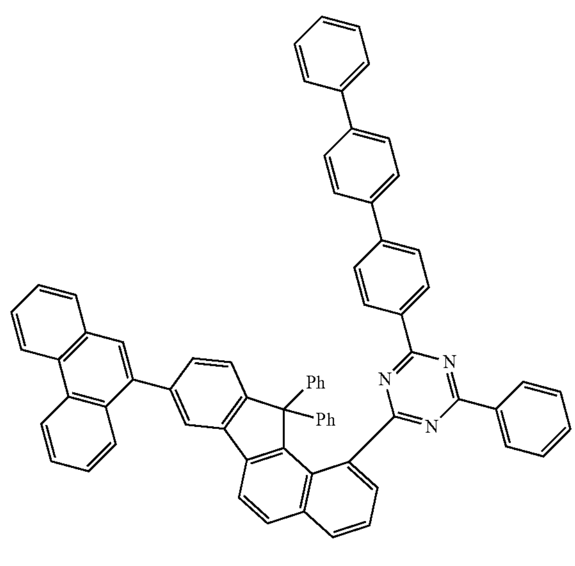

-continued
C-266
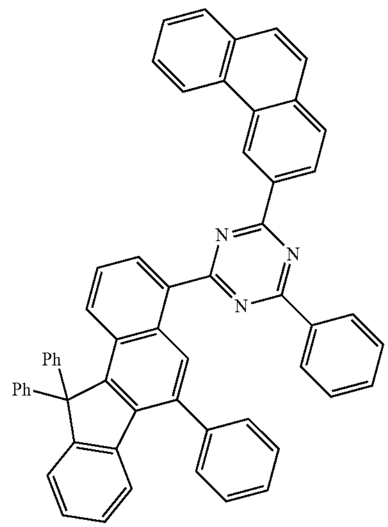
C-267
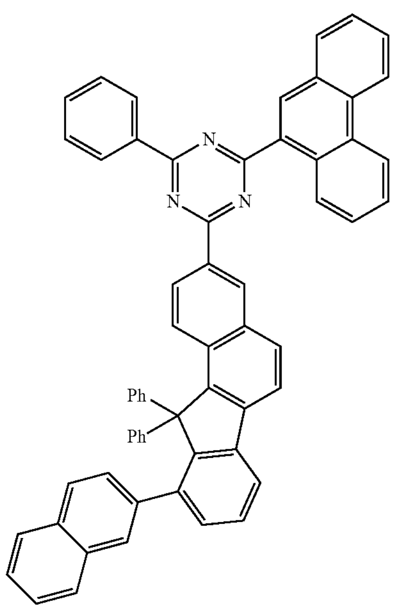
-continued
C-268
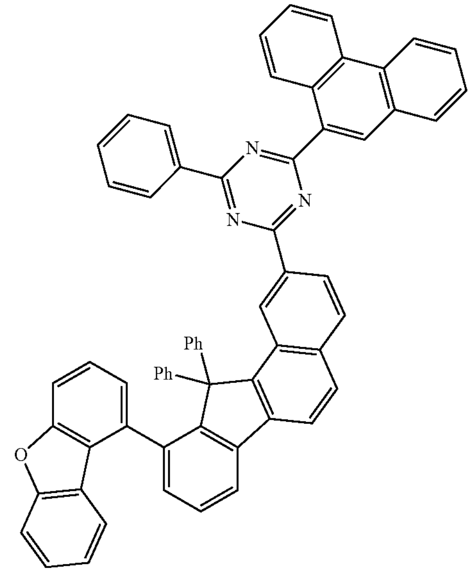
C-269
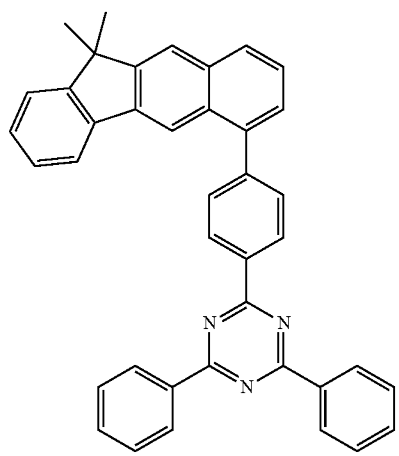
C-270
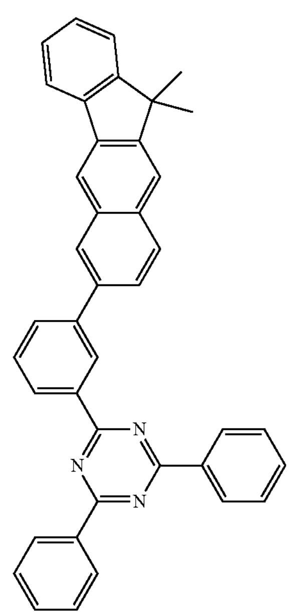

-continued
C-271
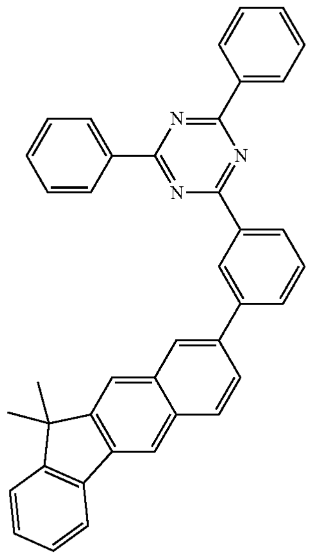
C-272
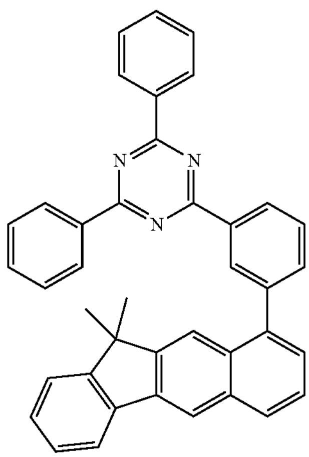
C-273
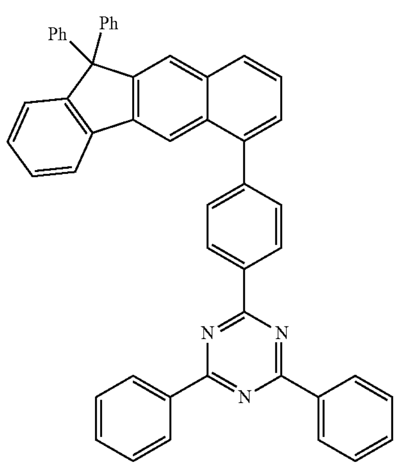
-continued
C-274
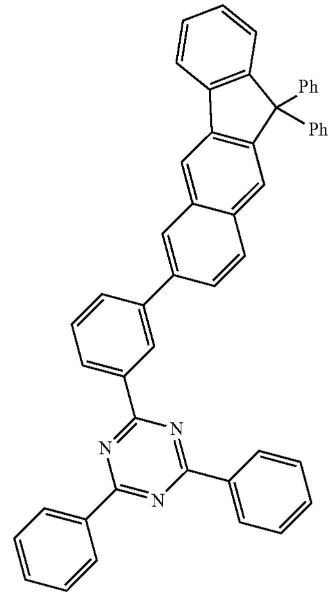
C-275
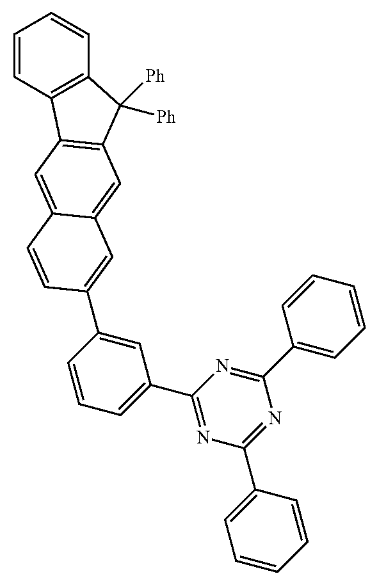
C-276
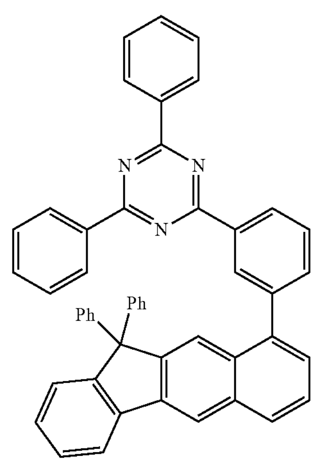

C-277
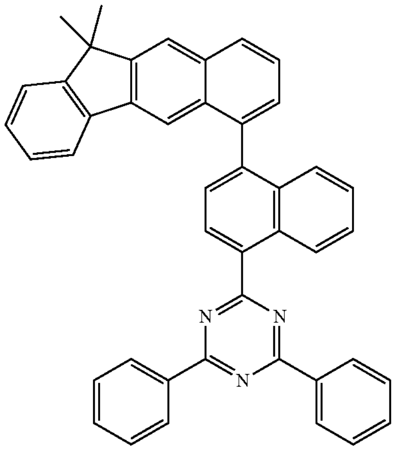
C-278
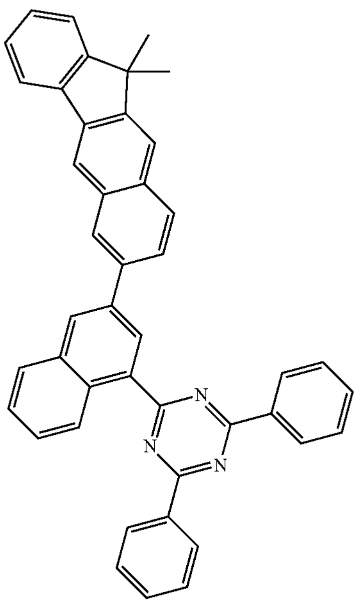
C-279
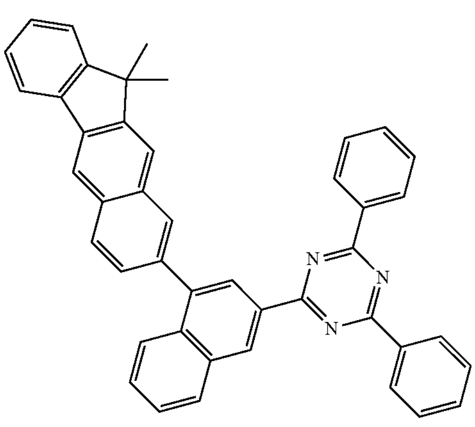
C-280
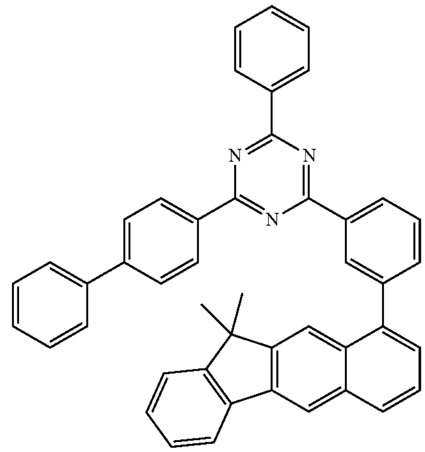
C-281
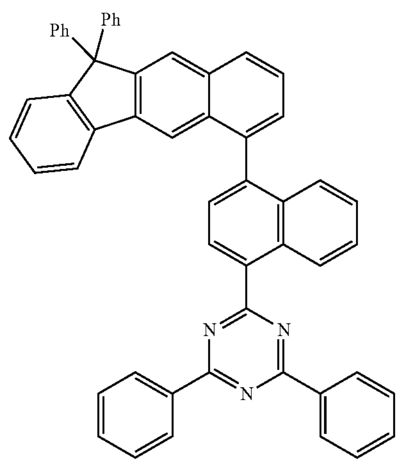
C-282
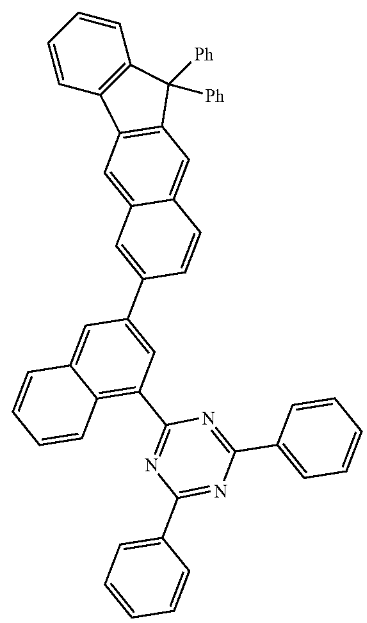

-continued
C-283
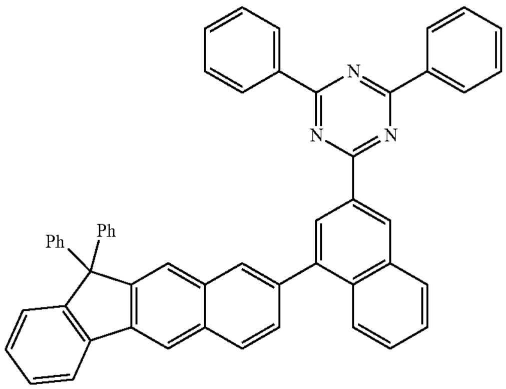
C-284
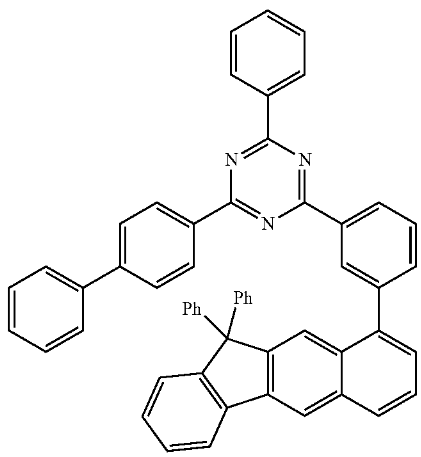
C-285
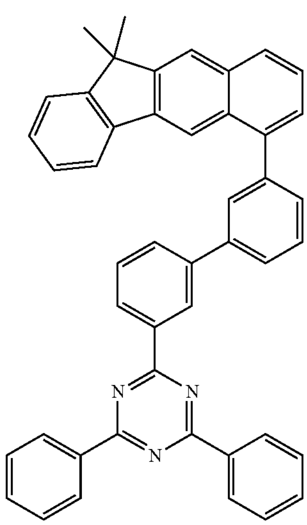
-continued
C-286
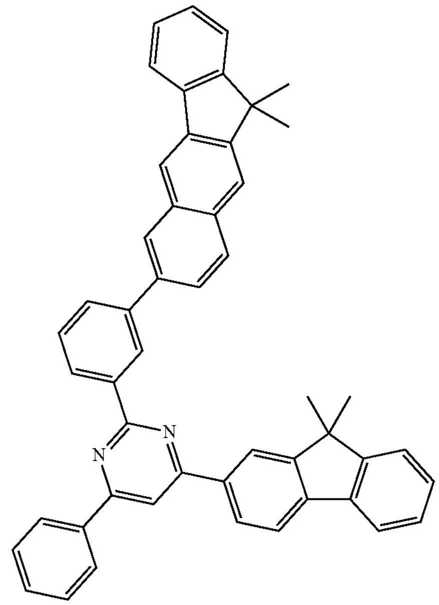
C-287
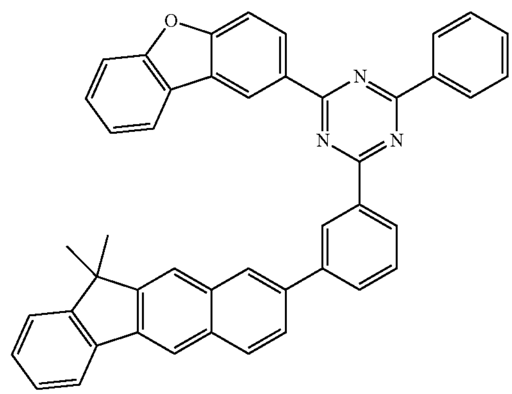
C-288
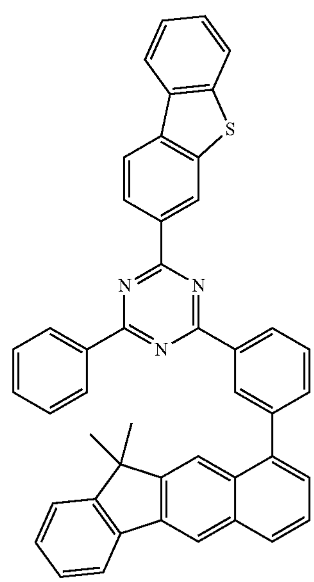

C-289
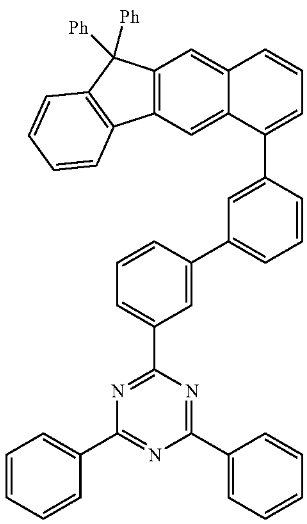
C-290
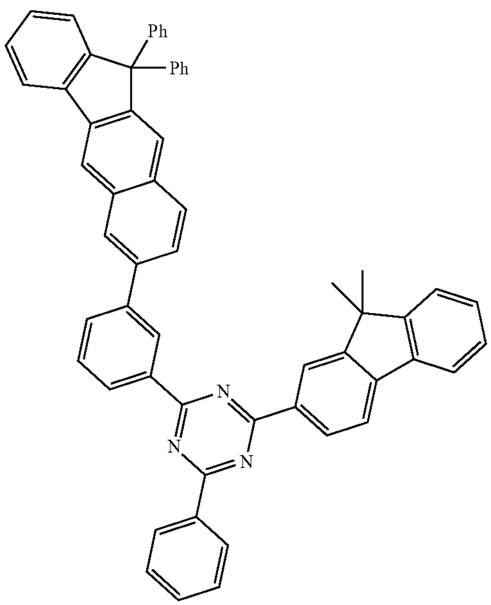
C-291
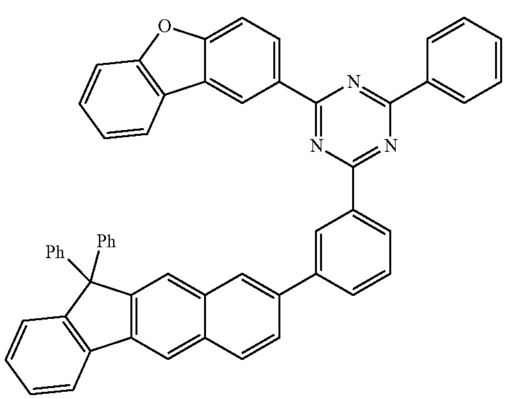
C-292
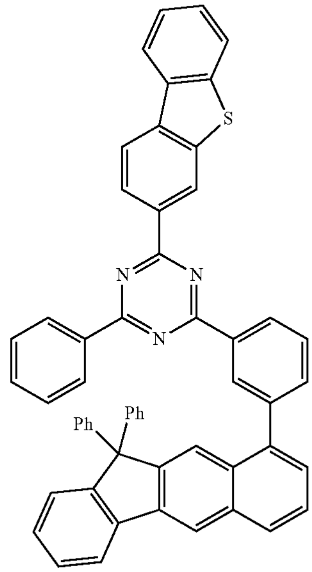
C-293
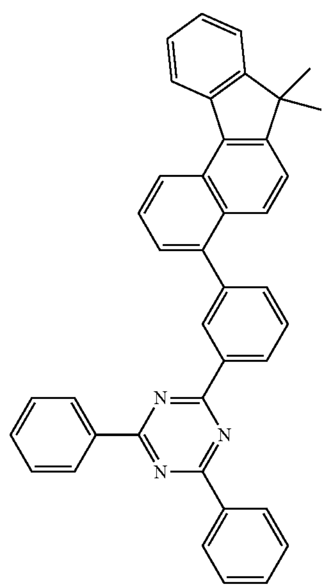
C-294
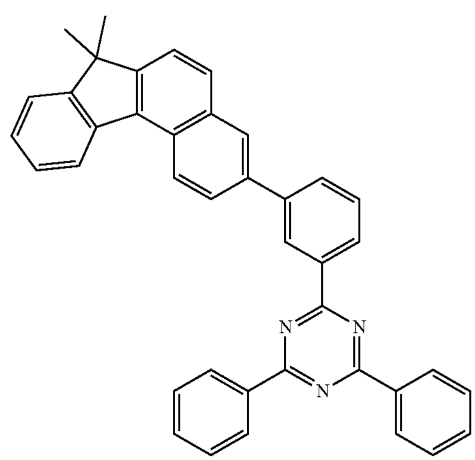

-continued
C-295
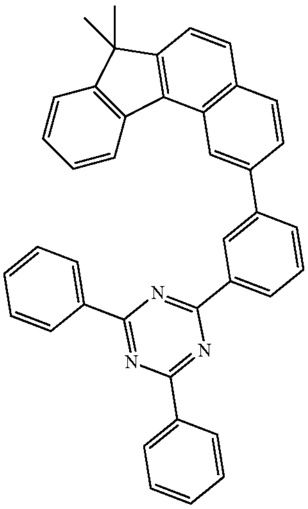
C-296
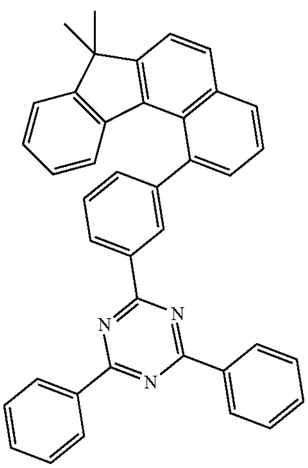
C-297
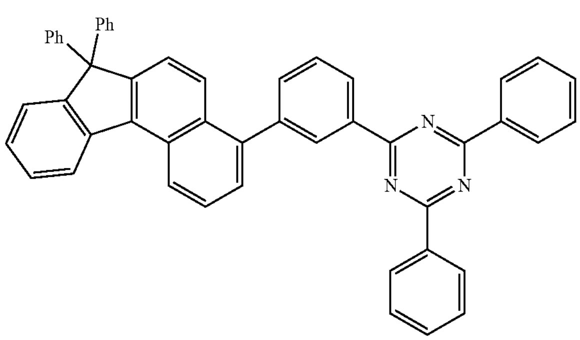
-continued
C-298
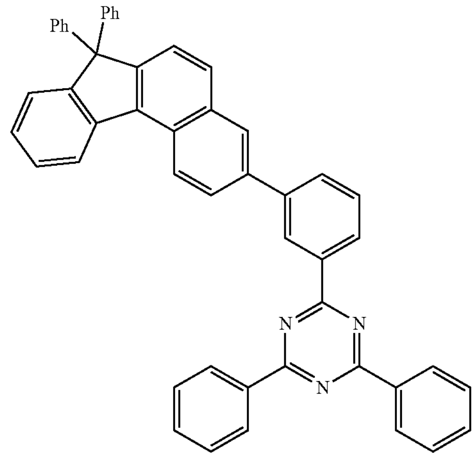
C-299
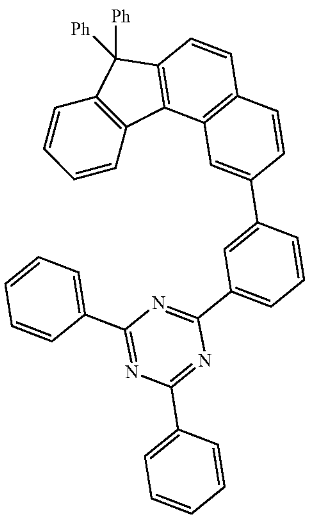
C-300
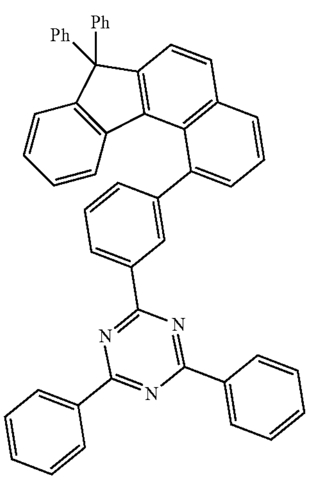

-continued
C-301
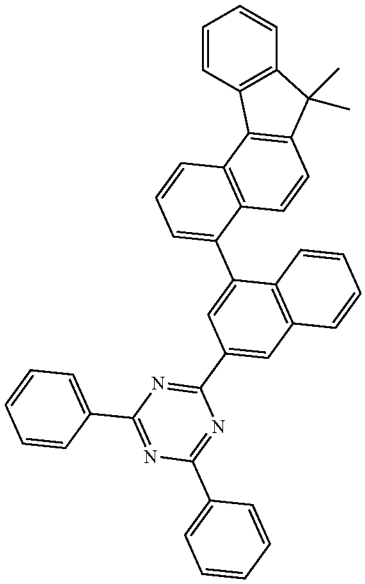
C-302
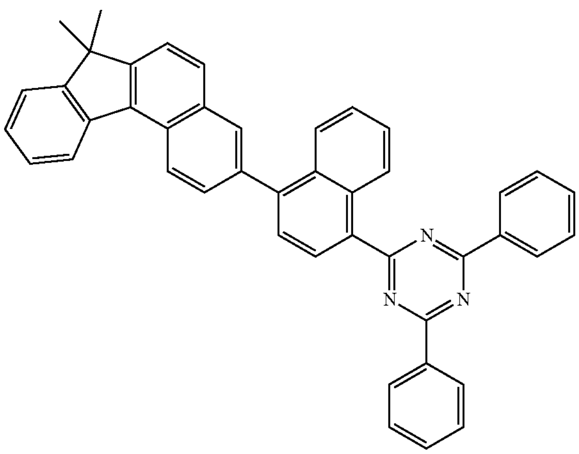
C-303
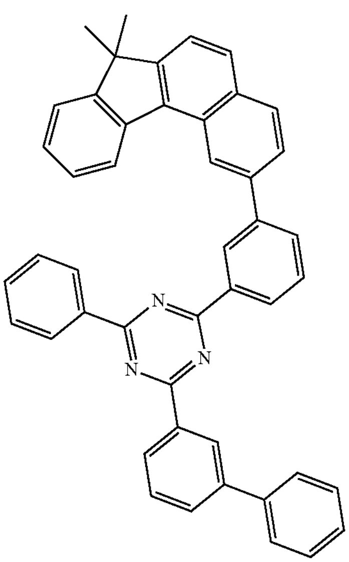
-continued
C-304
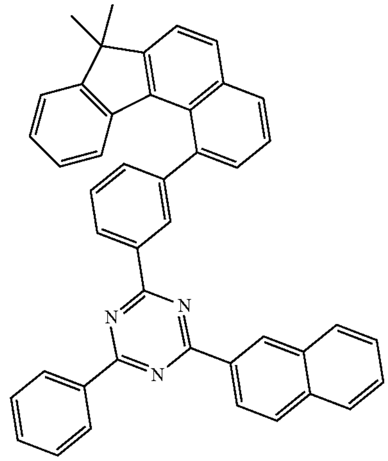
C-305
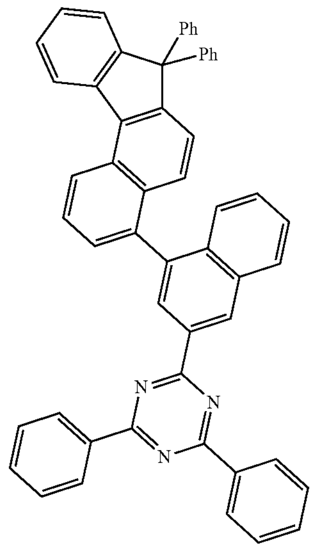
C-306
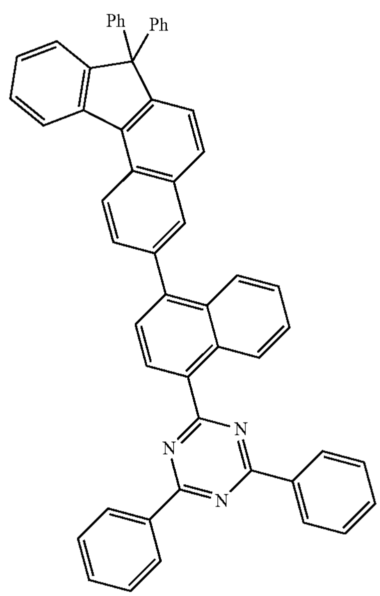

-continued
C-307
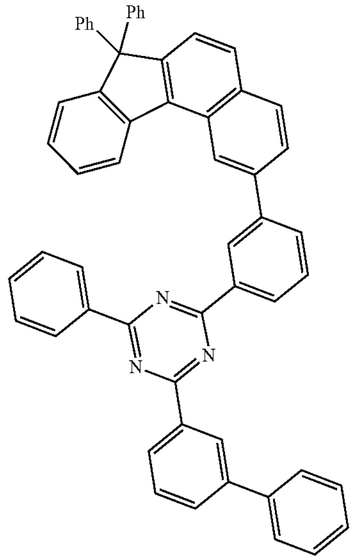
C-308
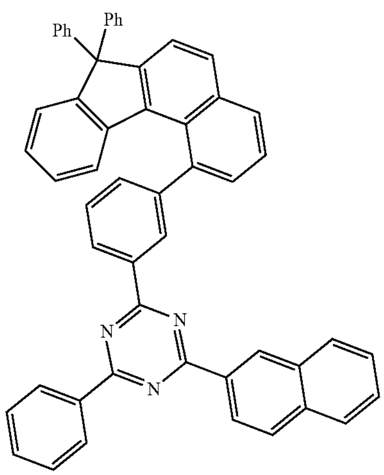
C-309
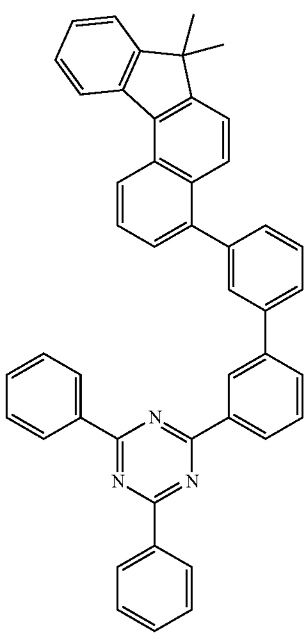
-continued
C-310
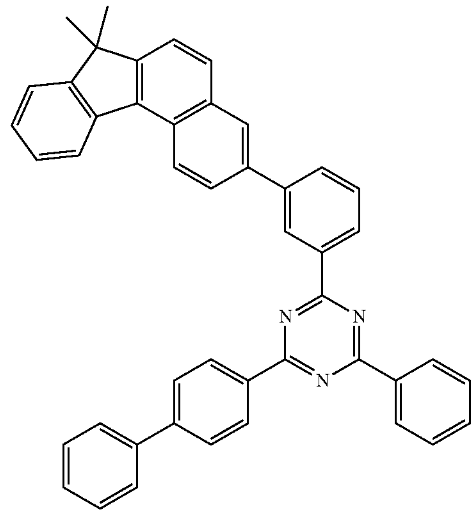
C-311
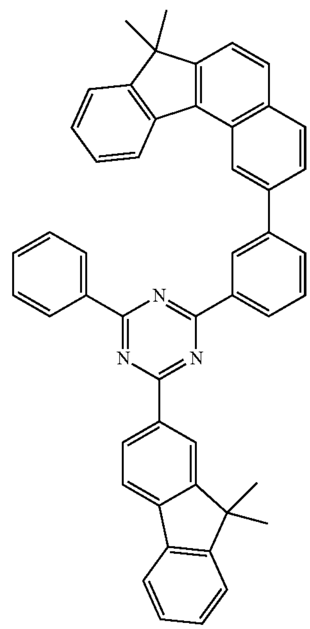
C-312
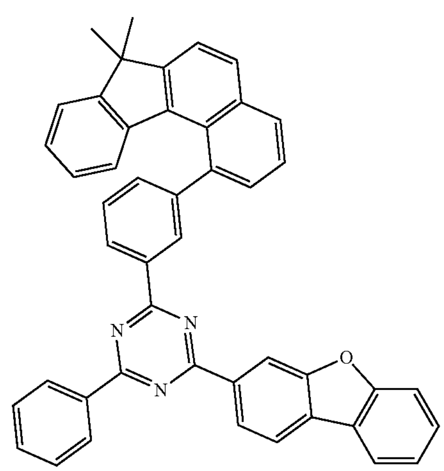

-continued
C-313
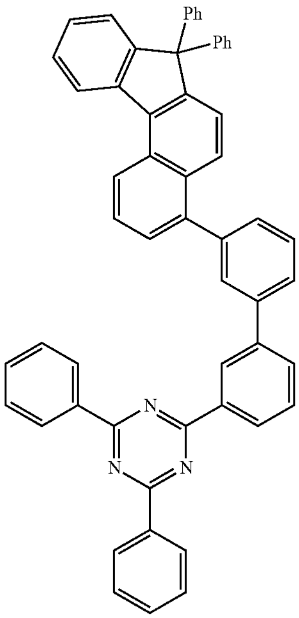
C-314
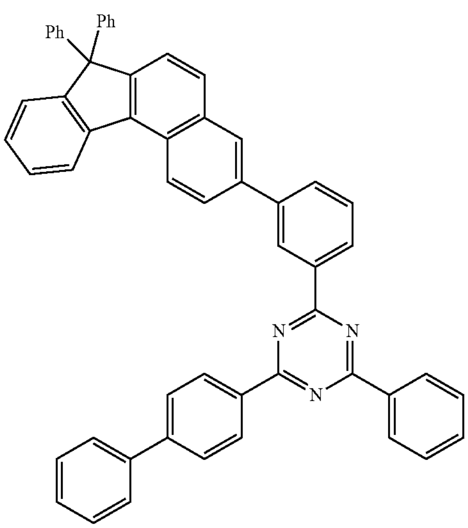
-continued
C-315
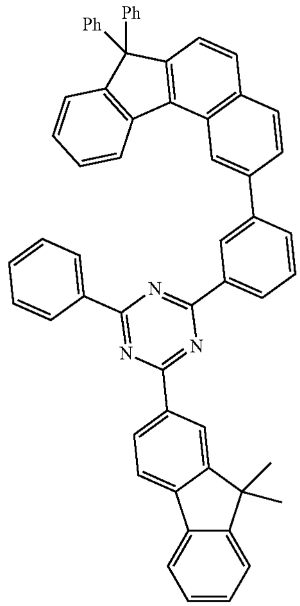
C-316
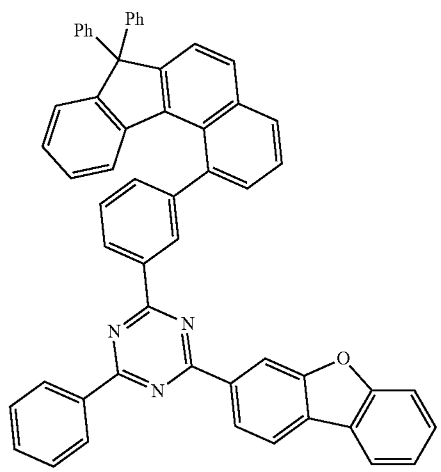
C-317
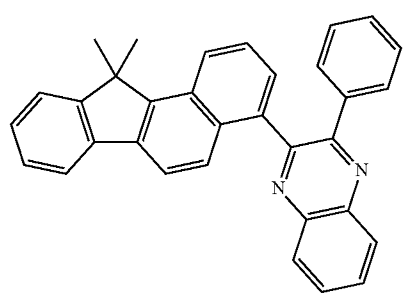

-continued
C-318
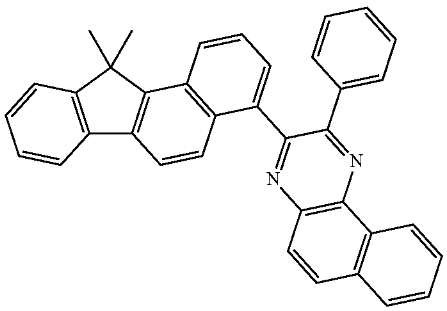
C-319
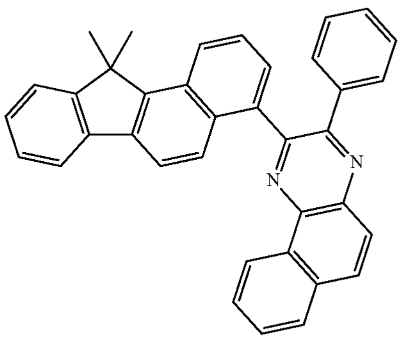
C-320
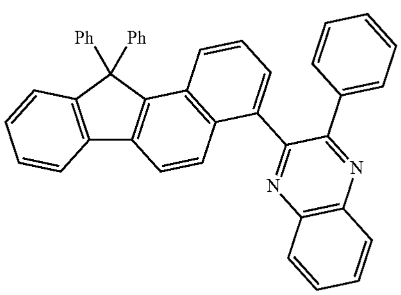
C-321
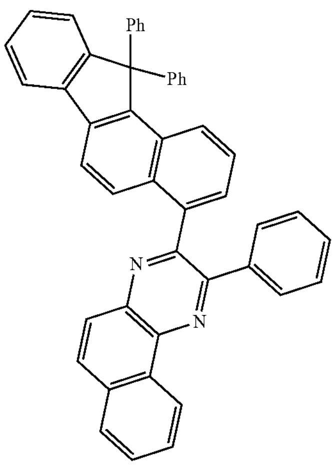
-continued
C-322
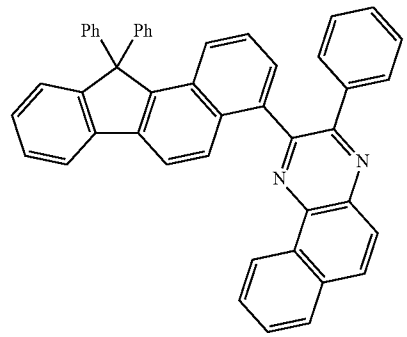
C-323
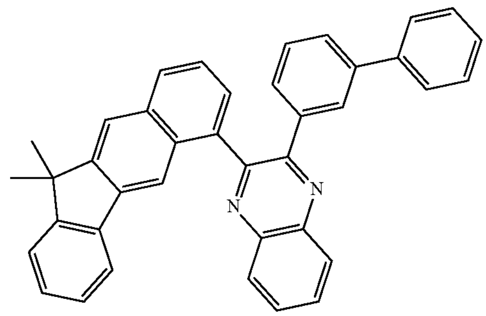
C-324
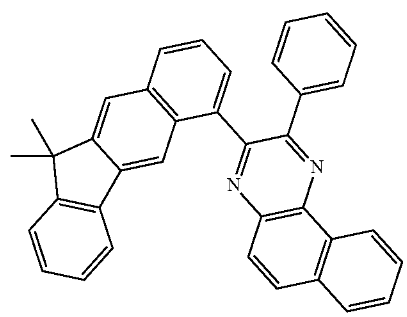
C-325
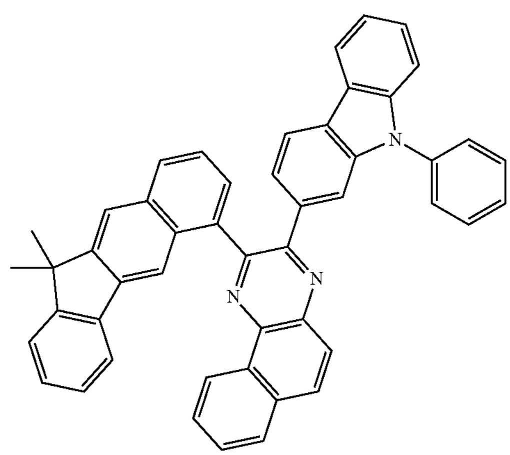

-continued
C-326
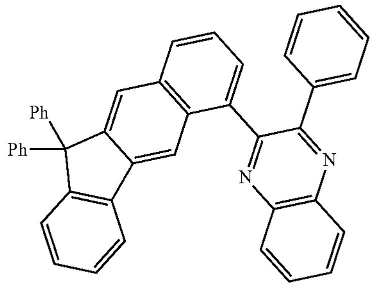
C-327
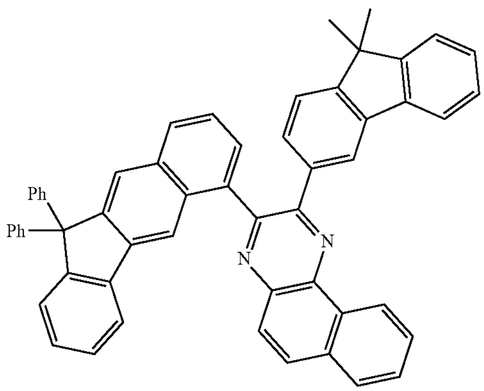
C-328
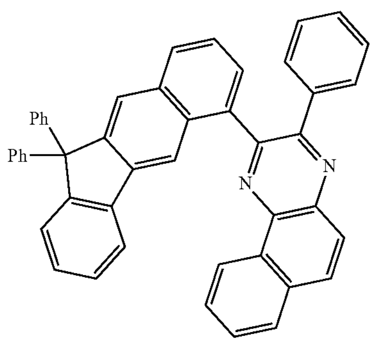
C-329
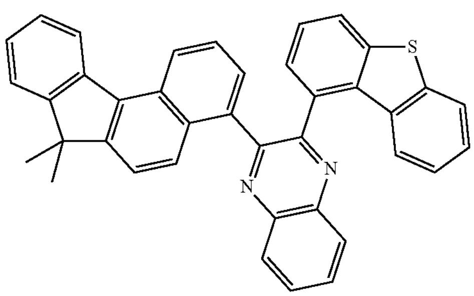
C-330
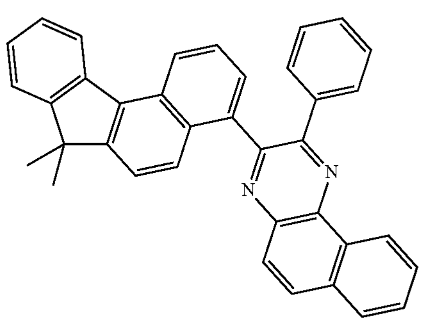
-continued
C-331
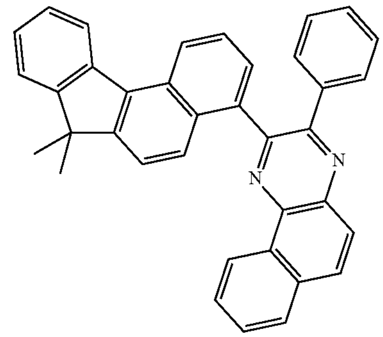
C-332
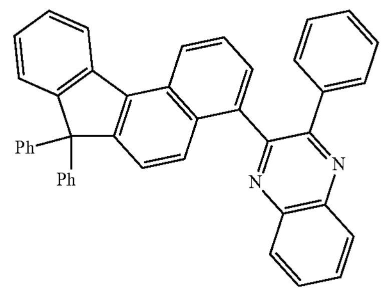
C-333
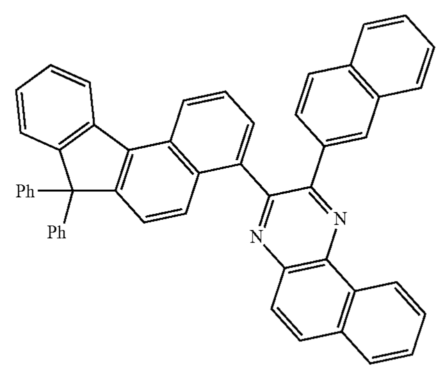
C-334
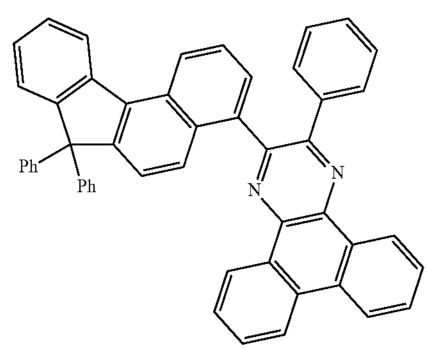

-continued
C-335
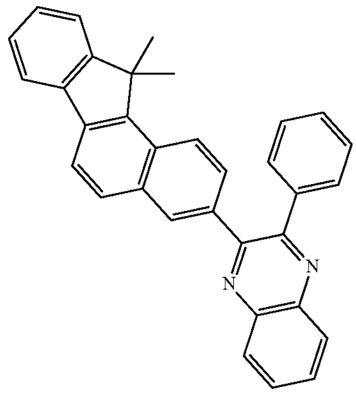
C-336
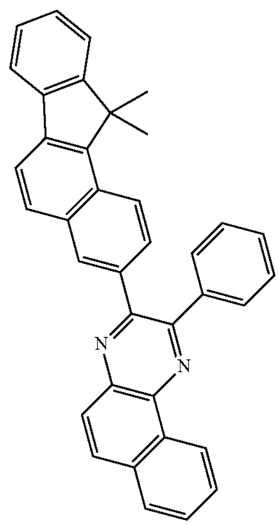
C-337
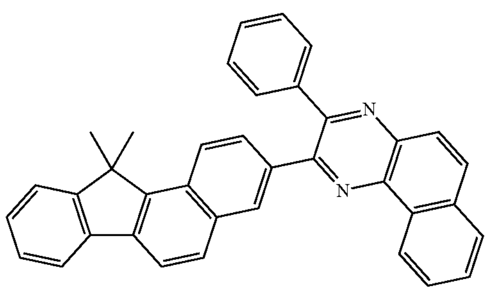
C-338
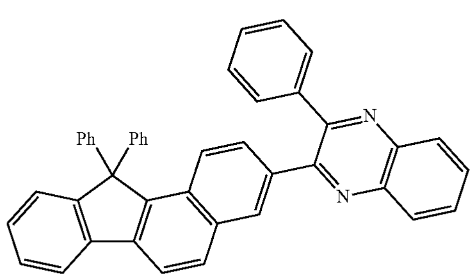
-continued
C-339
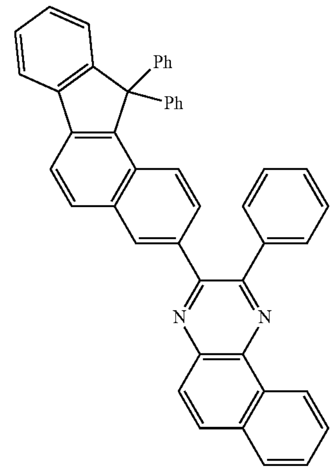
C-340
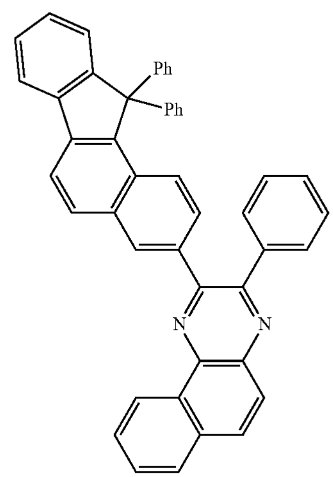
C-341
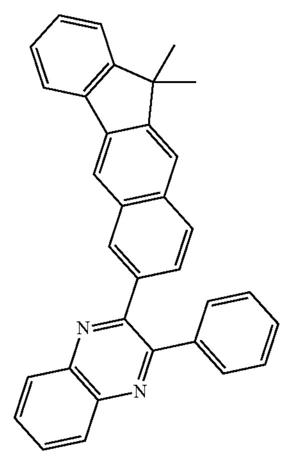

C-342
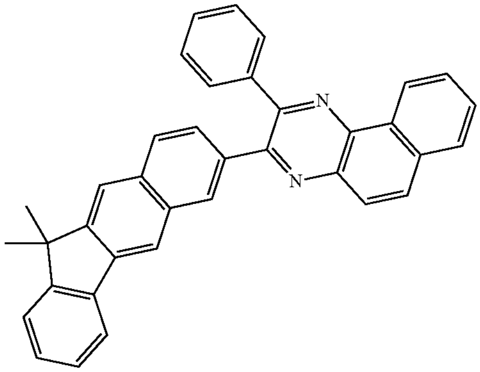
C-343
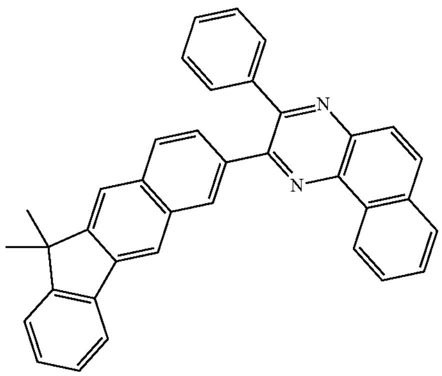
C-344
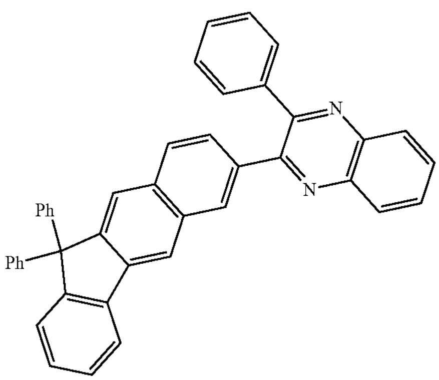
C-345
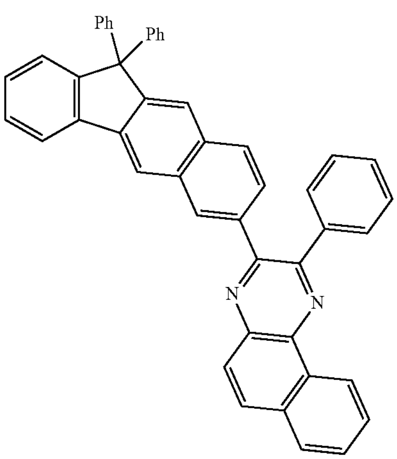
C-346
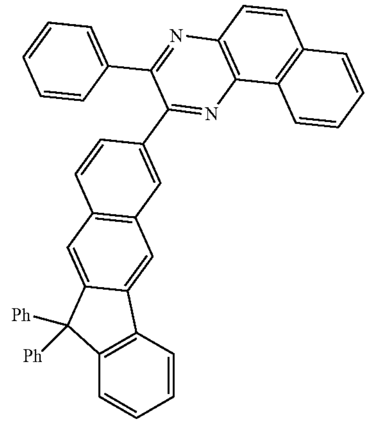
C-347
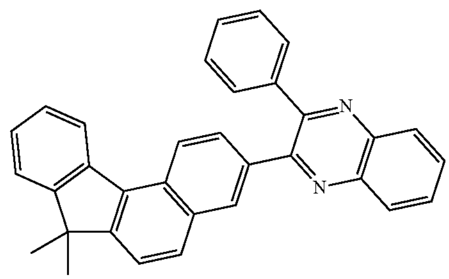
C-348
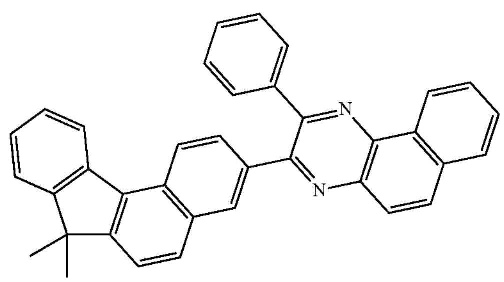
C-349
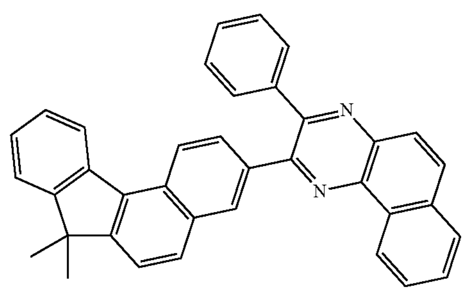

-continued
C-350
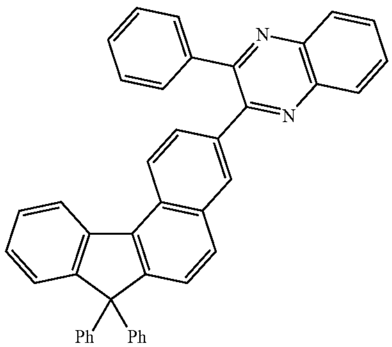
C-351
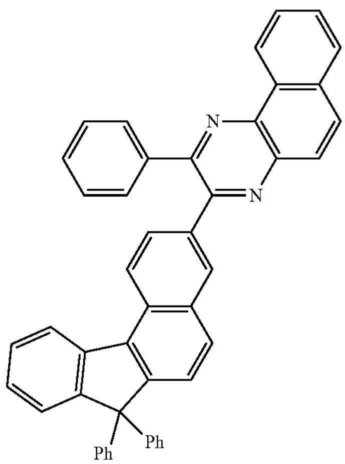
C-352
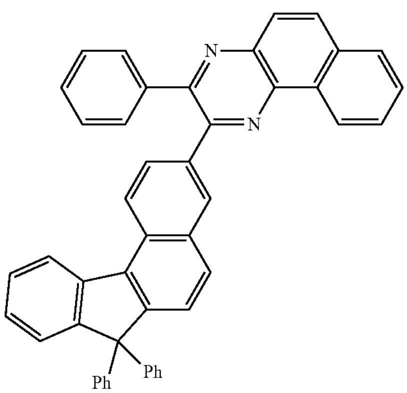
C-353
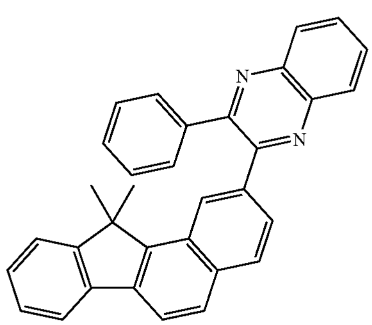
-continued
C-354
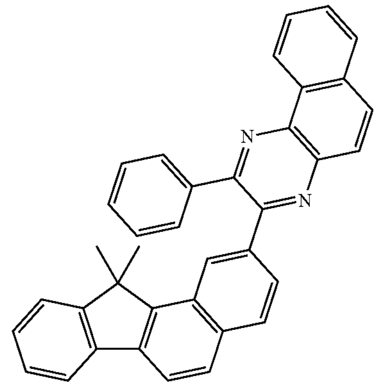
C-355
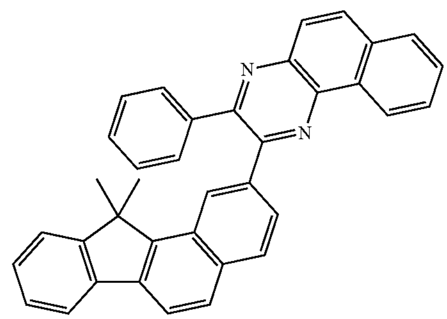
C-356
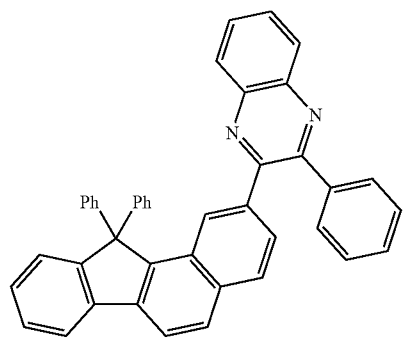
C-357
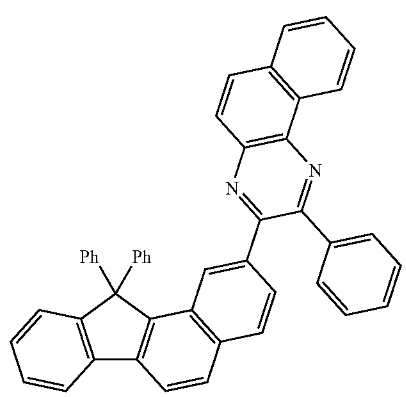

-continued
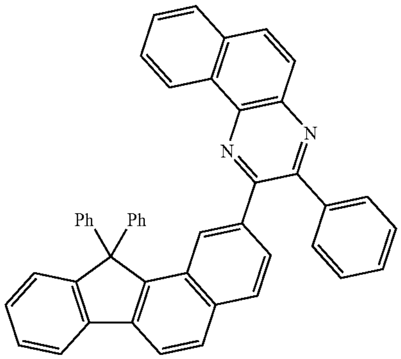
C-358
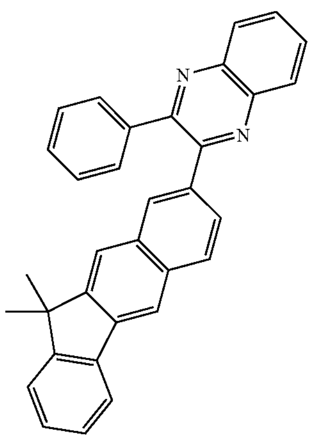
C-359
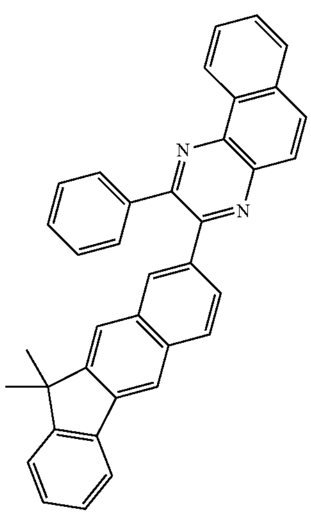
C-360
-continued
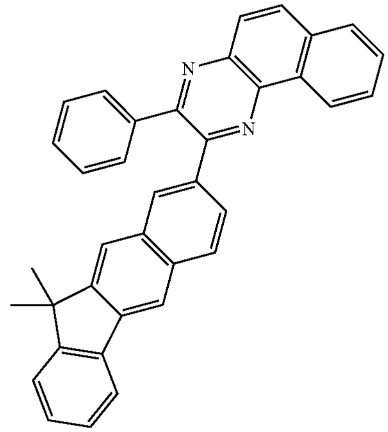
C-361
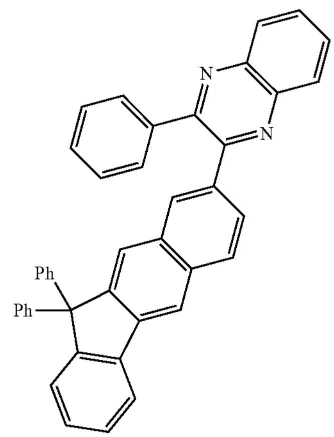
C-362
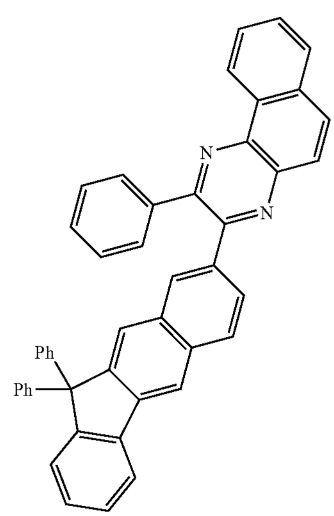
C-363

-continued
C-364
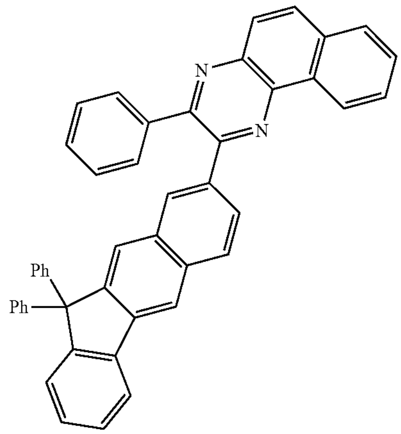
C-365
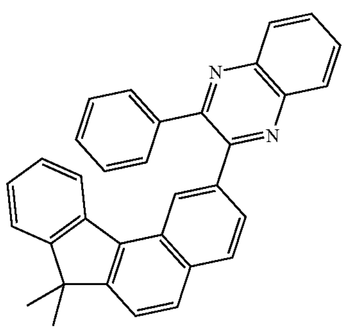
C-366
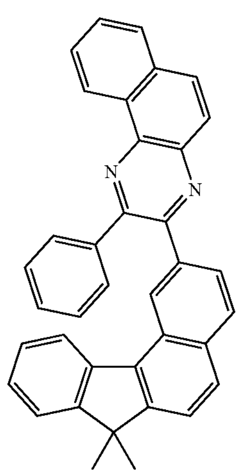
-continued
C-367
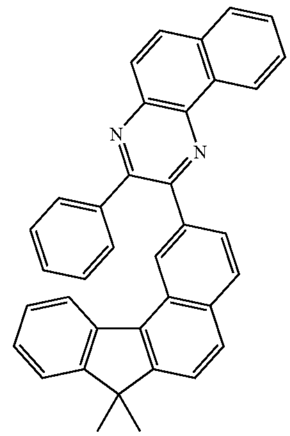
C-368
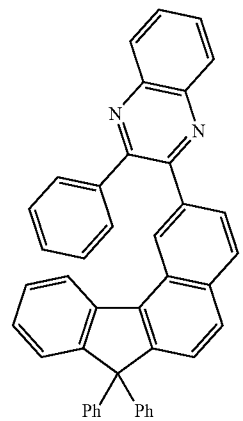
C-369
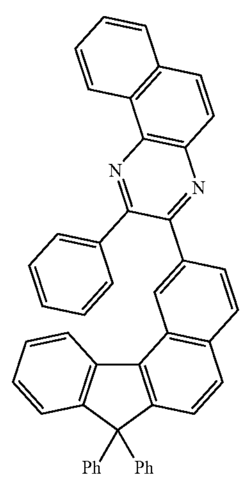

-continued
C-370
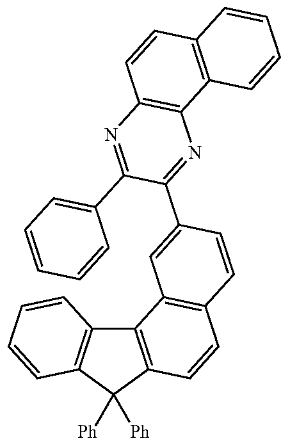
C-371
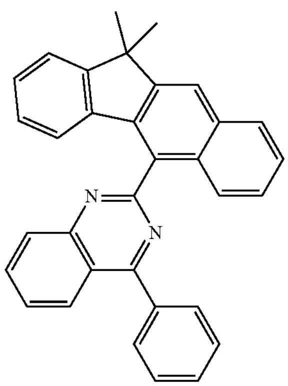
C-372
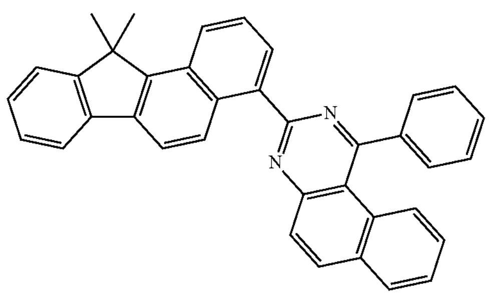
C-373
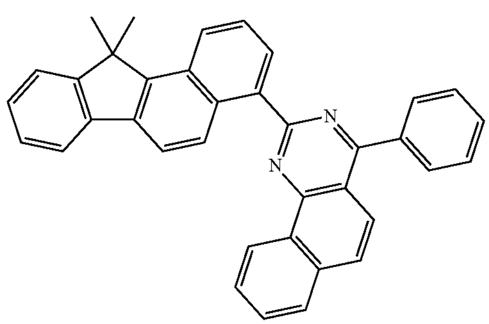
-continued
C-374
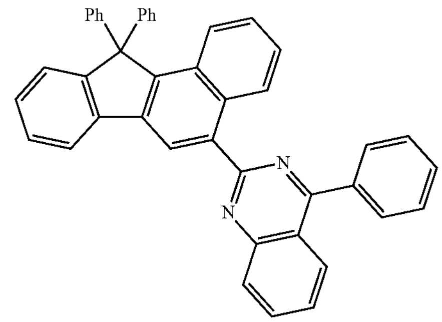
C-375
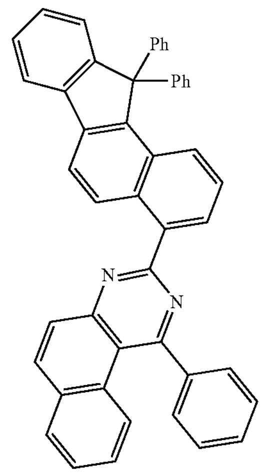
C-376
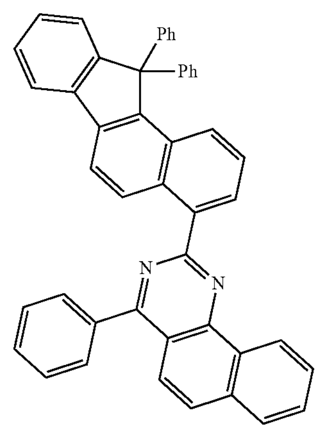
C-377
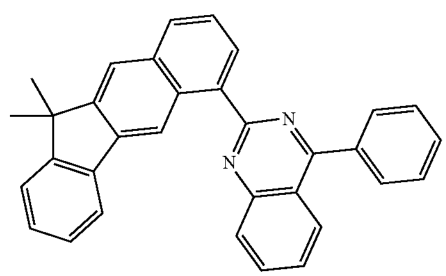

-continued
C-378
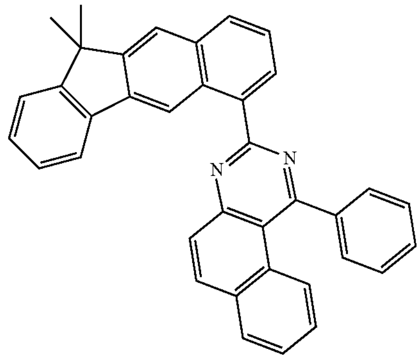
C-379
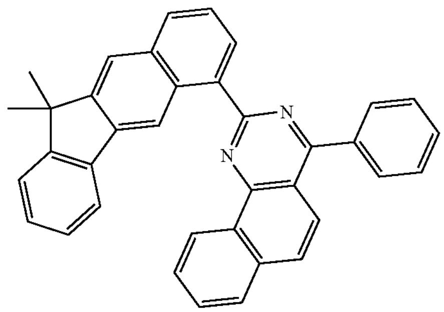
C-380
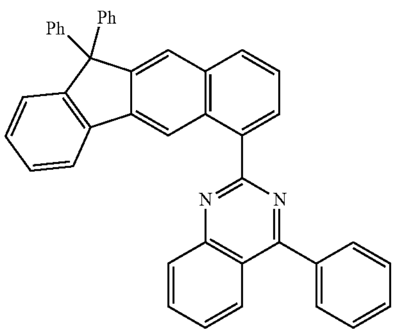
C-381
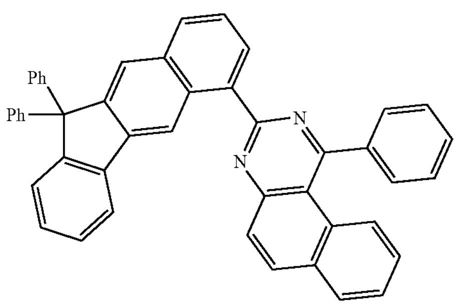
C-382
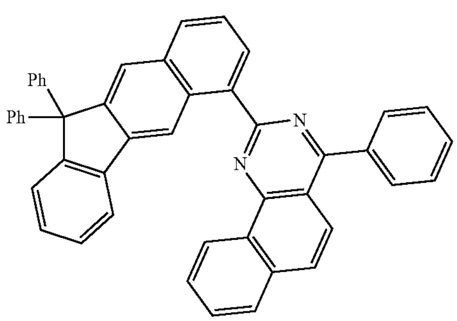
-continued
C-383
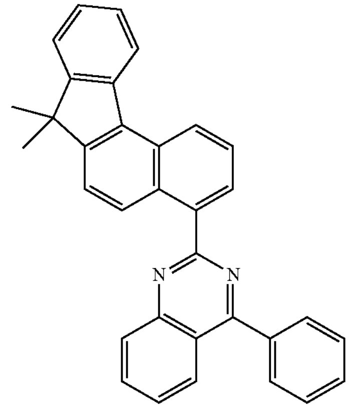
C-384
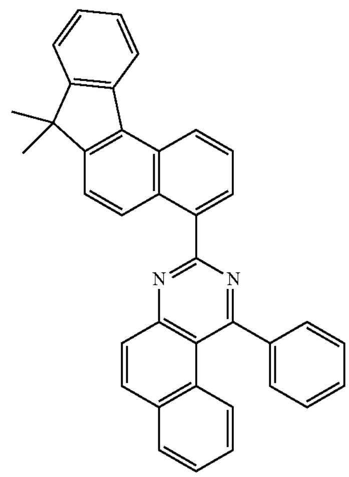
C-385
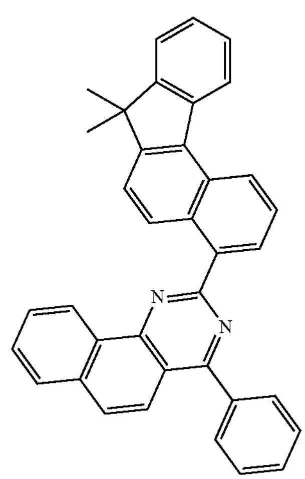

-continued
C-386
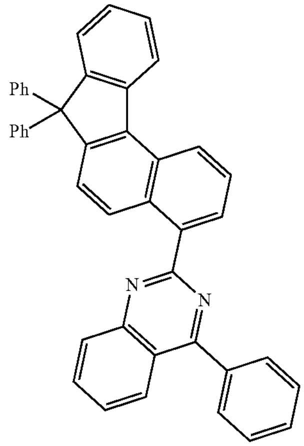
C-387
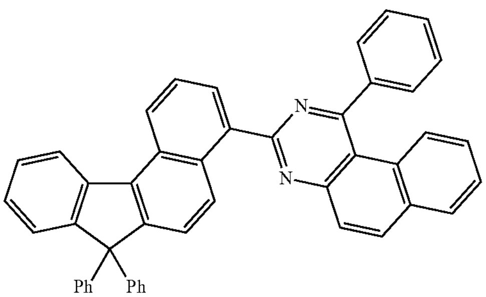
C-388
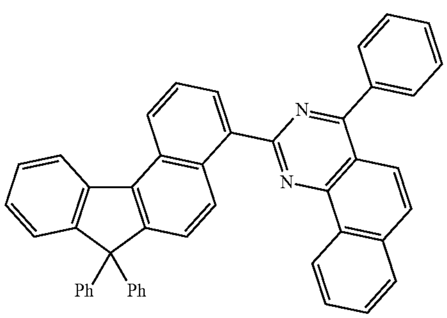
C-389
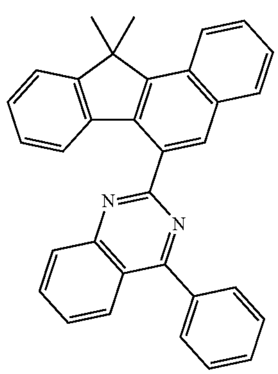
-continued
C-390
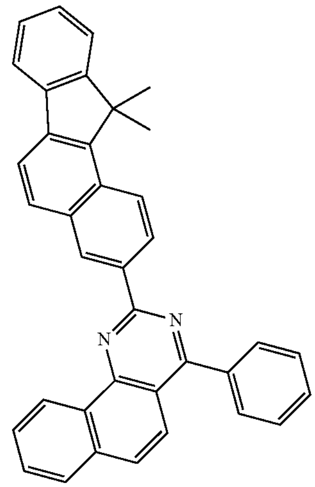
C-391
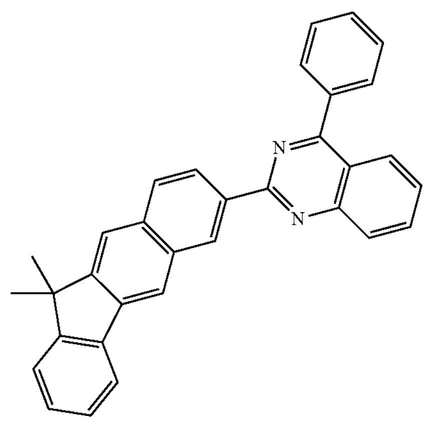
C-392
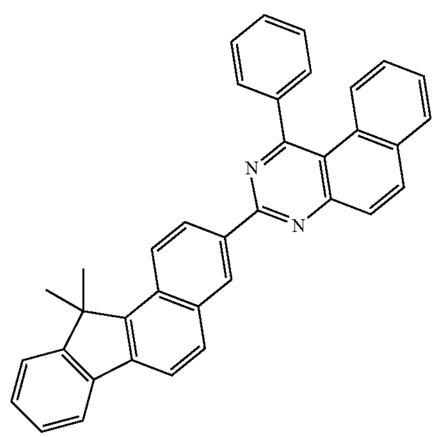

-continued
C-393
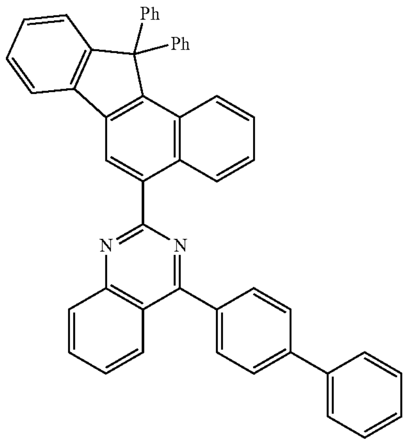
C-394
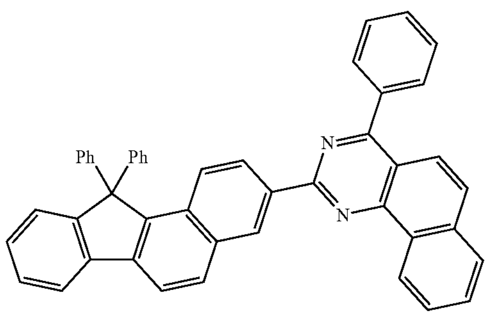
C-395
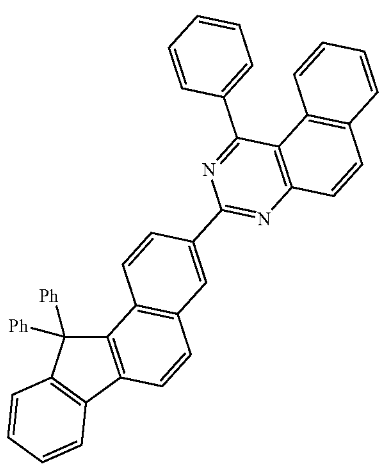
-continued
C-396
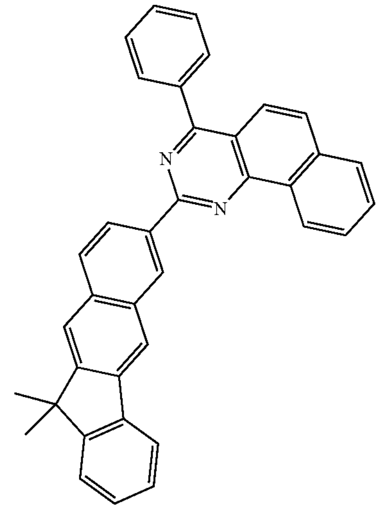
C-397
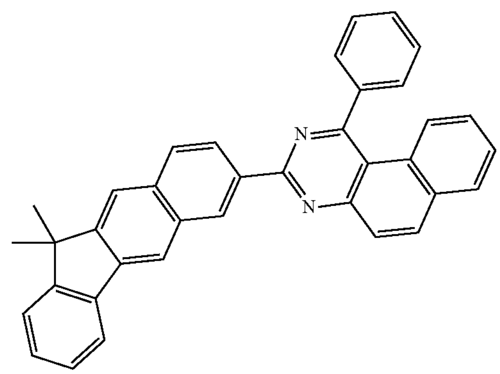
C-398
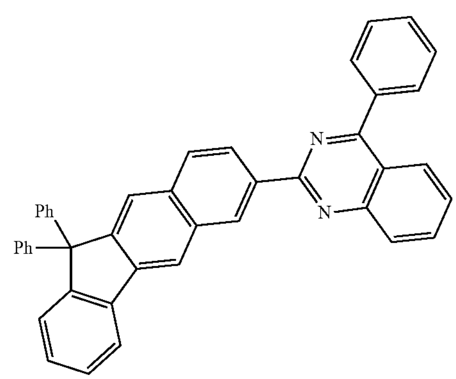

-continued
C-399
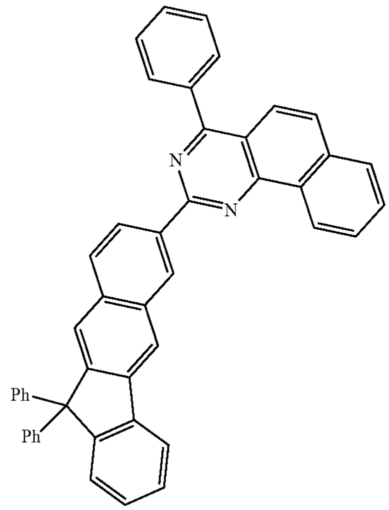
C-400
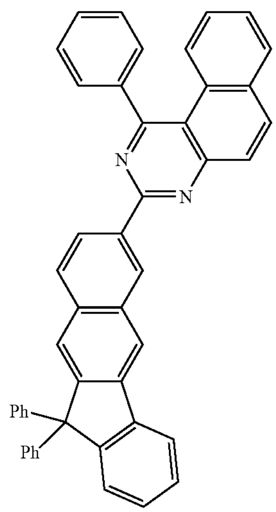
C-401
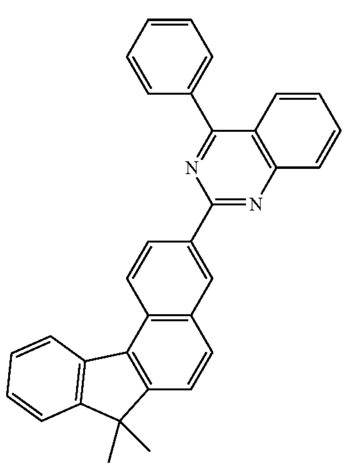
-continued
C-402
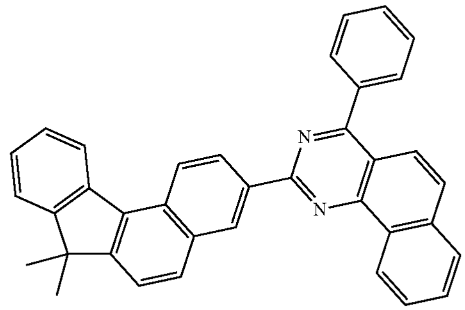
C-403
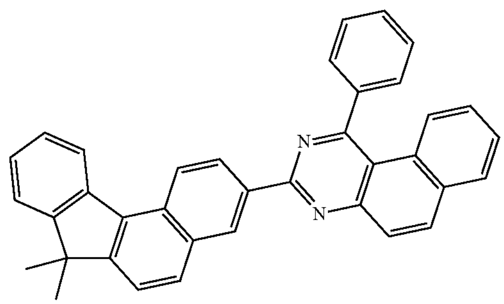
C-404
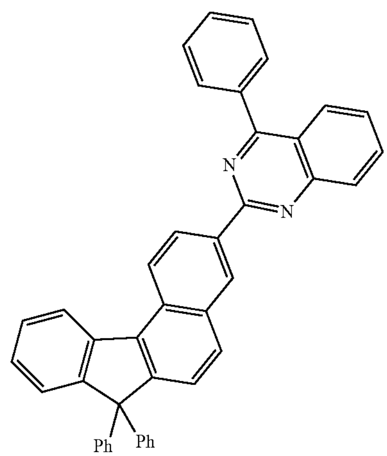
C-405
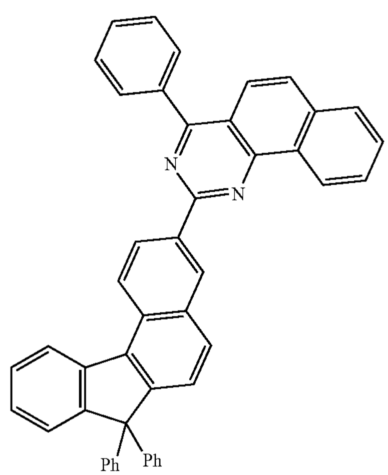

-continued
C-406
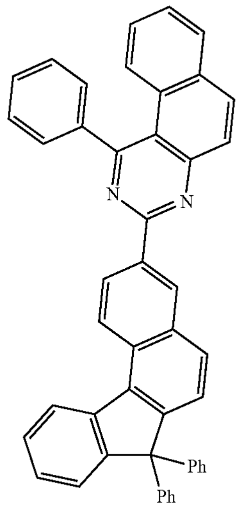
C-407
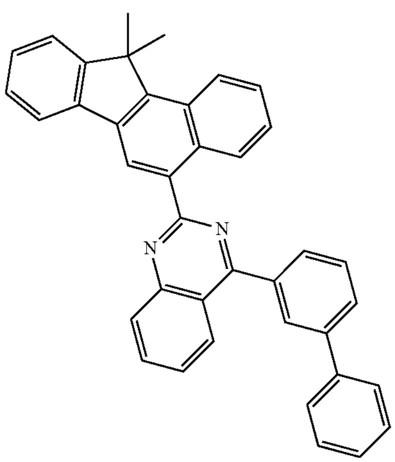
C-408
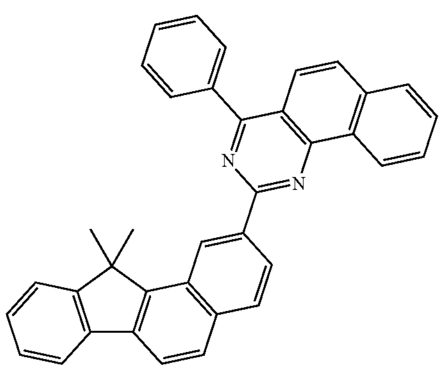
-continued
C-409
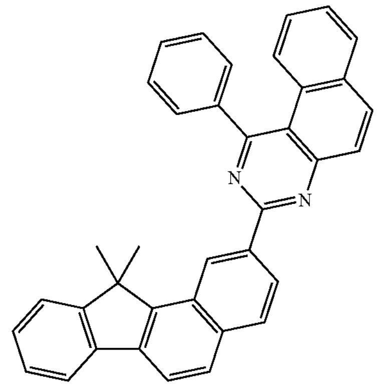
C-410
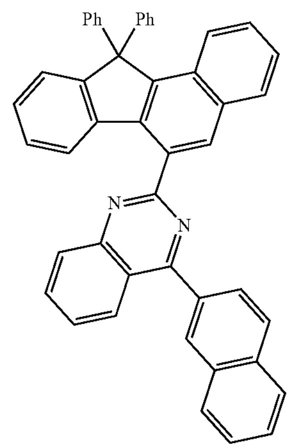
C-411
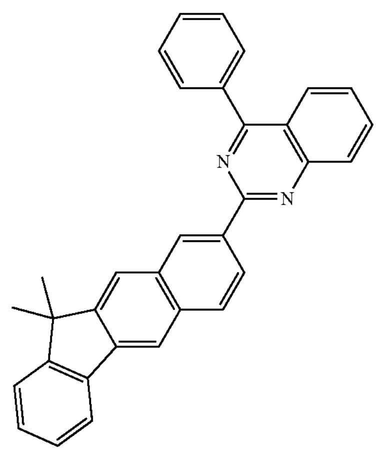

-continued
C-412
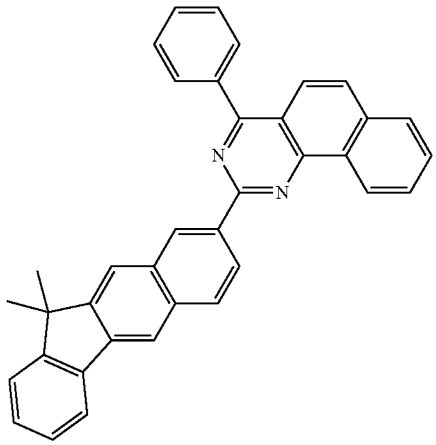
C-413
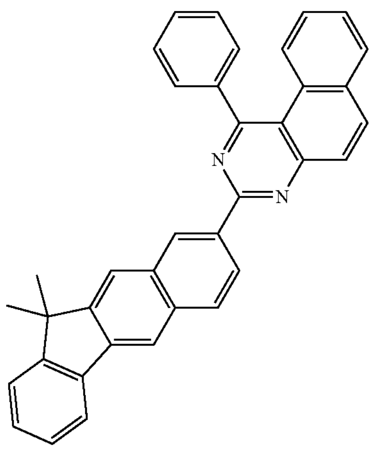
C-414
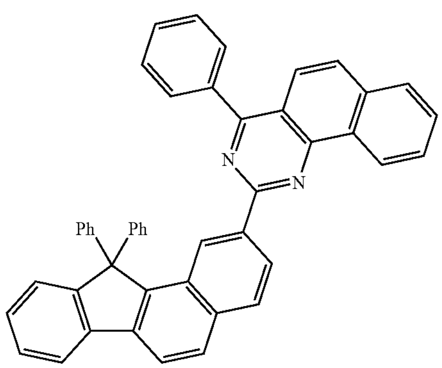
C-415
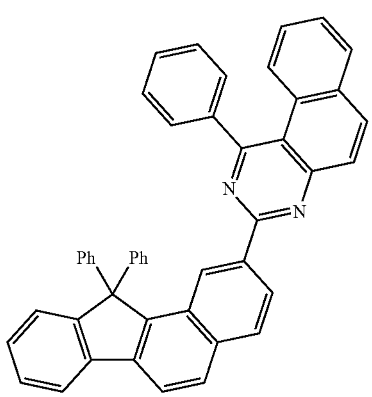
-continued
C-416
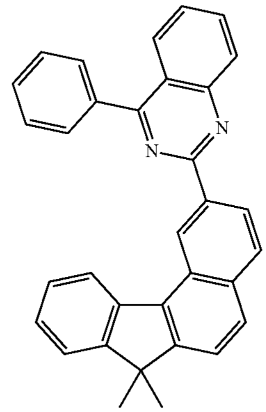
C-417
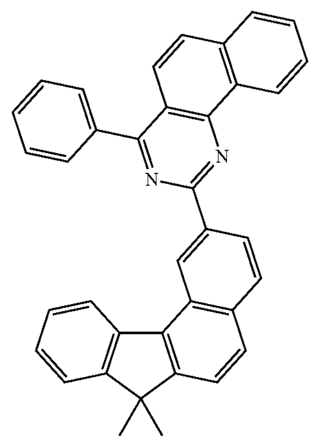
C-418
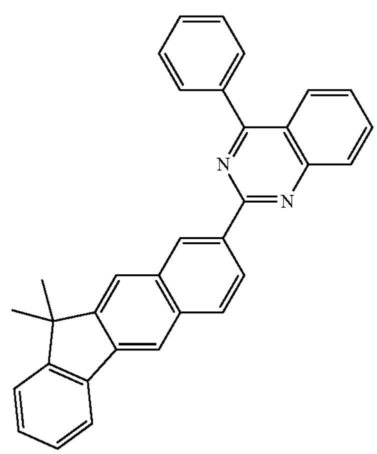

-continued
C-419
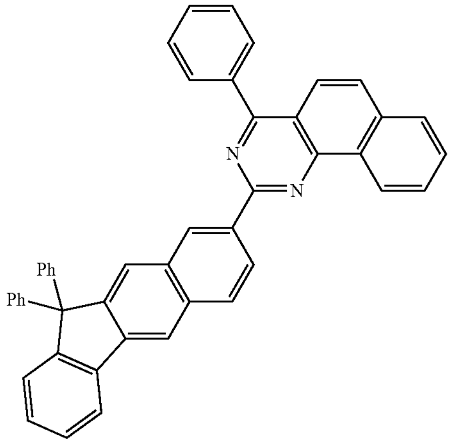
C-420
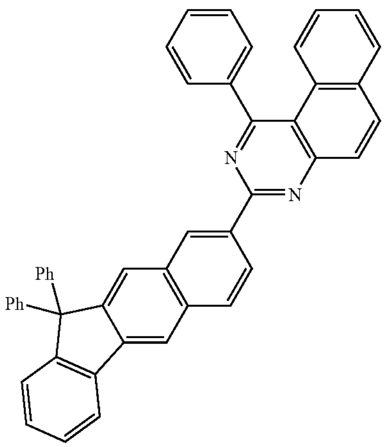
C-421
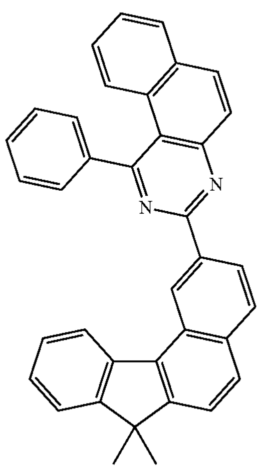
-continued
C-422
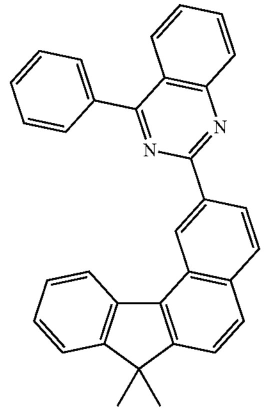
C-423
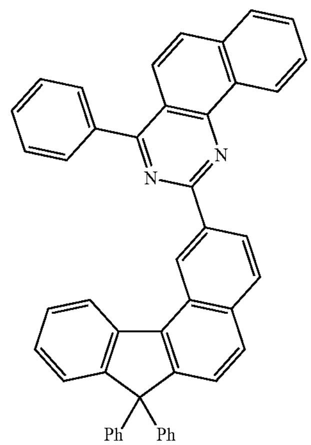
C-424
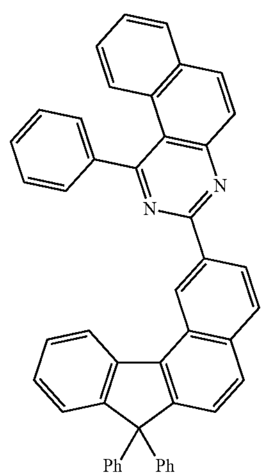

-continued
C-425
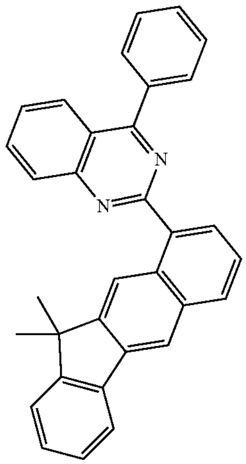
C-426
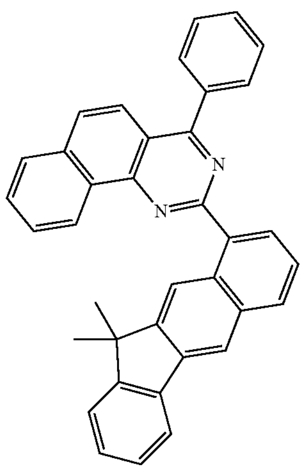
C-427
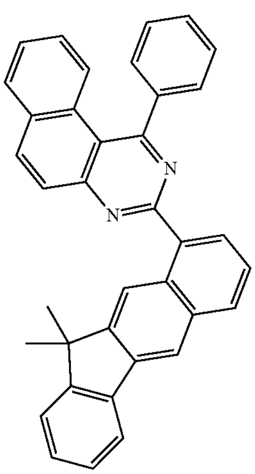
-continued
C-428
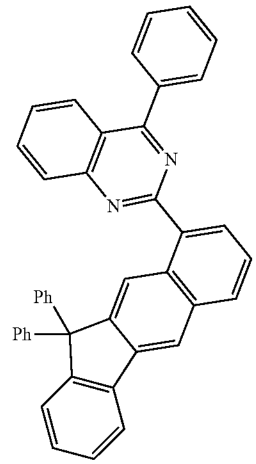
C-429
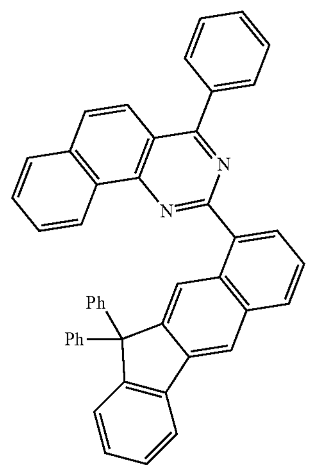
C-430
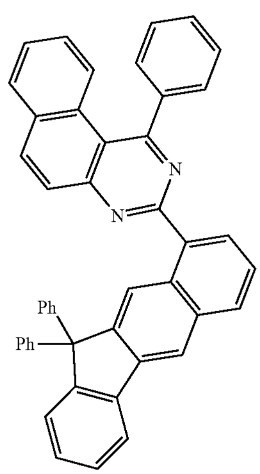

C-431
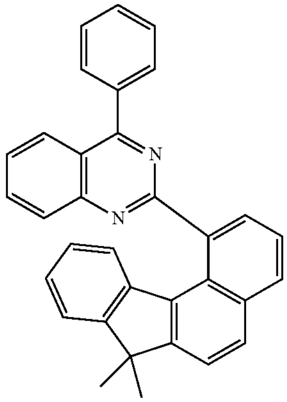
C-432
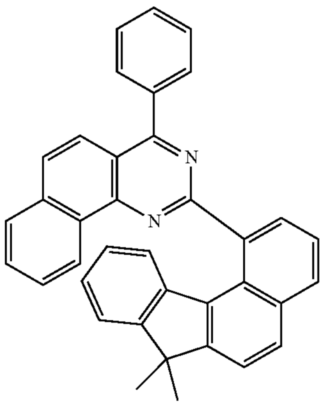
C-433
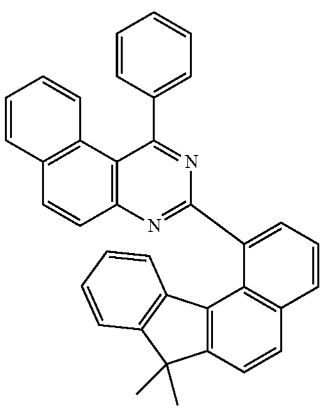
C-434
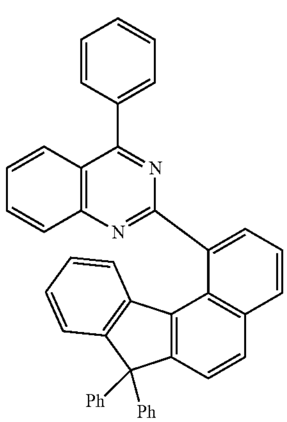
C-435
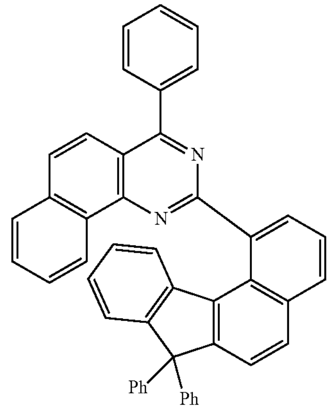
C-436
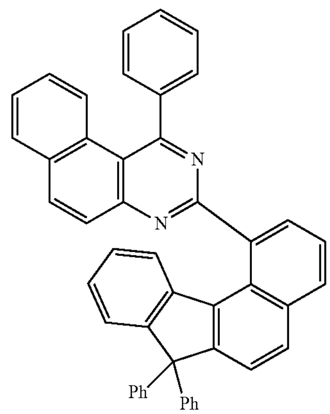
C-437
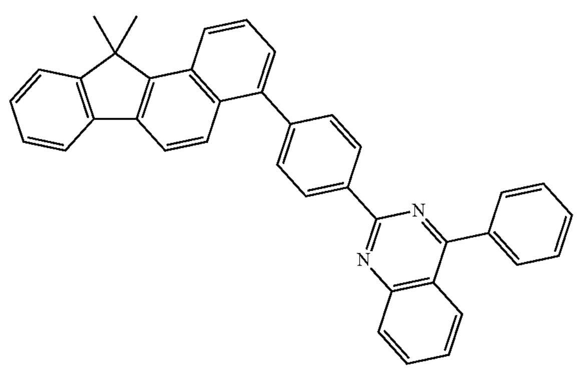
C-438
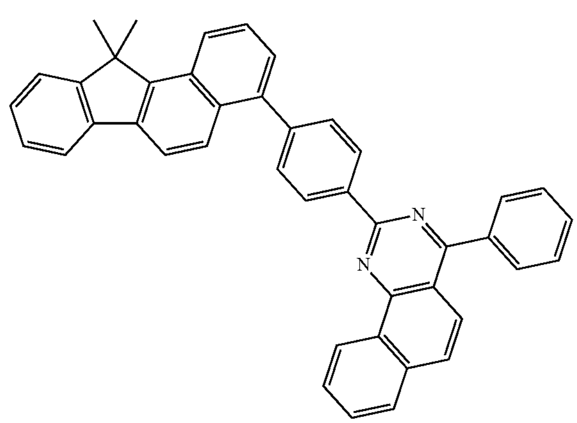

-continued
C-439
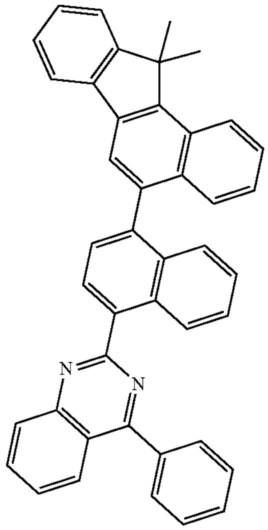
C-440
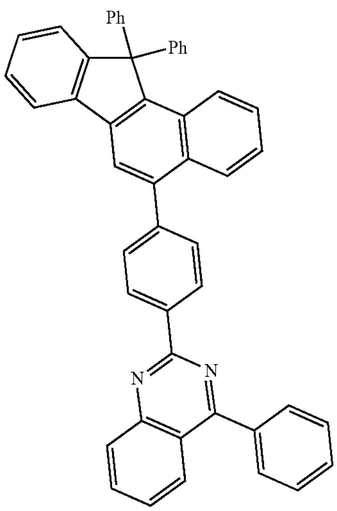
C-441
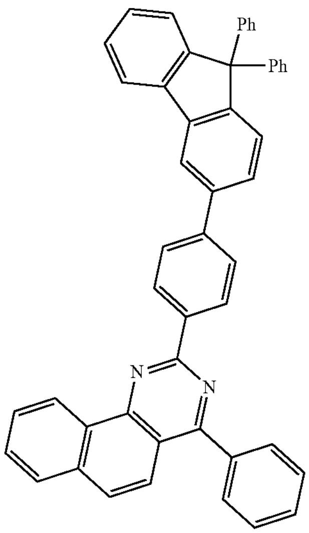
-continued
C-442
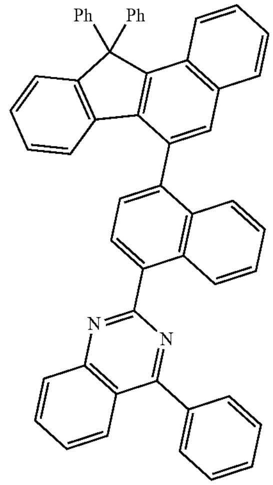
C-443
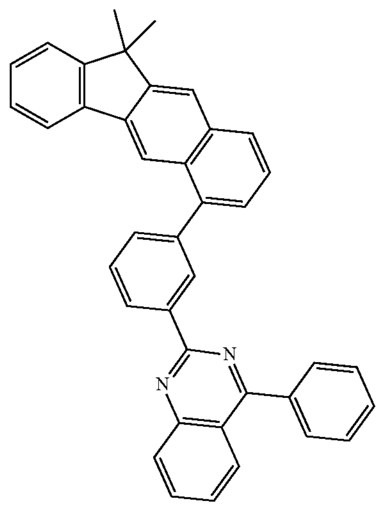
C-444
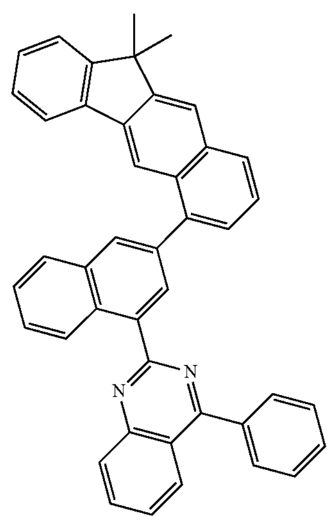

-continued
C-445
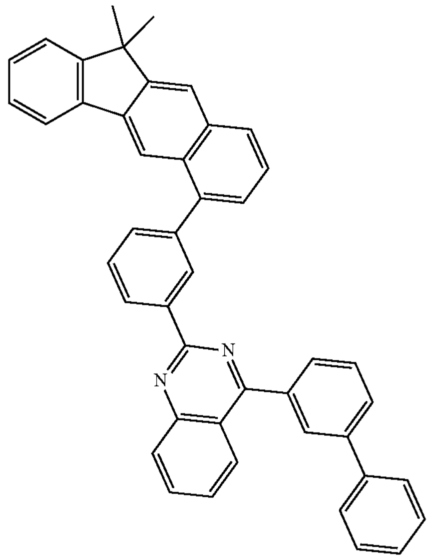
C-446
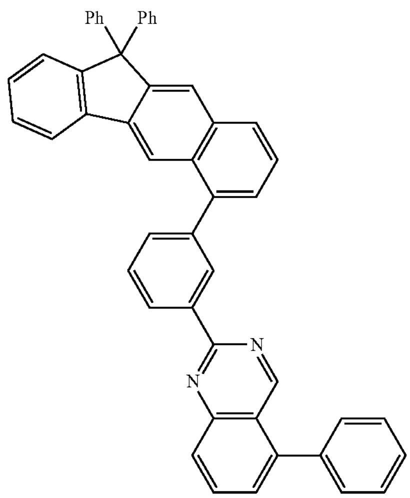
C-447
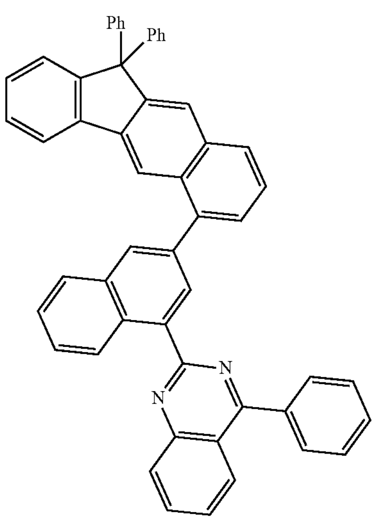
-continued
C-448
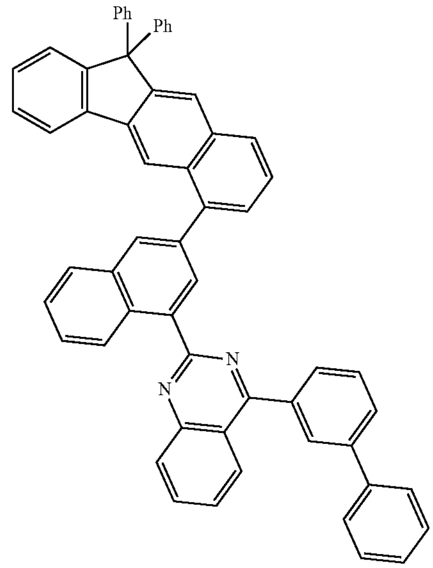
C-449
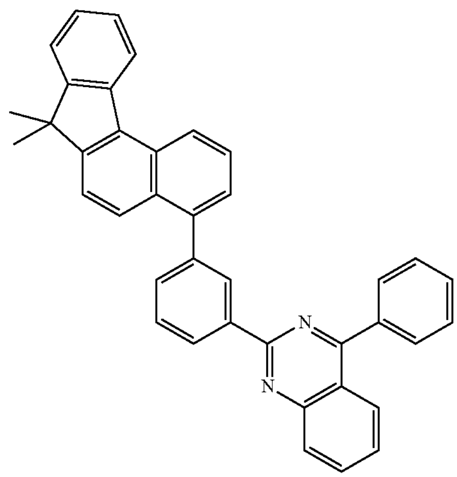
C-450
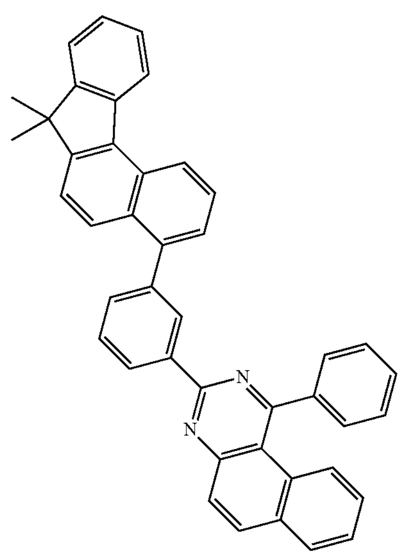

-continued
C-451
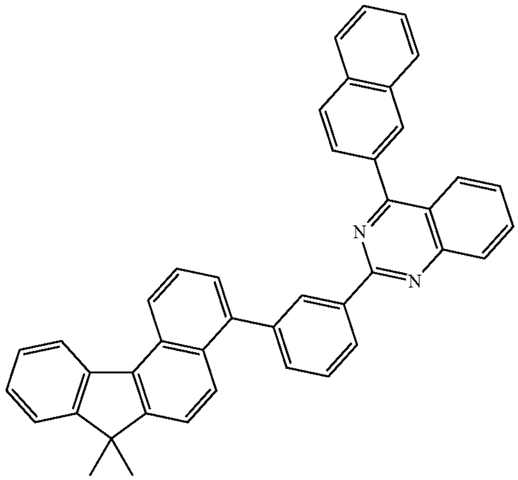
C-452
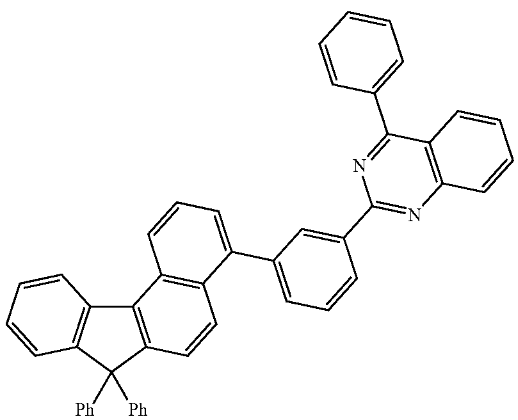
C-453
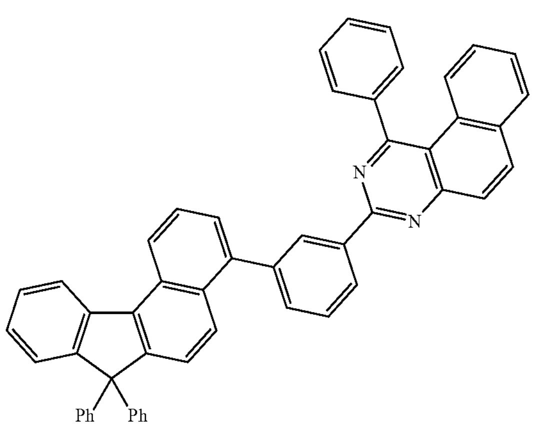
-continued
C-454
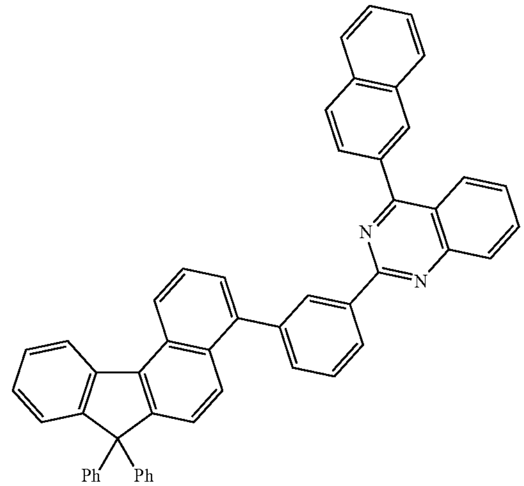
C-455
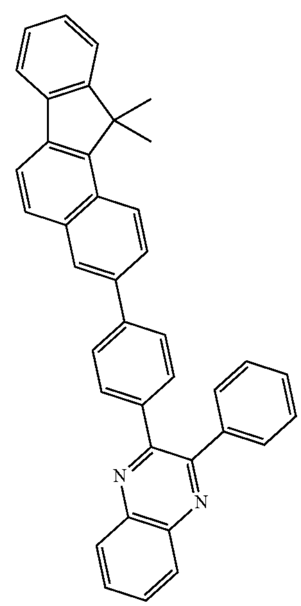

-continued
C-456
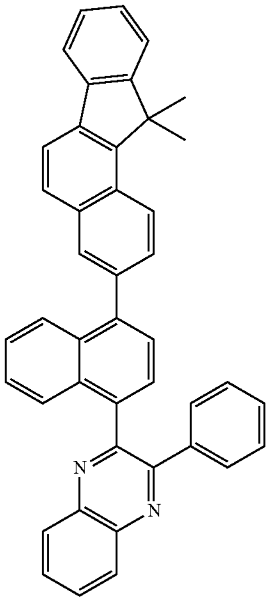
C-457
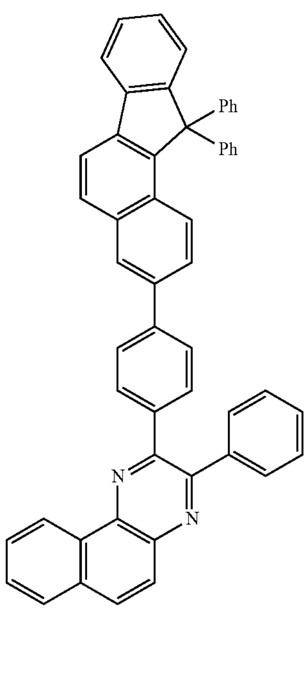
-continued
C-458
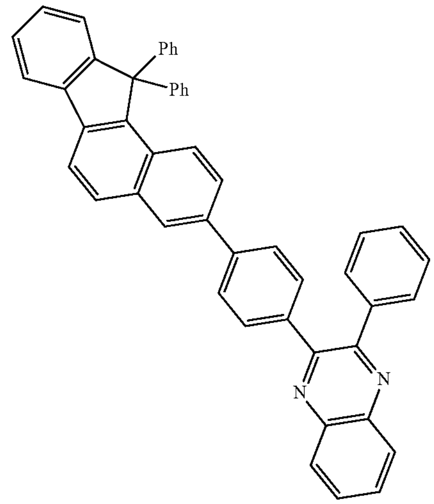
C-459
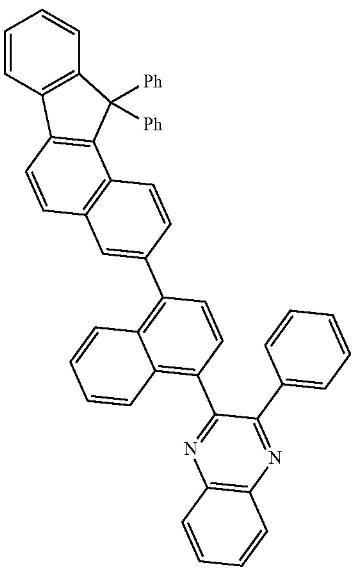
C-460
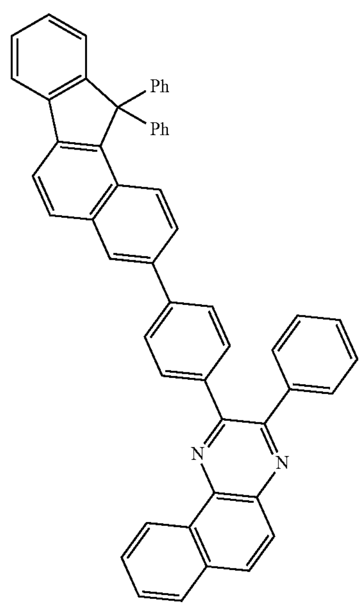

-continued
C-461
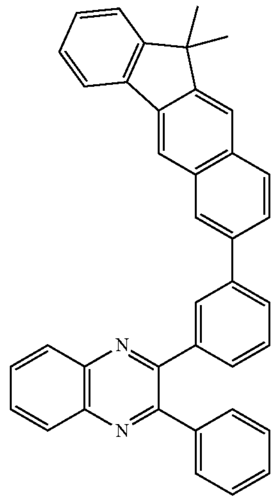
C-462
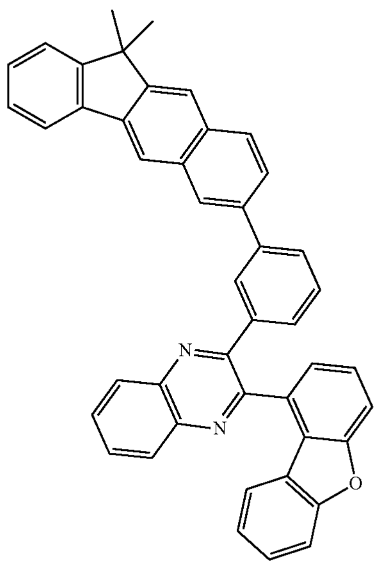
C-463
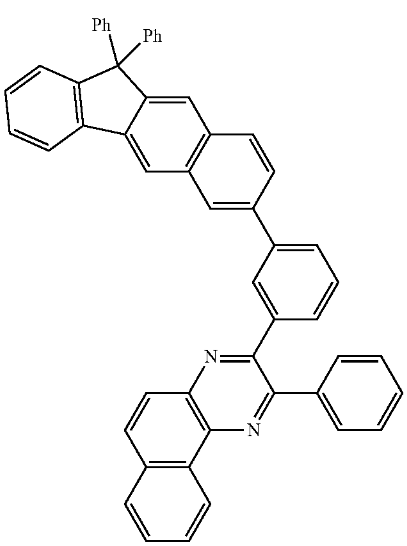
-continued
C-464
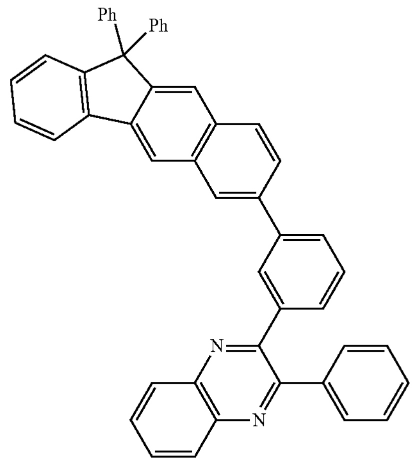
C-465
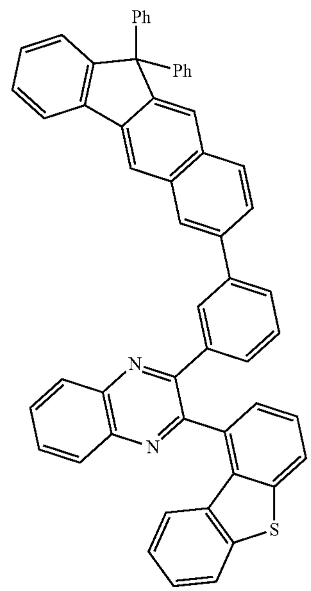
C-466
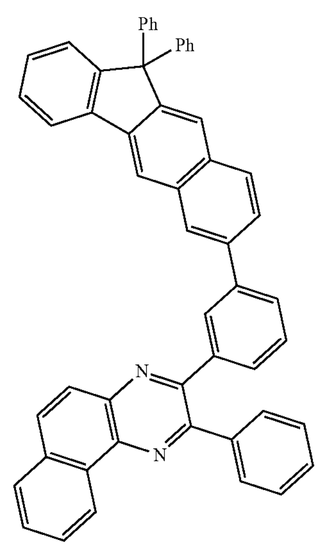

-continued
C-467
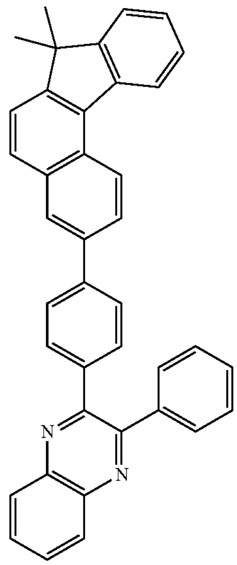
C-468
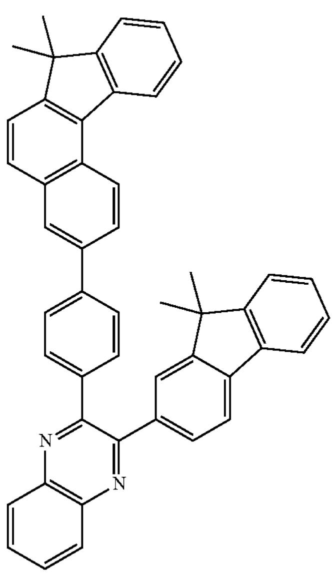
-continued
C-469
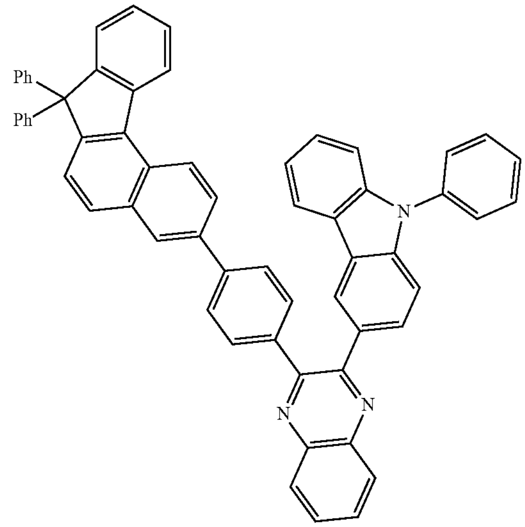
C-470
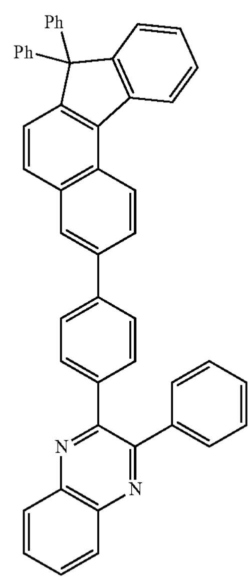

C-471
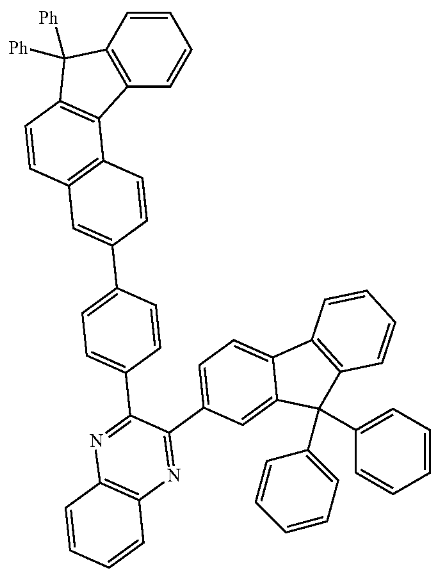
C-472
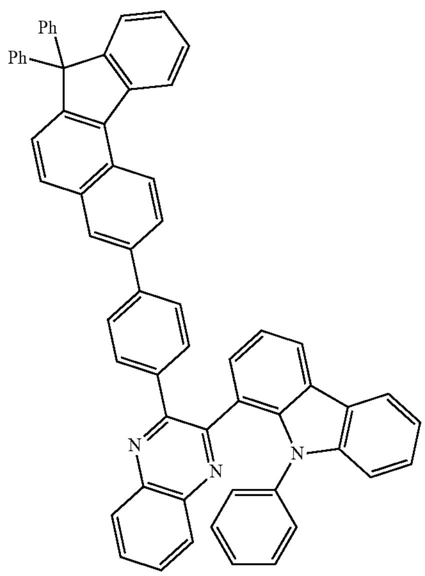
C-473
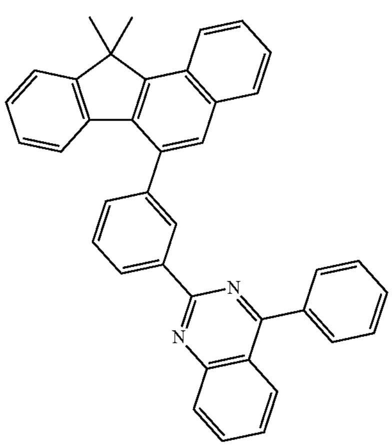
C-474
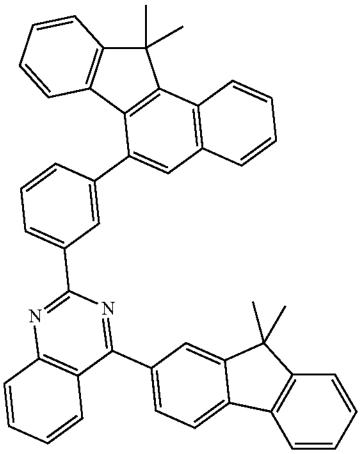
C-475
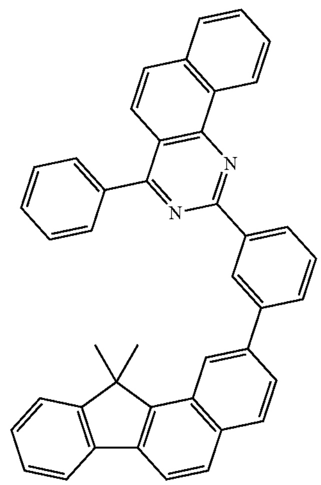
C-476
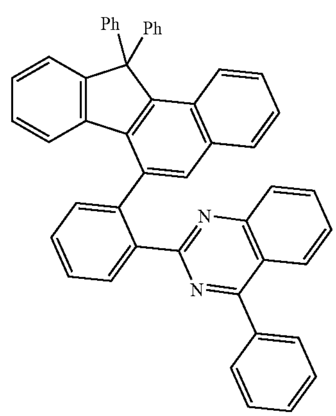

-continued
C-477
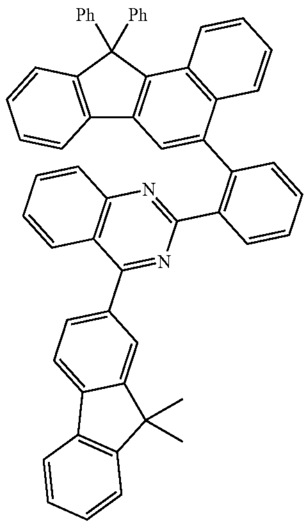
C-478
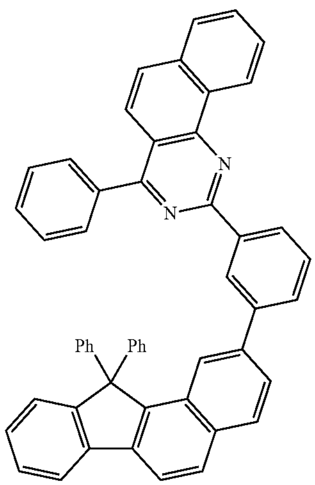
C-479
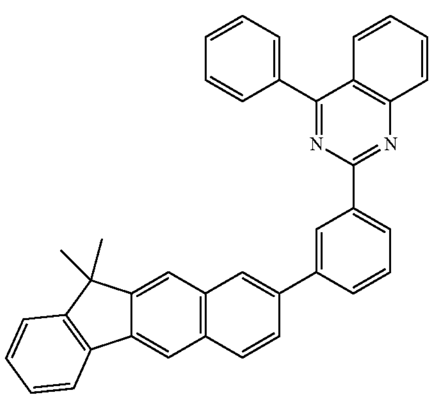
-continued
C-480
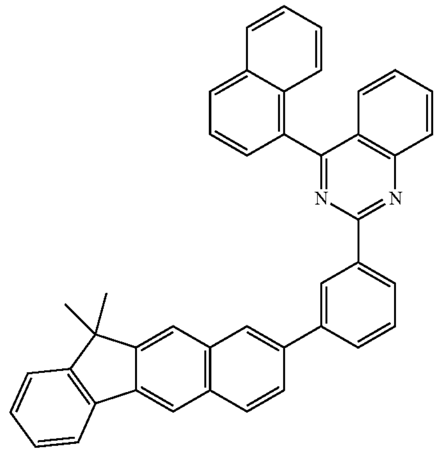
C-481
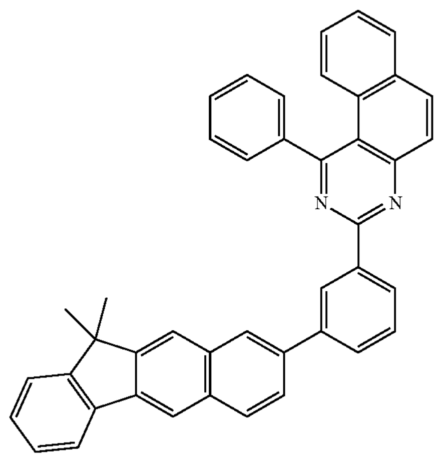
C-482
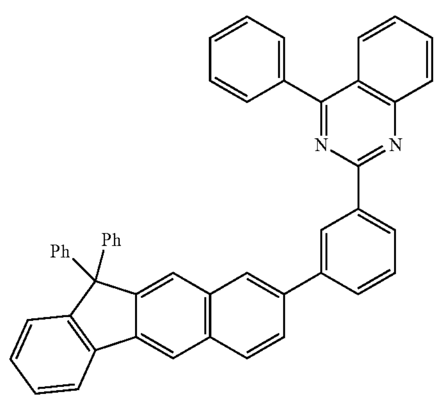

-continued
C-483
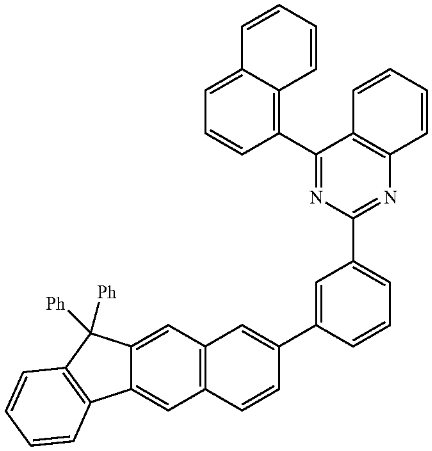
C-484
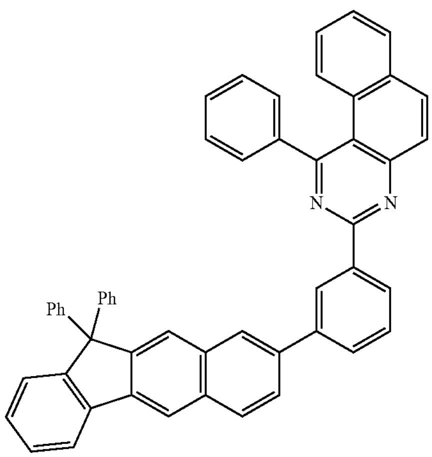
C-485
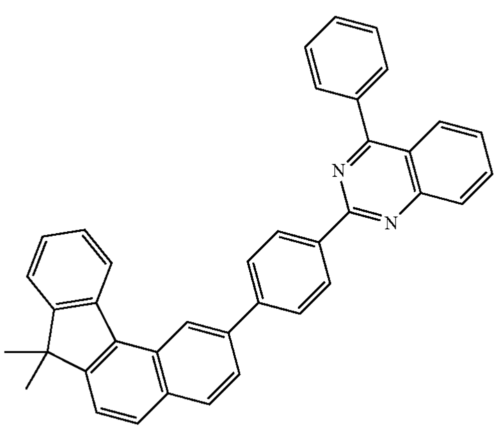
-continued
C-486
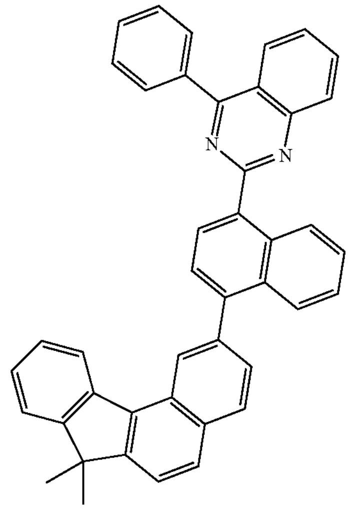
C-487
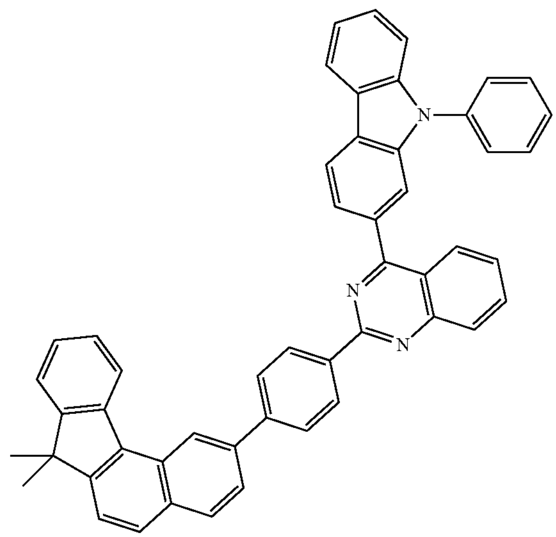
C-488
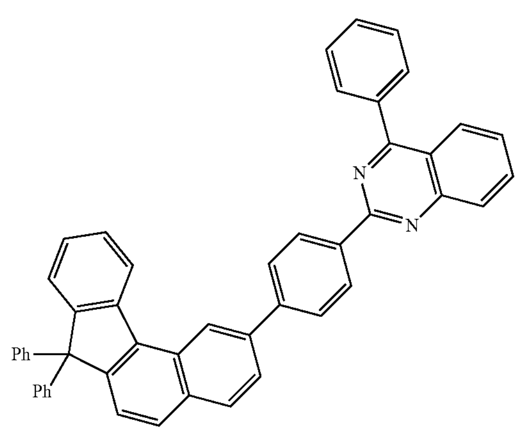

-continued
C-489
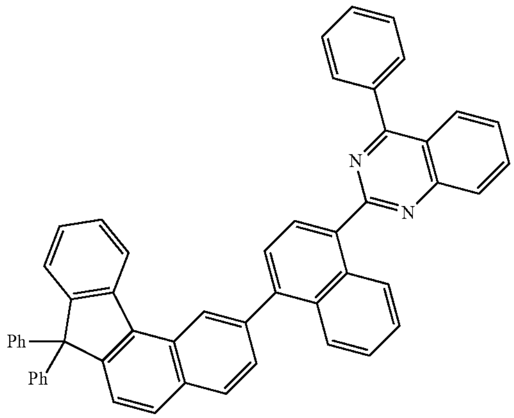
C-490
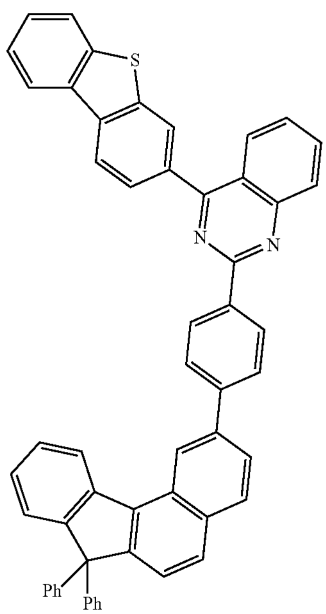
C-491
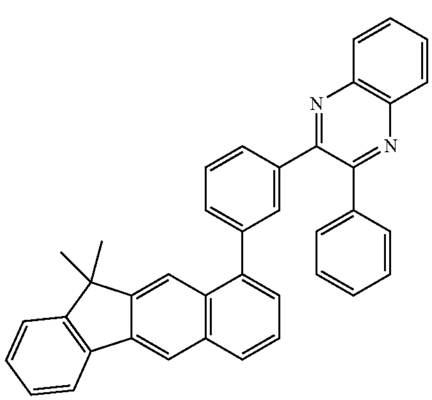
-continued
C-492
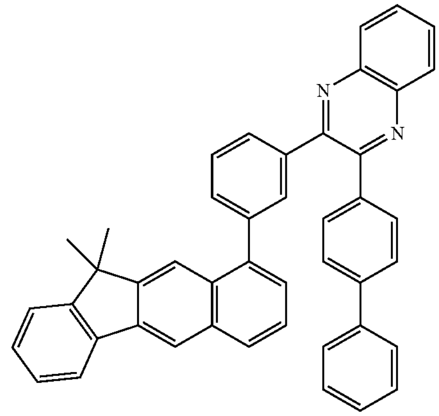
C-493
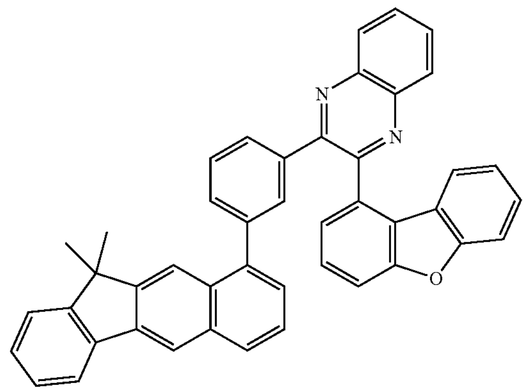
C-494
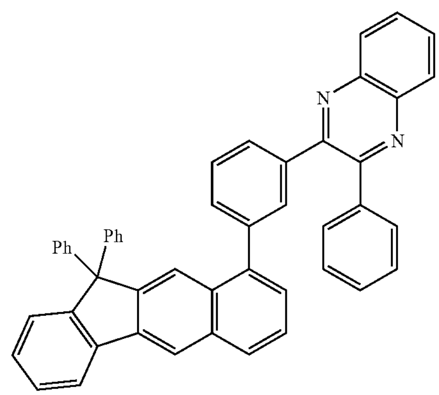
C-495
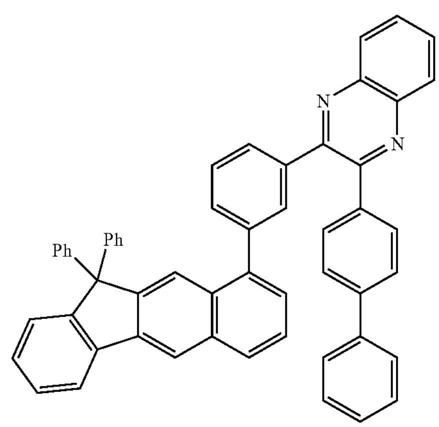

-continued
C-496
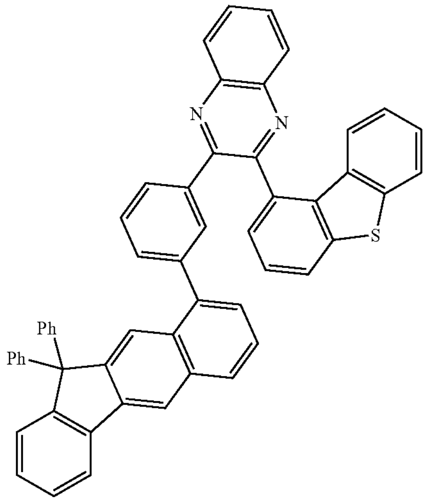
C-497
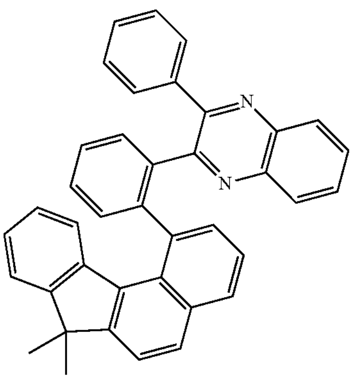
C-498
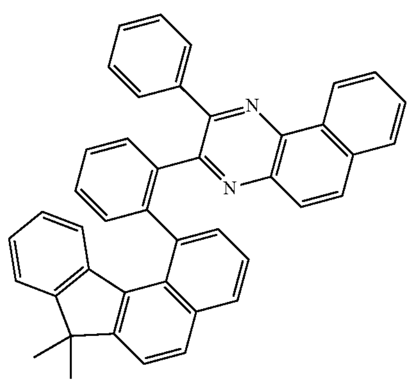
-continued
C-499
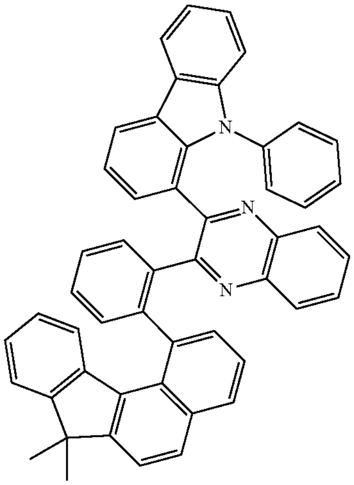
C-500
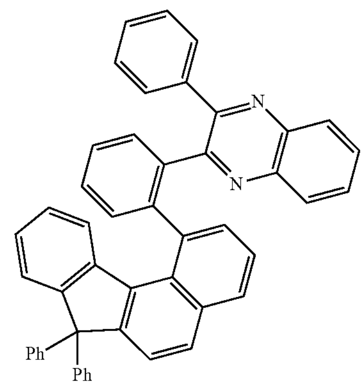
C-501
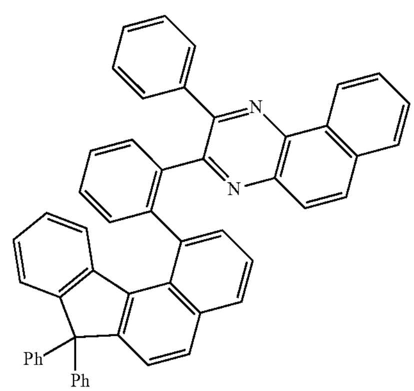

-continued
C-502
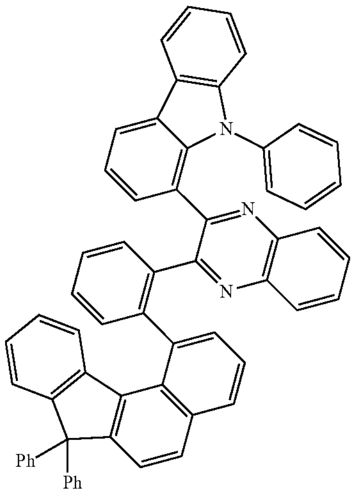
C-503
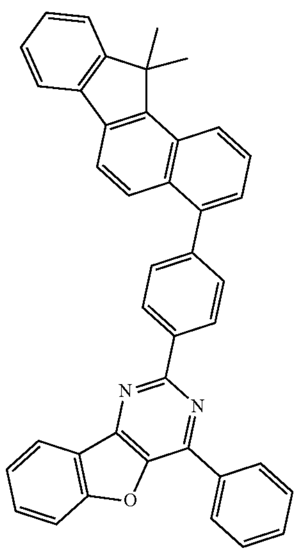
C-504
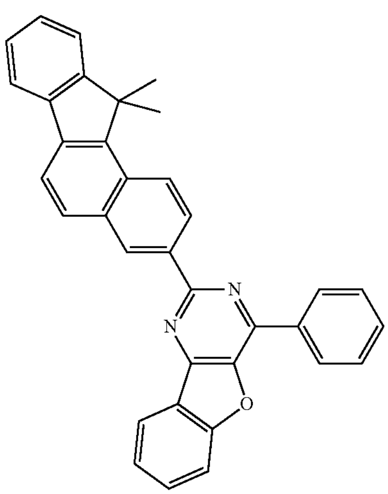
-continued
C-505
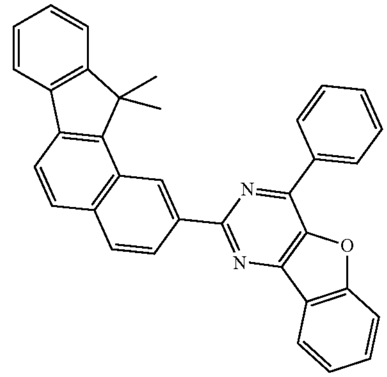
C-506
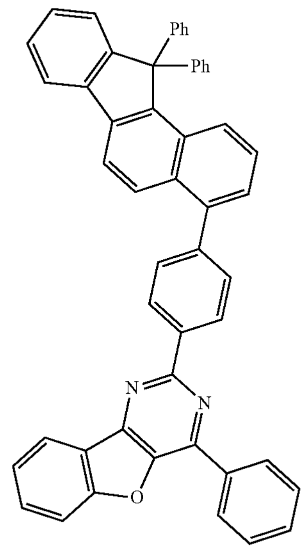
C-507
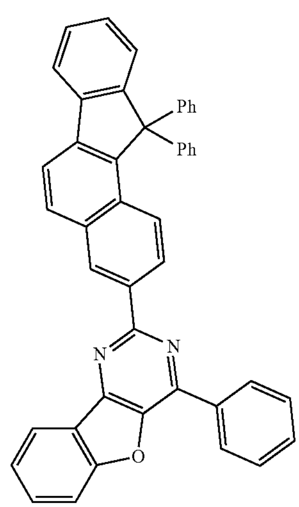

-continued
C-508
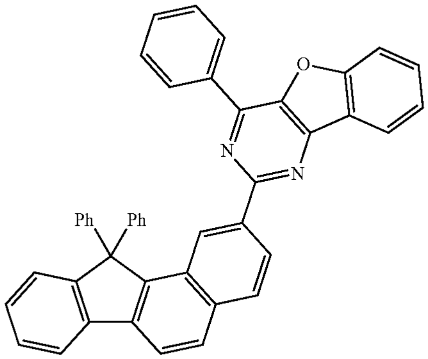
C-509
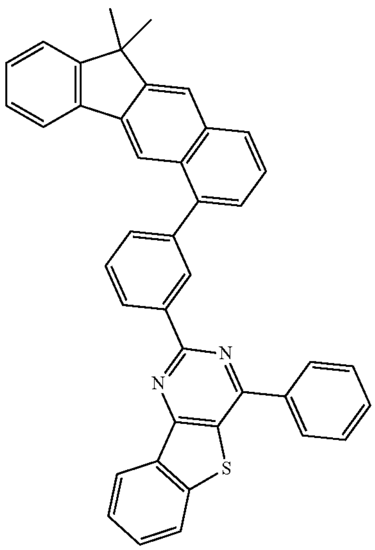
C-510
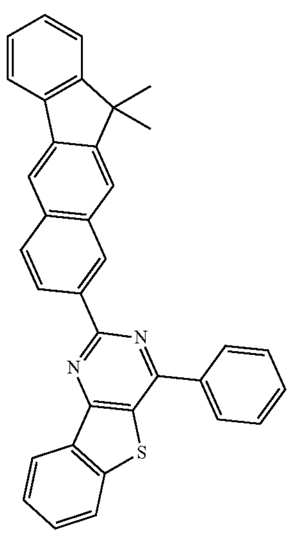
-continued
C-511
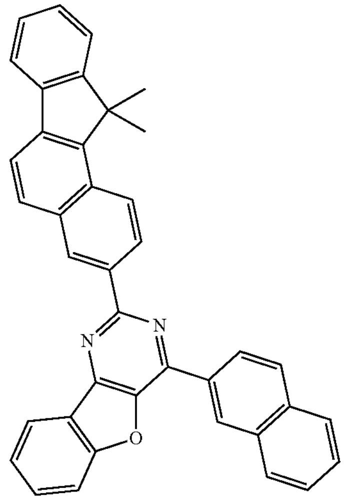
C-512
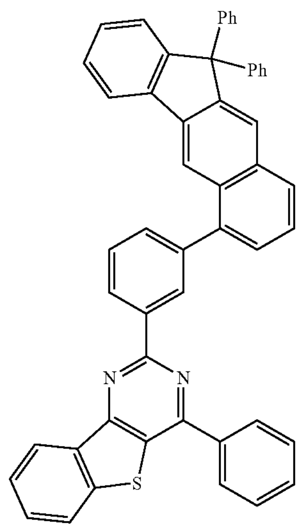
C-513
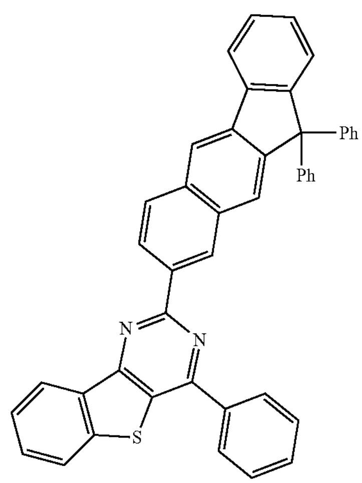

-continued
C-514
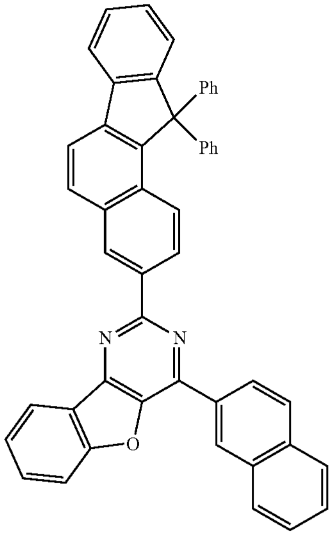
C-515
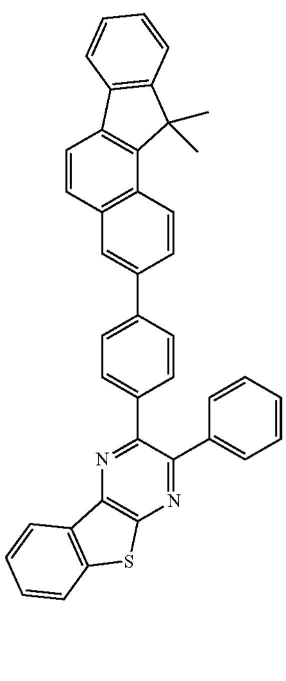
-continued
C-516
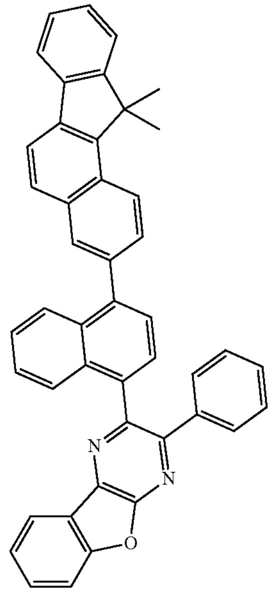
C-517
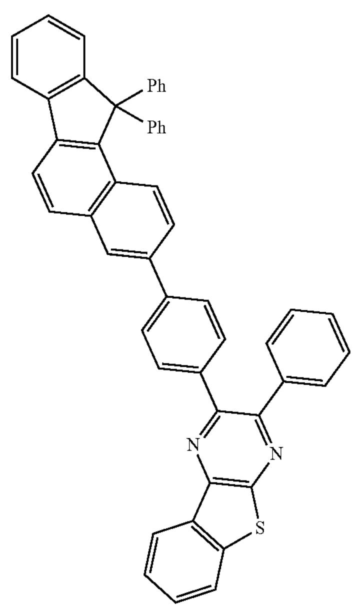

-continued
C-518
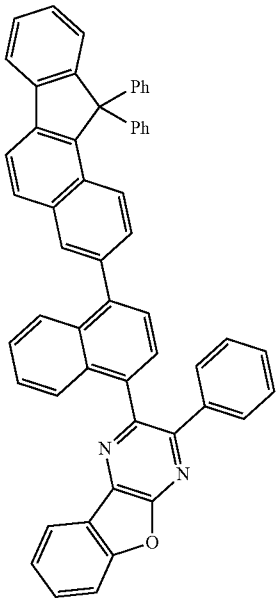
C-519
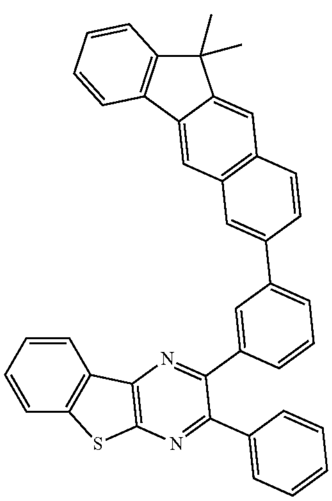
-continued
C-520
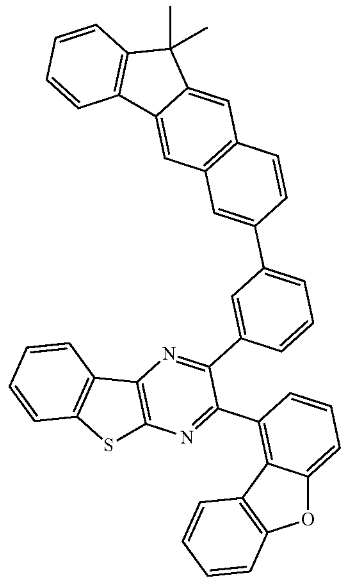
C-521
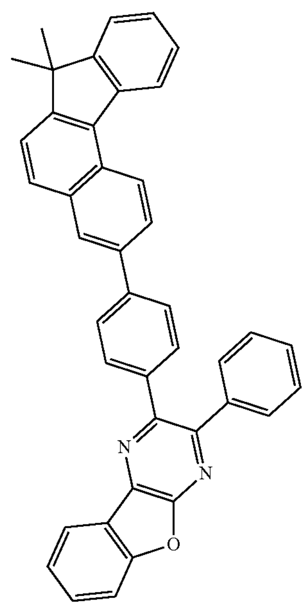

C-522
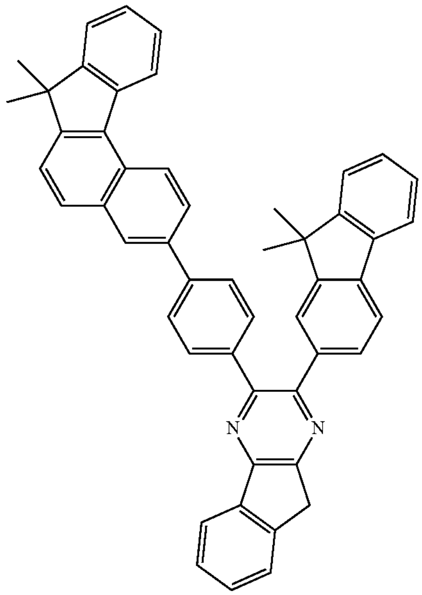
C-523
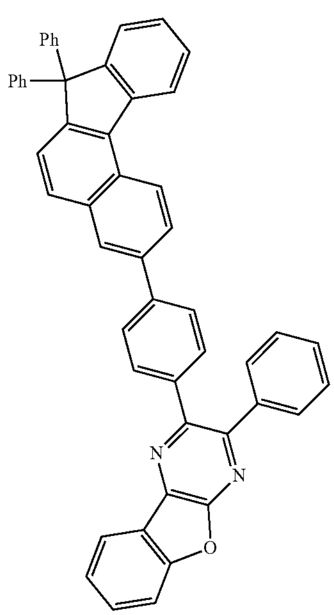
C-524
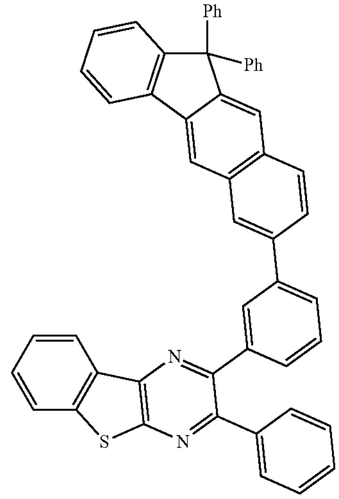
C-525
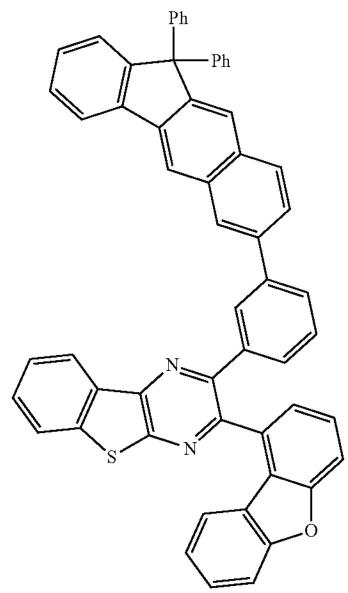
C-526
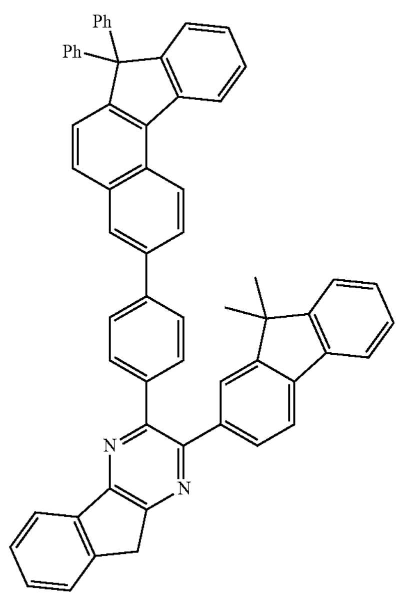

-continued
C-527
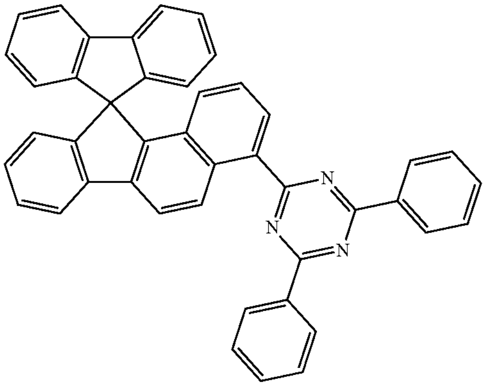
C-528
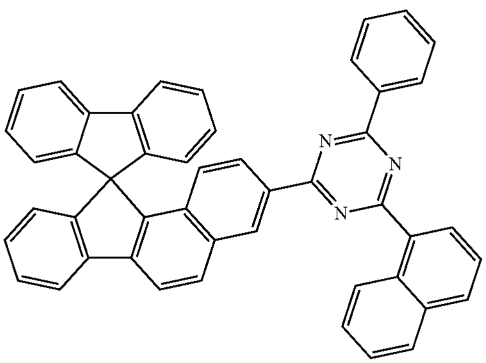
C-529
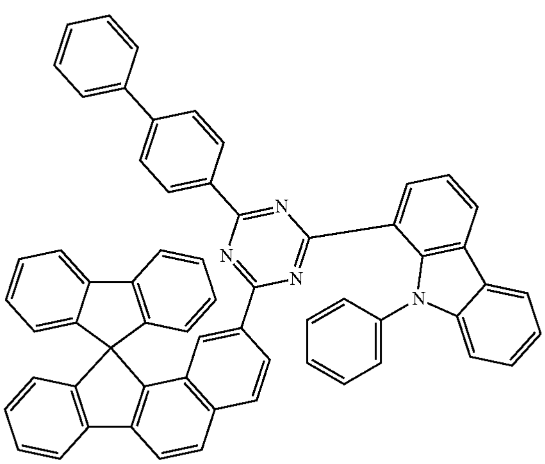
-continued
C-530
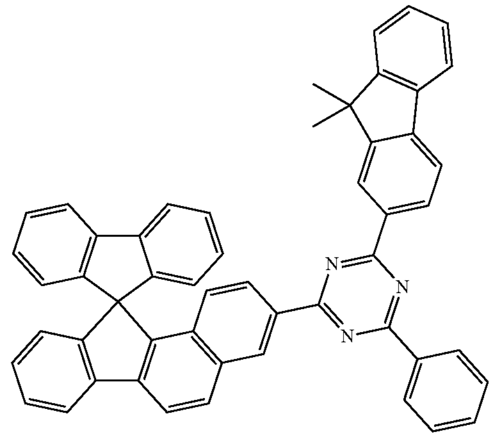
C-531
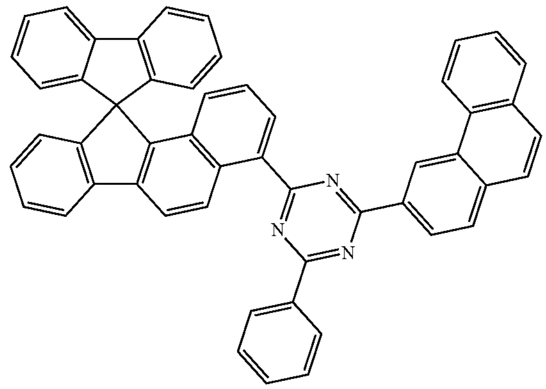
C-532
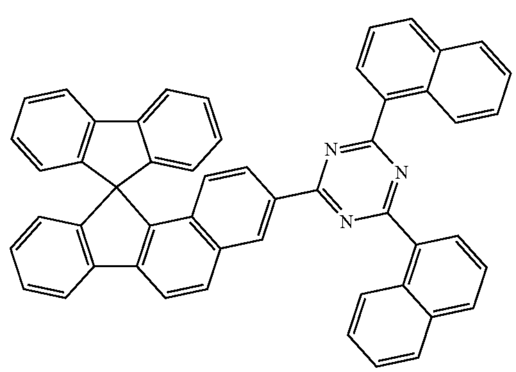

-continued
C-533
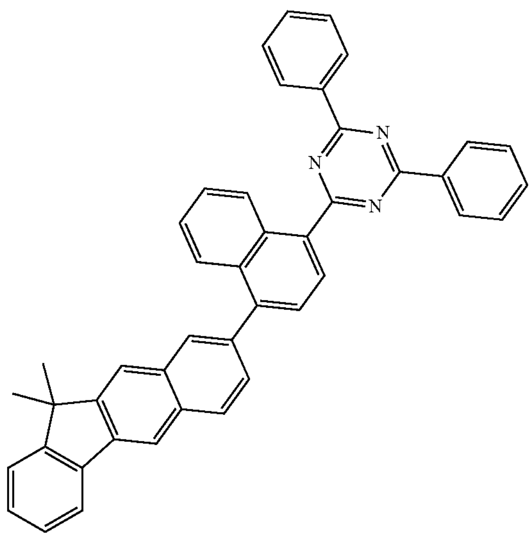
The compounds of formulas 1-1 to 1-3 according to the present disclosure may be produced by a synthetic method known to a person skilled in the art, for example, may be synthesized by referring to the following reaction schemes 1 to 3, but are not limited thereto:
[Reaction Scheme 1]
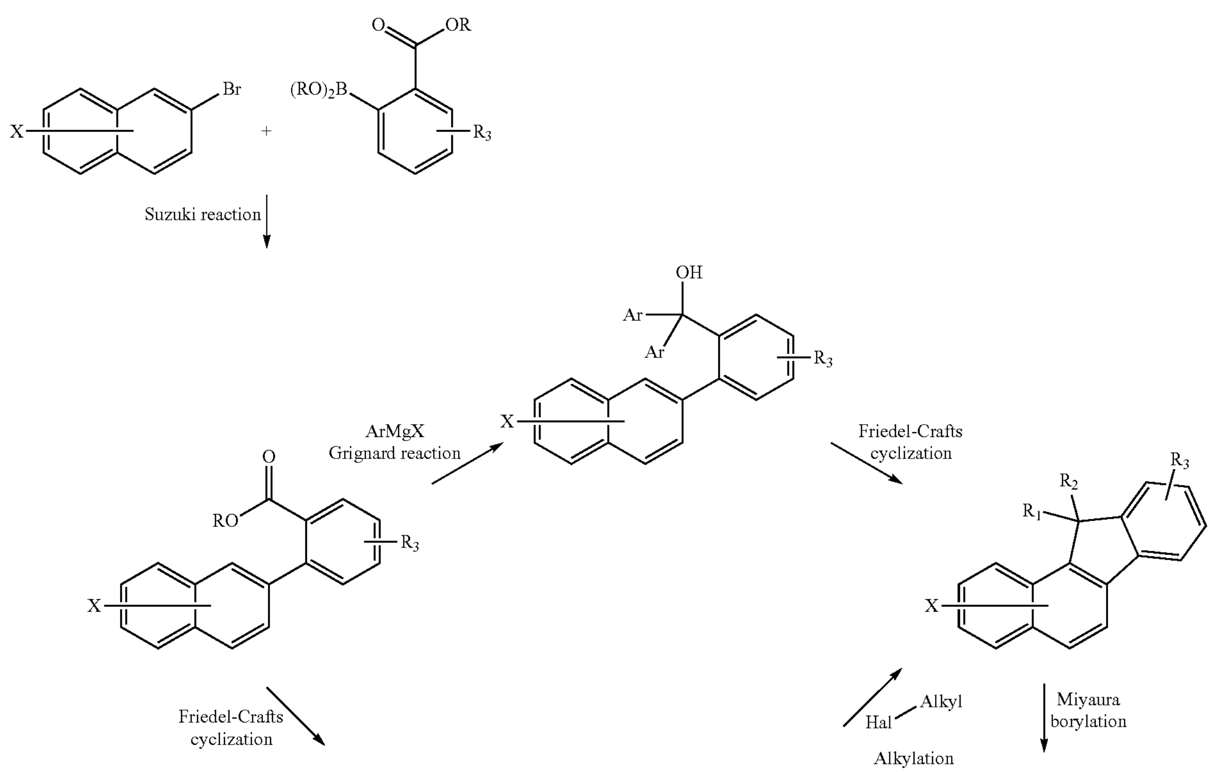

-continued
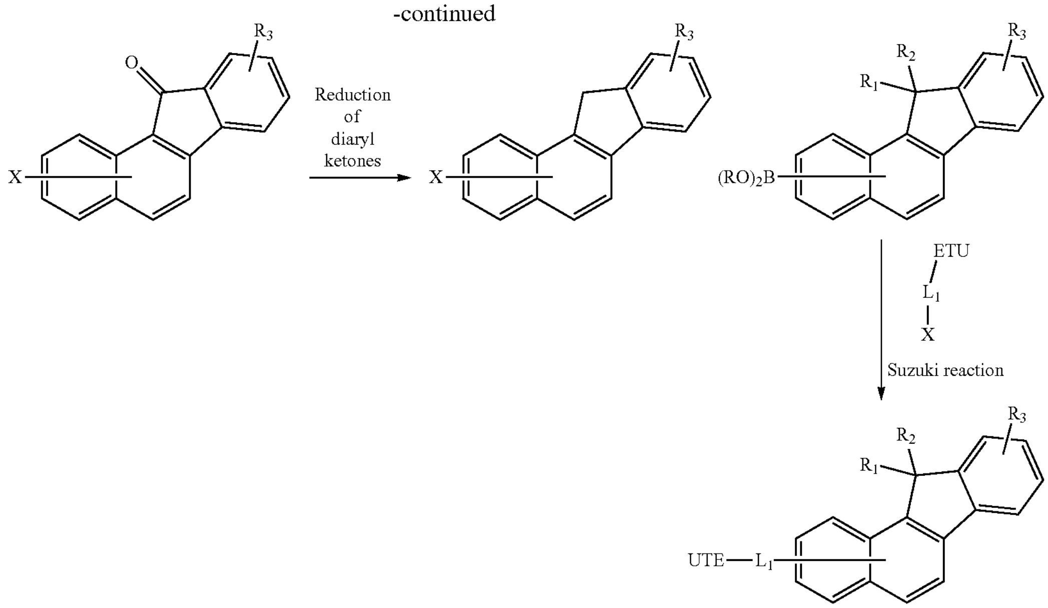
[Reaction Scheme 2]
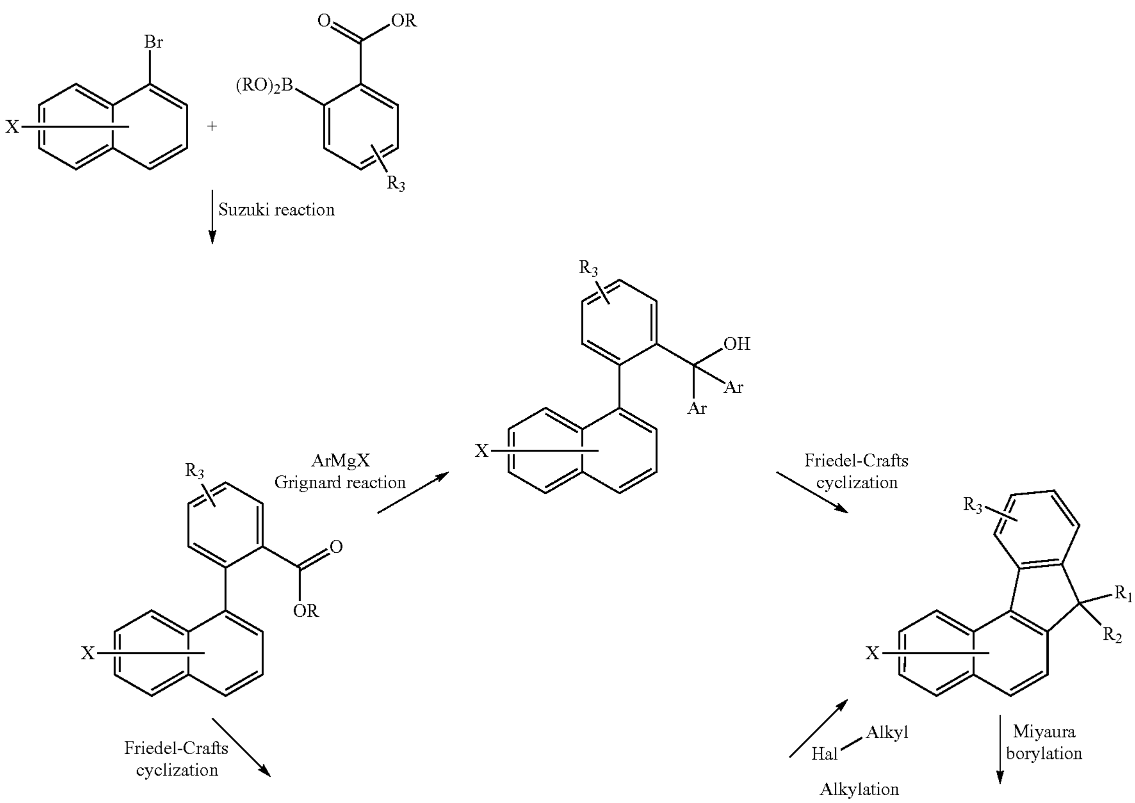

-continued
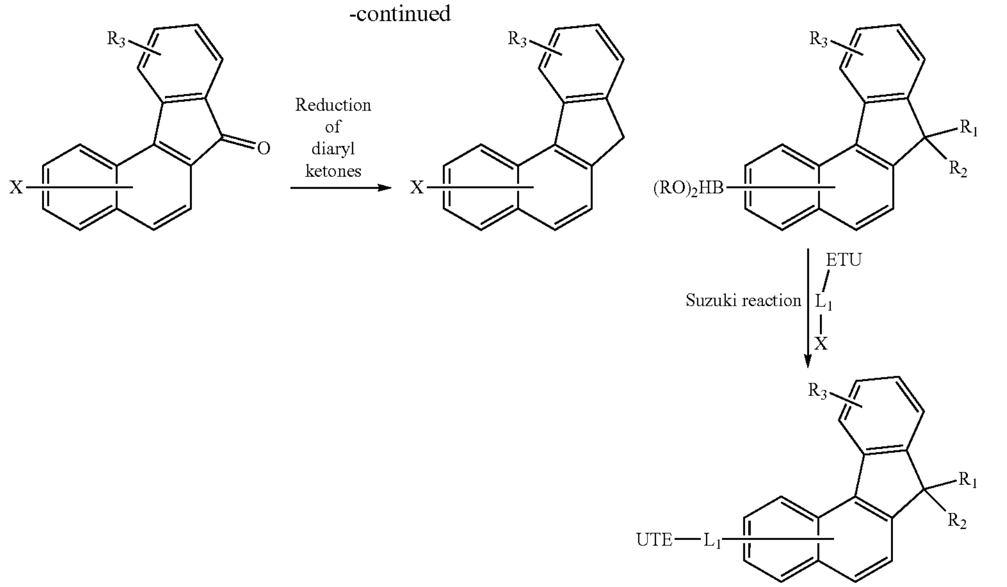
[Reaction Scheme 3]
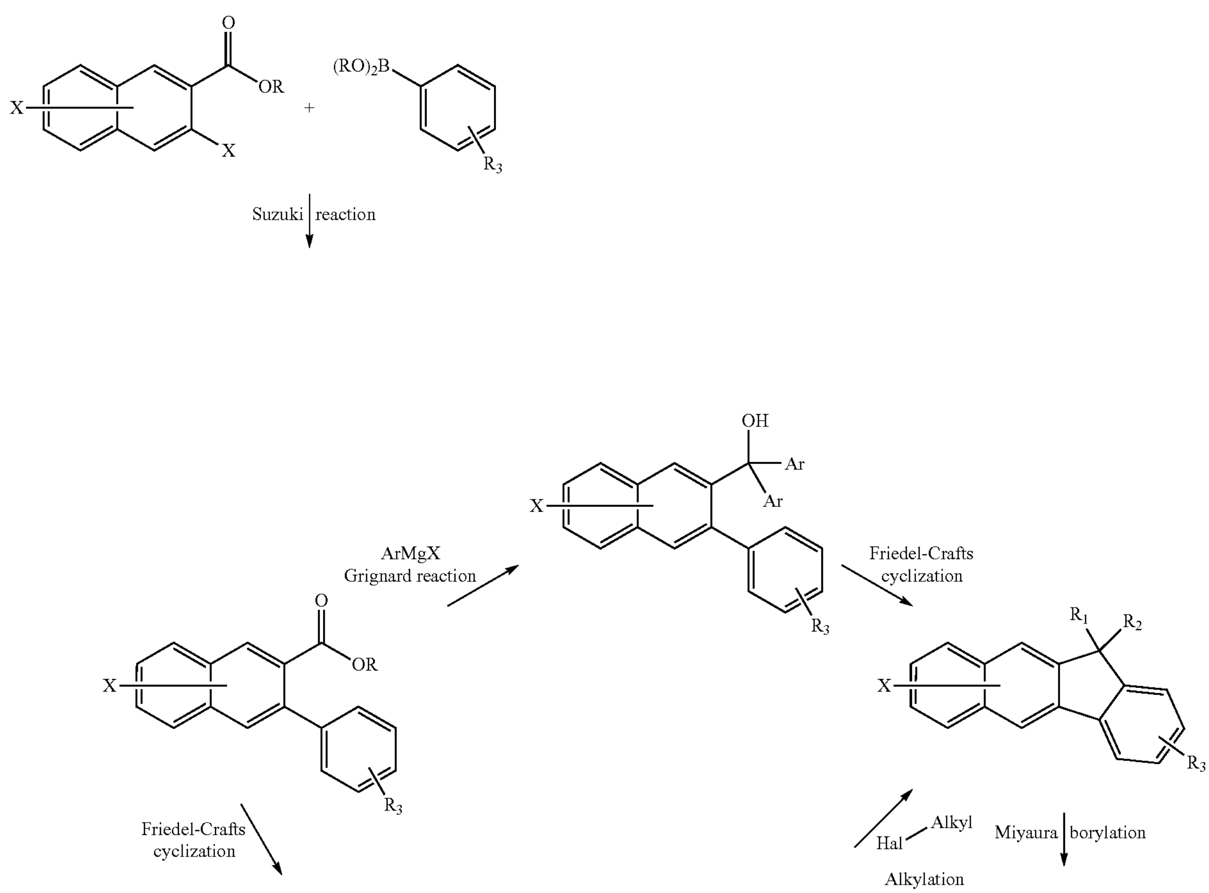

-continued

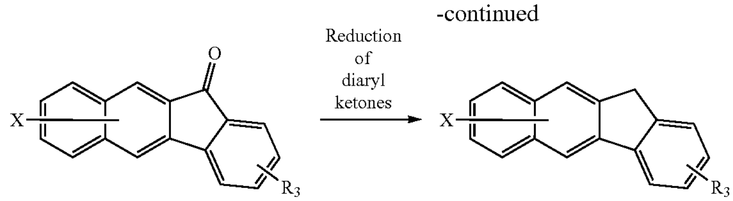

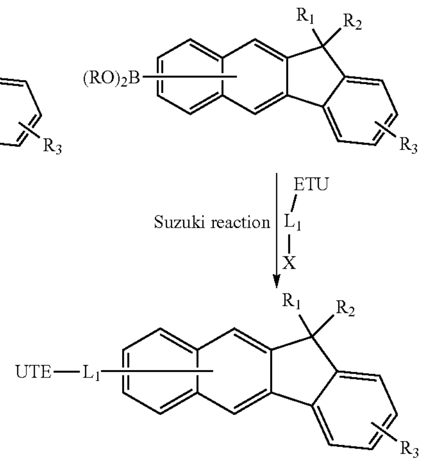

In reaction schemes 1 to 3, $R_1$, $R_2$, $R_3$, $L_1$, and ETU are as defined in formulas 1-1 to 1-3, X represents Br, Cl, or I, and Hal represents halogen atoms.

As described above, exemplary synthesis examples of the compounds represented by formulas 1-1 to 1-3 according to one embodiment are described, but they are based on Buchwald-Hartwig cross coupling reaction, N-arylation reaction, H-mont-mediated etherification reaction, Miyaura borylation reaction, Suzuki cross-coupling reaction, Intramolecular acid-induced cyclization reaction, Pd(II)-catalyzed oxidative cyclization reaction, Grignard reaction, Heck reaction, Cyclic Dehydration reaction, $SN_1$ substitution reaction, $SN_2$ substitution reaction, and Phosphine-mediated reductive cyclization, etc. It will be understood by one skilled in the art that the above reaction proceeds even if other substituents defined in the formulas 1-1 to 1-3 other than the substituents described in the specific synthesis examples are bonded.

The present disclosure may provide an organic electroluminescent material comprising an organic electroluminescent compound of formula 1, and an organic electroluminescent device comprising the organic electroluminescent material.

The organic electroluminescent material may be comprised solely of the organic electroluminescent compound of the present disclosure, or may further comprise conventional materials included in the organic electroluminescent material.

The organic electroluminescent material according to one embodiment may comprise at least one compound represented by formula 1. In one embodiment, the organic electroluminescent compound of formula 1 may be included in a light-emitting layer as a host material and an electron transport zone as an electron transport material, preferably, the organic electroluminescent compound of formula 1 may be included in a light-emitting layer, a hole blocking layer, an electron buffer layer (a deposited layer between the electron transport layer and the light-emitting layer in the device), and an electron transport layer, preferably, in a light-emitting layer, as a host material, a hole blocking material, an electron buffer material, and an electron transport material, respectively.

The organic electroluminescent material of the present disclosure may further host a compound other than the organic electroluminescent compound of formula 1. Preferably, the organic electroluminescent material may further be at least one dopant.

The host material comprised in the organic electroluminescent material of the present disclosure may further comprise a second host material, which is different to a first host material, other than the organic electroluminescent compound of formula 1 (a first host material). That is, the organic electroluminescent material according to one embodiment of the present disclosure may comprise a plurality of host materials. Specifically, the plurality of host materials according to one embodiment may comprise at least one compound(s) of formula 1 as a first host material, and may comprise at least one second host material(s), which is different from the first host material. Herein, the weight ratio of the first host material to the second host material may be about 1:99 to about 99:1, preferably about 10:90 to about 90:10, more preferably about 30:70 to about 70:30.

The second host material according to one embodiment comprises the compound represented by the following formula 100.

(100)

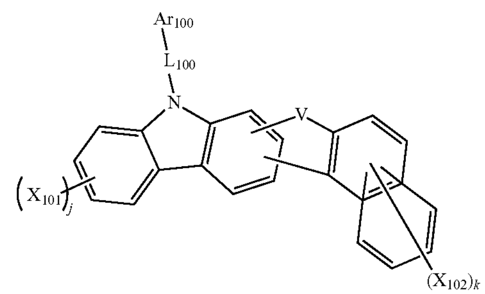

In formula 100,

V represents $CX_{11}X_{12}$, $NX_{13}$, O, or S;

$L_{100}$ represents a single bond, a substituted or unsubstituted (C6-C30)arylene, or a substituted or unsubstituted (3- to 30-membered)heteroarylene;

$Ar_{100}$ represents a substituted or unsubstituted (C6-C30) aryl, a substituted or unsubstituted (3- to 30-membered) heteroaryl, or $—NX_9X_{10}$;

$X_9$ and $X_{10}$ each independently represent a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl;

$X_{11}$ to $X_{13}$, $X_{101}$ and $X_{102}$ each independently represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C2-C30) alkenylamino, a substituted or unsubstituted (C1-C30)alkyl (C2-C30)alkenylamino, a substituted or unsubstituted mono- or di-(C6-C30)arylamino, a substituted or unsubstituted (C1-C30)alkyl(C6-C30)arylamino, a substituted or unsubstituted (C2-C30)alkenyl(C6-C30)arylamino, a substituted or unsubstituted mono- or di-(3- to 30-membered) heteroarylamino, a substituted or unsubstituted (C1-C30) alkyl(3- to 30-membered)heteroarylamino, a substituted or unsubstituted (C2-C30)alkenyl(3- to 30-membered)heteroarylamino, or a substituted or unsubstituted (C6-C30)aryl (3- to 30-membered)heteroarylamino; and j represents an integer of 1 to 4, k represents an integer of 1 to 6, and when j and k are 2 or more, each $X_{101}$ and each $X_{102}$ may be the same or different.

In one embodiment, V may be $NX_{13}$, wherein $X_{13}$ may be a substituted or unsubstituted (C6-C30)aryl, preferably, a substituted or unsubstituted (C6-C25)aryl, more preferably, a substituted or unsubstituted (C6-C18)aryl. For example, $X_{13}$ may be an unsubstituted phenyl.

In one embodiment, $L_{100}$ may be a single bond, a substituted or unsubstituted (C6-C30)arylene, or a substituted or unsubstituted (5- to 30-membered)heteroarylene, preferably, a single bond, a substituted or unsubstituted (C6-C25) arylene, or a substituted or unsubstituted (5- to 25-membered)heteroarylene, more preferably, a single bond, a substituted or unsubstituted (C6-C18)arylene, or a substituted or unsubstituted (5- to 18-membered)heteroarylene. For example, $L_{100}$ may be a single bond, or a substituted or unsubstituted phenylene, a substituted or unsubstituted biphenylene, a substituted or unsubstituted pyridylphenylene, a substituted or unsubstituted naphthalenylene, a substituted or unsubstituted quinolinylene, a substituted or unsubstituted quinazolinylene, a substituted or unsubstituted quinoxalinylene, a substituted or unsubstituted carbazolylene, a substituted or unsubstituted naphthyridinylene, a substituted or unsubstituted benzoquinoxalinylene, a substituted or unsubstituted benzoquinazolinylene, or a substituted or unsubstituted benzofuropyrimidinylene.

In one embodiment, $Ar_{100}$ may be a substituted or unsubstituted (C6-C30)aryl, a substituted or unsubstituted (5- to 30-membered)heteroaryl, or —$NX_9X_{10}$, preferably, a substituted or unsubstituted (C6-C25)aryl, a substituted or unsubstituted (5- to 25-membered)heteroaryl, or —$NX_9X_{10}$, more preferably, a substituted or unsubstituted (C6-C18) aryl, a substituted or unsubstituted (5- to 18-membered) heteroaryl, or —$NX_9X_{10}$. Wherein, Xs and $X_{10}$ each independently may be a substituted or unsubstituted (C6-C30) aryl, preferably, a substituted or unsubstituted (C6-C25)aryl, more preferably, a substituted or unsubstituted (C6-C18) aryl. For example, $Ar_{100}$ may be a substituted or unsubstituted phenyl, a substituted or unsubstituted naphthyl, a substituted or unsubstituted m-biphenyl, a substituted or unsubstituted p-biphenyl, a substituted or unsubstituted o-terphenyl, a substituted or unsubstituted m-terphenyl, a substituted or unsubstituted p-terphenyl, a substituted or unsubstituted dibenzofuranyl, a substituted or unsubstituted dibenzothiophenyl, a substituted or unsubstituted carbazolyl, a substituted or unsubstituted fluorenyl, a substituted or unsubstituted benzofluorenyl, a substituted or unsubstituted spirobifluorenyl, a substituted or unsubstituted pyridyl, a substituted or unsubstituted pyrimidinyl, a substituted or unsubstituted naphthyridinyl, a substituted or unsubstituted triazinyl, a substituted or unsubstituted benzofuropyrimidinyl, phenylbiphenylamino, phenylnaphthylamino, or diphenylamino.

In one embodiment, $X_{101}$ and $X_{102}$ each independently may be hydrogen or deuterium.

According to one embodiment, the organic electroluminescent compound represented by formula 100 may be illustrated by the following compounds, but is not limited thereto.

H-1

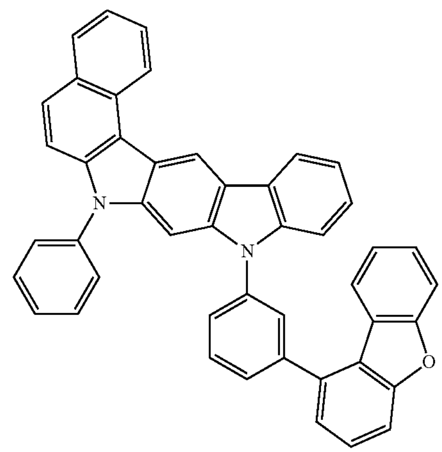

H-2

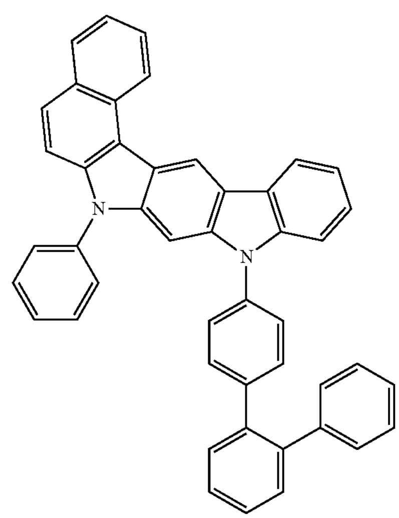

-continued
H-3
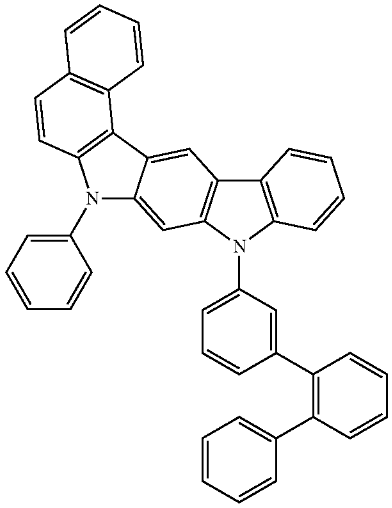
H-4
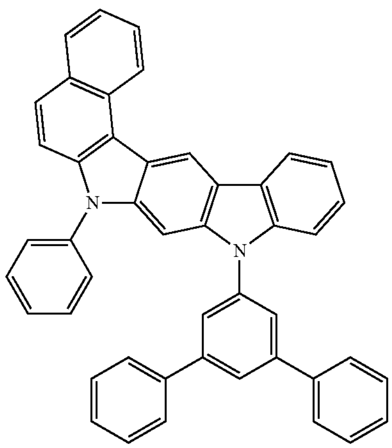
H-5
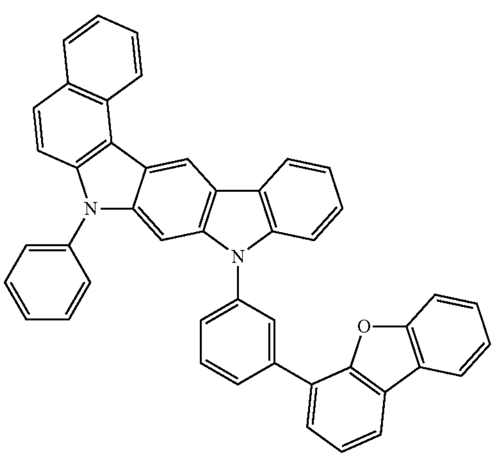
-continued
H-6
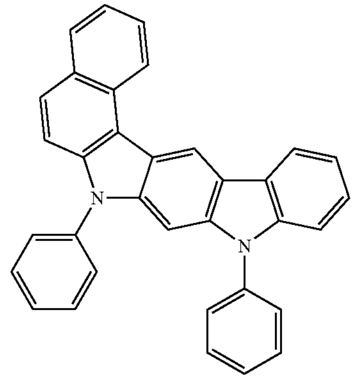
H-7
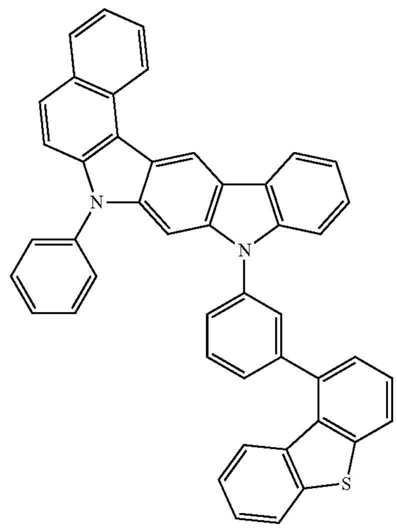
H-8
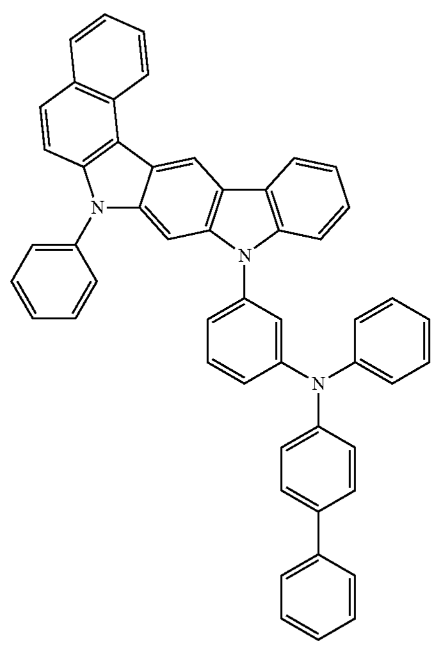

-continued
H-9
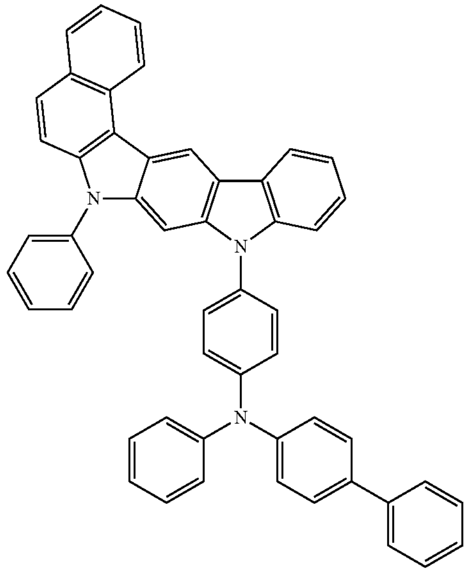
H-10
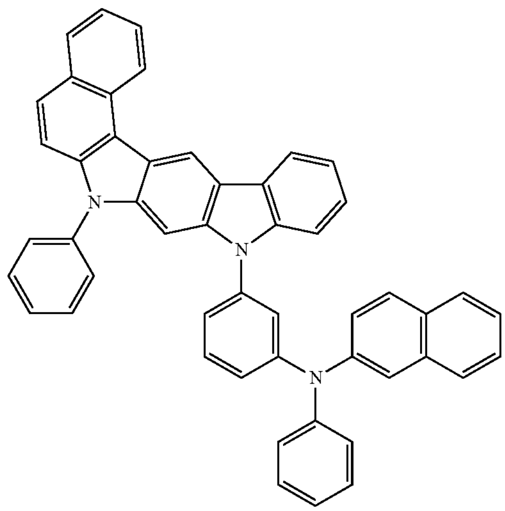
H-11
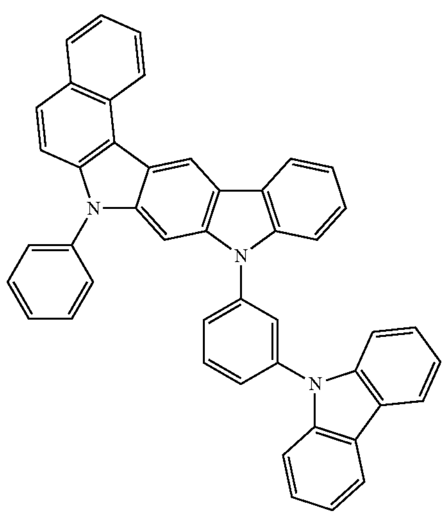
-continued
H-12
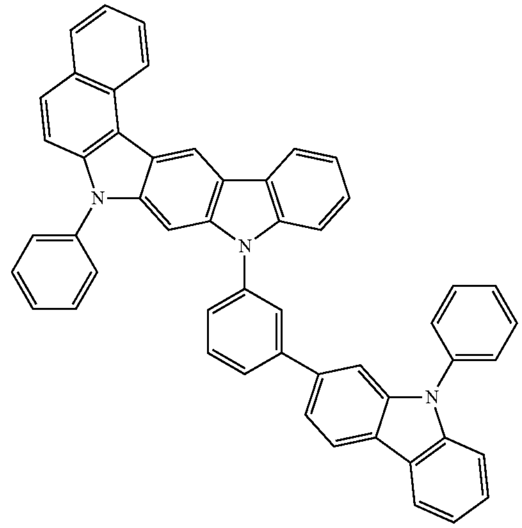
H-13
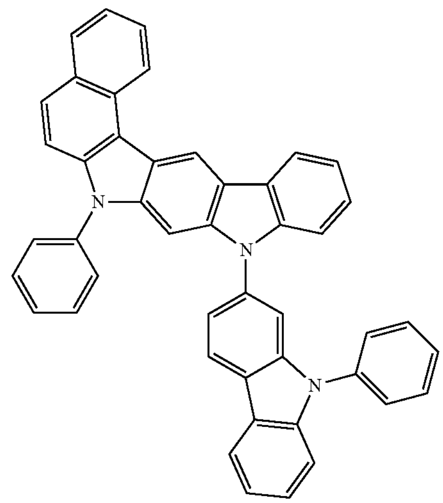
H-14
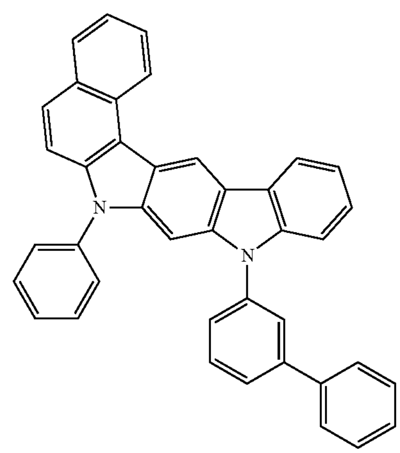

-continued
H-15
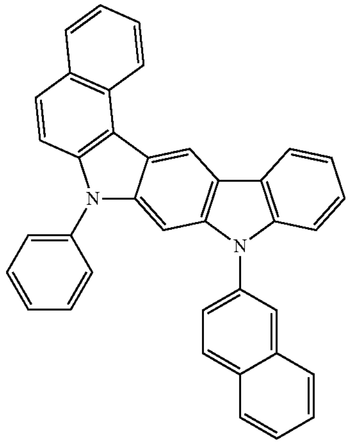
H-16
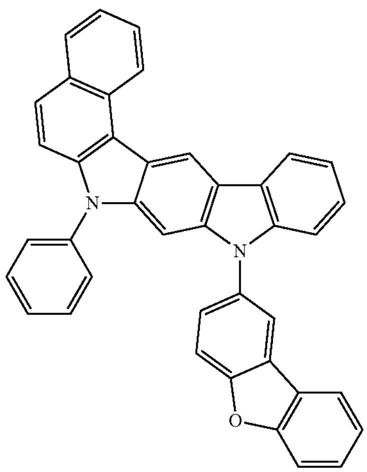
H-17
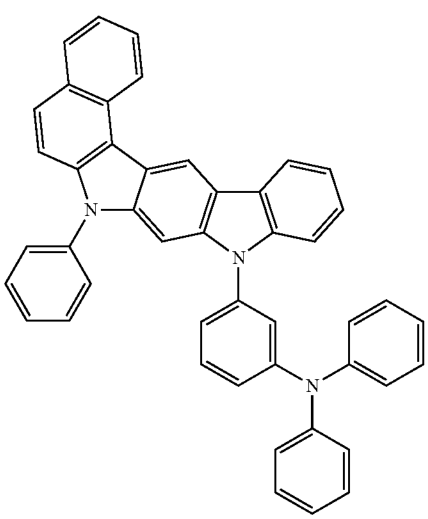
-continued
H-18
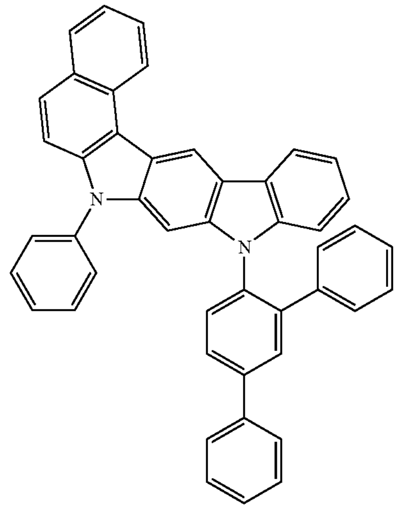
H-19
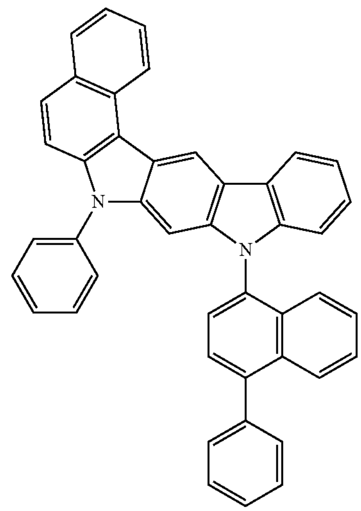
H-20
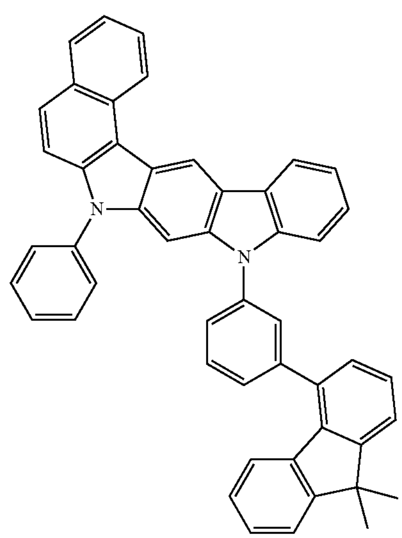

H-21
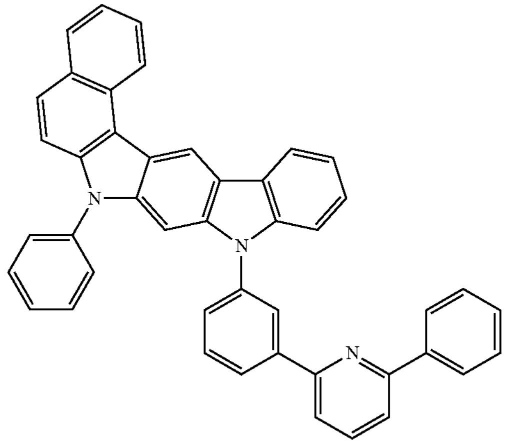
H-22
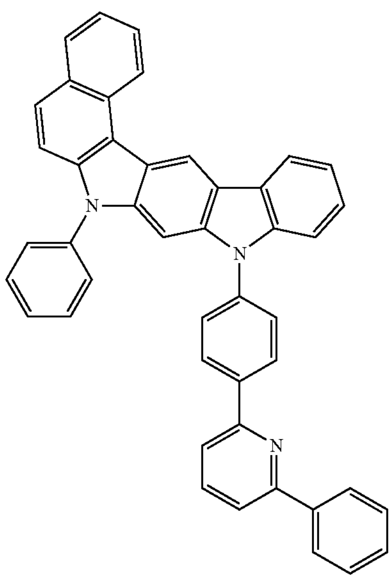
H-23
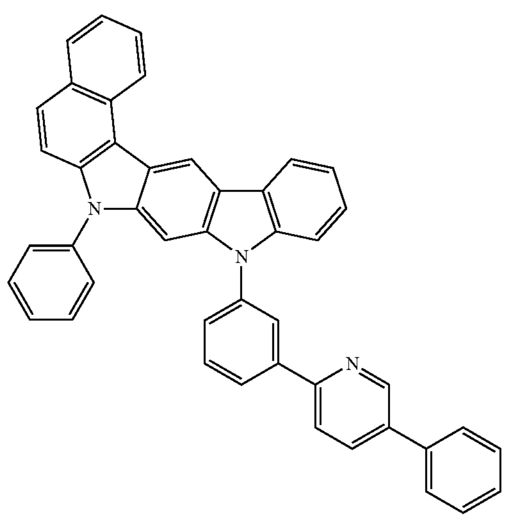
H-24
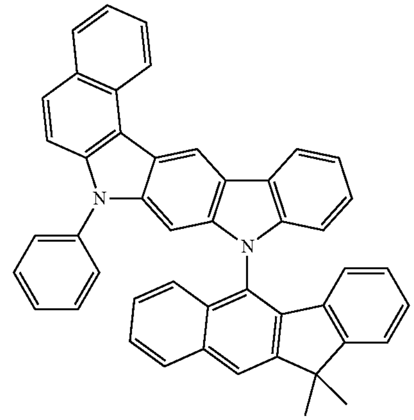
H-25
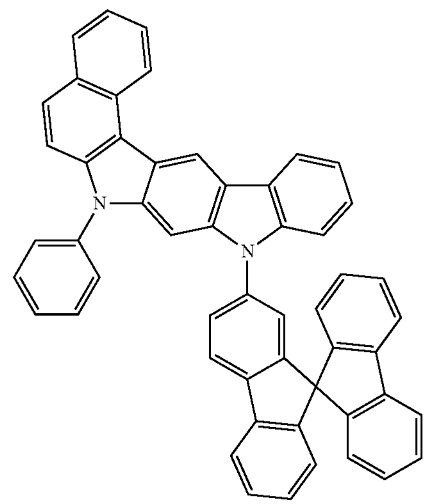
H-26
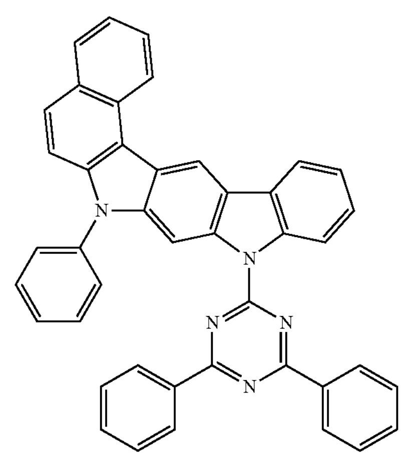

-continued
H-27
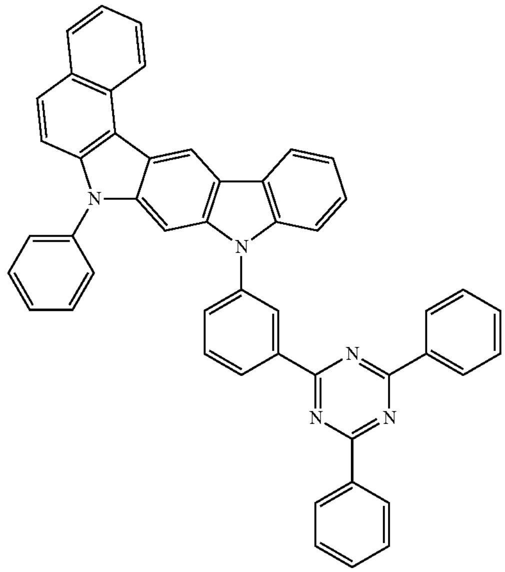
H-28
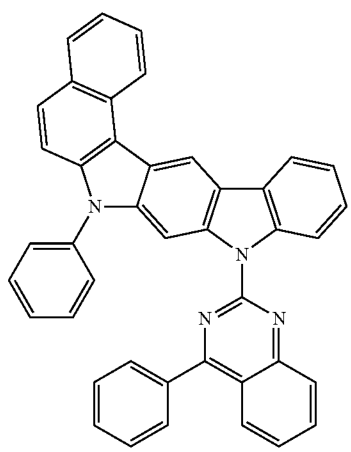
H-29
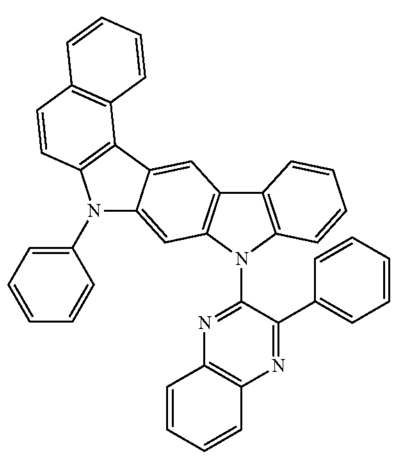
-continued
H-30
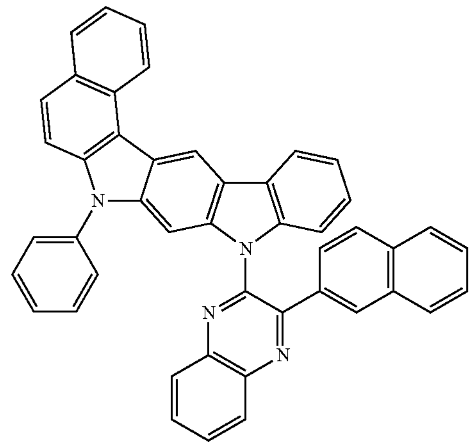
H-31
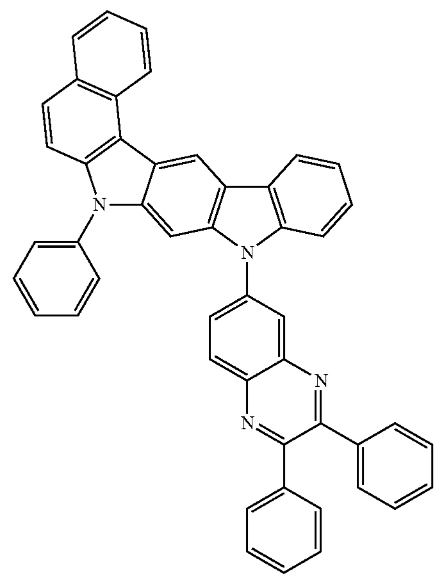
H-32
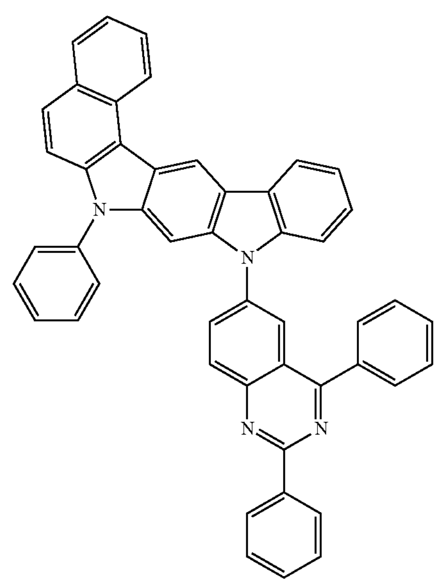

-continued
H-33
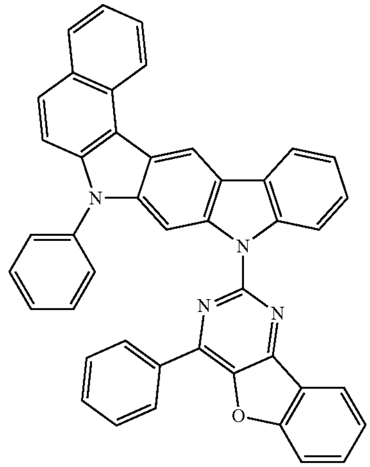
H-34
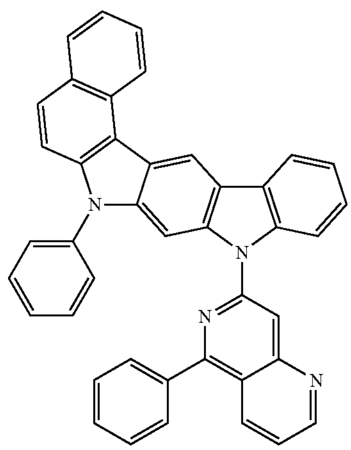
H-35
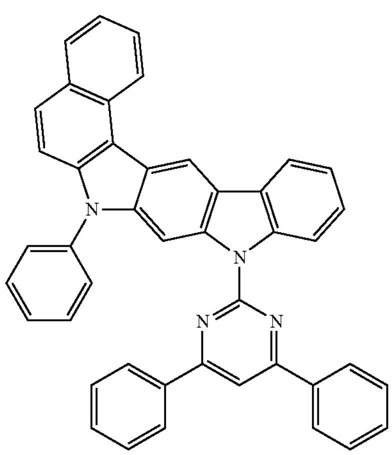
-continued
H-36
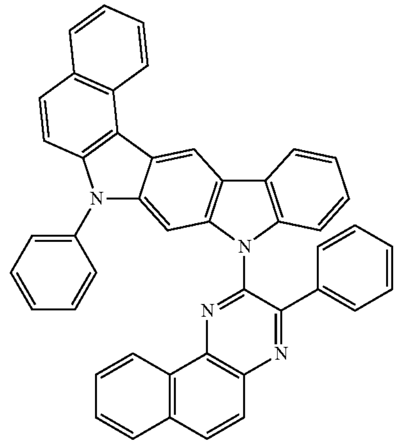
H-37
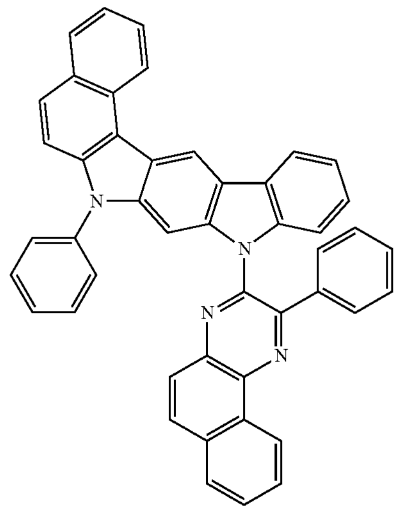
H-38
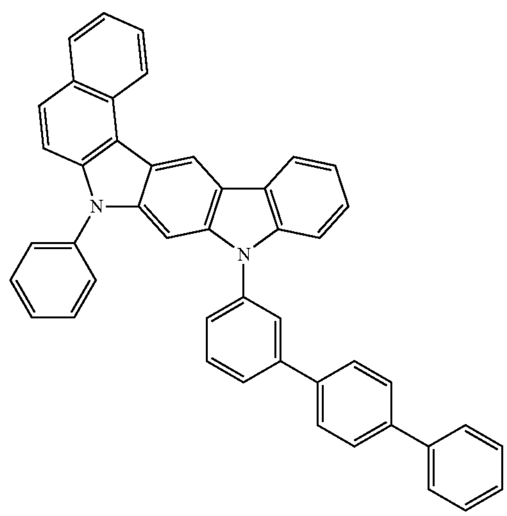

-continued
H-39
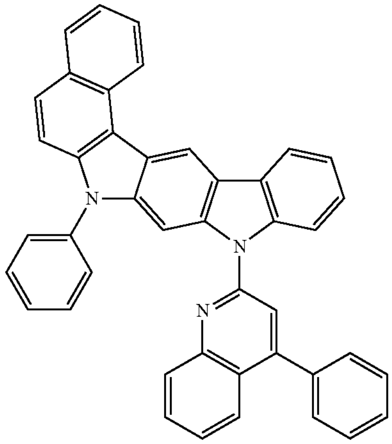
H-40
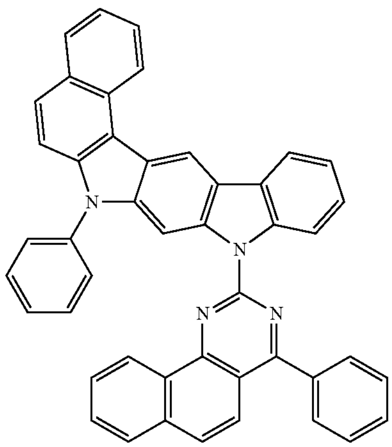
H-41
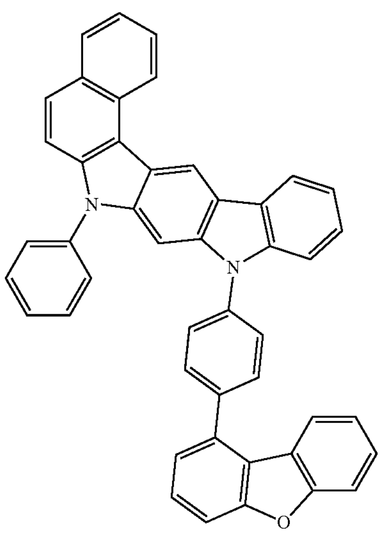
-continued
H-42
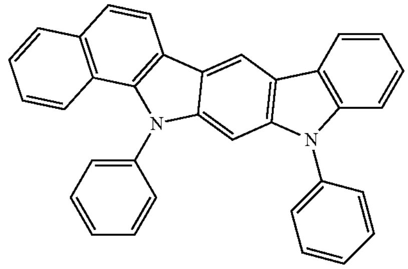
H-43
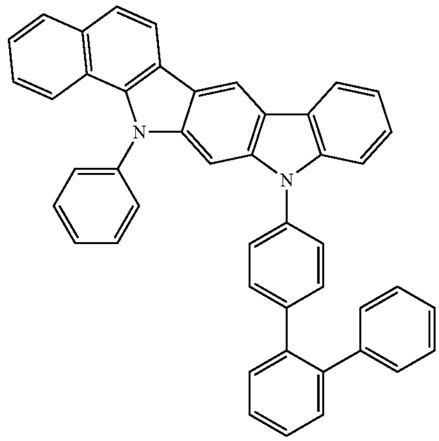
H-44
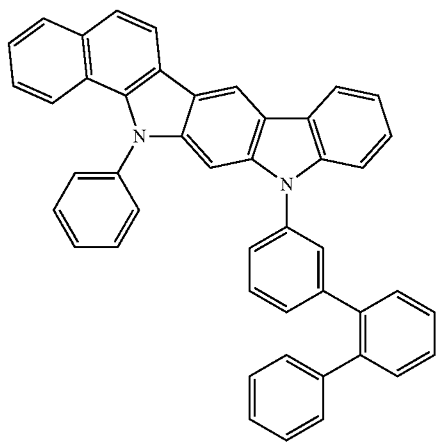
H-45
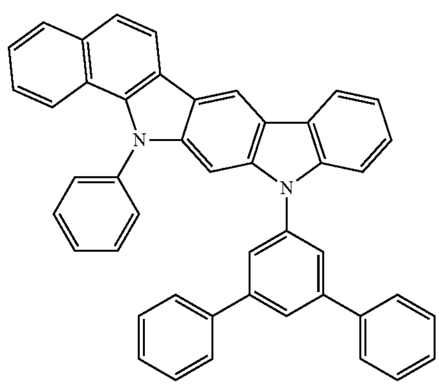

-continued
H-46
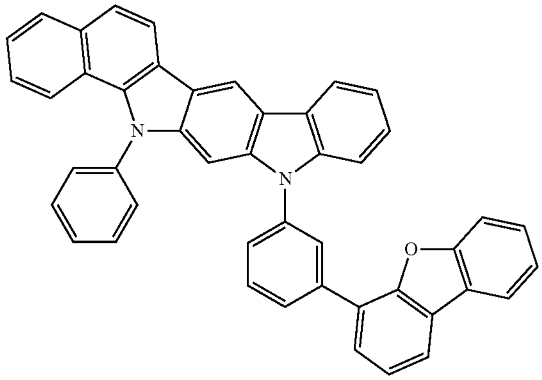
H-47
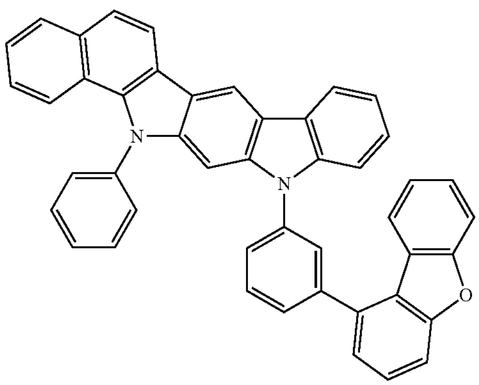
H-48
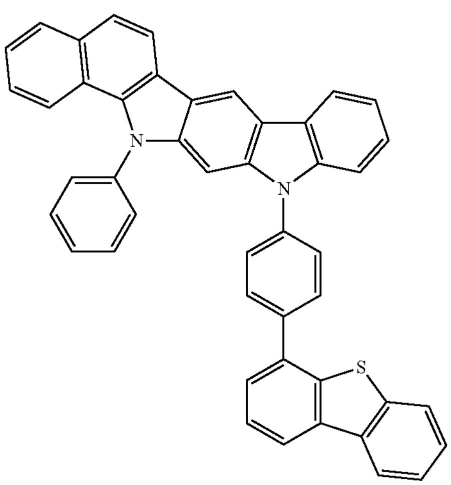
-continued
H-49
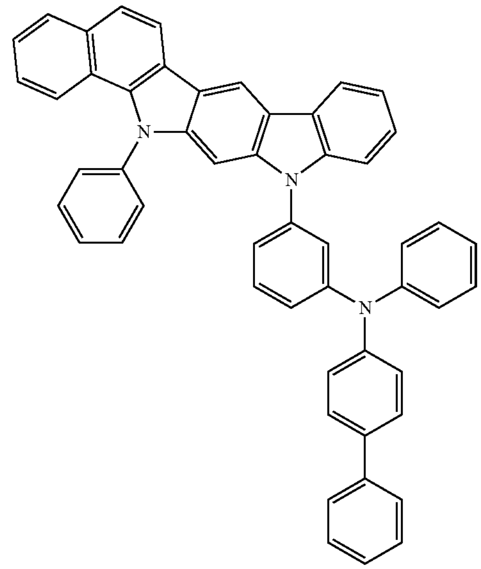
H-50
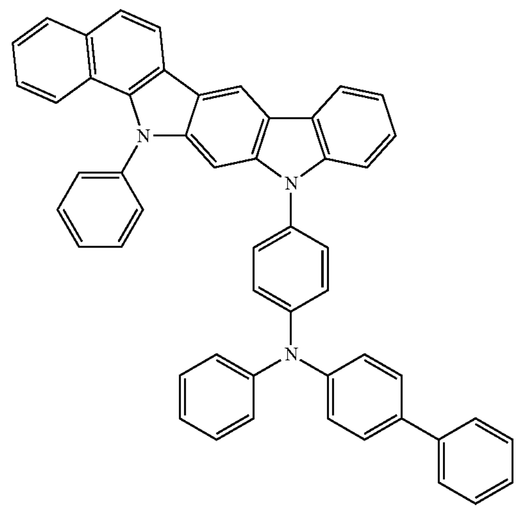
H-51
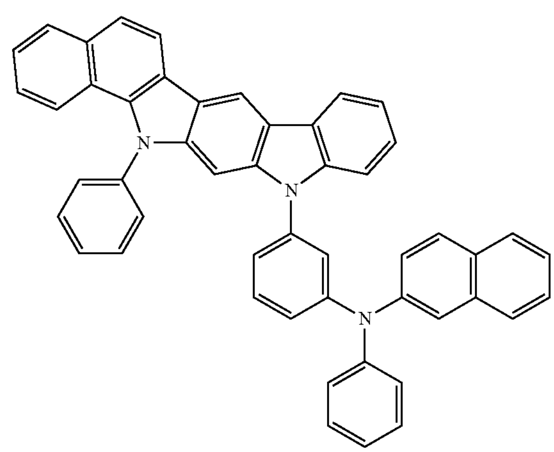

-continued
H-52
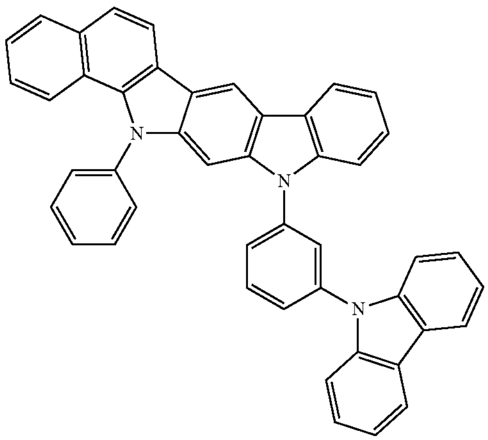
H-53
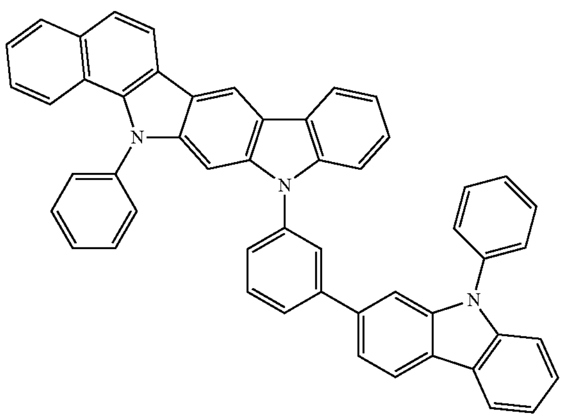
H-54
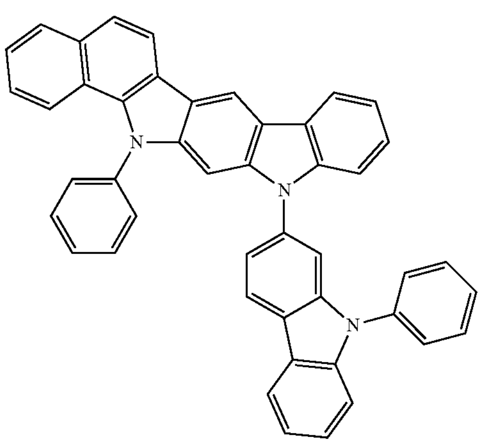
-continued
H-55
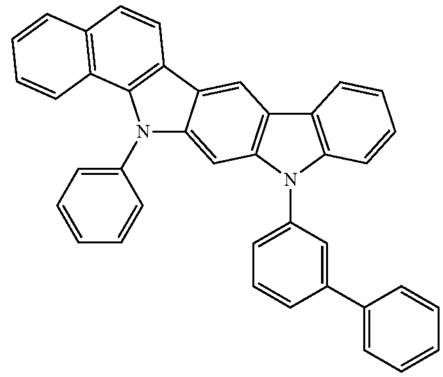
H-56
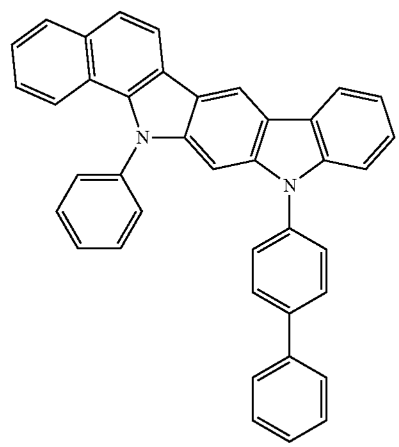
H-57
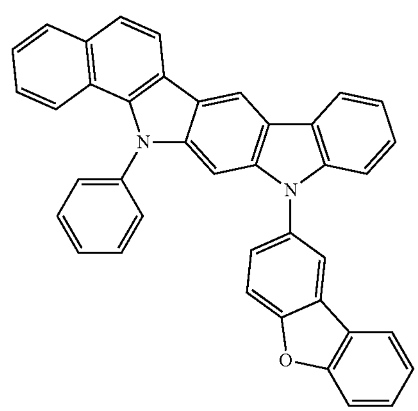

-continued
H-58
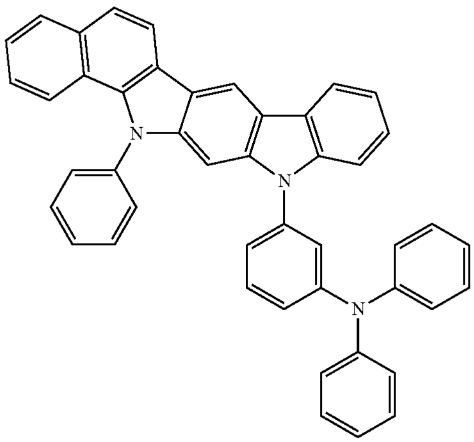
H-59
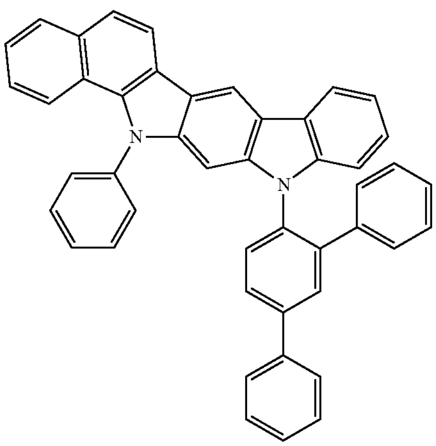
H-60
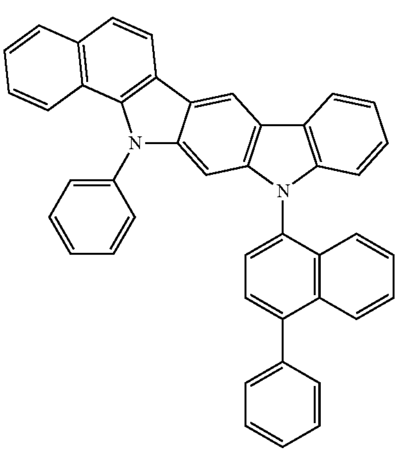
-continued
H-61
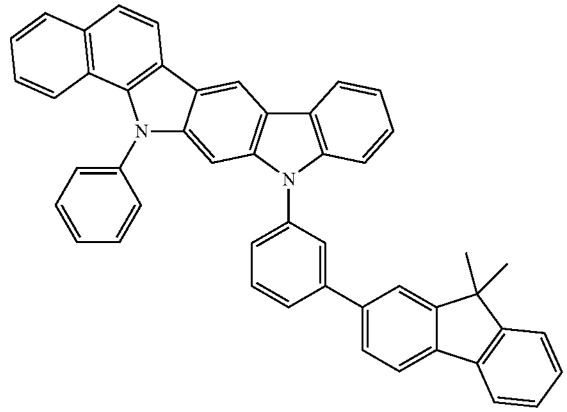
H-62
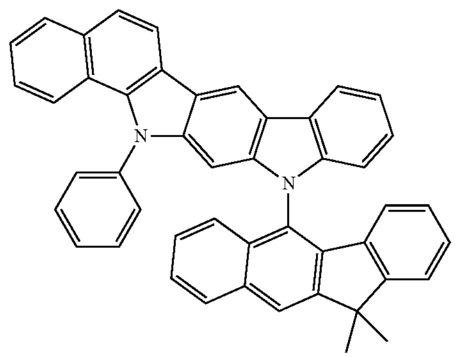
H-63
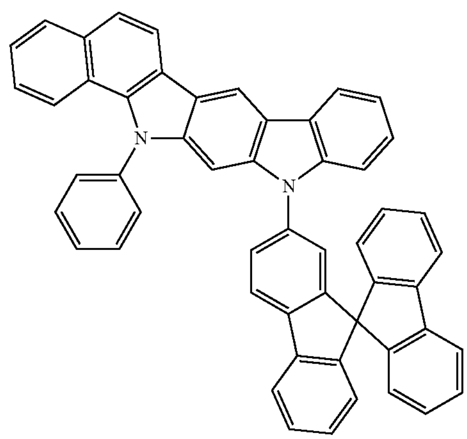
H-64
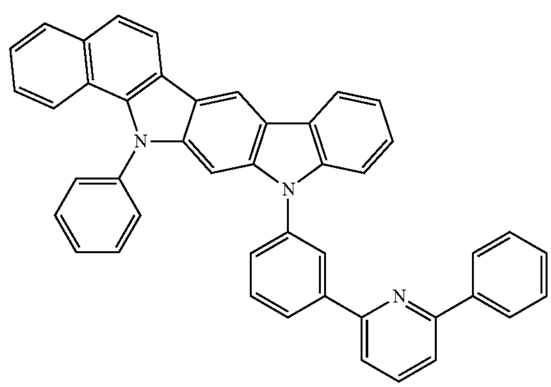

-continued
H-65
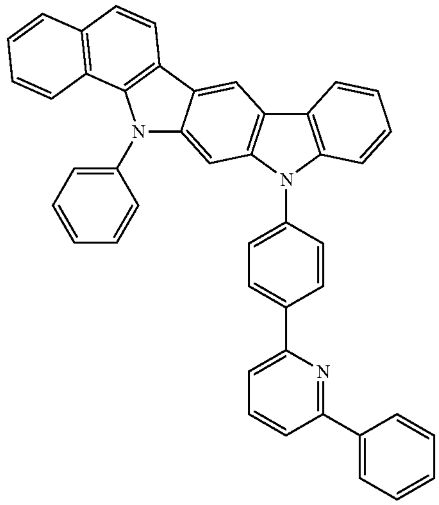
H-66
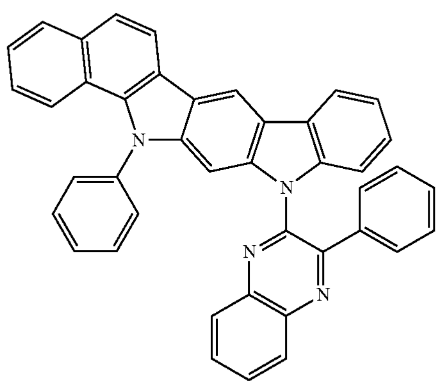
H-67
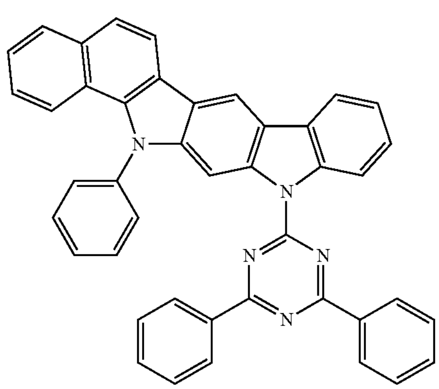
-continued
H-68
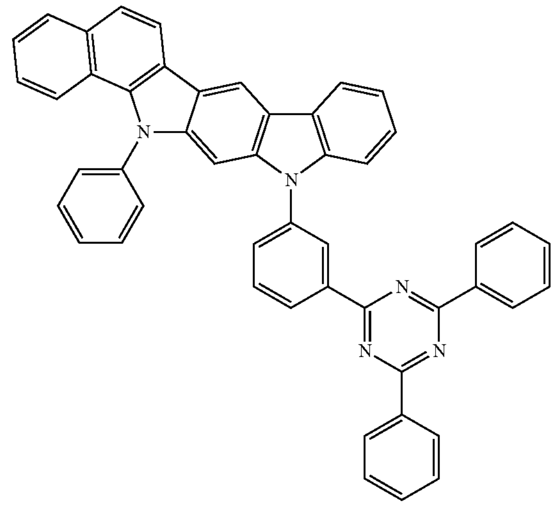
H-69
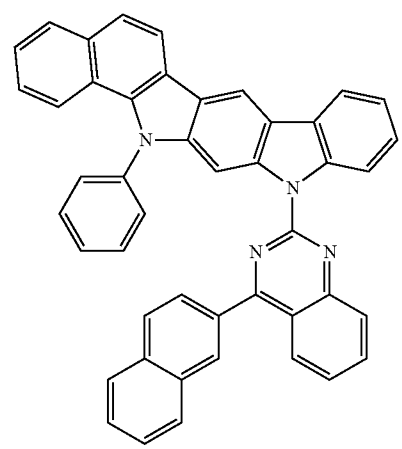
H-70
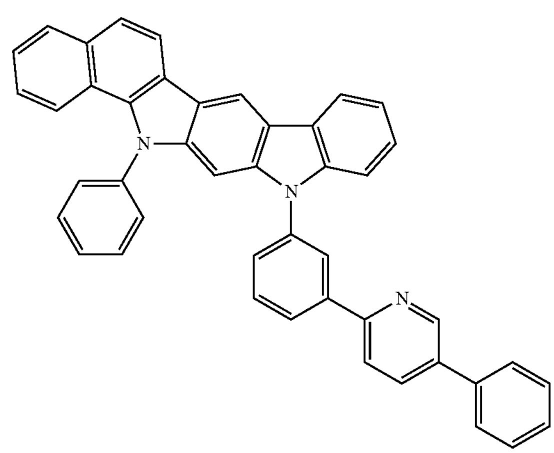

-continued
H-71
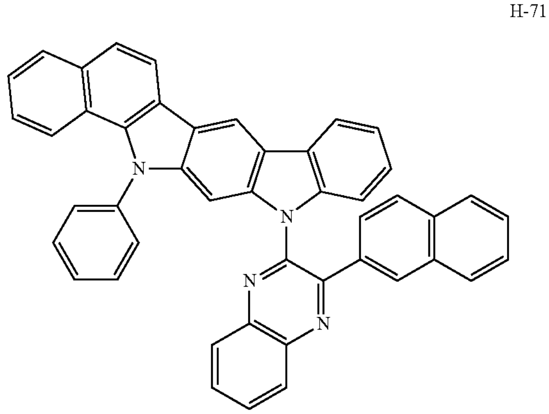
H-72
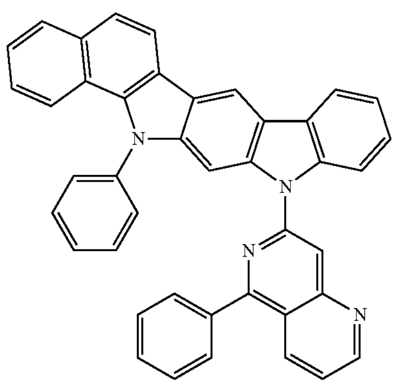
H-73
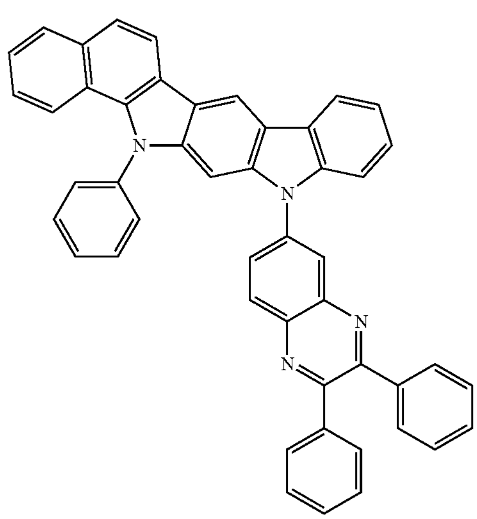
-continued
H-74
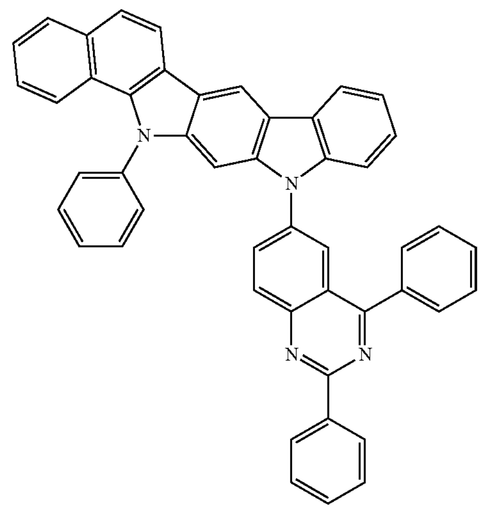
H-75
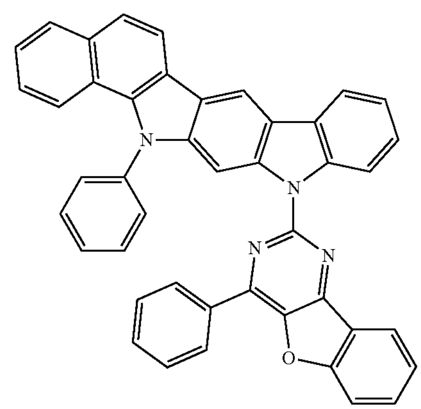
H-76
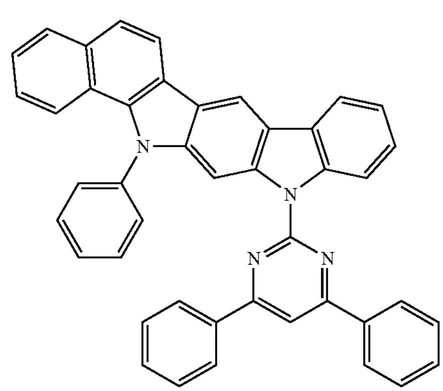

H-77
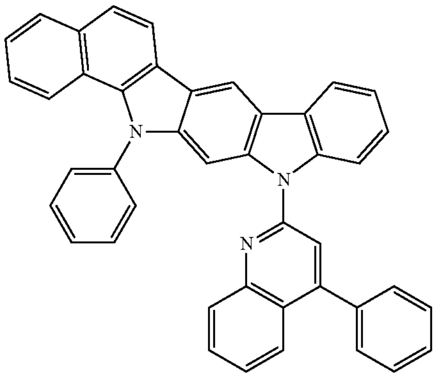
H-78
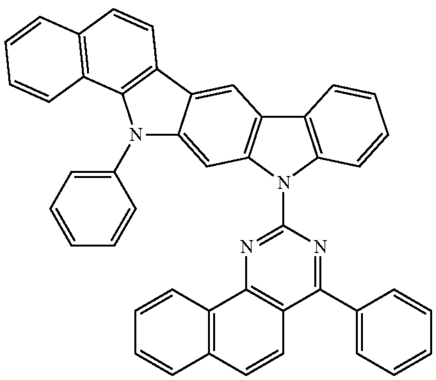
H-79
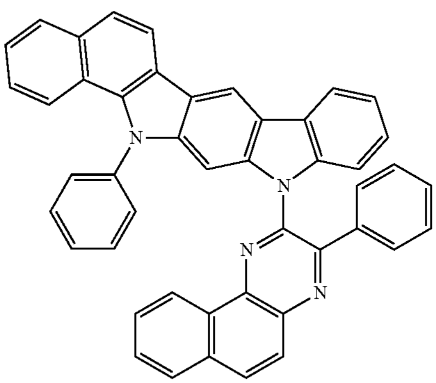
H-80
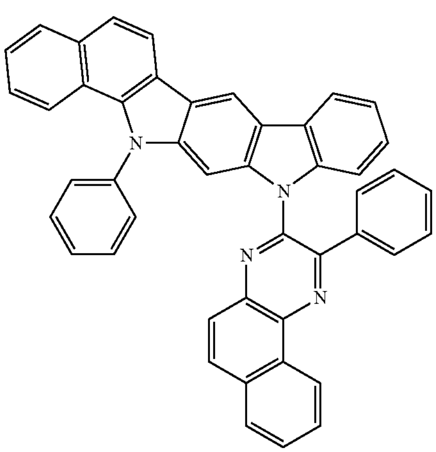
H-81
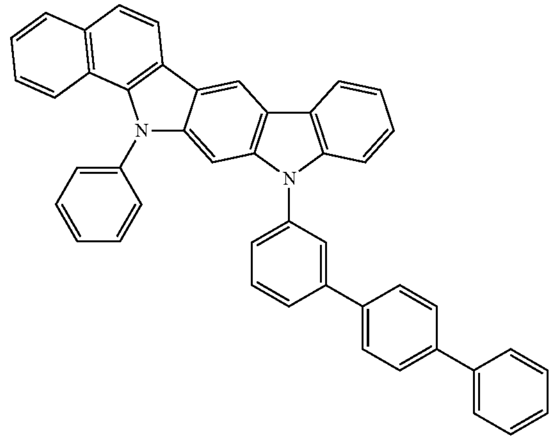
H-82
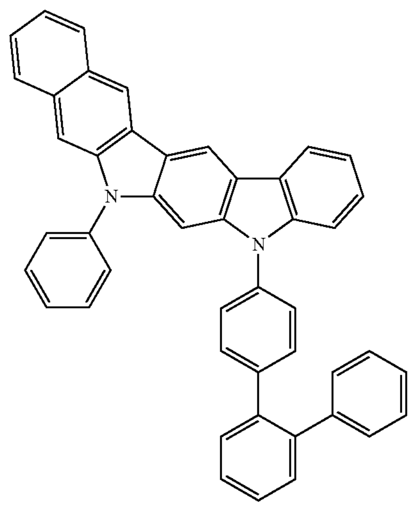
H-83
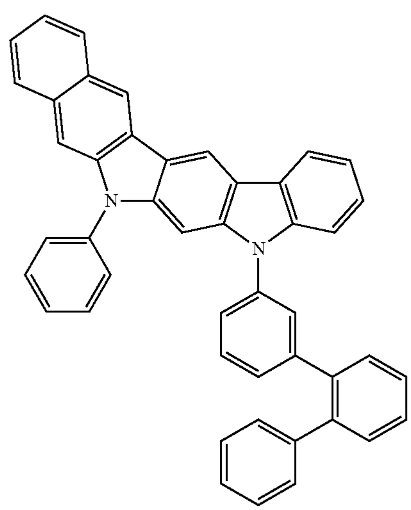

-continued
H-84
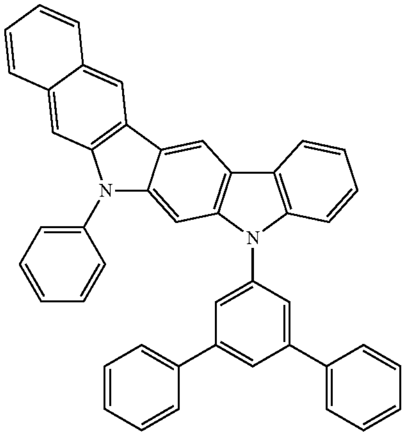
H-85
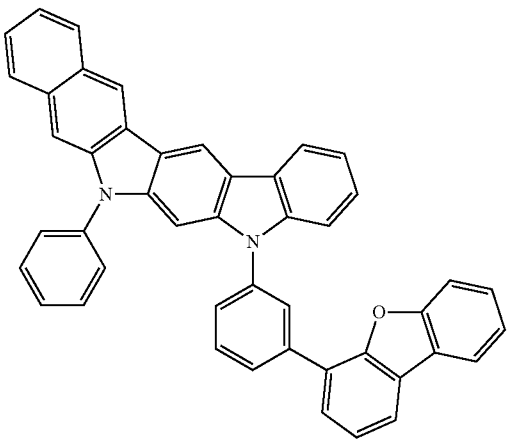
H-86
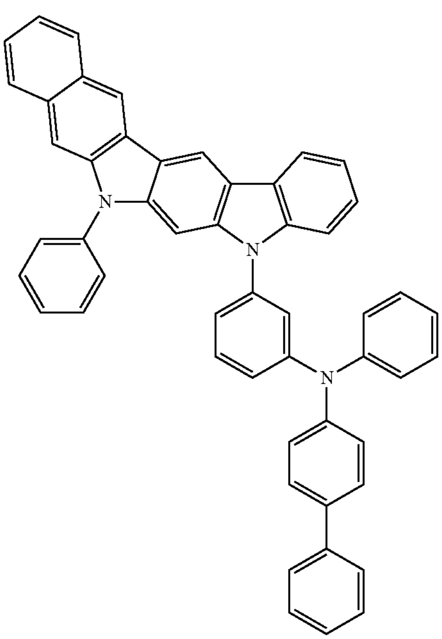
-continued
H-87
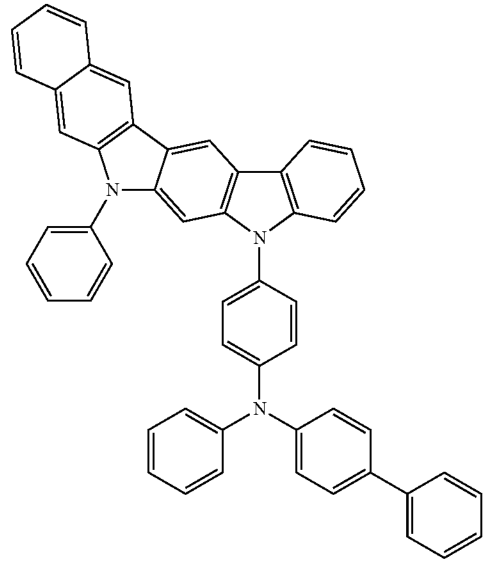
H-88
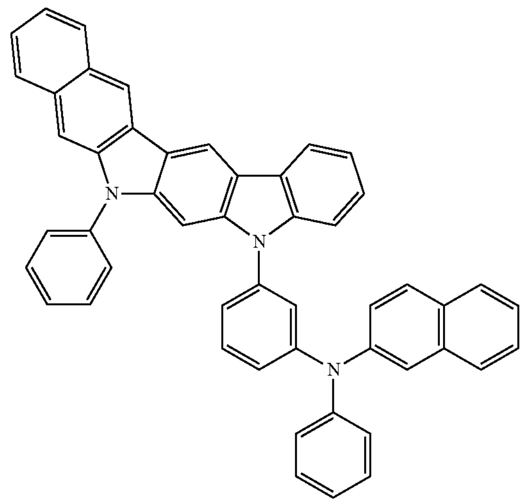
H-89
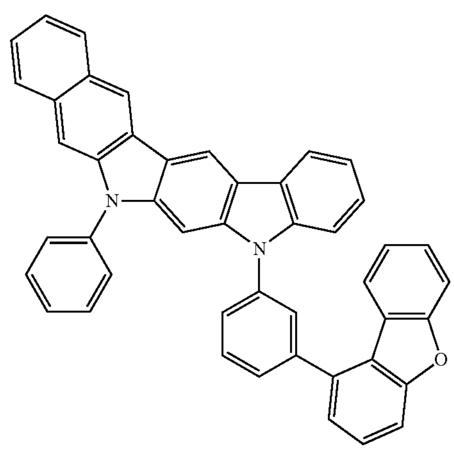

-continued

H-90

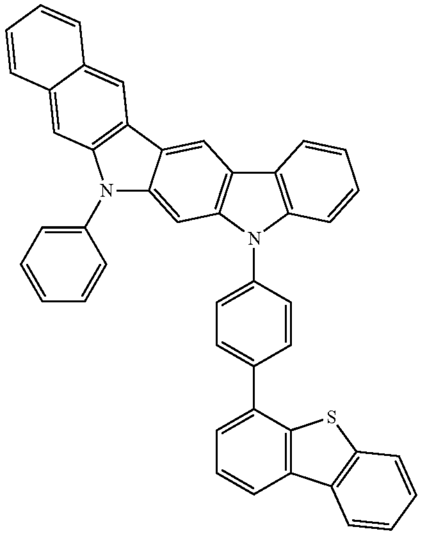

H-91

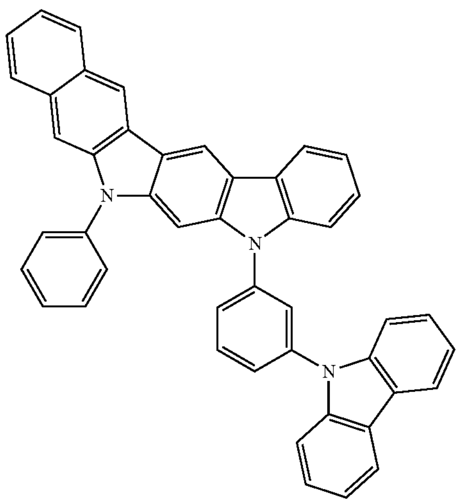

H-92

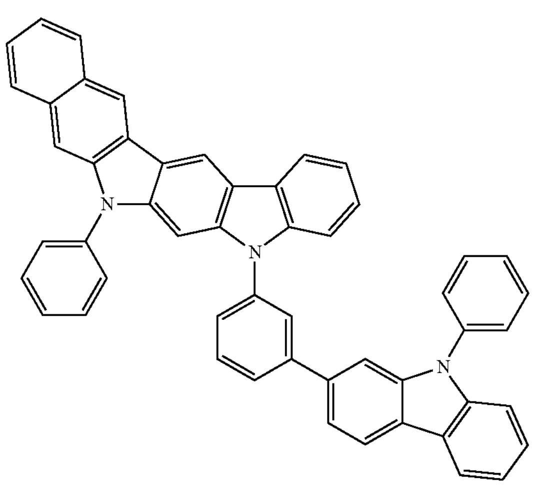

-continued

H-93

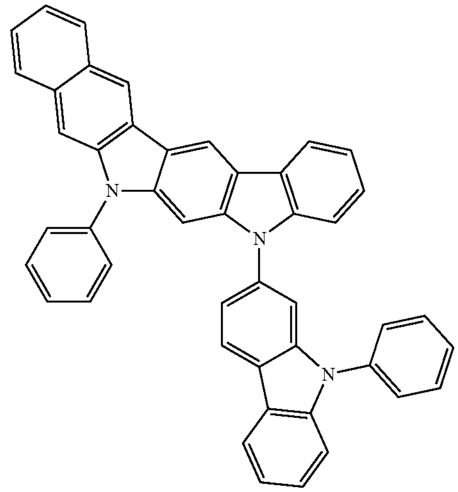

H-94

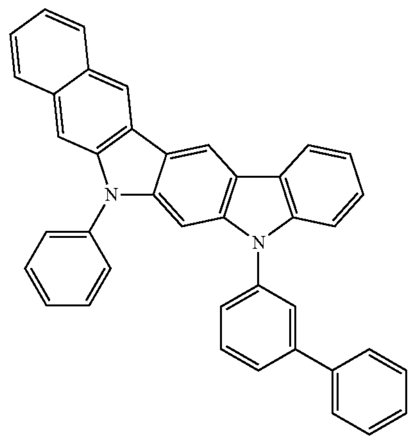

H-95

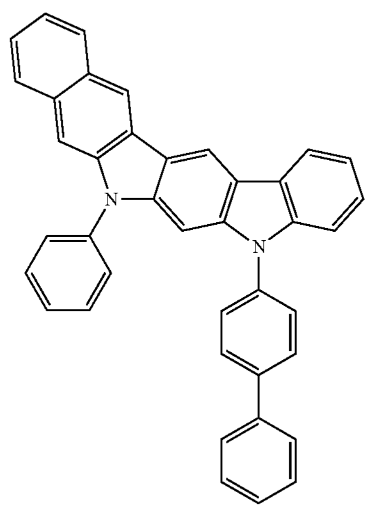

The organic electroluminescent compound of formula 100 according to the present disclosure may be produced by referring to synthetic method known to a person skilled in the art.

The dopant comprised in the organic electroluminescent material of the present disclosure may be at least one phosphorescent or fluorescent dopant, preferably a phosphorescent dopant. The phosphorescent dopant material applied to the present disclosure is not particularly limited, but may preferably be a metallated complex compound(s) of a metal atom(s) selected from iridium (Ir), osmium (Os), copper (Cu), and platinum (Pt), more preferably an ortho-metallated complex compound(s) of a metal atom(s) selected from iridium (Ir), osmium (Os), copper (Cu), and platinum (Pt), and even more preferably ortho-metallated iridium complex compound(s).

The dopant may use the compound represented by the following formula 101, but is not limited thereto:

(101)

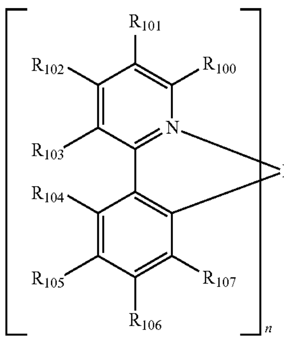

in formula 101, wherein, L is selected from any one of the following structures 1 to 3:

structure (1)

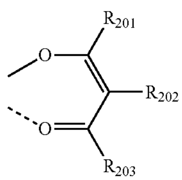

structure (2)

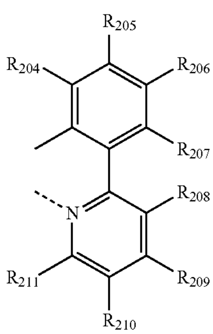

structure (3)

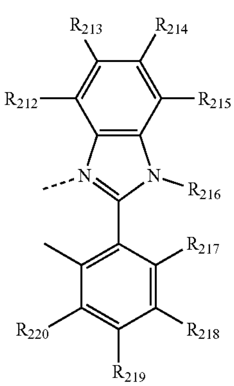

$R_{100}$ to $R_{103}$ each independently represent hydrogen, deuterium, halogen, halogen-substituted or unsubstituted (C1-C30)alkyl, a substituted or unsubstituted (C3-C30)cycloalkyl, a substituted or unsubstituted (C6-C30)aryl, cyano, a substituted or unsubstituted (3- to 30-membered) heteroaryl, or a substituted or unsubstituted (C1-C30)alkoxy; or $R_{100}$ to $R_{103}$ may be linked to an adjacent substituent(s) to form a substituted or unsubstituted fused ring with pyridine, e.g., pyridine-substituted or unsubstituted quinoline, a substituted or unsubstituted isoquinoline a substituted or unsubstituted benzofuropyridine, a substituted or unsubstituted benzothienopyridine, a substituted or unsubstituted indenopyridine, a substituted or unsubstituted benzofuroquinoline, a substituted or unsubstituted benzothienoquinoline, or a substituted or unsubstituted indenoquinoline;

$R_{104}$ to $R_{107}$ each independently represent hydrogen, deuterium, halogen, halogen-substituted or unsubstituted (C1-C30)alkyl, a substituted or unsubstituted (C3-C30)cycloalkyl, a substituted or unsubstituted (C6-C30)aryl, a substituted or unsubstituted (3- to 30-membered)heteroaryl, cyano, or a substituted or unsubstituted (C1-C30)alkoxy; or $R_{104}$ to $R_{107}$ may be linked to an adjacent substituent(s) to form a substituted or unsubstituted fused ring with benzene, e.g., benzene-substituted or unsubstituted naphthyl, a substituted or unsubstituted fluorene, a substituted or unsubstituted dibenzothiophene, a substituted or unsubstituted dibenzofuran, a substituted or unsubstituted indenopyridine, a substituted or unsubstituted benzofuropyridine, or a substituted or unsubstituted benzothienopyridine;

$R_{201}$ to $R_{220}$ each independently represent hydrogen, deuterium, halogen, deuterium- and/or halogen-substituted or unsubstituted (C1-C30)alkyl, a substituted or unsubstituted (C3-C30)cycloalkyl, or a substituted or unsubstituted (C6-C30)aryl; or $R_{201}$ to $R_{220}$ may be linked to an adjacent substituent(s) to form a substituted or unsubstituted ring; and n represents an integer of 1 to 3.

The specific examples of the dopant compound include the following, but are not limited thereto:

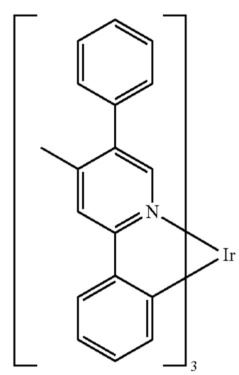

D-1

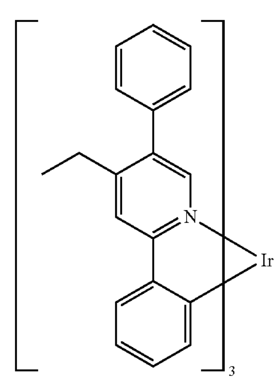

D-2

-continued
D-3
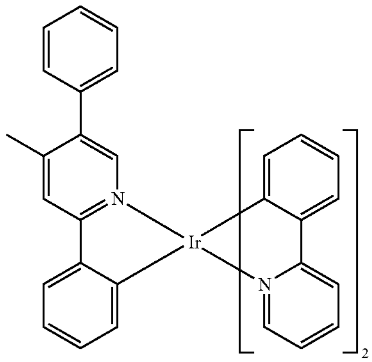
D-4
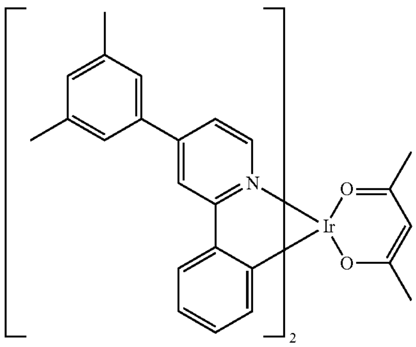
D-5
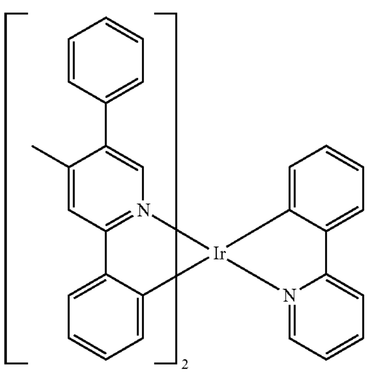
D-6
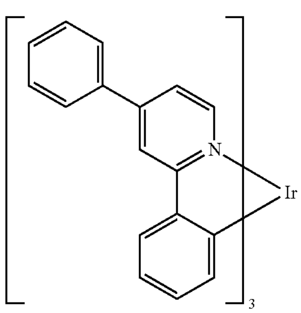
-continued
D-7
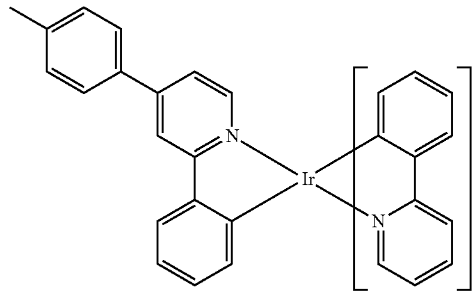
D-8
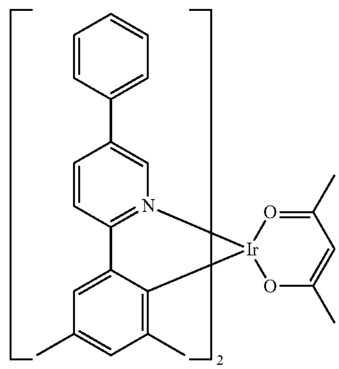
D-9
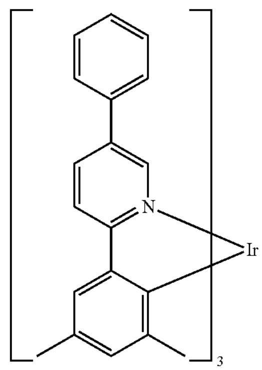
D-10
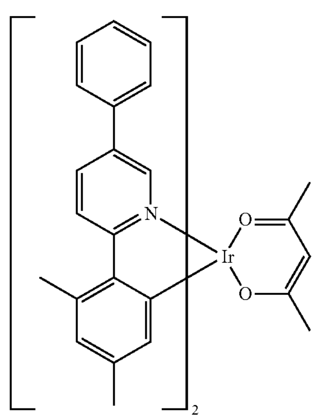

-continued
D-11
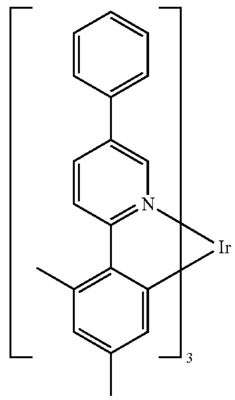
D-12
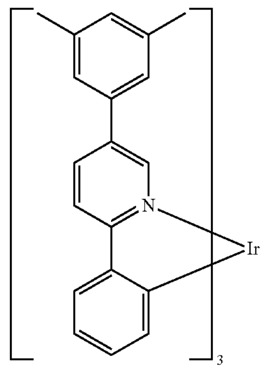
D-13
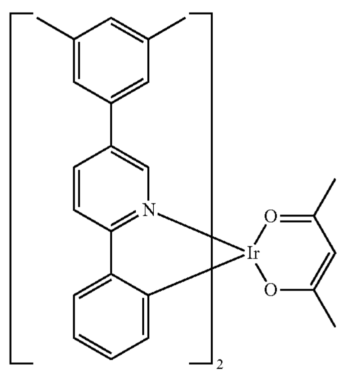
D-14
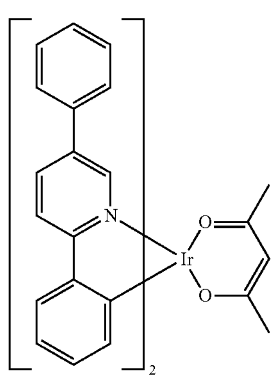
-continued
D-15
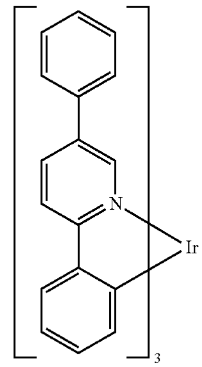
D-16
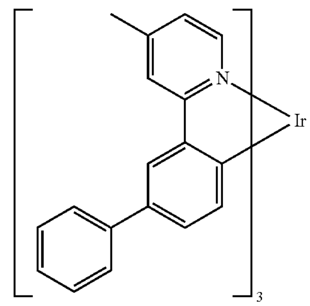
D-17
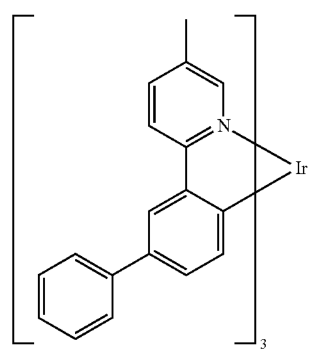
D-18
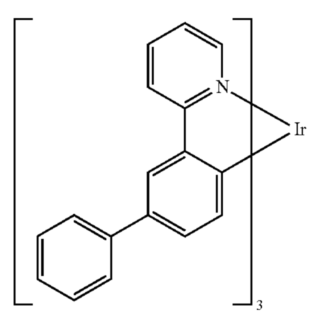

-continued
D-19
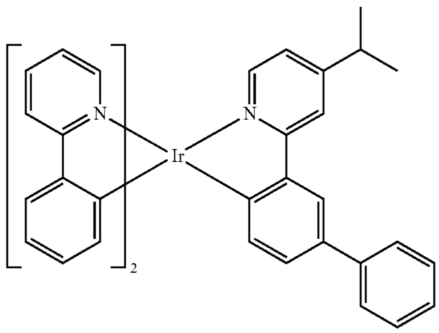
D-20
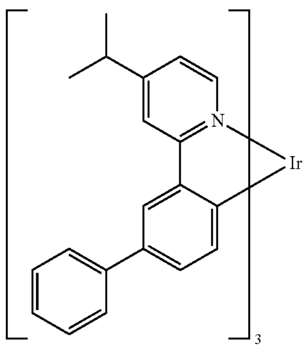
D-21
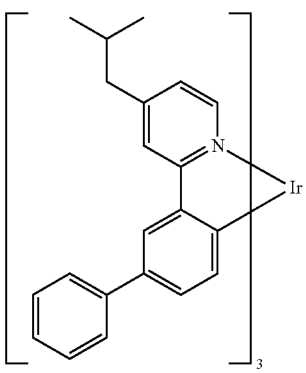
D-22
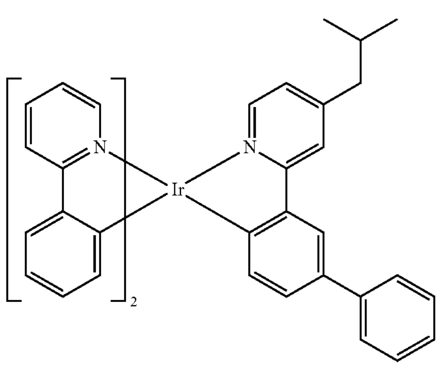
-continued
D-23
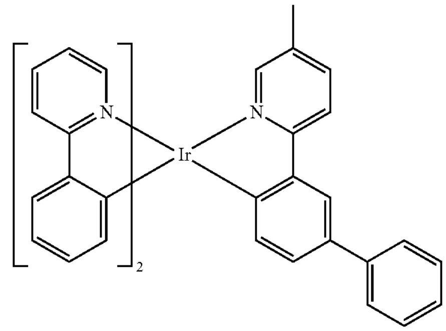
D-24
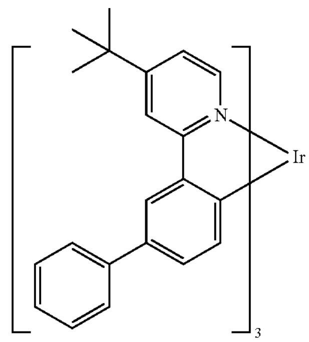
H-25
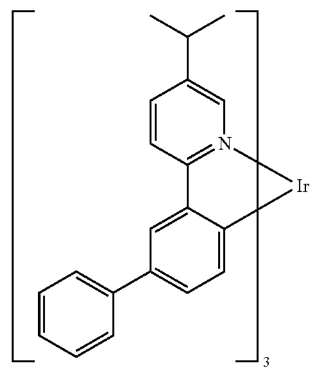
H-26
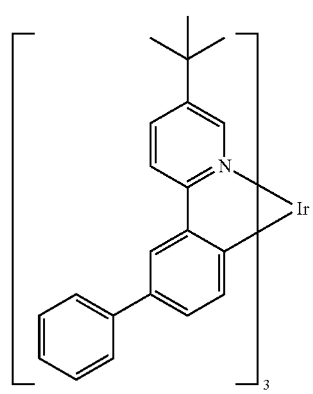

-continued
H-27
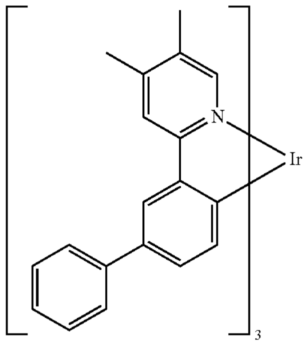
D-28
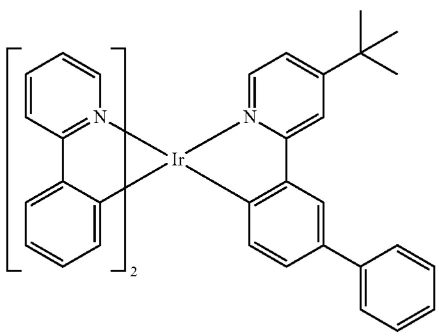
D-29
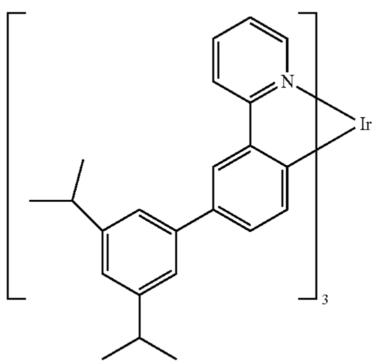
D-30
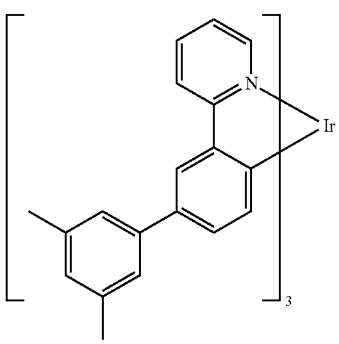
-continued
D-31
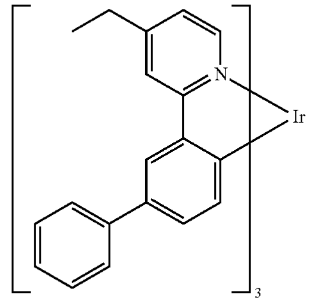
D-32
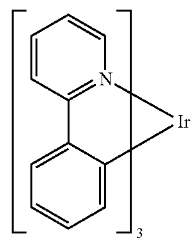
D-33
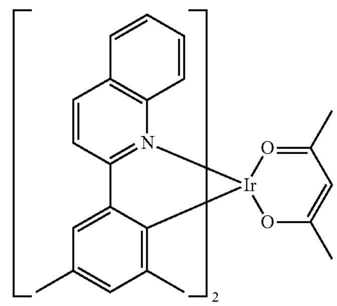
D-34
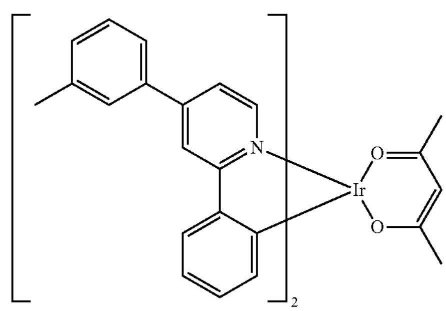
D-35
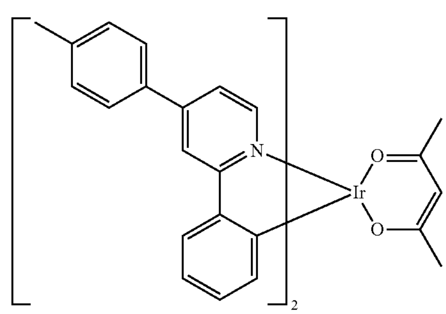

-continued
D-36
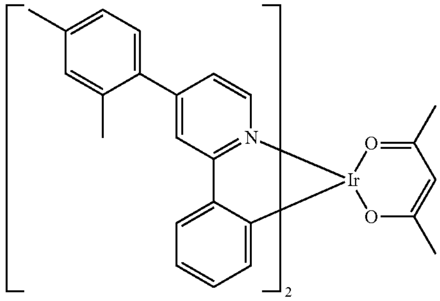
D-37
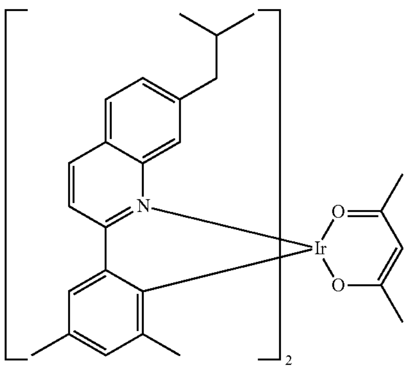
D-38
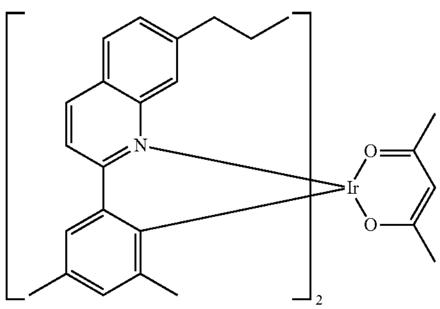
D-39
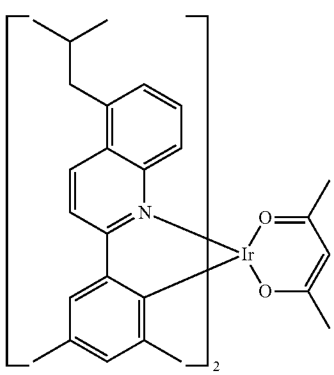
-continued
D-40
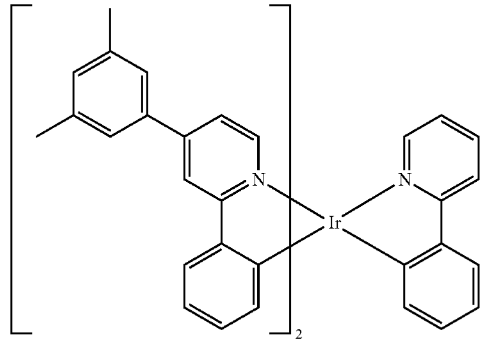
D-41
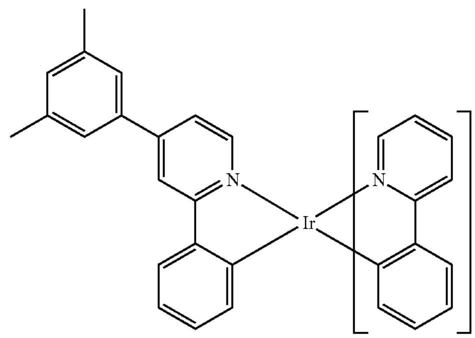
D-42
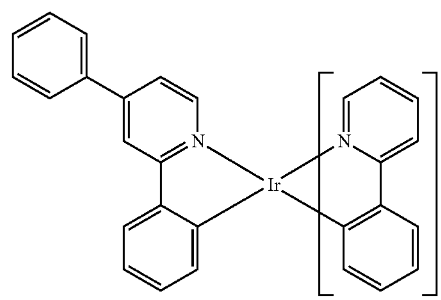
D-43
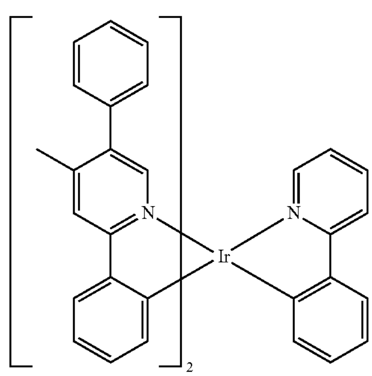

-continued
D-44
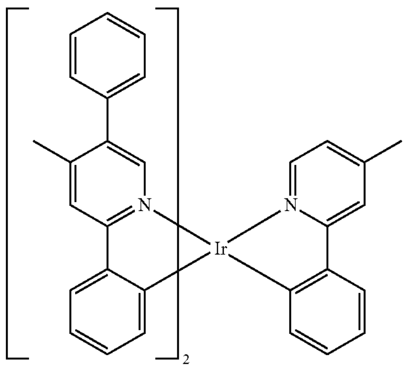
D-45
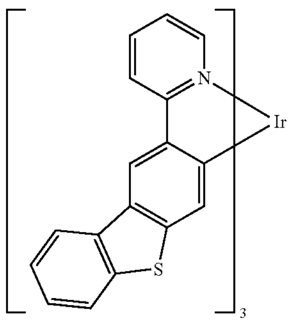
D-46
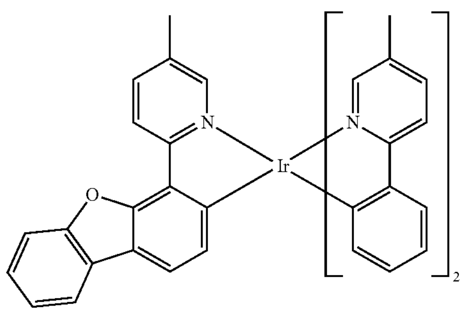
D-47
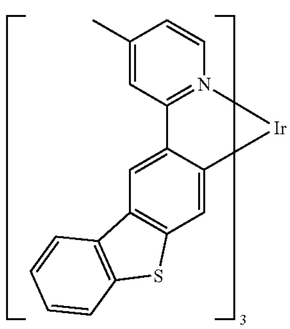
D-48
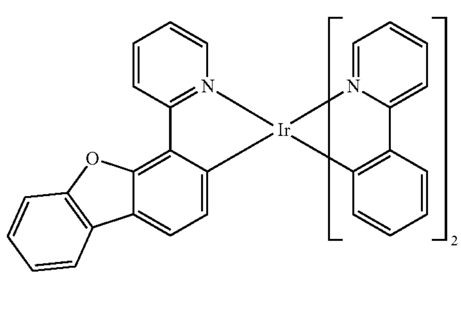
-continued
D-49
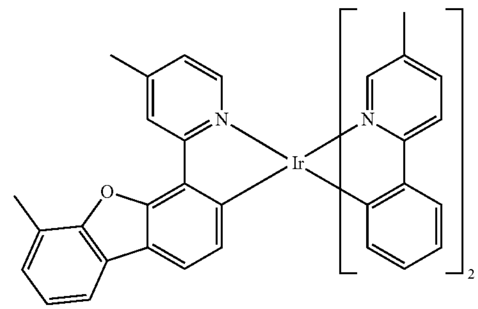
D-50
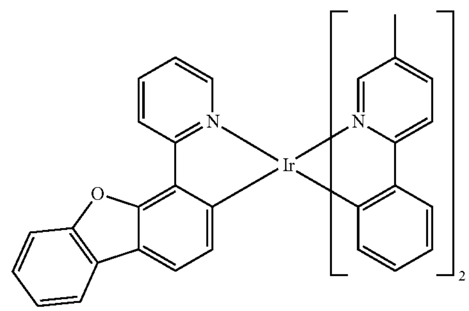
D-51
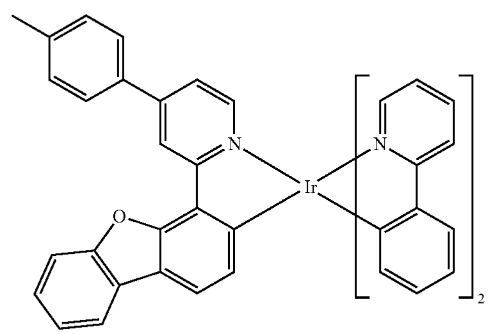
D-52
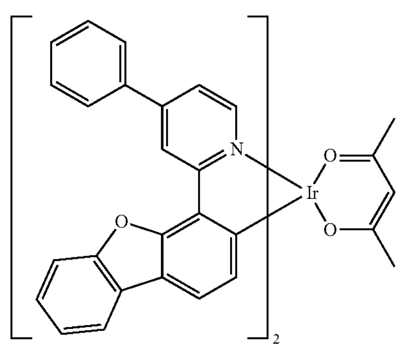
D-53
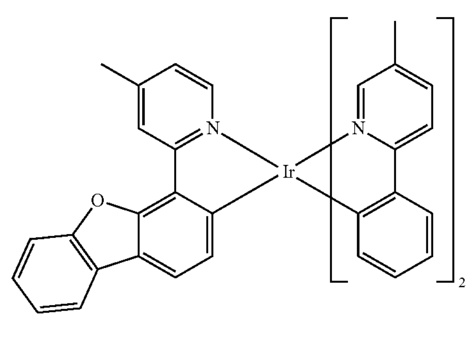

D-54
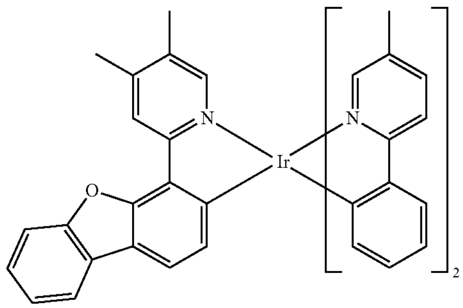
D-55
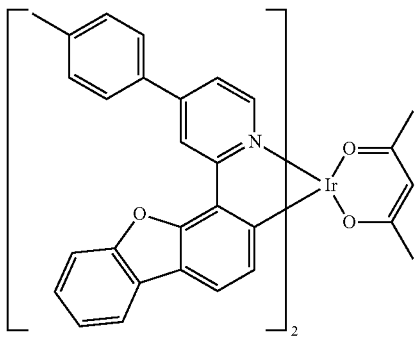
D-56
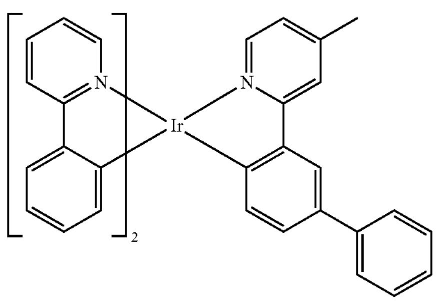
D-57
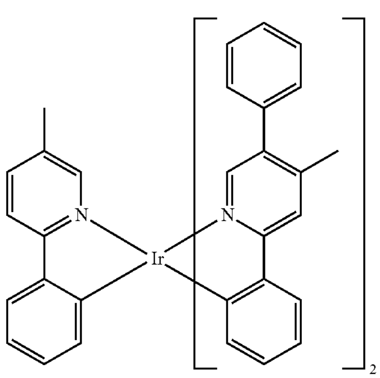
D-58
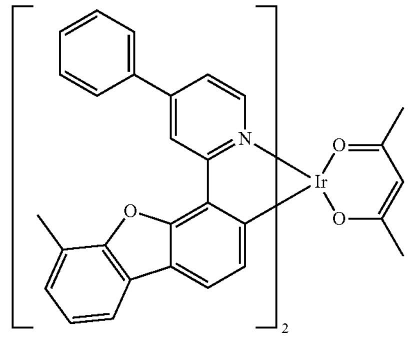
D-59
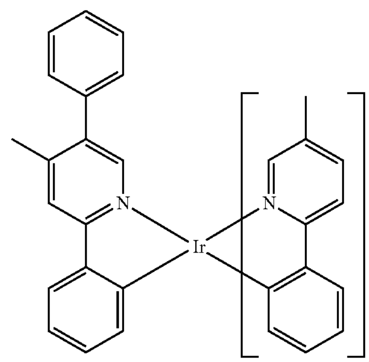
D-60
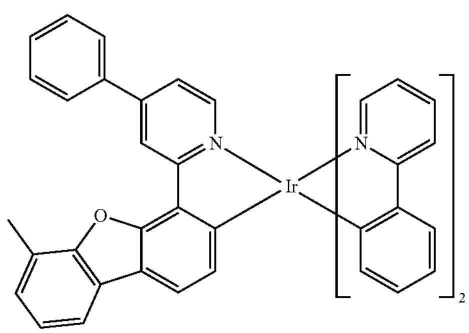
D-61
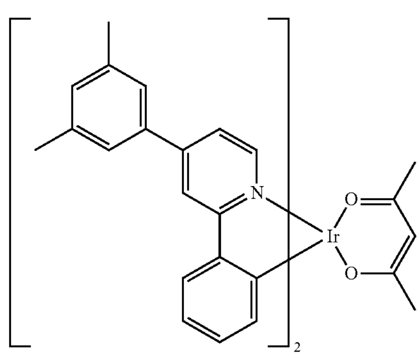

-continued
D-62
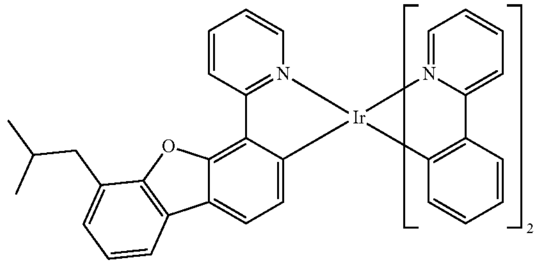
D-63
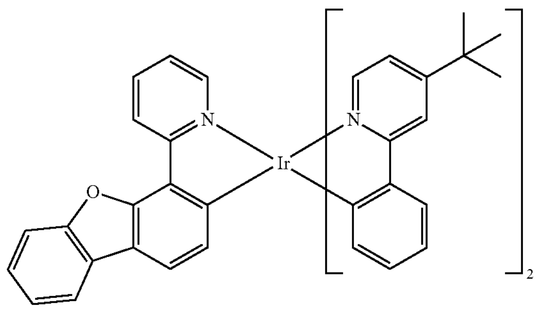
D-64
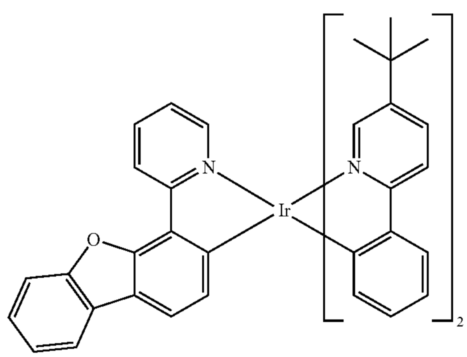
D-65
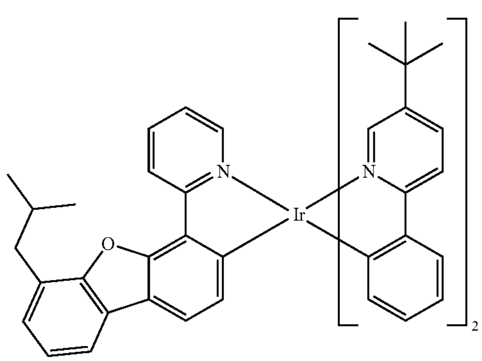
-continued
D-66
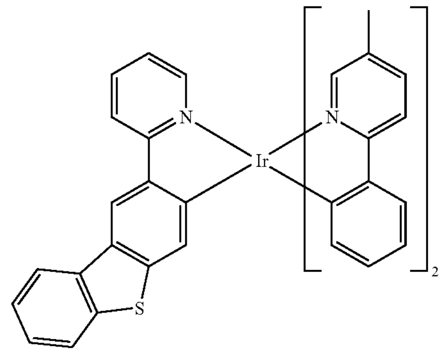
D-67
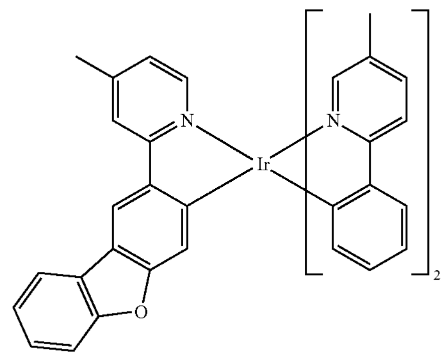
D-68
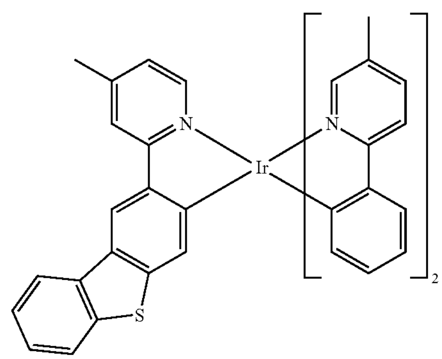
D-69
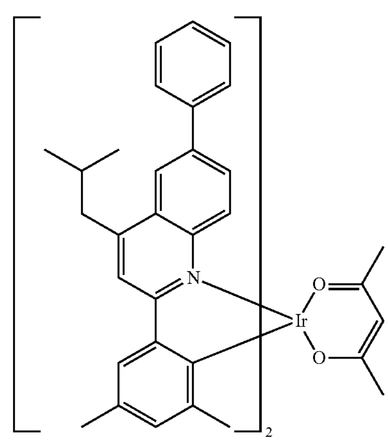

-continued
D-70
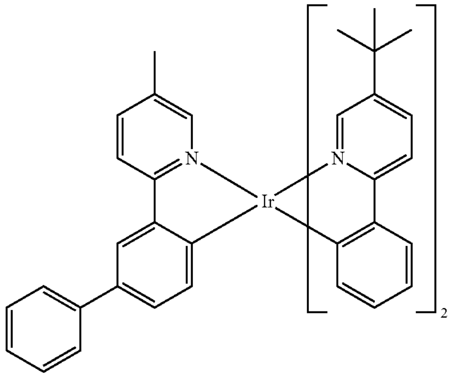
D-71
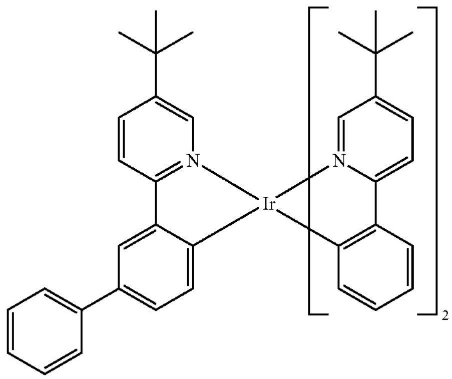
D-72
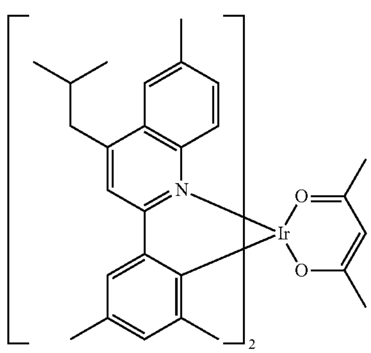
D-73
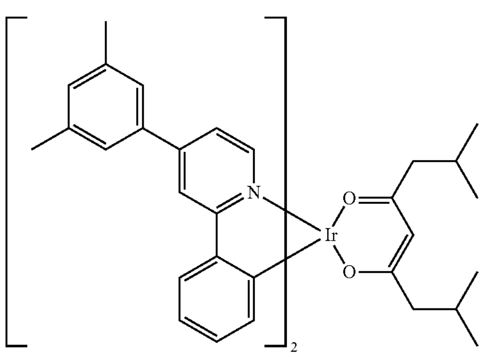
-continued
D-74
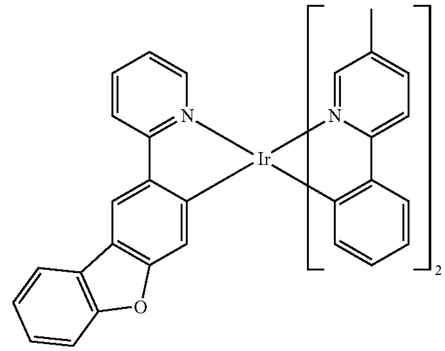
D-75
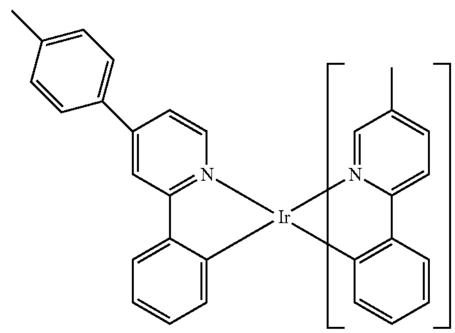
D-76
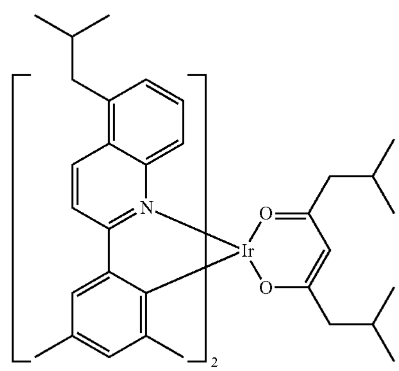
D-77
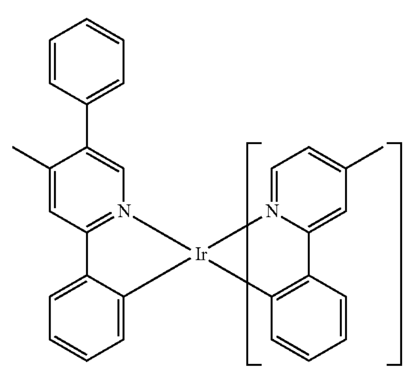

-continued
D-78
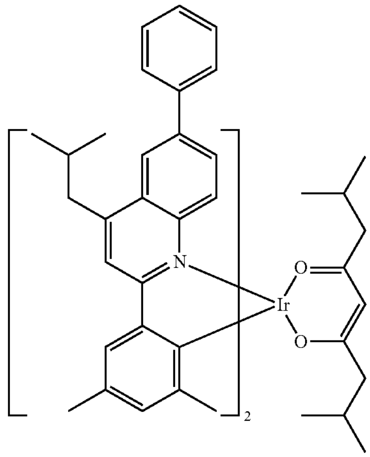
D-79
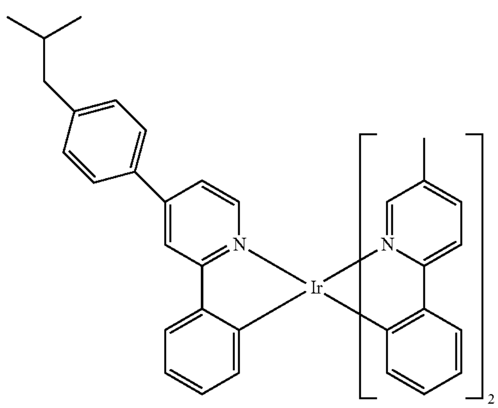
D-80
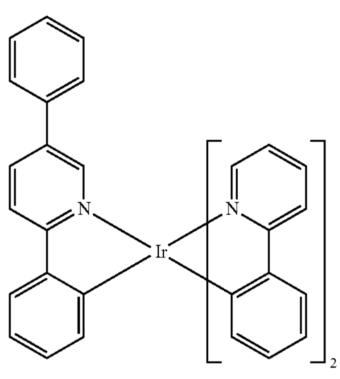
-continued
D-81
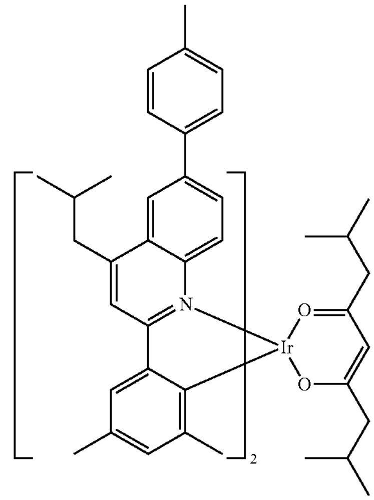
D-82
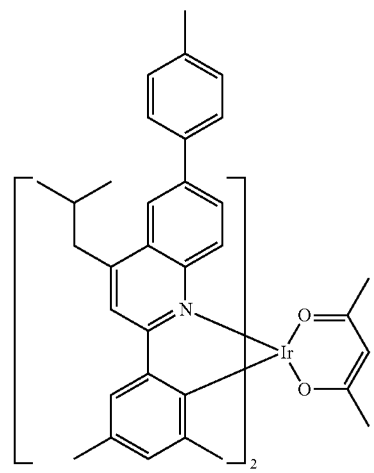
D-83
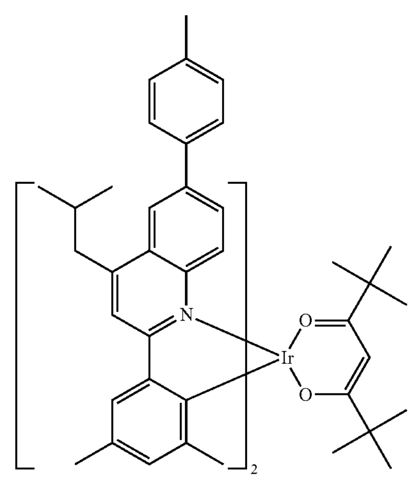

D-84
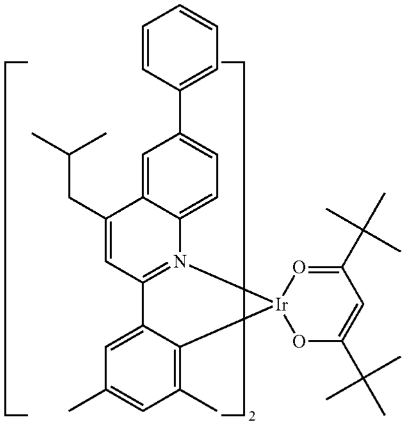
D-85
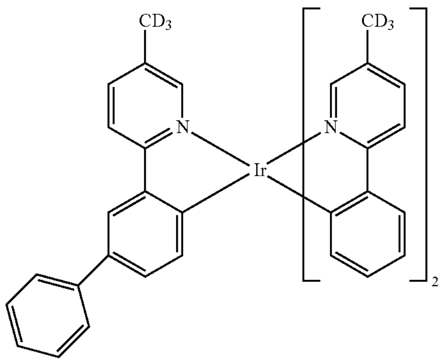
D-86
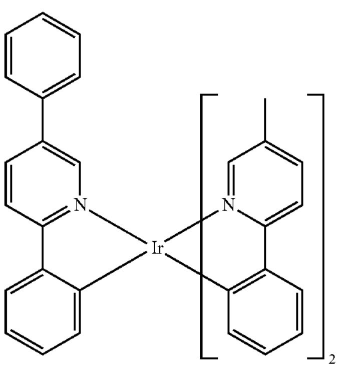
D-87
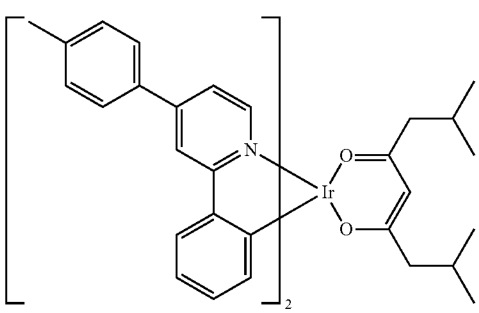
D-88
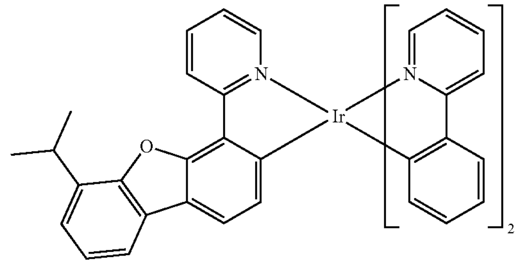
D-89
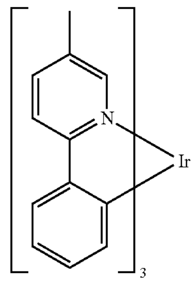
D-90
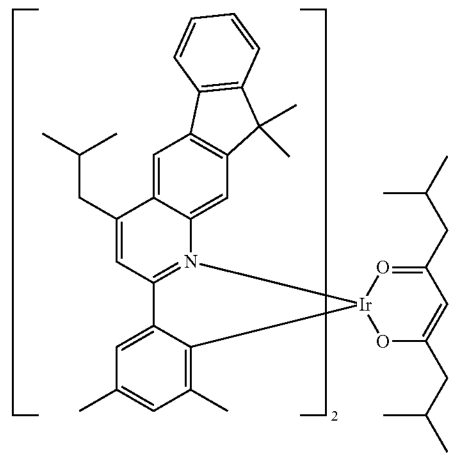
D-91
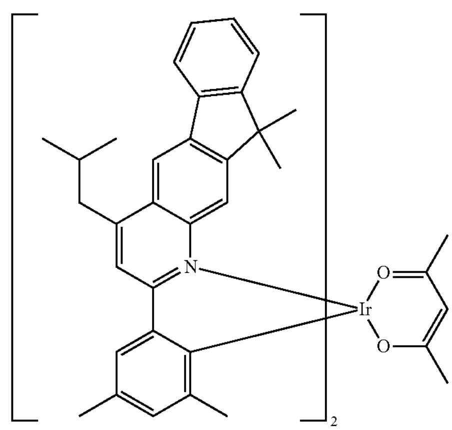

D-92
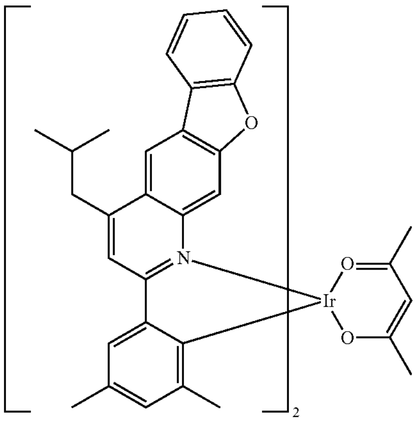
D-93
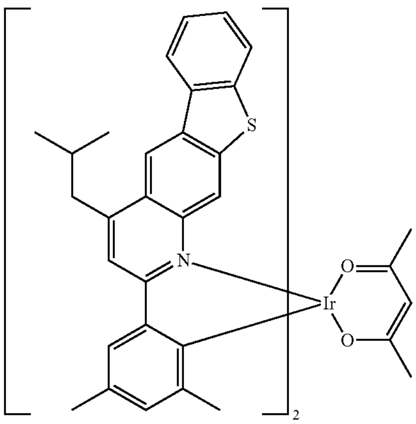
D-94
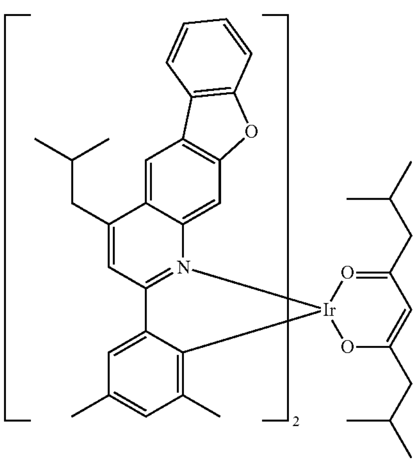
D-95
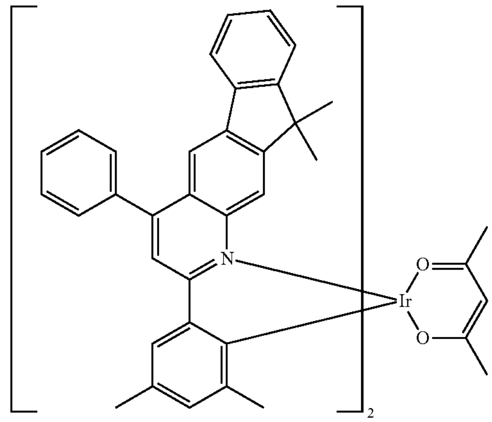
D-96
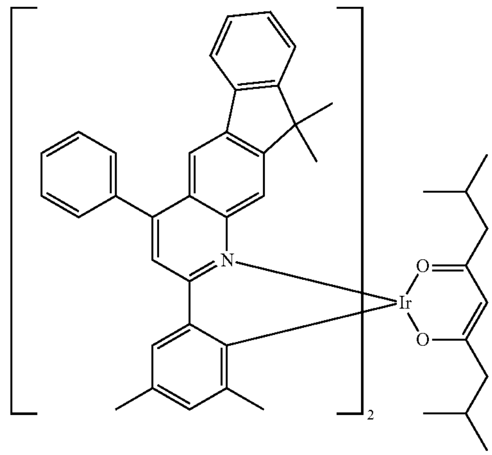
D-97
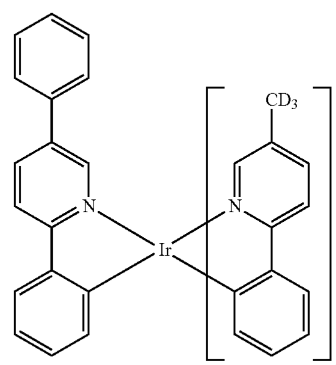
D-98
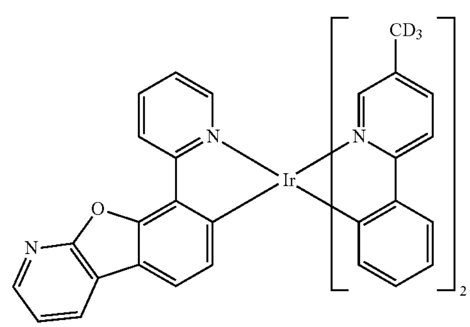

-continued
D-99
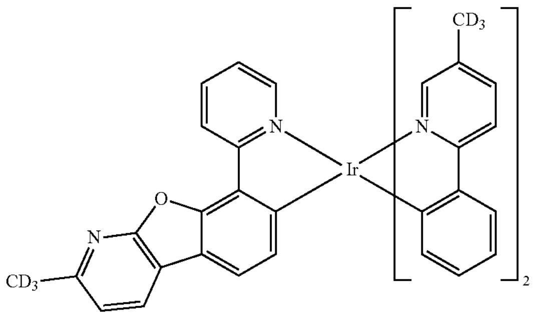
D-100
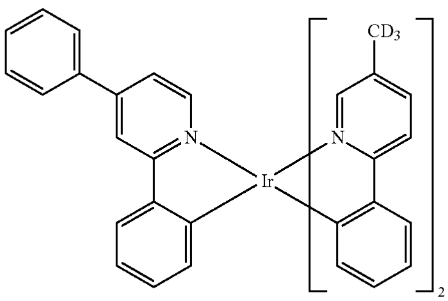
D-101
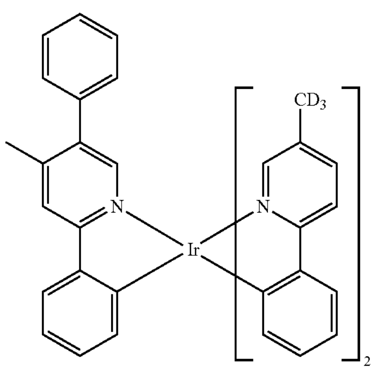
D-102
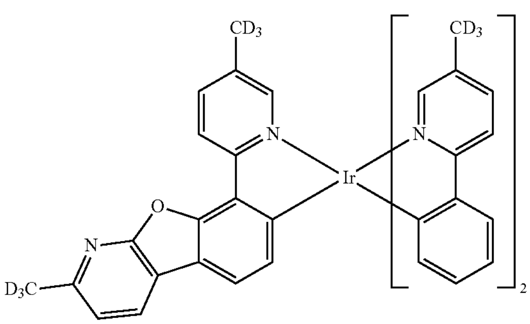
-continued
D-103
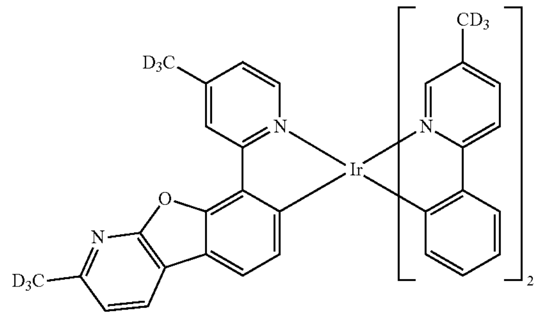
D-104
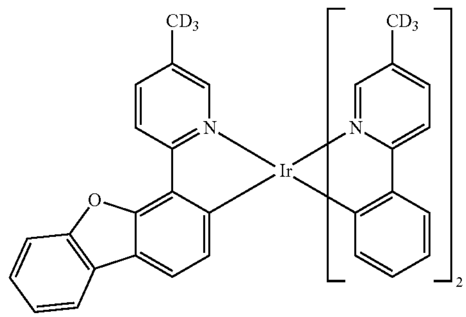
D-105
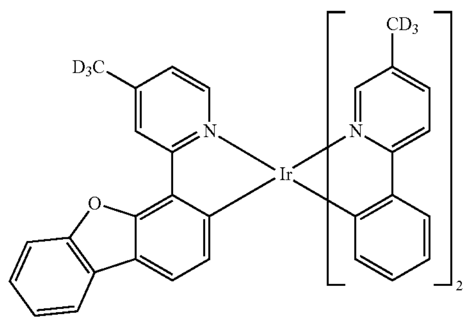
D-106
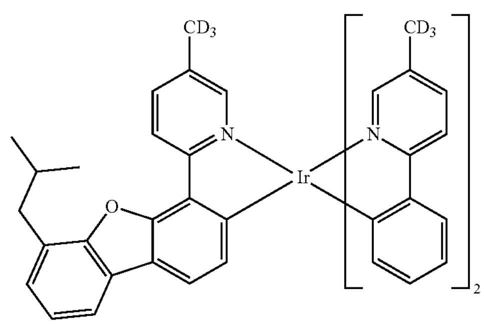
D-107
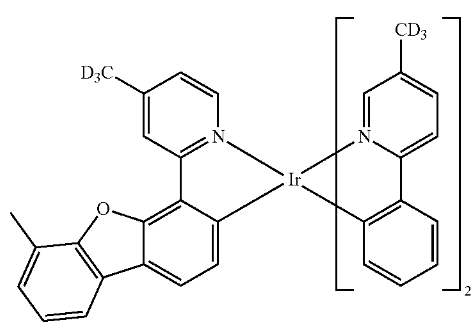

-continued
D-108
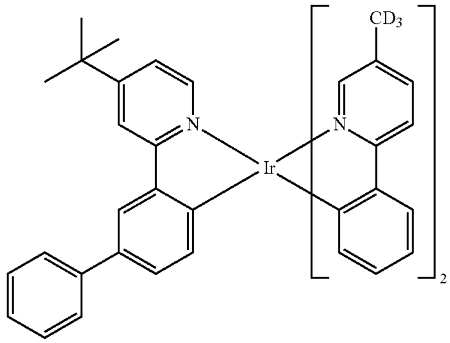
D-109
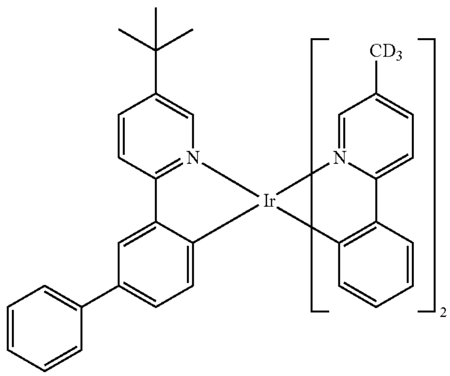
D-110
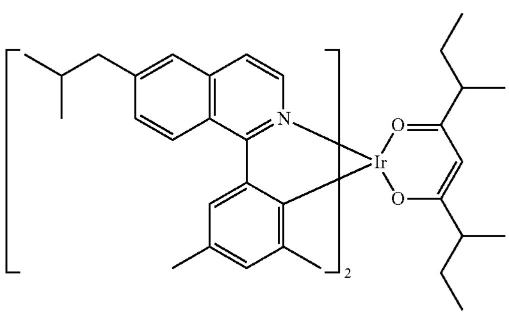
D-111
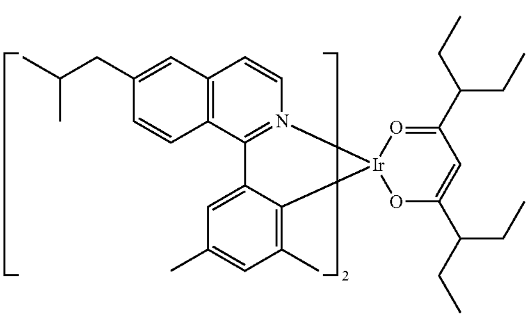
-continued
D-112
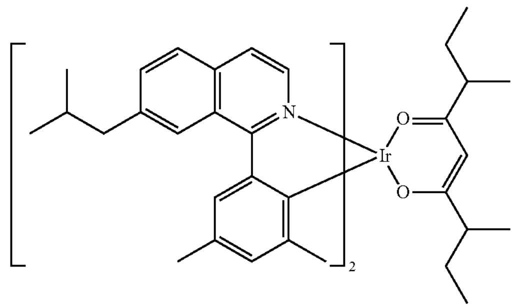
D-113
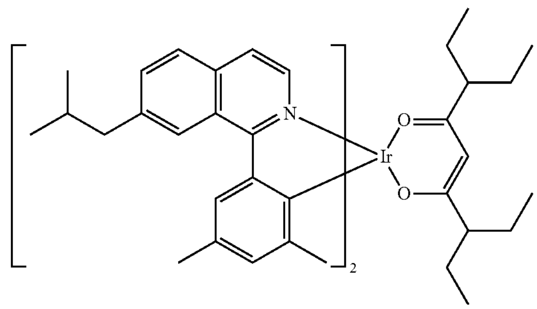
D-114
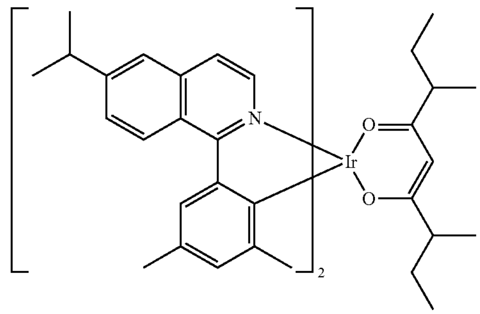
D-115
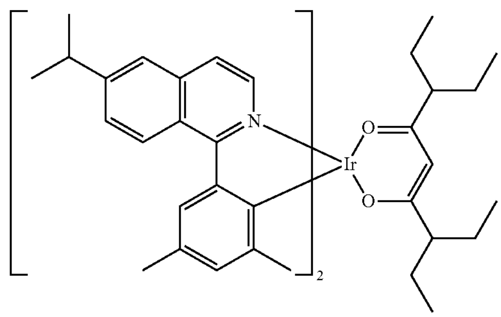
D-116
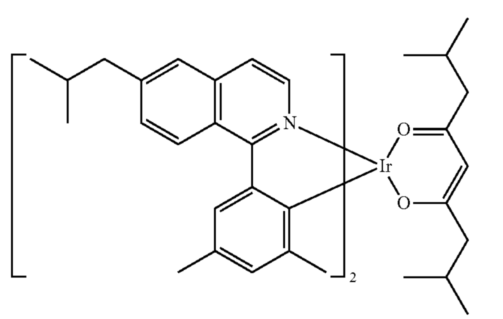

-continued
D-117
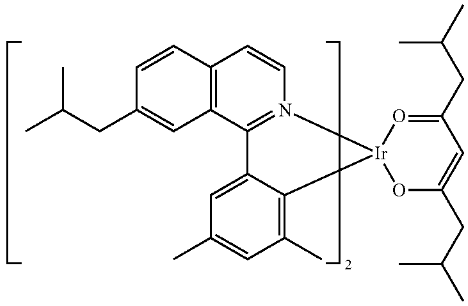
D-118
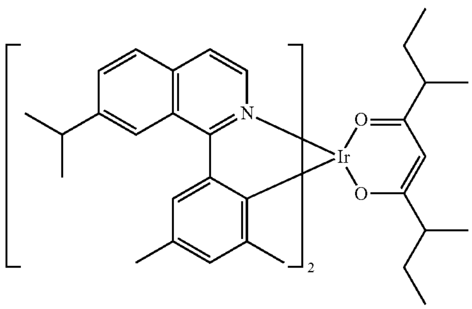
D-119
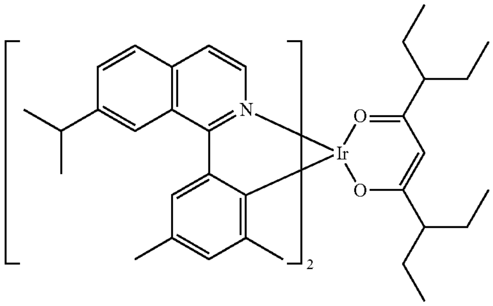
D-120
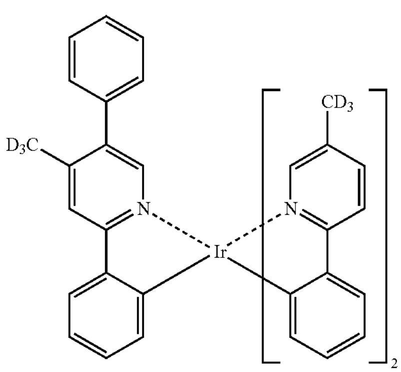
D-121
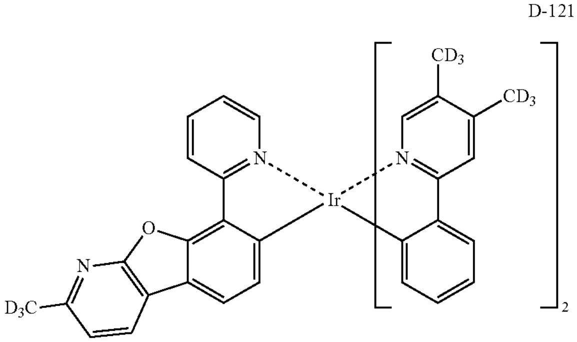
-continued
D-122
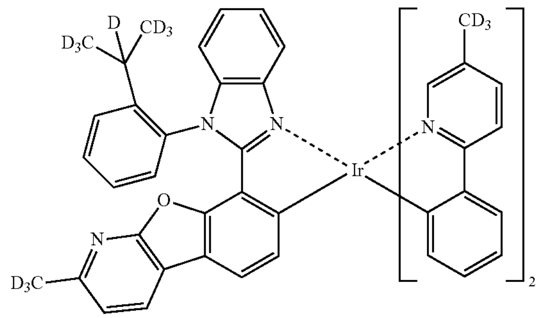
D-123
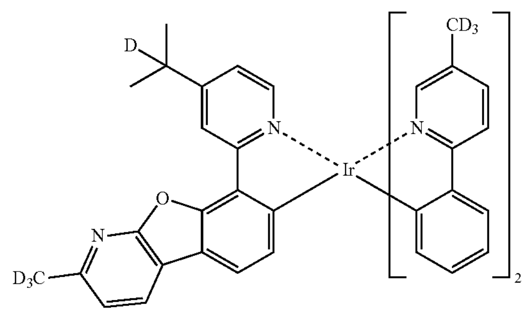
D-124
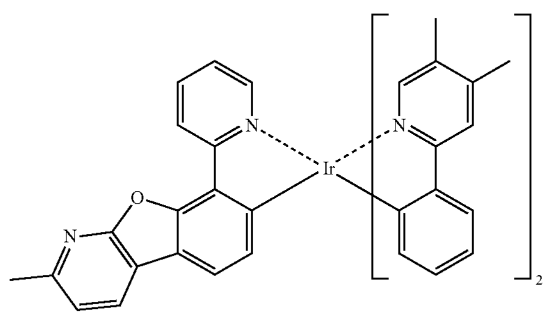
D-125
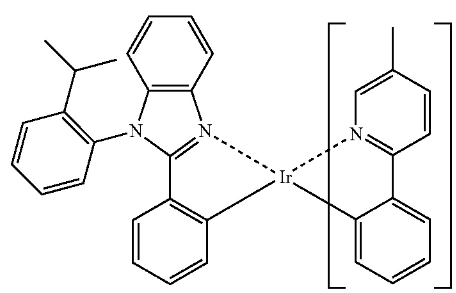
D-126
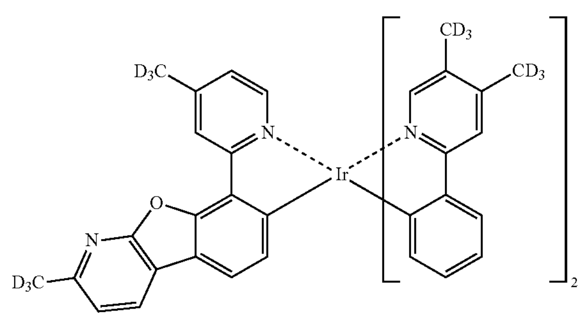

-continued
D-127
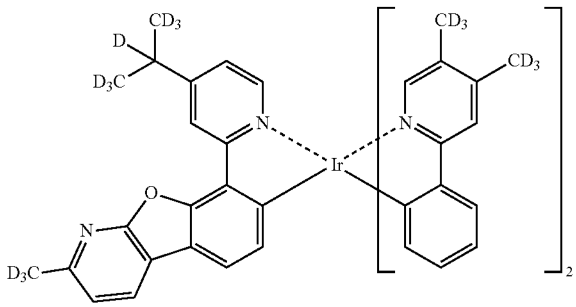
D-128
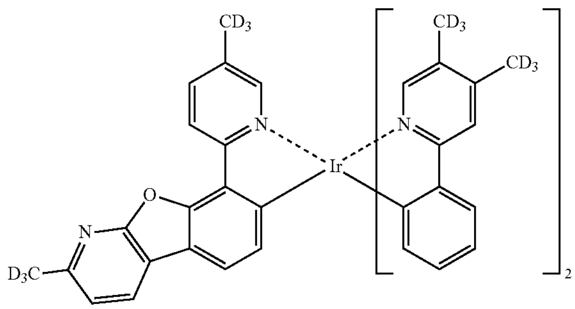
D-129
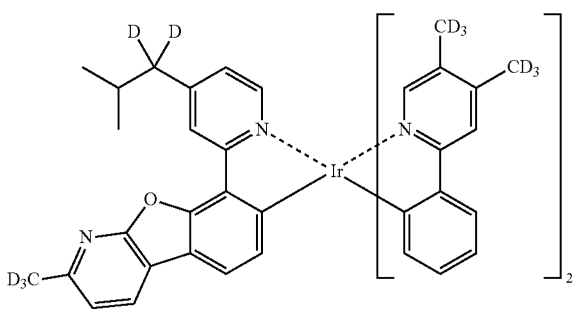
D-130
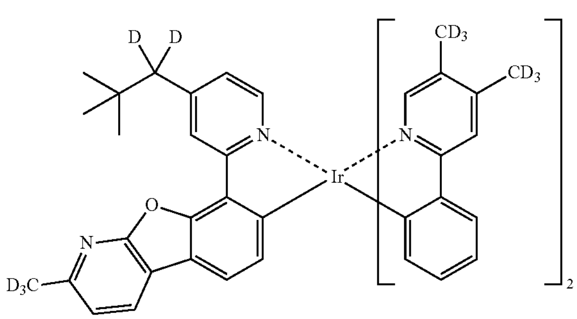
-continued
D-131
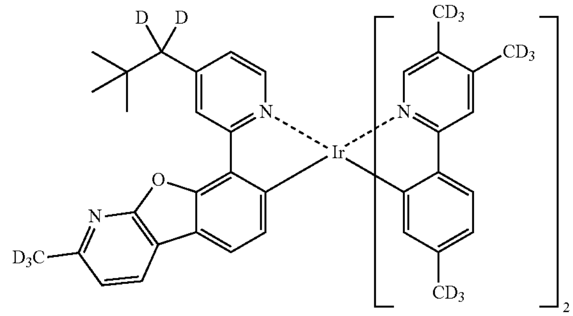
D-132
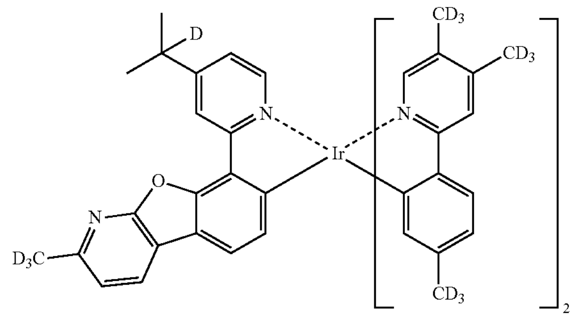
D-133
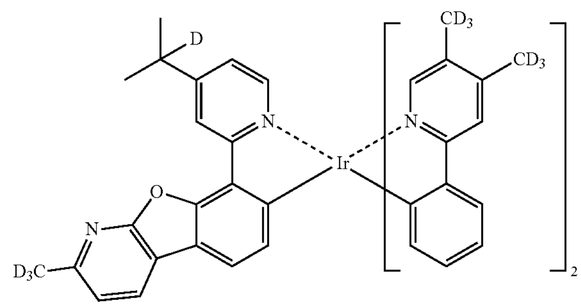
D-134
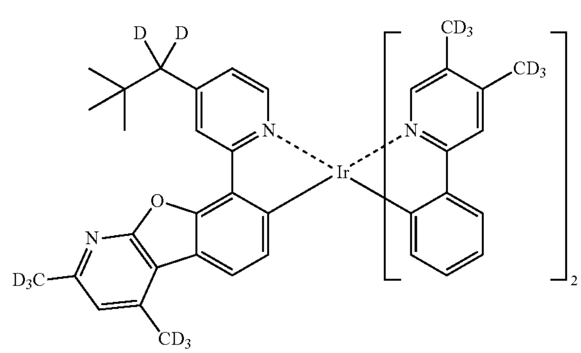

-continued
D-135
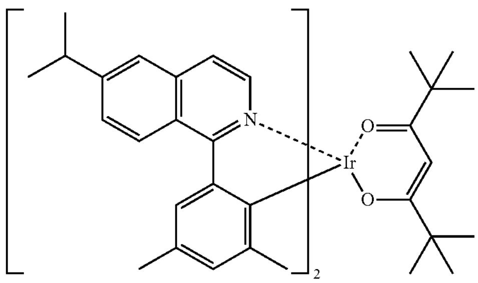
D-136
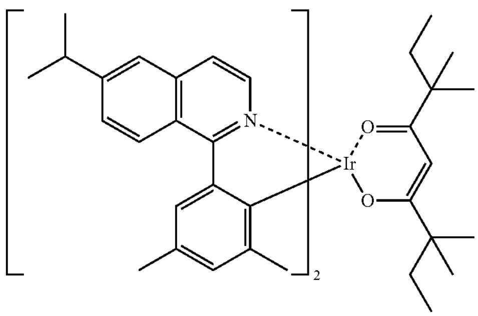
D-137
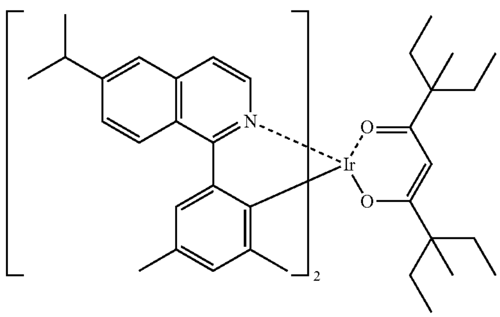
D-138
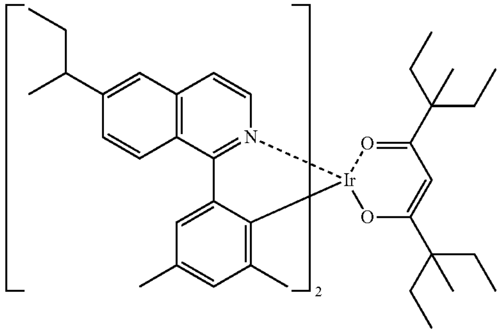
D-139
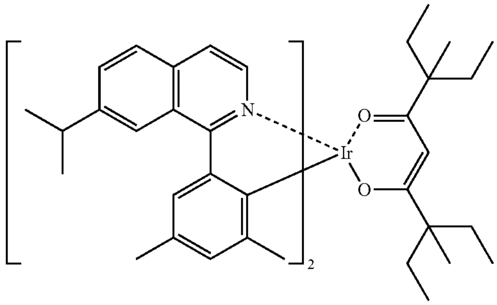
-continued
D-140
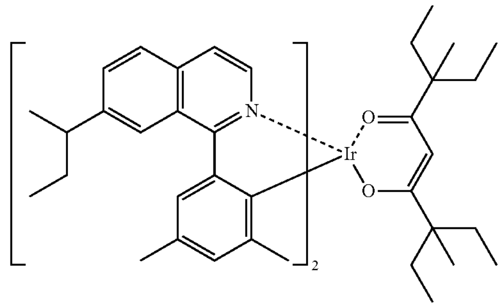
D-141
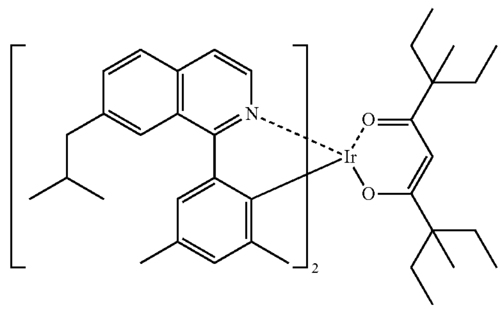
D-142
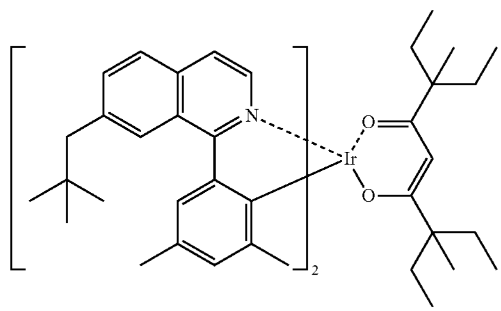
D-143
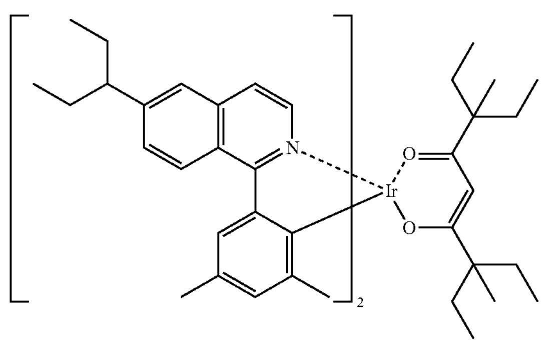
D-144
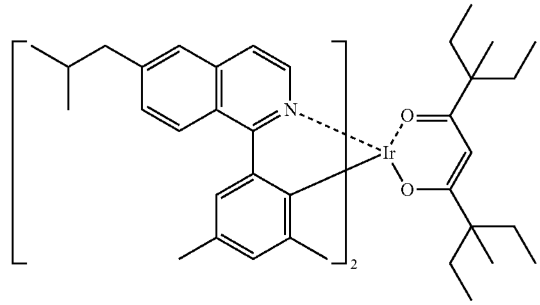

-continued

D-145

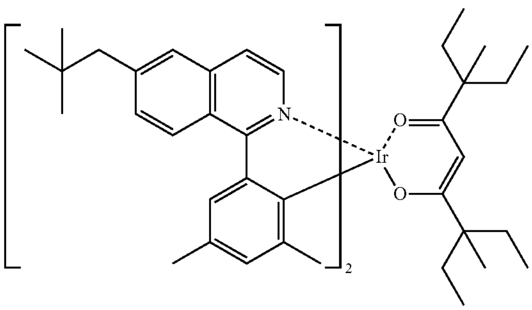

D-146

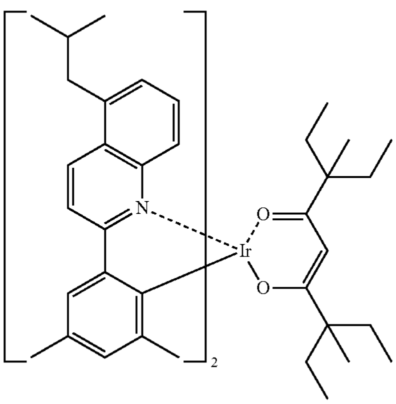

D-147

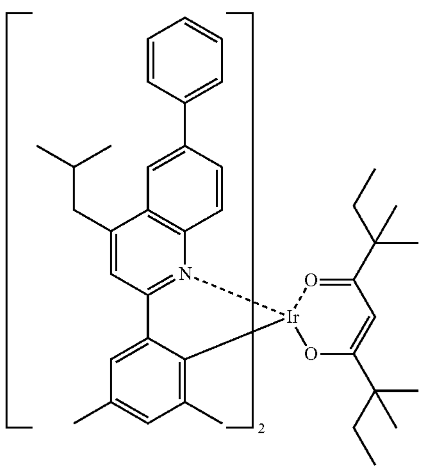

D-148

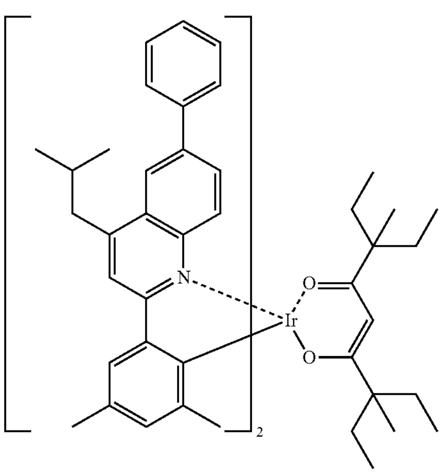

-continued

D-149

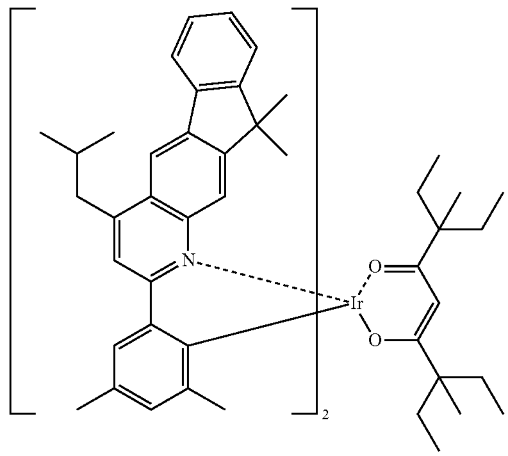

Hereinafter, the organic electroluminescent device to which the aforementioned organic electroluminescent compound or the organic electroluminescent material is applied will be described.

The organic electroluminescent device according to one embodiment may comprise a first electrode; a second electrode; and at least one organic layer between the first and second electrodes. In addition, the organic layer may comprise a light-emitting layer, an electron buffer layer, a hole blocking layer, an electron transport layer, and an electron injection layer, and may further comprise at least one layer selected from a hole injection layer, a hole transport layer, and a hole auxiliary layer, and a light-emitting auxiliary layer. Each layer may further consist of several layers. Also, the organic layer may further comprise at least one compound selected from the group consisting of an arylamine-based compound and a styrylarylamine-based compound, and further comprise at least one metal selected from the group consisting of metals of Group 1, metals of Group 2, transition metals of the $4^{th}$ period, transition metals of the $5^{th}$ period, lanthanides, and organic metals of the d-transition elements of the Periodic Table, or at least one complex compound comprising such a metal.

The compound represented by formula 1 of the present disclosure may be included in one or more layers constituting the organic electroluminescent device. According to one embodiment, the organic layer includes a light-emitting layer and/or an electron transport zone, e.g., a light-emitting layer and/or a hole blocking layer and/or an electron transport layer, comprising the organic electroluminescent compound. For example, when the organic electroluminescent compound of formula 1 is included in a hole blocking layer and/or an electron transport layer, it may be included as a hole blocking material and/or an electron transport material, respectively. The light-emitting layer, the hole blocking layer, and/or the electron transport layer may comprise solely of the organic electroluminescent compound of the present disclosure or at least two species of the organic electroluminescent compound, and may further comprise the conventional material included in the organic electroluminescent material.

The light-emitting layer according to one embodiment may comprise a plurality of host materials comprising at least one first host material represented by formula 1 and at least one second host material represented by formula 100. According to one embodiment, the light-emitting layer may comprise at least one compound among the compounds C-1 to C-533 as the first host material represented by formula 1 and at least one compound among the compounds H-1 to H-95 as the second host material represented by formula 100.

The hole blocking layer according to one embodiment may comprise at least one of the organic electroluminescent compound represented by formula 1, e.g., the hole blocking layer may comprise at least one compound among the compounds C-1 to C-533 represented by formula 1.

The electron transport layer according to another embodiment may comprise at least one of the organic electroluminescent compound represented by formula 1, e.g., the electron transport layer may comprise at least one compound among the compounds C-1 to C-533 represented by formula 1.

An organic electroluminescent material according to one embodiment may be used as light-emitting materials for a white organic light-emitting device. The white organic light-emitting device has suggested various structures such as a parallel side-by-side arrangement method, a stacking arrangement method, or color conversion material (CCM) method, etc., according to the arrangement of Red (R), Green (G), Blue (B), or Yellowish Green (YG) light-emitting units. In addition, the organic electroluminescent material according to one embodiment may also be applied to the organic electroluminescent device comprising a Quantum Dot (QD).

One of the first electrode and the second electrode may be an anode and the other may be a cathode. Wherein, the first electrode and the second electrode may each be formed as a transmissive conductive material, a transflective conductive material, or a reflective conductive material. The organic electroluminescent device may be a top emission type, a bottom emission type, or a both-sides emission type according to the kinds of the material forming the first electrode and the second electrode.

A hole injection layer, a hole transport layer, an electron blocking layer, or a combination thereof can be used between the anode and the light-emitting layer. The hole injection layer may be multi-layers in order to lower the hole injection barrier (or hole injection voltage) from the anode to the hole transport layer or the electron blocking layer, wherein each of the multi-layers may use two compounds simultaneously. The hole injection layer may be doped as a p-dopant. Also, the electron blocking layer may be placed between the hole transport layer (or hole injection layer) and the light-emitting layer, and can confine the excitons within the light-emitting layer by blocking the overflow of electrons from the light-emitting layer to prevent a light-emitting leakage. The hole transport layer or the electron blocking layer may be multi-layers, and wherein each layer may use a plurality of compounds.

An electron buffer layer, a hole blocking layer, an electron transport layer, an electron injection layer, or a combination thereof can be used between the light-emitting layer and the cathode. The electron buffer layer may be multi-layers in order to control the injection of the electron and improve the interfacial properties between the light-emitting layer and the electron injection layer, wherein each of the multi-layers may use two compounds simultaneously. The hole blocking layer or the electron transport layer may also be multi-layers, wherein each layer may use a plurality of compounds. Also, the electron injection layer may be doped as an n-dopant.

The light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or the hole transport, or for preventing the overflow of electrons. When the light-emitting auxiliary layer is placed between the cathode and the light-emitting layer, it can be used for promoting the electron injection and/or the electron transport, or for preventing the overflow of holes. In addition, the hole auxiliary layer may be placed between the hole transport layer (or hole injection layer) and the light-emitting layer, and may be effective to promote or block the hole transport rate (or the hole injection rate), thereby enabling the charge balance to be controlled. When an organic electroluminescent device includes two or more hole transport layers, the hole transport layer, which is further included, may be used as the hole auxiliary layer or the electron blocking layer. The light-emitting auxiliary layer, the hole auxiliary layer, or the electron blocking layer may have an effect of improving the efficiency and/or the lifespan of the organic electroluminescent device.

In the organic electroluminescent device of the present disclosure, preferably at least one layer (hereinafter, "a surface layer") selected from a chalcogenide layer, a halogenated metal layer, and a metal oxide layer may be placed on an inner surface(s) of one or both electrode(s). Specifically, a chalcogenide (including oxides) layer of silicon and aluminum is preferably placed on an anode surface of an electroluminescent medium layer, and a halogenated metal layer or a metal oxide layer is preferably placed on a cathode surface of an electroluminescent medium layer. The operation stability for the organic electroluminescent device may be obtained by the surface layer. Preferably, the chalcogenide includes $SiO_x(1 \leq X \leq 2)$, $AlO_x(1 \leq X \leq 1.5)$, SiON, SiAlON, etc.; the halogenated metal includes LiF, $MgF_2$, $CaF_2$, a rare earth metal fluoride, etc.; and the metal oxide includes $Cs_2O$, $Li_2O$, MgO, SrO, BaO, CaO, etc.

Further, in the organic electroluminescent device of the present disclosure, a mixed region of an electron transport compound and a reductive dopant, or a mixed region of a hole transport compound and an oxidative dopant may be placed on at least one surface of a pair of electrodes. In this case, the electron transport compound is reduced to an anion, and thus it becomes easier to inject and transport electrons from the mixed region to an electroluminescent medium. Furthermore, the hole transport compound is oxidized to a cation, and thus it becomes easier to inject and transport holes from the mixed region to the electroluminescent medium. Preferably, the oxidative dopant includes various Lewis acids and acceptor compounds, and the reductive dopant includes alkali metals, alkali metal compounds, alkaline earth metals, rare-earth metals, and mixtures thereof. A reductive dopant layer may be employed as a charge generating layer to prepare an organic electroluminescent device having two or more light-emitting layers and emitting white light.

In order to form each layer of the organic electroluminescent device of the present disclosure, dry film-forming methods such as vacuum evaporation, sputtering, plasma, ion plating methods, etc., or wet film-forming methods such as ink jet printing, nozzle printing, slot coating, spin coating, dip coating, flow coating methods, etc., can be used. When using a wet film-forming method, a thin film may be formed by dissolving or diffusing materials forming each layer into any suitable solvent such as ethanol, chloroform, tetrahydrofuran, dioxane, etc. The solvent may be any solvent where the materials forming each layer can be dissolved or diffused, and where there are no problems in film-formation capability.

When forming a layer by the host and the dopant compounds according to one embodiment, co-evaporation or mixture-evaporation may be used, but is not limited thereto. The co-deposition is a mixed deposition method in which two or more isomer materials are put into respective individual crucible sources and a current is applied to both cells simultaneously to evaporate the materials and to perform mixed deposition; and the mixed deposition is a mixed deposition method in which two or more isomer materials are mixed in one crucible source before deposition, and then a current is applied to one cell to evaporate the materials.

According to one embodiment, the present disclosure can provide displays for devices such as smartphones, tablets, notebooks, PCs, TVs, or display devices for vehicles, or lighting devices such as outdoor or indoor lighting, by using the organic electroluminescent compound of the present disclosure.

Hereinafter, the preparation method of compound according to the present disclosure will be explained with reference to the synthesis method of a representative compound or an intermediate compound in order to understand the present disclosure in detail.

[Example 1] Synthesis of Compound C-172

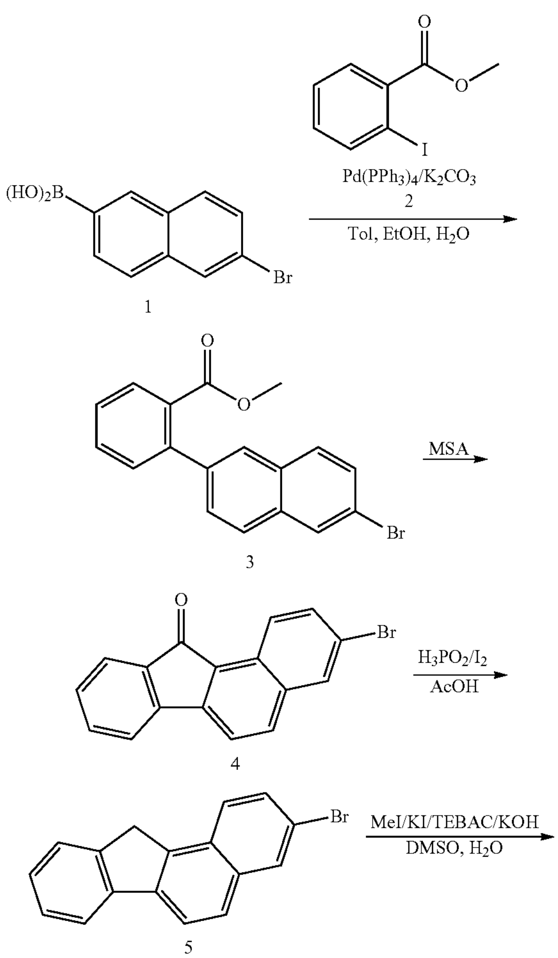

-continued

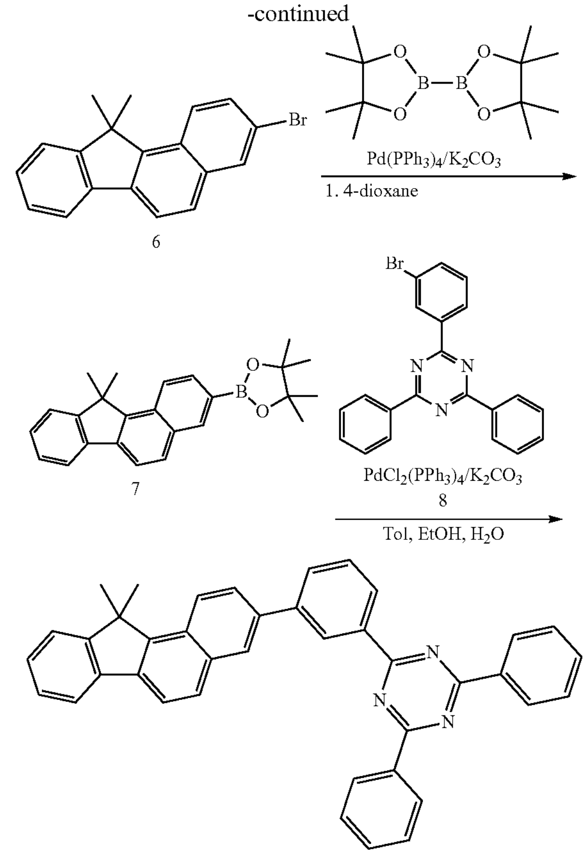

C-172

1) Synthesis of Compound 3

Compound 1 (50.3 g, 200.34 mmol), compound 2 (50.0 g, 190.80 mmol), tetrakis(triphenylphosphine)palladium(0)(Pd $(PPh_3)_4$) (6.6 g, 5.72 mmol), potassium carbonate($K_2CO_3$) (66.0 g, 477 mmol), 950 mL of toluene(Toluen; Tol), 240 mL of ethanol(EtOH), and 240 mL of distilled water ($H_2O$) were added into a flask and dissolved followed by refluxing for 3 hours. After completion of the reaction, the organic layer was extracted with ethyl acetate, and then the reaction mixture was purified by column chromatography to obtain compound 3 (61.7 g, yield: 85%).

2) Synthesis of Compound 4

Compound 3 (61.7 g, 180.83 mmol) and 720 mL of methanesulfonic acid (MSA) were added into a flask and stirred at 70° C. for 2 hours. After completion of the reaction, distilled water was added dropwise into the mixture, and then the mixture was filtered to obtain compound 4 (40.1 g, yield: 72%).

3) Synthesis of Compound 5

Hypophosphite($H_3PO_2$) (22.0 mL, 207.53 mmol), iodine ($I_2$) (17.1 g, 67.45 mmol), and 650 mL of acetic acid(AcOH) were added into a flask and refluxed for 1 hour. Thereafter, compound 4 (40.1 g, 129.71 mmol) was added into the mixture followed by refluxing 2 hours. After completion of the reaction, the organic layer was extracted with ethyl acetate to obtain compound 5 (38.3 g, yield: 100%).

4) Synthesis of Compound 6

Compound 5 (38.3 g, 129.76 mmol), potassium iodide (KI) (2.2 g, 12.98 mmol), potassium hydroxide (KOH) (36.4 g, 648.80 mmol), benzyltriethylammonium chloride (TEBAC) (1.8 g, 6.49 mmol), 650 mL of dimethylsulfoxide (DMSO), and 65 mL of distilled water($H_2O$) were added into a flask and stirred for 30 minutes. Thereafter, methyl iodide (MeI) (20.2 mL, 324.39 mmol) was added into the mixture followed by stirring at room temperature for 2 hours. After completion of the reaction, the organic layer was extracted with ethyl acetate, and then was purified by column chromatography to obtain compound 6 (36.0 g, yield: 86%).

5) Synthesis of Compound 7

Compound 6 (10 g, 30.94 mmol), bis(pinacolato)diboron (11 g, 43.32 mmol), Bis(triphenylphosphine)palladium(II) dichloride ($PdCl_2(PPh_3)_2$) (1.1 g, 1.55 mmol), potassium acetate (KOAc) (6.1 g, 61.88 mmol) and 155 mL of 1,4-dioxane were added into a reaction vessel and stirred at 130° C. for 6 hours. After completion of the reaction, the mixture was cooled to room temperature and the organic layer was extracted with ethyl acetate. The extracted organic layer was dried with $MgSO_4$ and then the remaining solvent was removed with a rotary evaporator. Thereafter the reaction mixture was purified by column chromatography to obtain compound 7 (7.8 g, yield: 68%).

6) Synthesis of Compound C-172

Compound 7 (3.0 g, 8.10 mmol), compound 8 (3.0 g, 7.72 mmol), tetrakis(triphenylphosphine)palladium ($Pd(PPh_3)_4$) (0.3 g, 0.23 mmol), potassium carbonate ($K_2CO_3$) (2.0 g, 19.30 mmol), 40 mL of toluene(Tol), 10 mL of ethanol (EtOH), and 10 mL of distilled water($H_2O$) were added into a flask and dissolved followed by refluxing for 4 hours. After completion of the reaction, the organic layer was extracted with ethyl acetate, and then was purified by column chromatography to obtain compound C-172 (2.8 g, yield: 67%).

| | MW | M.P |
|---|---|---|
| C-172 | 551.68 | 223° C. |

[Example 2] Synthesis of Compound C-11

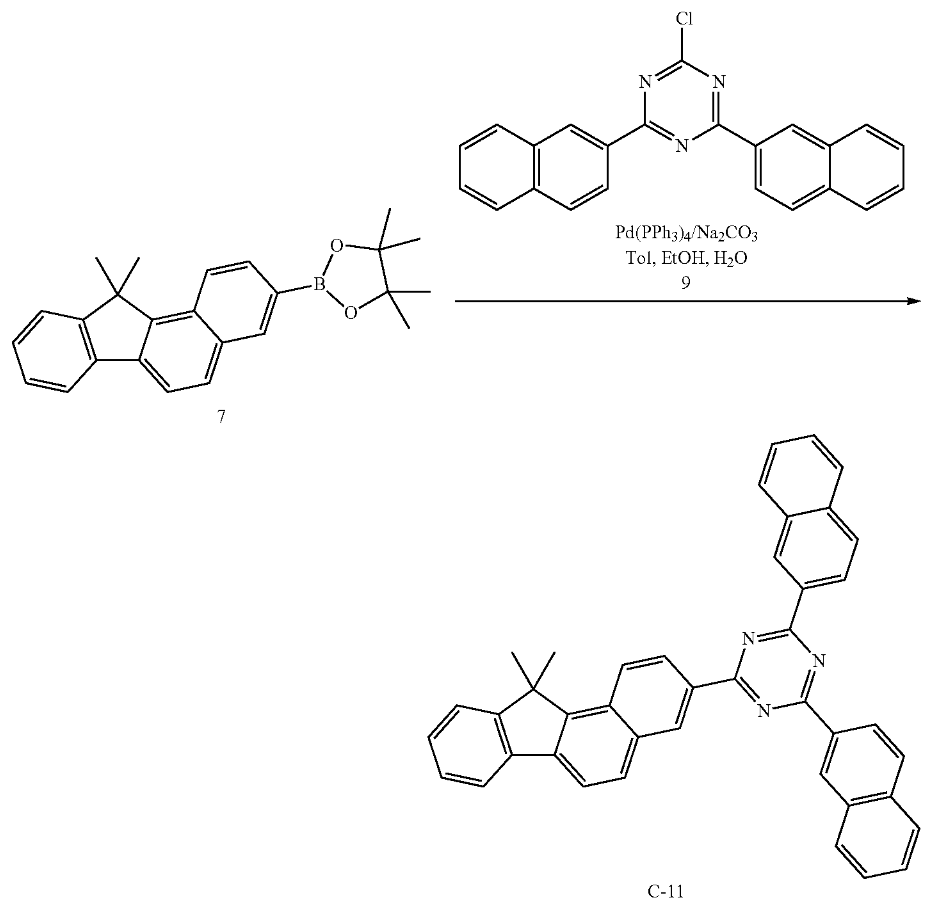

7

C-11

Compound 7 (3.0 g, 8.10 mmol), compound 9 (2.8 g, 7.72 mmol), tetrakis(triphenylphosphine)palladium ($Pd(PPh_3)_4$) (0.3 g, 0.23 mmol), sodium carbonate (2.0 g, 19.30 mmol), 40 mL of toluene (Tol), 10 mL of ethanol (EtOH), and 10 mL of distilled water ($H_2O$) were added into a flask and dissolved followed by refluxing for 4 hours. After completion of the reaction, the organic layer was extracted with ethyl acetate, and was purified by column chromatography to obtain compound C-11 (2.5 g, yield: 57%).

| | MW | M.P |
|---|---|---|
| C-11 | 575.72 | 293° C. |

[Example 3] Synthesis of Compound C-533

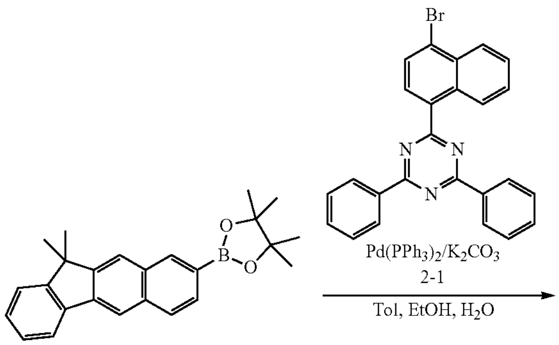

1-1

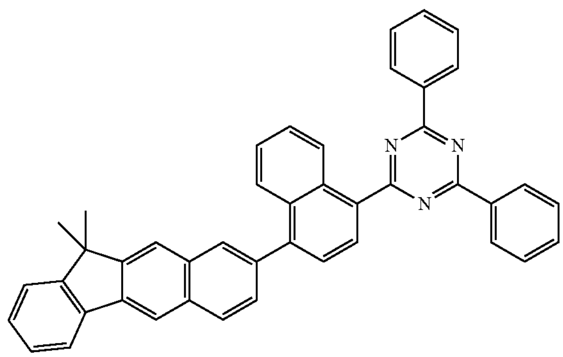

C-533

Compound 1-1 (1.9 g, 5.10 mmol), compound 2-1 (2.7 g, 6.11 mmol), $Pd(PPh_3)_2$ (0.17 g, 0.15 mmol), K2C03 (1.6 g, 11.21 mmol), 25 mL of toluene(Tol), 7 mL of EtOH, and 7 mL of $H_2O$ were added into a flask and dissolved followed by refluxing for 4 hours. After completion of the reaction, the organic layer was extracted with ethyl acetate, and was purified by column chromatography to obtain compound C-533 (2.7 g, yield: 60%).

| | MW | M.P |
|---|---|---|
| C-533 | 601.75 | 171° C. |

[Example 4] Synthesis of Compound C-293

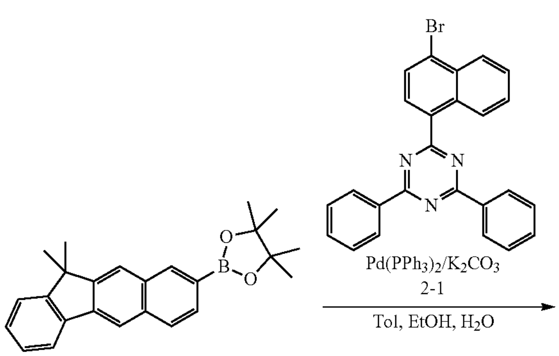

1-1

-continued

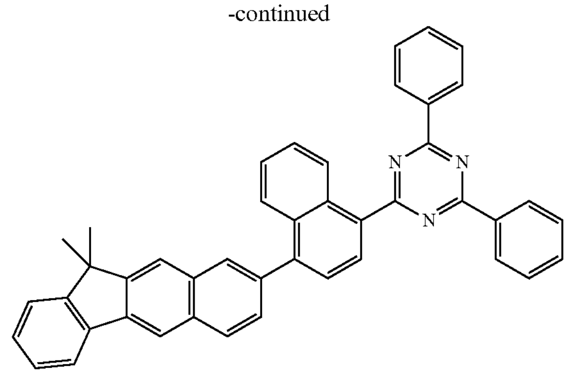

C-533

Compound 1-2 (4.9 g, 15.16 mmol), compound 2-2 (6.0 g, 13.78 mmol), $Pd(PPh_3)_2$ (0.5 g, 0.41 mmol), $Na_2CO_3$ (3.7 g, 34.45 mmol), 69 mL of toluene(Tol), 17 mL of EtOH, and 17 mL of $H_2O$ were added into a flask and dissolved followed by refluxing for 4 hours. After completion of the reaction, the organic layer was extracted with ethyl acetate and was purified by column chromatography to obtain compound C-293 (5.0 g, yield: 66%).

| | MW | M.P |
|---|---|---|
| C-293 | 551.68 | 207° C. |

Hereinafter, the preparation method and the properties of an organic electroluminescent device comprising an organic electroluminescent compound of the present disclosure will be explained in order to understand the present disclosure in detail.

[Device Comparative Example 1] Producing Red-Emitting OLED not According to the Present Disclosure An OLED not according to the present disclosure was produced. First, a transparent electrode indium tin oxide (ITO) thin film (10 Ω/sq) on a glass substrate for an OLED (GEOMATEC CO., LTD., Japan) was subjected to an ultrasonic washing with acetone and isopropylalcohol, sequentially, and then was stored in isopropanol. Next, the ITO substrate was mounted on a substrate holder of a vacuum vapor deposition apparatus. Compound HI-1 was introduced into a cell of the vacuum vapor deposition apparatus, and the pressure in the chamber of the apparatus was then controlled to $10^{-7}$ torr. Thereafter, an electric current was applied to the cell to evaporate the introduced material, thereby forming a first hole injection layer having a thickness of 80 nm on the ITO substrate. Compound HI-2 was then introduced into another cell of the vacuum vapor deposition apparatus, and an electric current was applied to the cell to evaporate the introduced material, thereby forming a second hole injection layer having a thickness of 5 nm on the first hole injection layer. Next, compound HT-1 was introduced into another cell of the vacuum vapor deposition apparatus. Thereafter, an electric current was applied to the cell to evaporate the introduced material, thereby forming a first hole transport layer having a thickness of 10 nm on the second hole injection layer. Next, compound HT-2 was introduced into another cell of the vacuum vapor deposition apparatus. Thereafter, an electric current was applied to the cell to evaporate the introduced material, thereby forming a second hole transport layer having a thickness of 60 nm on the first hole transport layer. After forming the hole injection layers and the hole transport layers, a light-emitting layer was then deposited thereon as follows: The compound CBP as a host was introduced into one cell of the vacuum vapor deposition apparatus and compound D-39 was introduced into another cell as a dopant. The dopant was doped in a doping amount of 3 wt % with respect to the total amount of the host and the dopant to form a light-emitting layer having a thickness of 40 nm on the second hole transport layer. Next, compounds ETL-1 and EIL-1 as electron transport materials were deposited in a weight ratio of 50:50 to form an electron transport layer having a thickness of 35 nm on the light-emitting layer. After depositing compound EIL-1 as an electron injection layer having a thickness of 2 nm on the electron transport layer, an Al cathode having a thickness of 80 nm was deposited on the electron injection layer by another vacuum vapor deposition apparatus. Thus, OLED was produced. Each compound was purified by vacuum sublimation under $10^{-6}$ torr and then used.

[Device Examples 1 and 2] Producing Red-Emitting OLEDs According to the Present Disclosure OLEDs were produced in the same manner as in the Device Comparative Example 1, except that the compounds listed in the following Table 1 as a first and a second host compounds were introduced into one cell of the vacuum vapor deposition apparatus and compound D-39 was introduced into another cell as a dopant. The two host materials were evaporated at a rate of 1:1, at the same time, the dopant was doped in a doping amount of 3 wt % with respect to the total amount of the host and the dopant to form a light-emitting layer having a thickness of 40 nm on the second hole transport layer.

The results of the driving voltage, the luminous efficiency, and CIE color coordinates at a luminance of 1,000 nits and the time taken to reduce from 100% to 95% at a luminance of 5,000 nit (lifespan; T95), of the OLEDs of Device Comparative Example 1 and Device Examples 1 and 2 produced as described above, are shown in the following Table 1.

TABLE 1

| | First Host | Second Host | Driving Voltage (V) | Luminous Efficiency (cd/A) | Color Coordinates (x, y) | | Lifespan (T95, hr) |
|---|---|---|---|---|---|---|---|
| Device Comparative Example 1 | CBP | — | 9.0 | 12.5 | 0.651 | 0.342 | 0.24 |
| Device Example 1 | H-1 | C-172 | 3.1 | 31.1 | 0.658 | 0.341 | 230 |
| Device Example 2 | H-1 | C-11 | 2.8 | 31.4 | 0.659 | 0.340 | 405 |

From Table 1 above, it is confirmed that the organic electroluminescent device comprising the organic electroluminescent compound according to the present disclosure as host materials has low driving voltage, high luminous efficiency, and high lifespan characteristics than the organic electroluminescent device comprising the conventional host compound.

The compounds used in Device Comparative Example 1 and Device Examples 1 and 2 are shown specifically in Table 2 below.

TABLE 2

Hole Injection Layer/ Hole Transport Layer

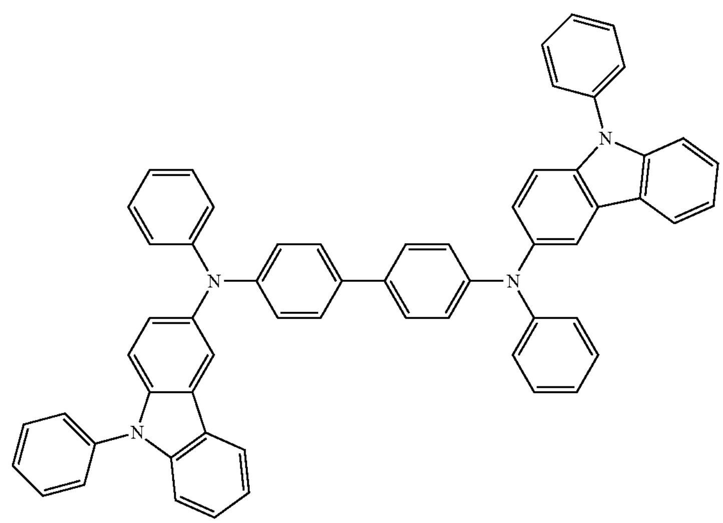 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1]

HI-1

TABLE 2-continued
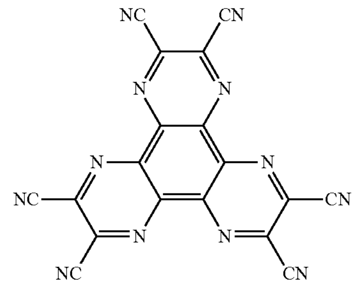 [SMILES: N#Cc1nc2c3nc(C#N)c(C#N)nc3c3nc(C#N)c(C#N)nc3c2nc1C#N]
HI-2
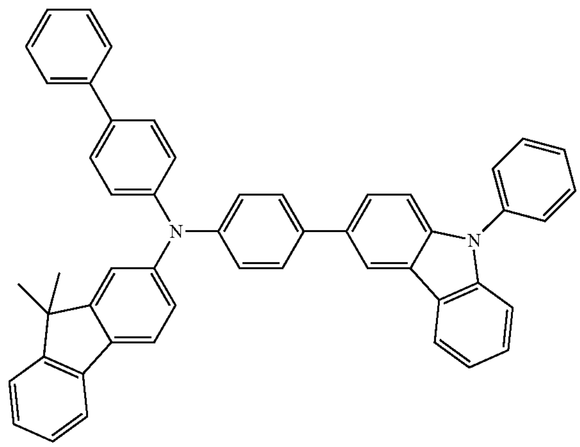 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]
HT-1
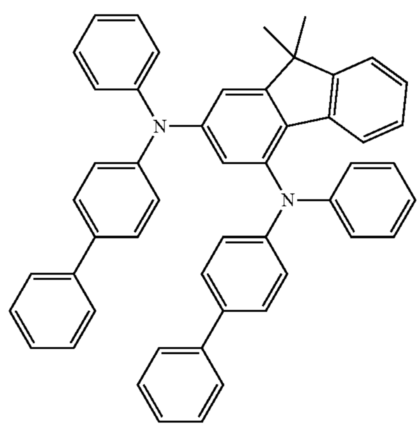 [SMILES: CC1(C)c2ccccc2-c2c(N(c3ccccc3)c3ccc(-c4ccccc4)cc3)cc(N(c3ccccc3)c3ccc(-c4ccccc4)cc3)cc21]
HT-2

TABLE 2-continued
Light-Emitting Layer
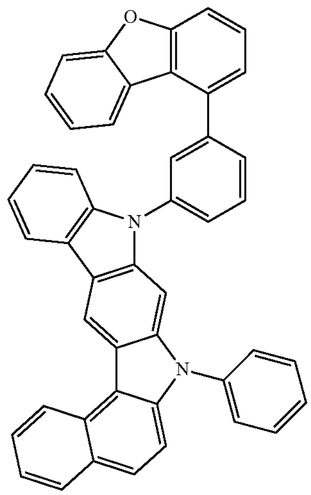 [SMILES: c1ccc(-n2c3cc4c(cc3c3c5ccccc5ccc32)c2ccccc2n4-c2cccc(-c3cccc4oc5ccccc5c34)c2)cc1]
H-1
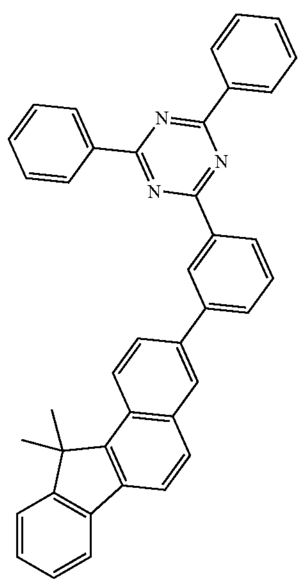 [SMILES: CC1(C)c2ccccc2-c2ccc3cc(-c4cccc(-c5nc(-c6ccccc6)nc(-c6ccccc6)n5)c4)ccc3c21]
C-172

TABLE 2-continued
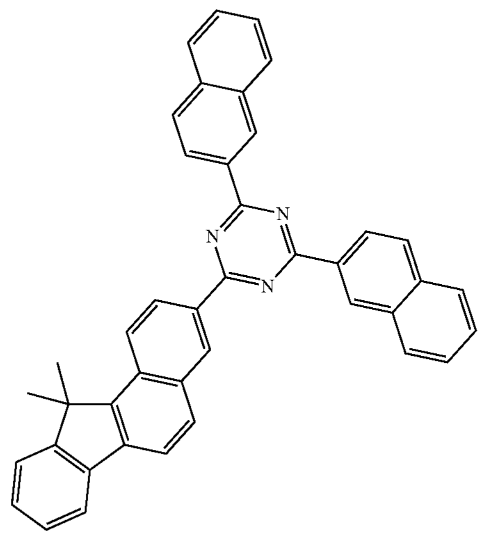 [SMILES: CC1(C)c2ccccc2-c2ccc3cc(-c4nc(-c5ccc6ccccc6c5)nc(-c5ccc6ccccc6c5)n4)ccc3c21]
C-11
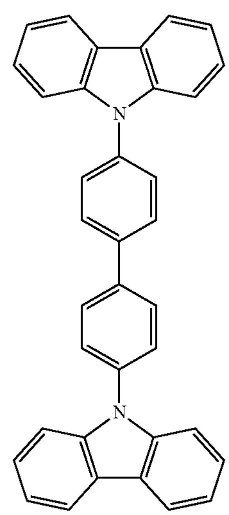 [SMILES: c1ccc2c(c1)c1ccccc1n2-c1ccc(-c2ccc(-n3c4ccccc4c4ccccc43)cc2)cc1]
CBP
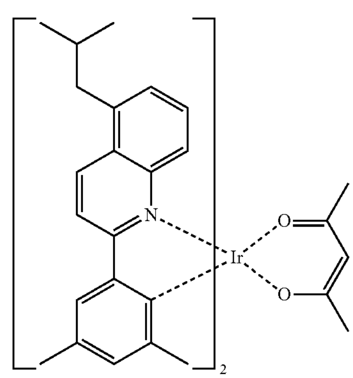
D-39

TABLE 2-continued

| | |
|---|---|
| Electron Transport Layer/ Electron Injection Layer | 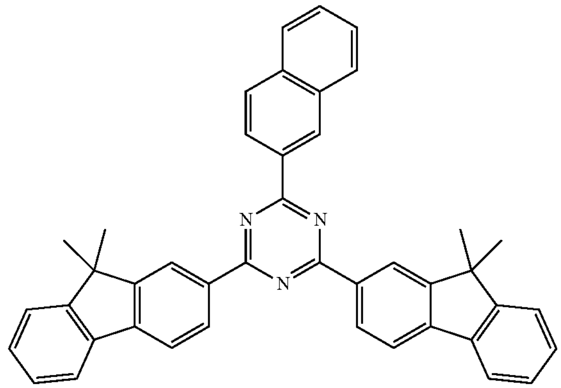 [SMILES: CC1(C)c2ccccc2-c2ccc(-c3nc(-c4ccc5c(c4)C(C)(C)c4ccccc4-5)nc(-c4ccc5ccccc5c4)n3)cc21] ETL-1 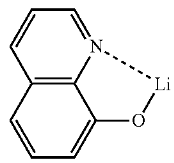 EIL-1 |

[Device Comparative Example 2] Producing OLED not According to the Present Disclosure An OLED not according to the present disclosure was produced. First, a transparent electrode indium tin oxide (ITO) thin film (10 Ω/sq) on a glass substrate for an OLED (GEOMATEC CO., LTD., Japan) was subjected to an ultrasonic washing with acetone, ethanol, and distilled water, sequentially, and then was stored in isopropanol. Next, the ITO substrate was mounted on a substrate holder of a vacuum vapor deposition apparatus after the pressure in the chamber of the apparatus was then controlled to $10^{-7}$ torr. Next, compound HT-1 as a hole transport compound was introduced into a cell of the vacuum vapor deposition apparatus, and compound HI-3 was introduced into another cell as a hole injection compound. Thereafter, the two materials were evaporated at a different rate, and the hole injection compound was doped in a doping amount of 3 wt % with respect to the total amount of the hole injection compound and the hole transport compound, to form a hole injection layer having a thickness of 10 nm. Next, compound HT-1 was introduced into another cell of the vacuum vapor deposition apparatus. Thereafter, an electric current was applied to the cell to evaporate the introduced material, thereby forming a first hole transport layer having a thickness of 75 nm on the hole injection layer. Next, compound HT-3 was introduced into another cell of the vacuum vapor deposition apparatus. Thereafter, an electric current was applied to the cell to evaporate the introduced material, thereby forming a second hole transport layer having a thickness of 5 nm on the first hole transport layer. After forming the hole injection layers and the hole transport layers, a light-emitting layer was then deposited thereon as follows: The compound BH-1 as a host was introduced into one cell of the vacuum vapor deposition apparatus and compound BD was introduced into another cell as a dopant. The dopant was doped in a doping amount of 2 wt % with respect to the total amount of the host and the dopant to form a light-emitting layer having a thickness of 20 nm on the second hole transport layer. Next, compound A-1 as a hole blocking layer material was deposited to form a hole blocking layer having a thickness of 5 nm. Next, compounds ETL-1 and EIL-1 were evaporated at a rate of 1:1 to form an electron transport layer having a thickness of 30 nm on the hole blocking layer. After depositing compound EIL-1 as an electron injection layer having a thickness of 2 nm, an Al cathode having a thickness of 80 nm was deposited on the electron injection layer by another vacuum vapor deposition apparatus. Thus, OLED was produced.

As a result, the time taken to reduce from 100% to 95% at a luminance of 1,400 nits, of the OLED according to Device Comparative Example 2 produced as described above, is 22 hours.

[Device Comparative Example 3] Producing OLED not According to the Present Disclosure OLED was produced in the same manner as in the Device Comparative Example 2, except that compound A-2 was used as the hole blocking layer material.

As a result, the time taken to reduce from 100% to 95% at a luminance of 1,400 nits, of the OLED according to Device Comparative Example 3 produced as described above, is 25 hours.

[Device Example 3] Producing OLED According to the Present Disclosure

OLED was produced in the same manner as in the Device Comparative Example 2, except that compound C-172 was used as the hole blocking layer material.

As a result, the time taken to reduce from 100% to 95% at a luminance of 1,400 nits, of the OLED according to Device Example 3 produced as described above, is 55 hours.

[Device Example 4] Producing OLED According to the Present Disclosure

OLED was produced in the same manner as in the Device Comparative Example 2, except that compound C-533 was used as the hole blocking layer material.

As a result, the time taken to reduce from 100% to 95% at a luminance of 1,400 nits, of the OLED according to Device Example 4 produced as described above, is 134 hours.

[Device Example 5] Producing OLED According to the Present Disclosure

OLED was produced in the same manner as in the Device Comparative Example 2, except that compound C-293 was used as the hole blocking layer material.

As a result, the time taken to reduce from 100% to 95% at a luminance of 1,400 nits, of the OLED according to Device Example 5 produced as described above, is 55 hours.

The compounds used in Device Comparative Examples 2 and 3 and Device Examples 3 to 5 are shown specifically in Table 3 below.

TABLE 3

Hole Injection Layer/ Hole Transport Layer

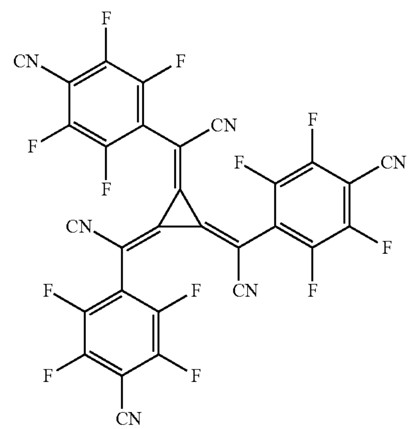

HI-3

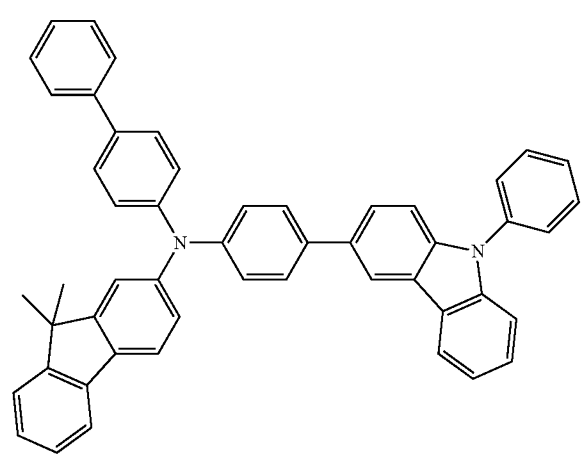 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

HT-1

TABLE 3-continued
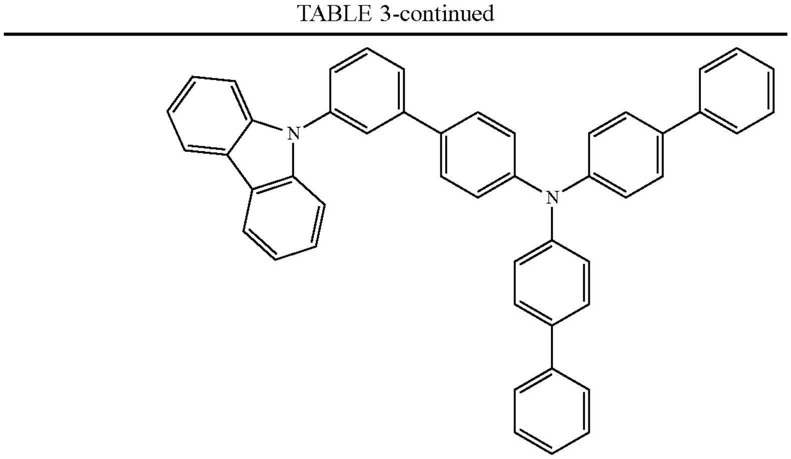
HT-3
Light-Emitting Layer
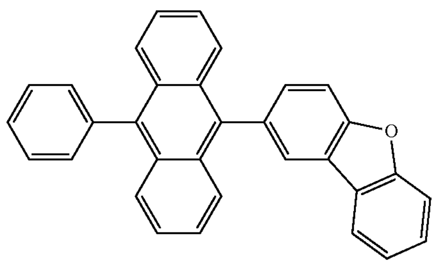 [SMILES: c1ccc(-c2c3ccccc3c(-c3ccc4oc5ccccc5c4c3)c3ccccc23)cc1]
BH-1
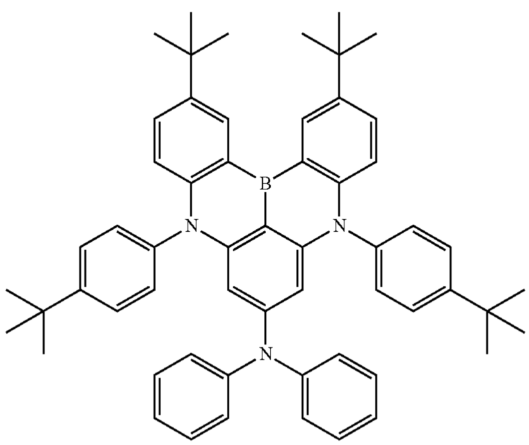 [SMILES: CC(C)(C)c1ccc(N2c3ccc(C(C)(C)C)cc3B3c4cc(C(C)(C)C)ccc4N(c4ccc(C(C)(C)C)cc4)c4cc(N(c5ccccc5)c5ccccc5)cc2c43)cc1]
BD
Hole Blocking layer/ Electron Transport Layer/ Electron Injection Layer
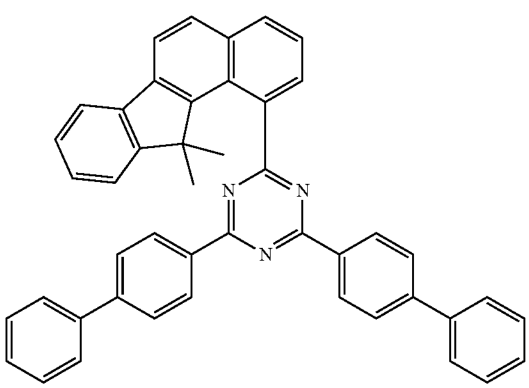 [SMILES: CC1(C)c2ccccc2-c2ccc3cccc(-c4nc(-c5ccc(-c6ccccc6)cc5)nc(-c5ccc(-c6ccccc6)cc5)n4)c3c21]

TABLE 3-continued
A-1
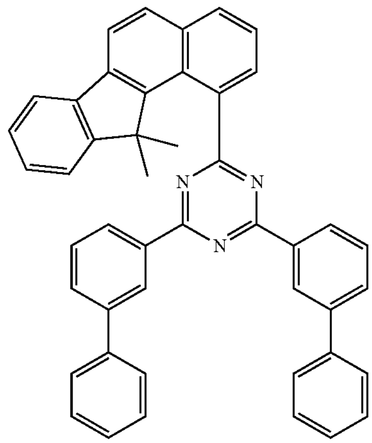 [SMILES: CC1(C)c2ccccc2-c2ccc3cccc(-c4nc(-c5cccc(-c6ccccc6)c5)nc(-c5cccc(-c6ccccc6)c5)n4)c3c21]
A-2
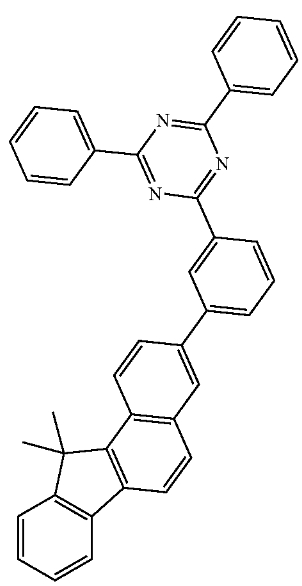 [SMILES: CC1(C)c2ccccc2-c2ccc3cc(-c4cccc(-c5nc(-c6ccccc6)nc(-c6ccccc6)n5)c4)ccc3c21]
C-172

TABLE 3-continued
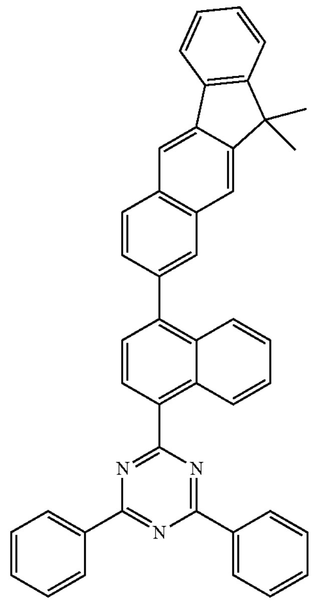 [SMILES: CC1(C)c2ccccc2-c2cc3ccc(-c4ccc(-c5nc(-c6ccccc6)nc(-c6ccccc6)n5)c5ccccc45)cc3cc21]
C-533
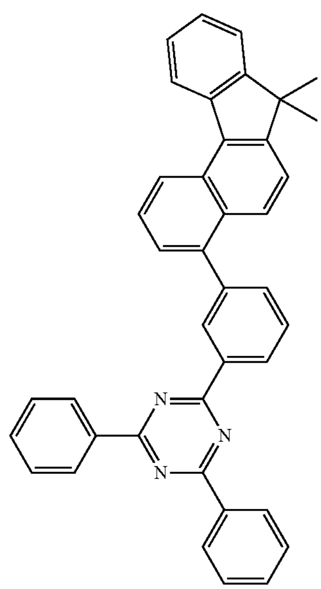 [SMILES: CC1(C)c2ccccc2-c2c1ccc1c(-c3cccc(-c4nc(-c5ccccc5)nc(-c5ccccc5)n4)c3)cccc21]
C-293

TABLE 3-continued

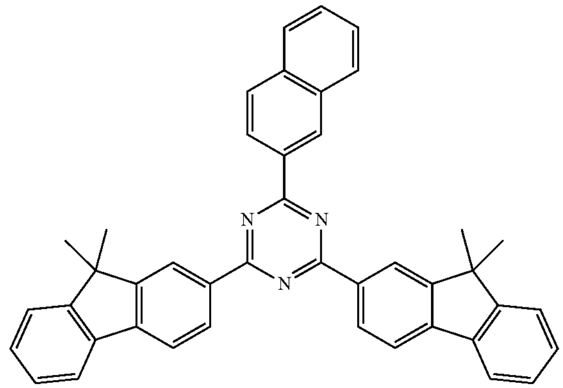 [SMILES: CC1(C)c2ccccc2-c2ccc(-c3nc(-c4ccc5c(c4)C(C)(C)c4ccccc4-5)nc(-c4ccc5ccccc5c4)n3)cc21]

ETL-1

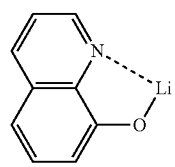

EIL-1

[Device Comparative Example 4] Producing OLED not According to the Present Disclosure An OLED not according to the present disclosure was produced. First, a transparent electrode indium tin oxide (ITO) thin film (10 Ω/sq) on a glass substrate for an OLED (GEOMATEC CO., LTD., Japan) was subjected to an ultrasonic washing with acetone, ethanol, and distilled water, sequentially, and then was stored in isopropanol. Next, the ITO substrate was mounted on a substrate holder of a vacuum vapor deposition apparatus after the pressure in the chamber of the apparatus was then controlled to $10^{-7}$ torr. Next, compound HT-1 as a hole transport compound was introduced into a cell of the vacuum vapor deposition apparatus, and compound HI-3 was introduced into another cell as a hole injection compound. Thereafter, the two materials were evaporated at different rate, and the hole injection compound was doped in a doping amount of 3 wt % with respect to the total amount of the hole injection compound and the hole transport compound, to form a hole injection layer having a thickness of 10 nm. Next, compound HT-1 was introduced into another cell of the vacuum vapor deposition apparatus. Thereafter, an electric current was applied to the cell to evaporate the introduced material, thereby forming a first hole transport layer having a thickness of 70 nm on the hole injection layer. Next, compound HT-4 was introduced into another cell of the vacuum vapor deposition apparatus. Thereafter, an electric current was applied to the cell to evaporate the introduced material, thereby forming a second hole transport layer having a thickness of 5 nm on the first hole transport layer. After forming the hole injection layers and the hole transport layers, a light-emitting layer was then deposited thereon as follows: The compound BH-2 as a host was introduced into one cell of the vacuum vapor deposition apparatus and compound BD-1 was introduced into another cell as a dopant. The dopant was doped in a doping amount of 3 wt % with respect to the total amount of the host and the dopant to form a light-emitting layer having a thickness of 20 nm on the second hole transport layer. Next, compound HB-1 as a hole blocking layer material was deposited to form a hole blocking layer having a thickness of 5 nm. Next, compounds A-2 and EIL-1 were evaporated in two different cells at a rate of 1:1 to form an electron transport layer having a thickness of 30 nm on the hole blocking layer. After depositing compound EIL-1 as an electron injection layer having a thickness of 2 nm, an Al cathode having a thickness of 80 nm was deposited on the electron injection layer by another vacuum vapor deposition apparatus. Thus, OLED was produced.

As a result, the time taken to reduce from 100% to 90% at a luminance of 2,390 nits, of the OLED according to Device Comparative Example 4 produced as described above, is 9.4 hours.

[Device Example 6] Producing OLED According to the Present Disclosure

OLED was produced in the same manner as in the Device Comparative Example 4, except that compound C-533 was used as the electron transport layer material.

As a result, the time taken to reduce from 100% to 90% at a luminance of 2,390 nits, of the OLED according to Device Example 6 produced as described above, is 20.5 hours.

The compounds used in Device Comparative Example 4 and Device Example 6 are shown specifically in Table 4 below.

TABLE 4
Hole Injection Layer/ Hole Transport Layer
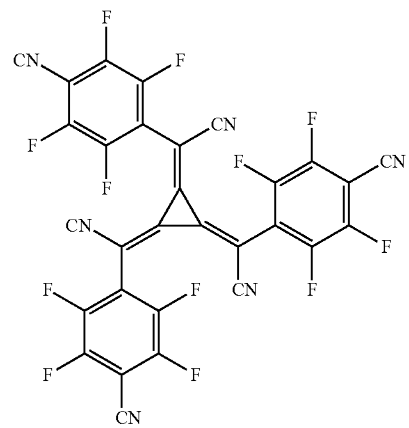
HI-3
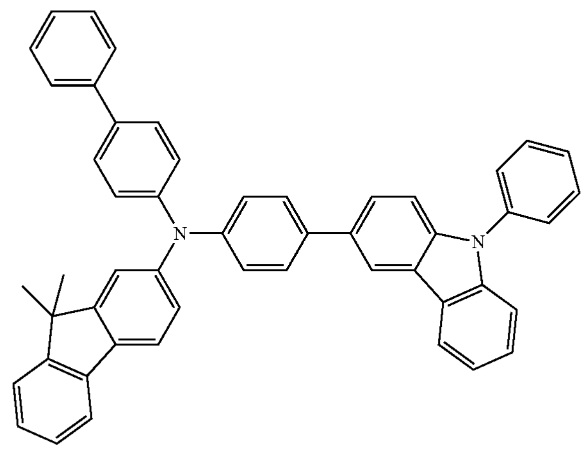 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]
HT-1
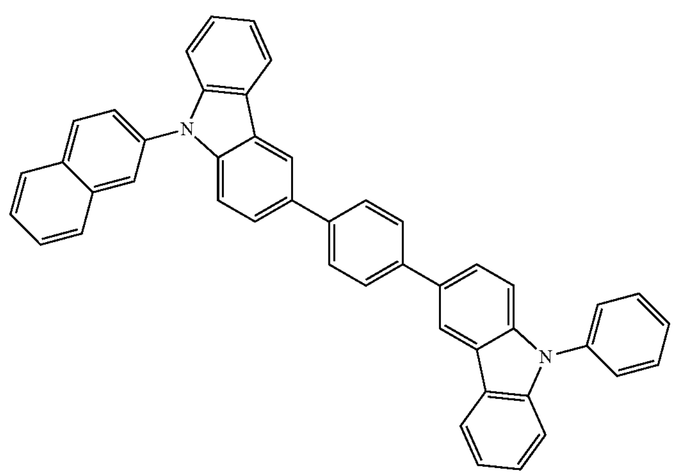 [SMILES: c1ccc(-n2c3ccccc3c3cc(-c4ccc(-c5ccc6c(c5)c5ccccc5n6-c5ccc6ccccc6c5)cc4)ccc32)cc1]
HT-4

TABLE 4-continued
| | |
|---|---|
| Light-Emitting Layer | 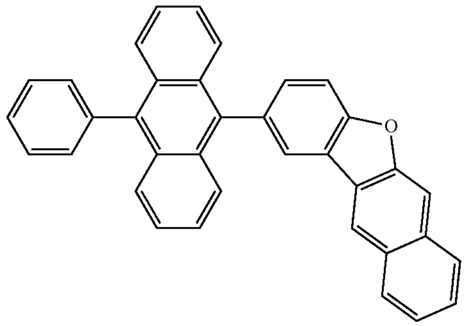 [SMILES: c1ccc(-c2c3ccccc3c(-c3ccc4oc5cc6ccccc6cc5c4c3)c3ccccc23)cc1] BH-2 |
| | 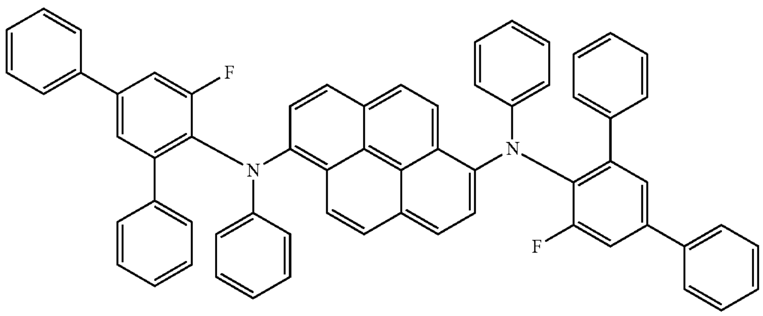 [SMILES: Fc1cc(-c2ccccc2)cc(-c2ccccc2)c1N(c1ccccc1)c1ccc2ccc3c(N(c4ccccc4)c4c(F)cc(-c5ccccc5)cc4-c4ccccc4)ccc4ccc1c2c43] BD-1 |
| Hole Blocking layer/ Electron Transport Layer/ Electron Injection Layer | 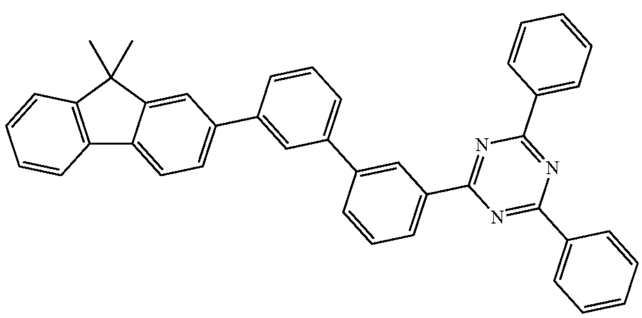 [SMILES: CC1(C)c2ccccc2-c2ccc(-c3cccc(-c4cccc(-c5nc(-c6ccccc6)nc(-c6ccccc6)n5)c4)c3)cc21] HB-1 |
| | 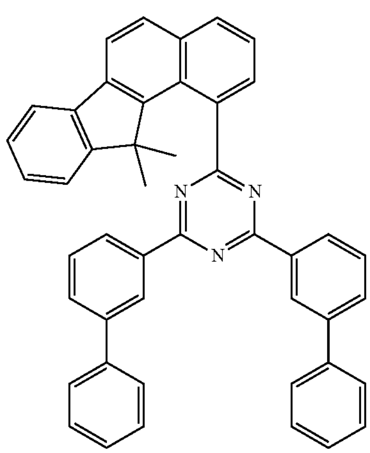 [SMILES: CC1(C)c2ccccc2-c2ccc3cccc(-c4nc(-c5cccc(-c6ccccc6)c5)nc(-c5cccc(-c6ccccc6)c5)n4)c3c21] A-2 |

TABLE 4-continued

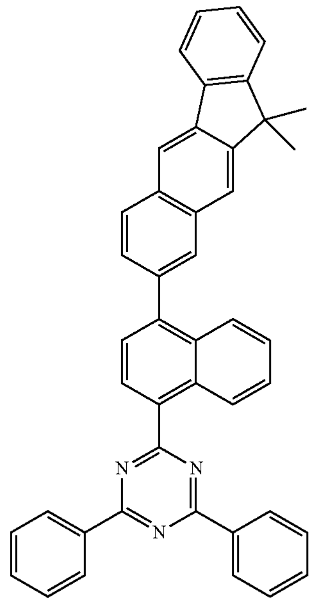 [SMILES: CC1(C)c2ccccc2-c2cc3ccc(-c4ccc(-c5nc(-c6ccccc6)nc(-c6ccccc6)n5)c5ccccc45)cc3cc21]

C-533

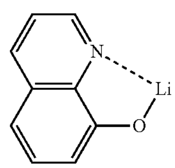

EIL-1

The invention claimed is:

1. A plurality of host materials comprising at least one first host material comprising an organic electroluminescent compound represented by the following formula 1-1 or 1-2 and at least one second host material, which is different from the first host material, wherein the second host material comprises the compound represented by the following formula 100:

(1-1)

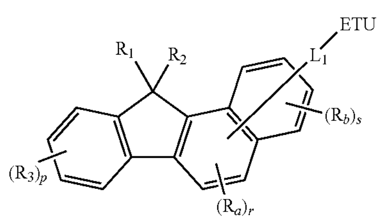

(1-2)

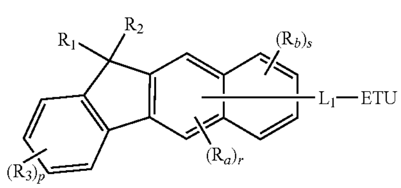

-continued (1-3)

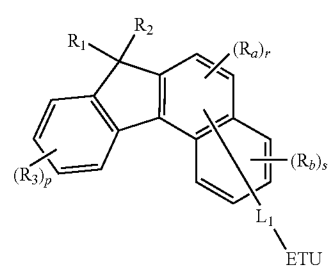

wherein, $R_1$ and $R_2$ each independently represent hydrogen, deuterium, a substituted or unsubstituted (C1-C30)alkyl, a substituted or unsubstituted (C6-C30)aryl, a substituted or unsubstituted (C3-C30)heteroaryl, or a substituted or unsubstituted (C3-C30)cycloalkyl; or may be linked to an adjacent substituent to form a ring;

$R_3$, $R_a$ and $R_b$ each independently represent hydrogen, deuterium, halogen, cyano, a substituted or unsubstituted (C1-C30)alkyl, a substituted or unsubstituted (C6-C30)aryl, a substituted or unsubstituted (C3-C30) heteroaryl where the (C3-C30)heteroaryl group is selected from the group consisting of furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, benzofuranyl, benzothiophenyl, isobenzofuranyl, dibenzofuranyl, dibenzothiophenyl, benzoimidazolyl, benzothiazolyl, benzoisothiazolyl, benzoisoxazolyl, benzoxazolyl, imidazopyridinyl, isoindolyl, indolyl, benzoindolyl, indazolyl, benzothiadiazolyl, quinolyl, isoquinolyl, cinnolinyl, quinazolinyl, quinoxalinyl, carbazolyl, azacarbazolyl, benzocarbazolyl, dibenzocarbazolyl, phenoxazinyl, phenanthridinyl, benzodioxolyl, indolizidinyl, acrylidinyl, silafluorenyl and germafluorenyl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

$L_1$ represents a single bond, a substituted or unsubstituted (C6-C30)arylene, a substituted or unsubstituted (3- to 30-membered)heteroarylene, or a substituted or unsubstituted (C3-C30)cycloalkylene;

ETU is selected from any one of the substituents listed in the following Group 1;

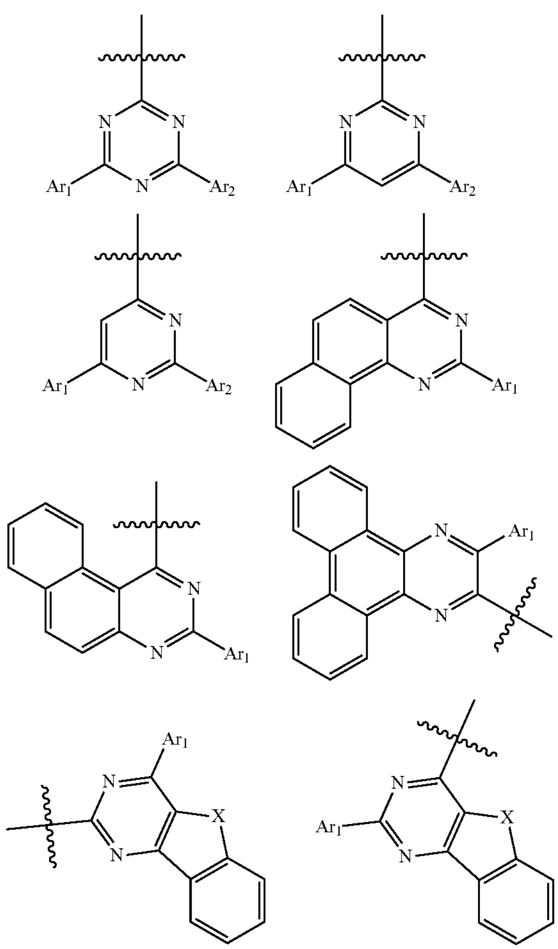

-continued

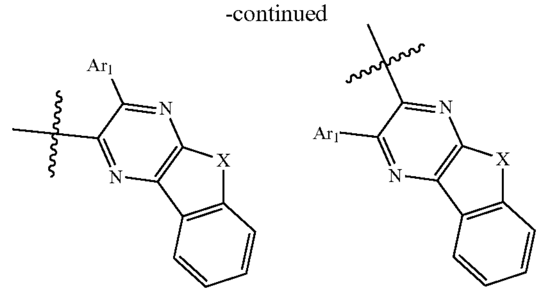

$Ar_1$ and $Ar_2$ each independently represent a substituted or unsubstituted (C6-C30)aryl or a substituted or unsubstituted (C3-C30)heteroaryl X represents $CR_{11}R_{12}$, O, or S;

$R_{11}$ and $R_{12}$ each independently represent hydrogen, deuterium, a substituted or unsubstituted (C1-C30)alkyl, a substituted or unsubstituted (C6-C30)aryl, a substituted or unsubstituted C3-C30)heteroaryl, or a substituted or unsubstituted (C3-C30)cycloalkyl; or may be linked to an adjacent substituent to form a ring;

p represents an integer of 1 to 4, and when p is 2 or more, each $R_3$ may be the same or different;

r represents an integer of 1 or 2, when r is 2, each $R_a$ may be the same or different;

s represents an integer of 1 to 4, when s is 2 or more, each $R_b$ may be the same or different; and with the proviso that the compounds represented by the following formulas I-1 to I-3:

(I-1)

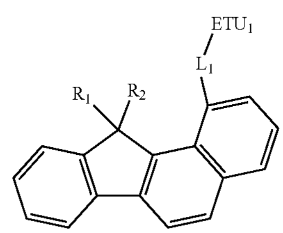

(I-2)

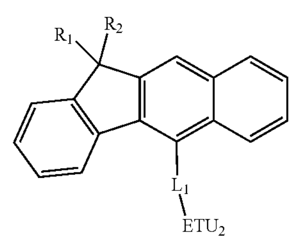

(I-3)

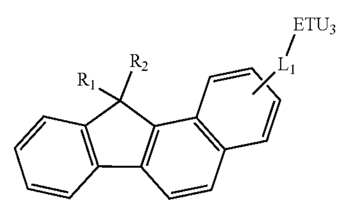

wherein, $R_1$, $R_2$, and $L_1$ are as defined in formula 1-1 and 1-2;

$ETU_1$ to $ETU_3$ are as defined as ETU in formula 1-1 and 1-2;

at least one of $L_1$ and $ETU_1$ include(s) triazine structure in formula I-1;

at least one of $L_1$ and $ETU_2$ include(s) pyridine structure, pyrimidine structure, or triazine structure in formula I-2; and at least one of $L_1$ and $ETU_3$ include quinazoline structure in formula I-3, are excluded:

(100)

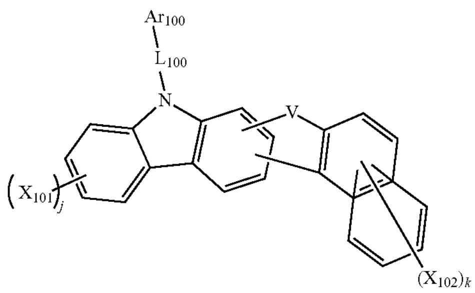

wherein,

V represents $CX_{11}X_{12}$, $NX_{13}$, O or S;

$L_{100}$ represents a single bond, a substituted or unsubstituted (C6-C30)arylene, or a substituted or unsubstituted (C3-C30)heteroarylene;

$Ar_{100}$ represents a substituted or unsubstituted (C6-C30) aryl, a substituted or unsubstituted (C3-C30)heteroaryl, or $-NX_9X_{10}$;

$X_9$ and $X_{10}$ each independently represent a substituted or unsubstituted (C1-C30)alkyl, a substituted or unsubstituted (C3-C30)cycloalkyl, a substituted or unsubstituted (C6-C30)aryl, or a substituted or unsubstituted (C3-C30)heteroaryl;

$X_{11}$ to $X_{13}$, $X_{101}$ and $X_{102}$ each independently represent hydrogen, deuterium, halogen, cyano, a substituted or unsubstituted (C1-C30)alkyl, a substituted or unsubstituted (C6-C30)aryl, a substituted or unsubstituted (C3-C30)heteroaryl, a substituted or unsubstituted (C3-C30)cycloalkyl, a substituted or unsubstituted (C1-C30)alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C2-C30) alkenylamino, a substituted or unsubstituted (C1-C30) alkyl(C2-C30)alkenylamino, a substituted or unsubstituted mono- or di-(C6-C30)arylamino, a substituted or unsubstituted (C1-C30)alkyl(C6-C30)arylamino, a substituted or unsubstituted (C2-C30)alkenyl (C6-C30)arylamino, a substituted or unsubstituted mono- or di-(C3-C30)heteroarylamino, a substituted or unsubstituted (C1-C30)alkyl(C3-C30)heteroarylamino, a substituted or unsubstituted (C2-C30)alkenyl(C3-C30)heteroarylamino, or a substituted or unsubstituted (C6-C30)aryl(C3-C30)heteroarylamino; and j represents an integer of 1 to 4, k represents an integer of 1 to 6, and when j and k are 2 or more, each $X_{101}$ and each $X_{102}$ may be the same or different.

2. The plurality of host materials according to claim 1, wherein $Ar_1$ and $Ar_2$ each independently are selected from any one of the substituents listed in the following Group 2.

[Group 2]

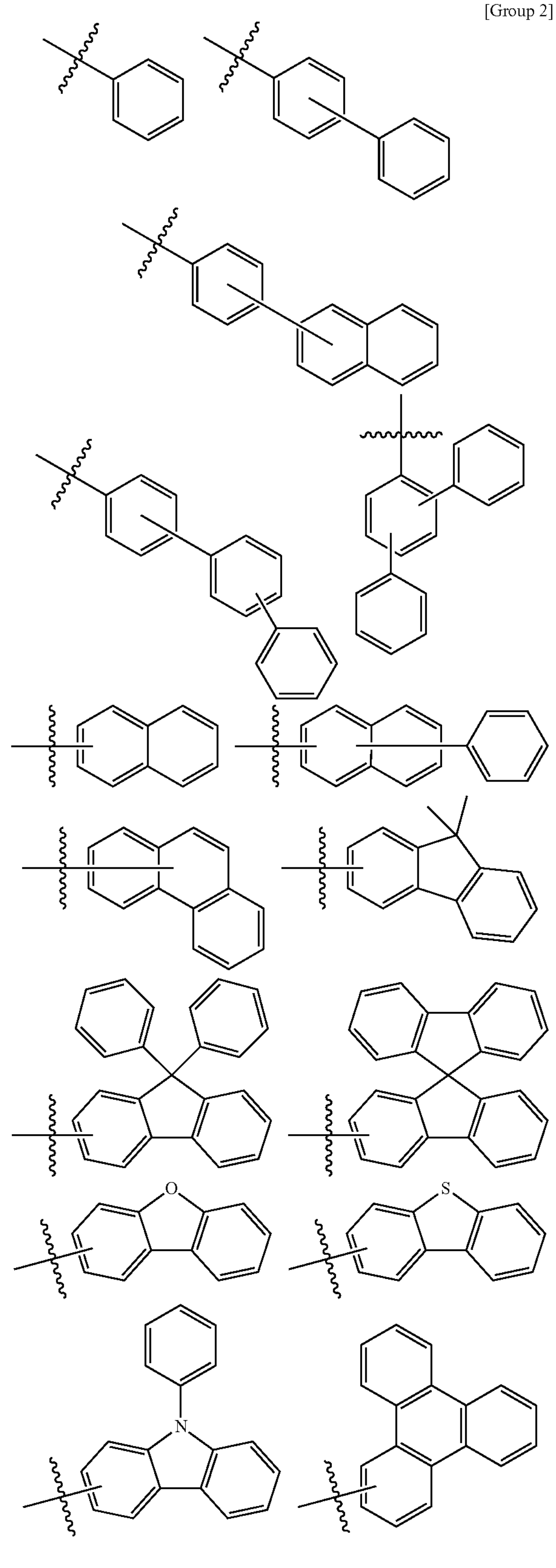

3. The plurality of host materials according to claim 1, wherein the compound represented by formula 1-1 or 1-2 is selected from the group consisting of:

C-1
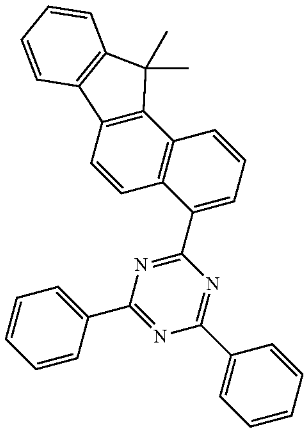
C-2
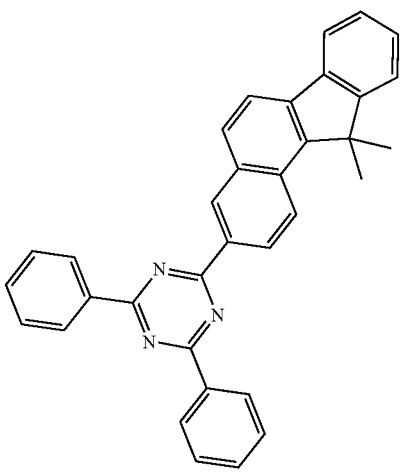
C-3
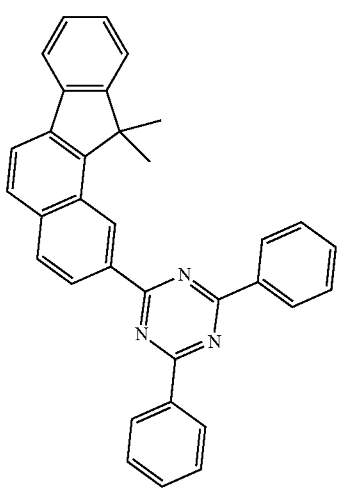
-continued
C-4
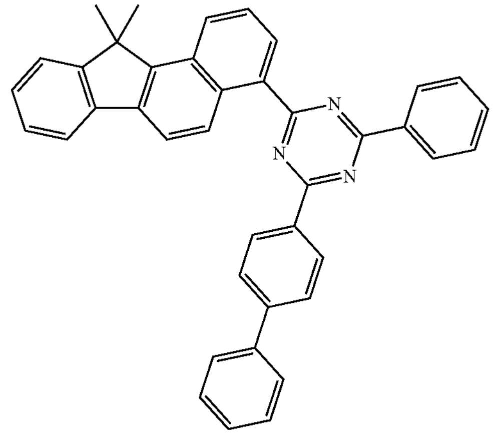
C-5
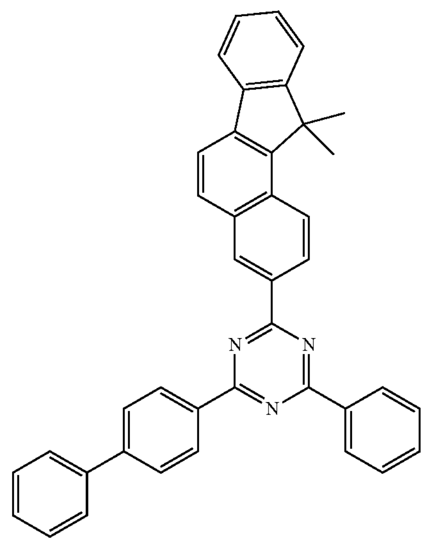
C-6
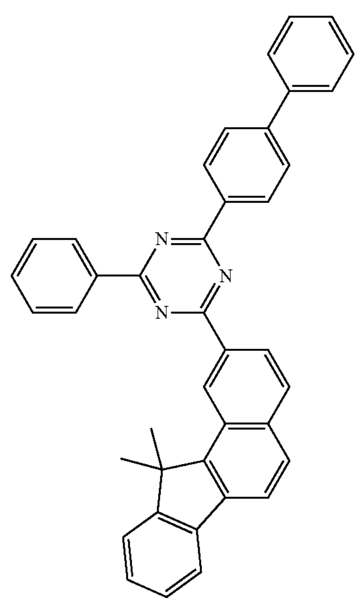

C-7
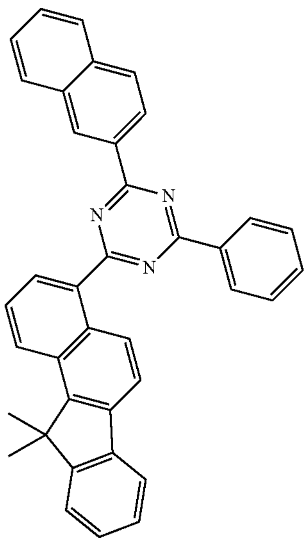
C-8
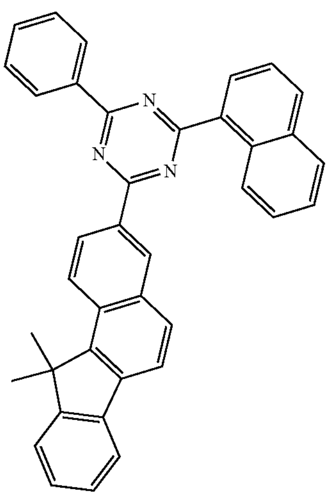
C-9
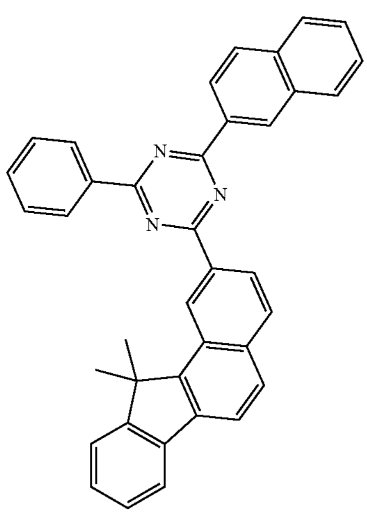
C-10
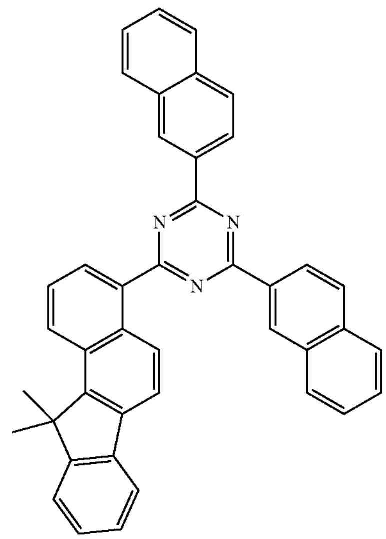
C-11
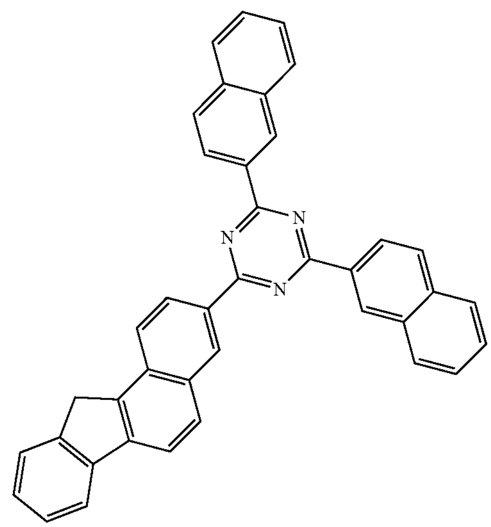
C-12
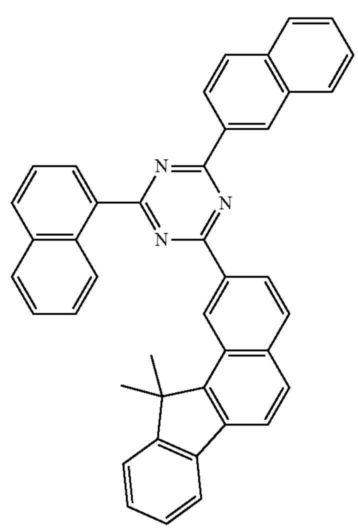

-continued
C-13
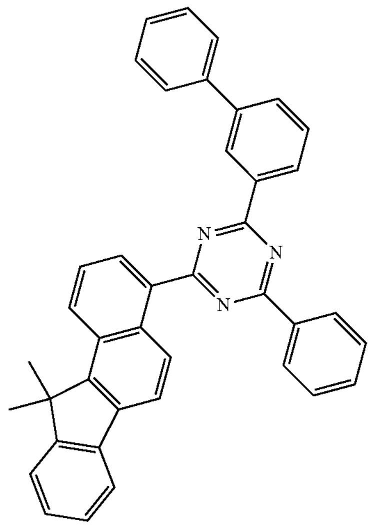
C-14
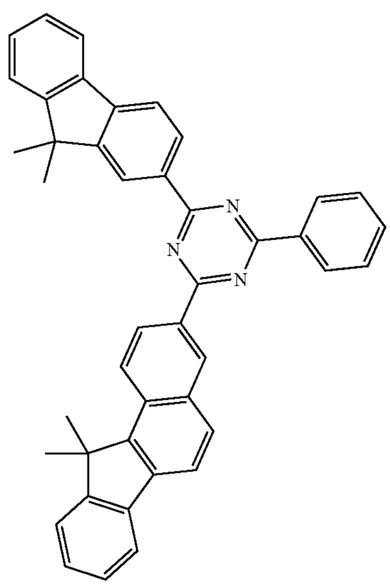
C-15
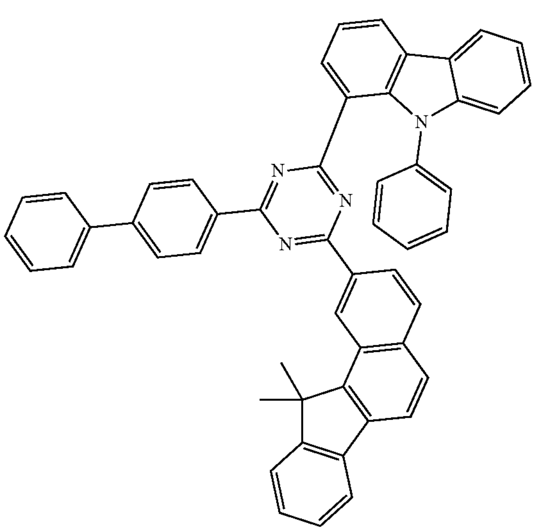
-continued
C-16
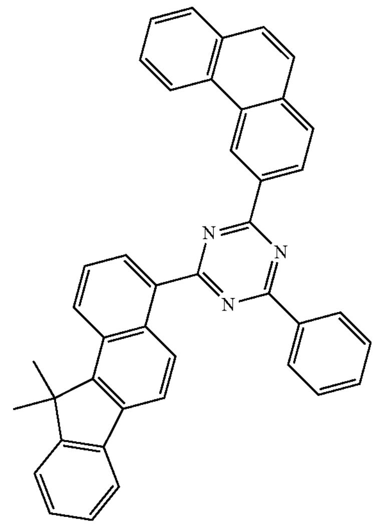
C-17
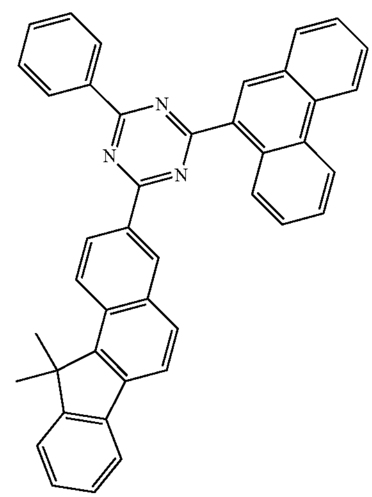
C-18
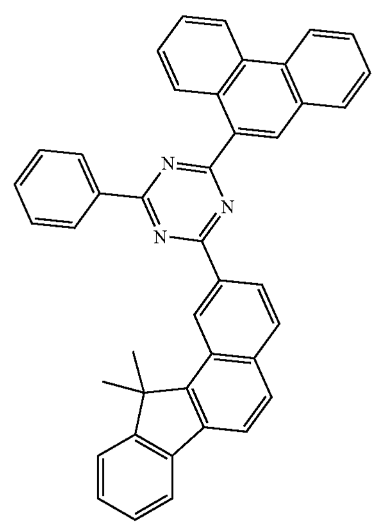

-continued
C-19
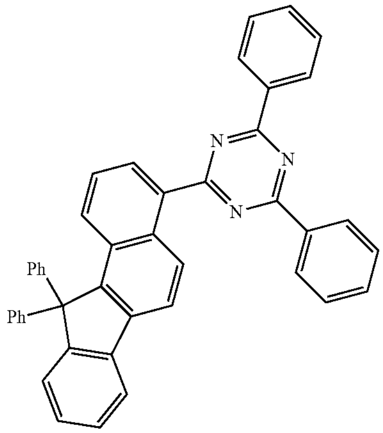
C-20
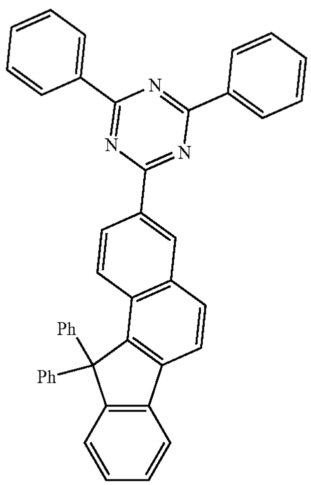
C-21
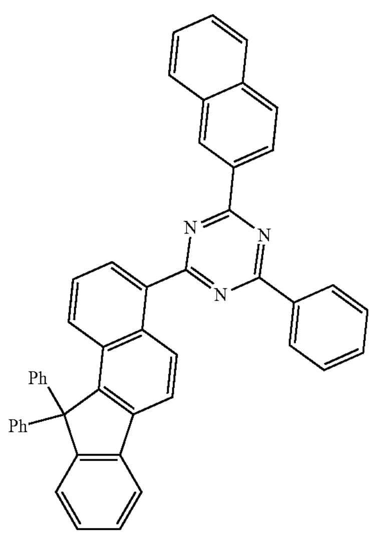
-continued
C-22
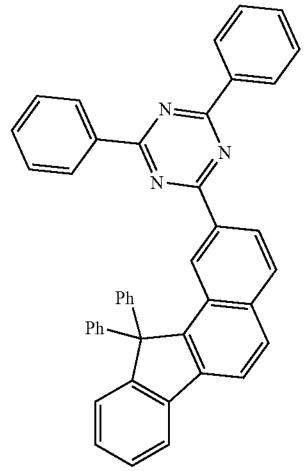
C-23
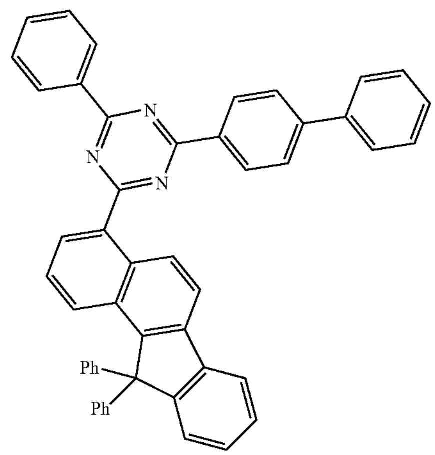
C-24
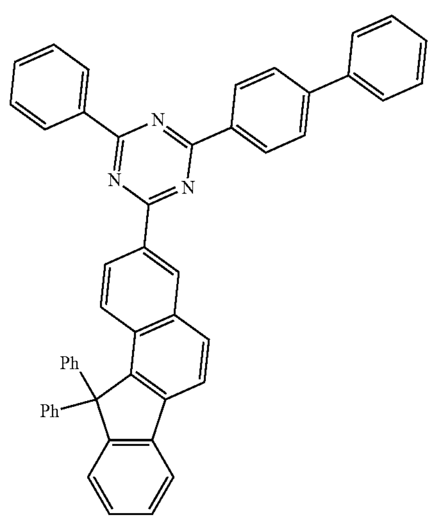

-continued
C-25
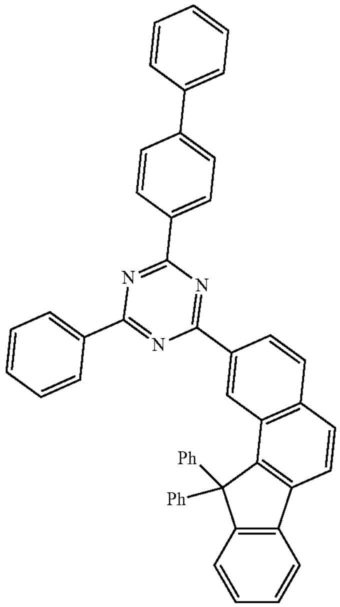
C-26
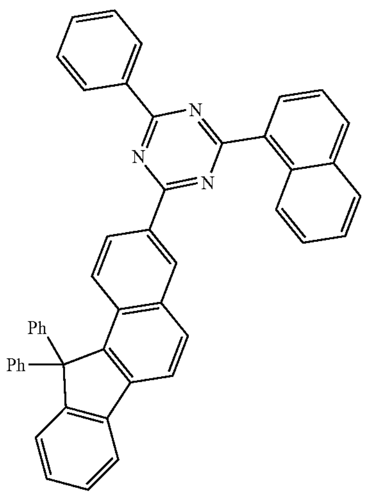
C-27
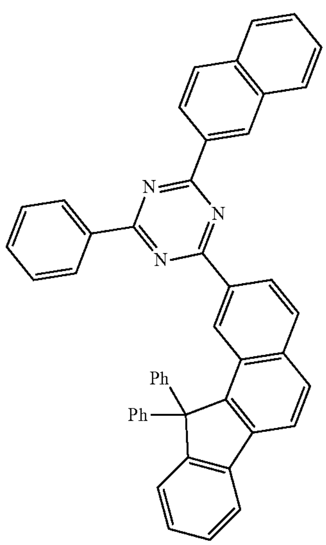
-continued
C-28
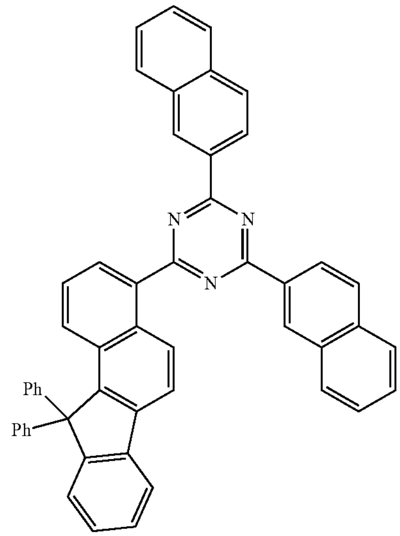
C-29
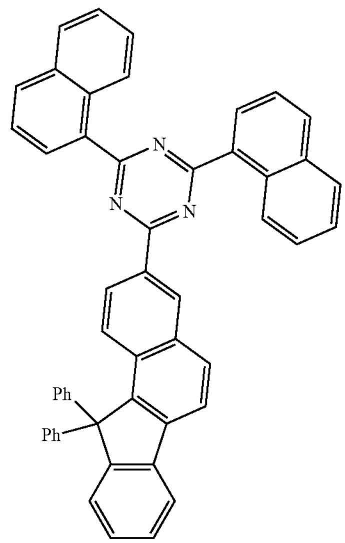
C-30
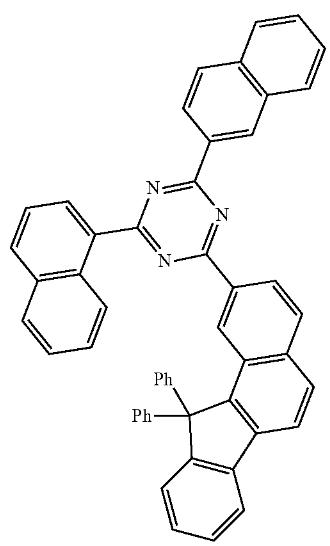

-continued
C-31
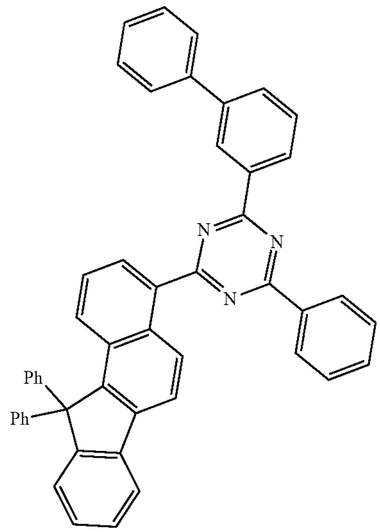
C-32
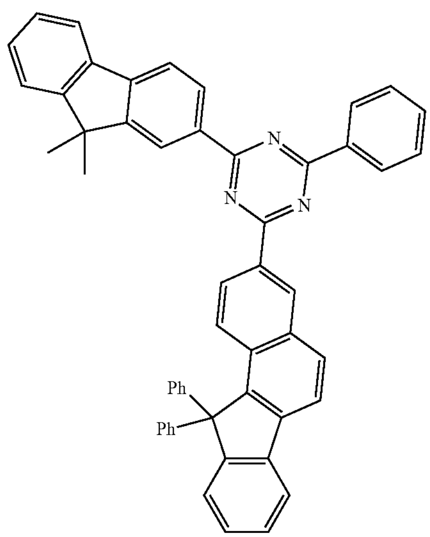
C-33
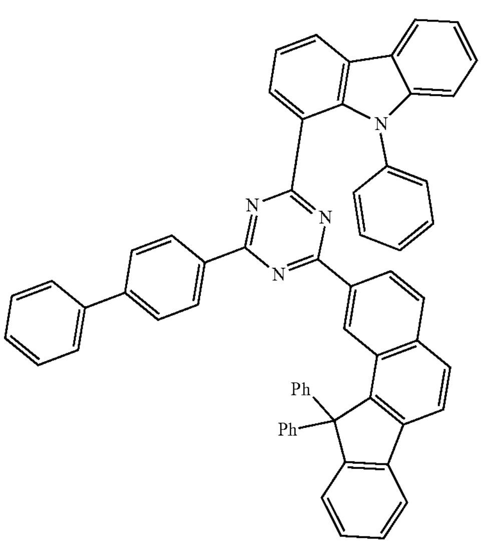
-continued
C-34
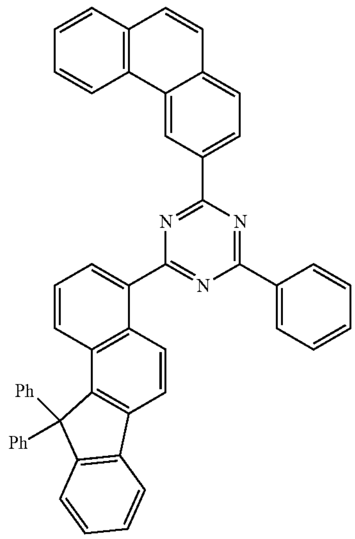
C-35
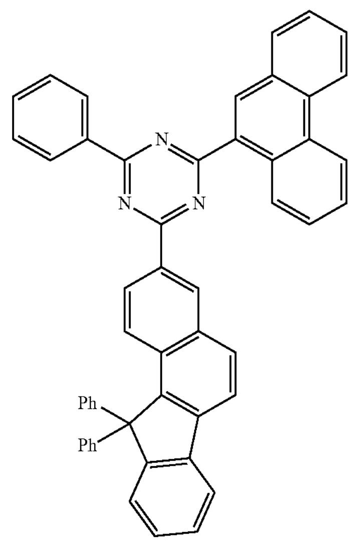
C-36
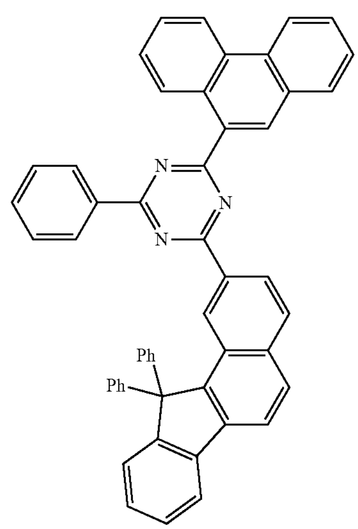

C-37
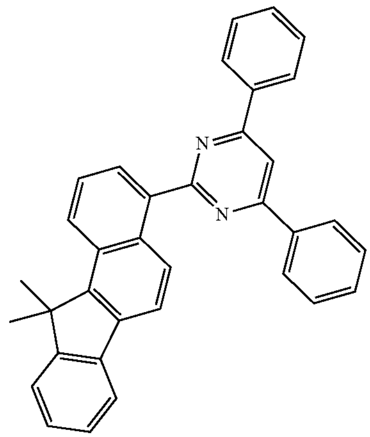
C-38
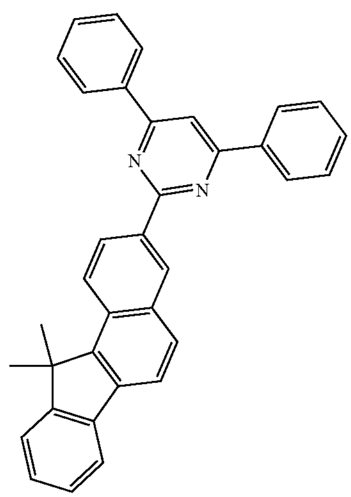
C-39
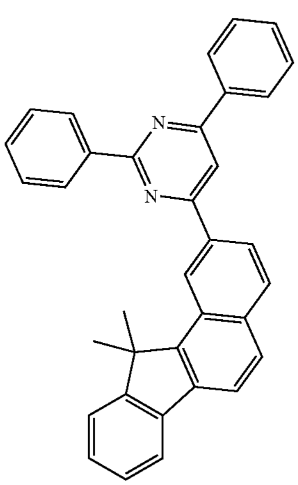
C-40
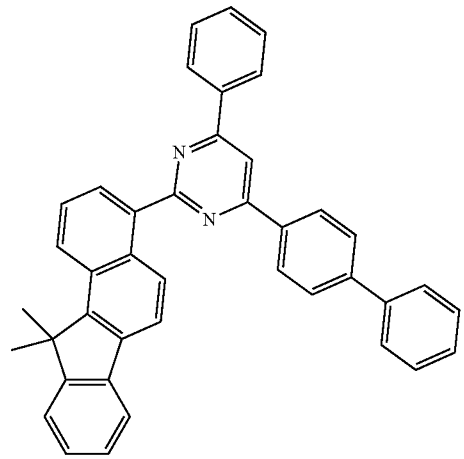
C-41
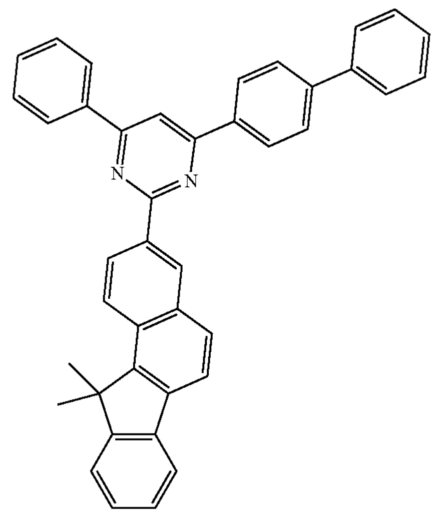
C-42
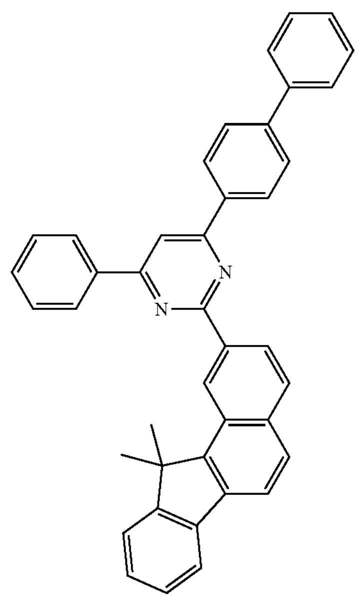

-continued
C-43
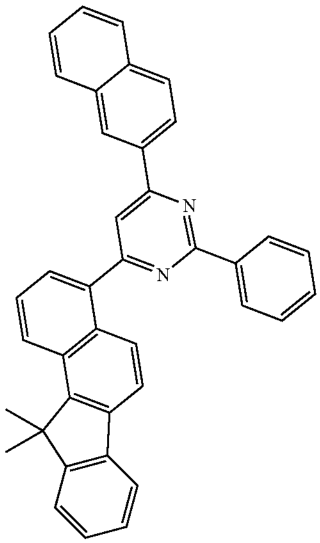
C-44
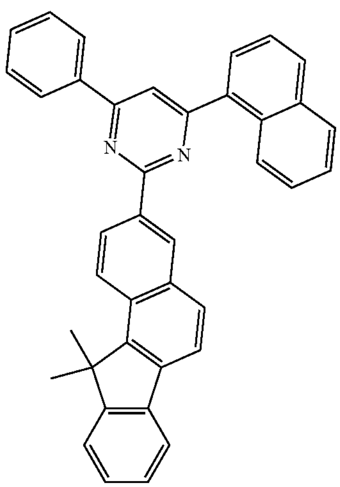
C-45
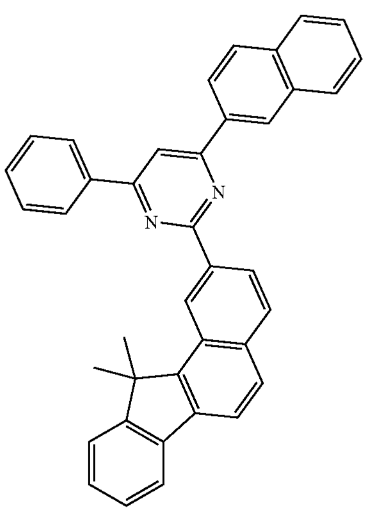
-continued
C-46
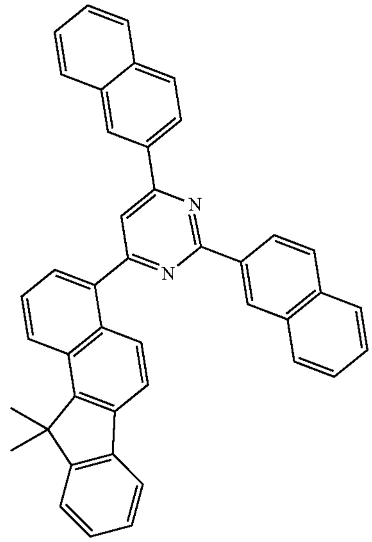
C-47
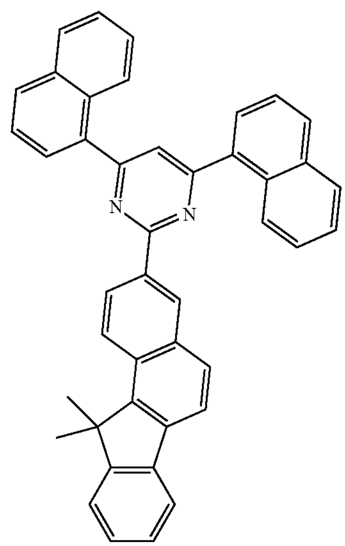
C-48
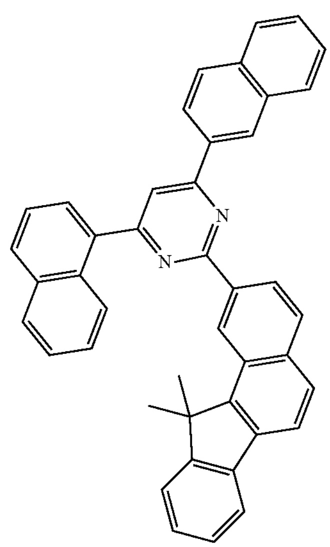

C-49
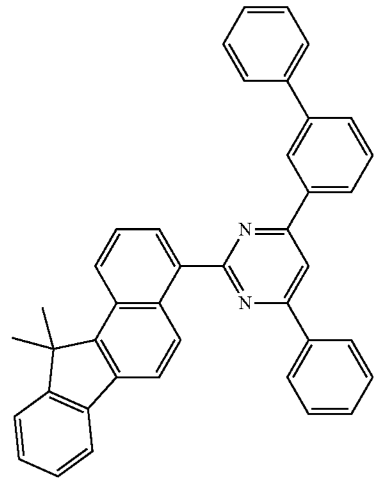
C-50
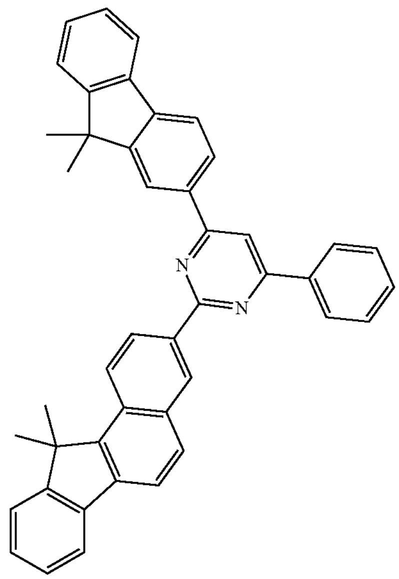
C-51
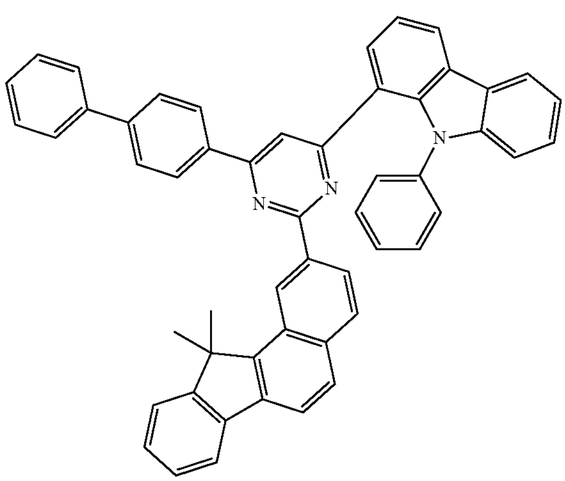
C-52
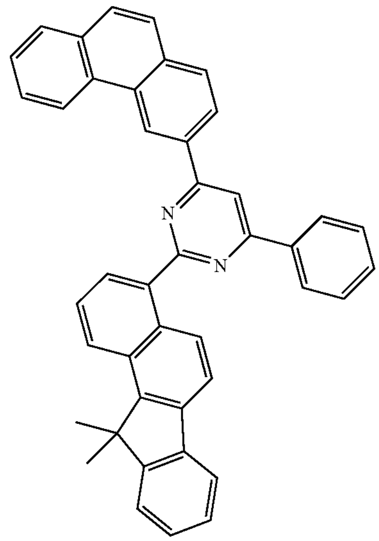
C-53
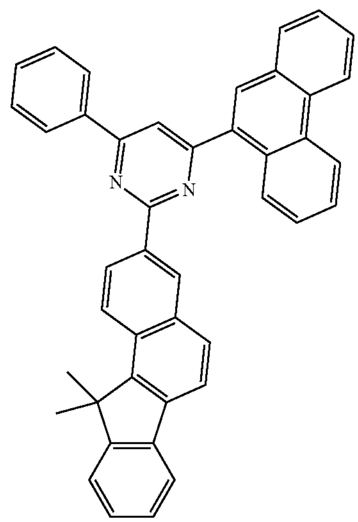
C-54
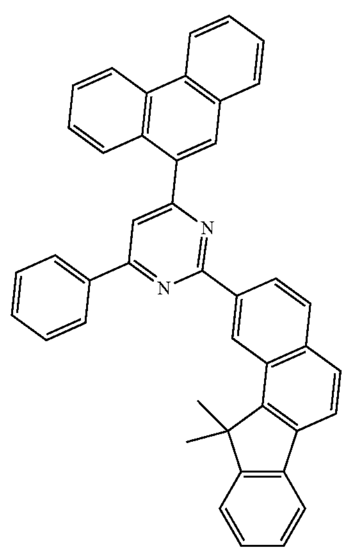

-continued
C-55
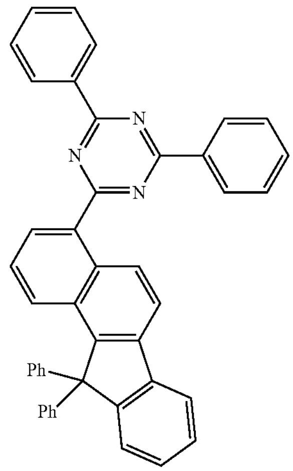
C-56
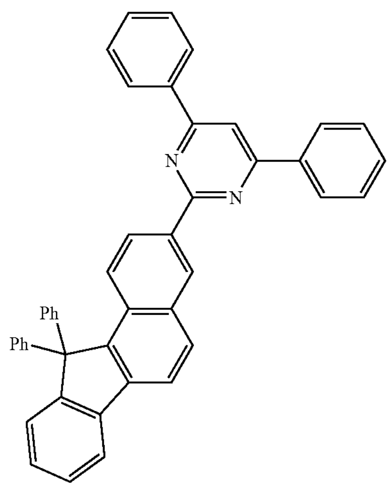
C-57
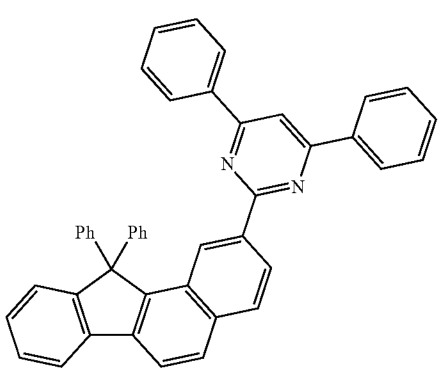
-continued
C-58
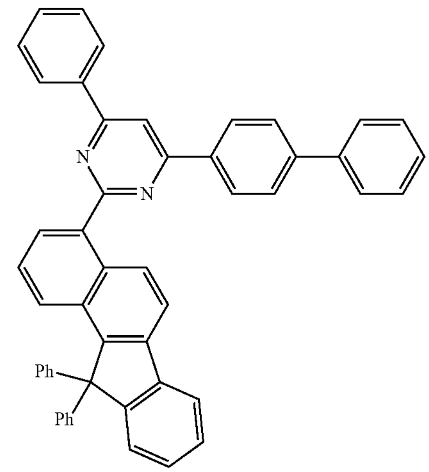
C-59
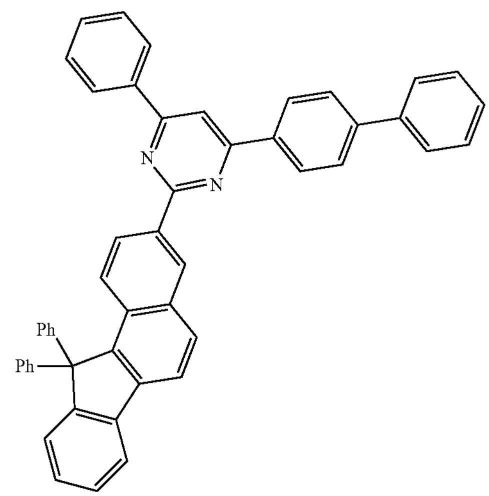
C-60
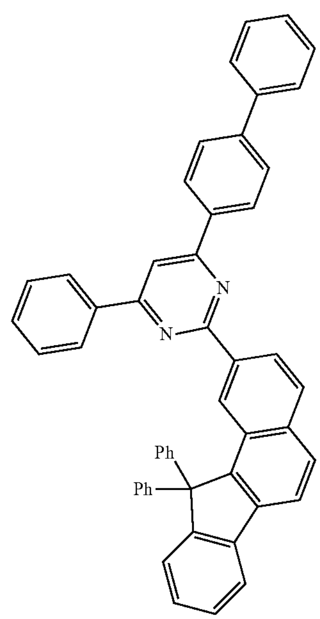

-continued
C-61
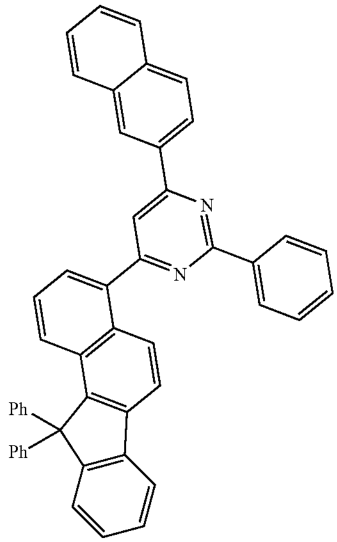
C-62
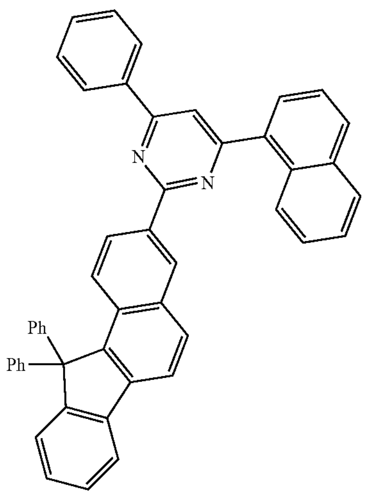
C-63
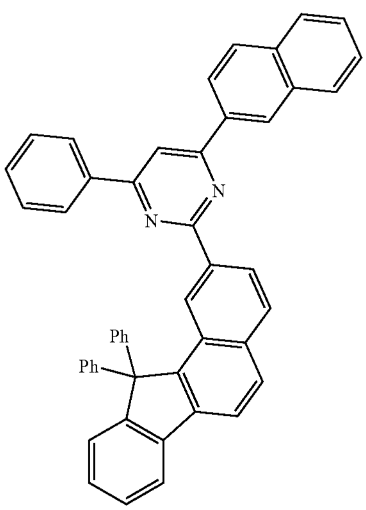
-continued
C-64
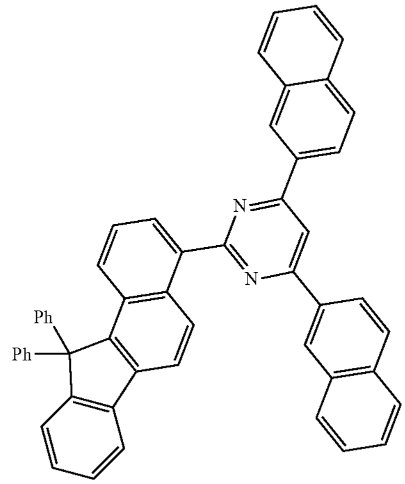
C-65
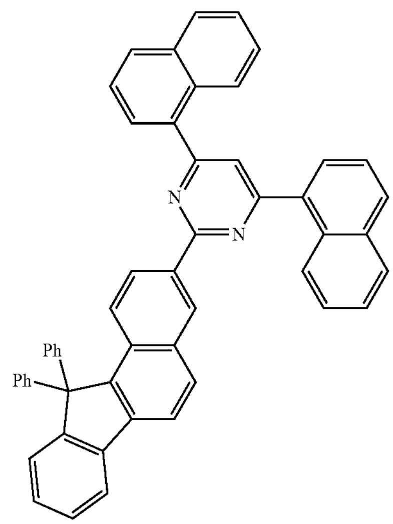
C-66
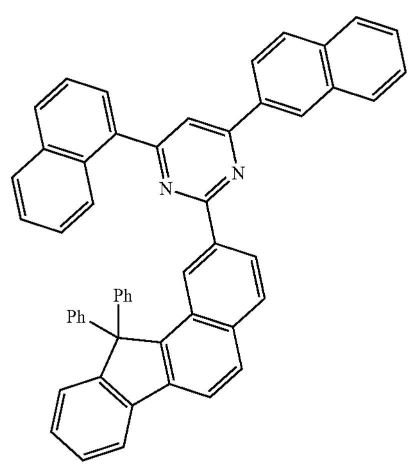

-continued
C-67
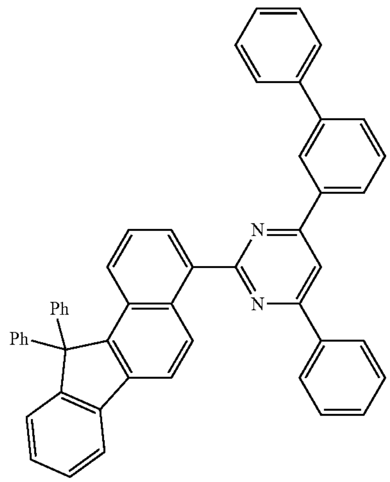
C-68
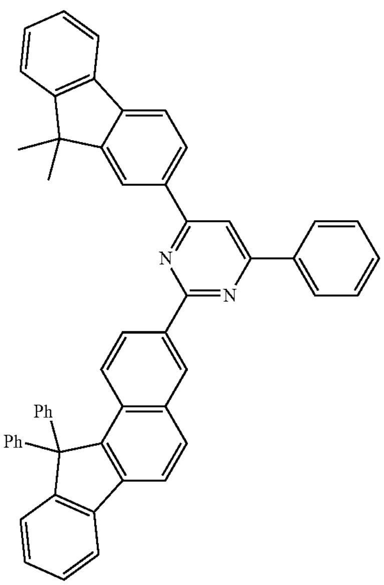
C-69
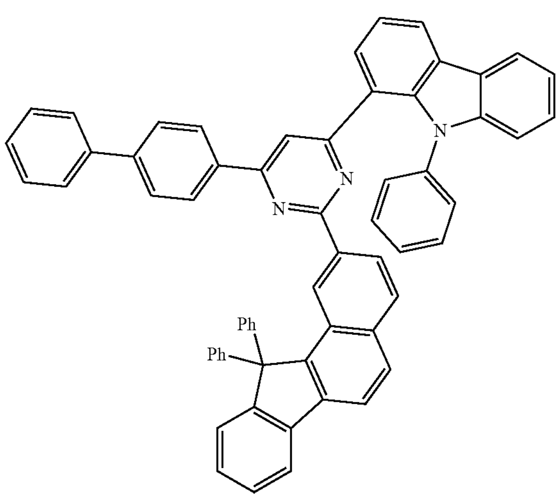
-continued
C-70
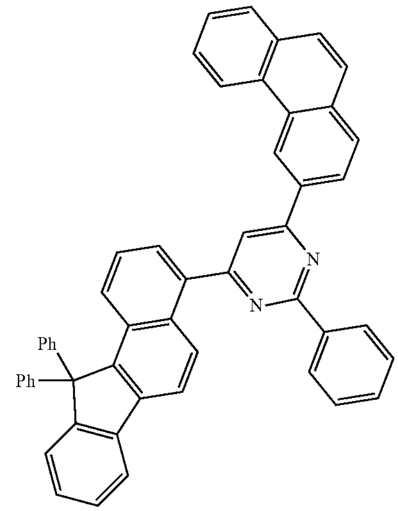
C-71
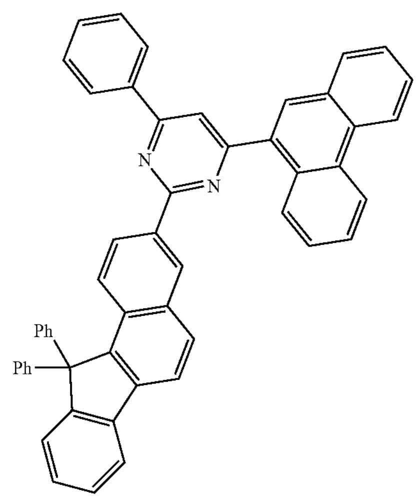
C-72
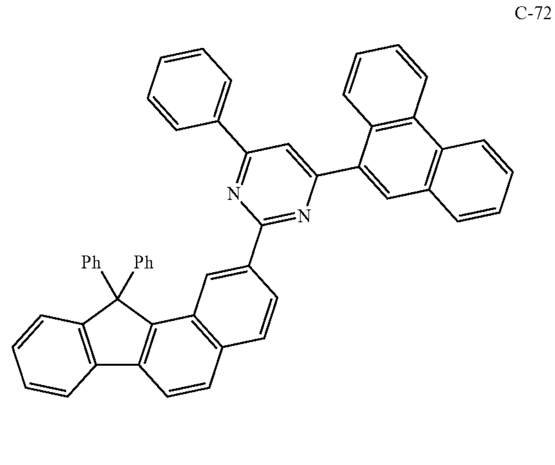

-continued
C-73
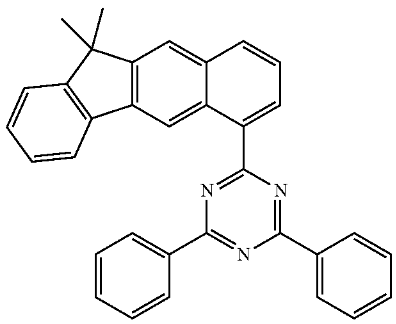
C-74
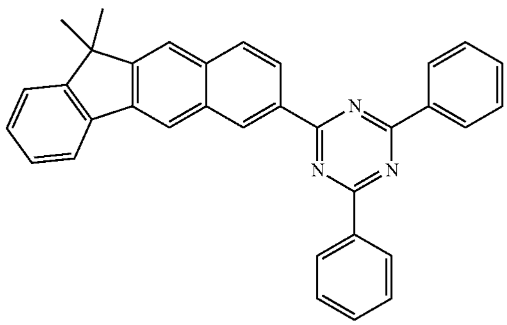
C-75
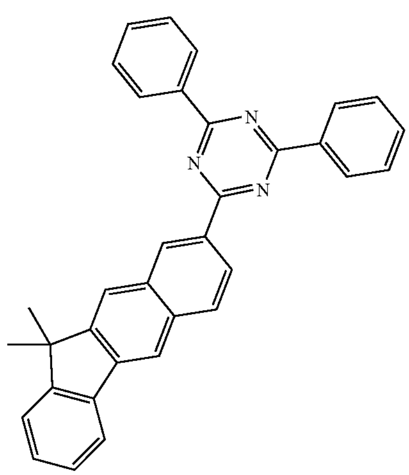
C-76
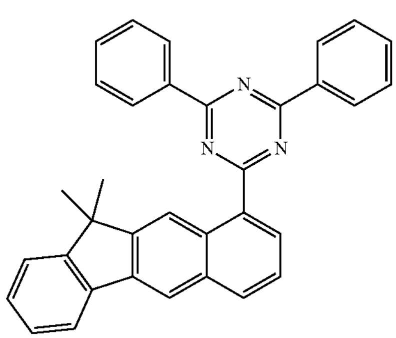
-continued
C-77
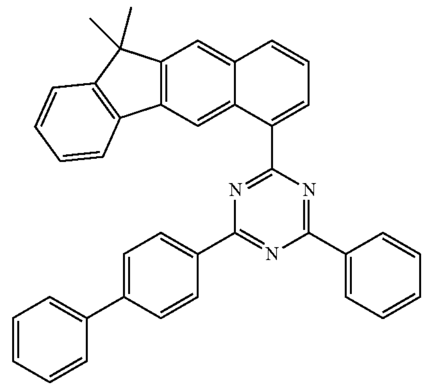
C-78
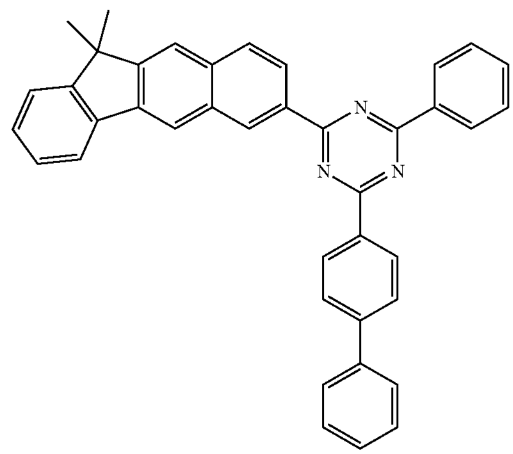
C-79
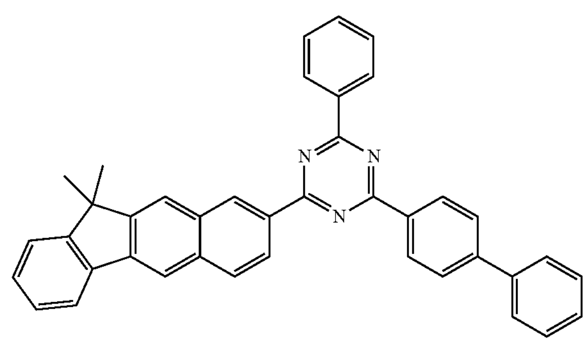
C-80
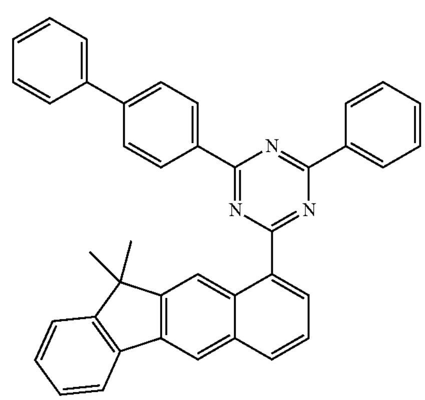

-continued
C-81
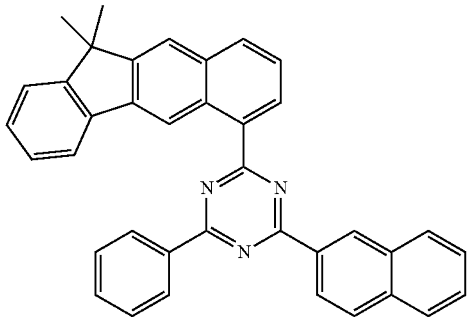
C-82
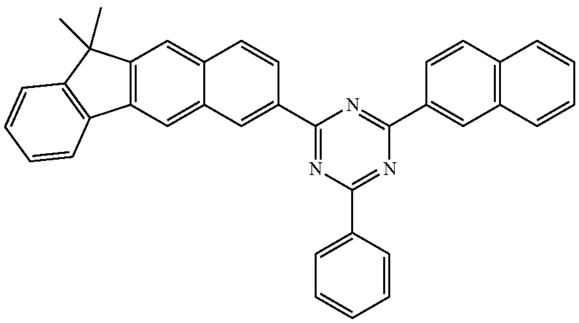
C-83
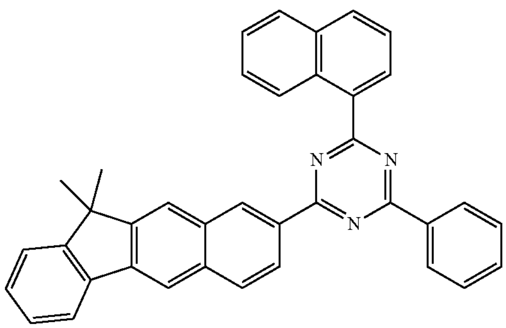
C-84
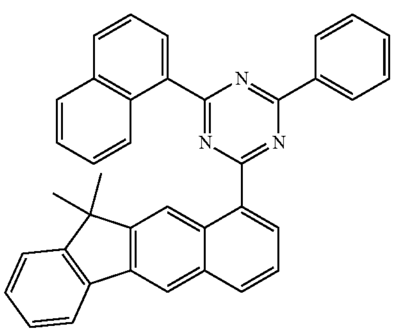
C-85
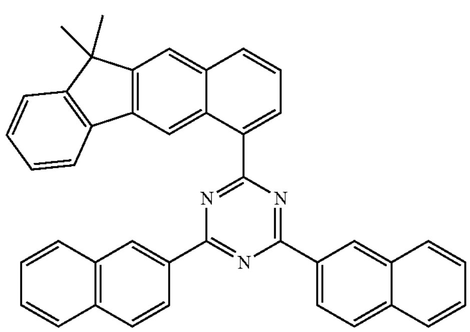
-continued
C-86
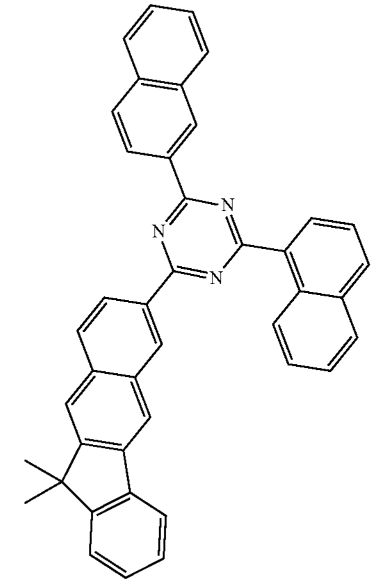
C-87
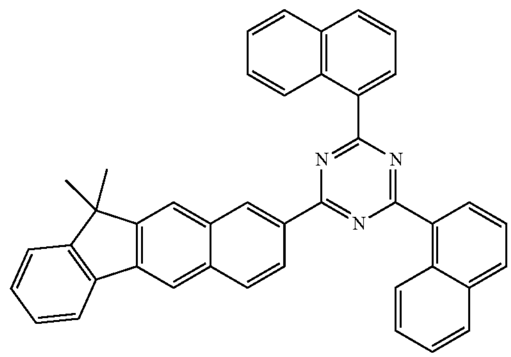
C-88
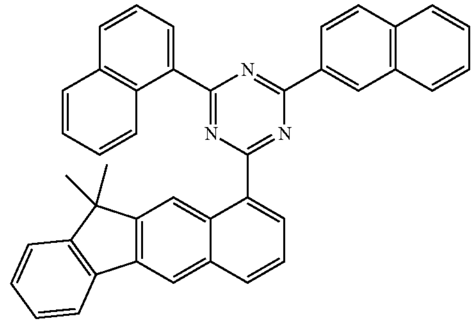

-continued
C-89
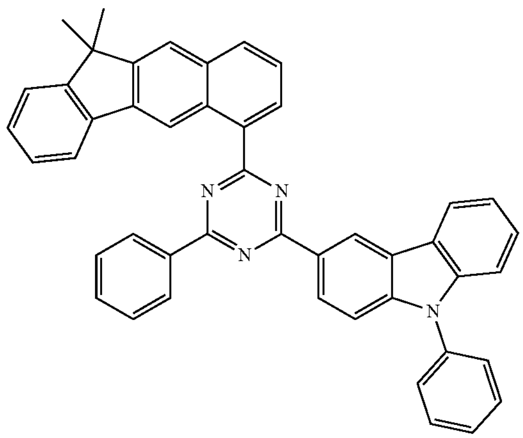
C-90
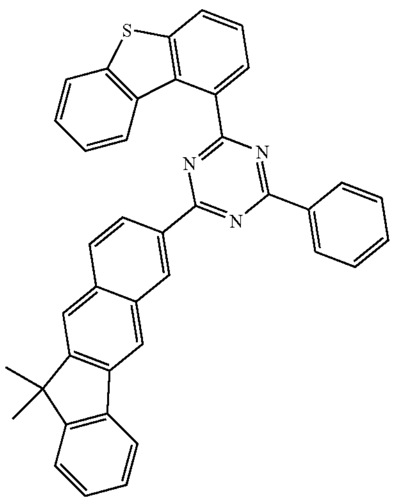
C-91
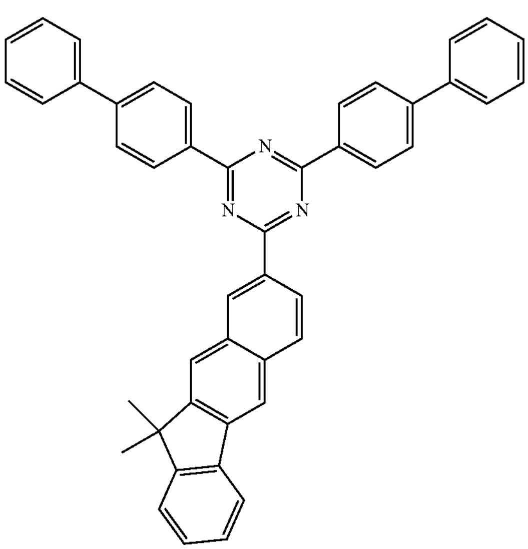
-continued
C-92
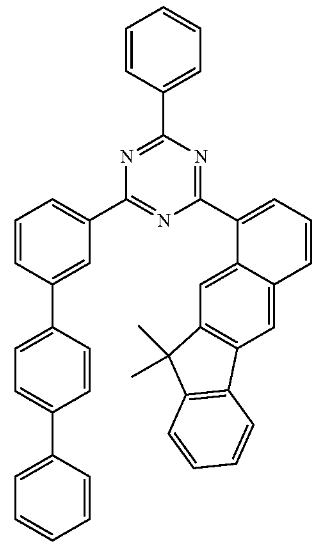
C-93
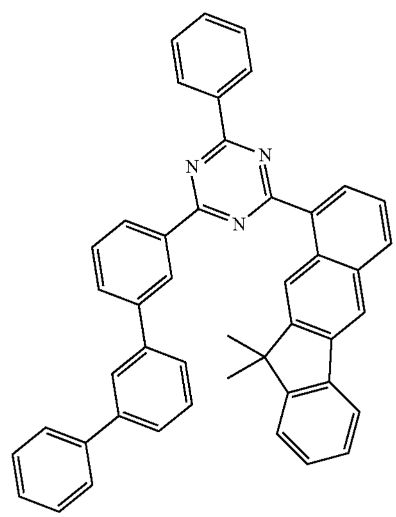
C-94
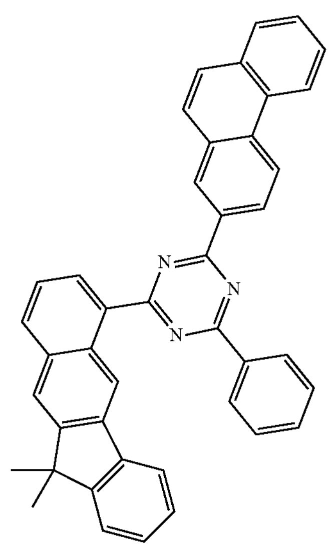

-continued
C-95
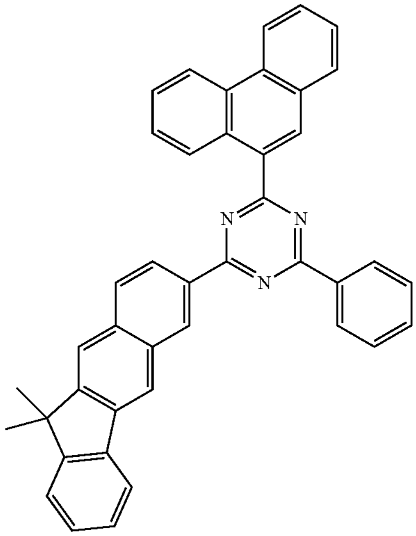
C-96
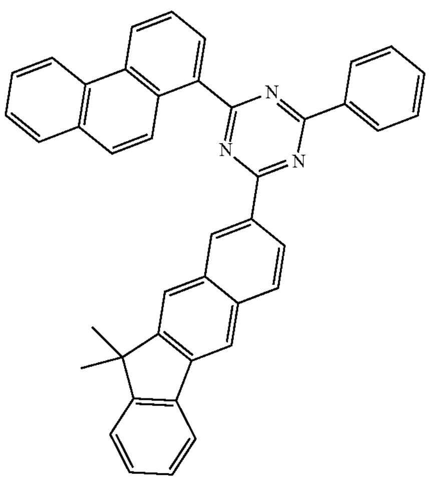
C-97
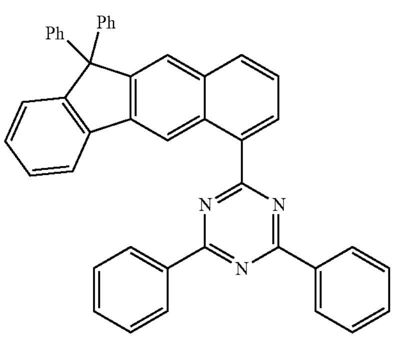
-continued
C-98
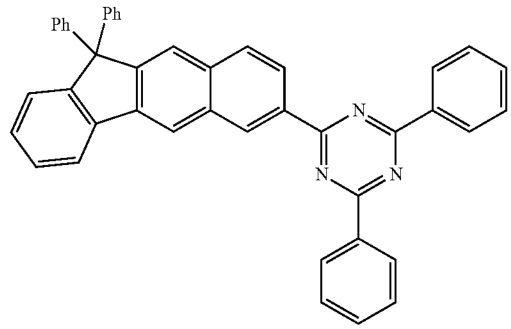
C-99
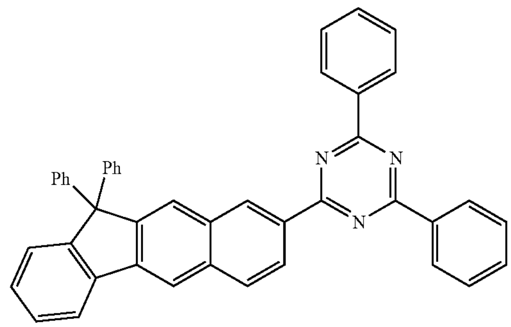
C-100
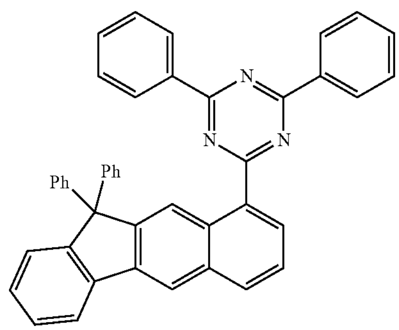
C-101
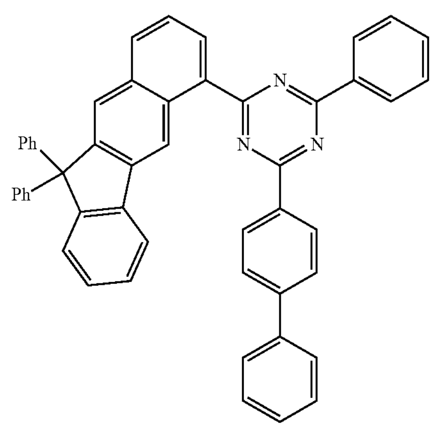

-continued
C-102
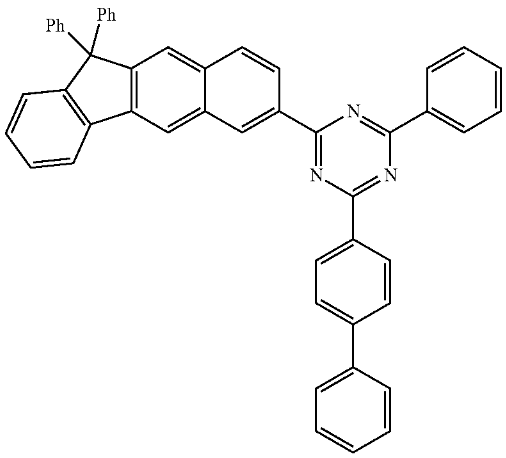
C-103
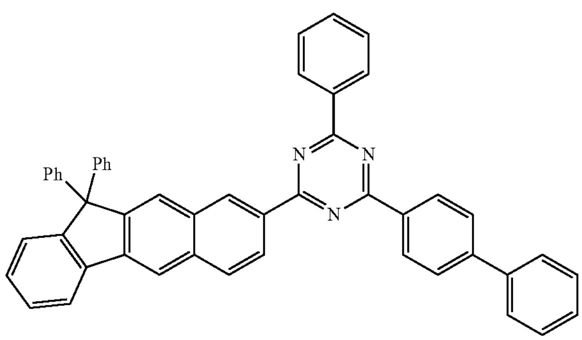
C-104
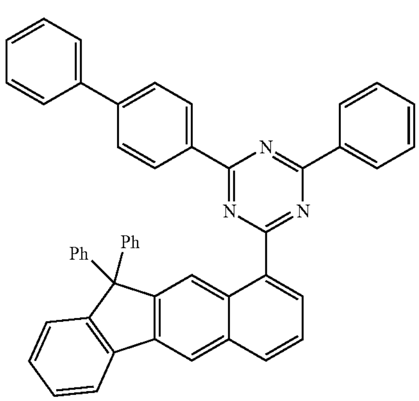
-continued
C-105
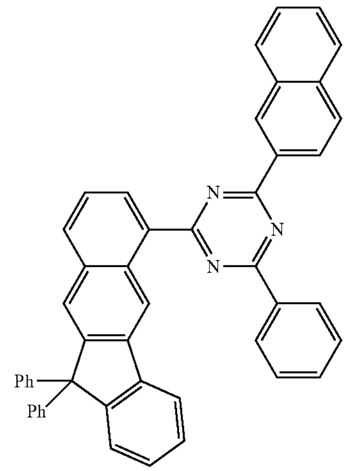
C-106
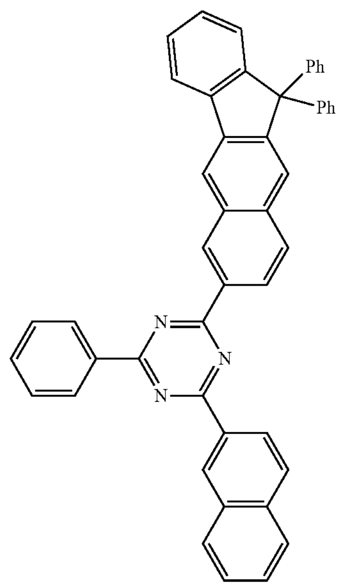
C-107
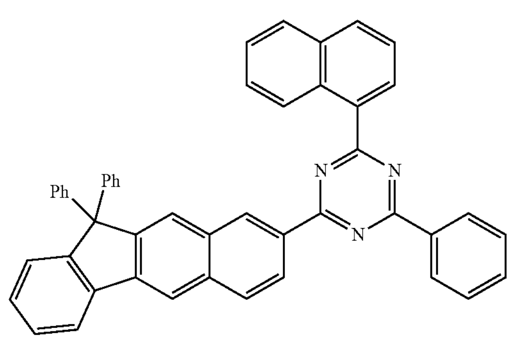

-continued
C-108
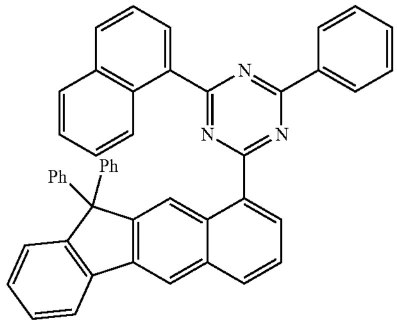
C-109
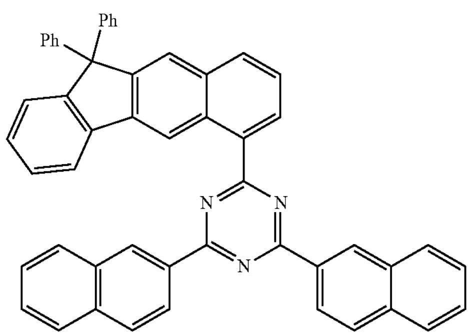
C-110
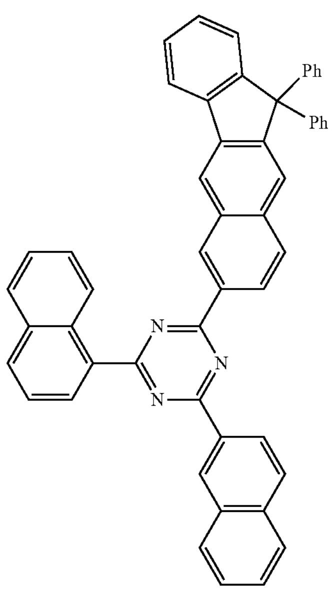
-continued
C-111
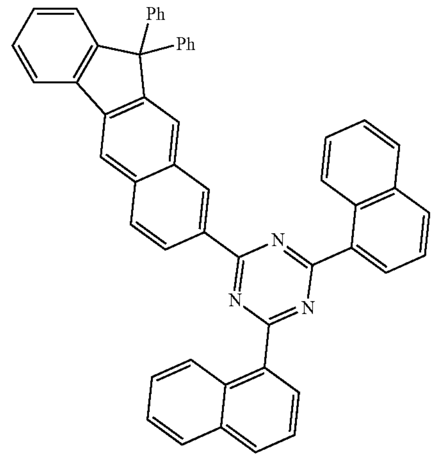
C-112
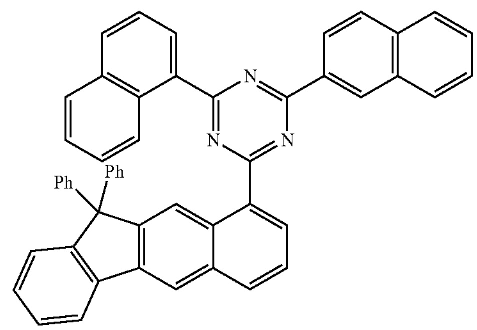
C-113
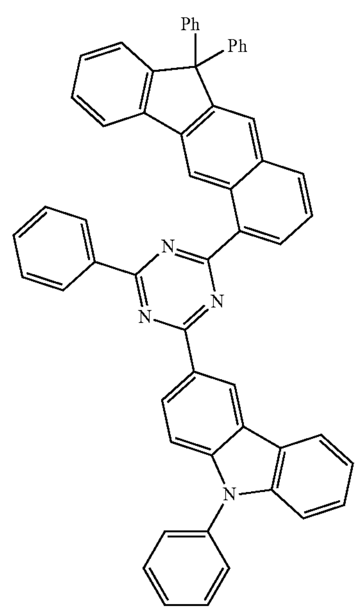

-continued
C-114
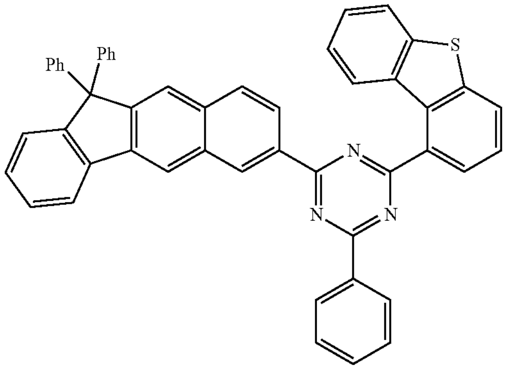
C-115
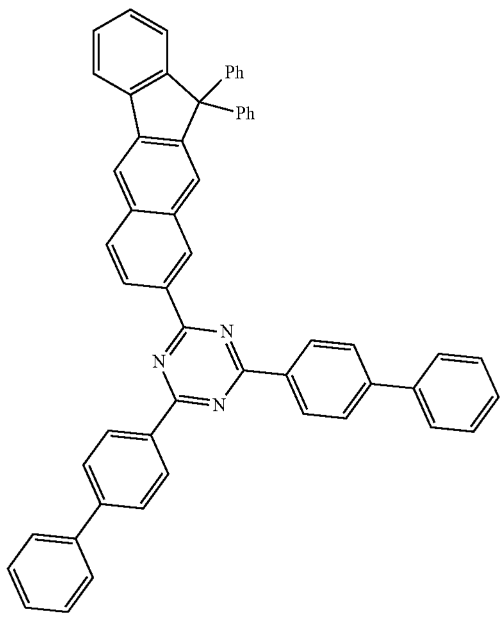
C-116
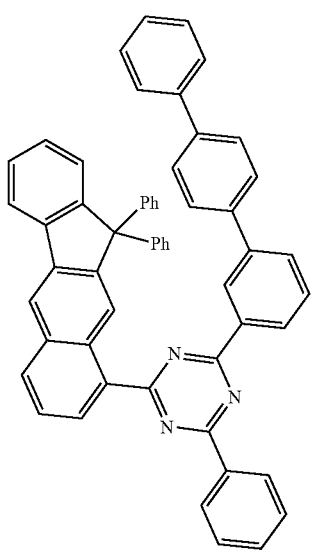
-continued
C-117
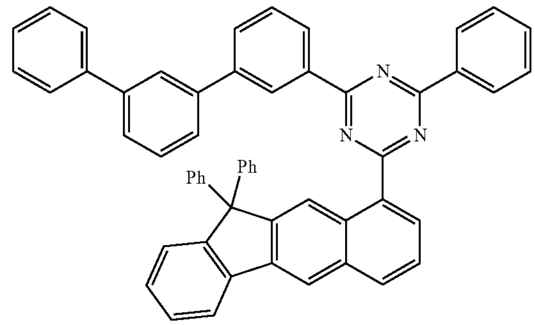
C-118
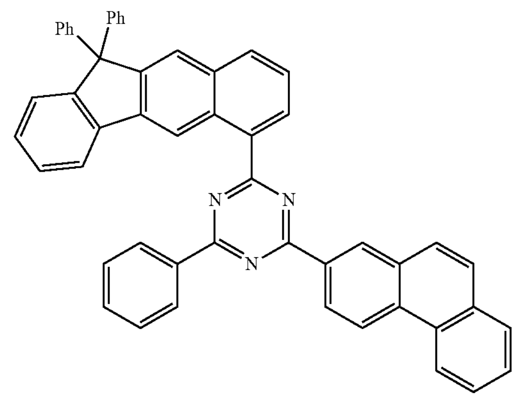
C-119
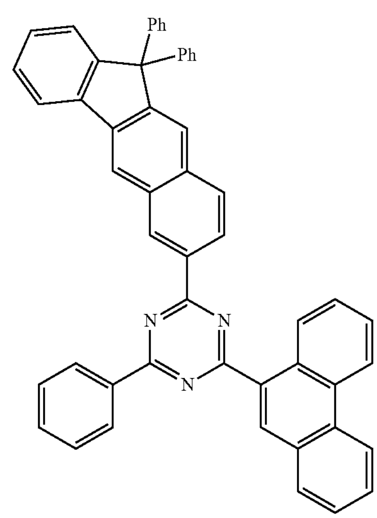

-continued
C-120
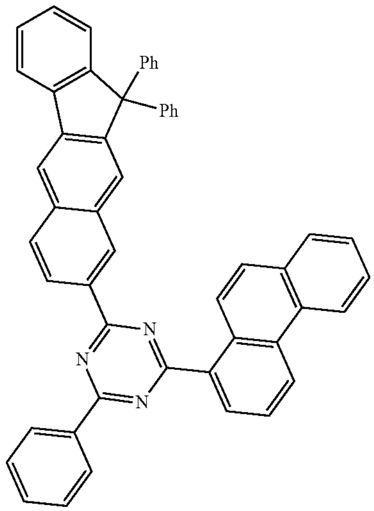
C-121
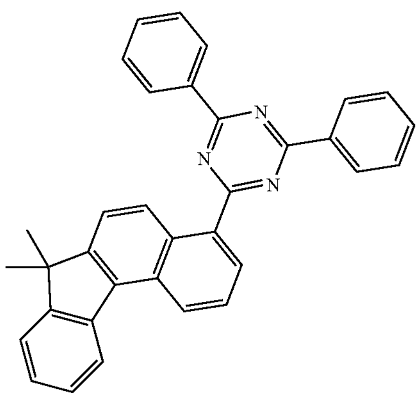
C-122
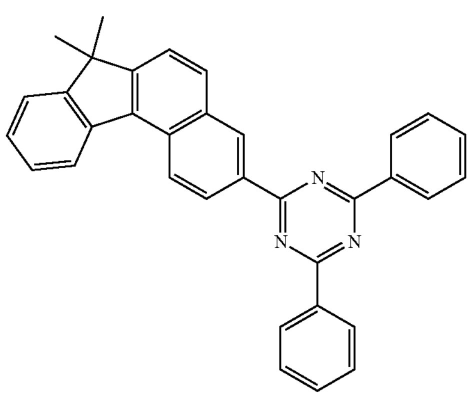
-continued
C-123
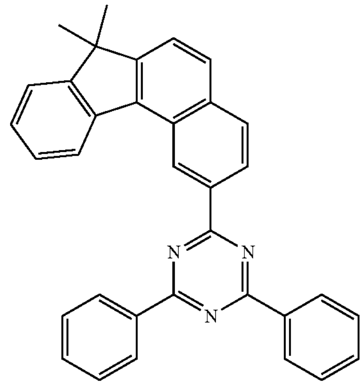
C-124
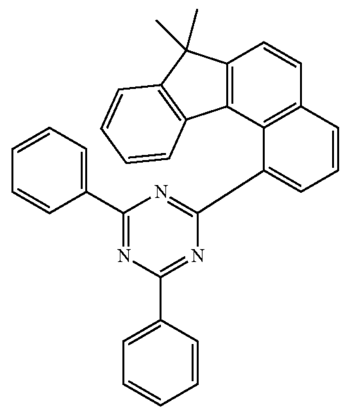
C-125
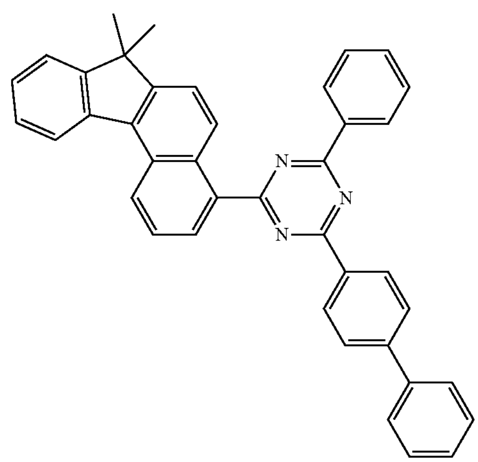

-continued
C-126
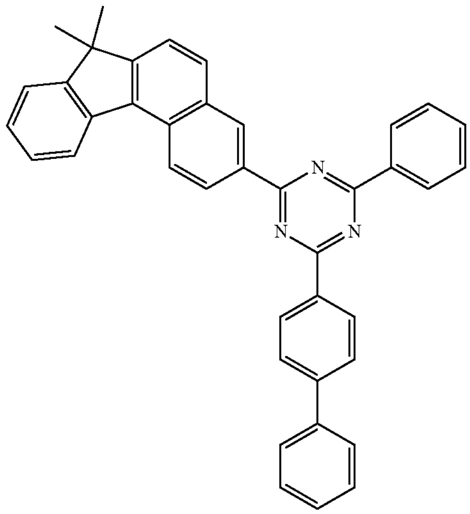
C-127
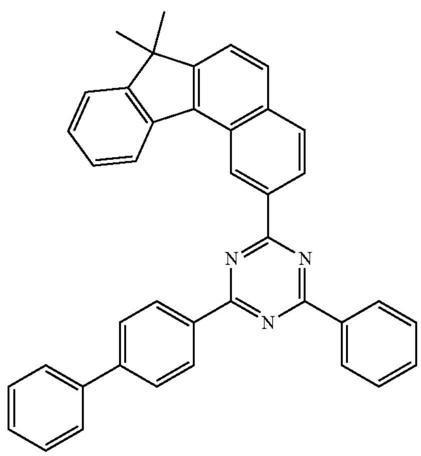
C-128
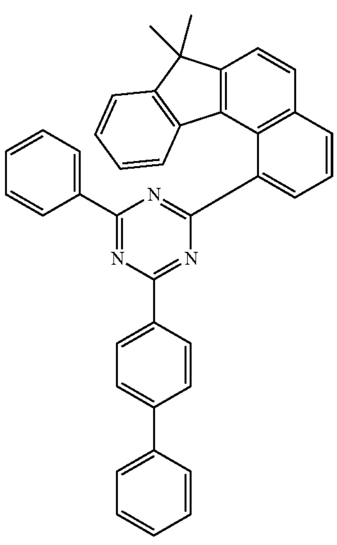
-continued
C-129
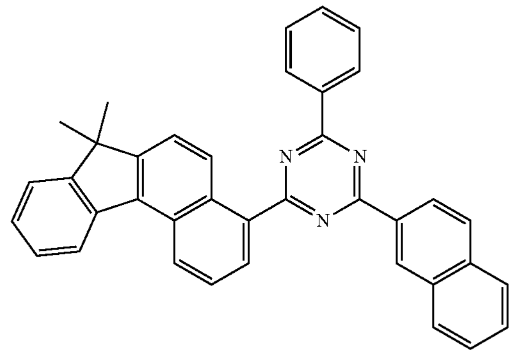
C-130
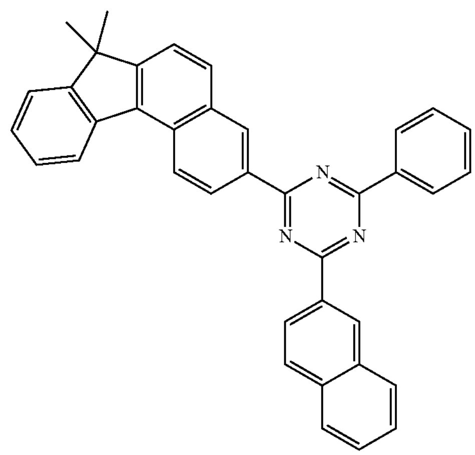
C-131
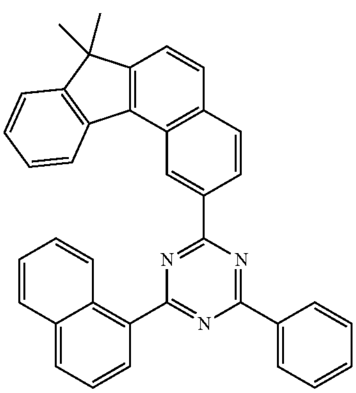
C-132
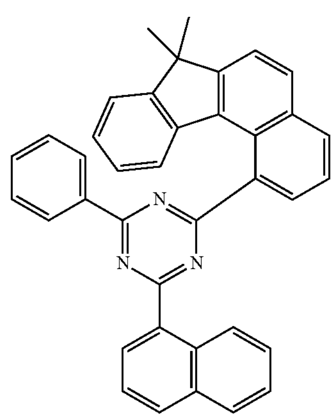

-continued
C-133
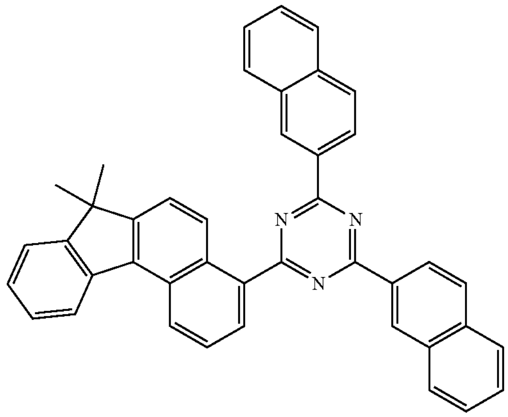
C-134
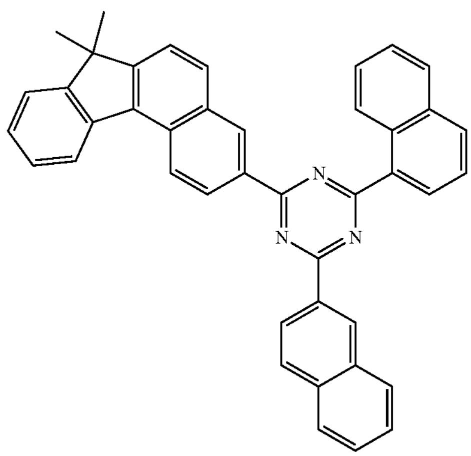
C-135
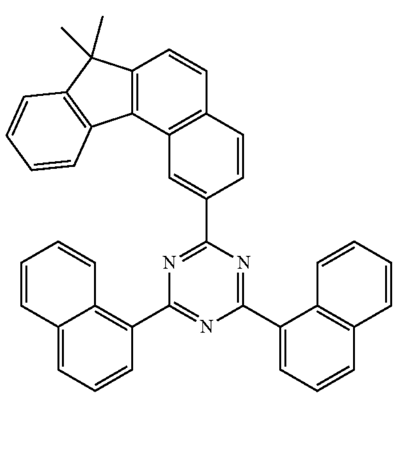
-continued
C-136
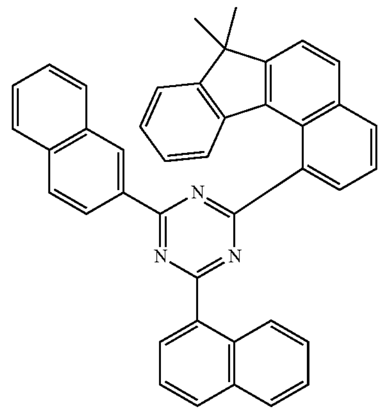
C-137
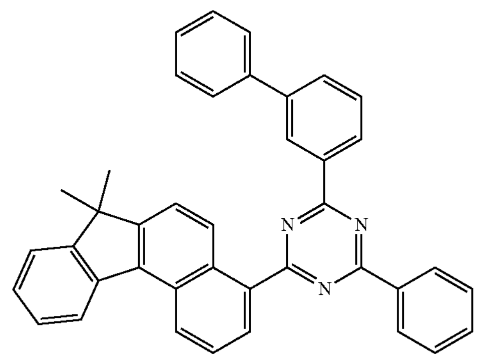
C-138
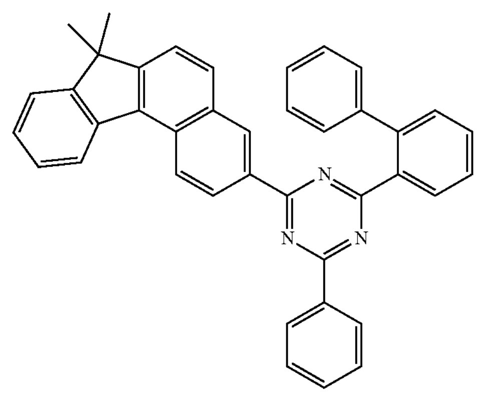
C-139
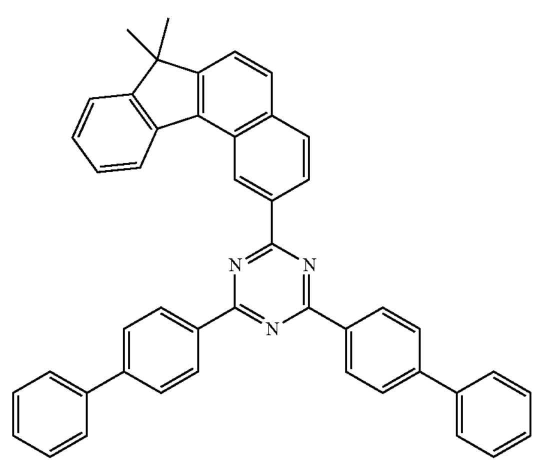

-continued
C-140
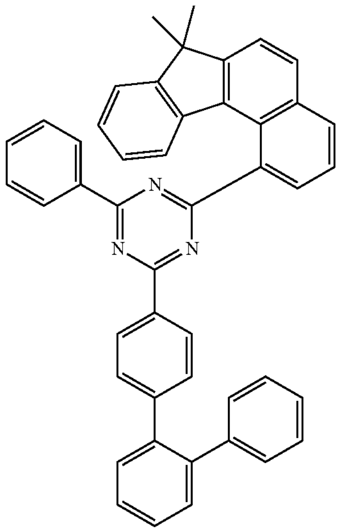
C-141
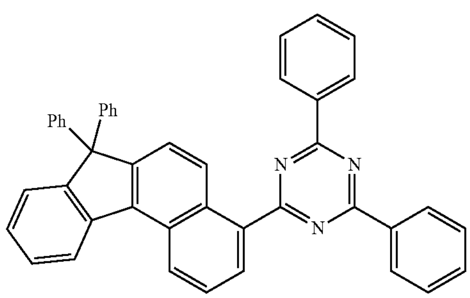
C-142
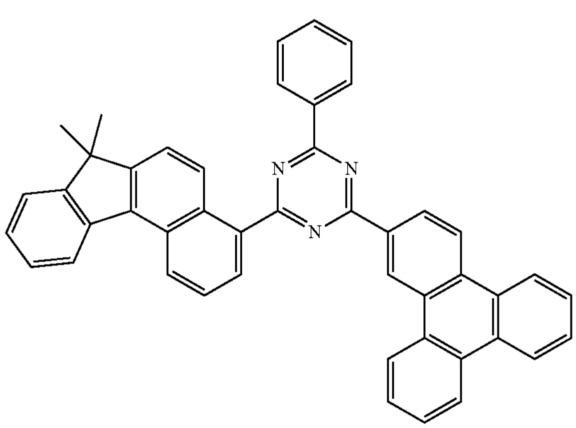
-continued
C-143
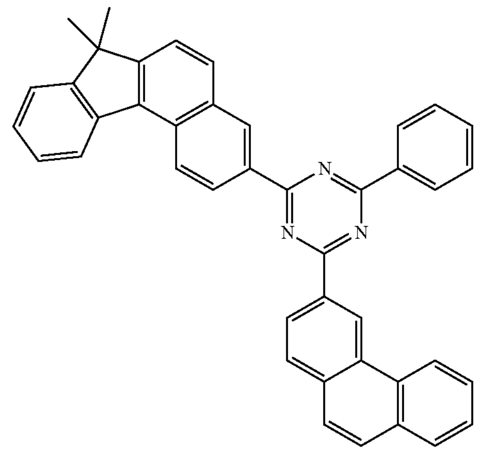
C-144
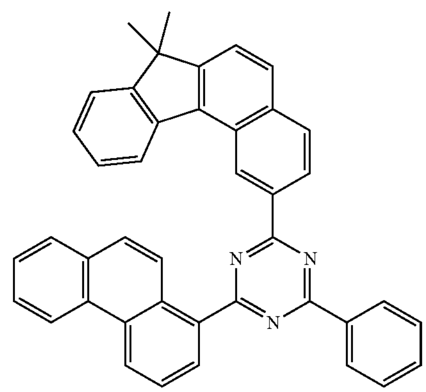
C-145
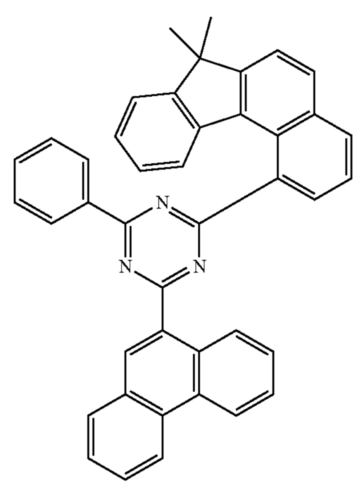

-continued
C-146
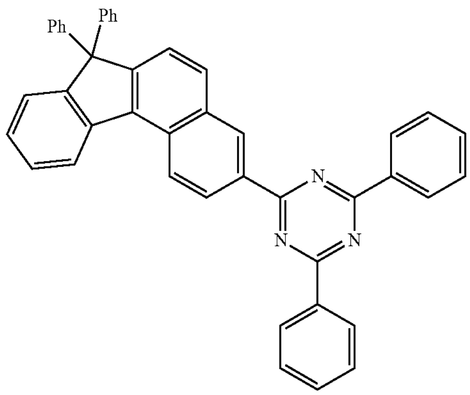
C-147
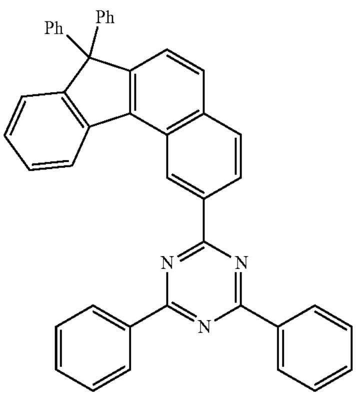
C-148
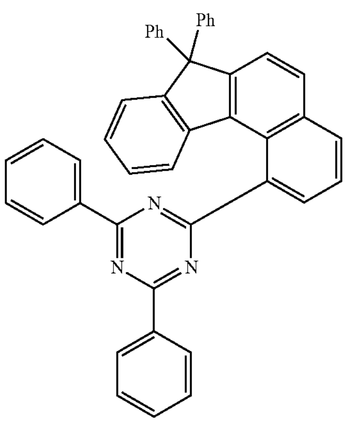
C-149
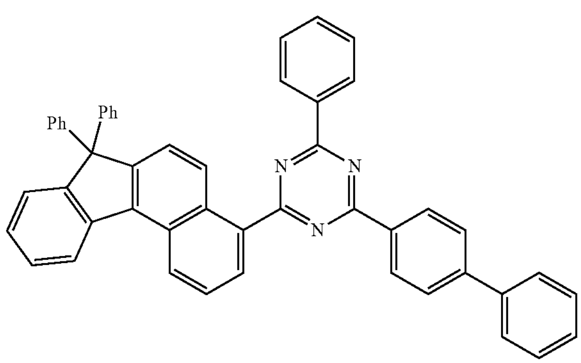
-continued
C-150
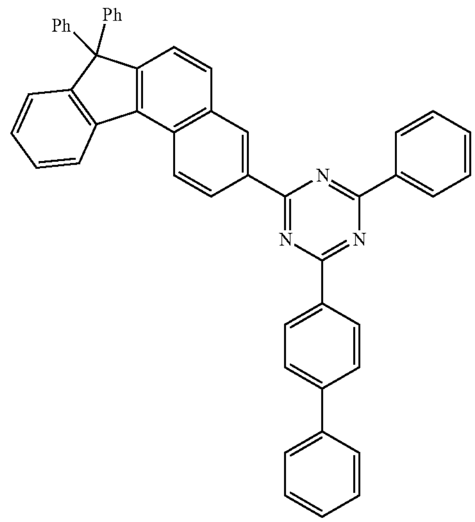
C-151
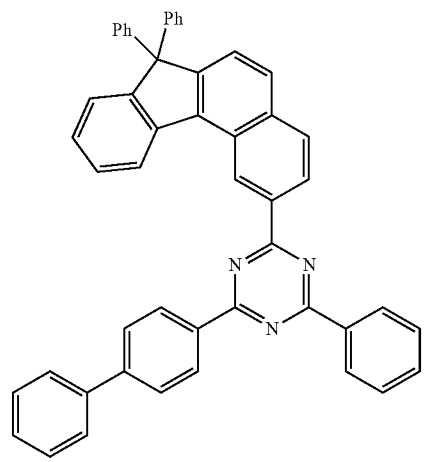
C-152
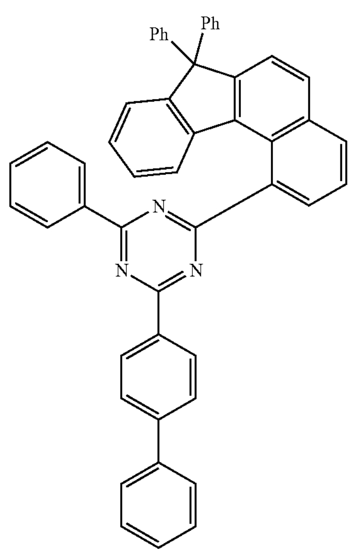

-continued
C-153
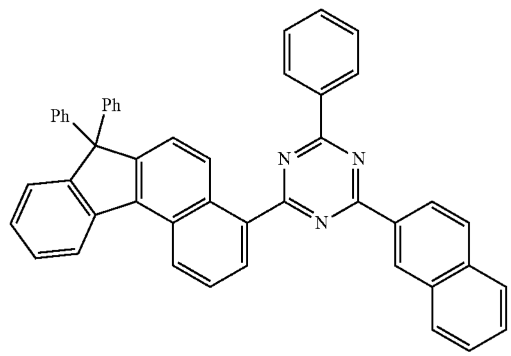
C-154
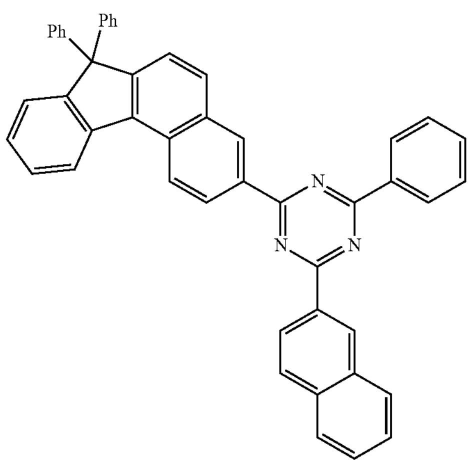
C-155
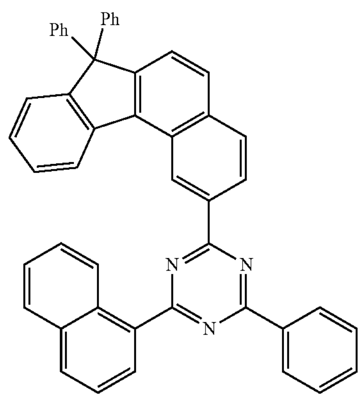
C-156
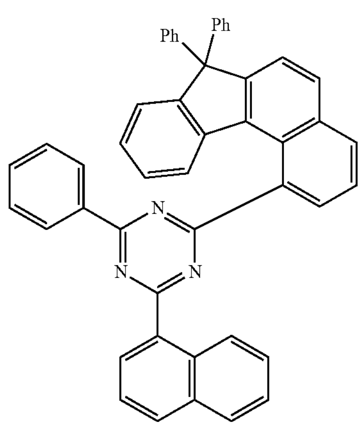
-continued
C-157
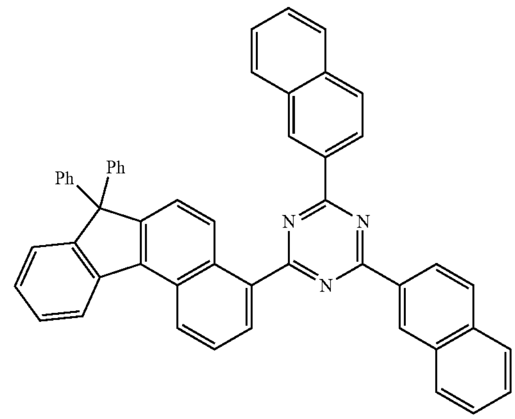
C-158
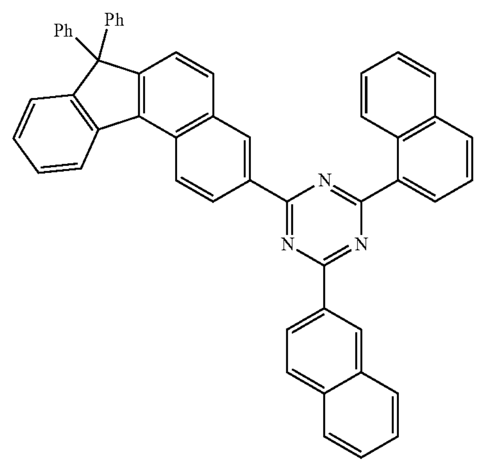
C-159
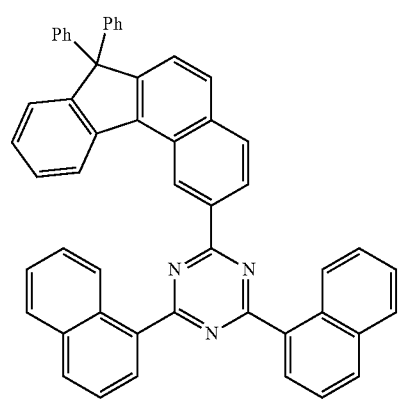

C-160
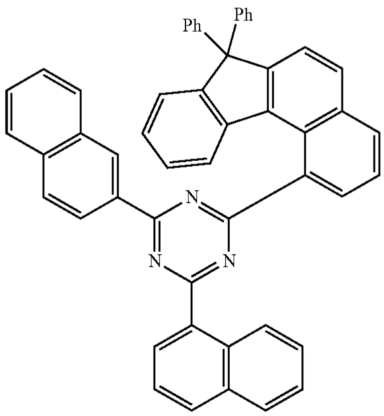
C-161
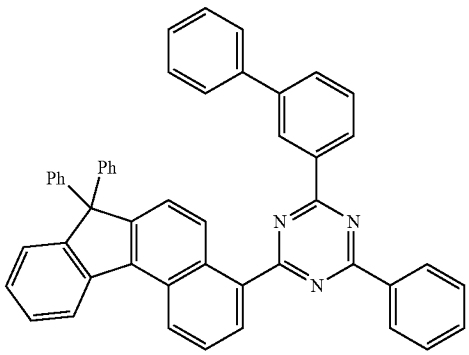
C-162
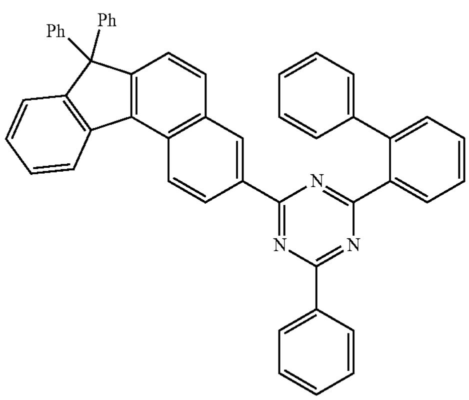
C-163
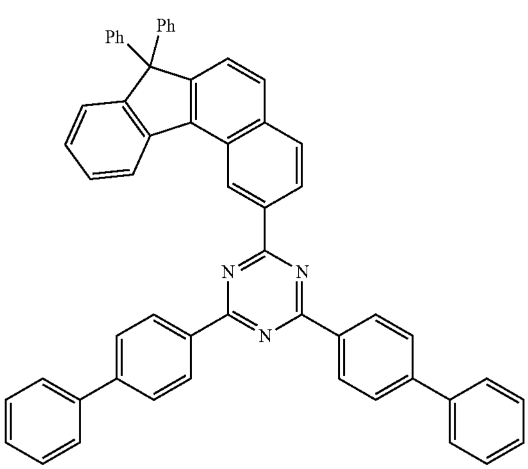
C-164
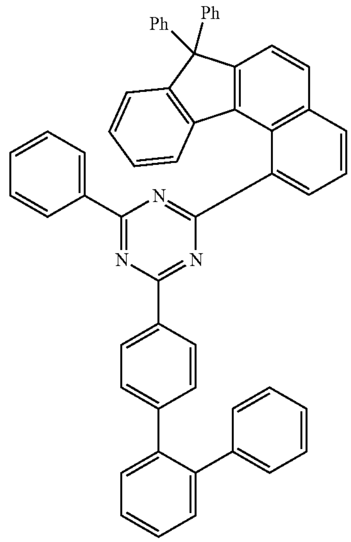
C-165
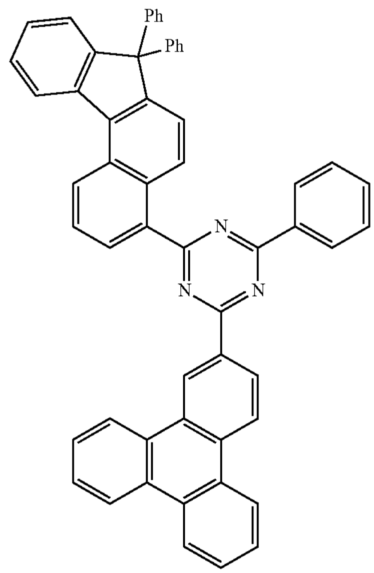
C-166
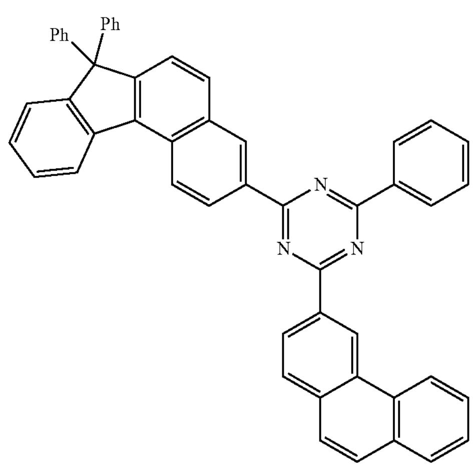

-continued
C-167
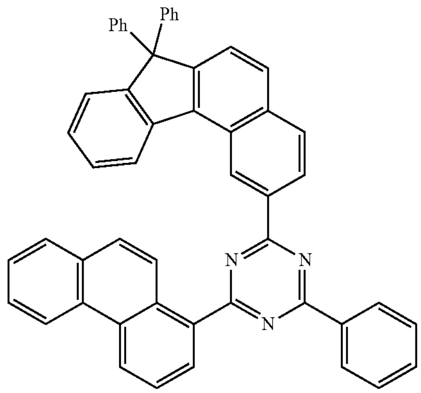
C-168
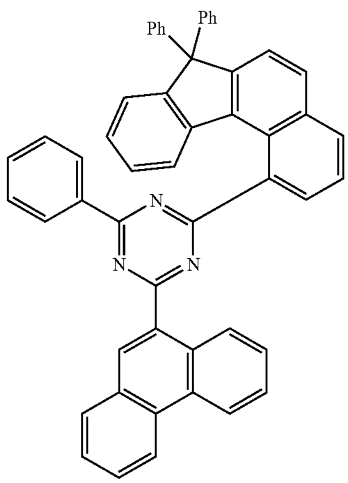
C-169
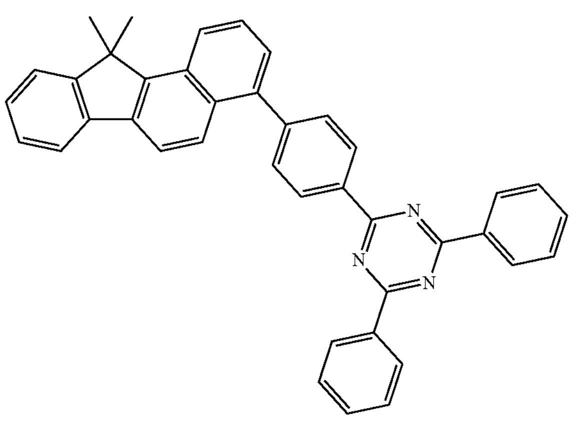
-continued
C-170
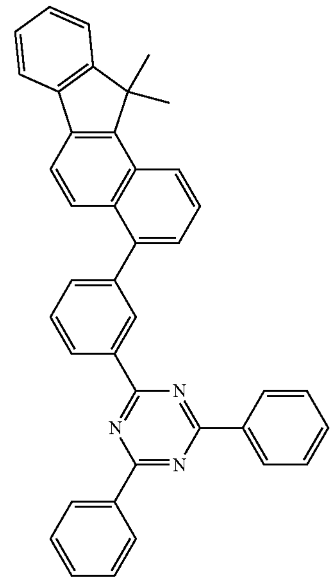
C-171
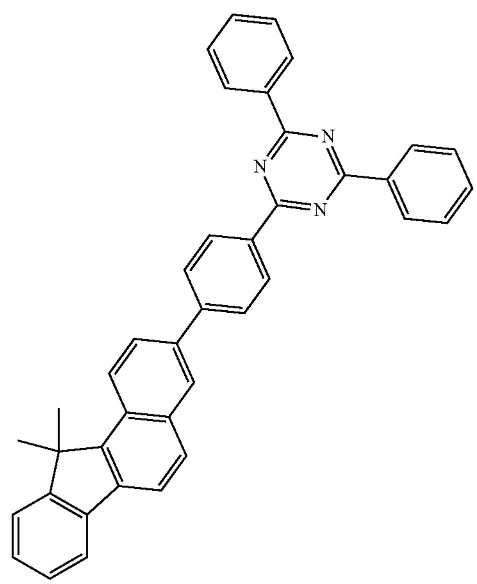

-continued
C-172
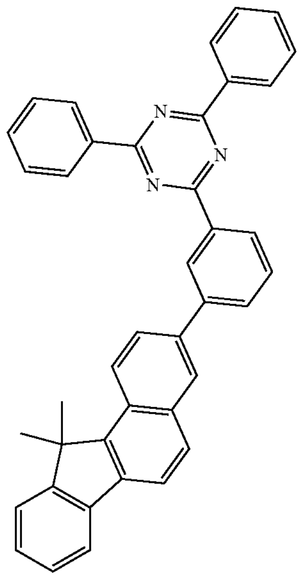
C-173
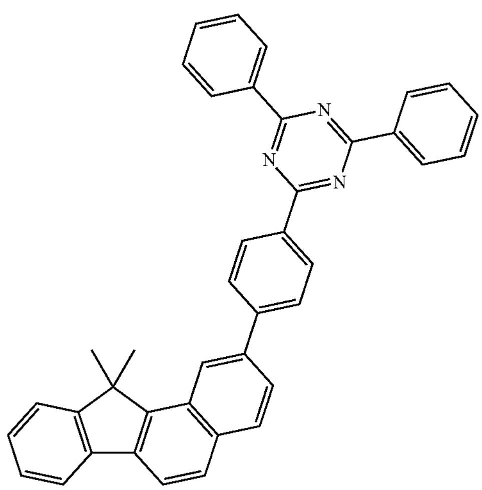
C-174
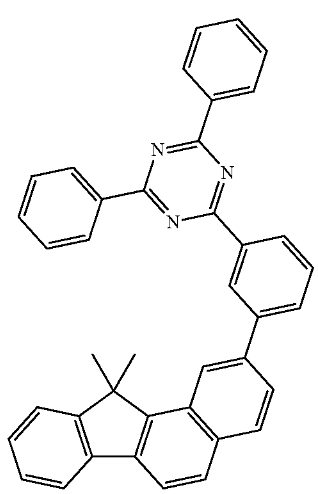
-continued
C-175
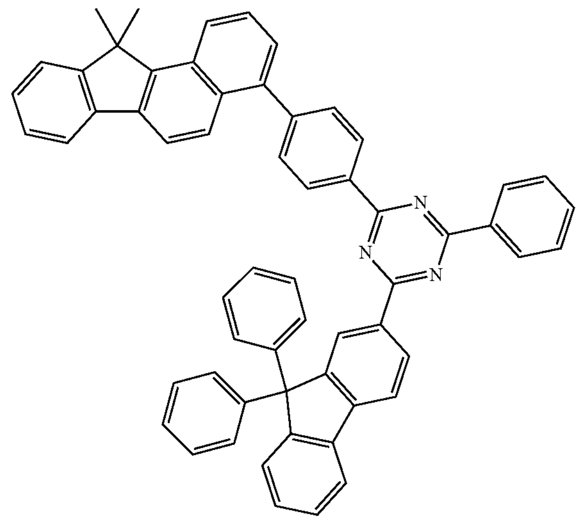
C-176
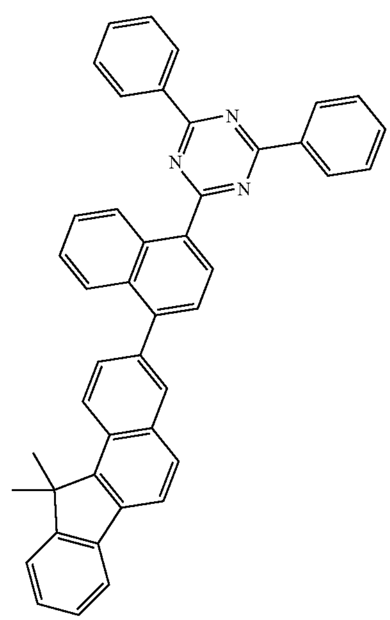

-continued
C-177
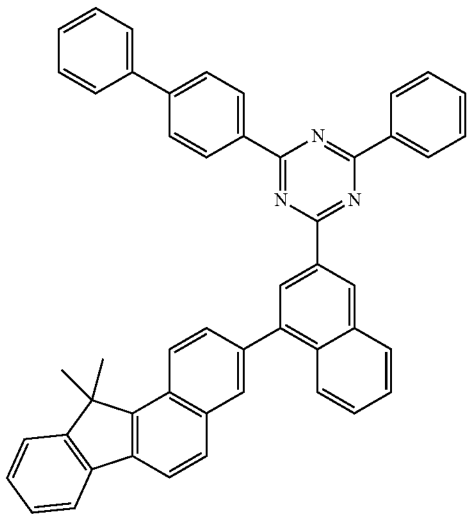
C-178
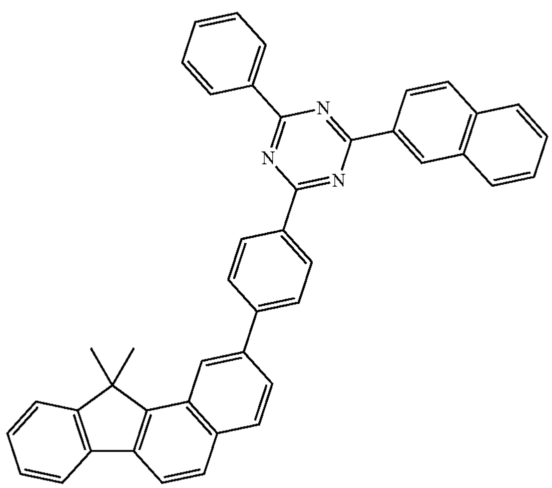
C-179
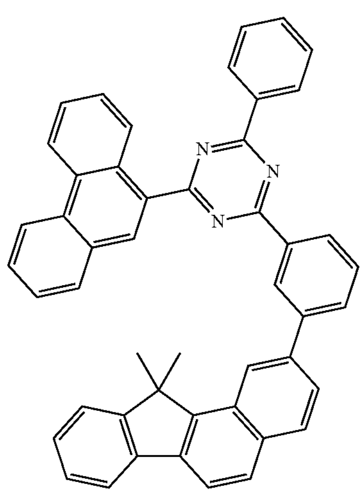
-continued
C-180
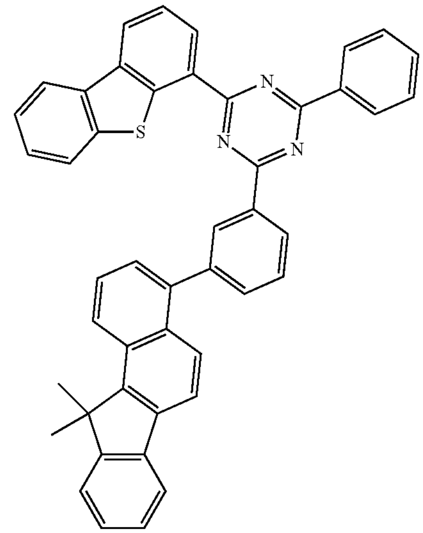
C-181
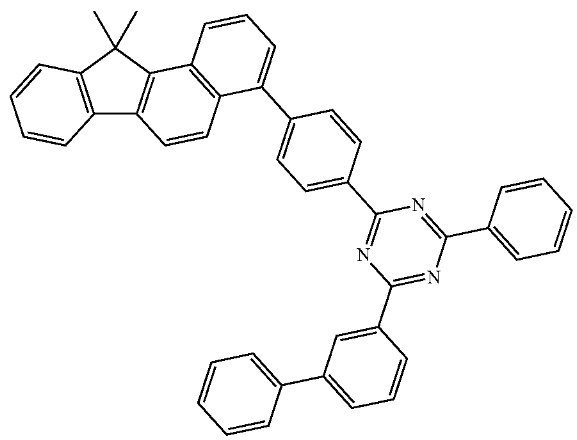
C-182
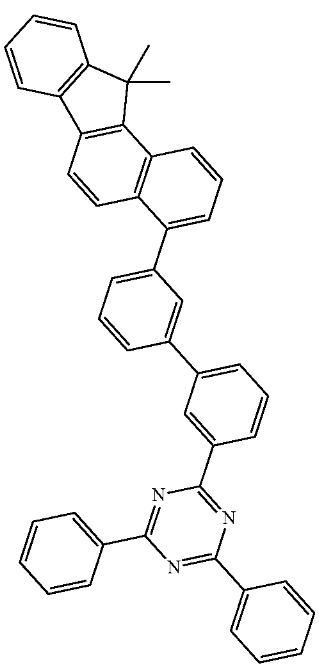

-continued
C-183
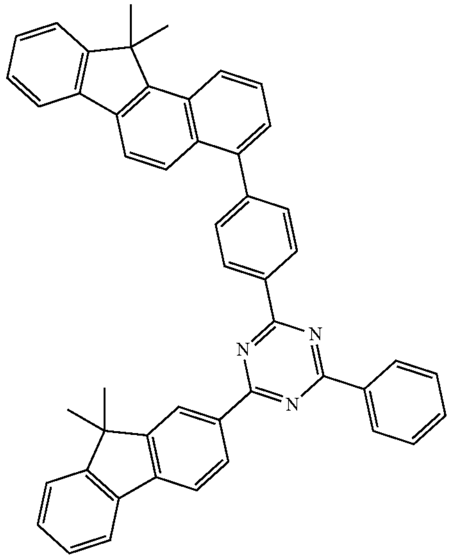
C-184
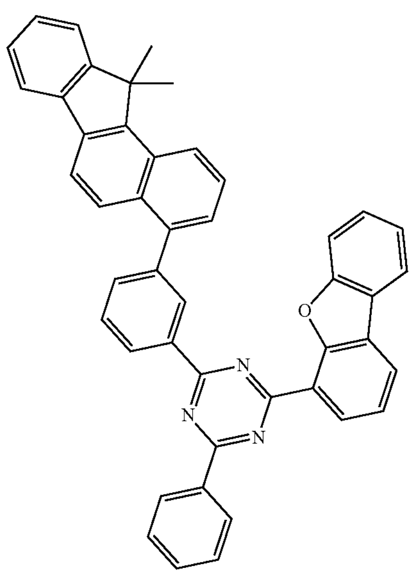
-continued
C-185
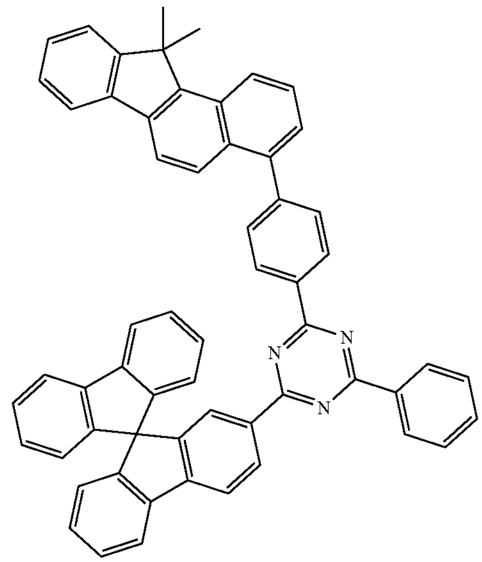
C-186
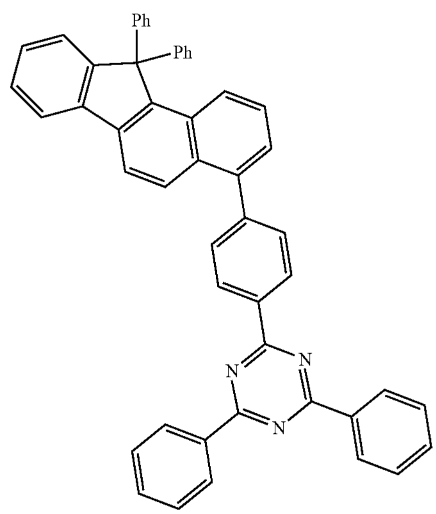
C-187
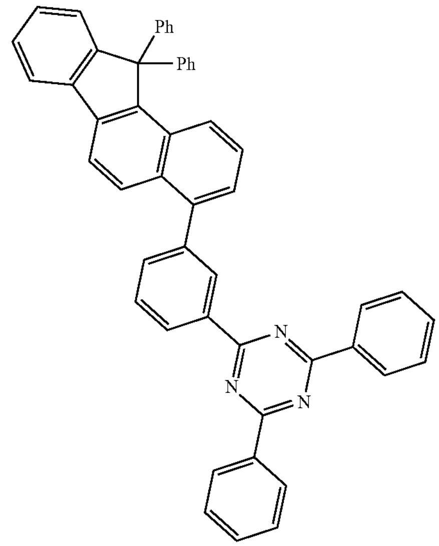

-continued
C-188
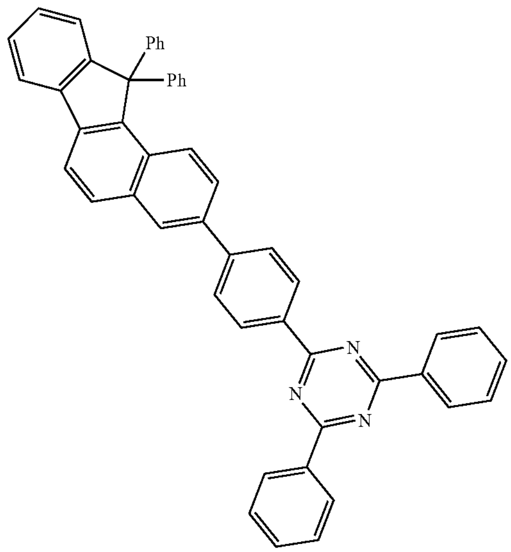
C-189
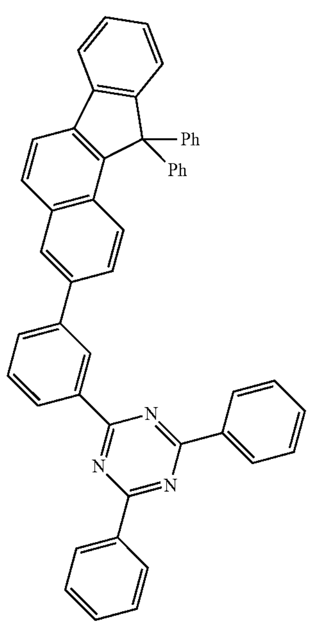
-continued
C-190
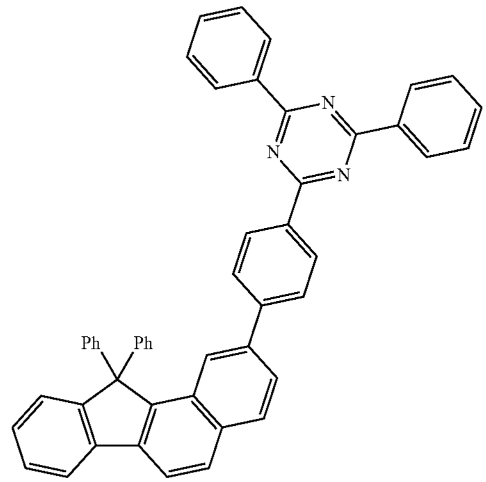
C-191
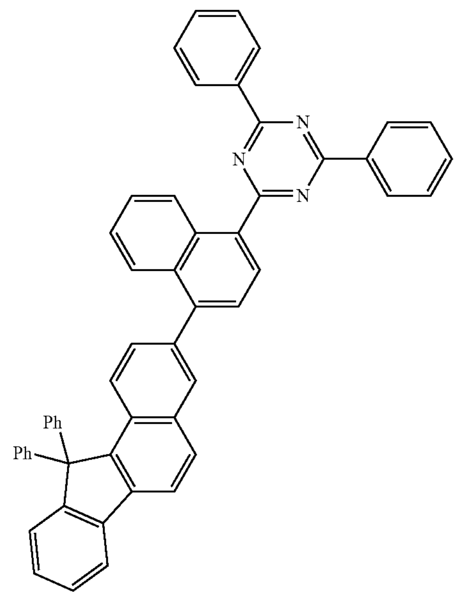
C-192
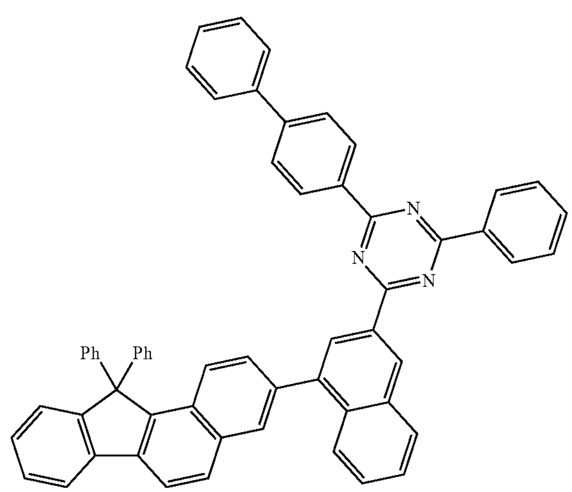

-continued
C-193
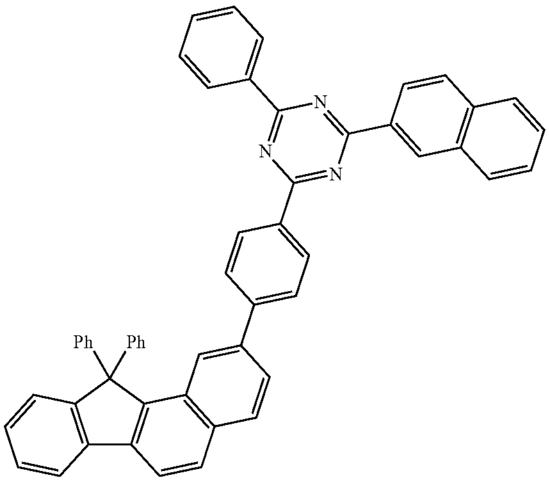
C-194
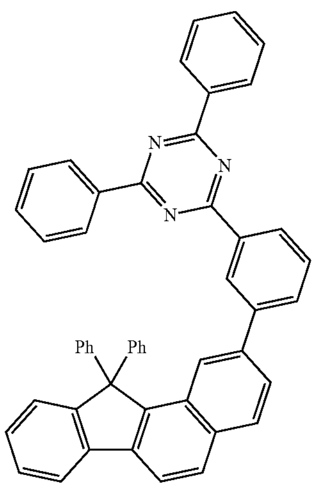
C-195
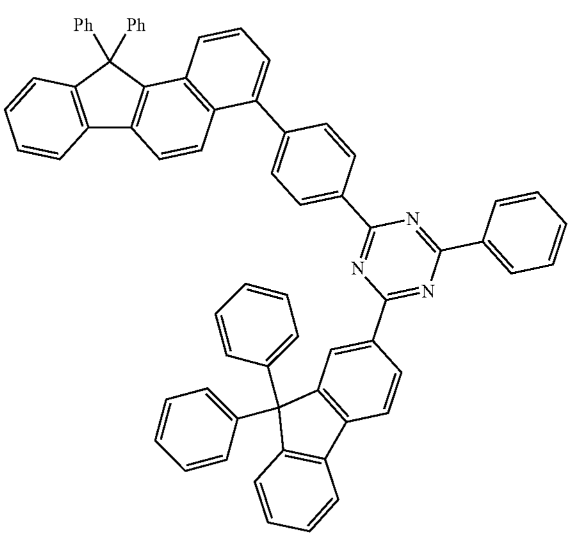
-continued
C-196
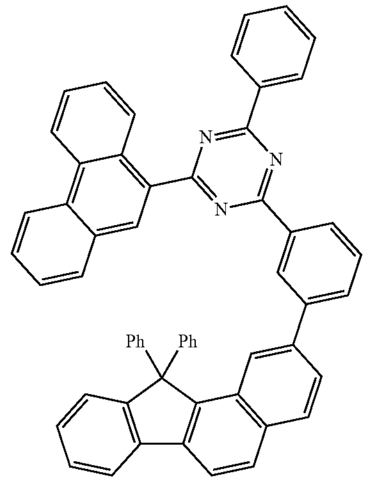
C-197
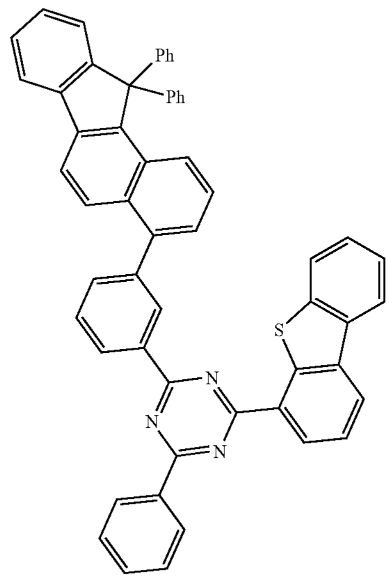
C-198
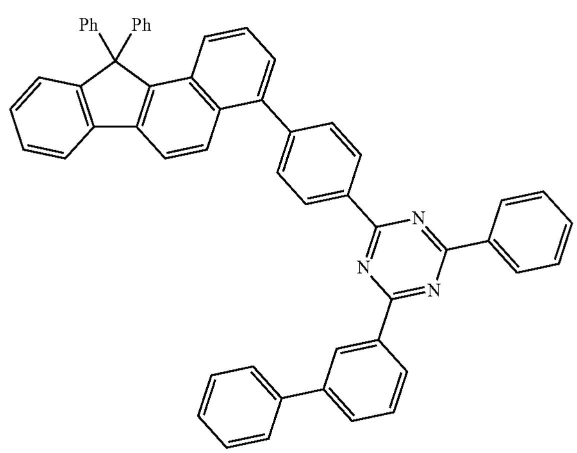

C-199
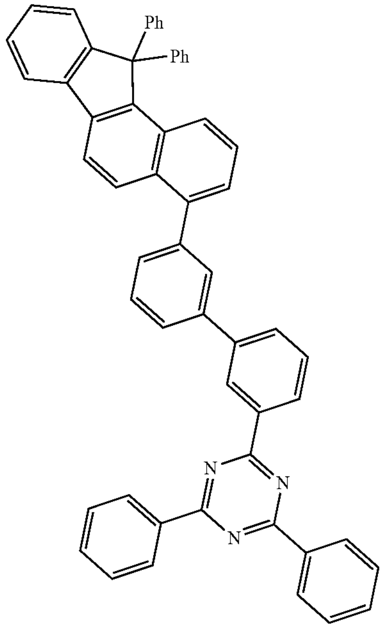
C-200
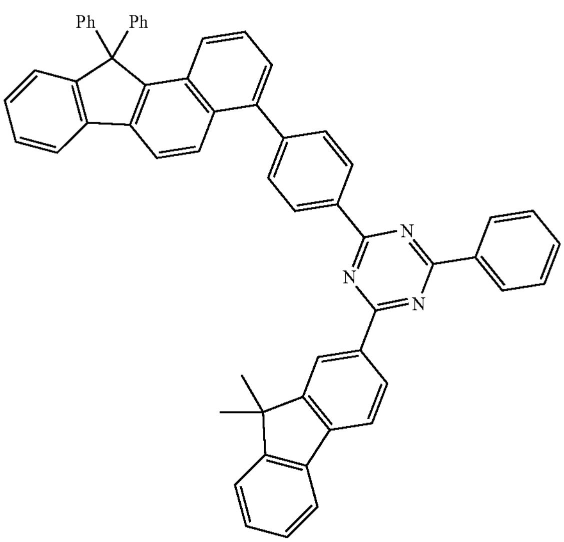
C-201
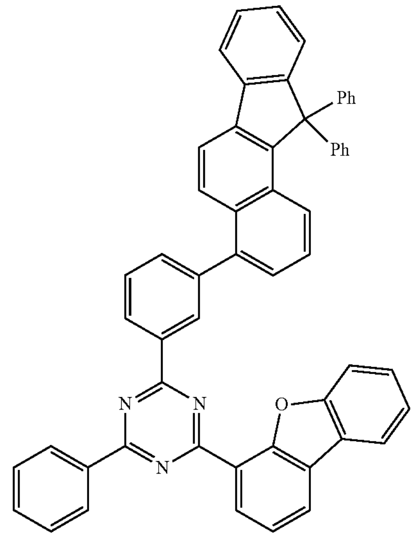
C-202
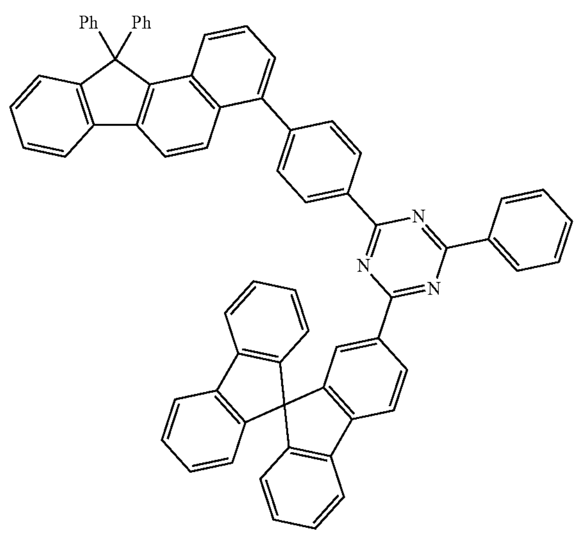

-continued
C-203
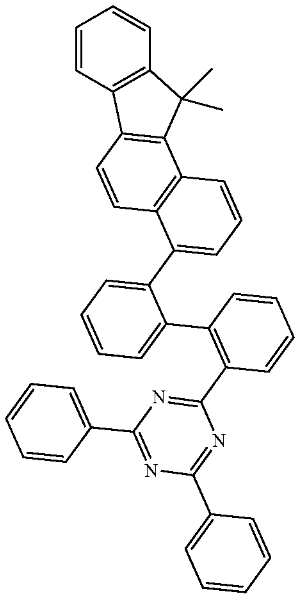
C-204
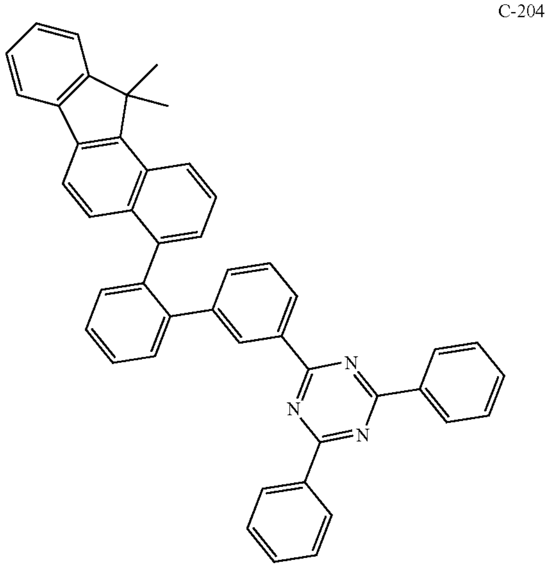
-continued
C-205
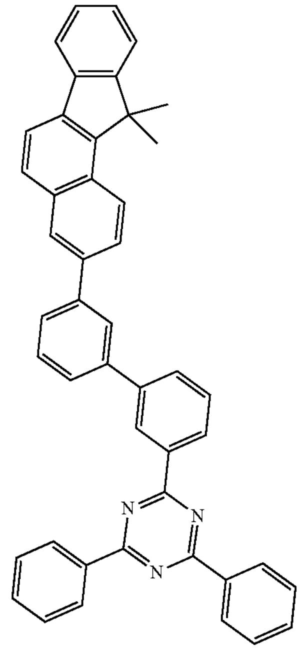
C-206
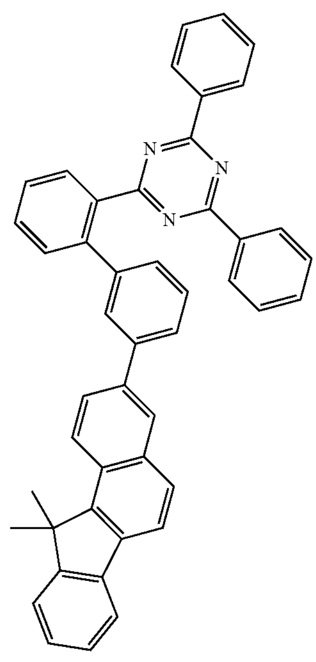

C-207
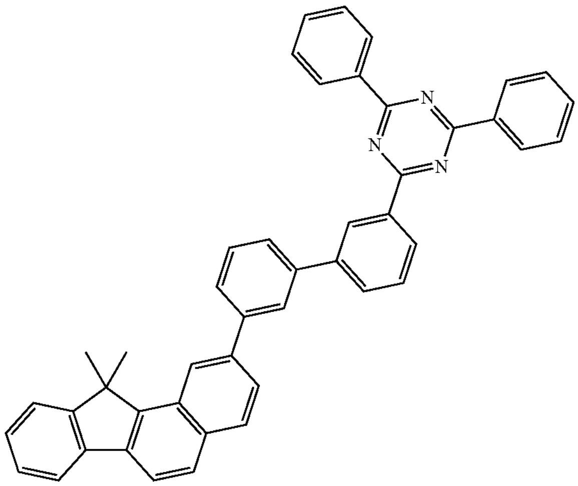
C-208
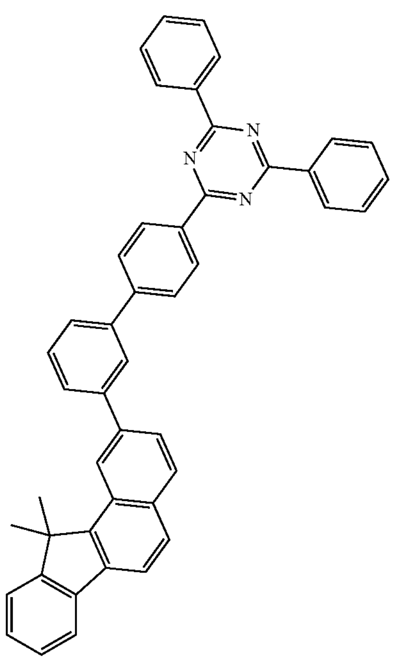
C-209
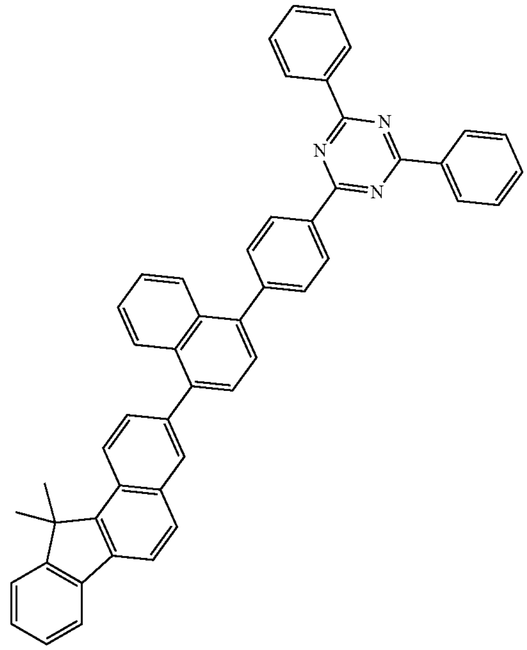
C-210
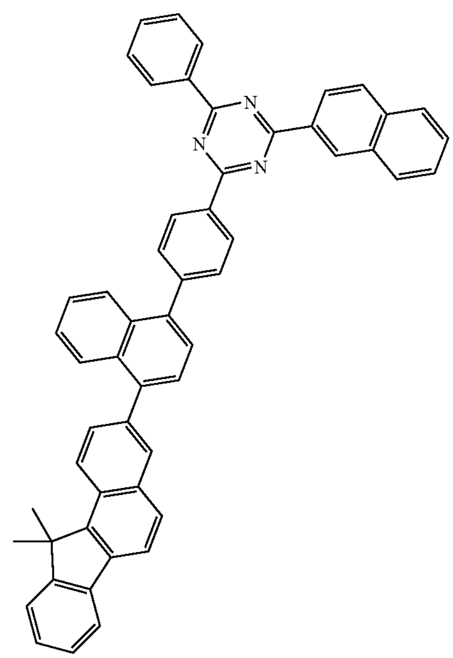

C-211
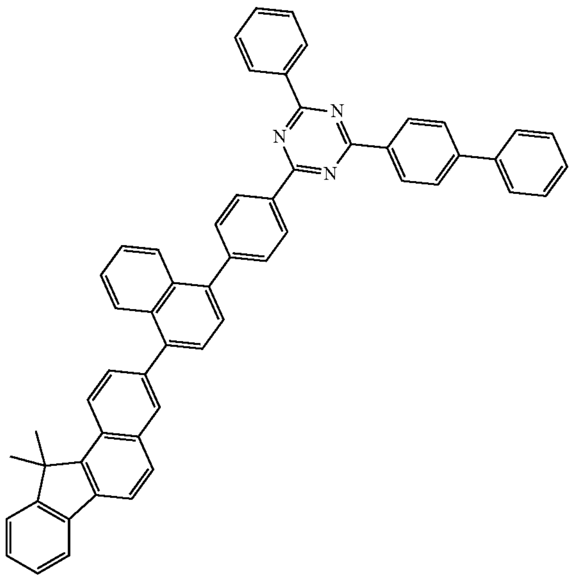
C-212
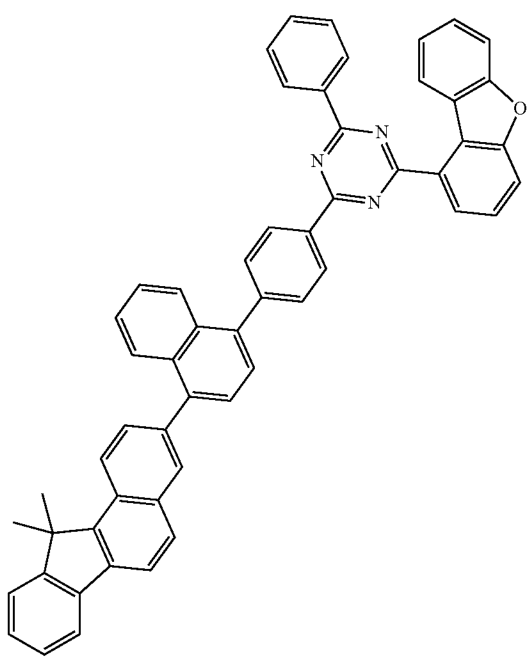
C-213
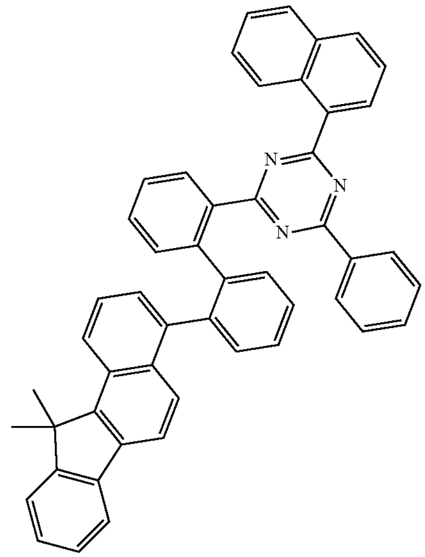
C-214
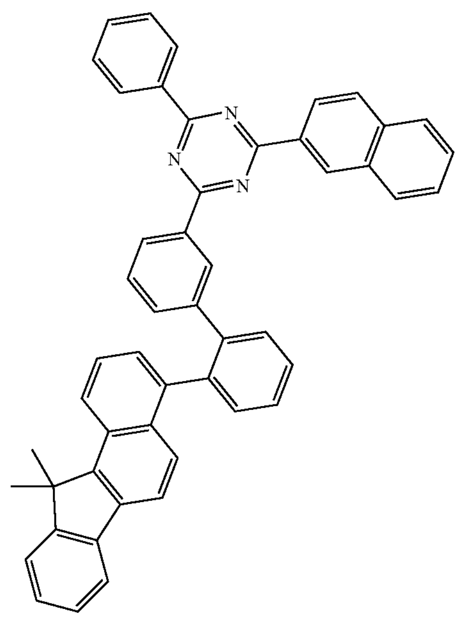

-continued
C-215
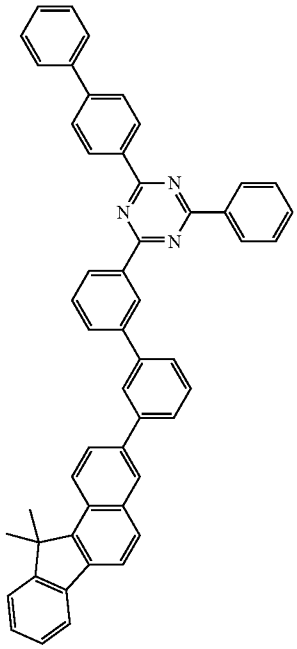
C-216
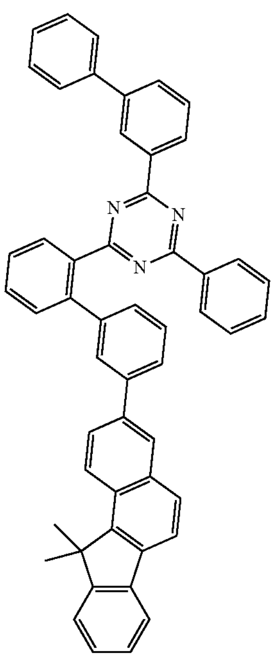
-continued
C-217
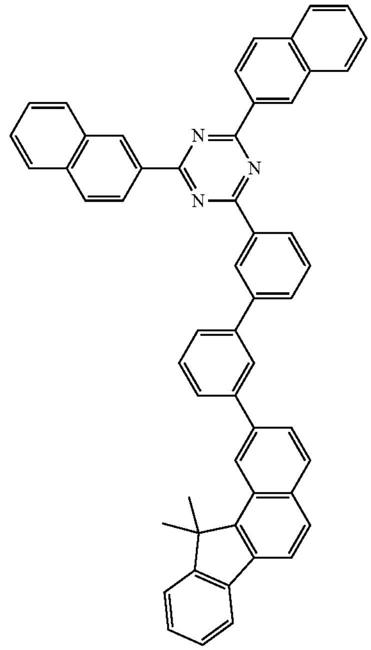
C-218
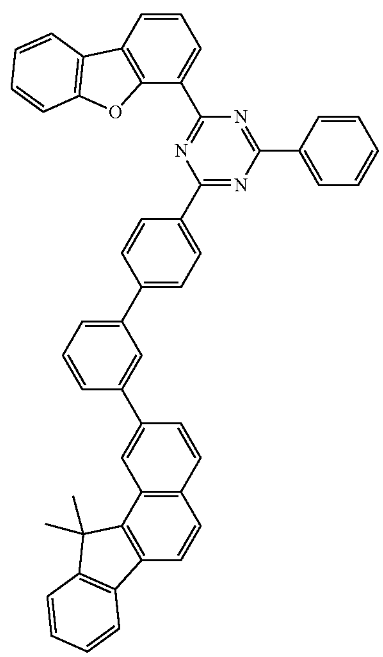

-continued
C-219
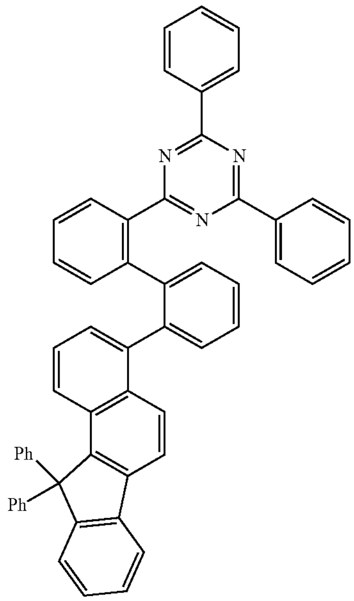
C-220
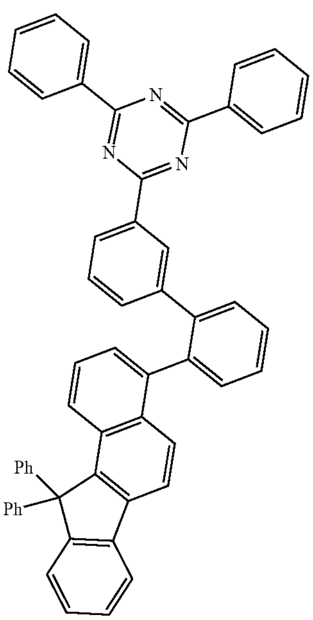
-continued
C-221
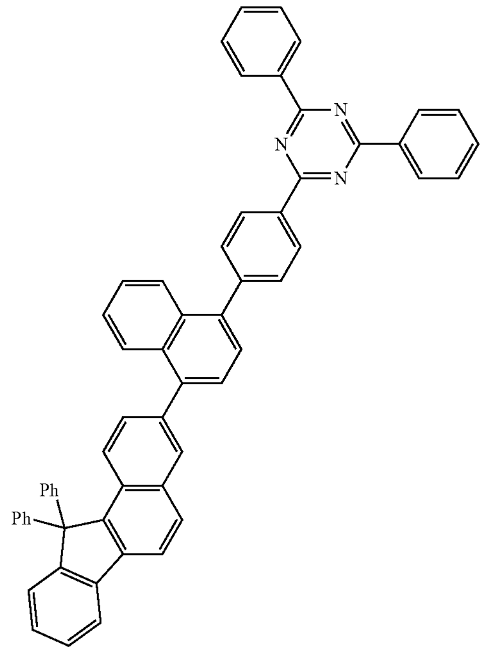
C-222
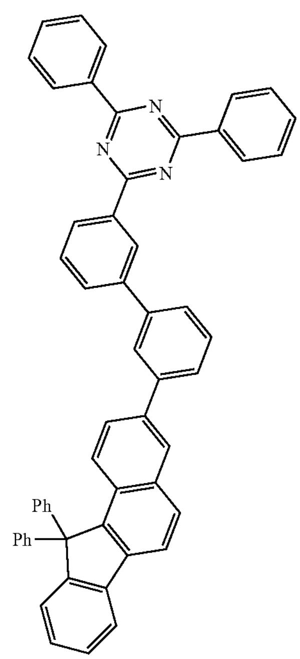

C-223
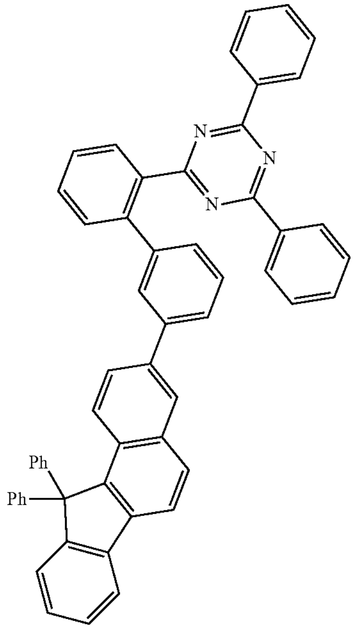
C-224
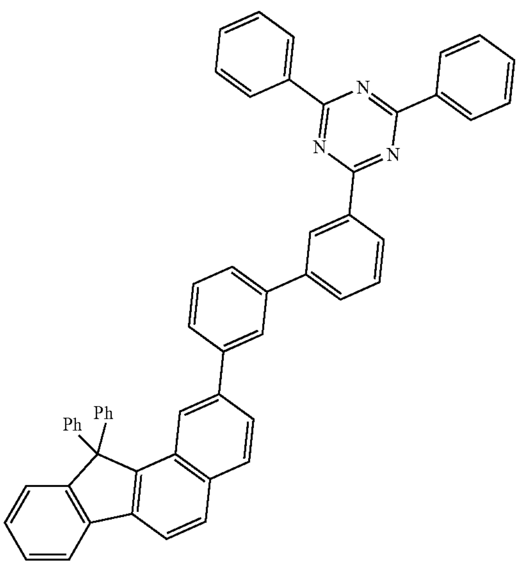
C-225
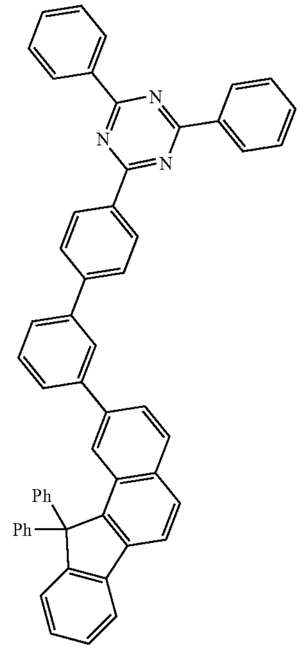
C-226
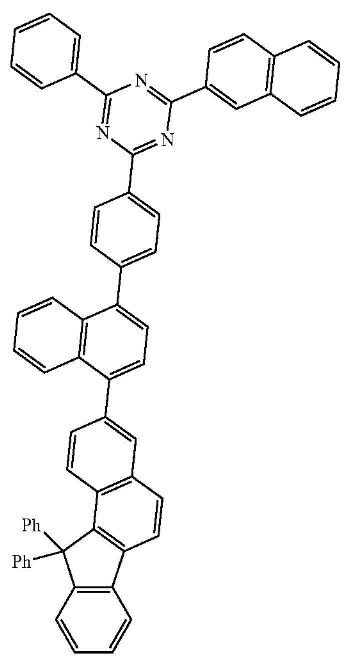

-continued
C-227
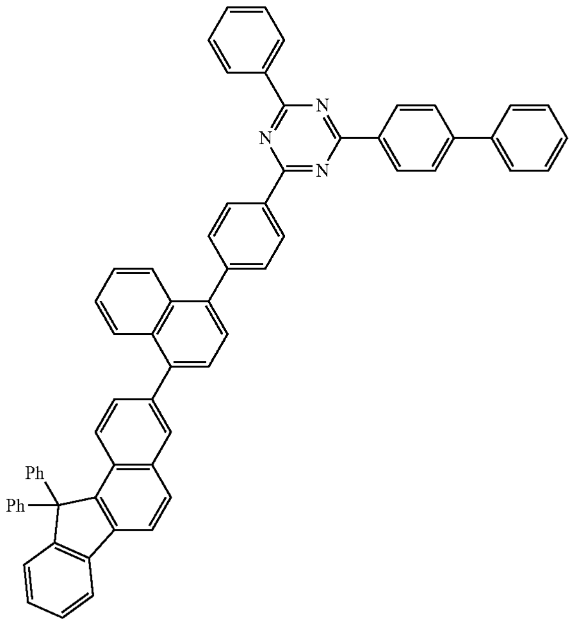
C-228
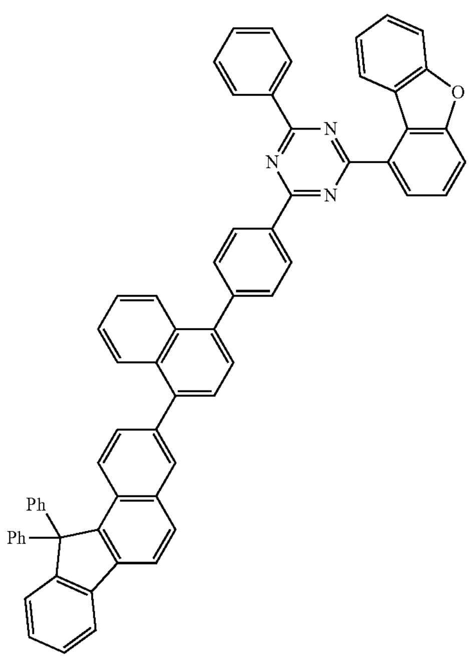
-continued
C-229
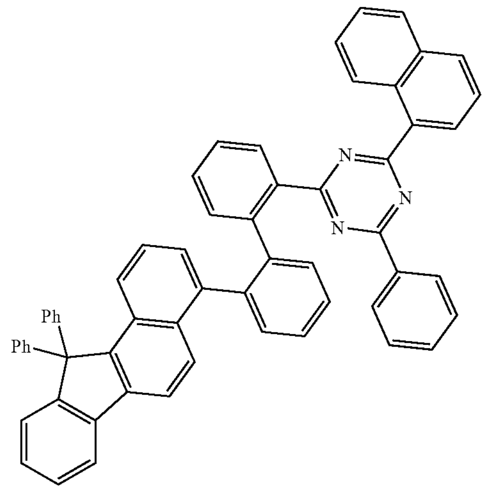
C-230
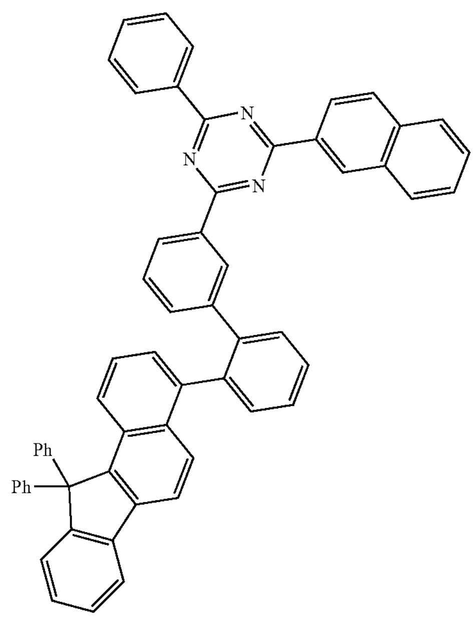

-continued
C-231
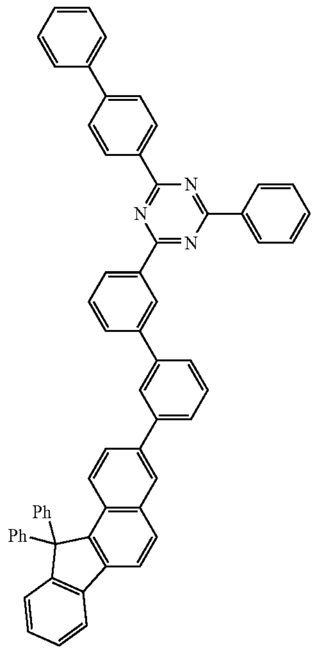
C-232
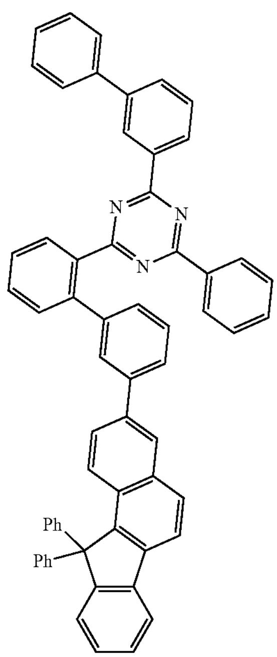
-continued
C-233
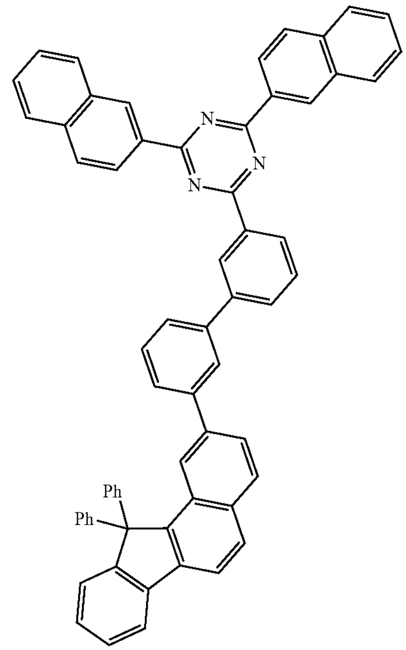
C-234
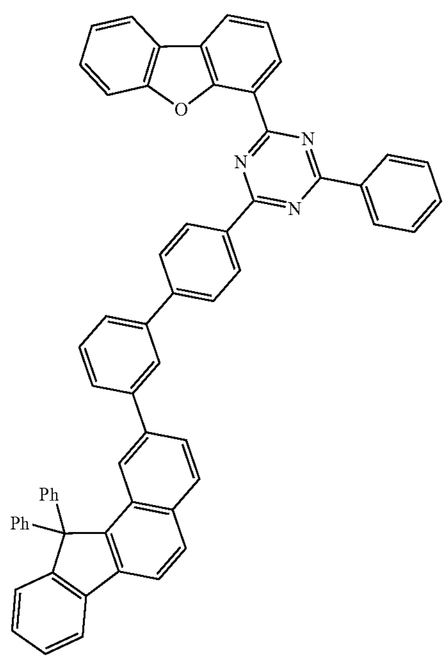

-continued
C-235
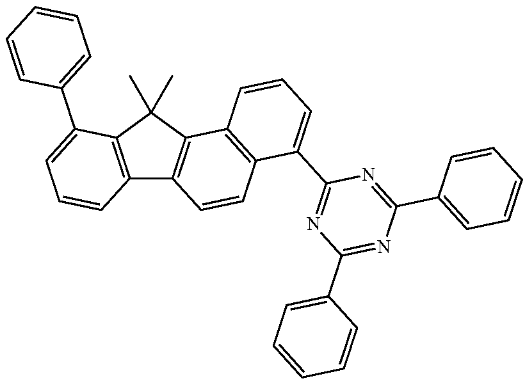
C-236
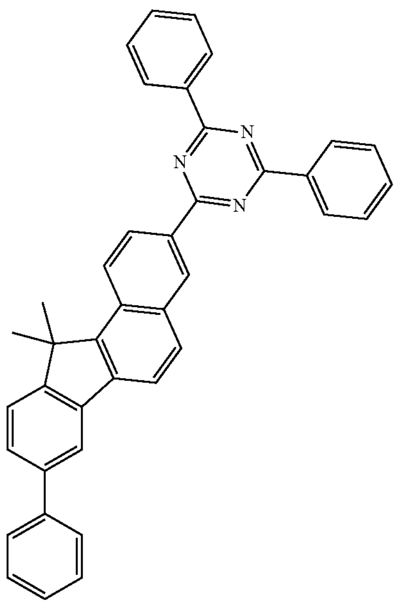
C-237
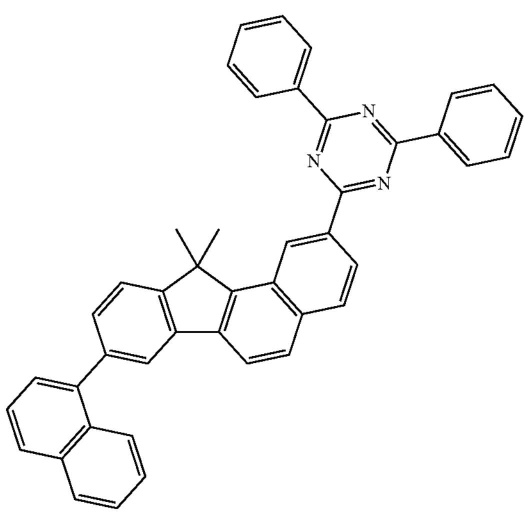
-continued
C-238
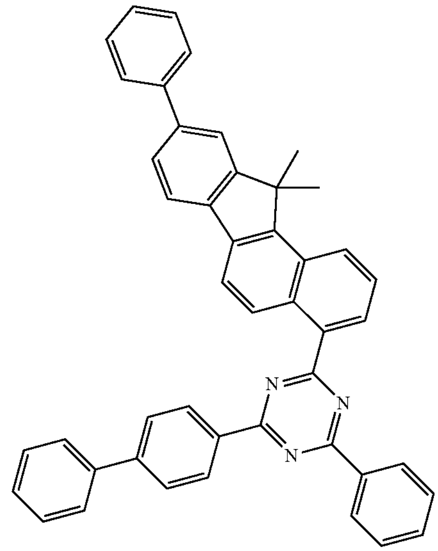
C-239
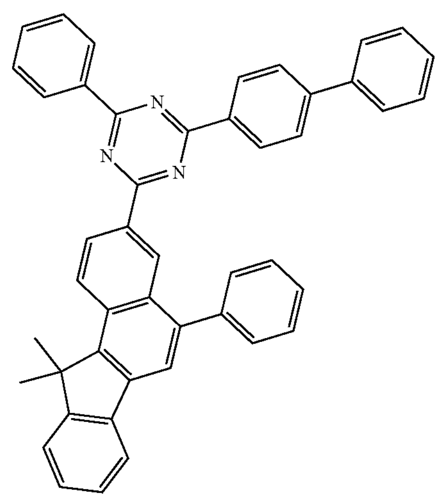

-continued
C-240
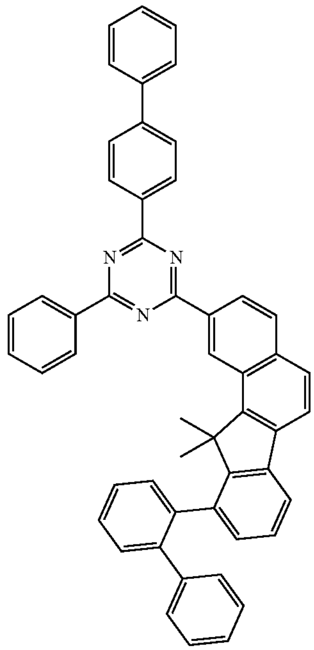
-continued
C-242
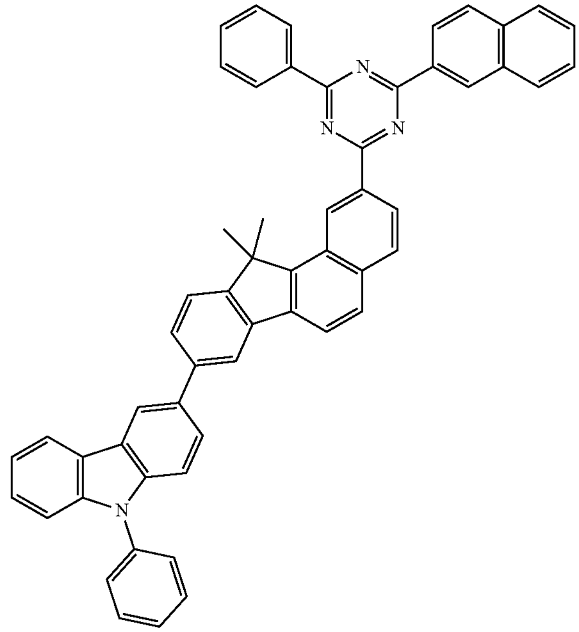
C-241
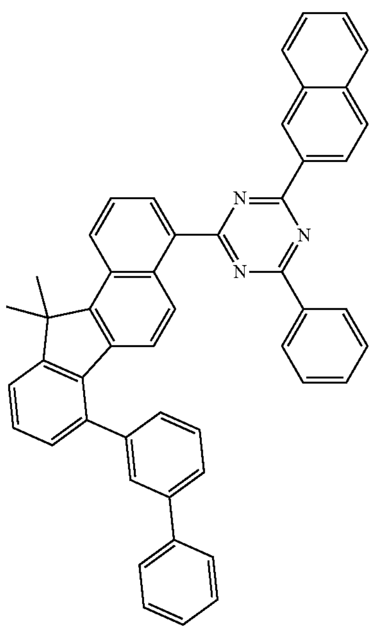
C-243
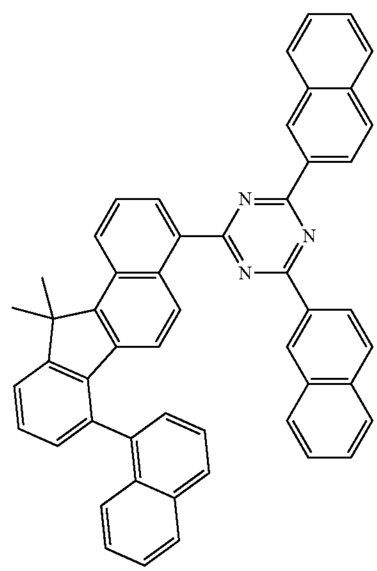

-continued
C-244
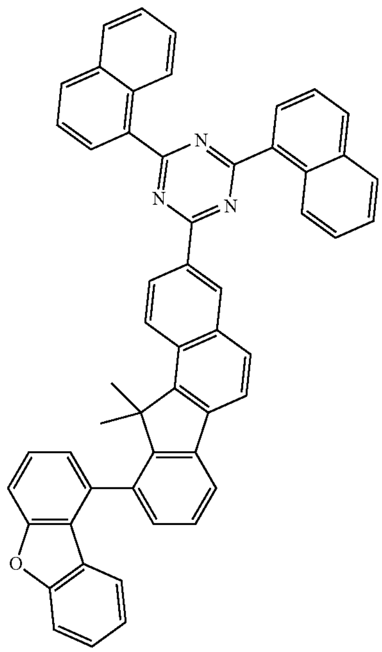
C-245
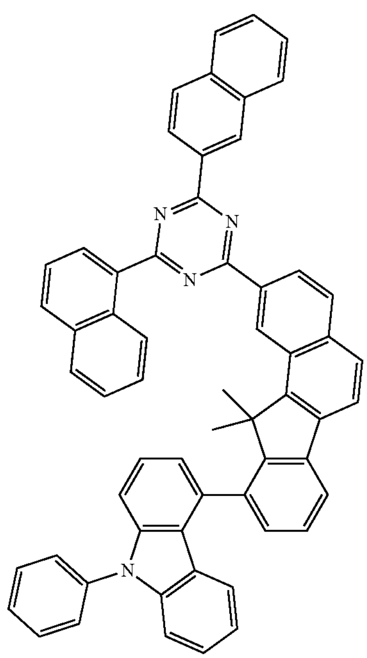
-continued
C-246
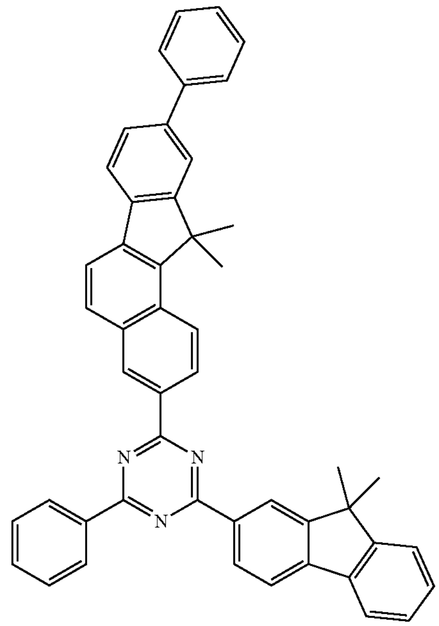
C-247
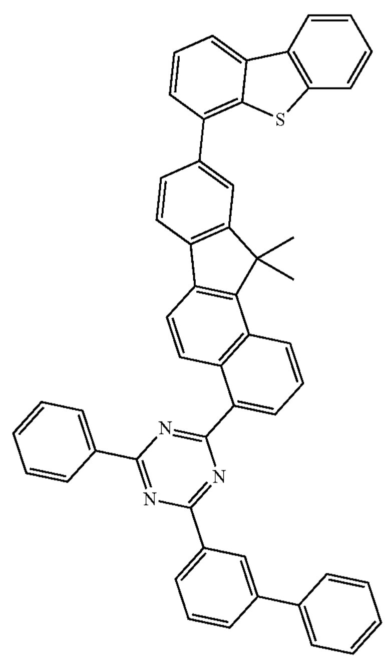

-continued
C-248
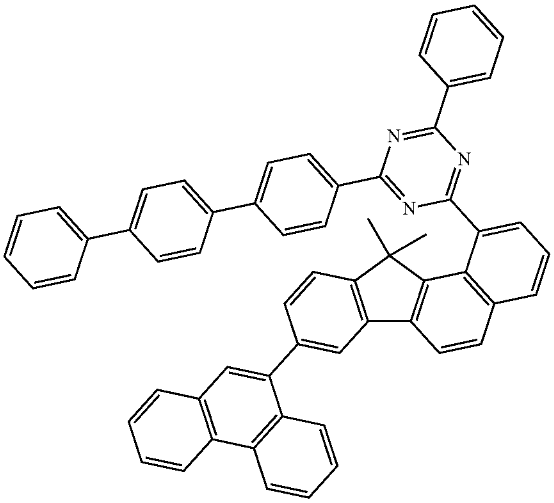
C-249
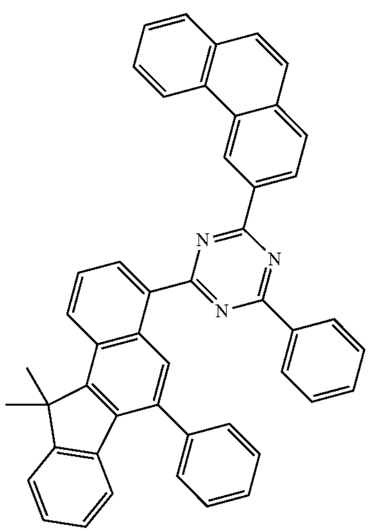
-continued
C-250
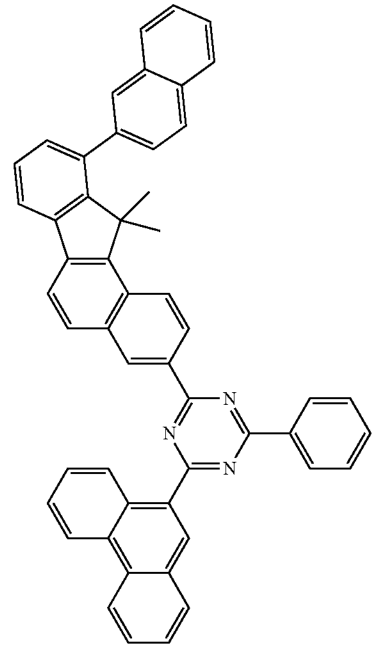
C-251
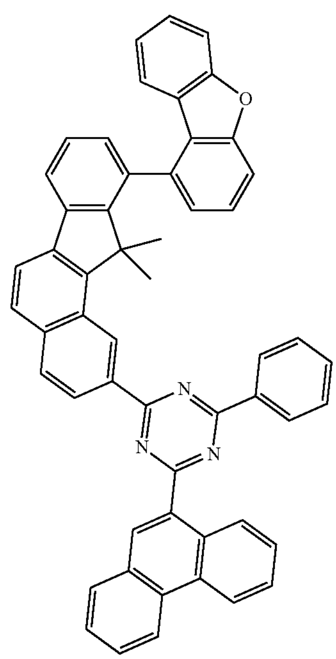

-continued
C-252
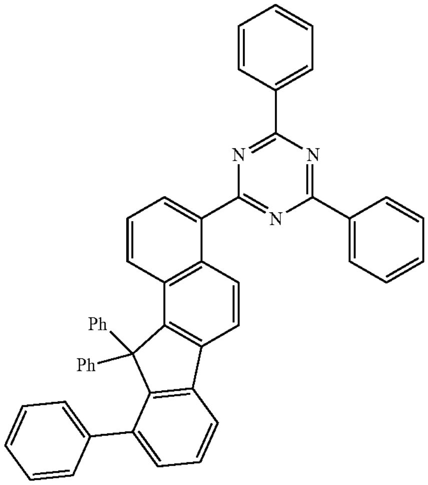
C-253
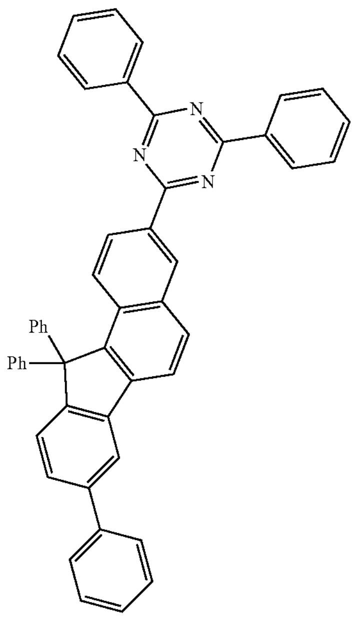
C-254
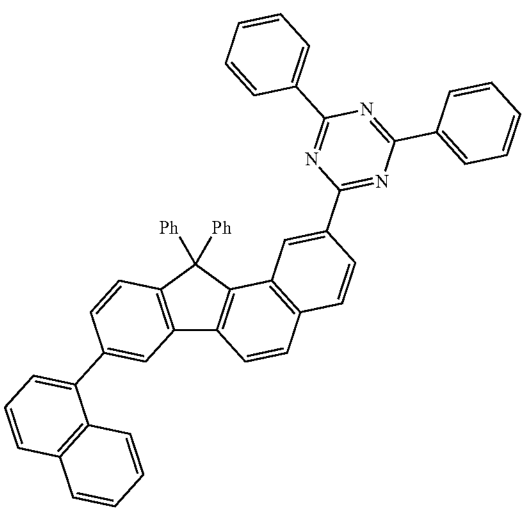
-continued
C-255
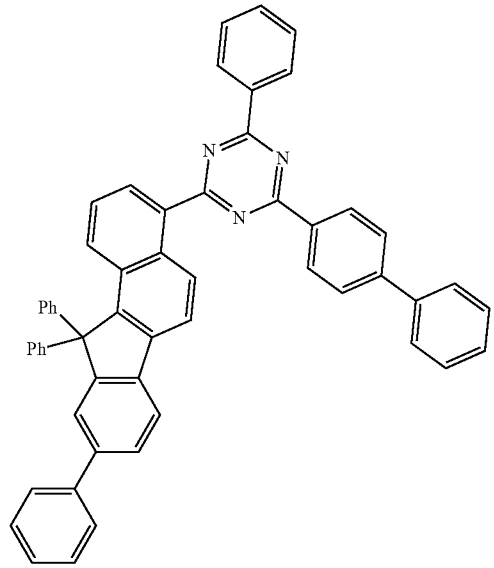
C-256
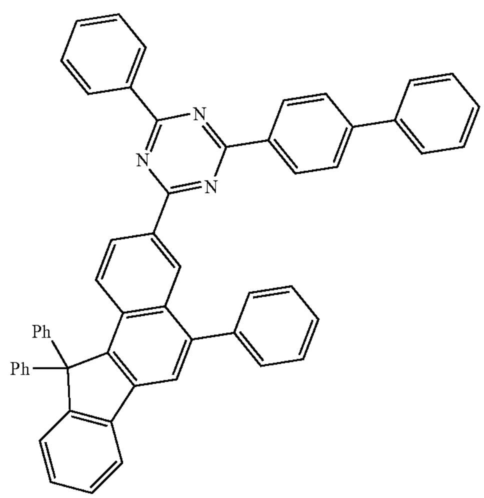

-continued
C-257
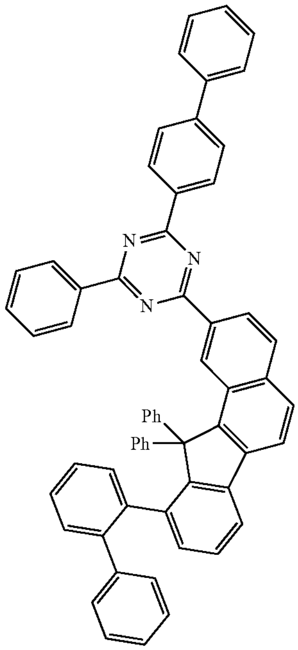
C-258
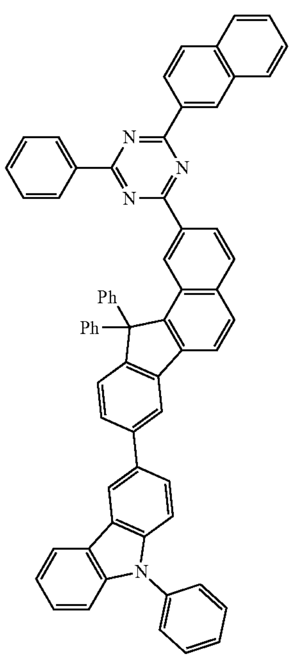
-continued
C-259
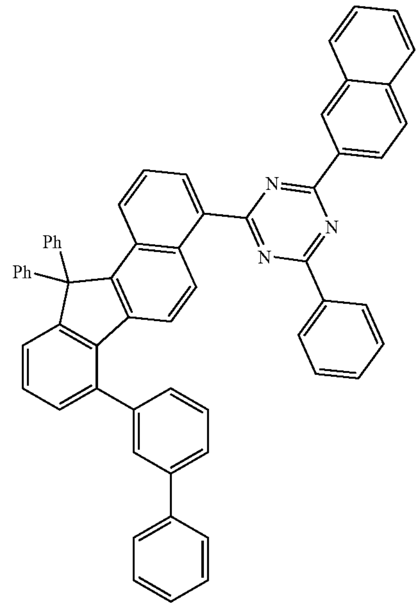
C-260
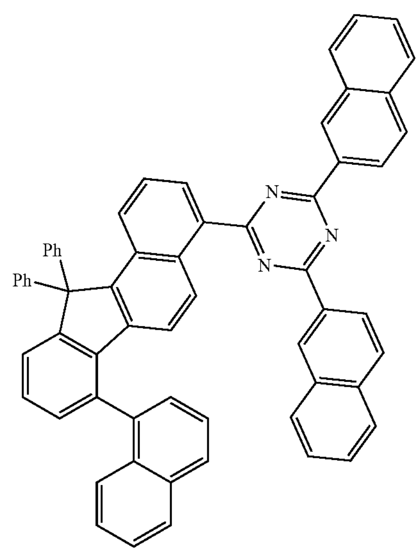

-continued
C-261
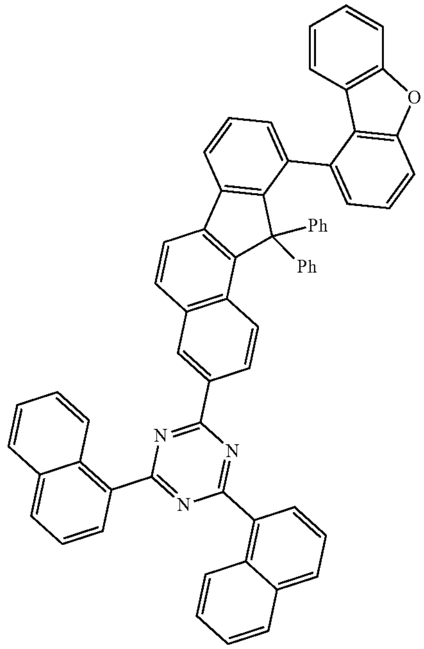
C-262
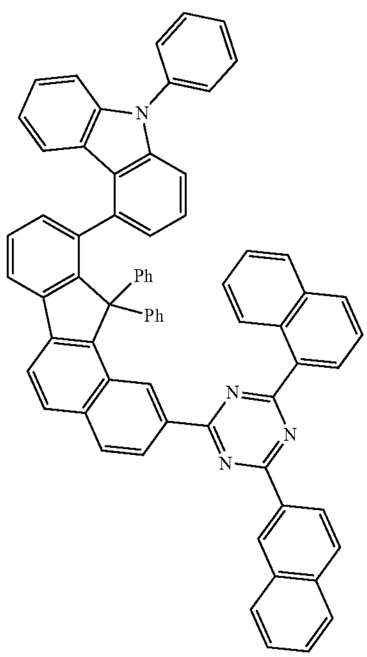
-continued
C-263
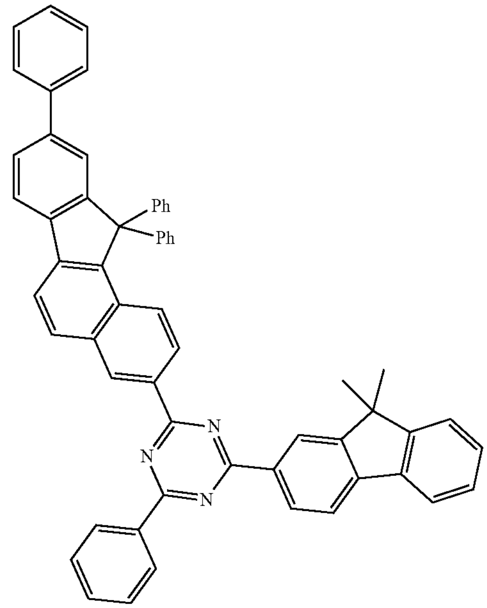
C-264
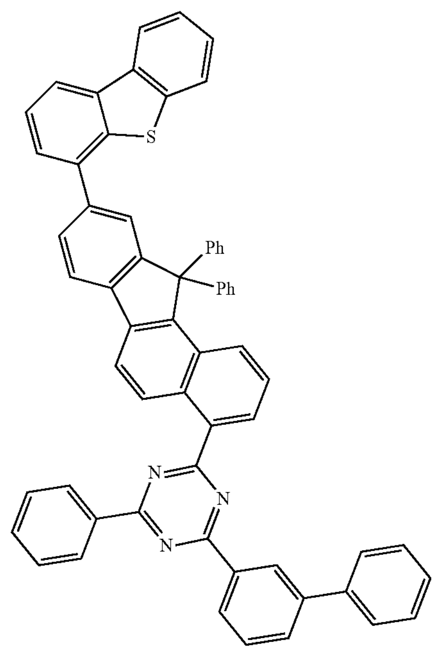

C-265
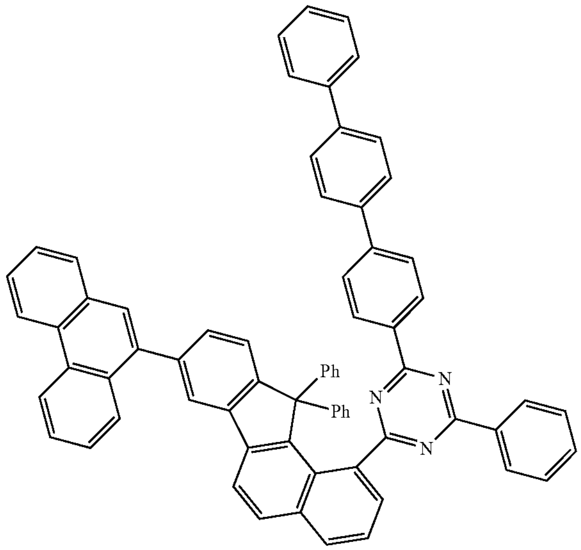
C-266
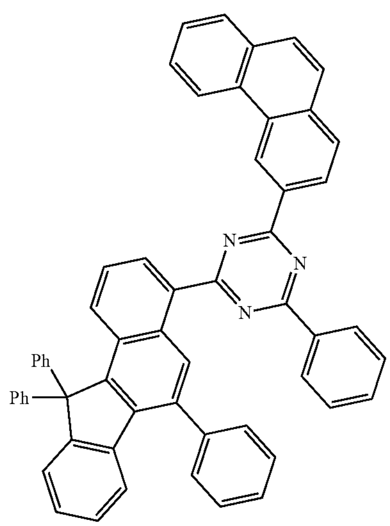
C-267
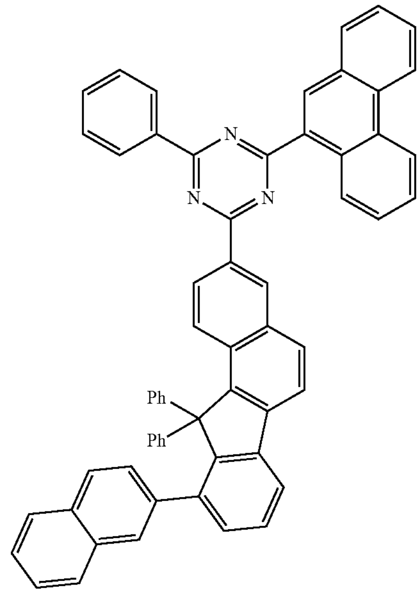
C-268
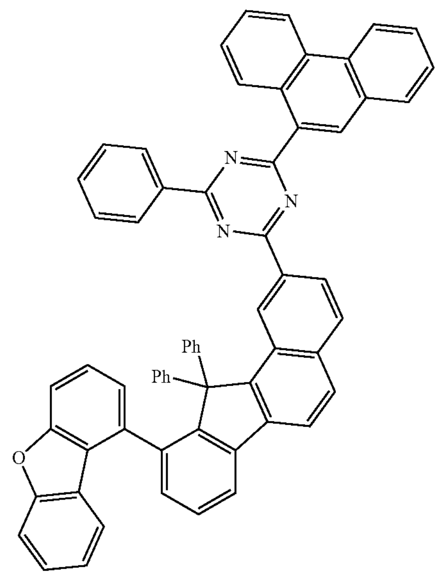
C-269
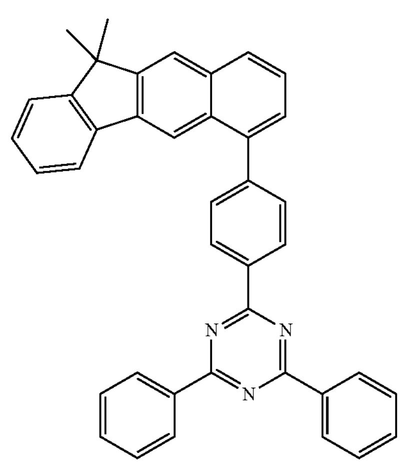

-continued
C-270
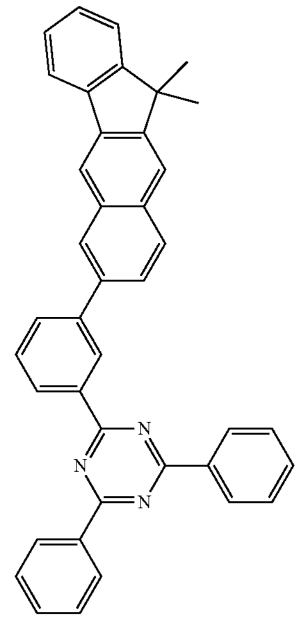
C-271
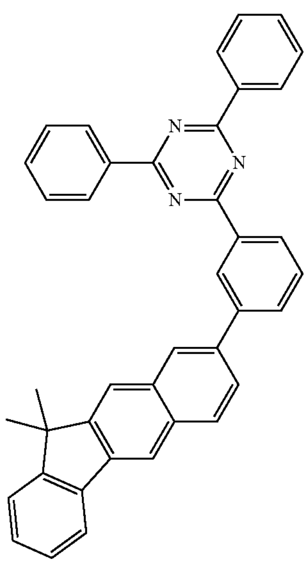
C-272
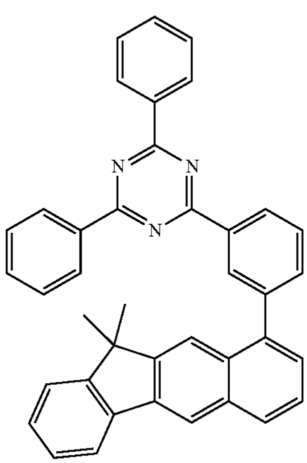
-continued
C-273
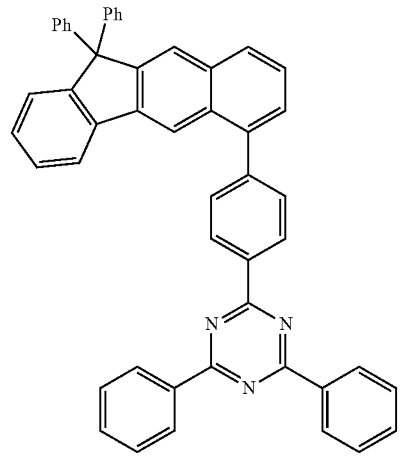
C-274
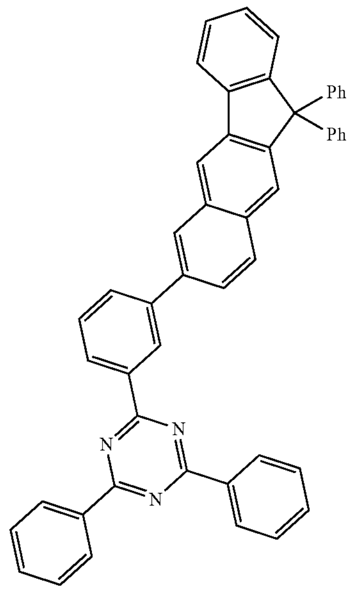
C-275
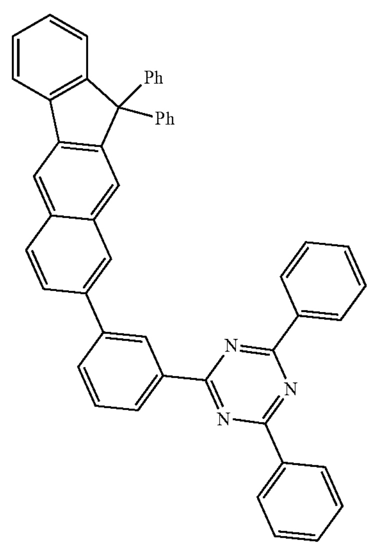

-continued
C-276
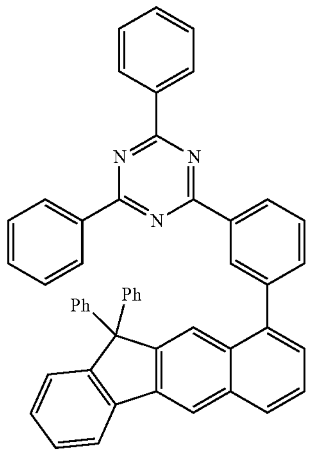
C-277
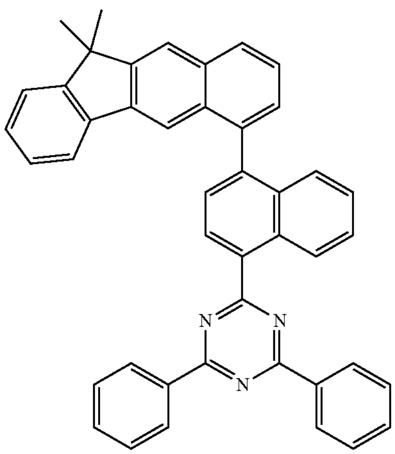
C-278
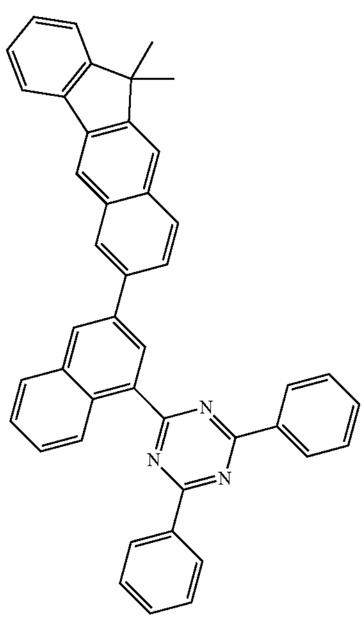
-continued
C-279
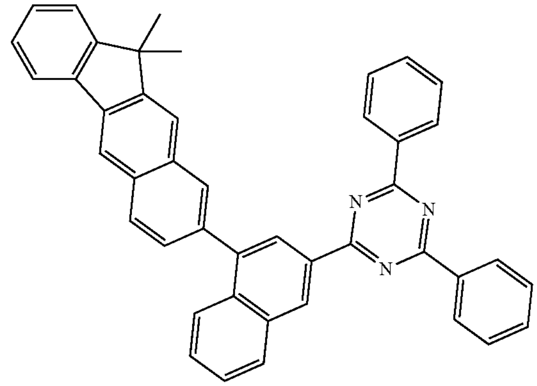
C-280
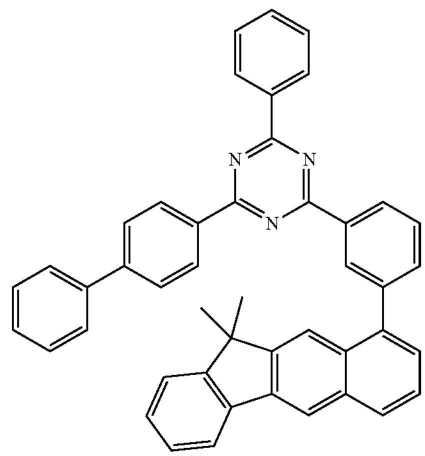
C-281
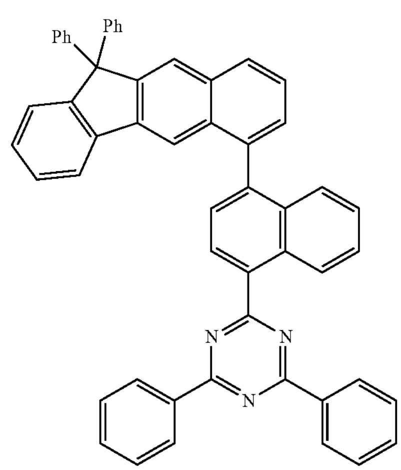

-continued
C-282
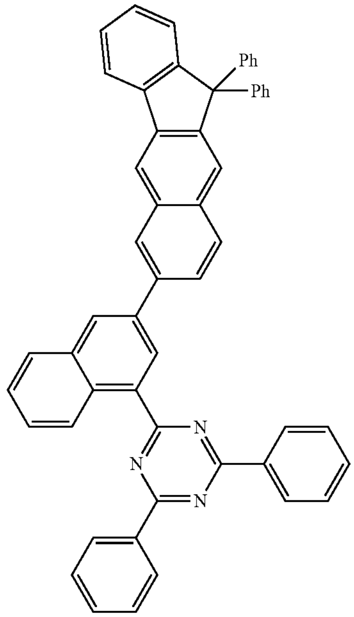
C-283
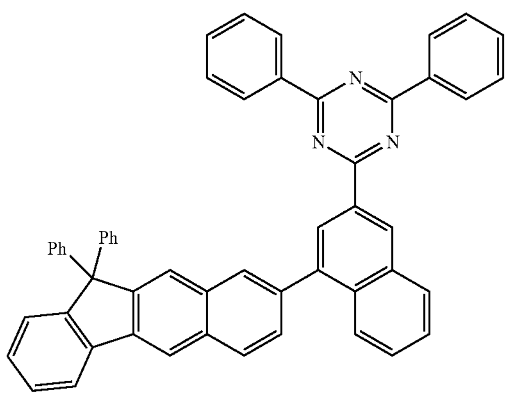
C-284
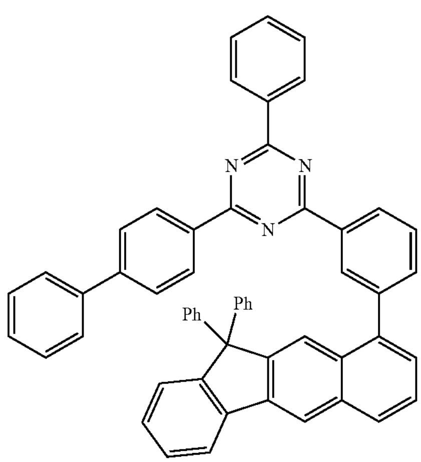
-continued
C-285
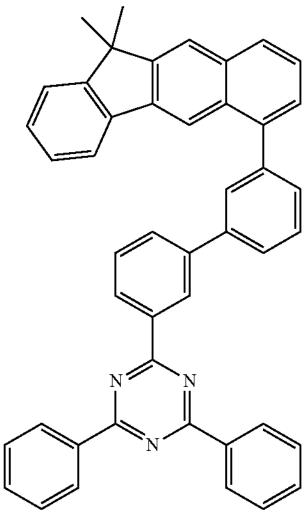
C-286
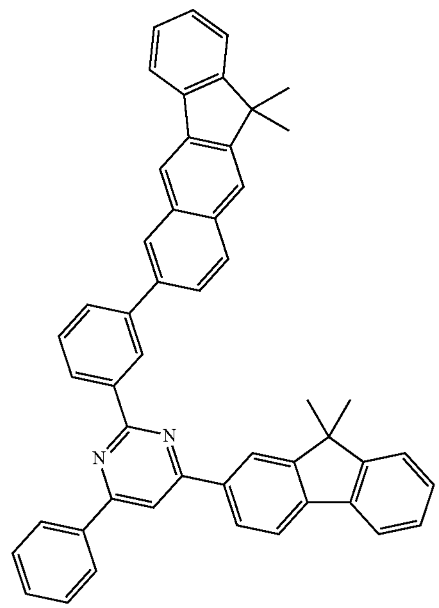
C-287
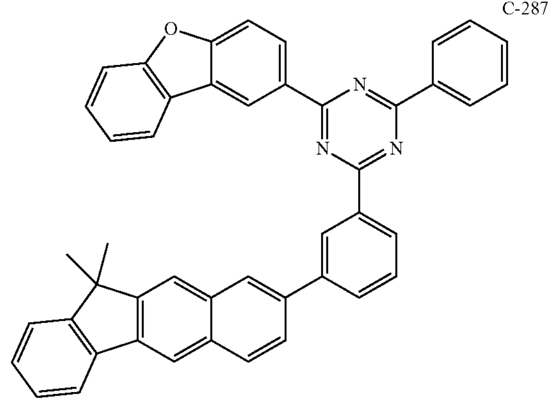

C-288
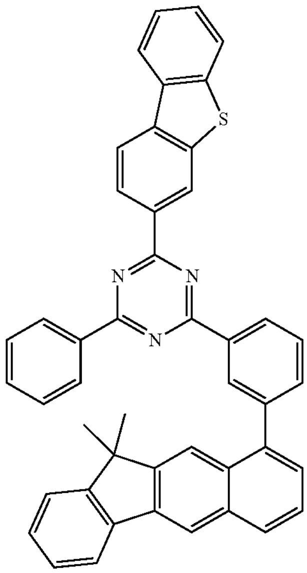
C-289
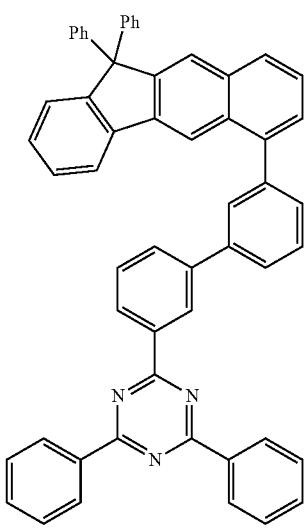
C-290
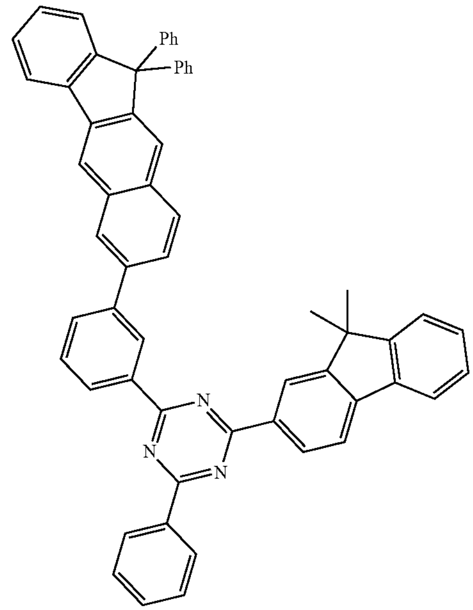
C-291
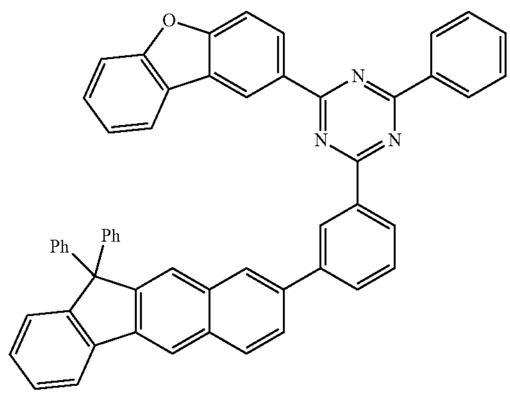
C-292
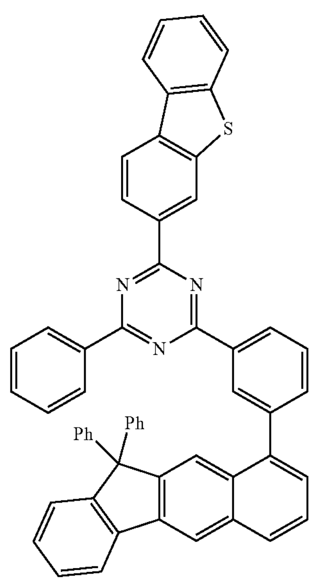

-continued
C-317
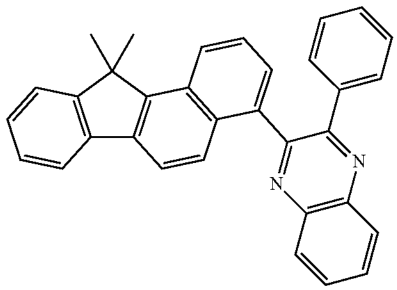
C-318
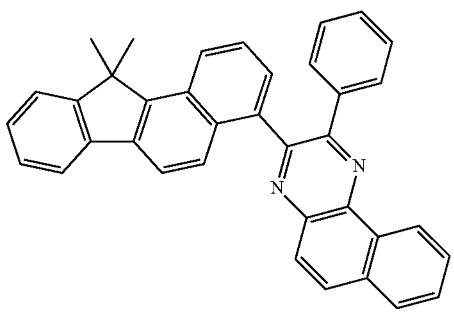
C-319
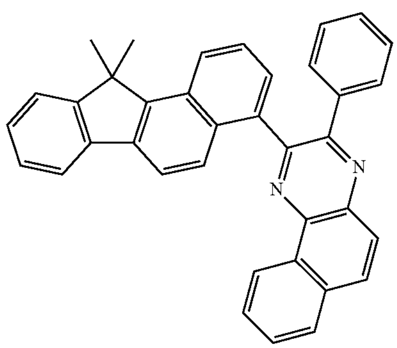
C-320
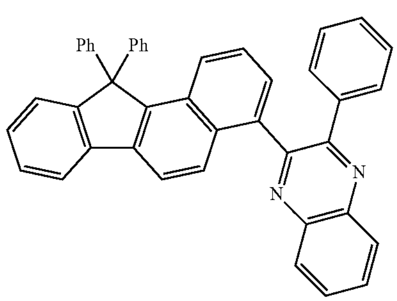
C-321
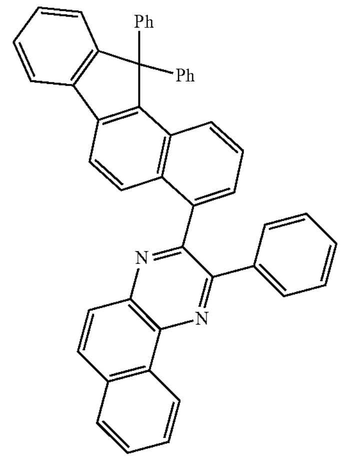
C-322
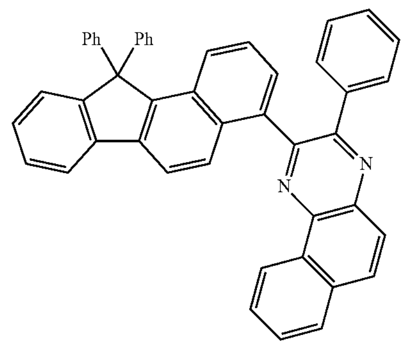
C-323
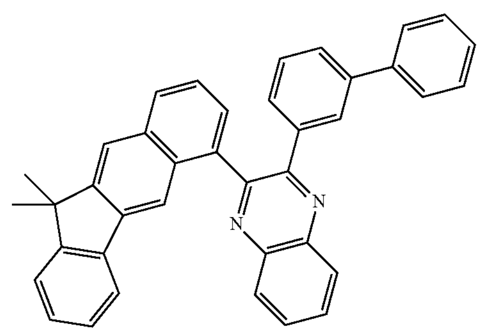
C-324
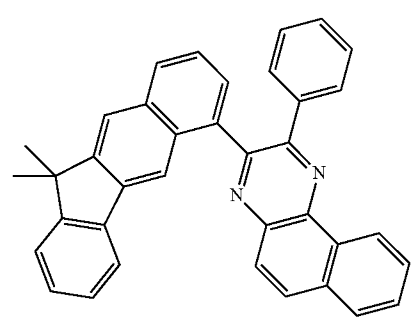

-continued
C-325
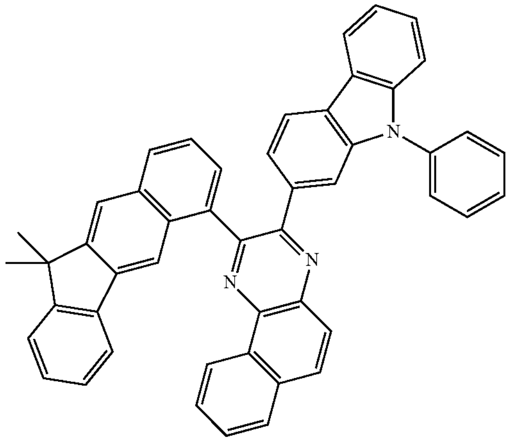
C-326
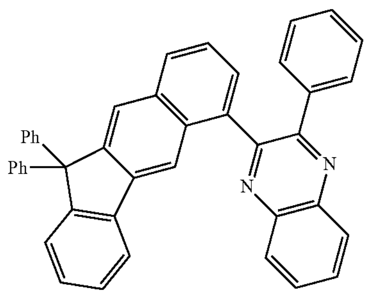
C-327
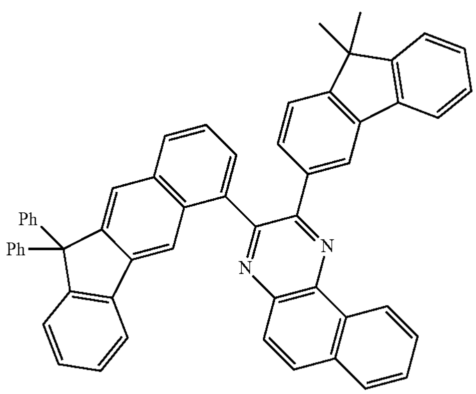
C-328
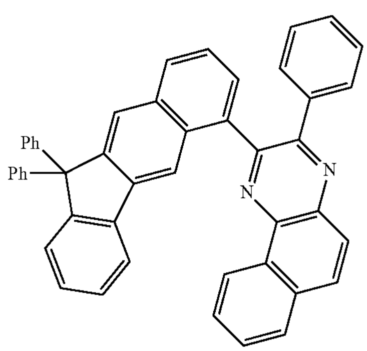
-continued
C-335
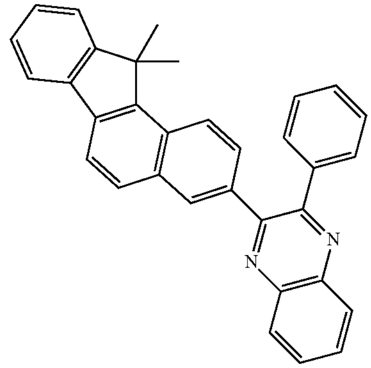
C-336
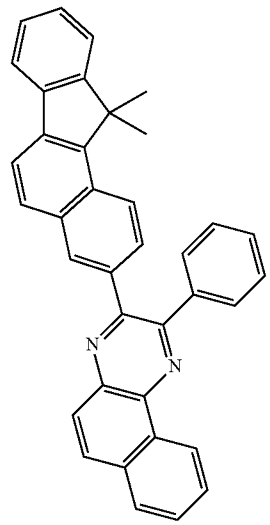
C-337
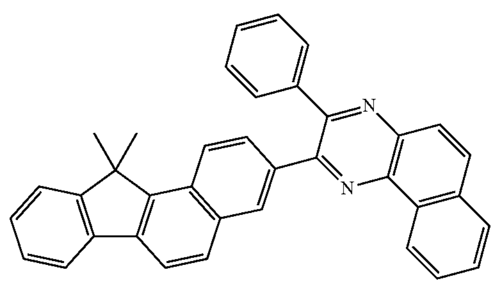
C-338
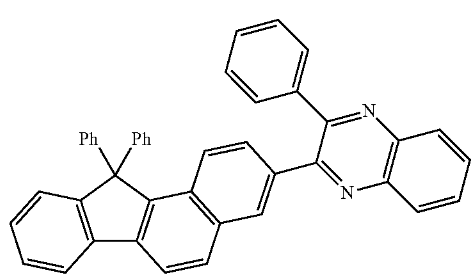

-continued
C-339
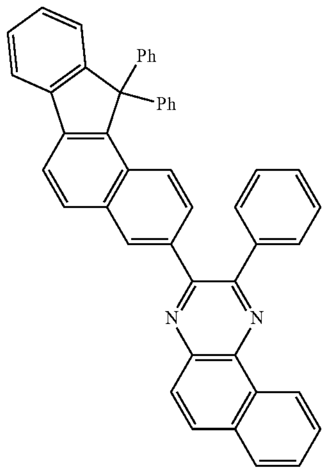
C-340
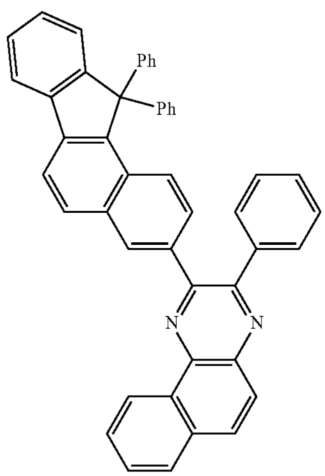
C-341
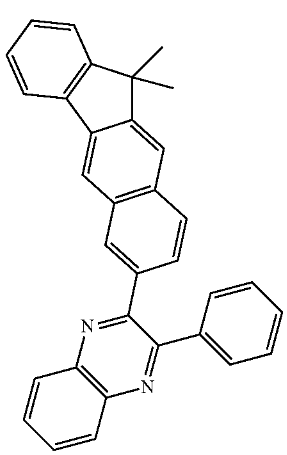
-continued
C-342
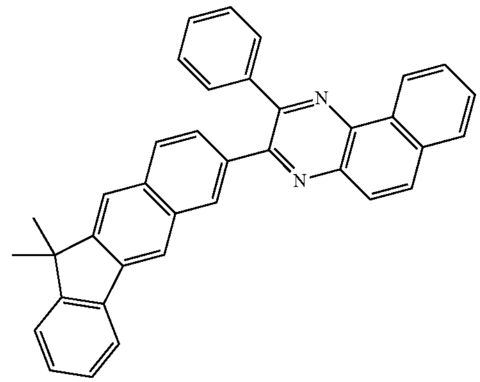
C-343
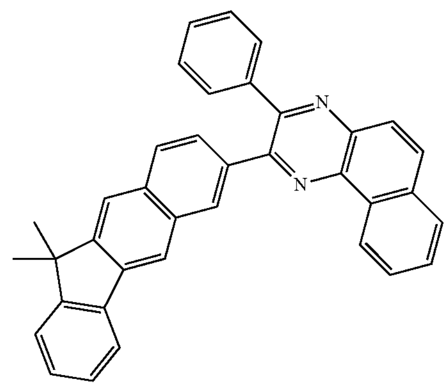
C-344
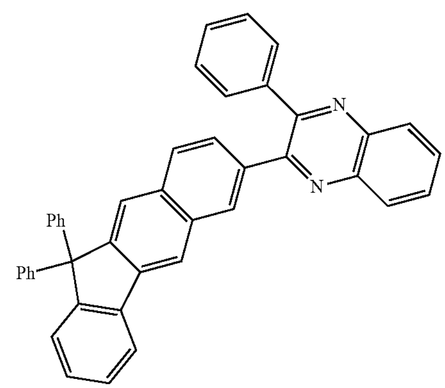
C-345
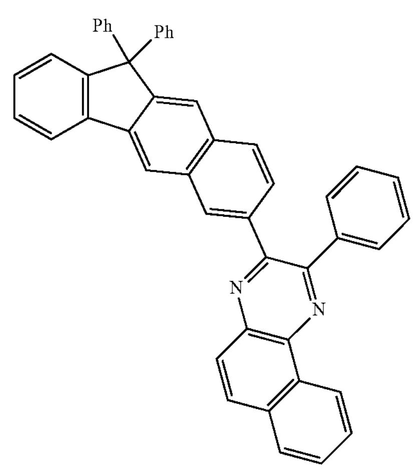

-continued
C-346
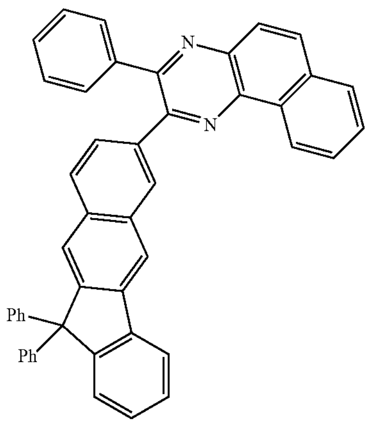
C-353
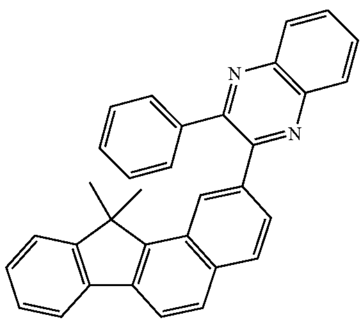
C-354
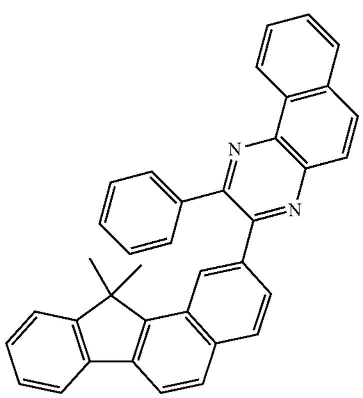
C-355
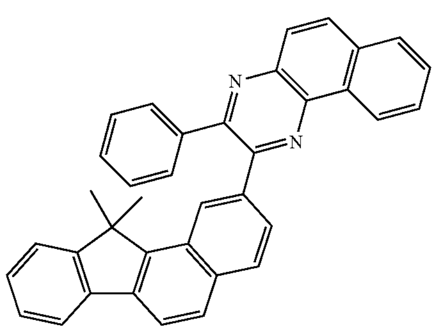
-continued
C-356
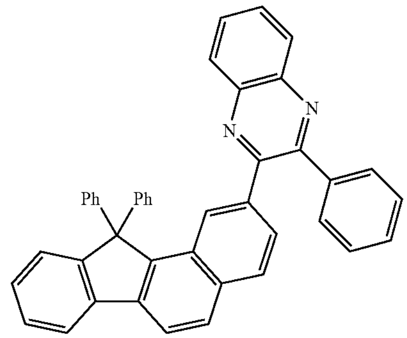
C-357
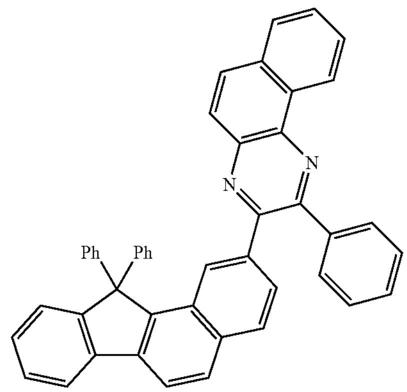
C-358
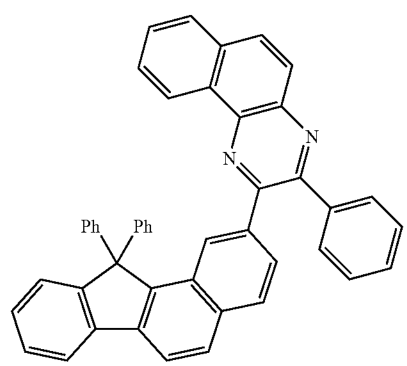
C-359
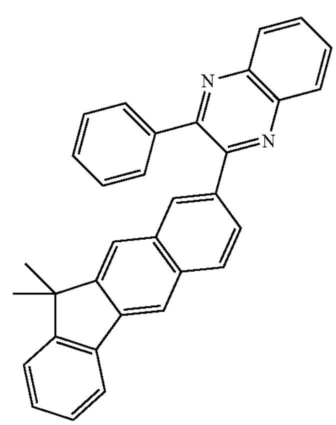

-continued
C-360
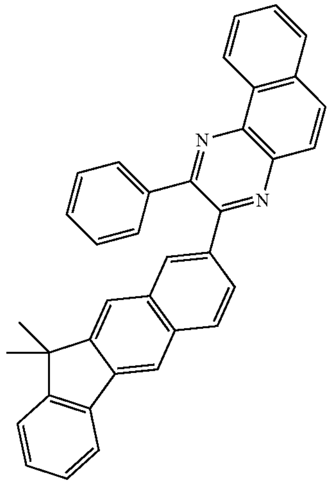
C-361
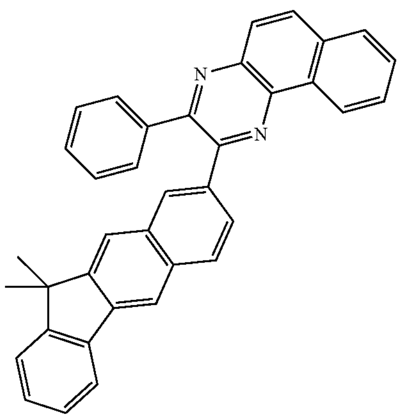
C-362
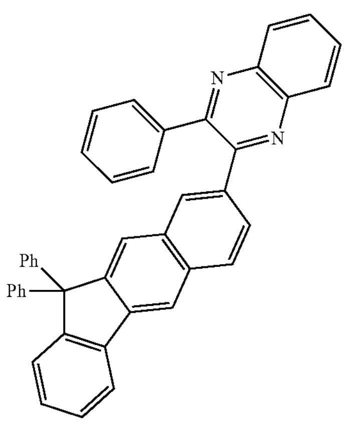
-continued
C-363
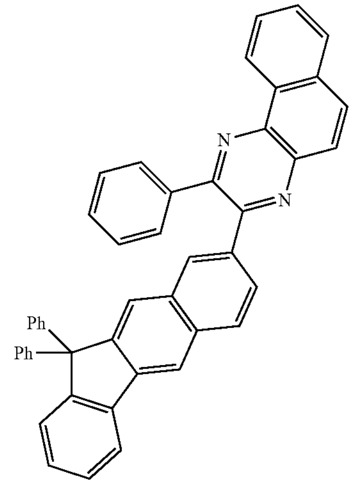
C-364
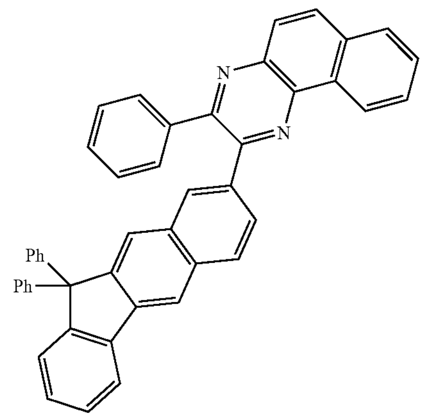
C-365
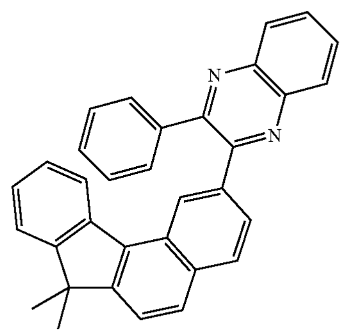
C-371
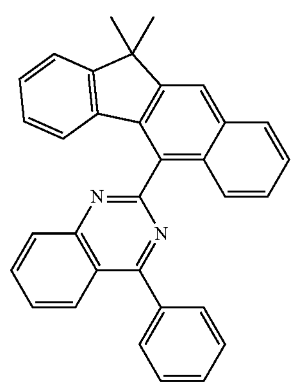

-continued
C-372
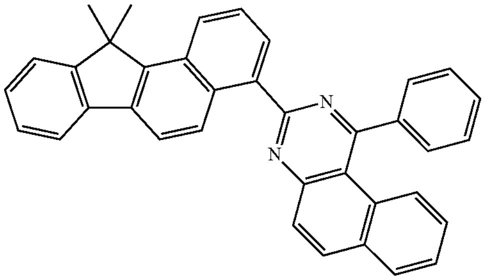
C-373
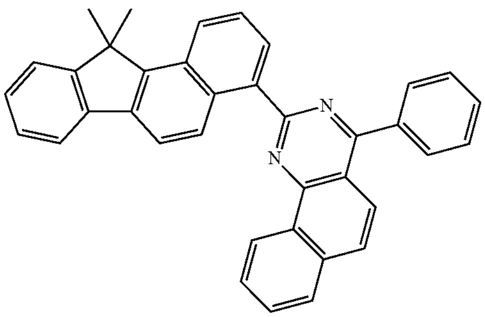
C-374
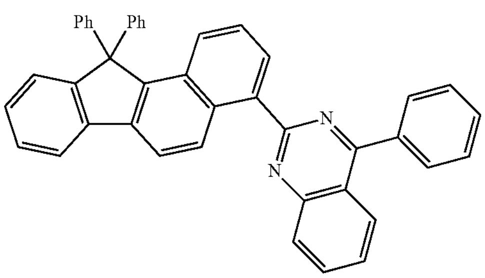
C-375
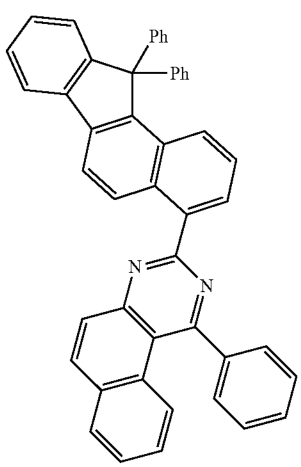
-continued
C-376
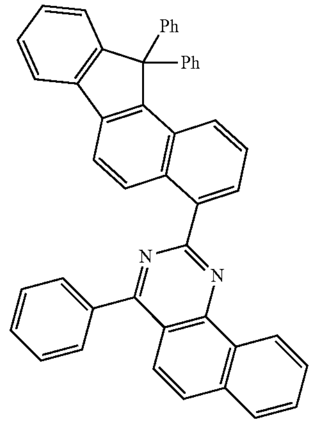
C-377
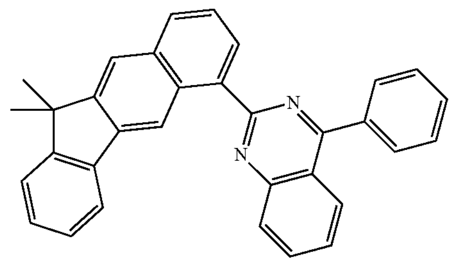
C-378
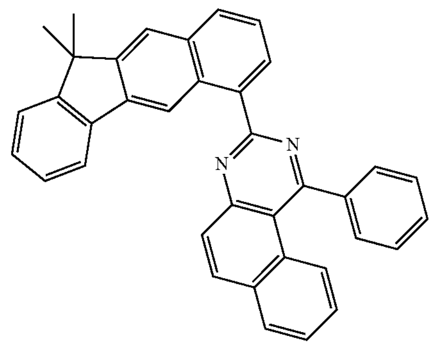
C-379
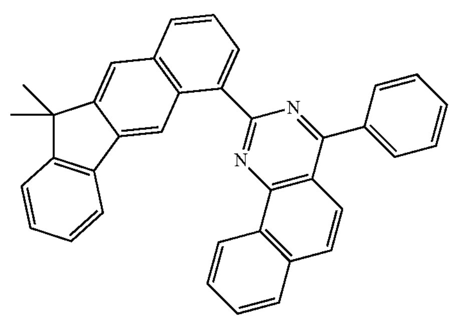

-continued
C-380
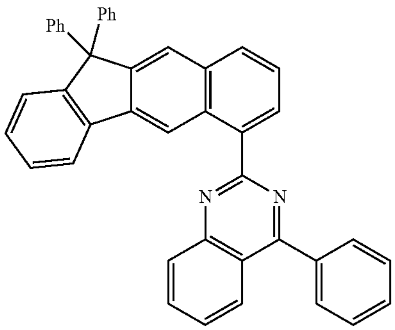
C-381
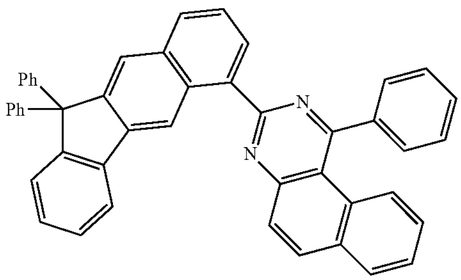
C-382
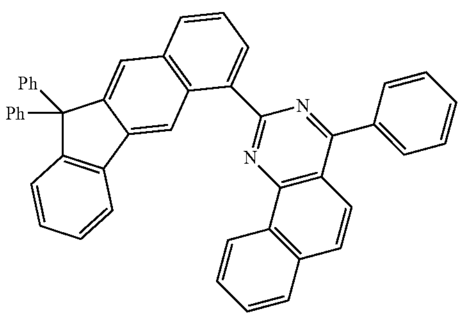
C-389
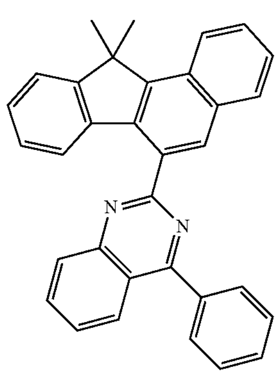
-continued
C-390
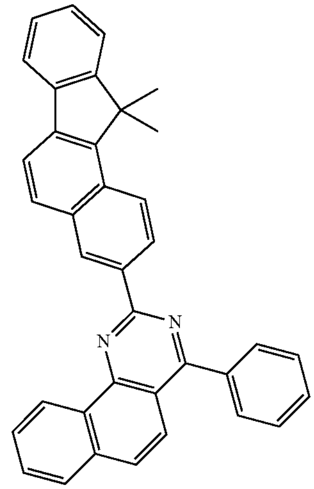
C-391
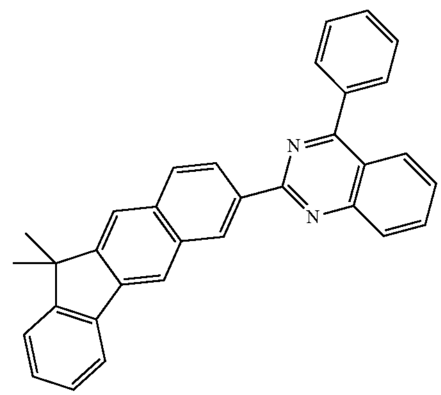
C-392
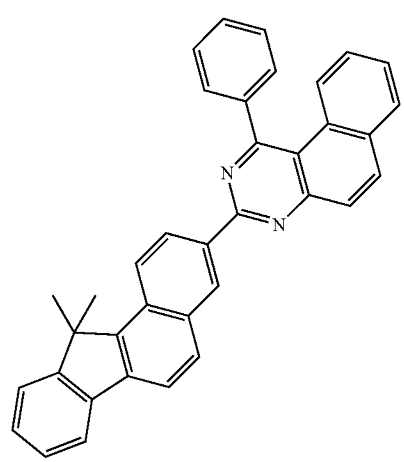

-continued
C-393
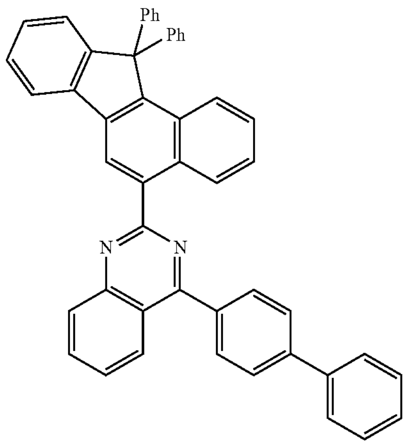
C-394
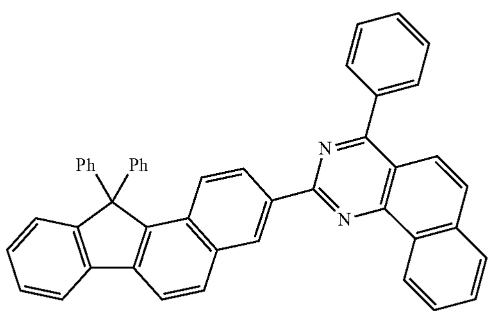
C-395
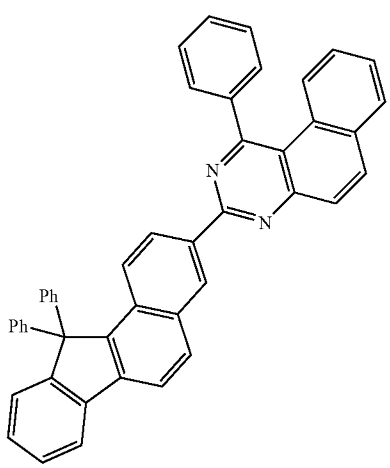
-continued
C-396
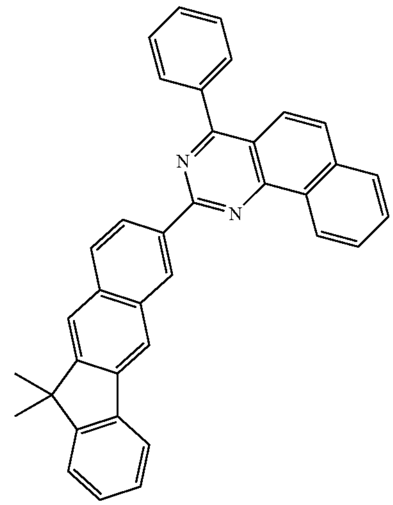
C-397
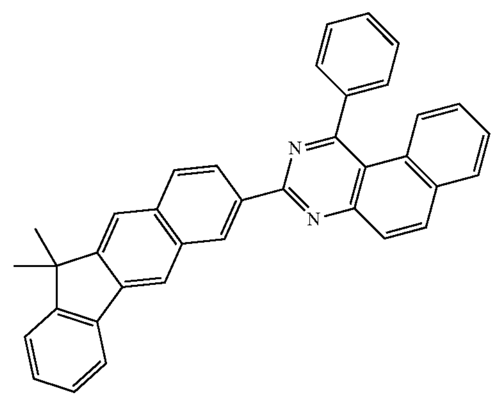
C-398
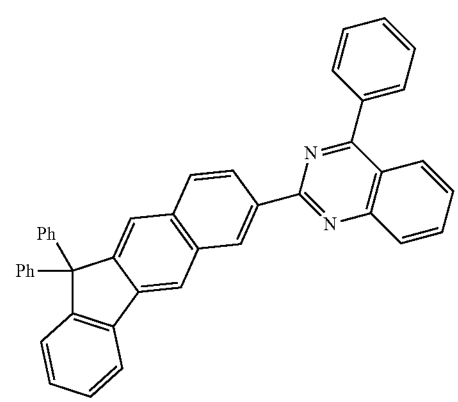

C-399
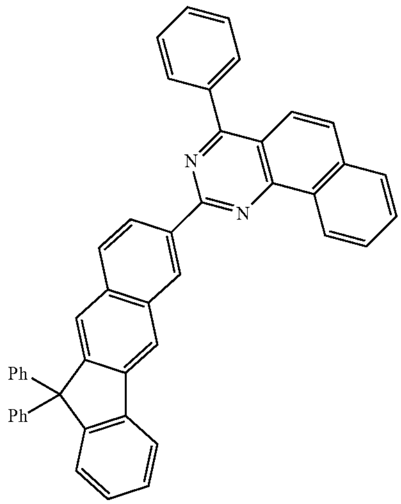
C-400
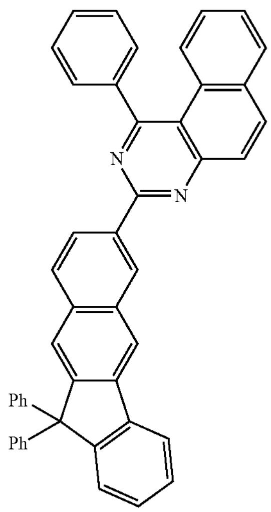
C-407
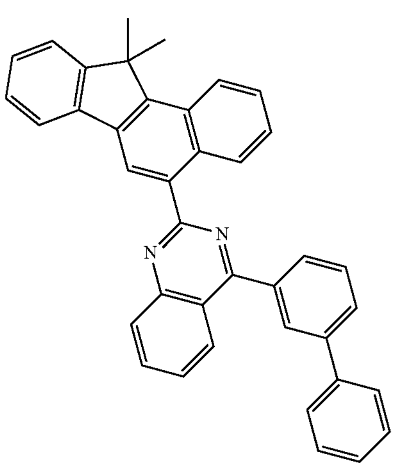
C-408
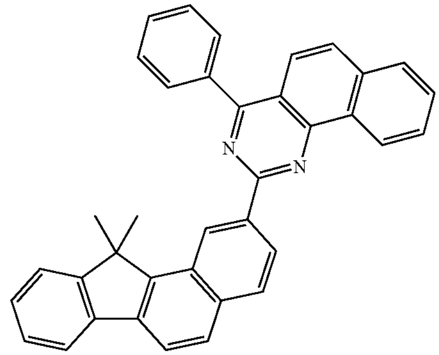
C-409
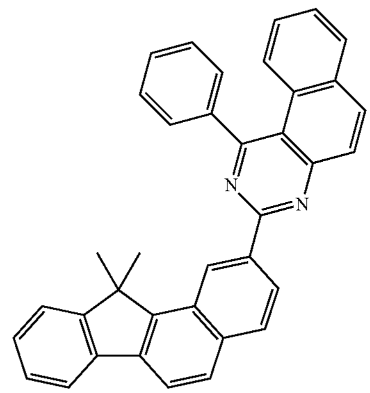
C-410
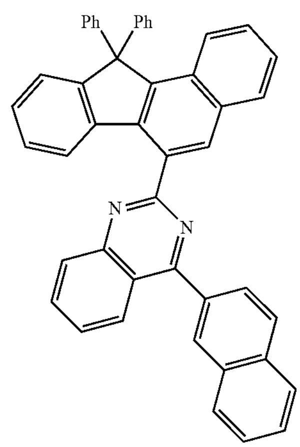
C-411
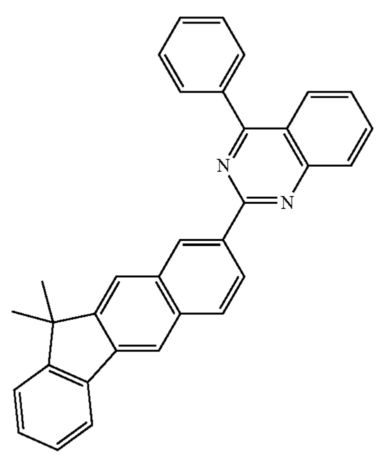

-continued
C-412
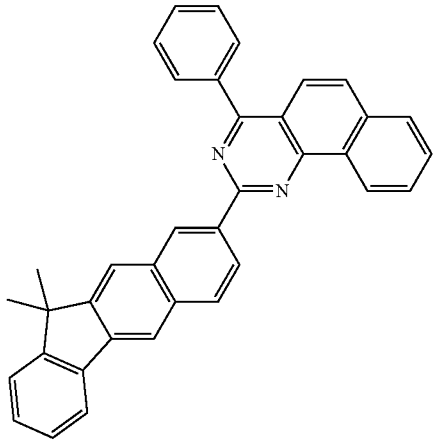
C-413
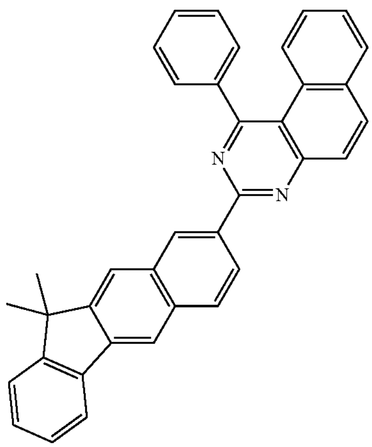
C-414
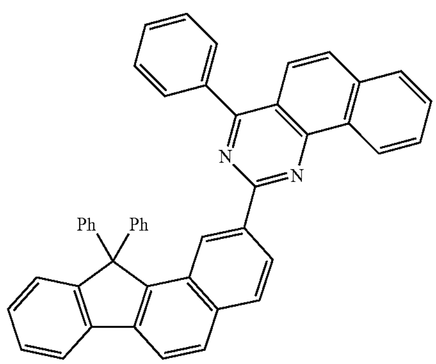
C-415
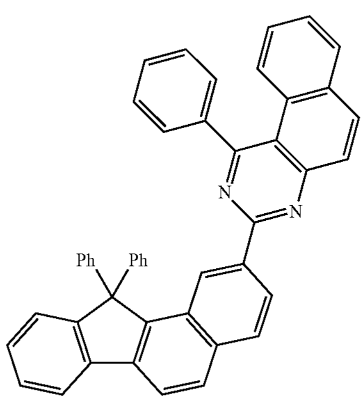
-continued
C-418
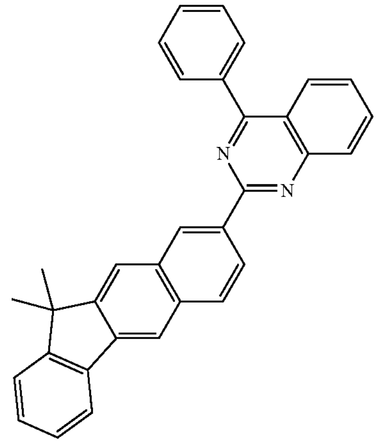
C-419
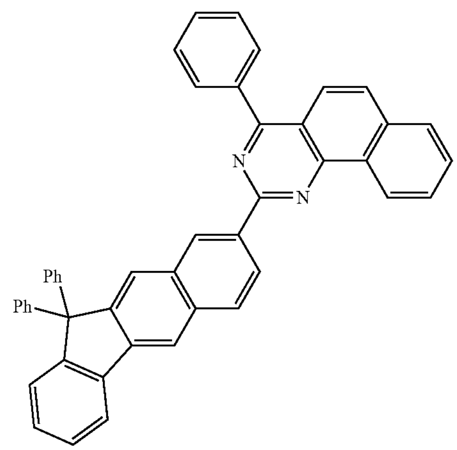
C-420
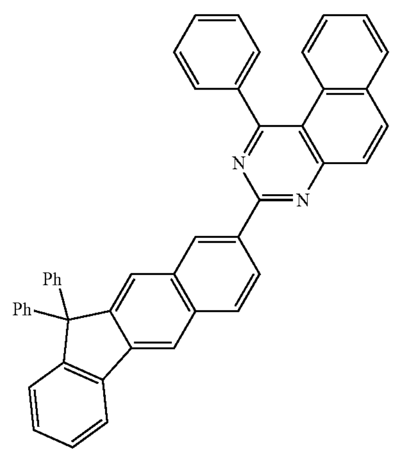

-continued
C-425
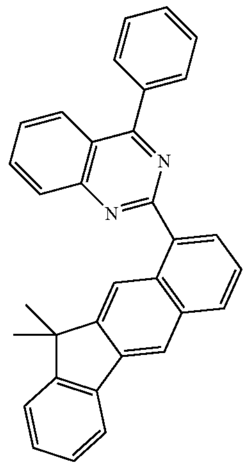
C-426
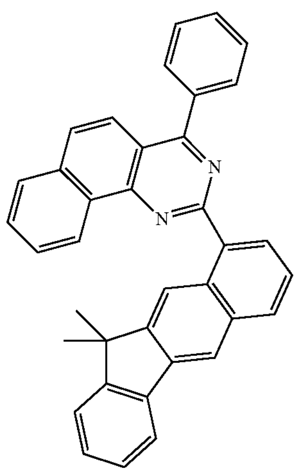
C-427
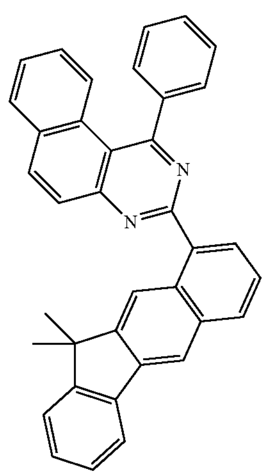
-continued
C-428
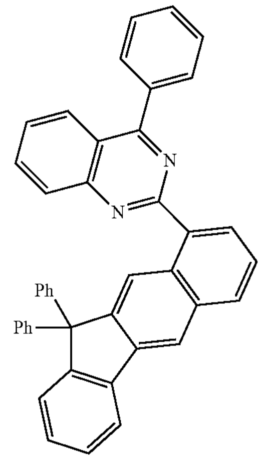
C-429
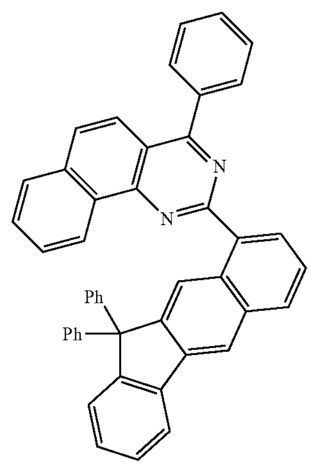
C-430
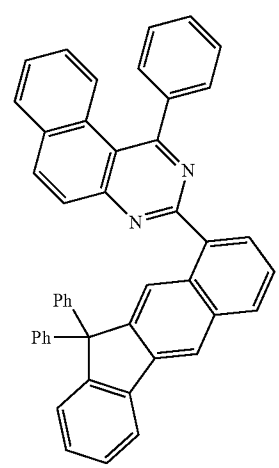

C-437
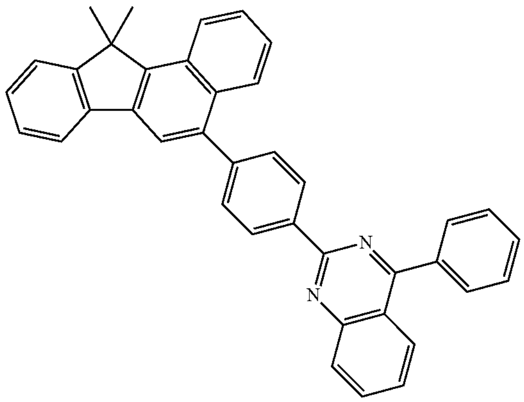
C-438
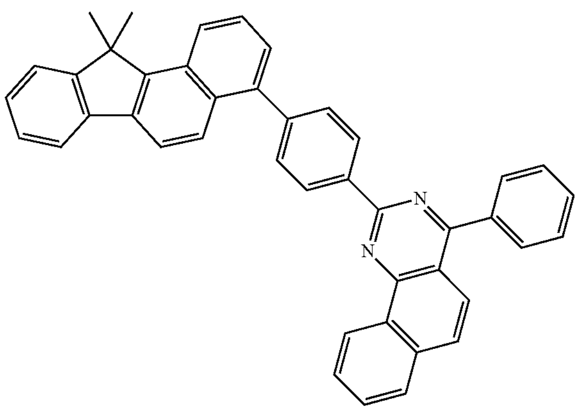
C-439
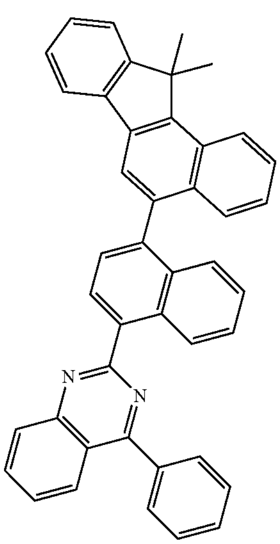
C-440
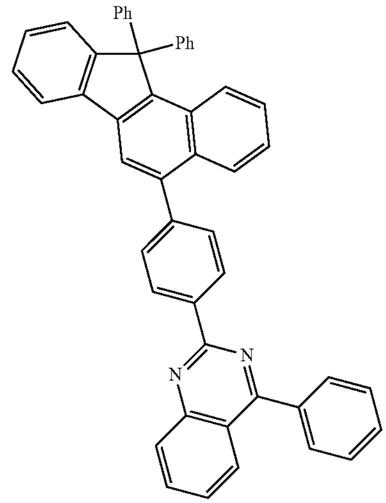
C-441
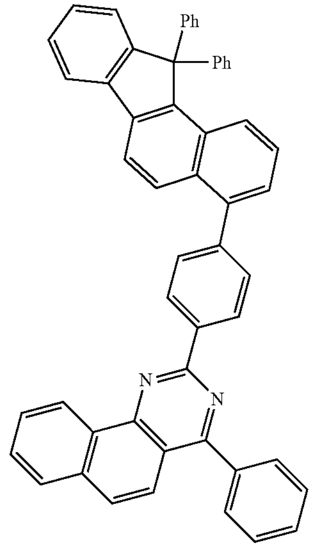
C-442
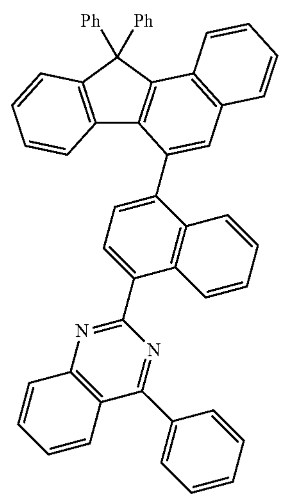

-continued
C-443
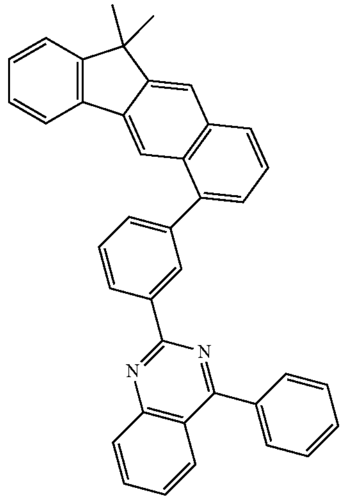
C-444
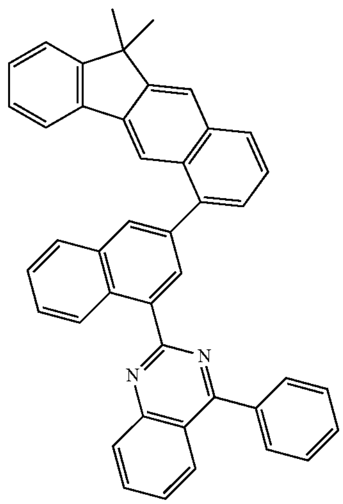
C-445
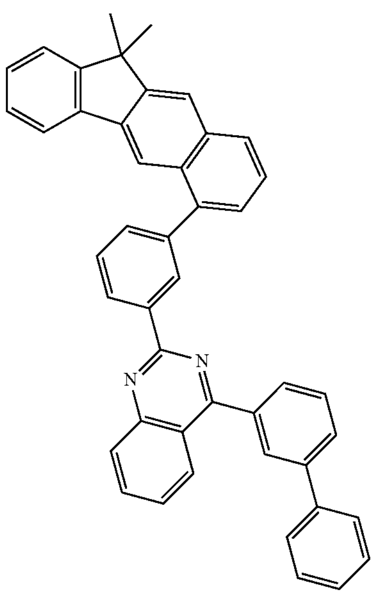
-continued
C-446
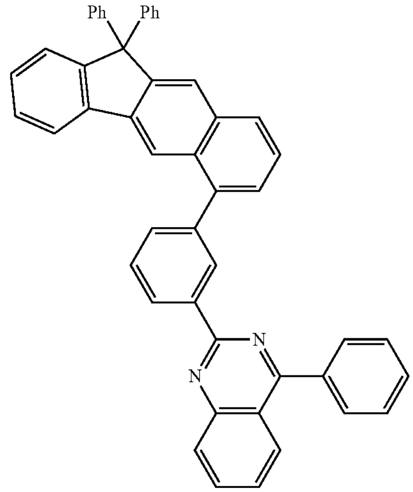
C-447
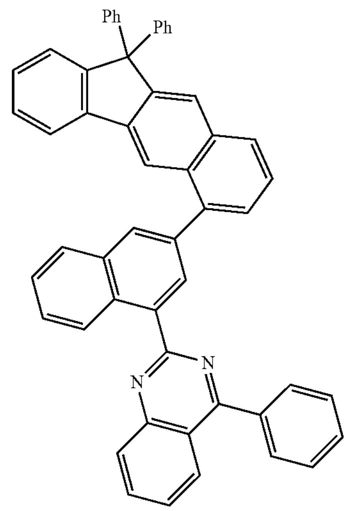
C-448
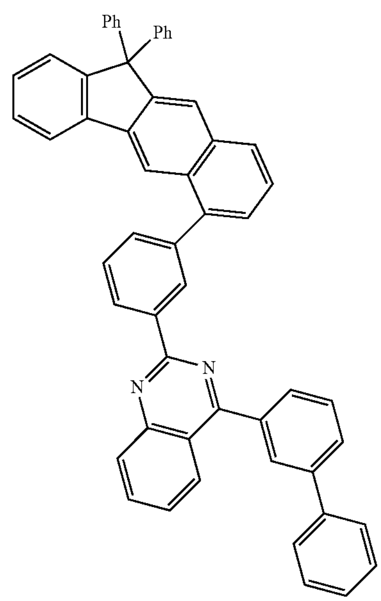

-continued
C-455
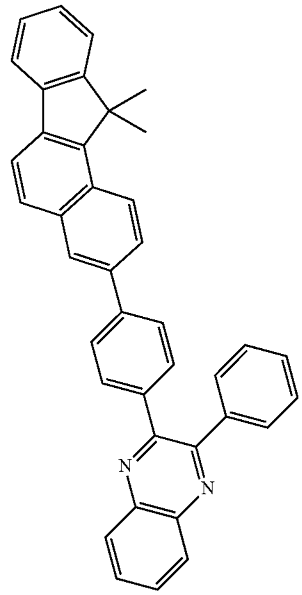
C-456
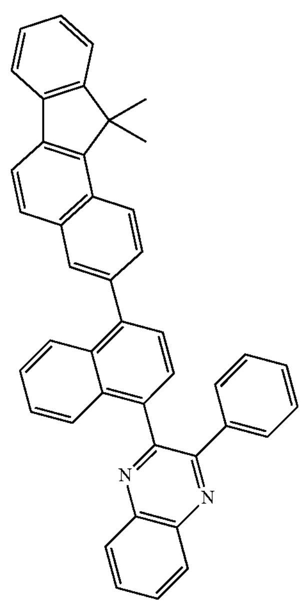
-continued
C-457
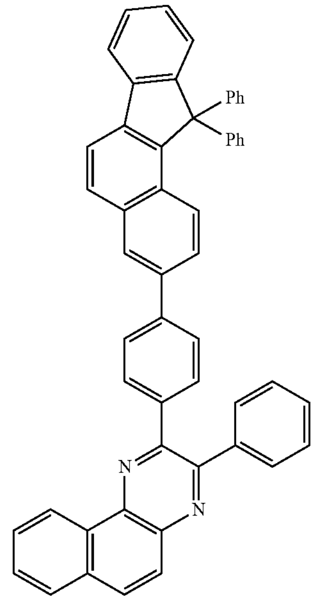
C-458
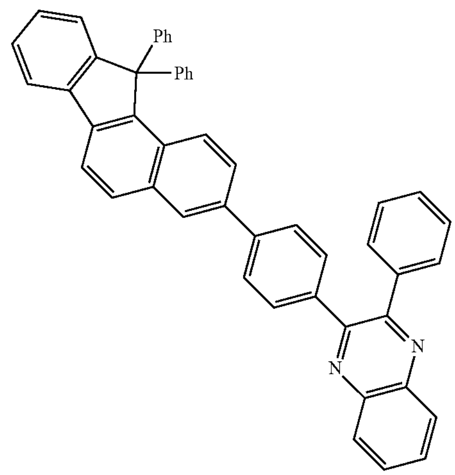
C-459
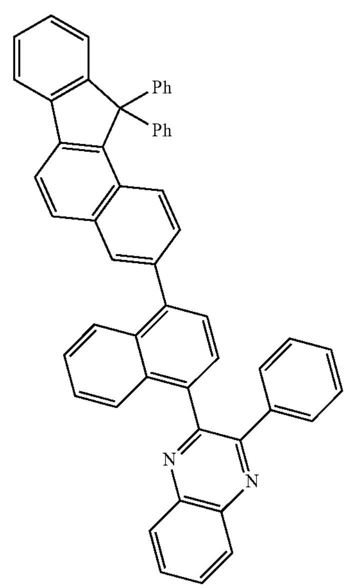

-continued
C-460
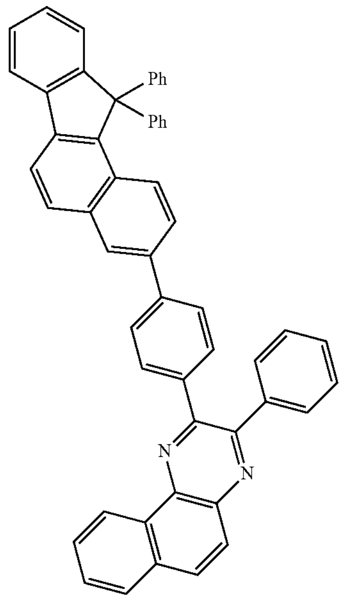
C-461
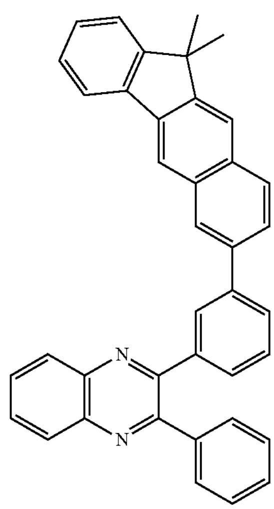
C-462
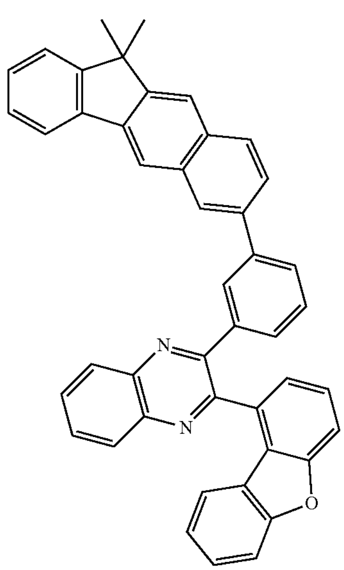
-continued
C-463
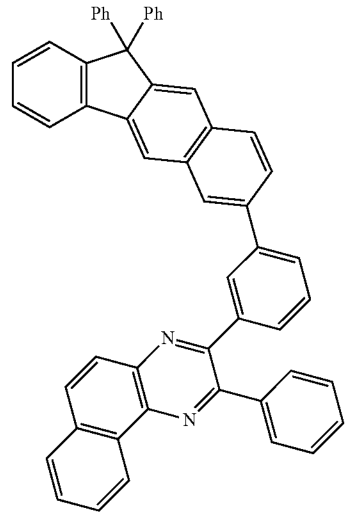
C-464
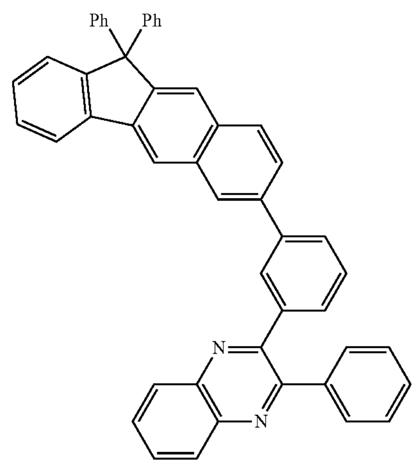
C-465
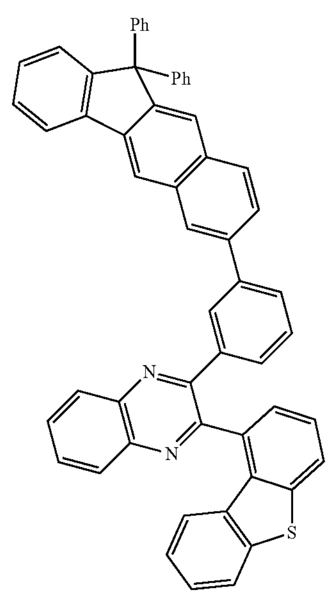

-continued
C-466
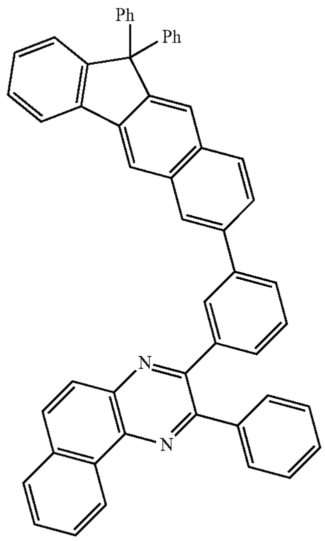
C-473
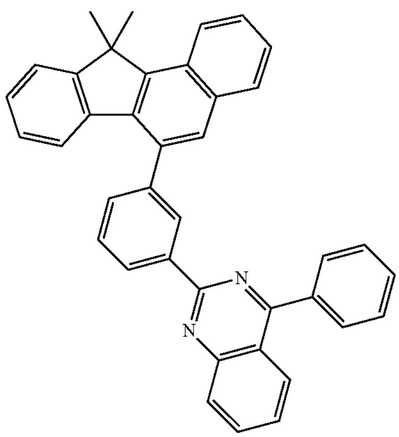
C-474
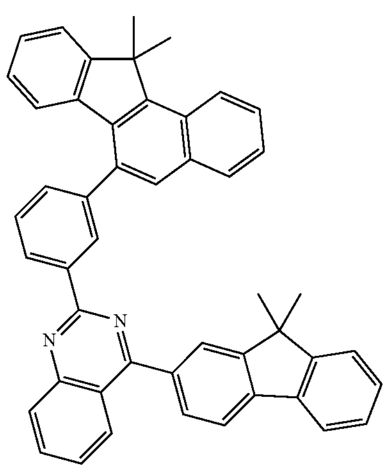
-continued
C-475
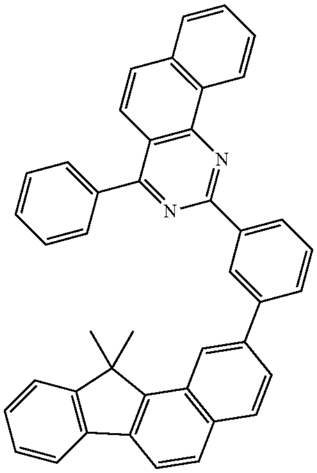
C-476
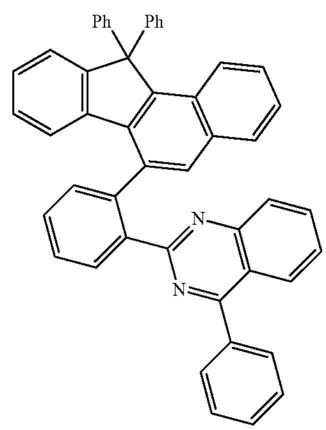
C-477
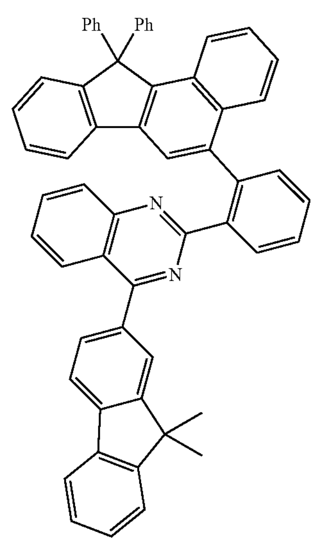

C-478
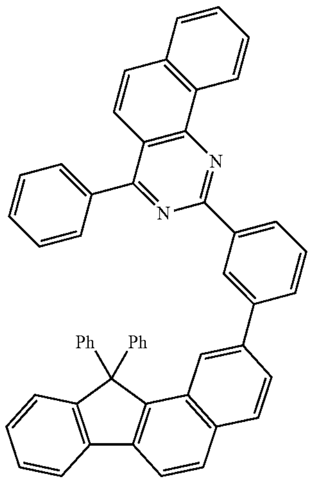
C-479
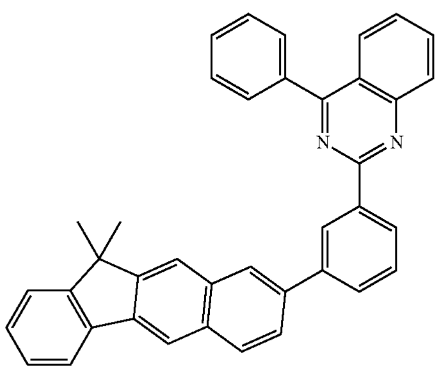
C-480
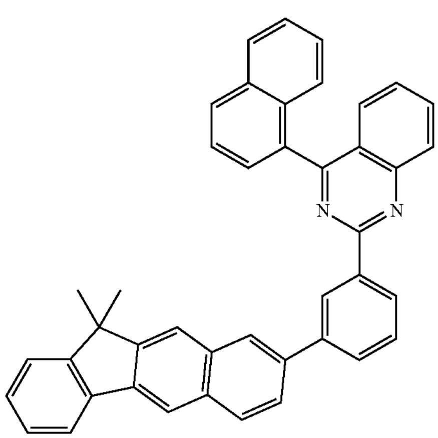
C-481
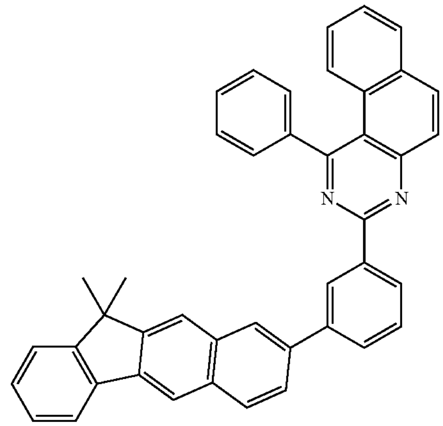
C-482
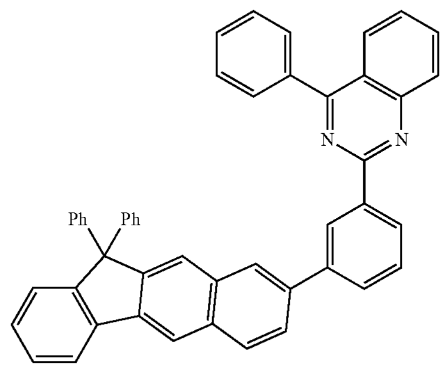
C-483
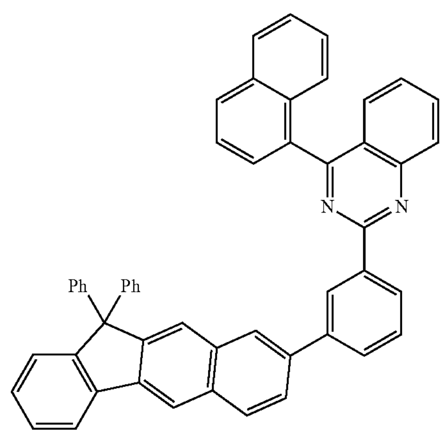
C-484
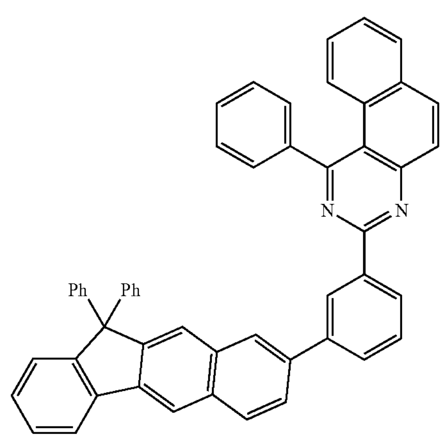

-continued
C-491
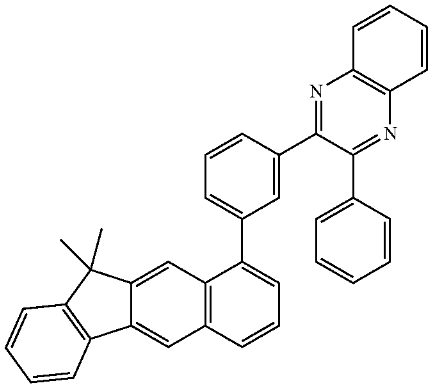
C-492
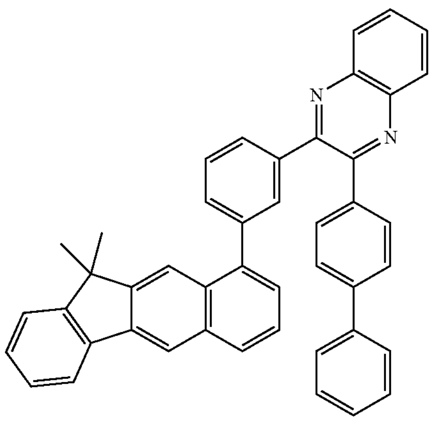
C-493
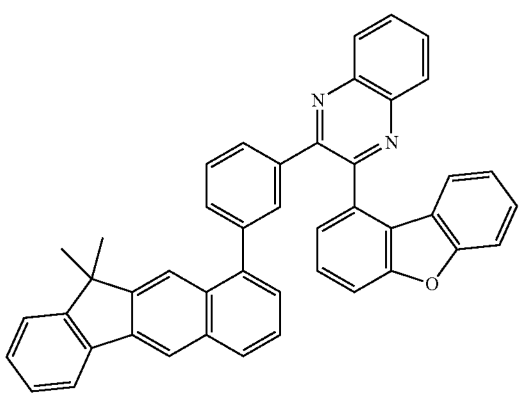
C-494
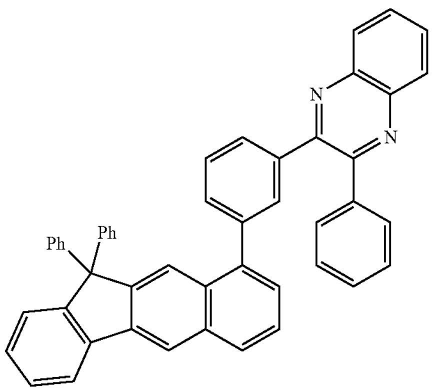
-continued
C-495
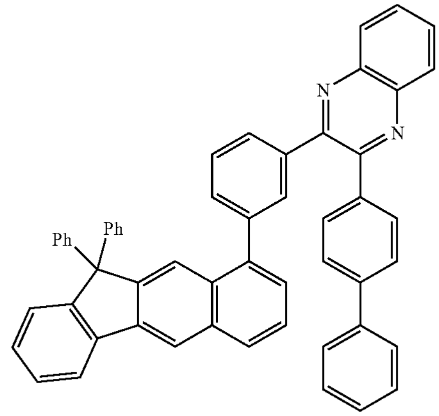
C-496
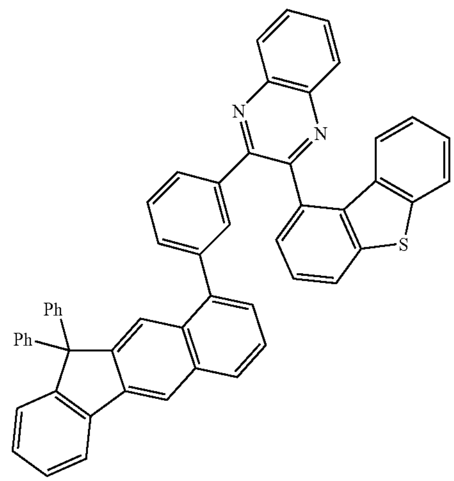
C-497
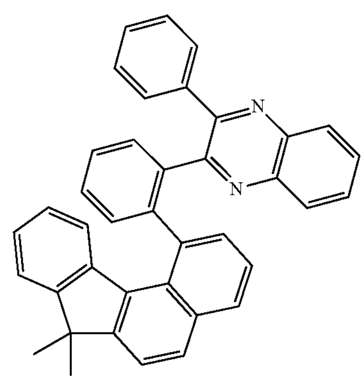
C-498
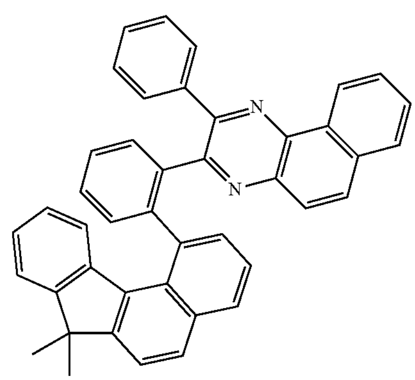

-continued
C-499
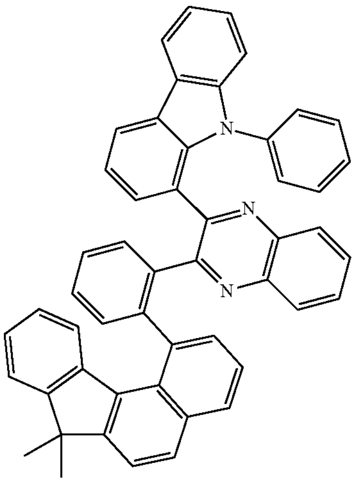
C-500
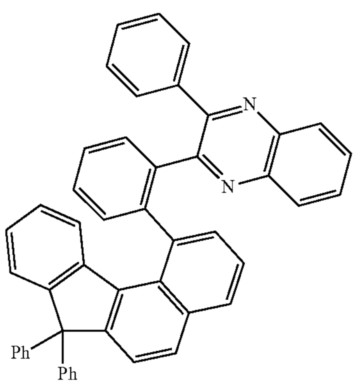
C-501
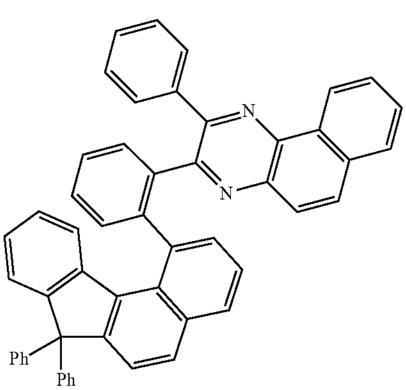
-continued
C-502
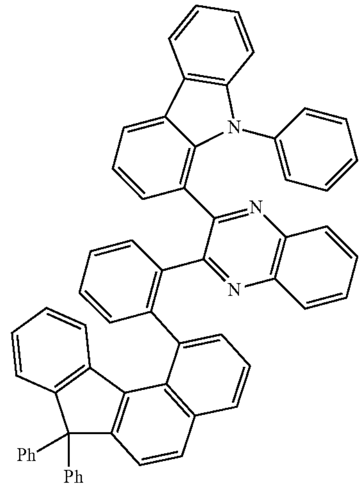
C-503
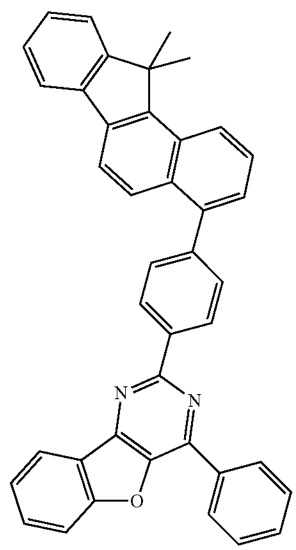
C-504
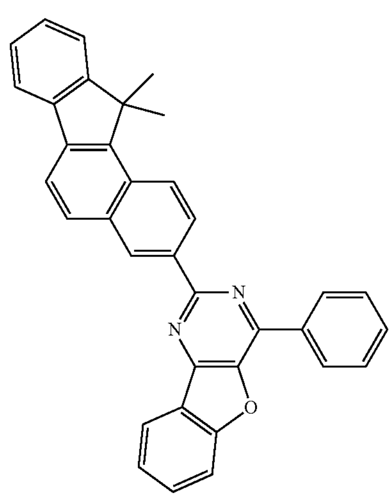

-continued
C-505
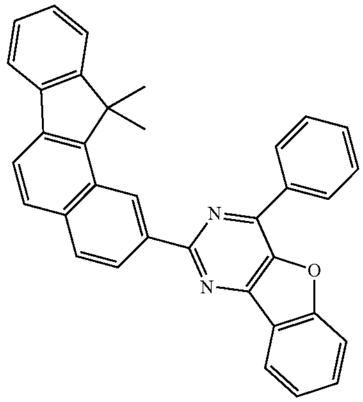
C-506
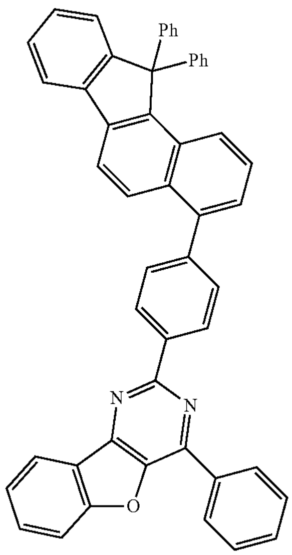
C-507
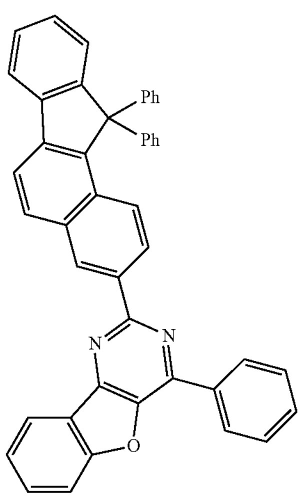
-continued
C-508
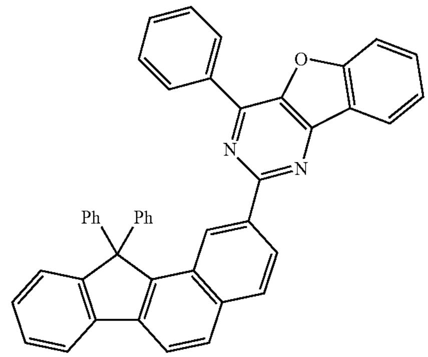
C-509
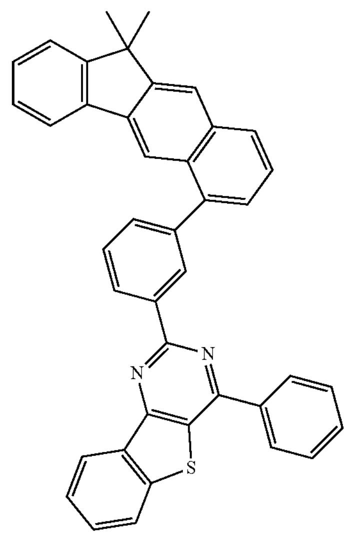
C-510
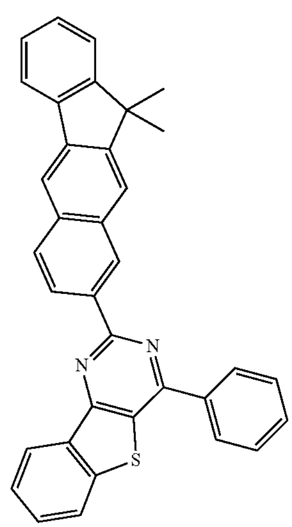

-continued
C-511
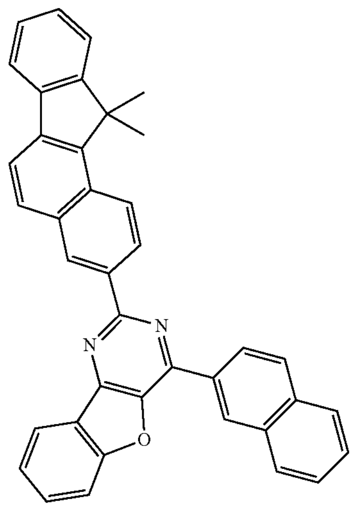
C-512
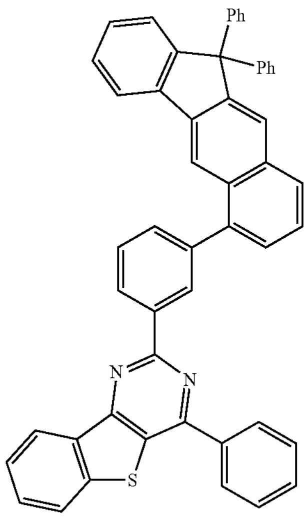
C-513
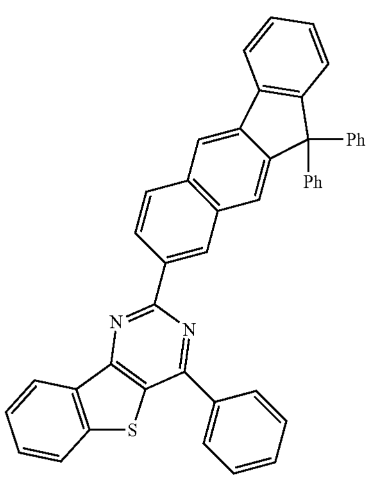
-continued
C-514
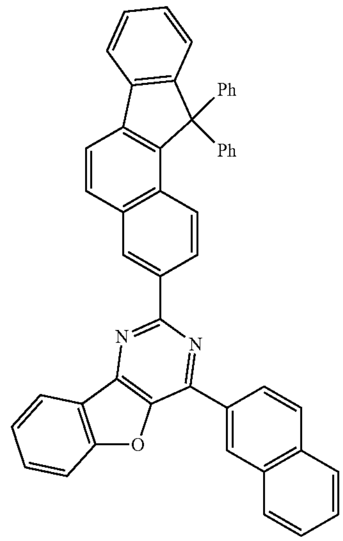
C-515
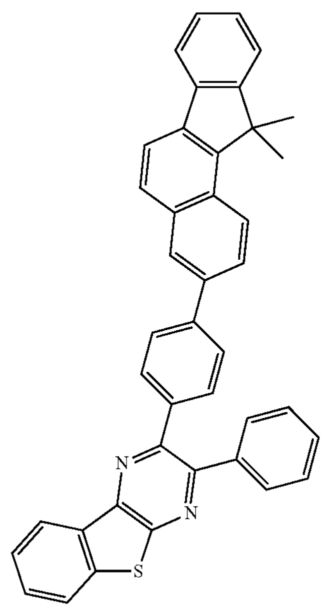

C-516
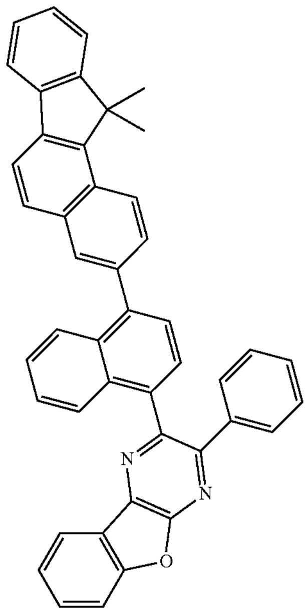
C-517
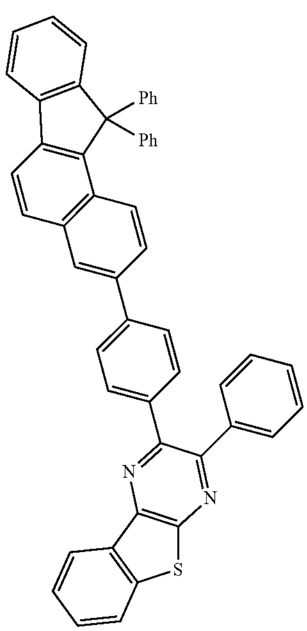
C-518
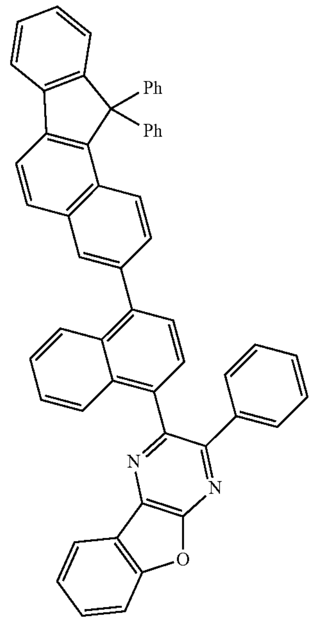
C-519
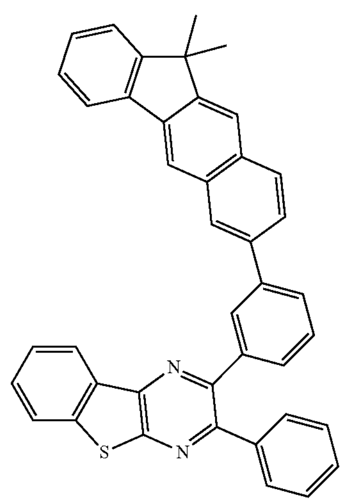

-continued
C-520
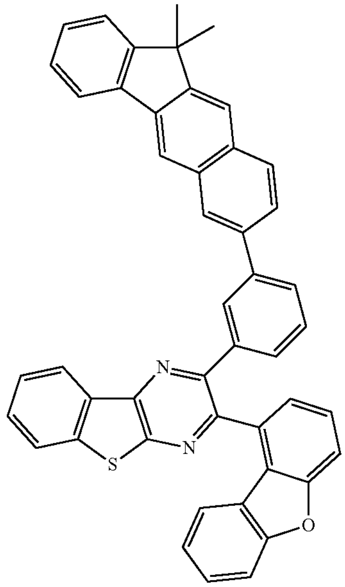
C-521
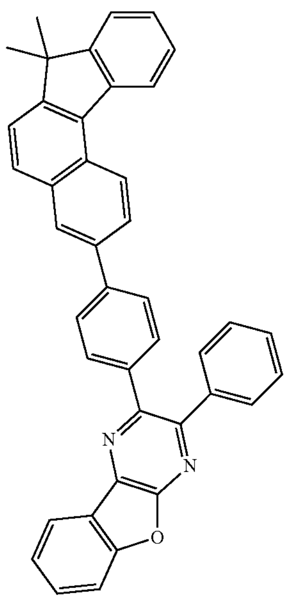
-continued
C-524
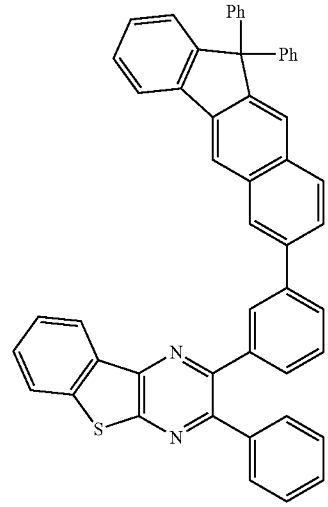
C-525
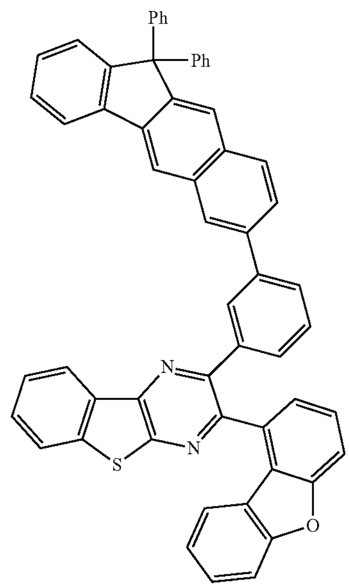
C-527
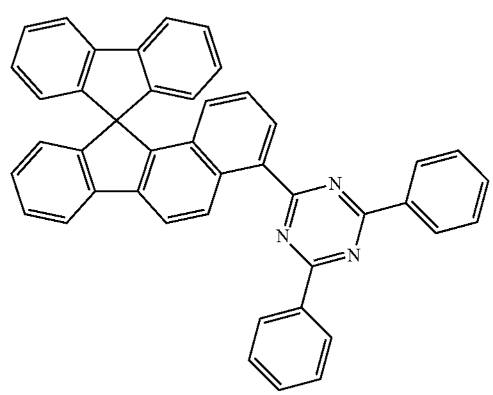

-continued

C-528

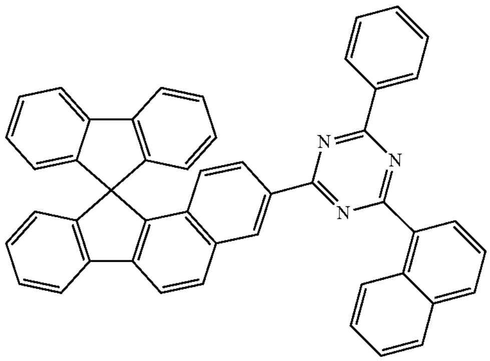

C-529

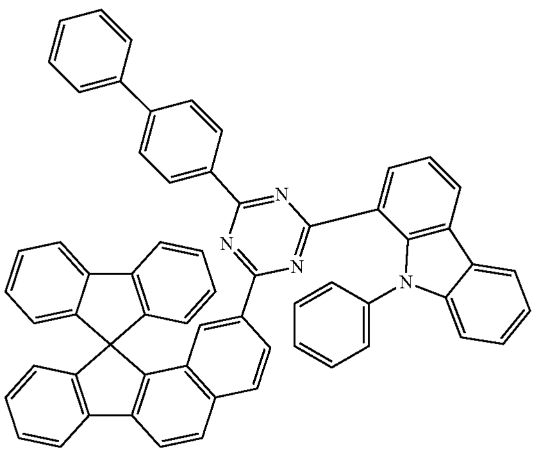

C-530

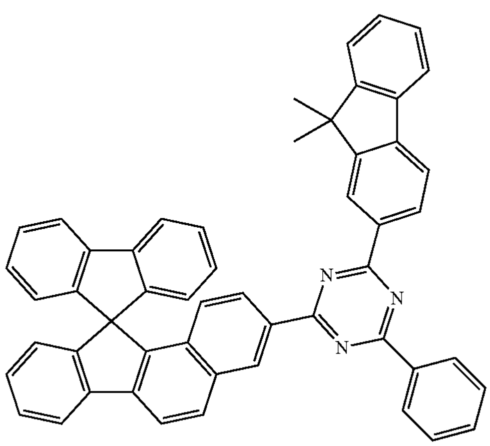

-continued

C-531

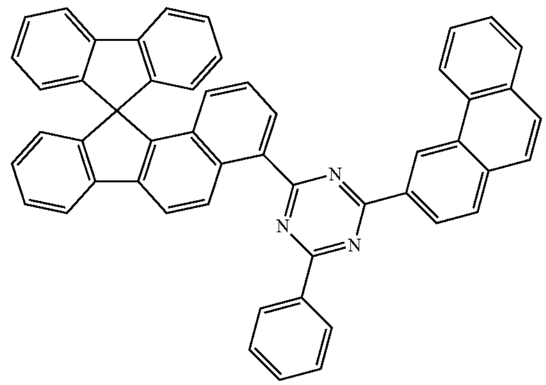

C-532

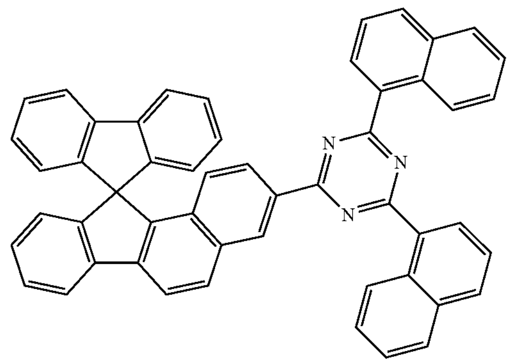

and

C-533

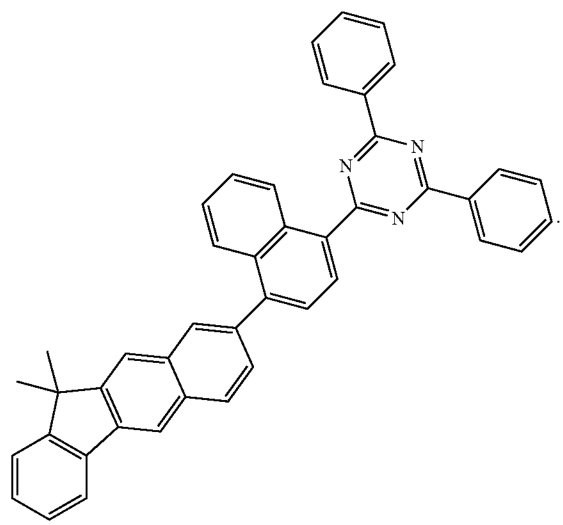

4. An organic electroluminescent device comprising the plurality of host materials according to claim 1.

5. The organic electroluminescent device according to claim 4, wherein the organic electroluminescent compound is contained in a light-emitting layer and/or an electron transport zone.

6. The host materials according to claim 1, wherein the compound represented by formula 100 is selected from the group consisting of:

-continued
H-1
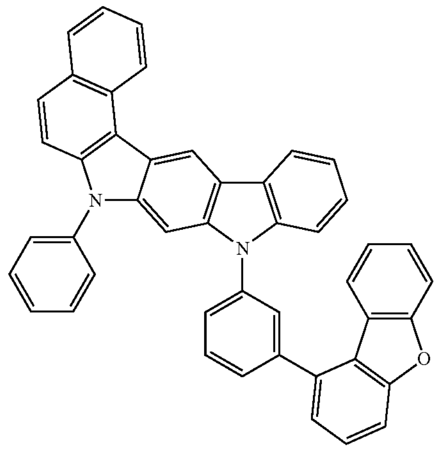
H-2
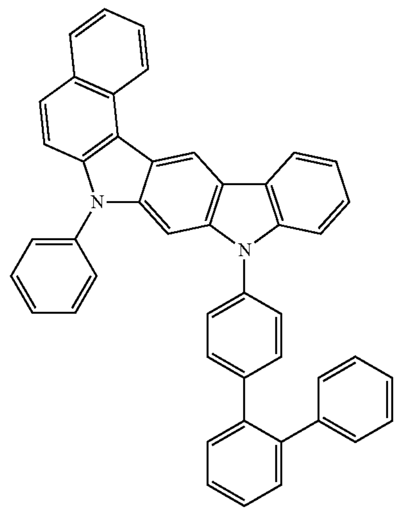
H-3
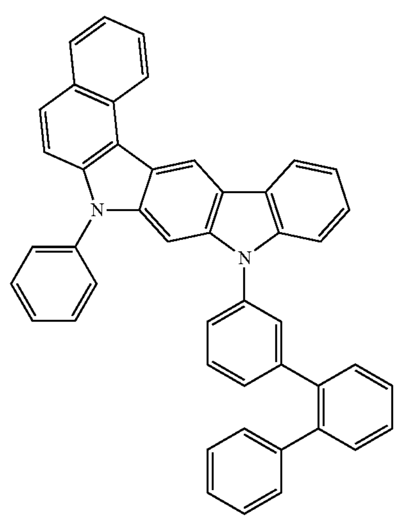
H-4
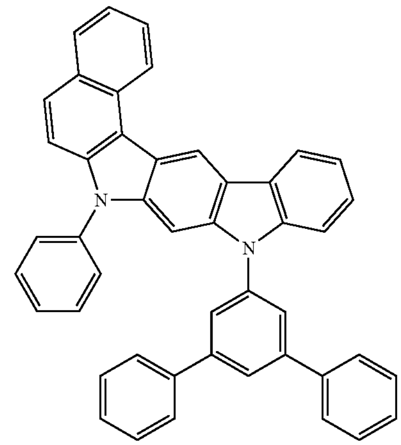
H-5
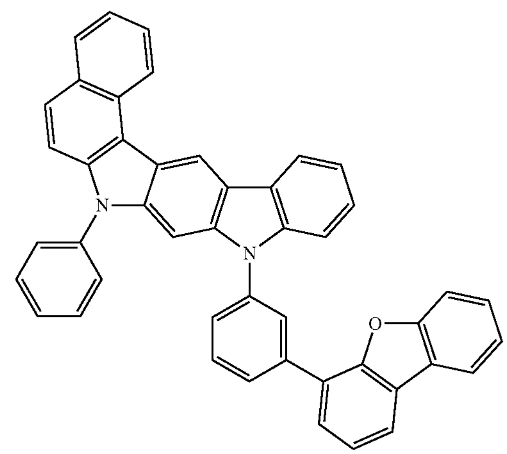
H-6
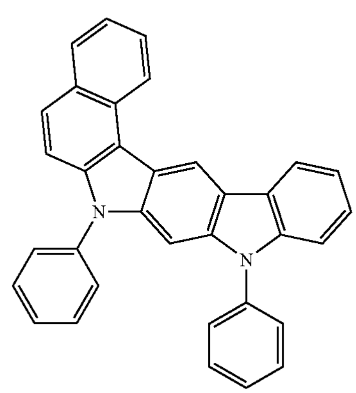

-continued
H-7
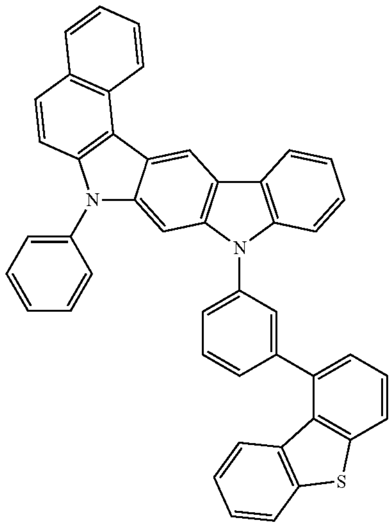
H-8
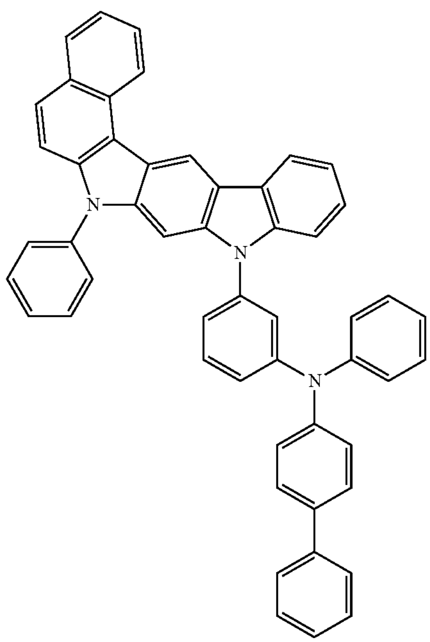
-continued
H-9
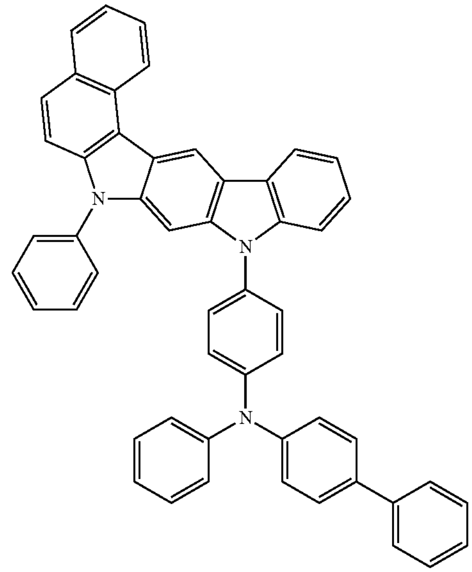
H-10
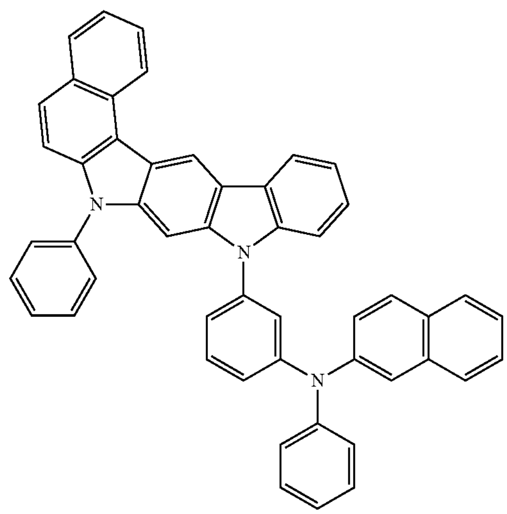
H-11
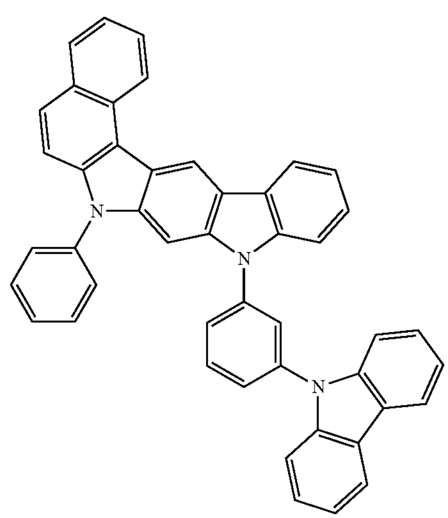

-continued
H-12
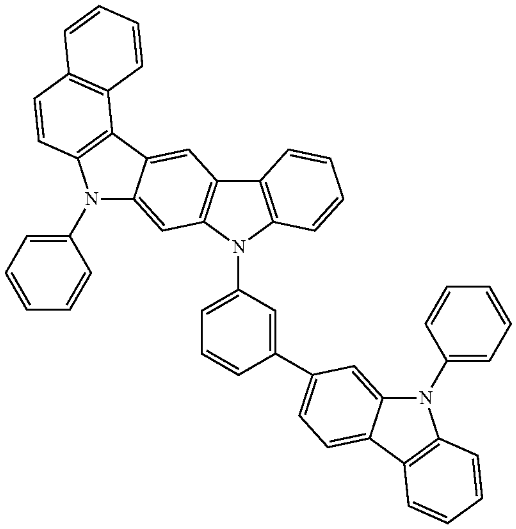
H-13
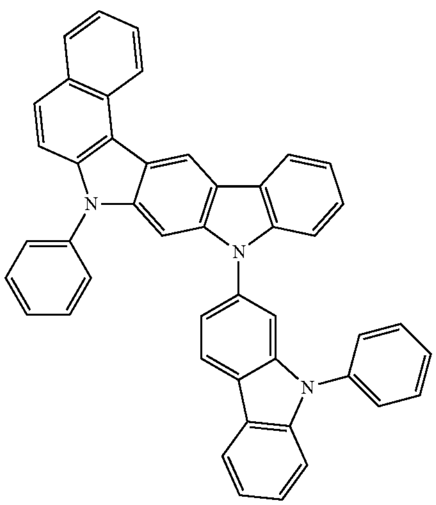
H-14
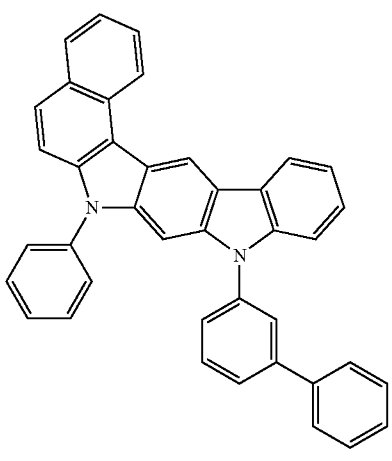
-continued
H-15
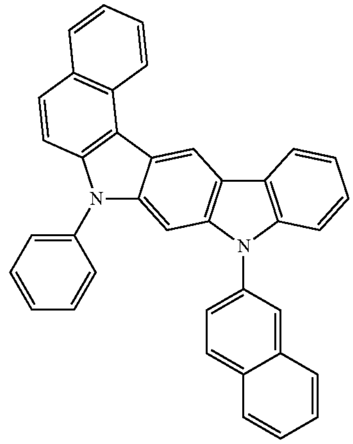
H-16
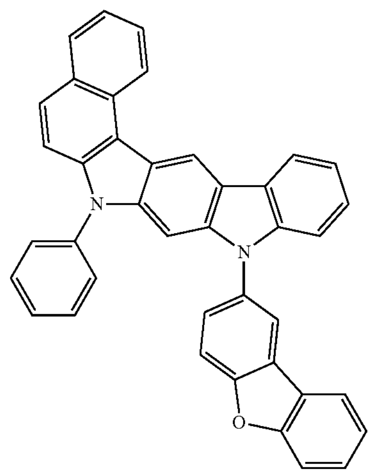
H-17
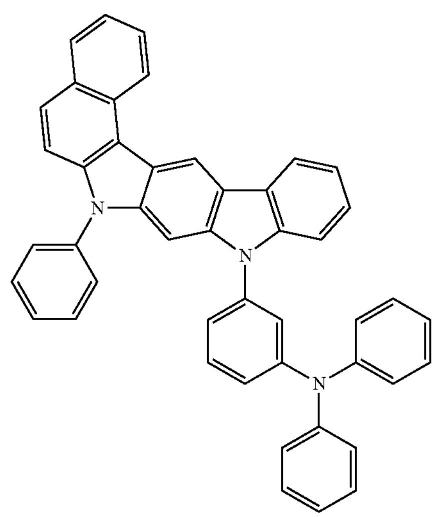

-continued
H-18
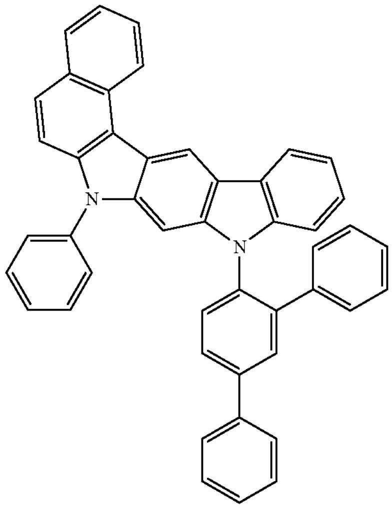
H-19
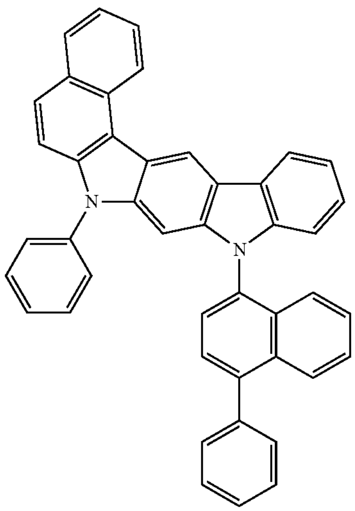
H-20
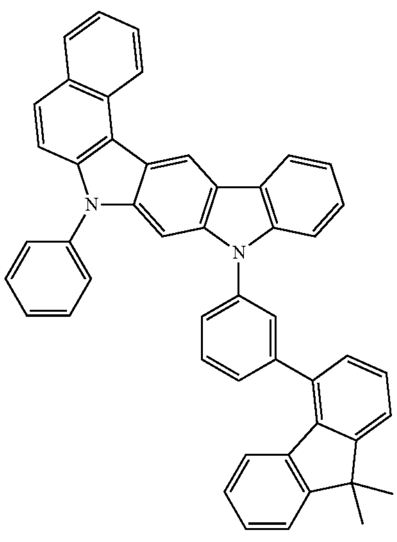
-continued
H-21
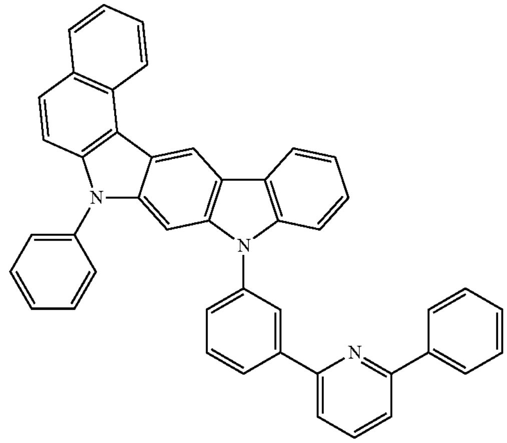
H-22
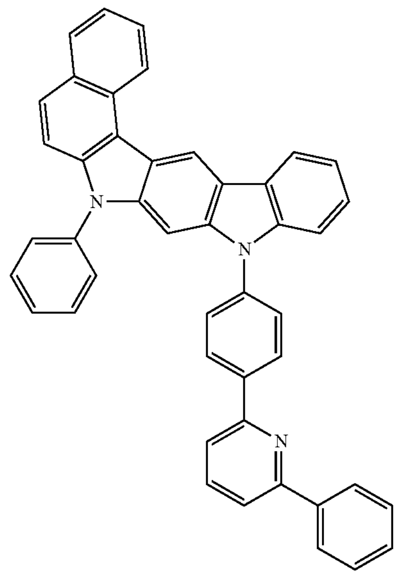
H-23
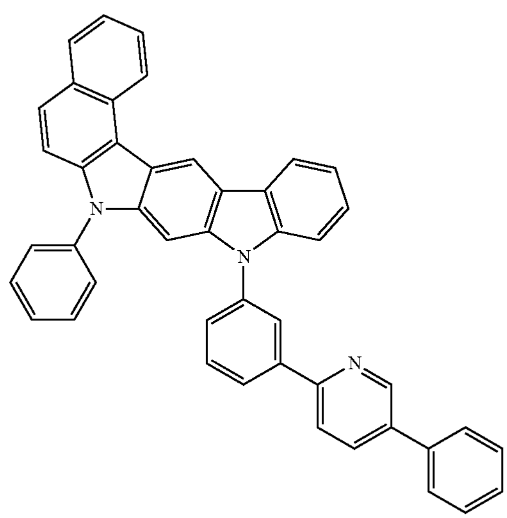

-continued
H-24
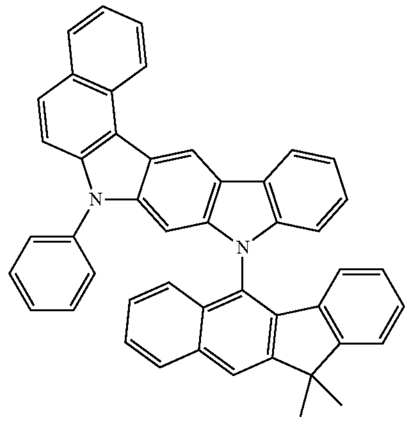
H-25
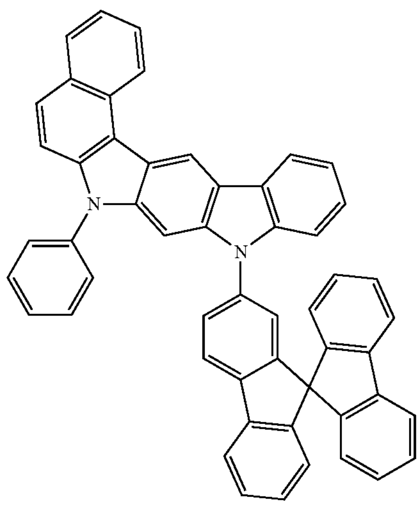
H-26
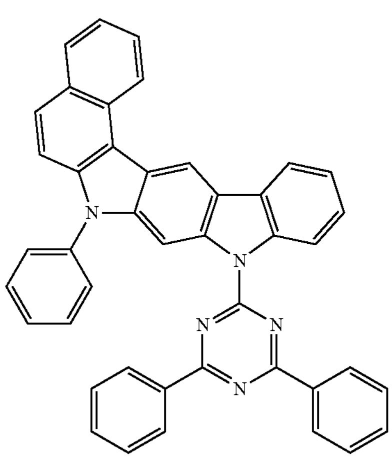
-continued
H-27
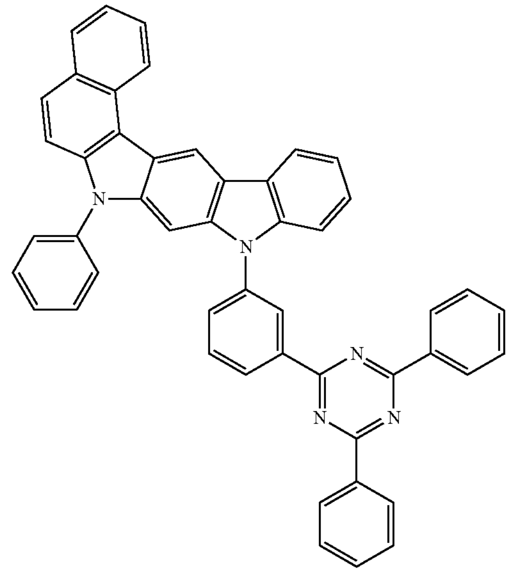
H-28
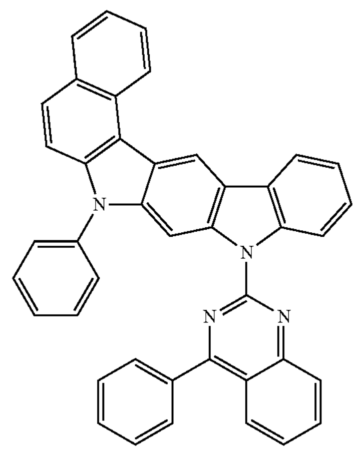
H-29
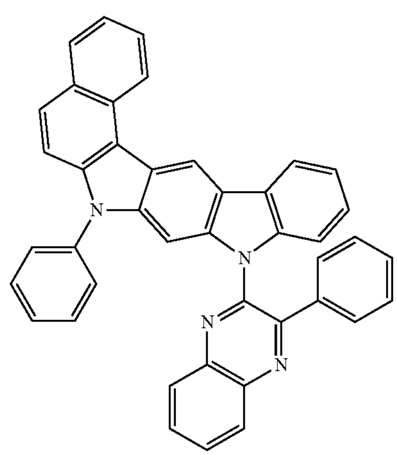

-continued
H-30
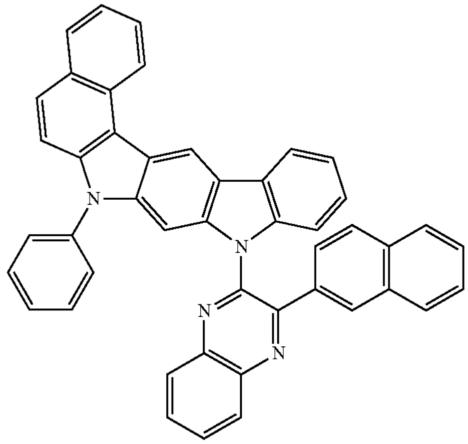
H-31
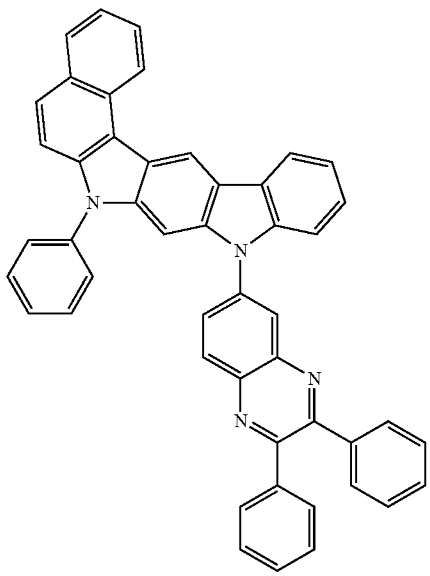
H-32
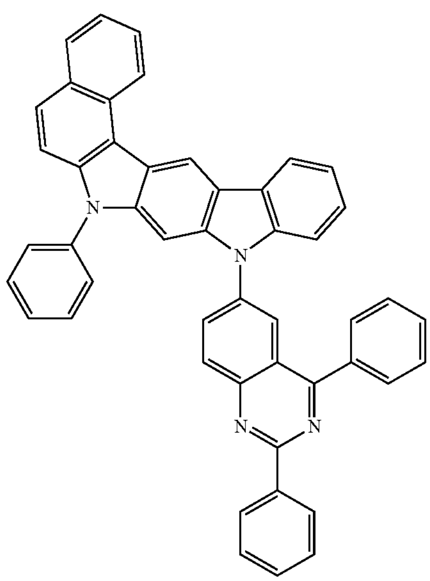
-continued
H-33
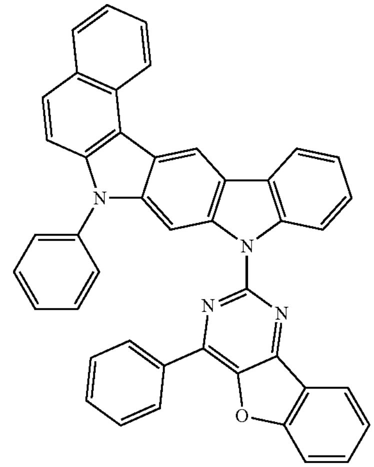
H-34
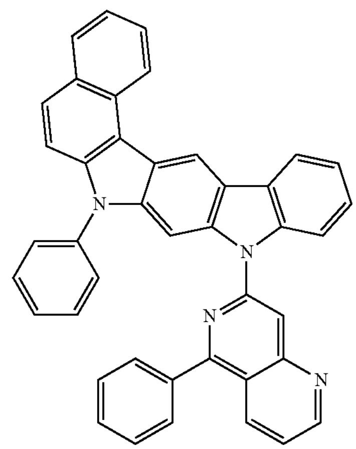
H-35
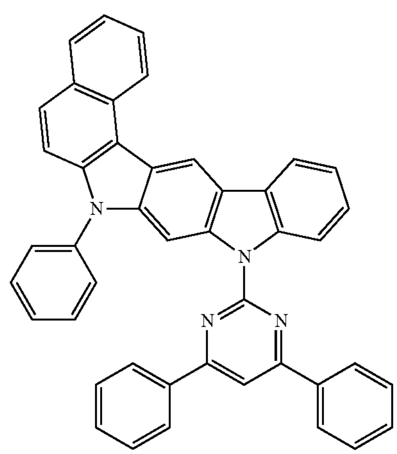

-continued
H-36
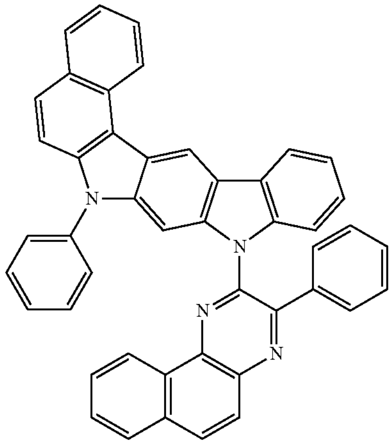
H-37
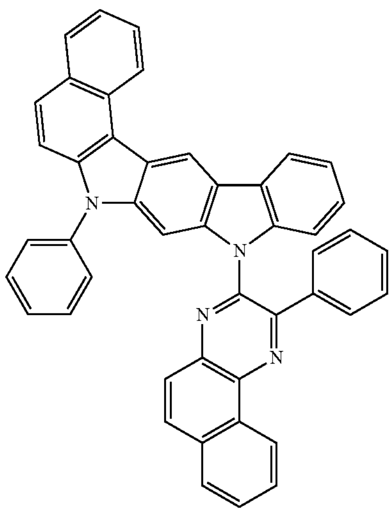
H-38
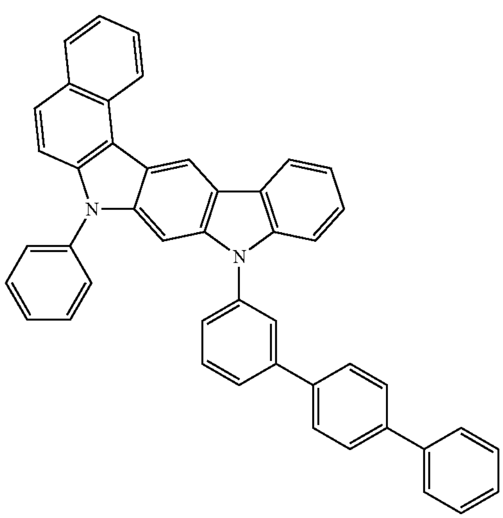
-continued
H-39
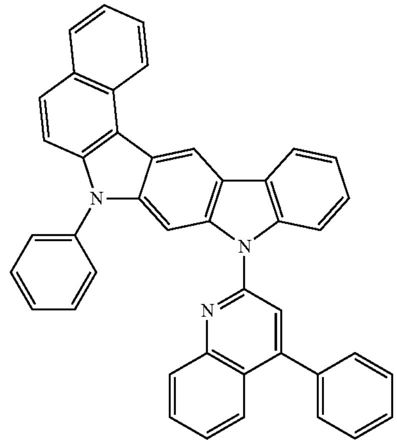
H-40
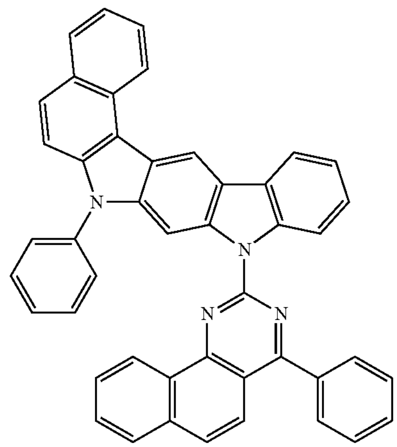
H-41
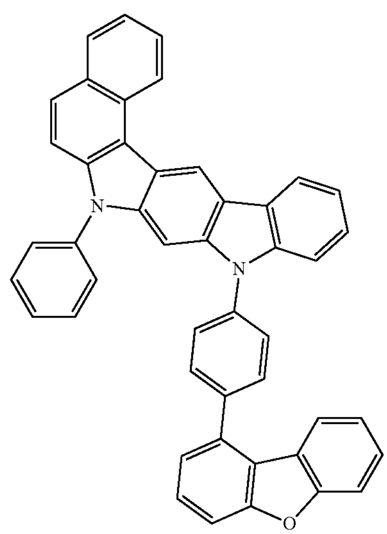

-continued
H-42
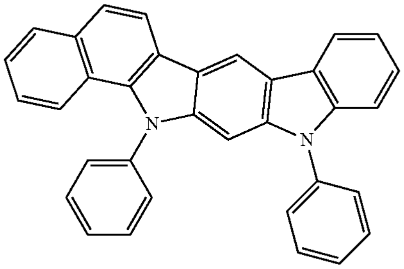
H-43
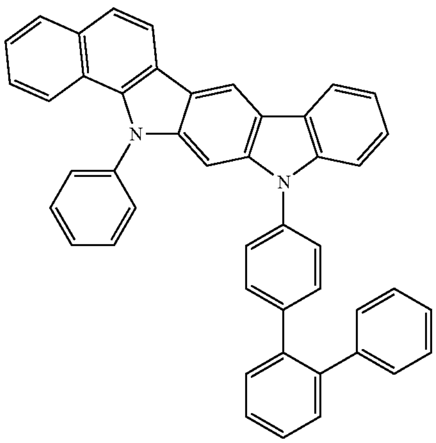
H-44
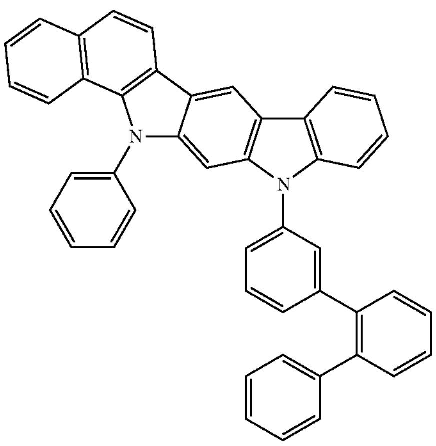
H-45
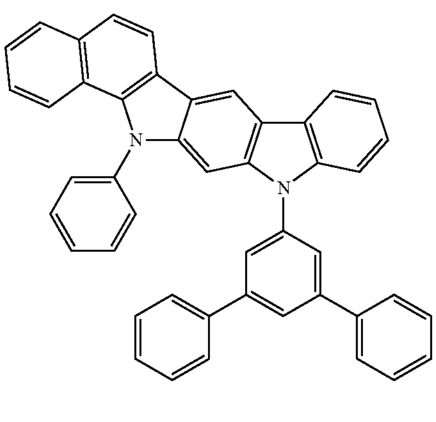
-continued
H-46
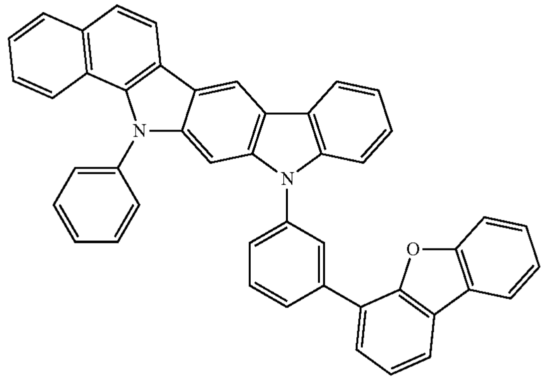
H-47
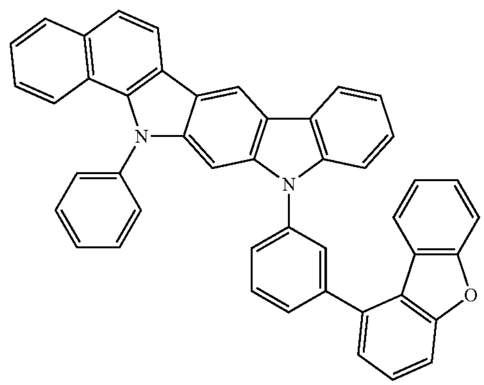
H-48
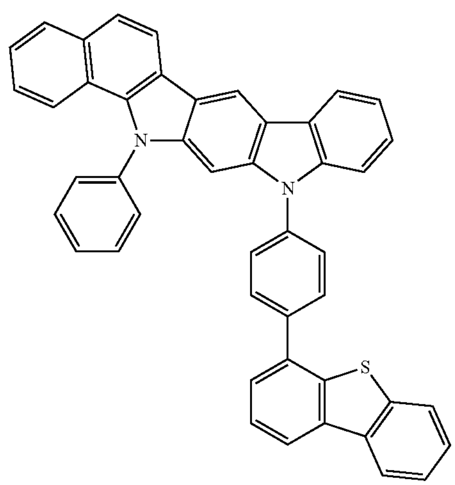

-continued
H-49
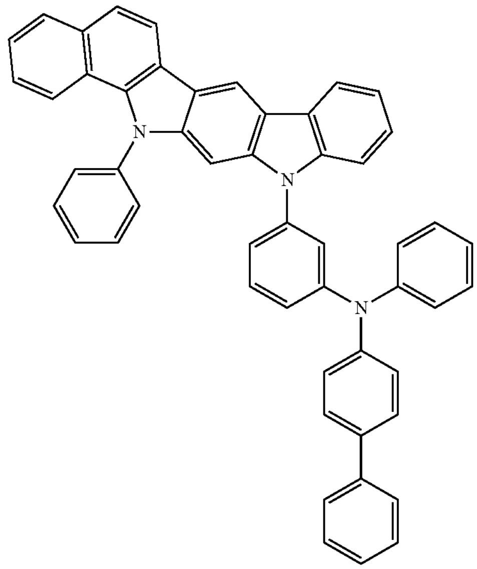
H-50
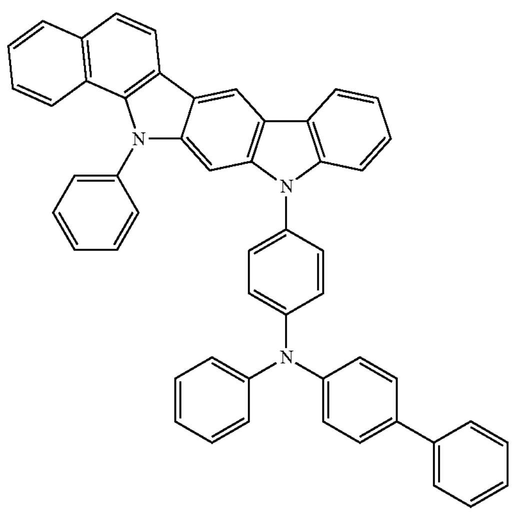
H-51
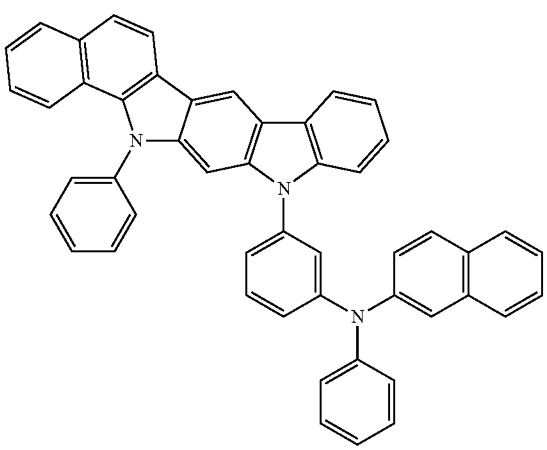
-continued
H-52
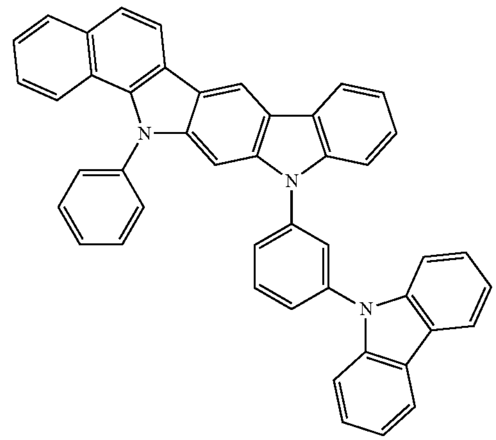
H-53
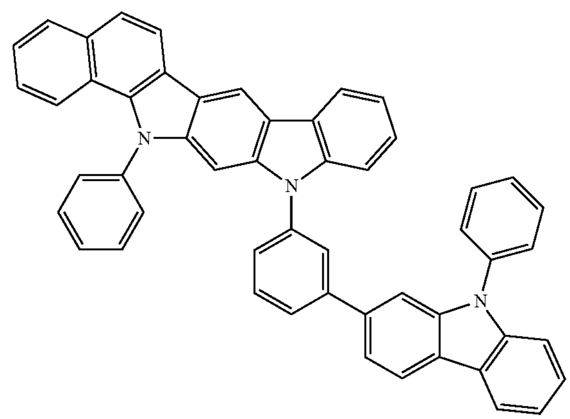
H-54
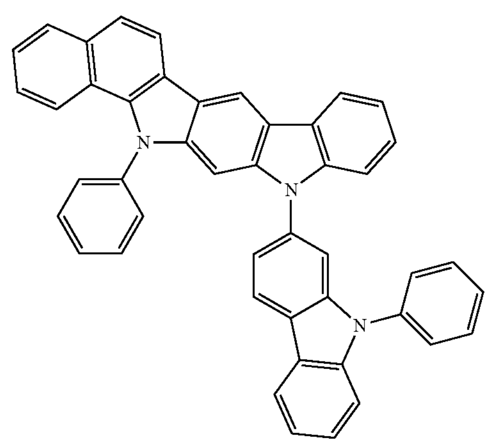

-continued
H-55
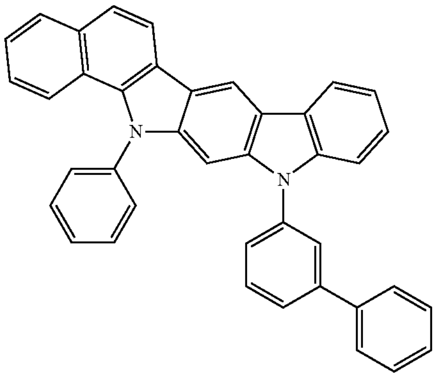
H-56
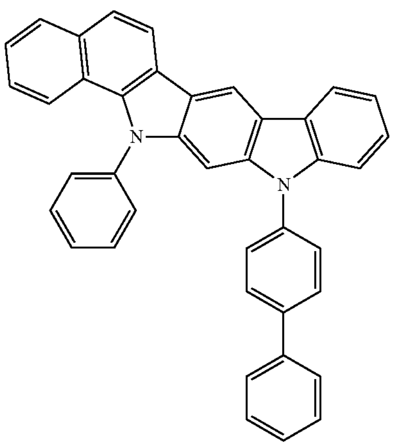
H-57
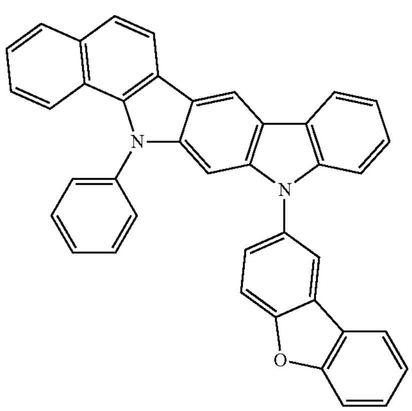
-continued
H-58
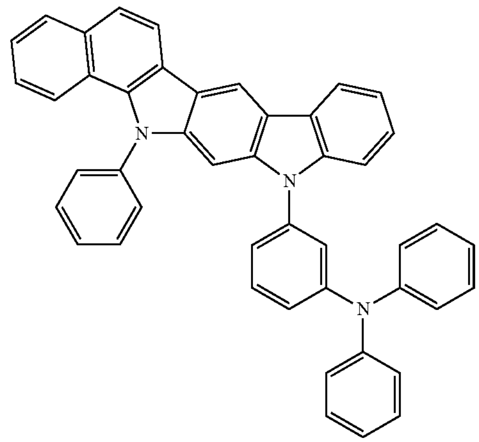
H-59
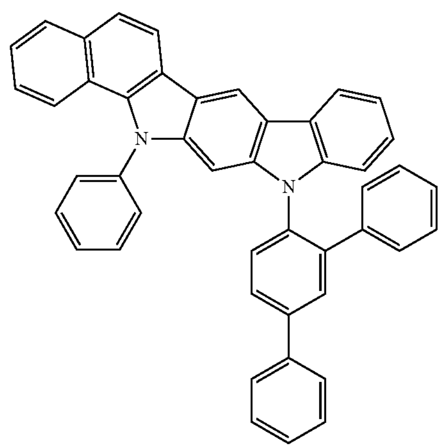
H-60
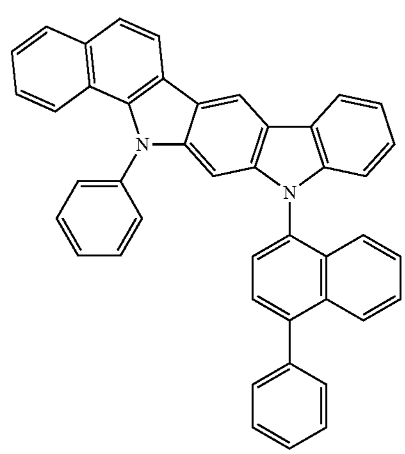

-continued
H-61
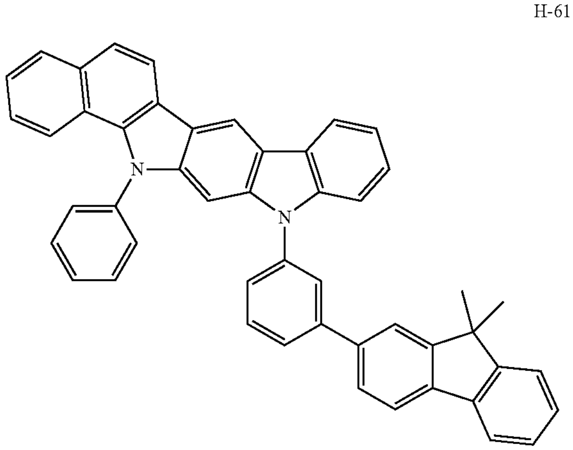
H-62
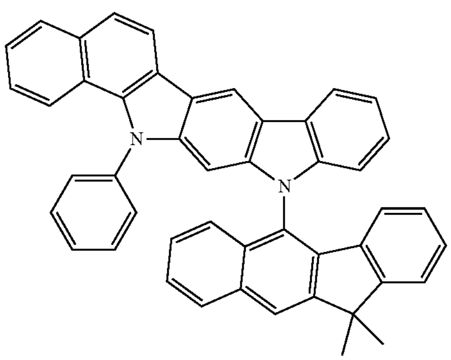
H-63
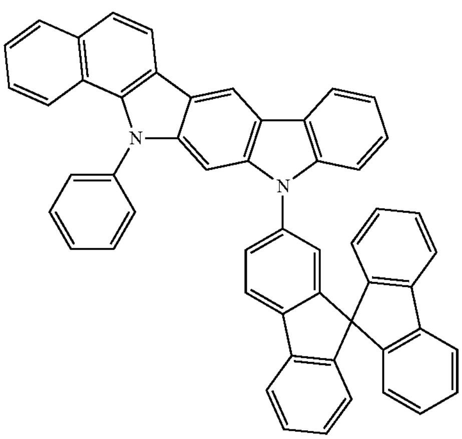
H-64
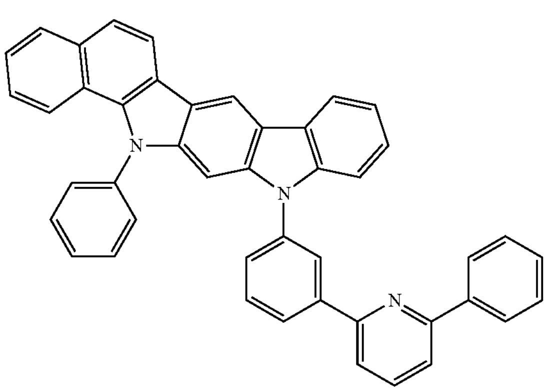
-continued
H-65
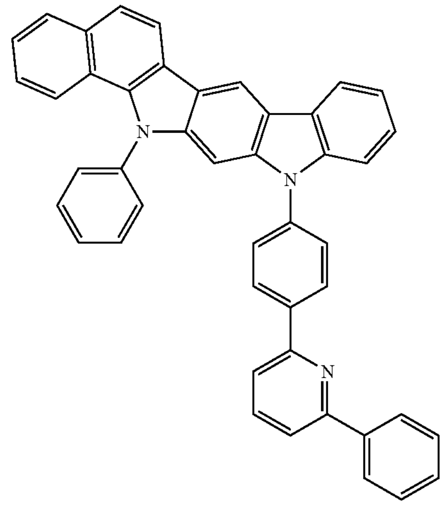
H-66
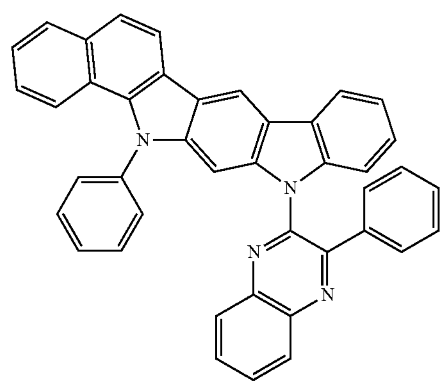
H-67
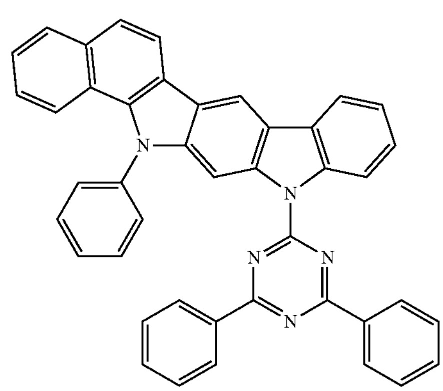

-continued
H-68
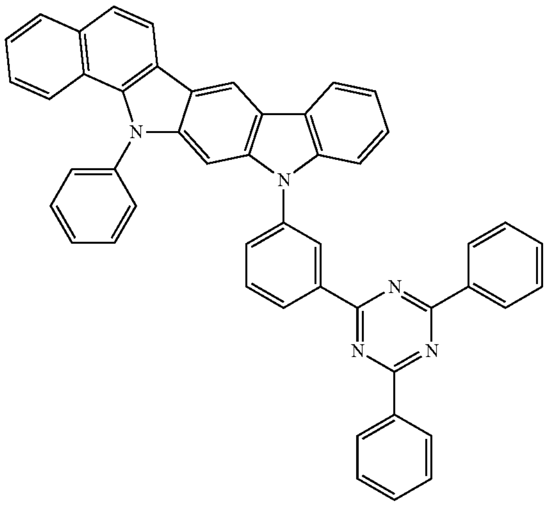
H-69
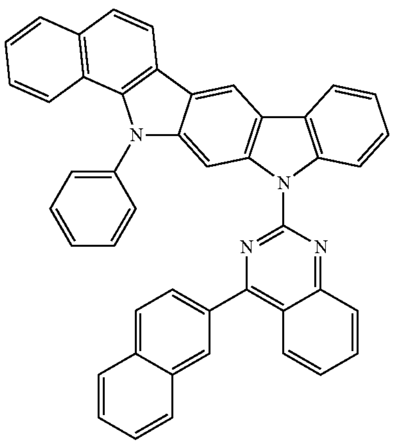
H-70
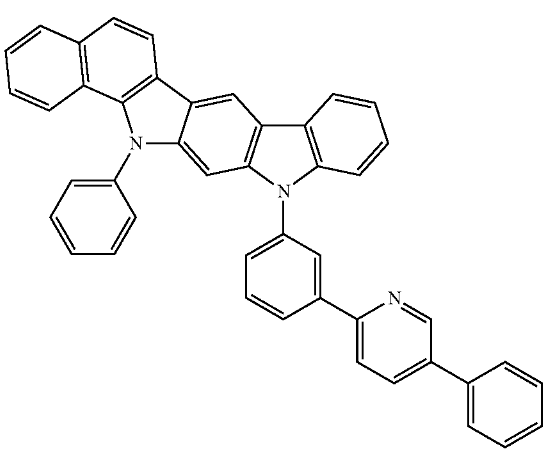
-continued
H-71
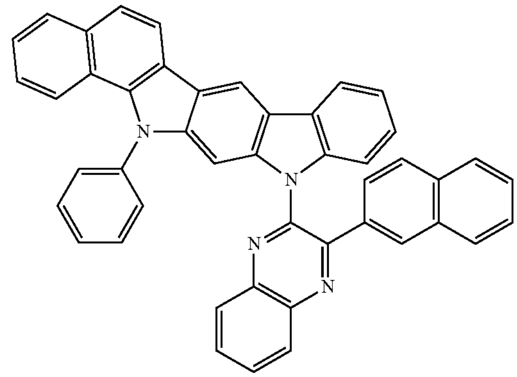
H-72
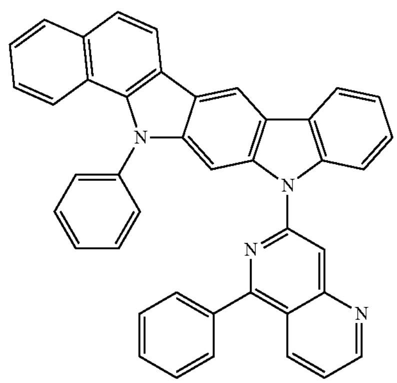
H-73
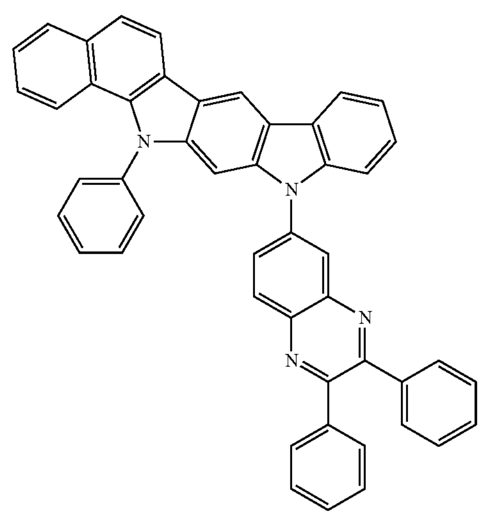

-continued
H-74
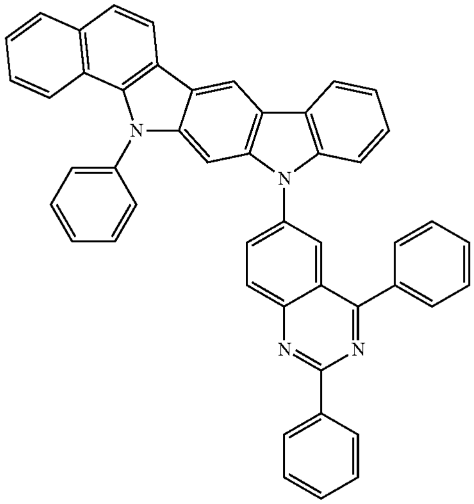
H-75
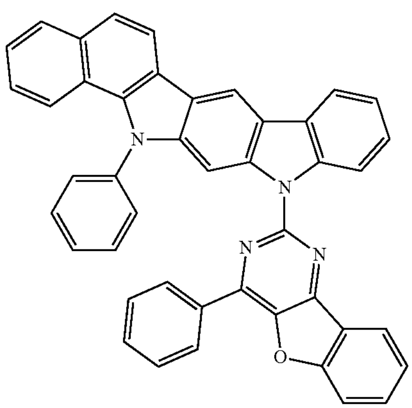
H-76
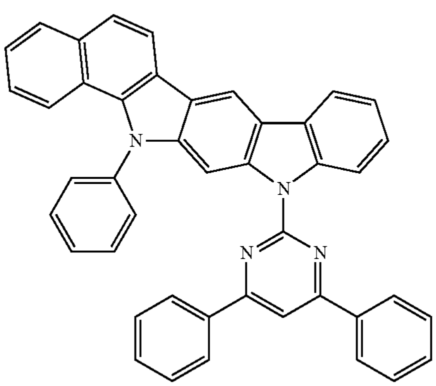
-continued
H-77
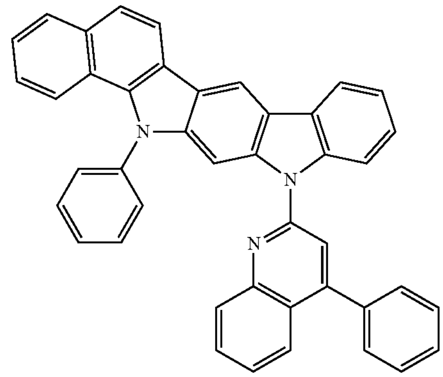
H-78
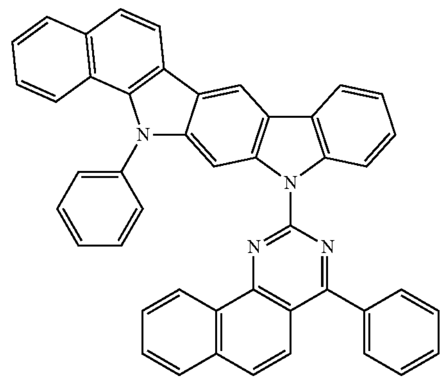
H-79
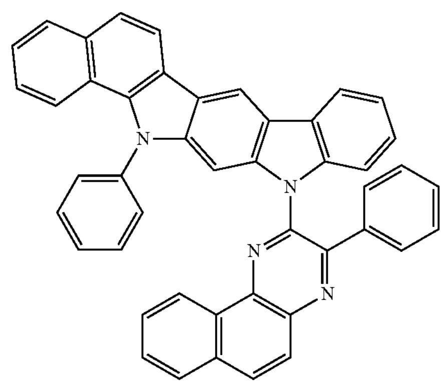
H-80
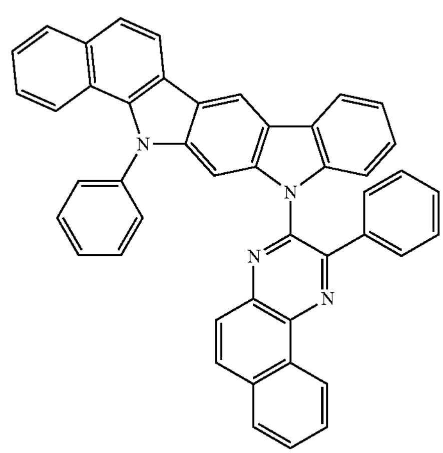

-continued
H-81
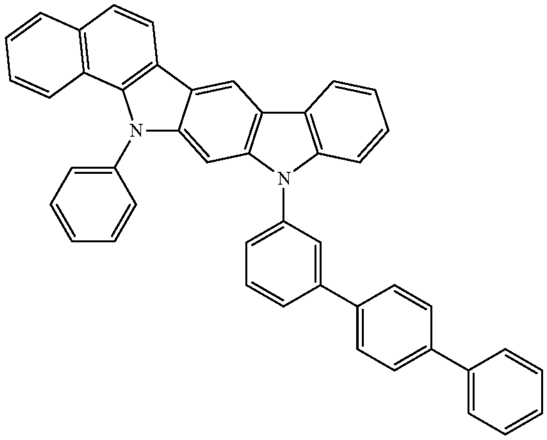
H-82
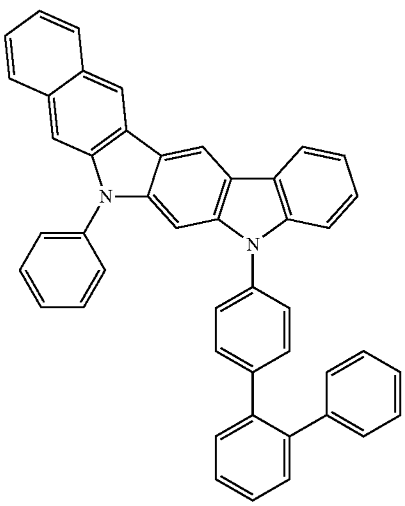
H-83
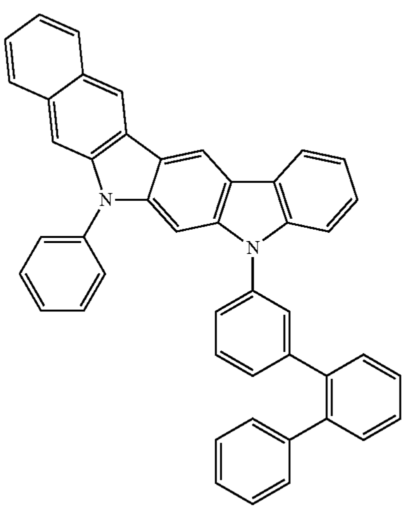
-continued
H-84
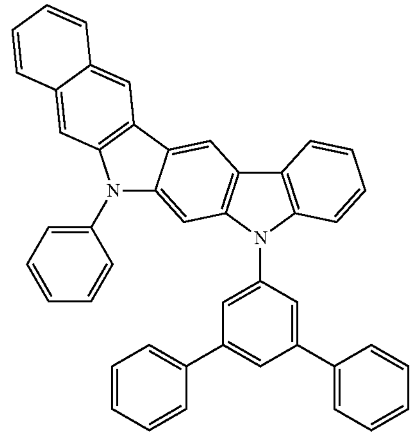
H-85
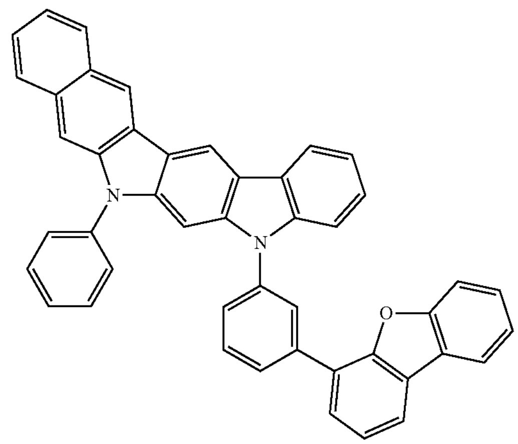
H-86
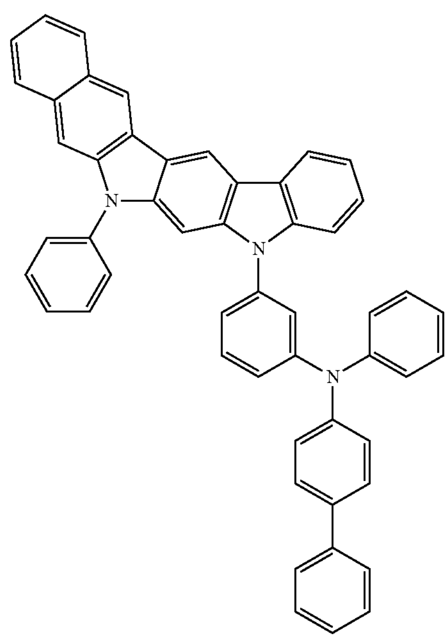

H-87
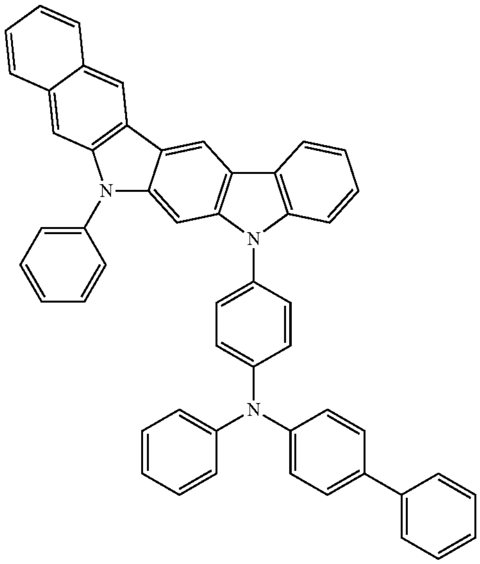
H-88
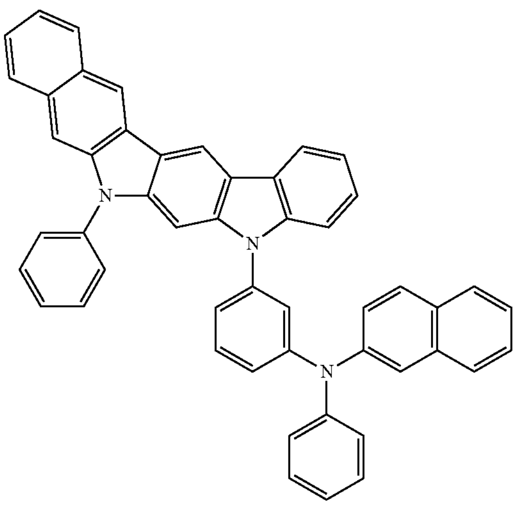
H-89
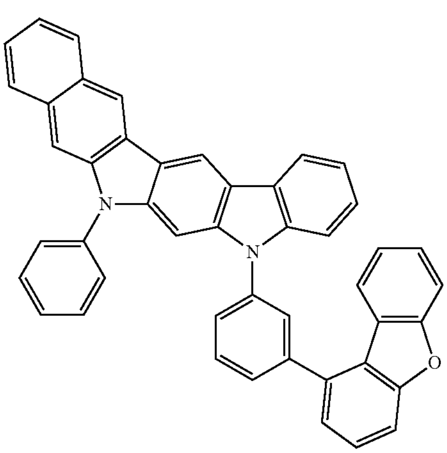
H-90
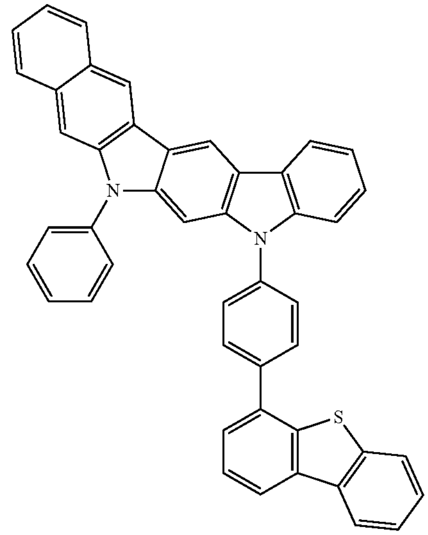
H-91
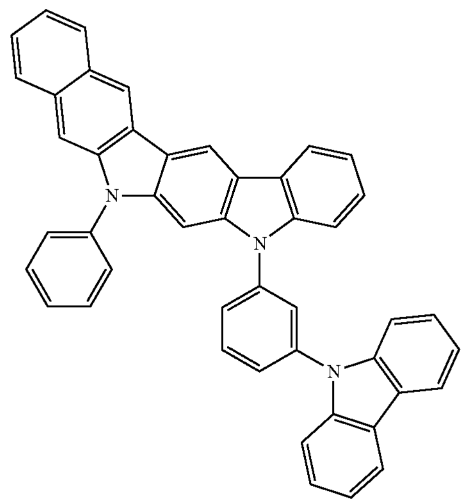
H-92
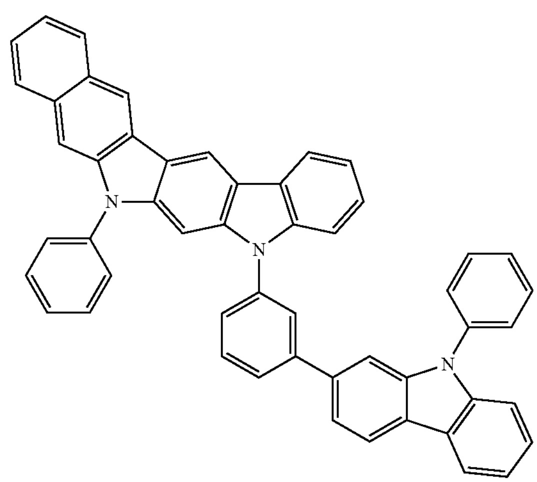

-continued
H-93
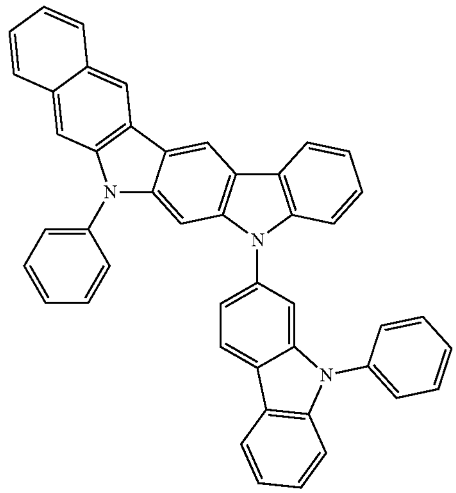
H-94
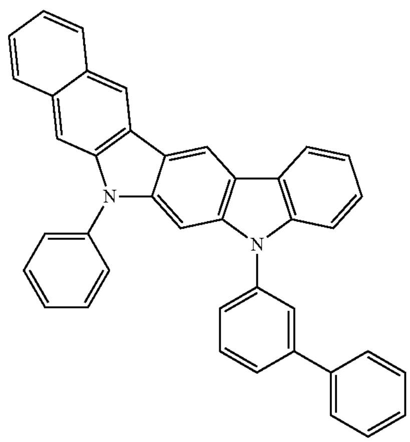
and
-continued
H-95
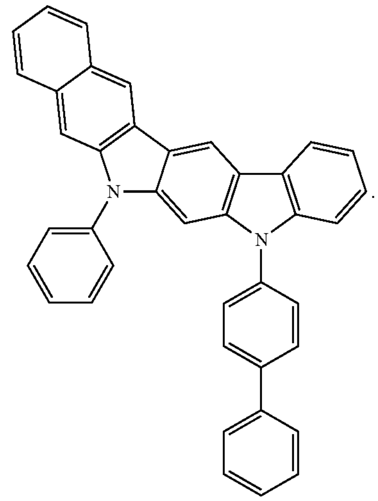
.
* * * * *

UNITED STATES PATENT AND TRADEMARK OFFICE

CERTIFICATE OF CORRECTION

PATENT NO. : 12,004,420 B2
APPLICATION NO. : 16/886822
DATED : June 4, 2024
INVENTOR(S) : Doo-Hyeon Moon et al.

It is certified that error appears in the above-identified patent and that said Letters Patent is hereby corrected as shown below:

In the Specification

In MODE FOR THE INVENTION at Column 8, Line 33:
'1-3'
Should be:
'I-3'.

Signed and Sealed this
Sixteenth Day of July, 2024

Katherine Kelly Vidal

Katherine Kelly Vidal
*Director of the United States Patent and Trademark Office*